US010677953B2

(12) United States Patent
Stetson et al.

(10) Patent No.: US 10,677,953 B2
(45) Date of Patent: Jun. 9, 2020

(54) MAGNETO-OPTICAL DETECTING APPARATUS AND METHODS

(71) Applicant: LOCKHEED MARTIN CORPORATION, Bethesda, MD (US)

(72) Inventors: John B. Stetson, New Hope, NJ (US); Arul Manickam, Mount Laurel, NJ (US); Peter G. Kaup, Marlton, NJ (US); Gregory Scott Bruce, Abington, PA (US); Wilbur Lew, Mount Laurel, NJ (US); Joseph W. Hahn, Erial, NJ (US); Nicholas Mauriello Luzod, Seattle, WA (US); Kenneth Michael Jackson, Westville, NJ (US); Jacob Louis Swett, Redwood City, CA (US); Peter V. Bedworth, Los Gatos, CA (US); Steven W. Sinton, Palo Alto, CA (US); Duc Huynh, Princeton Junction, NJ (US); Michael John Dimario, Doylestown, PA (US); Jay T. Hansen, Hainesport, NJ (US); Andrew Raymond Mandeville, Delran, NJ (US); Bryan Neal Fisk, Madison, AL (US); Joseph A. Villani, Moorestown, NJ (US); Jon C. Russo, Cherry Hill, NJ (US); David Nelson Coar, Philadelphia, PA (US); Julie Lynne Miller, Auberry, CA (US); Anjaney Pramod Kottapalli, San Jose, CA (US); Gary Edward Montgomery, Palo Alto, CA (US); Margaret Miller Shaw, Silver Spring, MD (US); Stephen Sekelsky, Princeton, NJ (US); James Michael Krause, Saint Michael, MN (US); Thomas J. Meyer, Corfu, NY (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 240 days.

(21) Appl. No.: 15/610,526

(22) Filed: May 31, 2017

(65) Prior Publication Data

US 2017/0343695 A1 Nov. 30, 2017

Related U.S. Application Data

(63) Continuation-in-part of application No. 15/207,457, filed on Jul. 11, 2016, now Pat. No. 10,338,163, and (Continued)

(51) Int. Cl.
*G01V 3/14* (2006.01)
*G01R 33/032* (2006.01)

(Continued)

(52) U.S. Cl.
CPC ............ *G01V 3/14* (2013.01); *G01R 33/032* (2013.01); *G01R 33/26* (2013.01); *G01V 3/101* (2013.01)

(58) Field of Classification Search
CPC ........... G01R 33/0017; G01R 33/0029; G01R 33/0052; G01R 33/0094; G01R 33/02;

(Continued)

(56) References Cited

U.S. PATENT DOCUMENTS

| | | | |
|---|---|---|---|
| 2,746,027 | A | 5/1956 | Murray |
| 3,359,812 | A | 12/1967 | Everitt |

(Continued)

FOREIGN PATENT DOCUMENTS

| | | | |
|---|---|---|---|
| CN | 105738845 | A | 7/2016 |
| CN | 106257602 | | 12/2016 |

(Continued)

OTHER PUBLICATIONS

Gaebel et al. Room-temperature coherent coupling of single spins in diamond, Nature Physics, May 28, 2006 (Year: 2006).*

(Continued)

*Primary Examiner* — Steven L Yeninas
(74) *Attorney, Agent, or Firm* — Foley & Lardner LLP

(57) ABSTRACT

A system for magnetic detection includes a magneto-optical defect center material including at least one magneto-optical defect center that emits an optical signal when excited by an excitation light; a radio frequency (RF) exciter system configured to provide RF excitation to the magneto-optical defect center material; an optical light source configured to direct the excitation light to the magneto-optical defect center material; and an optical detector configured to receive (Continued)

the optical signal emitted by the magneto-optical defect center material.

20 Claims, 188 Drawing Sheets

Related U.S. Application Data a continuation-in-part of application No. 15/350,303, filed on Nov. 14, 2016, now Pat. No. 10,281,550, and a continuation-in-part of application No. 15/376,244, filed on Dec. 12, 2016, now Pat. No. 10,345,395, and a continuation-in-part of application No. 15/437,222, filed on Feb. 20, 2017, now Pat. No. 10,371,765, application No. 15/610,526, which is a continuation-in-part of application No. 15/437,038, filed on Feb. 20, 2017, now Pat. No. 10,359,479, and a continuation-in-part of application No. 15/440,194, filed on Feb. 23, 2017, now abandoned, and a continuation-in-part of application No. 15/443,422, filed on Feb. 27, 2017, now Pat. No. 10,527,746, application No. 15/610,526, which is a continuation-in-part of application No. 15/446,373, filed on Mar. 1, 2017, now Pat. No. 10,571,530, and a continuation-in-part of application No. 15/454,162, filed on Mar. 9, 2017, now Pat. No. 10,317,279, and a continuation-in-part of application No. 15/456,913, filed on Mar. 13, 2017, and a continuation-in-part of application No. 15/380,691, filed on Dec. 15, 2016, now abandoned, and a continuation-in-part of application No. 15/380,419, filed on Dec. 15, 2016, now Pat. No. 10,345,396, and a continuation-in-part of application No. 15/382,045, filed on Dec. 16, 2016, now abandoned, application No. 15/610,526, which is a continuation-in-part of application No. 15/468,641, filed on Mar. 24, 2017, now Pat. No. 10,330,744, and a continuation-in-part of application No. 15/468,410, filed on Mar. 24, 2017, and a continuation-in-part of application No. 15/468,303, filed on Mar. 24, 2017, now abandoned, and a continuation-in-part of application No. 15/468,289, filed on Mar. 24, 2017, now Pat. No. 10,228,429, and a continuation-in-part of application No. 15/468,397, filed on Mar. 24, 2017, now Pat. No. 10,274,550, and a continuation-in-part of application No. 15/468,356, filed on Mar. 24, 2017, now Pat. No. 10,408,890, and a continuation-in-part of application No. 15/468,386, filed on Mar. 24, 2017, now Pat. No. 10,145,910.

(60) Provisional application No. 62/360,940, filed on Jul. 11, 2016, provisional application No. 62/343,839, filed on May 31, 2016, provisional application No. 62/343,842, filed on May 31, 2016, provisional application No. 62/343,758, filed on May 31, 2016, provisional application No. 62/343,492, filed on May 31, 2016, provisional application No. 62/343,602, filed on May 31, 2016, provisional application No. 62/343,746, filed on May 31, 2016, provisional application No. 62/343,750, filed on May 31, 2016, provisional application No. 62/343,818, filed on May 31, 2016, provisional application No. 62/343,843, filed on May 31, 2016, provisional application No. 62/343,600, filed on May 31, 2016.

(51) Int. Cl.
*G01R 33/26* (2006.01)
*G01V 3/10* (2006.01)

(58) Field of Classification Search
CPC .............. G01R 33/032; G01R 33/1269; G01R 33/1284; G01R 33/24; G01R 33/243; G01R 33/246; G01R 33/26; G01R 33/323; G01R 33/62; G01N 24/004; G01N 24/006; G01N 24/10; G01N 24/12; G01N 24/64; G01N 24/6458; G01V 3/08; G01V 3/081; G01V 3/101; G01V 3/102; G01V 3/104; G01V 3/14; G01V 3/40
USPC ............. 324/202, 244, 244.1, 260, 304, 305
See application file for complete search history.

(56) References Cited

U.S. PATENT DOCUMENTS 3,389,333 A 6/1968 Wolff et al.
3,490,032 A 1/1970 Zurflueh
3,514,723 A 5/1970 Cutler
3,518,531 A 6/1970 Huggett
3,621,380 A 11/1971 Barlow, Jr.
3,745,452 A 7/1973 Osburn et al.
3,899,758 A 8/1975 Maier et al.
4,025,873 A 5/1977 Chilluffo
4,047,805 A 9/1977 Sekimura
4,078,247 A 3/1978 Albrecht
4,084,215 A 4/1978 Willenbrock
4,322,769 A 3/1982 Cooper
4,329,173 A 5/1982 Culling
4,359,673 A 11/1982 Bross et al.
4,368,430 A 1/1983 Dale et al.
4,410,926 A 10/1983 Hafner et al.
4,437,533 A 3/1984 Bierkarre et al.
4,514,083 A 4/1985 Fukuoka
4,588,993 A 5/1986 Babij et al.
4,636,612 A 1/1987 Cullen
4,638,324 A 1/1987 Hannan
4,675,522 A 6/1987 Arunkumar
4,768,962 A 9/1988 Kupfer et al.
4,818,990 A 4/1989 Fernandes
4,820,986 A 4/1989 Mansfield et al.
4,945,305 A 7/1990 Blood
4,958,328 A 9/1990 Stubblefield
4,982,158 A 1/1991 Nakata et al.
5,019,721 A 5/1991 Martens et al.
5,038,103 A 8/1991 Scarzello et al.
5,113,136 A 5/1992 Hayashi et al.
5,134,369 A 7/1992 Lo et al.
5,189,368 A 2/1993 Chase
5,200,855 A 4/1993 Meredith et al.
5,210,650 A 5/1993 O'Brien et al.
5,245,347 A 9/1993 Bonta et al.
5,252,912 A 10/1993 Merritt et al.
5,301,096 A 4/1994 Klontz et al.
5,384,109 A 1/1995 Klaveness et al.
5,396,802 A 3/1995 Moss
5,420,549 A 5/1995 Prestage
5,425,179 A 6/1995 Nickel et al.
5,427,915 A 6/1995 Ribi et al.
5,548,279 A 8/1996 Gaines
5,568,516 A 10/1996 Strohallen et al.
5,586,069 A 12/1996 Dockser
5,597,762 A 1/1997 Popovici et al.
5,638,472 A 6/1997 Van Delden
5,694,375 A 12/1997 Woodall
5,719,497 A 2/1998 Veeser et al.
5,731,996 A 3/1998 Gilbert
5,764,061 A 6/1998 Asakawa et al.
5,818,352 A 10/1998 McClure
5,846,708 A 12/1998 Hollis et al.
5,888,925 A 3/1999 Smith et al.
5,894,220 A 4/1999 Wellstood et al.
5,907,420 A 5/1999 Chraplyvy et al.
5,907,907 A 6/1999 Ohtomo et al.
5,915,061 A 6/1999 Vanoli
5,995,696 A 11/1999 Miyagi et al.
6,042,249 A 3/2000 Spangenberg

(56) References Cited

U.S. PATENT DOCUMENTS

| | | | |
|---|---|---|---|
| 6,057,684 | A | 5/2000 | Murakami et al. |
| 6,064,210 | A | 5/2000 | Sinclair |
| 6,121,053 | A | 9/2000 | Kolber et al. |
| 6,124,862 | A | 9/2000 | Boyken et al. |
| 6,130,753 | A | 10/2000 | Hopkins et al. |
| 6,144,204 | A | 11/2000 | Sementchenko |
| 6,195,231 | B1 | 2/2001 | Sedlmayr et al. |
| 6,215,303 | B1 | 4/2001 | Weinstock et al. |
| 6,262,574 | B1 | 7/2001 | Cho et al. |
| 6,360,173 | B1 | 3/2002 | Fullerton |
| 6,398,155 | B1 | 6/2002 | Hepner et al. |
| 6,433,944 | B1 | 8/2002 | Nagao et al. |
| 6,437,563 | B1 | 8/2002 | Simmonds et al. |
| 6,472,651 | B1 | 10/2002 | Ukai |
| 6,472,869 | B1 | 10/2002 | Upschulte et al. |
| 6,504,365 | B2 | 1/2003 | Kitamura |
| 6,518,747 | B2 | 2/2003 | Sager et al. |
| 6,542,242 | B1 | 4/2003 | Yost et al. |
| 6,621,377 | B2 | 9/2003 | Osadchy et al. |
| 6,621,578 | B1 | 9/2003 | Mizoguchi |
| 6,636,146 | B1 | 10/2003 | Wehoski |
| 6,686,696 | B2 | 2/2004 | Mearini et al. |
| 6,690,162 | B1 | 2/2004 | Schopohl et al. |
| 6,765,487 | B1 | 7/2004 | Holmes et al. |
| 6,788,722 | B1 | 9/2004 | Kennedy et al. |
| 6,809,829 | B1 | 10/2004 | Takata et al. |
| 7,118,657 | B2 | 10/2006 | Golovchenko et al. |
| 7,221,164 | B1 | 5/2007 | Barringer |
| 7,277,161 | B2 | 10/2007 | Claus |
| 7,305,869 | B1 | 12/2007 | Berman et al. |
| 7,307,416 | B2 | 12/2007 | Islam et al. |
| 7,342,399 | B1 | 3/2008 | Wiegert |
| RE40,343 | E | 5/2008 | Anderson |
| 7,400,142 | B2 | 7/2008 | Greelish |
| 7,413,011 | B1 | 8/2008 | Chee et al. |
| 7,427,525 | B2 | 9/2008 | Santori et al. |
| 7,448,548 | B1 | 11/2008 | Compton |
| 7,471,805 | B2 | 12/2008 | Goldberg |
| 7,474,090 | B2 | 1/2009 | Islam et al. |
| 7,543,780 | B1 | 6/2009 | Marshall et al. |
| 7,546,000 | B2 | 6/2009 | Spillane et al. |
| 7,570,050 | B2 | 8/2009 | Sugiura |
| 7,608,820 | B1 | 10/2009 | Berman et al. |
| 7,705,599 | B2 | 4/2010 | Strack et al. |
| 7,741,936 | B1 | 6/2010 | Weller et al. |
| 7,805,030 | B2 | 9/2010 | Bratkovski et al. |
| 7,868,702 | B2 | 1/2011 | Ohnishi |
| 7,889,484 | B2 | 2/2011 | Choi |
| 7,916,489 | B2 | 3/2011 | Okuya |
| 7,932,718 | B1 | 4/2011 | Wiegert |
| 7,983,812 | B2 | 7/2011 | Potter |
| 8,022,693 | B2 | 9/2011 | Meyersweissflog |
| 8,120,351 | B2 | 2/2012 | Rettig et al. |
| 8,120,355 | B1 | 2/2012 | Stetson |
| 8,124,296 | B1 | 2/2012 | Fischel |
| 8,138,756 | B2 | 3/2012 | Barclay et al. |
| 8,193,808 | B2 | 6/2012 | Fu et al. |
| 8,294,306 | B2 | 10/2012 | Kumar et al. |
| 8,310,251 | B2 | 11/2012 | Orazem |
| 8,311,767 | B1 | 11/2012 | Stetson |
| 8,334,690 | B2 | 12/2012 | Kitching et al. |
| 8,415,640 | B2 | 4/2013 | Babinec et al. |
| 8,471,137 | B2 | 6/2013 | Adair et al. |
| 8,480,653 | B2 | 7/2013 | Birchard et al. |
| 8,525,516 | B2 | 9/2013 | Le Prado et al. |
| 8,547,090 | B2 | 10/2013 | Lukin et al. |
| 8,574,536 | B2 | 11/2013 | Boudou et al. |
| 8,575,929 | B1 | 11/2013 | Wiegert |
| 8,686,377 | B2 | 4/2014 | Twitchen et al. |
| 8,704,546 | B2 | 4/2014 | Konstantinov |
| 8,758,509 | B2 | 6/2014 | Twitchen et al. |
| 8,803,513 | B2 | 8/2014 | Hosek et al. |
| 8,854,839 | B2 | 10/2014 | Cheng et al. |
| 8,885,301 | B1 | 11/2014 | Heidmann |
| 8,913,900 | B2 | 12/2014 | Lukin et al. |
| 8,933,594 | B2 | 1/2015 | Kurs |
| 8,947,080 | B2 | 2/2015 | Lukin et al. |
| 8,963,488 | B2 | 2/2015 | Campanella et al. |
| 9,103,873 | B1 | 8/2015 | Martens et al. |
| 9,157,859 | B2 | 10/2015 | Walsworth et al. |
| 9,245,551 | B2 | 1/2016 | El Hallak et al. |
| 9,249,526 | B2 | 2/2016 | Twitchen et al. |
| 9,270,387 | B2 | 2/2016 | Wolfe et al. |
| 9,291,508 | B1 | 3/2016 | Biedermann et al. |
| 9,317,811 | B2 | 4/2016 | Scarsbrook |
| 9,369,182 | B2 | 6/2016 | Kurs et al. |
| 9,385,654 | B2 * | 7/2016 | Englund ............ G01R 33/1284 |
| 9,442,205 | B2 | 9/2016 | Geiser et al. |
| 9,541,610 | B2 | 1/2017 | Kaup et al. |
| 9,551,763 | B1 | 1/2017 | Hahn et al. |
| 9,557,391 | B2 | 1/2017 | Egan et al. |
| 9,570,793 | B2 | 2/2017 | Borodulin |
| 9,590,601 | B2 | 3/2017 | Krause et al. |
| 9,614,589 | B1 | 4/2017 | Russo et al. |
| 9,632,045 | B2 | 4/2017 | Englund et al. |
| 9,645,223 | B2 | 5/2017 | Megdal et al. |
| 9,680,338 | B2 | 6/2017 | Malpas et al. |
| 9,689,679 | B2 | 6/2017 | Budker et al. |
| 9,720,055 | B1 | 8/2017 | Hahn et al. |
| 9,778,329 | B2 | 10/2017 | Heidmann |
| 9,779,769 | B2 | 10/2017 | Heidmann |
| 9,891,297 | B2 | 2/2018 | Sushkov et al. |
| 2002/0144093 | A1 | 10/2002 | Inoue et al. |
| 2002/0167306 | A1 | 11/2002 | Zalunardo et al. |
| 2003/0058346 | A1 | 3/2003 | Bechtel et al. |
| 2003/0076229 | A1 | 4/2003 | Blanpain et al. |
| 2003/0094942 | A1 | 5/2003 | Friend et al. |
| 2003/0098455 | A1 | 5/2003 | Amin et al. |
| 2003/0235136 | A1 | 12/2003 | Akselrod et al. |
| 2004/0013180 | A1 | 1/2004 | Giannakis et al. |
| 2004/0022179 | A1 | 2/2004 | Giannakis et al. |
| 2004/0042150 | A1 | 3/2004 | Swinbanks et al. |
| 2004/0081033 | A1 | 4/2004 | Arieli et al. |
| 2004/0095133 | A1 | 5/2004 | Nikitin et al. |
| 2004/0109328 | A1 | 6/2004 | Dahl et al. |
| 2004/0247145 | A1 | 12/2004 | Luo et al. |
| 2005/0031840 | A1 | 2/2005 | Swift et al. |
| 2005/0068249 | A1 | 3/2005 | Frederick du Toit et al. |
| 2005/0099177 | A1 | 5/2005 | Greelish |
| 2005/0112594 | A1 | 5/2005 | Grossman |
| 2005/0126905 | A1 | 6/2005 | Golovchenko et al. |
| 2005/0130601 | A1 | 6/2005 | Palermo et al. |
| 2005/0134257 | A1 | 6/2005 | Etherington et al. |
| 2005/0138330 | A1 | 6/2005 | Owens et al. |
| 2005/0146327 | A1 | 7/2005 | Jakab |
| 2006/0012385 | A1 | 1/2006 | Tsao et al. |
| 2006/0054789 | A1 | 3/2006 | Miyamoto et al. |
| 2006/0055584 | A1 | 3/2006 | Waite et al. |
| 2006/0062084 | A1 | 3/2006 | Drew |
| 2006/0071709 | A1 | 4/2006 | Maloberti et al. |
| 2006/0245078 | A1 | 11/2006 | Kawamura |
| 2006/0247847 | A1 | 11/2006 | Carter et al. |
| 2006/0255801 | A1 | 11/2006 | Ikeda |
| 2006/0291771 | A1 | 12/2006 | Braunisch et al. |
| 2007/0004371 | A1 | 1/2007 | Okanobu |
| 2007/0120563 | A1 | 5/2007 | Kawabata et al. |
| 2007/0247147 | A1 | 10/2007 | Xiang et al. |
| 2007/0273877 | A1 | 11/2007 | Kawano et al. |
| 2008/0016677 | A1 | 1/2008 | Creighton, IV |
| 2008/0048640 | A1 | 2/2008 | Hull et al. |
| 2008/0078233 | A1 | 4/2008 | Larson et al. |
| 2008/0089367 | A1 | 4/2008 | Srinivasan et al. |
| 2008/0160634 | A1 * | 7/2008 | Su .......................... G01N 27/74 436/501 |
| 2008/0204004 | A1 | 8/2008 | Anderson |
| 2008/0217516 | A1 | 9/2008 | Suzuki et al. |
| 2008/0239265 | A1 | 10/2008 | Den Boef |
| 2008/0253264 | A1 | 10/2008 | Nagatomi et al. |
| 2008/0265895 | A1 | 10/2008 | Strack et al. |
| 2008/0266050 | A1 | 10/2008 | Crouse et al. |
| 2008/0279047 | A1 | 11/2008 | An et al. |
| 2008/0299904 | A1 | 12/2008 | Yi et al. |
| 2009/0001979 | A1 | 1/2009 | Kawabata |
| 2009/0015262 | A1 | 1/2009 | Strack et al. |

(56) References Cited

U.S. PATENT DOCUMENTS

2009/0042592 A1 2/2009 Cho et al.
2009/0058697 A1 3/2009 Aas et al.
2009/0060790 A1 3/2009 Okaguchi et al.
2009/0079417 A1 3/2009 Mort et al.
2009/0079426 A1 3/2009 Anderson
2009/0132100 A1 5/2009 Shibata
2009/0157331 A1 6/2009 Van Netten
2009/0161264 A1 6/2009 Meyersweissflog
2009/0195244 A1 8/2009 Mouget et al.
2009/0222208 A1 9/2009 Speck
2009/0243616 A1 10/2009 Loehken et al.
2009/0244857 A1 10/2009 Tanaka
2009/0277702 A1 11/2009 Kanada et al.
2009/0310650 A1 12/2009 Chester et al.
2010/0004802 A1 1/2010 Bodin et al.
2010/0015438 A1 1/2010 Williams et al.
2010/0015918 A1 1/2010 Liu et al.
2010/0045269 A1 2/2010 Lafranchise et al.
2010/0071904 A1 3/2010 Burns et al.
2010/0102809 A1 4/2010 May
2010/0102820 A1 4/2010 Martinez et al.
2010/0134922 A1 6/2010 Yamada et al.
2010/0156547 A1* 6/2010 McGuyer ................ G04F 5/145 331/94.1
2010/0157305 A1 6/2010 Henderson
2010/0188081 A1 7/2010 Lammegger
2010/0237149 A1 9/2010 Olmstead
2010/0271016 A1 10/2010 Barclay et al.
2010/0271032 A1 10/2010 Helwig
2010/0277121 A1 11/2010 Hall et al.
2010/0308813 A1 12/2010 Lukin et al.
2010/0315079 A1 12/2010 Lukin et al.
2010/0321117 A1 12/2010 Gan
2010/0326042 A1 12/2010 McLean et al.
2011/0031969 A1 2/2011 Kitching et al.
2011/0034393 A1 2/2011 Justen et al.
2011/0059704 A1 3/2011 Norimatsu et al.
2011/0062957 A1 3/2011 Fu et al.
2011/0062967 A1 3/2011 Mohaupt
2011/0066379 A1 3/2011 Mes
2011/0120890 A1 5/2011 MacPherson et al.
2011/0127999 A1 6/2011 Lott et al.
2011/0165862 A1 7/2011 Yu et al.
2011/0175604 A1 7/2011 Polzer et al.
2011/0176563 A1 7/2011 Friel et al.
2011/0243267 A1 10/2011 Won et al.
2011/0270078 A1 11/2011 Wagenaar et al.
2011/0279120 A1 11/2011 Sudow et al.
2011/0315988 A1 12/2011 Yu et al.
2012/0016538 A1 1/2012 Waite et al.
2012/0019242 A1 1/2012 Hollenberg et al.
2012/0037803 A1 2/2012 Strickland
2012/0044014 A1 2/2012 Stratakos et al.
2012/0051996 A1 3/2012 Scarsbrook et al.
2012/0063505 A1 3/2012 Okamura et al.
2012/0087449 A1 4/2012 Ling et al.
2012/0089299 A1 4/2012 Breed
2012/0140219 A1 6/2012 Cleary
2012/0181020 A1 7/2012 Barron et al.
2012/0194068 A1 8/2012 Cheng et al.
2012/0203086 A1 8/2012 Rorabaugh et al.
2012/0232838 A1 9/2012 Kemppi et al.
2012/0235633 A1 9/2012 Kesler et al.
2012/0235634 A1 9/2012 Hall et al.
2012/0245885 A1 9/2012 Kimishima
2012/0257683 A1 10/2012 Schwager et al.
2012/0281843 A1 11/2012 Christensen et al.
2012/0326793 A1 12/2012 Gan
2013/0043863 A1 2/2013 Ausserlechner et al.
2013/0070252 A1 3/2013 Feth
2013/0093419 A1* 4/2013 An ..................... G01R 33/0325 324/244.1
2013/0093424 A1 4/2013 Blank et al.
2013/0107253 A1 5/2013 Santori
2013/0127518 A1 5/2013 Nakao
2013/0179074 A1 7/2013 Haverinen
2013/0215712 A1 8/2013 Geiser et al.
2013/0223805 A1 8/2013 Ouyang et al.
2013/0241302 A1* 9/2013 Miyamoto ............. H02J 50/12 307/104
2013/0265042 A1 10/2013 Kawabata et al.
2013/0265782 A1 10/2013 Barrena et al.
2013/0270991 A1 10/2013 Twitchen et al.
2013/0279319 A1 10/2013 Matozaki et al.
2013/0292472 A1 11/2013 Guha
2014/0012505 A1 1/2014 Smith et al.
2014/0015522 A1 1/2014 Widmer et al.
2014/0037932 A1 2/2014 Twitchen et al.
2014/0044208 A1 2/2014 Woodsum
2014/0061510 A1 3/2014 Twitchen et al.
2014/0070622 A1 3/2014 Keeling et al.
2014/0072008 A1 3/2014 Faraon et al.
2014/0077231 A1 3/2014 Twitchen et al.
2014/0081592 A1 3/2014 Bellusci et al.
2014/0104008 A1 4/2014 Gan
2014/0126334 A1 5/2014 Megdal et al.
2014/0139322 A1 5/2014 Wang et al.
2014/0153363 A1 6/2014 Juhasz et al.
2014/0154792 A1 6/2014 Moynihan et al.
2014/0159652 A1 6/2014 Hall et al.
2014/0166904 A1 6/2014 Walsworth et al.
2014/0167759 A1 6/2014 Pines et al.
2014/0168174 A1 6/2014 Idzik et al.
2014/0180627 A1 6/2014 Naguib et al.
2014/0191139 A1 7/2014 Englund
2014/0191752 A1 7/2014 Walsworth et al.
2014/0197831 A1 7/2014 Walsworth
2014/0198463 A1 7/2014 Klein
2014/0210473 A1 7/2014 Campbell et al.
2014/0215985 A1 8/2014 Pollklas
2014/0225606 A1 8/2014 Endo et al.
2014/0247094 A1 9/2014 Englund et al.
2014/0264723 A1 9/2014 Liang et al.
2014/0265555 A1 9/2014 Hall et al.
2014/0272119 A1 9/2014 Kushalappa et al.
2014/0273826 A1 9/2014 Want et al.
2014/0291490 A1 10/2014 Hanson et al.
2014/0297067 A1 10/2014 Malay
2014/0306707 A1 10/2014 Walsworth et al.
2014/0327439 A1 11/2014 Cappellaro et al.
2014/0335339 A1 11/2014 Dhillon et al.
2014/0340085 A1 11/2014 Cappellaro et al.
2014/0368191 A1 12/2014 Goroshevskiy et al.
2015/0001422 A1 1/2015 Englund et al.
2015/0009746 A1 1/2015 Kucsko et al.
2015/0015247 A1 1/2015 Goodwill et al.
2015/0018018 A1 1/2015 Shen et al.
2015/0022404 A1 1/2015 Chen et al.
2015/0048822 A1 2/2015 Walsworth et al.
2015/0054355 A1 2/2015 Ben-Shalom et al.
2015/0061590 A1 3/2015 Widmer et al.
2015/0061670 A1 3/2015 Fordham et al.
2015/0090033 A1 4/2015 Budker et al.
2015/0128431 A1 5/2015 Kuo
2015/0130456 A1* 5/2015 Smith .................... G01R 33/26 324/301
2015/0137793 A1 5/2015 Englund et al.
2015/0153151 A1 6/2015 Kochanski
2015/0192532 A1 7/2015 Clevenson et al.
2015/0192596 A1 7/2015 Englund et al.
2015/0225052 A1 8/2015 Cordell
2015/0235661 A1 8/2015 Heidmann
2015/0253355 A1 9/2015 Grinolds et al.
2015/0268373 A1 9/2015 Meyer
2015/0269957 A1 9/2015 El Hallak et al.
2015/0276897 A1 10/2015 Leussler et al.
2015/0288352 A1 10/2015 Krause et al.
2015/0299894 A1 10/2015 Markham et al.
2015/0303333 A1 10/2015 Yu et al.
2015/0314870 A1 11/2015 Davies
2015/0326030 A1 11/2015 Malpas et al.
2015/0326410 A1 11/2015 Krause et al.
2015/0354985 A1 12/2015 Judkins et al.
2015/0358026 A1 12/2015 Gan

(56) References Cited

U.S. PATENT DOCUMENTS

| | | | |
|---|---|---|---|
| 2015/0374250 A1 | 12/2015 | Hatano et al. | |
| 2015/0377865 A1 | 12/2015 | Acosta et al. | |
| 2015/0377987 A1 | 12/2015 | Menon et al. | |
| 2016/0018269 A1 | 1/2016 | Maurer et al. | |
| 2016/0031339 A1 | 2/2016 | Geo | |
| 2016/0036529 A1 | 2/2016 | Griffith et al. | |
| 2016/0052789 A1 | 2/2016 | Gaathon et al. | |
| 2016/0054402 A1 | 2/2016 | Meriles | |
| 2016/0061914 A1 | 3/2016 | Jelezko | |
| 2016/0071532 A9 | 3/2016 | Heidmann | |
| 2016/0077167 A1 | 3/2016 | Heidmann | |
| 2016/0097702 A1 | 4/2016 | Zhao et al. | |
| 2016/0113507 A1 | 4/2016 | Reza et al. | |
| 2016/0131723 A1 | 5/2016 | Nagasaka | |
| 2016/0139048 A1 | 5/2016 | Heidmann | |
| 2016/0146904 A1 | 5/2016 | Stetson, Jr. et al. | |
| 2016/0161429 A1* | 6/2016 | Englund | G01N 24/006 324/304 |
| 2016/0161583 A1 | 6/2016 | Meriles et al. | |
| 2016/0174867 A1 | 6/2016 | Hatano | |
| 2016/0214714 A1 | 7/2016 | Sekelsky | |
| 2016/0216304 A1 | 7/2016 | Sekelsky | |
| 2016/0216340 A1 | 7/2016 | Egan et al. | |
| 2016/0216341 A1 | 7/2016 | Boesch et al. | |
| 2016/0221441 A1 | 8/2016 | Hall et al. | |
| 2016/0223621 A1 | 8/2016 | Kaup et al. | |
| 2016/0231394 A1 | 8/2016 | Manickam et al. | |
| 2016/0266220 A1 | 9/2016 | Sushkov et al. | |
| 2016/0282427 A1* | 9/2016 | Heidmann | G01R 33/26 |
| 2016/0291191 A1 | 10/2016 | Fukushima et al. | |
| 2016/0313408 A1 | 10/2016 | Hatano et al. | |
| 2016/0348277 A1 | 12/2016 | Markham et al. | |
| 2016/0356863 A1 | 12/2016 | Boesch et al. | |
| 2017/0010214 A1 | 1/2017 | Osawa et al. | |
| 2017/0010334 A1 | 1/2017 | Krause et al. | |
| 2017/0010338 A1 | 1/2017 | Bayat et al. | |
| 2017/0010594 A1 | 1/2017 | Kottapalli et al. | |
| 2017/0023487 A1 | 1/2017 | Boesch | |
| 2017/0030982 A1 | 2/2017 | Jeske et al. | |
| 2017/0038314 A1 | 2/2017 | Suyama et al. | |
| 2017/0038411 A1 | 2/2017 | Yacobi et al. | |
| 2017/0068012 A1 | 3/2017 | Fisk | |
| 2017/0074660 A1 | 3/2017 | Gann et al. | |
| 2017/0075020 A1 | 3/2017 | Gann et al. | |
| 2017/0075205 A1 | 3/2017 | Kriman et al. | |
| 2017/0077665 A1 | 3/2017 | Liu et al. | |
| 2017/0104426 A1 | 4/2017 | Mills | |
| 2017/0138735 A1 | 5/2017 | Cappellaro et al. | |
| 2017/0139017 A1 | 5/2017 | Egan et al. | |
| 2017/0146615 A1 | 5/2017 | Wolf et al. | |
| 2017/0199156 A1 | 7/2017 | Villani et al. | |
| 2017/0205526 A1 | 7/2017 | Meyer | |
| 2017/0207823 A1 | 7/2017 | Russo et al. | |
| 2017/0211947 A1 | 7/2017 | Fisk | |
| 2017/0212046 A1 | 7/2017 | Cammerata | |
| 2017/0212177 A1 | 7/2017 | Coar et al. | |
| 2017/0212178 A1 | 7/2017 | Hahn et al. | |
| 2017/0212179 A1 | 7/2017 | Hahn et al. | |
| 2017/0212180 A1 | 7/2017 | Hahn et al. | |
| 2017/0212181 A1 | 7/2017 | Coar et al. | |
| 2017/0212182 A1 | 7/2017 | Hahn et al. | |
| 2017/0212183 A1 | 7/2017 | Egan et al. | |
| 2017/0212184 A1 | 7/2017 | Coar et al. | |
| 2017/0212185 A1 | 7/2017 | Hahn et al. | |
| 2017/0212186 A1 | 7/2017 | Hahn et al. | |
| 2017/0212187 A1 | 7/2017 | Hahn et al. | |
| 2017/0212190 A1 | 7/2017 | Reynolds et al. | |
| 2017/0212258 A1 | 7/2017 | Fisk | |
| 2017/0234941 A1* | 8/2017 | Hatano | G01R 33/032 324/304 |
| 2017/0261629 A1 | 9/2017 | Gunnarsson et al. | |
| 2017/0328965 A1* | 11/2017 | Hruby | G01R 33/60 |
| 2017/0336480 A1* | 11/2017 | Narducci | G01R 33/022 |
| 2017/0343617 A1 | 11/2017 | Manickam et al. | |
| 2017/0343619 A1 | 11/2017 | Manickam et al. | |
| 2017/0343620 A1 | 11/2017 | Hahn et al. | |
| 2017/0343621 A1 | 11/2017 | Hahn et al. | |
| 2017/0343695 A1 | 11/2017 | Stetson et al. | |
| 2018/0120219 A1* | 5/2018 | Bumb | G01N 21/1717 |
| 2018/0136291 A1 | 5/2018 | Pham et al. | |
| 2018/0275209 A1 | 9/2018 | Mandeville et al. | |
| 2018/0275212 A1 | 9/2018 | Hahn et al. | |
| 2018/0275224 A1 | 9/2018 | Manickam et al. | |
| 2018/0275225 A1 | 9/2018 | Hahn | |
| 2018/0348393 A1 | 12/2018 | Hansen et al. | |
| 2019/0018085 A1 | 1/2019 | Wu et al. | |

FOREIGN PATENT DOCUMENTS

| | | | |
|---|---|---|---|
| DE | 69608006 | T2 | 2/2001 |
| DE | 19600241 | C2 | 8/2002 |
| DE | 10228536 | A1 | 1/2003 |
| EP | 0 161 940 | B1 | 12/1990 |
| EP | 0 718 642 | | 6/1996 |
| EP | 0 726 458 | | 8/1996 |
| EP | 1 505 627 | | 2/2005 |
| EP | 1 685 597 | | 8/2006 |
| EP | 1 990 313 | | 11/2008 |
| EP | 2 163 392 | | 3/2010 |
| EP | 2 495 166 | A1 | 9/2012 |
| EP | 2 587 232 | A1 | 5/2013 |
| EP | 2 705 179 | | 3/2014 |
| EP | 2 707 523 | | 3/2014 |
| EP | 2 745 360 | | 6/2014 |
| EP | 2 769 417 | | 8/2014 |
| EP | 2 790 031 | | 10/2014 |
| EP | 2 837 930 | A1 | 2/2015 |
| EP | 2 907 792 | | 8/2015 |
| GB | 2 423 366 | A | 8/2006 |
| GB | 2 433 737 | | 7/2007 |
| GB | 2 482 596 | | 2/2012 |
| GB | 2 483 767 | | 3/2012 |
| GB | 2 486 794 | | 6/2012 |
| GB | 2 490 589 | | 11/2012 |
| GB | 2 491 936 | | 12/2012 |
| GB | 2 493 236 | | 1/2013 |
| GB | 2 495 632 | A | 4/2013 |
| GB | 2 497 660 | | 6/2013 |
| GB | 2 510 053 | A | 7/2014 |
| GB | 2 515 226 | | 12/2014 |
| GB | 2 522 309 | | 7/2015 |
| GB | 2 526 639 | | 12/2015 |
| JP | 3782147 | B2 | 6/2006 |
| JP | 4800896 | B2 | 10/2011 |
| JP | 2012-103171 | | 5/2012 |
| JP | 2012-110489 | | 6/2012 |
| JP | 2012-121748 | | 6/2012 |
| JP | 2013-028497 | | 2/2013 |
| JP | 5476206 | B2 | 4/2014 |
| JP | 5522606 | B2 | 6/2014 |
| JP | 5536056 | B2 | 7/2014 |
| JP | 5601183 | B2 | 10/2014 |
| JP | 2014-215985 | | 11/2014 |
| JP | 2014-216596 | | 11/2014 |
| JP | 2015-518562 | A | 7/2015 |
| JP | 5764059 | B2 | 8/2015 |
| JP | 2015-167176 | | 9/2015 |
| JP | 2015-529328 | | 10/2015 |
| JP | 5828036 | B2 | 12/2015 |
| JP | 5831947 | B2 | 12/2015 |
| WO | WO-87/04028 | A1 | 7/1987 |
| WO | WO-88/04032 | A1 | 6/1988 |
| WO | WO-95/33972 | A1 | 12/1995 |
| WO | WO-2009/073736 | | 6/2009 |
| WO | WO-2011/046403 | A2 | 4/2011 |
| WO | WO-2011/153339 | A1 | 12/2011 |
| WO | WO-2012/016977 | A2 | 2/2012 |
| WO | WO-2012/084750 | | 6/2012 |
| WO | WO-2013/027074 | | 2/2013 |
| WO | WO-2013/059404 | A1 | 4/2013 |
| WO | WO-2013/066446 | A1 | 5/2013 |
| WO | WO-2013/066448 | | 5/2013 |
| WO | WO-2013/093136 | A1 | 6/2013 |
| WO | WO-2013/188732 | A1 | 12/2013 |

(56) References Cited

FOREIGN PATENT DOCUMENTS

| | | |
|---|---|---|
| WO | WO-2013/190329 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |
| WO | WO-2014/166883 A1 | 10/2014 |
| WO | WO-2014/210486 A1 | 12/2014 |
| WO | WO-2015/015172 A1 | 2/2015 |
| WO | WO-2015/142945 | 9/2015 |
| WO | WO-2015/157110 A1 | 10/2015 |
| WO | WO-2015/157290 A1 | 10/2015 |
| WO | WO-2015/158383 A1 | 10/2015 |
| WO | WO-2015/193156 A1 | 12/2015 |
| WO | WO-2016/075226 A1 | 5/2016 |
| WO | WO-2016/118756 A1 | 7/2016 |
| WO | WO-2016/118791 A1 | 7/2016 |
| WO | WO-2016/122965 A1 | 8/2016 |
| WO | WO-2016/122966 A1 | 8/2016 |
| WO | WO-2016/126435 A1 | 8/2016 |
| WO | WO-2016/126436 A1 | 8/2016 |
| WO | WO-2016/190909 A2 | 12/2016 |
| WO | WO-2017/007513 A1 | 1/2017 |
| WO | WO-2017/007514 A1 | 1/2017 |
| WO | WO-2017/014807 A1 | 1/2017 |
| WO | WO-2017/039747 A1 | 3/2017 |
| WO | WO-2017/095454 A1 | 6/2017 |
| WO | WO-2017/127079 A1 | 7/2017 |
| WO | WO-2017/127080 A1 | 7/2017 |
| WO | WO-2017/127081 A1 | 7/2017 |
| WO | WO-2017/127085 A1 | 7/2017 |
| WO | WO-2017/127090 A1 | 7/2017 |
| WO | WO-2017/127091 A1 | 7/2017 |
| WO | WO-2017/127093 A1 | 7/2017 |
| WO | WO-2017/127094 A1 | 7/2017 |
| WO | WO-2017/127095 A1 | 7/2017 |
| WO | WO-2017/127096 A1 | 7/2017 |
| WO | WO-2017/127097 A1 | 7/2017 |
| WO | WO-2017/127098 A1 | 7/2017 |

OTHER PUBLICATIONS

European Extended Search Report for Appl. Ser. No. 16740794.9 dated Nov. 12, 2018, 12 pages.

Halbach et al., "Design of Permanent Multipole Magnets with Oriented Rare Earth Cobalt Material", Nuclear Instruments and Methods, North Holland Publishing Co., Amsterdam, NL., vol. 169, Jan. 1, 1980, pp. 1-5, XP001032085, DOI: 10.1016/0029-554X(80) 90094-4.

Hodges et al., "Time-keeping with electron spin states in diamond", Dept. of Electrical Engineering and Dept. of Applied Physics and Applied Mathematics, Columbia University, New York, New York 10027, Aug. 30, 2011, 13 pages.

Hodges et al., Appendix, "Time-keeping with electron spin states in diamond", Dept. of Electrical Engineering and Dept. of Applied Physics and Applied Mathematics, Columbia University, New York, New York 10027, Aug. 27, 2012, 46 pages.

International Search Report and Written Opinion for PCT Appl. Ser. No. PCT/US2018/041527 dated Feb. 4, 2019, 22 pages.

U.S. Ex Parte Quayle Action for U.S. Appl. No. 15/468,641 dated Nov. 28, 2018, 11 pages.

U.S. Non-Final Office Action for U.S. Appl. No. 15/003,177 dated Jan. 14, 2019, 15 pages.

U.S. Non-Final Office Action for U.S. Appl. No. 15/003,670 dated Nov. 27, 2018, 14 pages.

U.S. Non-Final Office Action for U.S. Appl. No. 15/382,045 dated Dec. 31, 2018, 16 pages.

U.S. Non-Final Office Action for U.S. Appl. No. 15/400,794 dated Jan. 10, 2019, 6 pages.

U.S. Non-Final Office Action for U.S. Appl. No. 15/468,356 dated Jan. 2, 2019, 10 pages.

U.S. Non-Final Office Action for U.S. Appl. No. 15/468,951 dated Dec. 13, 2018, 9 pages.

U.S. Notice of Allowance for U.S. Appl. No. 15/003,670 dated Feb. 1, 2019, 7 pages.

U.S. Notice of Allowance for U.S. Appl. No. 15/350,303 dated Dec. 26, 2018, 10 pages.

U.S. Notice of Allowance for U.S. Appl. No. 15/450,504 dated Dec. 13, 2018, 7 pages.

U.S. Notice of Allowance for U.S. Appl. No. 15/454,162 dated Jan. 17, 2019, 8 pages.

U.S. Notice of Allowance for U.S. Appl. No. 15/468,397 dated Dec. 12, 2018, 5 pages.

U.S. Notice of Allowance for U.S. Appl. No. 15/468,641 dated Feb. 7, 2019, 10 pages.

U.S. Notice of Allowance for U.S. Appl. No. 15/479,256 dated Feb. 4, 2019, 7 pages.

U.S. Notice of Allowance dated Oct. 19, 2017, from related U.S. Appl. No. 15/179,957, 5 pages.

U.S. Notice of Allowance dated Oct. 23, 2017, from related U.S. Appl. No. 15/003,797, 6 pages.

U.S. Office Action dated Nov. 24, 2017, from related U.S. Appl. No. 15/003,145, 14 pages.

U.S. Office Action dated Nov. 27, 2017, from related U.S. Appl. No. 15/468,386, 28 pages.

International Search Report and Written Opinion for PCT Appl. Ser. No. PCT/US2019/022097 dated May 15, 2019, 13 pages.

U.S. Final Office Action for U.S. Appl. No. 15/003,309 dated May 23, 2019, 8 pages.

U.S. Non-Final Office Action for U.S. Appl. No. 15/468,274 dated May 14, 2019, 15 pages.

U.S. Non-Final Office Action for U.S. Appl. No. 15/468,303 dated Jun. 25, 2019, 14 pages.

U.S. Notice of Allowance for U.S. Appl. No. 15/419,832 dated Jun. 24, 2019, 5 pages.

U.S. Notice of Allowance for U.S. Appl. No. 15/443,422 dated Jul. 23, 2019, 10 pages.

U.S. Notice of Allowance for U.S. Appl. No. 15/469,374 dated Jun. 20, 2019, 5 pages.

"'Diamond Sensors, Detectors, and Quantum Devices' in Patent Application Approval Process," Chemicals & Chemistry, pp. 1-6, (Feb. 28, 2014), 6 pages.

"Findings from University of Stuttgart in physics reported," Science Letter, (Jul. 7, 2009), 2 pages.

"New Findings on Nitrogen from Ecole Normale Superieure Summarized (Magnetic imaging with an ensemble of nitrogen vacancy-centers in diamond)," Physics Week, pp. 1-2, (Jul. 21, 2015), 2 pages.

"Patent Issued for Diamond Sensors, Detectors, and Quantum Devices (U.S. Pat. No. 9,249,526)," Journal of Engineering, pp. 1-5 (Feb. 15, 2016), 5 pages.

"Researchers Submit Patent Application, 'Diamond Sensors, Detectors, and Quantum Devices', for Approval," Chemicals & Chemistry, pp. 1-7, (Apr. 11, 2014), 7 pages.

Acosta et al., "Broadband magnetometry by infrared-absorption detection of nitrogen-vacancy ensembles in diamond," Appl. Phys. Letters 97: 174104 (Oct. 29, 2010), 4 pages.

Acosta et al., "Diamonds with a high density of nitrogen-vacancy centers for magnetometry applications," Physical Review B 80(115202): 1-15 (Sep. 9, 2009), 15 pages.

Acosta et al., "Nitrogen-vacancy centers: physics and applications," MRS Bulletin 38(2): 127-130 (Feb. 2013), 4 pages.

Acosta, "Optical Magnetometry with Nitrogen-Vacancy Centers in Diamond," University of California Berkeley, (Spring 2011), 118 pages.

Aiello et al., "Composite-pulse magnetometry with a solid-state quantum sensor," Nature Communications 4(1419): 1-6 (Jan. 29, 2013), 6 pages.

Alam, "Solid-state 13C magic angle spinning NMR spectroscopy characterization of particle size structural variations in synthetic nanodiamonds," Materials Chemistry and Physics 85(2-3): 310-315 (Jun. 15, 2004), 6 pages.

Albrecht et al., "Coupling of nitrogen vacancy centres in nanodiamonds by means of phonons," New Journal of Physics 15(083014): 1-26 (Aug. 6, 2013), 27 pages.

(56) References Cited

OTHER PUBLICATIONS

Appel et al., "Nanoscale microwave imaging with a single electron spin in diamond," New Journal of Physics 17(Nov. 2001): 1-6 (Nov. 3, 2015), 7 pages.
Arai et al., "Fourier magnetic imaging with nanoscale resolution and compressed sensing speed-up using electronic spins in diamond," Nature Nanotechnology 10: 859-864 (Aug. 10, 2015), 7 pages.
Aslam et al., "Single spin optically detected magnetic resonance with 60-90 GHz (E-band) microwave resonators," Review of Scientific Instruments 86(064704): 1-8 (Jun. 22, 2015), 9 pages.
Awschalom et al., "Diamond age of spintronics," Scientific American 297: 84-91 (Oct. 2007), 8 pages.
Babamoradi et al., "Correlation between entanglement and spin density in nitrogen-vacancy center of diamond," European Physical Journal D 65: 597-603 (Dec. 1, 2011), 7 pages.
Babunts et al., "Diagnostics of NV defect structure orientation in diamond using optically detected magnetic resonance with a modulated magnetic field," Technical Physics Letters 41(6): 583-586 (Jun. 2015; first published online Jul. 14, 2015), 4 pages.
Babunts et al., "Temperature-scanned magnetic resonance and the evidence of two-way transfer of a nitrogen nuclear spin hyperfine interaction in coupled NV-N pairs in diamond," JETP Letters 95(8): 429-432 (Jun. 27, 2012), 4 pages.
Bagguley et al., "Zeeman effect of acceptor states in semiconducting diamond," Journal of the Physical Society of Japan 21(Supplement): 244-248 (1966), 7 pages.
Balasubramanian et al., "Nanoscale imaging magnetometry with diamond spins under ambient conditions," Nature 455: 648-651 (Oct. 2, 2008), 5 pages.
Balmer et al., "Chemical Vapour deposition synthetic diamond: materials technology and applications," J. of Physics: Condensed Matter 21(36): 1-51 (Aug. 19, 2009), 51 pages.
Baranov et al., "Enormously High Concentrations of Fluorescent Nitrogen-Vacancy Centers Fabricated by Sintering of Detonation Nanodiamonds," Small 7(11): 1533-1537 (Jun. 6, 2011; first published online Apr. 26, 2011), 5 pages.
Barfuss et al., "Strong mechanical driving of a single electron spin," Nature Physics 11: 820-824 (Aug. 3, 2015), 6 pages.
Barry et al., "Optical magnetic detection of single-neuron action potentials using quantum defects in diamond," as submitted to Quantum Physics on Feb. 2, 2016, 23 pages.
Bennett et al., "CVD Diamond for High Power Laser Applications," SPIE 8603, High-Power Laser Materials Processing: Lasers, Beam Delivery, Diagnostics, and Applications II, 860307 (Feb. 22, 2013), 10 pages.
Berman & Chernobrod, "Single-spin microscope with sub-nanoscale resolution based on optically detected magnetic resonance," SPIE 7608, Quantum Sensing and Nanophotonic Devices VII, 76080Y (Jan. 23, 2010), 4 pages.
Berman et al. "Measurement of single electron and nuclear spin states based on optically detected magnetic resonance," J. Physics: Conf. Series 38: 167-170 (2006), 5 pages.
Blakley et al., "Room-temperature magnetic gradiometry with fiber-coupled nitrogen-vacancy centers in diamond," Optics Letters 40(16): 3727-3730 (Aug. 5, 2015), 4 pages.
Bourgeois, et al., "Photoelectric detection of electron spin resonance of nitrogen-vacancy centres in diamond," Nature Communications 6(8577): 1-8 (Oct. 21, 2015), 8 pages.
Brenneis, et al. "Ultrafast electronic readout of diamond nitrogen-vacancy centres coupled to graphene." Nature nanotechnology 10.2 (2015): 135-139.
Bucher et al, "High Resolution Magnetic Resonance Spectroscopy Using Solid-State Spins", May 25, 2017, downloaded from https://arxiv.org/ (arXiv.org > quant-ph > arXiv:1705.08887) on May 25, 2017, pp. 1-24.
Budker & Kimball, "Optical Magnetometry," Cambridge Press, (2013), 11 pages.
Budker & Romalis, "Optical Magnetometry," Nature Physics 3: 227-243 (Apr. 2007), 8 pages.
Casanova, et al., "Effect of magnetic field on phosphorus centre in diamond," Physica Status Solidi A 186(2): 291-295 (Jul. 30, 2001), 6 pages.
Castelletto, et al., "Frontiers in diffraction unlimited optical methods for spin manipulation, magnetic field sensing and imaging using diamond nitrogen vacancy defects," Nanophotonics 1(2): 139-153 (Nov. 2012), 15 pages.
Chapman, et al., "Anomalous saturation effects due to optical spin depolarization in nitrogen-vacancy centers in diamond nanocrystals," Physical Review B 86(045204): 1-8 (Jul. 10, 2012), 8 pages.
Chavez, et al. "Detecting Arctic oil spills with NMR: a feasibility study." Near Surface Geophysics 13.4 (Feb. 2015): 409-416.
Chen et al., "Vector magnetic field sensing by a single nitrogen vacancy center in diamond," EPL 101(67003): 1-5 (Mar. 2013), 6 pages.
Chernobrod et al., "Improving the sensitivity of frequency modulation spectroscopy using nanomechanical cantilevers," Applied Physics Letters 85(17): 3896-3898 (Oct. 25, 2004), 3 pages.
Chernobrod et al., "Spin Microscope Based on Optically Detected Magnetic Resoncance," Journal of Applied Physics 97(014903): 1-3, (2005; first published online Dec. 10, 2004), 4 pages.
Childress et al., "Coherent dynamics of coupled electron and nuclear spin qubits in diamond," Science 314(5797): 281-285 (Oct. 13, 2006), 6 pages.
Chipaux et al., "Magnetic imaging with an ensemble of nitrogen vacancy-centers in diamond," European Physical Journal D 69(166): 1-10 (Jul. 2, 2015), 10 pages.
Chipaux et al., "Nitrogen vacancies (NV) centers in diamond for magnetic sensors and quantum sensing," SPIE 9370, Quantum Sensing and Nanophotonic Devices XII, 93701V (Feb. 8, 2015), 6 pages.
Chipaux, et al., "Wide bandwidth instantaneous radio frequency spectrum analyzer based on nitrogen vacancy centers in diamond," Applied Physics Letters 107(233502): 1-5 (2015), 6 pages.
Clevenson et al., "Broadband magnetometry and temperature sensing with a light-trapping diamond waveguide," Nature Physics 11: 393-397 (May 2015; first published online Apr. 6, 2015), 6 pages.
Constable, "Geomagnetic Spectrum, Temporal." in Encyclopedia of Geomagnetism and Paleomagnetism, pp. 353-355, Springer: Dordrecht, Netherlands (2007), 3 pages.
Cooper et al., "Time-resolved magnetic sensing with electronic spins in diamond," Nature Communications 5:3141: 1-7 (Jan. 24, 2014), 7 pages.
Creedon et al., "Strong coupling between P1 diamond impurity centers and a three-dimensional lumped photonic microwave cavity," Physical Review B 91(140408R): 1-5 (Apr. 24, 2015), 5 pages.
Dale, et al. "Medical applications of diamond magnetometry: commercial viability." arXiv preprint arXiv:1705.01994 (May 8, 2017), pp. 1-7.
Davies, "Current problems in diamond: towards a quantitative understanding," Physica B 273-274: 15-13 (Dec. 15, 1999), 9 pages.
De Lange et al., "Single-Spin Magnetometry with Multipulse Sensing Sequences," Physical Review Letters 106(080802): 1-4 (Feb. 24, 2011), 4 pages.
Degen, "Scanning magnetic field microscope with a diamond single-spin sensor," Applied Physics Letters 92(243111): 1-3 (Jun. 17, 2008), 3 pages.
Delacroix et al., "Design, manufacturing, and performance analysis of mid-infrared achromatic half-wave plates with diamond subwavelength gratings," Applied Optics 51(24): 5897-5902 (Aug. 16, 2012), 6 pages.
Denatale et al., "Fabrication and characterization of diamond moth eye antireflective surfaces on Ge," J. of Applied Physics 71: 1388-1393 (Mar. 1992), 8 pages.
Dobrovitski et al., "Quantum Control over Single Spins in Diamond," Annual Review of Condensed Matter Physics 4: 23-50 (Apr. 2013), 30 pages.
Doherty et al., "The nitrogen-vacancy colour centre in diamond," Physics Reports 528: 1-45 (Jul. 1, 2013), 45 pages.
Doherty et al., "Theory of the ground-state spin of the NV-center in diamond," Physical Review B 85(205203): 1-21 (May 3, 2012), 21 pages.

(56) References Cited

OTHER PUBLICATIONS

Doi et al., "Pure negatively charged state of the NV center in n-type diamond," Physical Review B 93(081203): 1-6 (Feb. 3, 2016), 6 pages.
Drake et al., "Influence of magnetic field alignment and defect concentration on nitrogen-vacancy polarization in diamond," New Journal of Physics 18(013011): 1-8 (Jan. 2016; first published on Dec. 24, 2015), 9 pages.
Dreau et al., "Avoiding power broadening in optically detected magnetic resonance of single NV defects for enhanced dc magnetic field sensitivity," Physical Review B 84(195204): 1-8 (Nov. 23, 2011), 8 pages.
Dreau et al., "High-resolution spectroscopy of single NV defects coupled with nearby 13C nuclear spins in diamond," Physical Review B 85(134107): 1-7 (Apr. 20, 2012), 7 pages.
Dumeige et al., "Magnetometry with nitrogen-vacancy ensembles in diamond based on infrared absorption in a doubly resonant optical cavity," Physical Review B 87(155202): 1-9 (Apr. 8, 2013), 9 pages.
Epstein et al., "Anisotropic interactions of a single spin and dark-spin spectroscopy in diamond," Nature Physics 1:94-98 (Nov. 2005), 5 pages.
Fallah et al., "Multi-sensor approach in vessel magnetic wake imaging," Wave Motion 51(1): 60-76 (Jan. 2014), retrieved from http://www.sciencedirect.com/science/article/pii/S0165212513001133 (Aug. 21, 2016).
Fedotov et al., "High-resolution magnetic field imaging with a nitrogen-vacancy diamond sensor integrated with a photonic-crystal fiber," Optics Letters 41(3): 472-475 (Feb. 1, 2016; published Jan. 25, 2016), 4 pages.
Fedotov et al., "Photonic-crystal-fiber-coupled photoluminescence interrogation of nitrogen vacancies in diamond nanoparticles," Laser Physics Letters 9(2): 151-154 (Feb. 2012; first published online Dec. 2, 2011), 5 pages.
Feng & Wei, "A steady-state spectral method to fit microwave absorptions of NV centers in diamonds: application to sensitive magnetic field sensing," Measurement Science & Technology 25(105102): 1-6 (Oct. 2014; first published online Aug. 29, 2014), 7 pages.
Fologea, et al. "Detecting single stranded DNA with a solid state nanopore." Nano Letters 5.10 (Aug. 15, 2005): 1905-1909.
Freitas, et al., "Solid-State Nuclear Magnetic Resonance (NMR) Methods Applied to the Study of Carbon Materials," Chemistry and Physics of Carbon, vol. 31 (2012), 45 pages.
Gaebel, et al. "Room-temperature coherent coupling of single spins in diamond." Nature Physics 2.6 (May 28, 2006): 408-413.
GB Examination Report from United Kingdom application No. GB 1618202.4 dated Jan. 10, 2017.
Geiselmann et al., "Fast optical modulation of the fluorescence from a single nitrogen-vacancy centre," Nature Physics 9: 785-789 (Dec. 2013; first published online Oct. 13, 2013), 5 pages.
Gombert & Blasi, "The Moth-Eye Effect-From Fundamentals to Commercial Exploitation," Functional Properties of Bio-Inspired Surfaces: 79-102, (Nov. 2009), 26 pages.
Gong et al., "Generation of Nitrogen-Vacancy Center Pairs in Bulk Diamond by Molecular Nitrogen Implantation," Chinese Physics Letters 33(2)(026105): 1-4 (Feb. 2016), 5 pages.
Gould et al., "An imaging magnetometer for bio-sensing based on nitrogen-vacancy centers in diamond," SPIE 8933, Frontiers in Biological Detection: From Nanosensors to Systems VI, 89330L (Mar. 18, 2014), 8 pages.
Gould et al., "Room-temperature detection of a single 19 nm superparamagnetic nanoparticle with an imaging magnetometer," Applied Physics Letters 105(072406): 1-4 (Aug. 19, 2014), 5 pages.
Gruber et al., "Scanning confocal optical microscopy and magnetic resonance on single defect centers," Science 276(5321): 2012-2014 (Jun. 27, 1997), 4 pages.
Haeberle et al., "Nanoscale nuclear magnetic imaging with chemical contrast," Nature Nanotechnology 10: 125-128 (Feb. 2015; first published online Jan. 5, 2015), 4 pages.
Haihua et al., "Design of wideband anti-reflective sub wavelength nanostructures," Infrared and Laser Engineering 40(2): 267-270 (Feb. 2011), 4 pages.
Hall et al., "Sensing of Fluctuating Nanoscale Magnetic Fields Using Nitrogen-Vacancy Centers in Diamond," Physical Review Letters 103(220802): 1-4 (Nov. 25, 2009), 4 pages.
Hanson et al., "Coherent Dynamics of a Single Spin Interacting with an Adjustable Spin Bath," Science 320(5874): 352-355 (Apr. 18, 2008), 5 pages.
Hanson et al., "Polarization and Readout of Coupled Single Spins in Diamond," Physical Review Letters 97(087601): 1-4 (Aug. 23, 2006), 4 pages.
Hanson et al., "Room-temperature manipulation and decoherence of a single spin in diamond," Physical Review 74(161203): 1-4 (Oct. 26, 2006), 4 pages.
Hanzawa et al., "Zeeman effect on the zero-phonon line of the NV center in synthetic diamond," Physica B 184(1-4): 137-140 (Feb. 1993), 4 pages.
Heerema, et al. "Graphene nanodevices for DNA sequencing." Nature nanotechnology 11.2 (Feb. 3, 2016): 127-136.
Hegyi & Yablonovitch, "Molecular imaging by optically detected electron spin resonance of nitrogen-vacancies in nanodiamonds," Nano Letters 13(3): 1173-1178 (Mar. 2013; first published online Feb. 6, 2013), 6 pages.
Hegyi & Yablonovitch, "Nanodiamond molecular imaging with enhanced contrast and expanded field of view," Journal of Biomedical Optics 19(1)(011015): 1-8 (Jan. 2014), 9 pages.
Hilser et al., "All-optical control of the spin state in the NV-center in diamond," Physical Review B 86(125204): 1-8 (Sep. 14, 2012), 8 pages.
Hobbs, "Study of the Environmental and Optical Durability of AR Microstructures in Sapphire, ALON, and Diamond," SPIE 7302, Window and Dome Technologies and Materials XI, 73020J (Apr. 27, 2009), 14 pages.
Huebener et al., "ODMR of NV centers in nano-diamonds covered with N@C60," Physica Status Solidi B 245(10): 2013-2017 (Oct. 2008; first published online Sep. 8, 2008), 5 pages.
Huxter et al., "Vibrational and electronic dynamics of nitrogen-vacancy centres in diamond revealed by two-dimensional ultrafast spectroscopy," Nature Physics 9: 744-749 (Sep. 29, 2013), 6 pages.
International Search Report and Written Opinion from related PCT application PCT/US2017/035315 dated Aug. 24, 2017, 7 pages.
International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written Opinion of the International Searching Authority dated Apr. 4, 2017 from related PCT application PCT/US16/68366, 9 pages.
International Search Report and Written Opinion of the International Searching Authority dated Feb. 15, 2017 from related PCT application PCT/US2016/014390, 20 pages.
International Search Report and Written opinion of the International Searching Authority dated Jul. 12, 2016, from related PCT application PCT/US2016/014287, 14 pages.
International Search Report and Written Opinion of the International Searching Authority dated Jul. 16, 2015, from related PCT application PCT/US2015/24723, 8 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.

(56) References Cited

OTHER PUBLICATIONS

International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 10, 2016 from related PCT application PCT/US2016/014290, 11 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 2, 2016, from related PCT application PCT/US2016/014386, 14 pages.
International Search Report and Written Opinion of the International Searching Authority dated Jun. 2, 2016, from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Jun. 9, 2017, from related patent application PCT/US2017/024181, 13 pages.
International Search Report and Written Opinion of the International Searching Authority dated Jun. 9, 2017, from related PCT application PCT/US2017/024179, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016, from related PCT application PCT/US2016/014363, 8 pages.
International Search Report and Written Opinion of the International Searching Authority dated Mar. 25, 2016, from related PCT application PCT/US2016/014389, 19 pages.
International Search Report and Written Opinion of the International Searching Authority dated Mar. 27, 2017 from related PCT application PCT/US16/68344, 16 pages.
International Search Report and Written Opinion of the International Searching Authority dated Mar. 28, 2016, from related PCT application PCT/US2016/014380, 9 pages.
International Search Report and Written Opinion of the International Searching Authority dated Mar. 28, 2016, from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016, from related PCT application PCT/US2016/014328, 7 pages.
International Search Report and Written Opinion of the International Searching Authority dated Mar. 29, 2016, from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017, from related PCT application PCT/US2017/021593, 10 pages.
International Search Report and Written Opinion of the International Searching Authority dated May 19, 2017, from related PCT application PCT/US17/18099, 16 pages.
International Search Report and Written Opinion of the International Searching Authority dated May 26, 2016, from related PCT application PCT/US2016/014331, 15 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.
International Search Report and Written Opinion of the International Searching Authority dated May 8, 2017 from related PCT application PCT/US2017/17321, 17 pages.
International Search Report and Written Opinion of the International Searching Authority dated Sep. 13, 2016, from related PCT application PCT/US16/14377, 11 pages.
International Search Report and Written Opinion of the International Searching Authority dated Jul. 14, 2017, from related PCT application PCT/US2017/022118, 13 pages.
International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.
International Search Report and Written Opinion of the International Searching Authority dated Jun. 15, 2017, from related PCT application PCT/US2017/024182, 21 pages.
International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169, 11 pages.
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168, 7 pages.
International Search Report and Written Opinion of the International Searching Authority dated Jun. 6, 2017, from related PCT application PCT/2017/024165, 9 pages.

(56) References Cited

OTHER PUBLICATIONS

International Search Report and Written Opinion of the International Searching Authority dated Jun. 6, 2017, from related PCT application PCT/US2017/024172, 9 pages.
Ivady et al., "Pressure and temperature dependence of the zero-field splitting in the ground state of NV centers in diamond: A first-principles study," Physical Review B 90(235205): 1-8 (Dec. 2014), 8 pages.
Jarmola et al., "Temperature- and Magnetic-Field-Dependent Longitudinal Spin Relaxation in Nitrogen-Vacancy Ensembles in Diamond," Physical Review Letters 108 (197601): 1-5 (May 2012), 5 pages.
Jensen et al., "Light narrowing of magnetic resonances in ensembles of nitrogen-vacancy centers in diamond," Physical Review B 87(014115): 1-10 (Jan. 2013), 10 pages.
Kailath, "Linear Systems," Prentice Hall, (1979), 6 pages.
Karlsson et al., "Diamond micro-optics: microlenses and antireflection structures surfaces for the infrared spectral region," Optics Express 11(5): 502-507 (Mar. 10, 2003), 6 pages.
Keyser "Enhancing nanopore sensing with DNA nanotechnology." Nature nanotechnology 11.2 (Feb. 2016): 106-108.
Khan & Hemmer, "Noise limitation in nano-scale imaging," Proceedings of SPIE vol. 5842: 302305, (Dec. 2005), 7 pages.
Kim et al., "Electron spin resonance shift and linewidth broadening of nitrogen-vacancy centers in diamond as a function of electron irradiation dose," Applied Physics Letters 101(082410): 1-5 (Aug. 2012), 6 pages.
Kim et al., "Jahn-Teller Splitting and Zeeman Effect of Acceptors in Diamond," Physica B 273-274: 647-627 (Jul. 1999), 4 pages.
Kim et al., "Magnetospectroscopy of acceptors in 'blue' diamonds," Physica B 302-301: 88-100 (Aug. 2001), 13 pages.
Kim et al., "Zeeman effect of electronic Raman lines of accepters in elemental semiconductors: Boron in blue diamond," Physical Review B 62(12): 8038-8052 (Sep. 2000), 15 pages.
King et al., "Optical polarization of 13C nuclei in diamond through nitrogen vacancy centers," Physical Review B 81(073201): 1-4 (Feb. 2010), 4 pages.
Kok et al., "Materials Science: Qubits in the pink," Nature 444(2): 49 (Nov. 2006), 1 page.
Konenko et al., "Formation of antireflective surface structures on diamond films by laser patterning," Applied Physics A 68:99-102 (Jan. 1999), 4 pages.
Kraus et al., "Magnetic field and temperature sensing with atomic-scale spin defects in silicon carbide," Scientific Reports 4(5303): 1-8 (Jul. 2014), 8 pages.
Lai et al., "Influence of a static magnetic field on the photoluminescence of an ensemble of nitrogen-vacancy color centers in a diamond single-crystal," Applied Physics Letters 95, (Sep. 2009), 4 pages.
Lai et al., "Optically detected magnetic resonance of a single Nitrogen-Vacancy electronic spin in diamond nanocrystals," CLEO/EQEC, (Jun. 14-19, 2009), 1 page.
Laraoui et al., "Nitrogen-vacancy assisted magnetometry of paramagnetic centers in an individual diamond nanocrystal," Nano Letters 12: 3477-3482 (Jul. 2012), 6 pages.
Lazariev et al., "A nitrogen-vacancy spin based molecular structure microscope using multiplexed projection reconstruction," Scientific Reports 5(14130): 1-8 (Sep. 2015), 8 pages.
Le Sage et al., "Efficient photon detection from color centers in a diamond optical waveguide," Phys. Rev. B 85: 121202(R), pp. 121202-1-121202-4, (Mar. 23, 2012), 4 pages.
Lee et al., "Vector magnetometry based on S=3/2 electronic spins," Physical Review B 92 (115201): 1-7 (Sep. 2015), 7 pages.
Lesik et al., "Preferential orientation of NV defects in CVD diamond films grown on (113)-oriented substrates," Diamond and Related Materials 56: 47-53 (Jun. 2015), 7 pages.
Levchenko et al., "Inhomogeneous broadening of optically detected magnetic resonance of the ensembles of nitrogen-vacancy centers in diamond by interstitial carbon atoms," Applied Physics Letters 106, (Mar. 2015; published online Mar. 9, 2015), 6 pages.
Lindsay "The promises and challenges of solid-state sequencing." Nature nanotechnology 11.2 (Feb. 2016): 109-111.
Liu et al., "Electron spin studies of nitrogen vacancy centers in nanodiamonds," Acta Physica Sinica 62(16) 164208: 1-5 (Aug. 2013), 5 pages.
Liu et al., "Fiber-integrated diamond-based magnetometer," Applied Physics Letters 103(143105): 14 (Sep. 2013), 5 pages.
MacLaurin et al., "Nanoscale magnetometry through quantum control of nitrogen-vacancy centres in rotationally diffusing nanodiamonds," New Journal of Physics 15, (Jan. 2013), 16 pages.
MacQuarie et al., "Mechanical spin control of nitrogen-vacancy centers in diamond," Retrieved from http://www.arxiv.org/pdf/1306.6356.pdf, pp. 1-8, (Jun. 2013), 8 pages.
Macs et al., "Diamond as a magnetic field calibration probe," Journal of Physics D: Applied Physics 37, (Apr. 2004; published Mar. 17, 2004), 6 pages.
Maletinsky et al., "A robust scanning diamond sensor for nanoscale imaging with single nitrogen-vacancy centres," Nature Nanotechnology 7: 320-324, (May 2012; published Apr. 15, 2012), 5 pages.
Mamin et al., "Multipulse Double-Quantum Magnetometry with Near-Surface Nitrogen-Vacancy Centers," Physical Review Letters 13(030803): 1-5 (Jul. 2014), 5 pages.
Mamin et al., "Nanoscale Nuclear Magnetic Resonance with a Nitrogen-Vacancy Spin Sensor," Science 339, (Feb. 2013), 5 pages.
Manson et al., "GR transitions in diamond: magnetic field measurements," Journal of Physics C Solid St. Phys 13: L1005-L1009, (Nov. 1980), 6 pages.
Massachusetts Institute of Technology, "Wide-Field Imaging Using Nitrogen Vacancies," in Patent Application Approval Process, Physics Week: 1-5, (Jan. 20, 2015), 5 pages.
Matlashov, et al. "SQUIDs for magnetic resonance imaging at ultra-low magnetic field." PIERS online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.
Matsuda et al., "Development of a plastic diamond anvil cell for high pressure magneto-photoluminescence in pulsed high magnetic fields," International Journal of Modern Physics B 18(27-29), (Nov. 2004), 7 pages.
Maze et al., "Nanoscale magnetic sensing using spin qubits in diamond," Proc. SPIE 7225, Advanced Optical Concepts in Quantum Computing, Memory, and Communication II, 722509 (Feb. 2, 2009) 8 pages.
Maze et al., "Nanoscale magnetic sensing with an individual electronic spin in diamond," Nature Physics 455: 644-647 (Oct. 2, 2008), 5 pages.
Meijer et al., "Generation of single color centers by focused nitrogen implantation," Applied Physics Letters 87(261909): 1-3 (Dec. 2005), 4 pages.
Michaelovich et al., "Polarization Dependencies of the Nitrogen-Vacancy Center." Undergraduate Project Report, Ben-Gurion University, Aug. 2015, pp. 1-9.
Millot et al., "High-field Zeeman and Paschen-Back effects at high pressure in oriented ruby," Physical Review B 78 (155125): 1-7 (Oct. 2008), 7 pages.
Moessle, et al. "Squid-detected magnetic resonance imaging in microtesla fields." Annu. Rev. Biomed. Eng. 9 (May 23, 2008): 389-413.
Moriyama et al., "Importance of electron-electron interactions and Zeeman splitting in single-wall carbon nanotube quantum dots," Physica E 26: 473-476 (Feb. 2005), 4 pages.
Mrozek et al., "Circularly polarized microwaves for magnetic resonance study in the GHz range: Application to nitrogen-vacancy in diamonds," Applied Physics Letters, pp. 1-4 (Jul. 2015), 4 pages.
Nagl et al., "Improving surface and defect center chemistry of fluorescent nanodiamonds for imaging purposes—a review," Analytical and Bioanalaytical Chemistry 407: 7521-7536 (Oct. 2015; published online Jul. 29, 2015), 16 pages.
Neumann et al., "Excited-state spectroscopy of single NV defects in diamond using optically detected magnetic resonance," New Journal of Physics 11(013017): 1-10, (Jan. 2009), 11 pages.

(56) References Cited

OTHER PUBLICATIONS

Nizovtsev & Kilin, "Optically Detected Magnetic Resonance Spectra of the 14NV-13C Spin Systems in Diamond: Analytical Theory and Experiment," Doklady of the National Academy of Sciences of Belarus, (2013), 27 pages with English machine translation.

Nizovtsev et al., "Modeling fluorescence of single nitrogen-vacancy defect centers in diamond," Physica B—Condensed Matter, 608-611 (Dec. 2001), 4 pages.

Nizovtsev et al., "Theoretical study of hyperfine interactions and optically detected magnetic resonance spectra by simulation of the C-291(NV)H-(172) diamond cluster hosting nitrogen-vacancy center," New Journal of Physics 16(083014): 1-21 (Aug. 2014), 22 pages.

Nobauer et al., "Smooth optimal quantum control for robust solid state spin magnetometry," Retrieved from http://www.arxiv.org/abs/1412.5051, pp. 1-12, (Dec. 2014), 12 pages.

Nowodzinski et al., "Nitrogen-Vacancy centers in diamond for current imaging at the redistributive layer level of Integrated Circuits," Microelectronics Reliability 55: 1549-1553 (Aug. 2015), 5 pages.

Nusran et al., "Optimizing phase-estimation algorithms for diamond spin magnetometry," Physical Review B 90(024422): 1-12 (Jul. 2014), 12 pages.

Ohashi et al., "Negatively Charged Nitrogen-Vacancy Centers in a 5 nm Thin 12C Diamond Film," Nano Letters 13: 4733-4738 (Oct. 2013), 6 pages.

Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.

Plakhotnik et al., "Super-Paramagnetic Particles Chemically Bound to Luminescent Diamond : Single Nanocrystals Probed with Optically Detected Magnetic Resonance," Journal of Physical Chemistry C 119: 20119-20124 (Aug. 2015), 6 pages.

Polatomic. "AN/ASQ 233A Digital Magnetic Anomaly Detective Set." Retrieved May 9, 2016, from http://polatomic.com/images/DMAD_Data_Sheet_09-2009.pdf (2009), 1 page.

Poole, "What is GMSK Modulation—Gaussian Minimum Shift Keying." Radio-Electronics, retrieved from https://web.archive.org/web/20150403045840/http://www.radio-electronics.com /info/rf-technology-design/pm-phase-modulation/what-is-gmsk-gaussian-minimum-shift-keyingtutorial.php (Apr. 3, 2015), 4 pages.

Qiu et al., "Low-field NMR Measurement Procedure when Squid Detection is Used," IEEE/CSC & ESAS European Superconductivity News Forum, No. 5, Jul. 2008.

Qiu, et al. "Squid-detected NMR in Earth's magnetic field." Journal of Physics: Conference Series. vol. 97. No. 1. IOP Publishing, Mar. 2008, pp. 1-7.

Rabeau et al., "Implantation of labelled single nitrogen vacancy centers in diamond using 15N," Applied Physics Letters 88, (Jan. 2006), 4 pages.

Ramsey, et al., "Phase Shifts in the Molecular Beam Method of Separated Oscillating Fields", Physical Review, vol. 84, No. 3, Nov. 1, 1951, pp. 506-507.

Ranjbar et al., "Many-electron states of nitrogen-vacancy centers in diamond and spin density calculations," Physical Review B 84(165212): 1-6 (Oct. 2011), 6 pages.

Reynhardt, "Spin-lattice relaxation of spin-1/2 nuclei in solids containing diluted paramagnetic impurity centers. I. Zeeman polarization of nuclear spin system," Concepts in Magnetic Resonance Part A, pp. 20-35, (Sep. 2003), 16 pages.

Rogers et al., "Singlet levels of the NV(−) centre in diamond," New Journal of Physics 17, (Jan. 2015), 13 pages.

Rondin et al., "Magnetometry with nitrogen-vacancy defects in diamond," Reports on Progress in Physics 77(056503) 1-26 (May 2014), 27 pages.

Rondin et al., "Magnetometry with nitrogen-vacancy defects in diamond." May 22, 2014 (May , 2014), pp. 1 [online] http://arxiv.org/pdf/1311.5214.pdf, 29 pages.

Rondin et al., "Nanoscale magnetic field mapping with a single spin scanning probe magnetometer," Applied Physics Letters 100, (Apr. 2012), 5 pages.

Sarkar et al., "Magnetic properties of graphite oxide and reduced graphene oxide," Physica E 64: 78-82 (Nov. 2014), 5 pages.

Scheuer et al., "Accelerated 2D magnetic resonance spectroscopy of single spins using matrix completion," Scientific Reports 5(17728): 1-8 (Dec. 2015), 8 pages.

Schirhagl et al., "Nitrogen-vacancy centers in diamond: Nanoscale sensors for physics and biology," Annual Review of Physical Chemistry 65: 83-105 (Jan. 2014), 26 pages.

Schoenfeld & Harneit, "Real time magnetic field sensing and imaging using a single spin in diamond," Physical Review Letters 106(030802): 1-4 (Jan. 2011), 4 pages.

Sedov et al., "Si-doped nano- and microcrystalline diamond films with controlled bright photoluminescence of silicon-vacancy color centers," Diamond and Related Materials 56: 23-28 (Jun. 2015; available online Apr. 18, 2015), 6 pages.

Shames et al., "Magnetic resonance tracking of fluorescent nanodiamond fabrication," Journal of Physics D: Applied Physics 48(155302): 1-13 (Apr. 2015; published Mar. 20, 2015), 14 pages.

Shao et al., "Diamond Color Center Based FM Microwave Demodulator," in Conference on Lasers and Electro-Optics, OSA Technical Digest (online) (Optical Society of America), paper JTh2A.136, (Jun. 5-10, 2016), 2 pages.

Sheinker et al., "Localization in 3-D Using Beacons of Low Frequency Magnetic Field." IEEE Transactions on Instrumentation and Measurement 62(12): 3194-3201 (Dec. 2013), 8 pages.

Simanovskaia et al., "Sidebands in optically detected magnetic resonance signals of nitrogen vacancy centers in diamond," Physical Review B 87(224106): 1-11 (Jun. 2013), 11 pages.

Sotoma et al., "Effective production of fluorescent nanodiamonds containing negatively-charged nitrogen-vacancy centers by ion irradiation," Diamond and Related Materials 49: 33-38 (Oct. 2014), 6 pages.

Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.

Steiner et al., "Universal enhancement of the optical readout fidelity of single electron spins at nitrogen-vacancy centers in diamond," Physical Review B 81(035205): 1-6 (Jan. 2010), 6 pages.

Steinert et al., "High-sensitivity magnetic imaging using an array of spins in diamond," Rev. Sci. Inst. 81(043705): 1-5 (Apr. 23, 2010), 5 pages.

Steinert et al., "Magnetic spin imaging under ambient conditions with sub-cellular resolution." Nature Comms 4:1607 (Mar. 19, 2013).

Stepanov et al., "High-frequency and high-field optically detected magnetic resonance of nitrogen-vacancy centers in diamond," Applied Physics Letters 106, (Feb. 2015), 5 pages.

Sternschulte et al., "Uniaxial stress and Zeeman splitting of the 1.681 eV optical center in a homoepitaxial CVD diamond film," Diamond and Related Materials 4: 1189-1192 (Sep. 1995), 4 pages.

Storteboom et al., "Lifetime investigation of single nitrogen vacancy centres in nanodiamonds," Optics Express 23(9): 11327-11333 (May 4, 2015; published Apr. 22, 2015), 7 pages.

Sushkov, et al. "All-optical sensing of a single-molecule electron spin." Nano letters 14.11 (Nov. 7, 2013): 6443-6448.

Tahara et al., "Quantifying selective alignment of ensemble nitrogen-vacancy centers in (111) diamond," Applied Physics Letters 107:193110 (Nov. 2015; published online Nov. 13, 2015), 5 pages.

Taylor et al., "High-sensitivity diamond magnetometer with nanoscale resolution," Nature Physics 4: 810-816 (Oct. 2008), 7 pages.

Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.

Terblanche et al., "13C spin-lattice relaxation in natural diamond: Zeeman relaxation at 4.7 T and 300 K due to fixed paramagnetic nitrogen defects," Solid State Nuclear Magnetic Resonance 20: 1-22 (Aug. 2001), 22 pages.

(56) References Cited

OTHER PUBLICATIONS

Terblanche et al., "13C spin-lattice relaxation in natural diamond: Zeeman relaxation in fields of 500 to 5000 G at 300 K due to fixed paramagnetic nitrogen defects," Solid State Nuclear Magnetic Resonance 19: 107-129 (May 2001), 23 pages.
Tetienne et al., "Magnetic-field-dependent photodynamics of single NV defects in diamond: an application to qualitative all-optical magnetic imaging," New Journal of Physics 14(103033): 1-5 (Oct. 2012), 16 pages.
Tetienne, et al. "Spin relaxometry of single nitrogen-vacancy defects in diamond nanocrystals for magnetic noise sensing." Physical Review B 87.23 (Apr. 3, 2013): 235436-1-235436-5.
Tong et al., "A hybrid-system approach for W state and cluster state generation," Optics Communication 310: 166-172, (Jan. 2014; available online Aug. 12, 2013), 7 pages.
Uhlen et al., "New diamond nanofabrication process for hard x-ray zone plates," J. of Vacuum Science & Tech. B 29(6) (06FG03): 1-4 (Nov./Dec. 2011), 4 pages.
U.S. Notice of Allowance dated Apr. 20, 2016, from related U.S. Appl. No. 15/003,718, 9 pages.
U.S. Notice of Allowance dated Aug. 11, 2017 from related U.S. Appl. No. 15/003,558, 5 pages.
U.S. Notice of Allowance dated Aug. 17, 2016, from related U.S. Appl. No. 15/003,718, 8 pages.
U.S. Notice of Allowance dated Dec. 13, 2016, from related U.S. Appl. No. 14/680,877, 8 pages.
U.S. Notice of Allowance dated Dec. 22, 2016, from related U.S. Appl. No. 14/659,498, 10 pages.
U.S. Notice of Allowance dated Feb. 14, 2017, from related U.S. Appl. No. 15/003,677, 8 pages.
U.S. Notice of Allowance dated Jul. 18, 2017 from related U.S. Appl. No. 15/003,634, 6 pages.
U.S. Notice of Allowance dated Jul. 24, 2017 from related U.S. Appl. No. 15/003,088, 12 pages.
U.S. Notice of Allowance dated Jun. 20, 2017, from related U.S. Appl. No. 15/204,675, 9 pages.
U.S. Notice of Allowance dated Jun. 28, 2017 from related U.S. Appl. No. 15/003,256, 10 pages.
U.S. Notice of Allowance dated Jun. 8, 2017, from related U.S. Appl. No. 15/351,862, 7 pages.
U.S. Notice of Allowance dated Mar. 15, 2017, from related U.S. Appl. No. 15/351,862, 6 pages.
U.S. Notice of Allowance dated Mar. 29, 2016, from related U.S. Appl. No. 15/003,590, 11 pages.
U.S. Notice of Allowance dated May 26, 2017 from related U.S. Appl. No. 15/218,821, 7 pages.
U.S. Notice of Allowance dated Sep. 1, 2017, from related U.S. Appl. No. 14/676,740, 7 pages.
U.S. Notice of Allowance dated Sep. 14, 2017, from related U.S. Appl. No. 15/476,636, 10 pages.
U.S. Notice of Allowance dated Sep. 18, 2017, from related U.S. Appl. No. 15/003,206, 11 pages.
U.S. Notice of Allowance dated Sep. 26, 2017, from related U.S. Appl. No. 15/003,281, 7 pages.
U.S. Notice of Allowance dated Sep. 8, 2016, from related U.S. Appl. No. 15/003,298, 10 pages.
U.S. Office Action dated Apr. 17, 2017, from related U.S. Appl. No. 15/003,558, 12 pages.
U.S. Office Action dated Aug. 15, 2017 from related U.S. Appl. No. 15/003,281, 12 pages.
U.S. Office Action dated Aug. 24, 2016 from related U.S. Appl. No. 14/676,740, 19 pages.
U.S. Office Action dated Feb. 10, 2017, from related U.S. Appl. No. 14/676,740, 20 pages.
U.S. Office Action dated Feb. 10, 2017, from related U.S. Appl. No. 15/003,088, 11 pages.
U.S. Office Action dated Feb. 16, 2017, from related U.S. Appl. No. 15/204,675, 7 pages.
U.S. Office Action dated Jul. 27, 2017 from related U.S. Appl. No. 15/003,577, 15 pages.
U.S. Office Action dated Jul. 29, 2016 from related U.S. Appl. No. 14/680,877, 8 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from related U.S. Appl. No. 15/003,678, 15 pages.
U.S. Office Action dated Jun. 2, 2017, from related U.S. Appl. No. 15/476,636, 10 pages.
U.S. Office Action dated Mar. 1, 2017, from related U.S. Appl. No. 15/003,634, 7 pages.
U.S. Office Action dated Mar. 16, 2017, from related U.S. Appl. No. 15/218,821, 7 pages.
U.S. Office Action dated May 13, 2016, from related U.S. Appl. No. 14/676,740, 15 pages.
U.S. Office Action dated May 22, 2017, from related U.S. Appl. No. 15/003,206, 12 pages.
U.S. Office Action dated May 6, 2016, from related U.S. Appl. No. 14/659,498.
U.S. Office Action dated Nov. 2, 2016, from related U.S. Appl. No. 15/003,256, 19 pages.
U.S. Office Action dated Nov. 3, 2016, from related U.S. Appl. No. 15/204,675, 9 pages.
U.S. Office Action dated Oct. 14, 2016 from related U.S. Appl. No. 15/003,677, 13 pages.
U.S. Office Action dated Oct. 19, 2016, from related U.S. Appl. No. 15/218,821, 6 pages.
U.S. Office Action dated Sep. 27, 2017, from related U.S. Appl. No. 15/003,176, 8 pages.
U.S. Office Action dated Sep. 8, 2017, from related U.S. Appl. No. 15/003,292, 8 pages.
Vershovskii & Dmitriev, "Combined excitation of an optically detected magnetic resonance in nitrogen-vacancy centers in diamond for precision measurement of the components of a magnetic field vector," Technical Physics Letters 41(11): 1026-1029 (Nov. 2015), 4 pages.
Vershovskii & Dmitriev, "Micro-scale three-component quantum magnetometer based on nitrogen-vacancy color centers in diamond crystal," Technical Physics Letters 41(4): 393-396 (Apr. 2015), 4 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013), 5 pages
Wang et al., "Optimizing ultrasensitive single electron magnetometer based on nitrogen-vacancy center in diamond," Chinese Science Bulletin, 58(24): 2920-2923, (Aug. 2013), 4 pages.
Webber et al., "Ab initio thermodynamics calculation of the relative concentration of NV- and NV0 defects in diamond," Physical Review B 85,(014102): 1-7 (Jan. 2012), 7 pages.
Wells, et al. "Assessing graphene nanopores for sequencing DNA." Nano letters 12.8 (Jul. 10, 2012): 4117-4123.
Widmann et al., "Coherent control of single spins in silicon carbide at room temperature," Nature Materials, 14: 164-168 (2015) (available online Dec. 1, 2014), 5 pages.
Wolf et al., "Subpicotesla Diamond Magnetometry," Physical Review X 5(041001): 1-10 (Oct. 2015), 10 pages.
Wolfe et al., "Off-resonant manipulation of spins in diamond via processing magnetization of a proximal ferromagnet," Physical Review B 89(180406): 1-5 (May 2014), 5 pages.
Wroble, "Performance Analysis of Magnetic Indoor Local Positioning System." Western Michigan University Master's Theses, Paper 609 (Jun. 2015), 42 pages.
Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.

(56) References Cited

OTHER PUBLICATIONS

Xue & Liu, "Producing GHz state of nitrogen-vacancy centers in cavity QED," Journal of Modern Optics 60(6-7), (Mar. 2013), 8 pages.
Yang & Gu, "Novel calibration techniques for high pulsed-magnetic fields using luminescence caused by photo," (with English machine translation), Journal of Huazhong University of Science and Technology, (Jun. 2007), 11 pages.
Yavkin et al., "Defects in Nanodiamonds: Application of High-Frequency cw and Pulse EPR, ODMR," Applied Magnetic Resonance, 45: 1035-1049 (Oct. 2014; published online Sep. 10, 2014), 15 pages.
Yu et al., "Bright fluorescent nanodiamonds: no photobleaching and low cytotoxicity," J. Am. Chem. Soc., 127: 17604-17605 (Nov. 25, 2005), 2 pages.
Zhang et al., "Laser-polarization-dependent and magnetically controlled optical bistability in diamond nitrogen-vacancy centers," Physics Letters A 377: 2621-2627 (Nov. 2013), 7 pages.
Zhang et al., "Laser-polarization-dependent spontaneous emission of the zero phonon line from single nitrogen-vacancy center in diamond," Chinese Physics B 24(3), (Apr. 2014), 13 pages.
Zhang et al., "Scalable quantum information transfer between nitrogen-vacancy-center ensembles," Annals of Physics, 355: 170-181 (Apr. 2015; available online Feb. 14, 2013), 12 pages.
Zhao et al., "Atomic-scale magnetometry of distant nuclear spin clusters via nitrogen-vacancy spin in diamond," Nature Nanotechnology, 5: 242-246 (Apr. 2011), 5 pages.
European Extended Search Report for Appl. Ser. No. 16743879.5 dated Sep. 11, 2018, 11 pages.
European Extended Search Report for Appl. Ser. No. 16800410.9 dated Oct. 12, 2018, 11 pages.
Niu, "Crack Detection of Power Line Based on Metal Magnetic Memory Non-destructive", TELKOMNIKA Indonesian Journal of Electrical Engineering, vol. 12, No. 11, Nov. 1, 2014, pp. 7764-7771.
U.S. Final Office Action for U.S. Appl. No. 15/380,691 dated Sep. 21, 2018, 12 pages.
U.S. Final Office Action for U.S. Appl. No. 15/479,256 dated Sep. 10, 2018, 20 pages.
U.S. Non-Final Office Action for U.S. Appl. No. 15/443,422 dated Oct. 2, 2018, 16 pages.
U.S. Non-Final Office Action for U.S. Appl. No. 15/446,373 dated Oct. 1, 2018, 13 pages.
U.S. Non-Final Office Action for U.S. Appl. No. 15/454,162 dated Sep. 10, 2018, 13 pages.
U.S. Non-Final Office Action for U.S. Appl. No. 15/468,282 dated Oct. 10, 2018, 12 pages.
U.S. Non-Final Office Action for U.S. Appl. No. 15/372,201 dated Oct. 15, 2018, 12 pages.
U.S. Non-Final Office Action for U.S. Appl. No. 15/468,274 dated Oct. 26, 2018, 11 pages.
U.S. Notice of Allowance for U.S. Appl. No. 14/866,730 dated Aug. 15, 2018, 9 pages.
U.S. Notice of Allowance for U.S. Appl. No. 15/468,289 dated Oct. 17, 2018, 12 pages.
U.S. Notice of Allowance for U.S. Appl. No. 15/003,704 dated Nov. 2, 2018, 19 pages.
U.S. Office Action for U.S. Appl. No. 15/468,397 dated Sep. 13, 2018, 7 pages.
Bui et al., "Noninvasive Fault Monitoring of Electrical Machines by Solving the Steady-State Magnetic Inverse Problem," in IEEE Transactions on Magnetics, vol. 44, No. 6, pp. 1050-1053, Jun. 24, 2008.
Chadebec et al., "Rotor fault detection of electrical machines by low frequency magnetic stray field analysis," 2005 5th IEEE International Symposium on Diagnostics for Electric Machines, Power Electronics and Drives, Vienna, 2005, submitted Mar. 22, 2006, pp. 1-6.
Froidurot et al., "Magnetic discretion of naval propulsion machines," in IEEE Transactions on Magnetics, vol. 38, No. 2, pp. 1185-1188, Mar. 2002.
IEEE Std 802.11 TM-2012 Wireless LAN Medium Access Control (MAC) and Physical Layer (PHY) Specifications, 1 page.
Kwon et al., "Analysis of the far field of permanent-magnet motors and effects of geometric asymmetries and unbalance in magnet design," in IEEE Transactions on Magnetics, vol. 40, No. 2, pp. 435-442, Mar. 2004.
Maertz et al., "Vector magnetic field microscopy using nitrogen vacancy centers in diamond", Applied Physics Letters 96, No. 9, Mar. 1, 2010, pp. 092504-1-092504-3.
U.S. Notice of Allowance dated Feb. 2, 2018, from related U.S. Appl. No. 15/003,292, 8 pages.
U.S. Notice of Allowance dated Feb. 21, 2018, from related U.S. Appl. No. 15/003,176, 9 pages.
U.S. Office Action dated Feb. 1, 2018, from related U.S. Appl. No. 15/003,577, 16 pages.
U.S. Office Action dated Feb. 5, 2018, from related U.S. Appl. No. 15/450,504, 12 pages.
U.S. Office Action dated Jan. 25, 2018, from related U.S. Appl. No. 15/672,953, 28 pages.
U.S. Office Action dated Jan. 26, 2018, from related U.S. Appl. No. 15/003,678, 14 pages.
U.S. Office Action dated Mar. 27, 2018, from related U.S. Appl. No. 15/468,386, 21 pages.
U.S. Office Action dated Mar. 28, 2018, from related U.S. Appl. No. 15/003,177, 12 pages.
U.S. Office Action dated Mar. 5, 2018, from related U.S. Appl. No. 14/866,730, 14 pages.
U.S. Office Action dated Mar. 8, 2018, from related U.S. Appl. No. 15/380,691, 12 pages.
U.S. Office Action dated Mar. 8, 2018, from related U.S. Appl. No. 15/479,256, 30 pages.
Wegerich, "Similarity based modeling of time synchronous averaged vibration signals for machinery health monitoring," 2004 IEEE Aerospace Conference Proceedings (IEEE Cat. No. 04TH8720), 2004, pp. 3654-3662 vol. 6.
Wikipedia, "Continuous phase modulation", downloaded from https://web.archive.org/web/20151017015236/https://en.wikipedia.org/wiki/Continuous_phase_modulati on on May 10, 2017, 3 pages.
Wikipedia, "Minimum-shift keying", downloaded from https://web.archive.org/web/20151017175828/https://en.wikipedia.org/wiki/Minimum-shift_keying on May 10, 2017, 2 pages.
Teeling-Smith et al., "Electron Paramagnetic Resonance of a Single NV Nanodiamond Attached to an Individual Biomolecule", Biophysical Journal 110, May 10, 2016, pp. 2044-2052.
UK Office Action dated Jun. 8, 2018, from related application No. GB1617438.5, 3 pages.
U.S. Final Office Action dated Jul. 26, 2018 from related U.S. Appl. No. 15/003,177, 14 pages.
U.S. Non-Final Office Action dated Aug. 6, 2018 from related U.S. Appl. No. 15/376,244, 28 pages.
U.S. Non-Final Office Action dated Aug. 9, 2018 from related U.S. Appl. No. 15/003,309, 22 pages.
U.S. Non-Final Office Action dated Jul. 20, 2018 from related U.S. Appl. No. 15/350,303, 13 pages.
U.S. Non-Final Office Action dated Jul. 26, 2018 from related U.S. Appl. No. 15/380,419, 11 pages.
U.S. Non-Final Office Action dated Jul. 3, 2018 from related U.S. Appl. No. 15/003,396, 19 pages.
U.S. Notice of Allowance dated Jul. 18, 2018 from related U.S. Appl. No. 15/468,386, 12 pages.
U.S. Notice of Allowance dated Jul. 6, 2018 from related U.S. Appl. No. 15/672,953, 11 pages.
U.S. Notice of Allowance dated Jun. 27, 2018 from related U.S. Appl. No. 15/003,519, 21 pages.
U.S. Notice of Allowance dated May 15, 2018, from related U.S. Appl. No. 15/003,209, 7 pages.
U.S. Notice of Allowance dated May 16, 2018, from related U.S. Appl. No. 15/003,145, 8 pages.
U.S. Office Action dated Jun. 19, 2018, from related U.S. Appl. No. 15/450,504, 12 pages.

(56) References Cited

OTHER PUBLICATIONS

International Search Report and Written Opinion for PCT Appl. Ser. No. PCT/US2018/041411 dated Feb. 8, 2019, 13 pages.
Rosskopf, "Advanced quantum sensing using nitrogen vacancy centers in diamond", Dissertation, p. 91 (12 pages), XP055500261, DOI: 10.3929/ethz-b-000168296 Retrieved from the Internet: URL: https://epo.summon.serialssolutions.com/2.0.0link/0/elvHCXMwY2BQsUxJMUs0MJTWNQWwlomqZYWuoIJ5qa6qaagq5BSjEzMLUG7kSOdTULczYPcTXwQHUXQqkrUWXXQ_a21WpJRpZukC26gWBhZmjEzsAJbAuaWkH1HrEqAZSIojWVyZkkqUoXhJsjA44100S3EwJSaJ8Lg5AidcFcoLAV6qDRXoRiOfDwvXaEUTAJzV1E-MEIVylIKTQYWeAmJIJLB5ppCZpwCMRmCCSRFIMHVzDXH201X (retr.
Schonfeld, "Optical readout of single spins for quantum computing and magnetic sensing", Dissertation, Fachbereich Physlk der Freien Universitat Berlin, May 1, 2011, 21 Pages (relevant pages only), XP055143403. Retrieved from the Internet: URL: http://www.dIss.fu-berlIn.de/diss/servlets/MCRFIleNodeServIeUFU DISS_derivate _00000001219 9/DIssertatIon_SImon-choenfela_PublIcVersion-2.pdfJsessionid-89A943688E59.
U.S. Final Office Action for U.S. Appl. No. 15/003,396 dated Mar. 22, 2019, 13 pages.
U.S. Final Office Action for U.S. Appl. No. 15/382,045 dated Apr. 26, 2019, 16 pages.
U.S. Final Office Action for U.S. Appl. No. 15/443,422 dated Mar. 7, 2019, 17 pages.
U.S. Non-Final Office Action for U.S. Appl. No. 15/003,193 dated Apr. 11, 2019, 7 pages.
U.S. Non-Final Office Action for U.S. Appl. No. 15/003,309 dated Feb. 13, 2019, 16 pages.
U.S. Non-Final Office Action for U.S. Appl. No. 15/003,617 dated Feb. 26, 2019, 10 pages.
U.S. Non-Final Office Action for U.S. Appl. No. 15/372,201 dated Apr. 2, 2019, 10 pages.
U.S. Non-Final Office Action for U.S. Appl. No. 15/419,832 dated Feb. 8, 2019, 12 pages.
U.S. Non-Final Office Action for U.S. Appl. No. 15/440,194 dated Feb. 15, 2019, 21 pages.
U.S. Non-Final Office Action for U.S. Appl. No. 15/446,373 dated Apr. 19, 2019, 8 pages.
U.S. Non-Final Office Action for U.S. Appl. No. 15/468,314 dated Mar. 28, 2019, 17 pages.
U.S. Non-Final Office Action for U.S. Appl. No. 15/468,410 dated Apr. 11, 2019, 15 pages.
U.S. Non-Final Office Action for U.S. Appl. No. 15/468,559 dated Apr. 11, 2019, 12 pages.
U.S. Non-Final Office Action for U.S. Appl. No. 15/469,374 dated Feb. 28, 2019, 14 pages.
U.S. Notice of Allowance for U.S. Appl. No. 15/003,617 dated Apr. 30, 2019, 9 pages.
U.S. Notice of Allowance for U.S. Appl. No. 15/207,457 dated Mar. 6, 2019, 16 pages.
U.S. Notice of Allowance for U.S. Appl. No. 15/376,244 dated Feb. 21, 2019, 7 pages.
U.S. Notice of Allowance for U.S. Appl. No. 15/380,419 dated Feb. 26, 2019, 5 pages.
U.S. Notice of Allowance for U.S. Appl. No. 15/400,794 dated Apr. 25, 2019, 5 pages.
U.S. Notice of Allowance for U.S. Appl. No. 15/437,038 dated Mar. 21, 2019, 13 pages.
U.S. Notice of Allowance for U.S. Appl. No. 15/437,222 dated Mar. 25, 2019, 11 pages.
U.S. Notice of Allowance for U.S. Appl. No. 15/468,282 dated Feb. 19, 2019, 8 pages.
U.S. Notice of Allowance for U.S. Appl. No. 15/468,56 dated Apr. 22, 2019, 8 pages.
U.S. Notice of Allowance for U.S. Appl. No. 15/468,582 dated Mar. 21, 2019, 13 pages.
U.S. Notice of Allowance for U.S. Appl. No. 15/468,951 dated Mar. 28, 2019, 8 pages.

* cited by examiner

2 GHz

3 GHz

| | + 10 dBm Power | |
|---|---|---|
| | 5 layer Cu with metal strip | |
| Freq (GHz) | E-field (v/m) | H-field (A/m) |
| 2.0 | 200 | 1.40 |
| 2.2 | 63 | 1.10 |
| 2.4 | 50 | 1.00 |
| 2.6 | 56 | 1.30 |
| 2.8 | 6 | 1.90 |
| 3.0 | 120 | 2.70 |
| 3.2 | 338 | 0.50 |
| 3.4 | 101 | 2.80 |
| 3.6 | 48 | 1.80 |
| 3.8 | 110 | 1.70 |
| 4.0 | 131 | 0.30 |

FIG. 16

14000C $$\begin{bmatrix} \tilde{B}_{1,X} & \tilde{B}_{2,X} & \tilde{B}_{3,X} \\ \tilde{B}_{1,Y} & \tilde{B}_{2,Y} & \tilde{B}_{3,Y} \\ \tilde{B}_{1,Z} & \tilde{B}_{2,Z} & \tilde{B}_{3,Z} \end{bmatrix}^{+} \begin{bmatrix} B_{Total,X} \\ B_{Total,Y} \\ B_{Total,Z} \end{bmatrix} = \begin{bmatrix} Channel\ 1 \\ Channel\ 2 \\ Channel\ 3 \end{bmatrix}$$

$C^{+}$ Moore-Penrose Pseudoinverse $B_{Total}$ $Channels$

FIG. 140C

MAGNETO-OPTICAL DETECTING APPARATUS AND METHODS

CROSS-REFERENCE TO RELATED APPLICATIONS

This application is a continuation-in-part and claims the benefit of priority of U.S. application Ser. No. 15/456,913, filed Mar. 13, 2017, entitled "Magneto-Optical Defect Center Magnetometer," which claims the benefit of priority to U.S. Provisional Patent Application No. 62/343,843, filed May 31, 2016, entitled "DIAMOND NITROGEN VACANCY MAGNETOMETER," U.S. Provisional Patent Application No. 62/343,492, filed May 31, 2016, entitled "LAYERED RF COIL FOR MAGNETOMETER", U.S. Non-Provisional patent application Ser. No. 15/380,691, filed Dec. 15, 2016, entitled "LAYERED RF COIL FOR MAGNETOMETER," U.S. Provisional Patent Application No. 62/343,746, filed May 31, 2016, entitled "DNV DEVICE INCLUDING LIGHT PIPE WITH OPTICAL COATINGS", U.S. Provisional Patent Application No. 62/343,750, filed May 31, 2016, entitled "DNV DEVICE INCLUDING LIGHT PIPE", U.S. Provisional Patent Application No. 62/343,758, filed May 31, 2016, entitled "OPTICAL FILTRATION SYSTEM FOR DIAMOND MATERIAL WITH NITROGEN VACANCY CENTERS", U.S. Provisional Patent Application No. 62/343,818, filed May 31, 2016, entitled "DIAMOND NITROGEN VACANCY MAGNETOMETER INTEGRATED STRUCTURE", U.S. Provisional Patent Application No. 62/343,600, filed May 31, 2016, entitled "TWO-STAGE OPTICAL DNV EXCITATION", U.S. Non-Provisional patent application Ser. No. 15/382,045, filed Dec. 16, 2016, entitled "TWO-STAGE OPTICAL DNV EXCITATION," U.S. Provisional Patent Application No. 62/343,602, filed May 31, 2016, entitled "SELECTED VOLUME CONTINUOUS ILLUMINATION MAGNETOMETER", and U.S. Non-Provisional patent application Ser. No. 15/380,419, filed Dec. 15, 2016, entitled "SELECTED VOLUME CONTINUOUS ILLUMINATION MAGNETOMETER," which are incorporated by reference herein in their entirety. This application is a continuation-in-part and claims the benefit of priority of U.S. application Ser. No. 15/468,303, filed Mar. 24, 2017, entitled "Precision Adjustability of Optical Components in a Magnetometer Sensor," which is incorporated by reference herein in its entirety. This application is a continuation-in-part and claims the benefit of priority of U.S. application Ser. No. 15/440,194, filed Feb. 23, 2017, entitled "Magneto-Optical Defect Center Device Including Light Pipe with Optical Coatings," which claims the benefit of priority to U.S. Provisional Patent Application No. 62/343,750, filed May 31, 2016, entitled "DNV DEVICE INCLUDING LIGHT PIPE," U.S. Provisional Patent Application No. 62/343,746, filed May 31, 2016, entitled "DNV DEVICE INCLUDING LIGHT PIPE WITH OPTICAL COATINGS," and U.S. Provisional Patent Application No. 62/343,758, filed May 31, 2016, entitled "OPTICAL FILTRATION SYSTEM FOR DIAMOND MATERIAL WITH NITROGEN VACANCY CENTERS," which are incorporated by reference herein in their entirety. This application is a continuation-in-part and claims the benefit of priority of U.S. application Ser. No. 15/454,162, filed Mar. 9, 2017, entitled "Optical Filtration System for Diamond Material with Nitrogen Vacancy Centers," which claims the benefit of priority to U.S. Provisional Patent Application No. 62/343,758, filed May 31, 2016, entitled "OPTICAL FILTRATION SYSTEM FOR DIAMOND MATERIAL WITH NITROGEN VACANCY CENTERS," which are incorporated by reference herein in their entirety. This application is a continuation-in-part and claims the benefit of priority of U.S. application Ser. No. 15/468,641, filed Mar. 24, 2017, entitled "Magnetometer with a Waveguide," which is incorporated by reference herein in its entirety. This application is a continuation-in-part and claims the benefit of priority of U.S. application Ser. No. 15/207,457, filed Jul. 11, 2016, entitled "Multi-Frequency Excitation Schemes for High Sensitivity Magnetometry Measurement with Drift Error Compensation," which is incorporated by reference herein in its entirety. This application is a continuation-in-part and claims the benefit of priority of U.S. application Ser. No. 15/437,038, filed Feb. 20, 2017, entitled "Efficient Thermal Drift Compensation in DNV Vector Magnetometry," which is incorporated by reference herein in its entirety. This application is a continuation-in-part and claims the benefit of priority of U.S. application Ser. No. 15/468,356, filed Mar. 24, 2017, entitled "Pulsed RF Methods for Optimization of CW Measurements," which is incorporated by reference herein in its entirety. This application is a continuation-in-part and claims the benefit of priority of U.S. application Ser. No. 15/468,397, filed Mar. 24, 2017, entitled "High Speed Sequential Cancellation for Pulsed Mode," which is incorporated by reference herein in its entirety. This application is a continuation-in-part and claims the benefit of priority of U.S. application Ser. No. 15/468,386, filed Mar. 24, 2017, entitled "Photodetector Circuit Saturation Mitigation for Magneto-Optical High Intensity Pulses," which is incorporated by reference herein in its entirety. This application is a continuation-in-part and claims the benefit of priority of U.S. application Ser. No. 15/468,289, filed Mar. 24, 2017, entitled "Apparatus and Method for Resonance Magneto-Optical Defect Center Material Pulsed Mode Referencing," which is incorporated by reference herein in its entirety. This application is a continuation-in-part and claims the benefit of priority of U.S. application Ser. No. 15/468,410, filed Mar. 24, 2017, entitled "Generation of Magnetic Field Proxy Through RF Frequency Dithering," which is incorporated by reference herein in its entirety. This application is a continuation-in-part and claims the benefit of priority of U.S. application Ser. No. 15/350,303, filed Nov. 14, 2016, entitled "Spin Relaxometry Based Molecular Sequencing," which is incorporated by reference herein in its entirety. This application is a continuation-in-part and claims the benefit of priority of U.S. application Ser. No. 15/443,422, filed Feb. 27, 2017, entitled "Array of UAVs with Magnetometers," which claims the benefit of priority to U.S. Provisional Application No. 62/343,842, filed May 31, 2016, entitled "Array of UAVs with Magnetometers," U.S. Provisional Application No. 62/343,839, filed May 31, 2016, entitled "Buoy Array of Magnetometers," and of U.S. Provisional Application No. 62/343,600, filed May 31, 2016, entitled "TWO-STAGE OPTICAL DNV EXCITATION," which are incorporated by reference herein in their entirety. This application is a continuation-in-part and claims the benefit of priority of U.S. application Ser. No. 15/446,373, filed Mar. 1, 2017, entitled "Buoy Array of Magnetometers," which claims the benefit of priority to U.S. Provisional Application No. 62/343,842, filed May 31, 2016, entitled "Array of UAVs with Magnetometers," U.S. Provisional Application No. 62/343,839, filed May 31, 2016, entitled "Buoy Array of Magnetometers," and of U.S. Provisional Application No. 62/343,600, filed May 31, 2016, entitled "TWO-STAGE OPTICAL DNV EXCITATION," which are incorporated by reference herein in their entirety. This application is a continuation-in-part and claims the benefit of priority of U.S. application Ser. No. 15/437,222, filed Feb. 20, 2017, entitled "Geolocation of Magnetic Sources Using Vector Magnetometer Sensors," which claims the benefit of priority to U.S. Provisional Patent Application No. 62/360,940, filed Jul. 11, 2016, entitled "Geolocation of Magnetic Sources Using Vector Magnetometer Sensors," which are incorporated by reference herein in their entirety. This application is a continuation-in-part and claims the benefit of priority of U.S. application Ser. No. 15/376,244, filed Dec. 12, 2016, entitled "Vector Magnetometry Localization of Subsurface Liquids," which is incorporated by reference herein in its entirety.

FIELD

The present disclosure generally relates to magnetometers, and more particularly, to magneto-optical defect center magnetometers, such as diamond nitrogen vacancy (DNV) magnetometers.

BACKGROUND

A number of industrial applications, as well as scientific areas such as physics and chemistry can benefit from magnetic detection and imaging with a device that has extraordinary sensitivity, ability to capture signals that fluctuate very rapidly (bandwidth) all with a substantive package that is extraordinarily small in size, efficient in power and infinitesimal in volume.

Atomic-sized magneto-optical defect center elements, such as nitrogen-vacancy (NV) centers in diamond lattices, have excellent sensitivity for magnetic field measurement and enable fabrication of small magnetic sensors that can readily replace existing-technology (e.g., Hall-effect) systems and devices. The DNV sensors are maintained in room temperature and atmospheric pressure and can be even used in liquid environments. A green optical source (e.g., a micro-LED) can optically excite NV centers of the DNV sensor and cause emission of fluorescence radiation (e.g., red light) under off-resonant optical excitation. A magnetic field generated, for example, by a microwave coil can probe degenerate triplet spin states (e.g., with $m_s=-1, 0, +1$) of the NV centers to split proportional to an external magnetic field projected along the NV axis, resulting in two spin resonance frequencies. The distance between the two spin resonance frequencies is a measure of the strength of the external magnetic field. A photo detector can measure the fluorescence (red light) emitted by the optically excited NV centers.

SUMMARY

Methods and systems are described for, among other things, a magneto-optical defect center magnetometer.

Magneto-Optical Defect Center Systems and Magnetometers

Some embodiments relate to a magneto-optical defect center magnetometer that includes an excitation source, a magneto-optical defect center element, a collection device, a top plate, a bottom plate, and a printed circuit board. The excitation source, the magneto-optical defect center element, and the collection device are each mounted to the printed circuit board.

In some implementations, the excitation source is positioned along a first axis relative to the printed circuit board and the collection device is positioned along a second axis relative to the printed circuit board. In some implementations, the magneto-optical defect center magnetometer includes excitation source circuitry mounted to the printed circuit board proximate to the excitation source. In some implementations, the magneto-optical defect center magnetometer includes collection device circuitry mounted to the printed circuit board proximate to the collection device. In some implementations, the magneto-optical defect center magnetometer includes an RF element mounted to the printed circuit board and RF amplifier circuitry mounted to the printed circuit board proximate to the RF device. In some implementations, the magneto-optical defect center magnetometer includes an optical waveguide assembly that includes an optical waveguide and at least one optical filter coating, and the optical waveguide assembly is configured to transmit light emitted from the diamond having nitrogen vacancies to the collection device. In some implementations, the optical waveguide comprises a light pipe. In some implementations, the optical filter coating transmits greater than about 99% of light with a wavelength of about 650 nm to about 850 nm. In some implementations, the optical filter coating transmits less than 0.1% of light with a wavelength of less than about 600 nm. In some implementations, the optical filter coating transmits greater than about 99% of light with a wavelength of about 650 nm to about 850 nm, and transmits less than 0.1% of light with a wavelength of less than about 600 nm. In some implementations, the optical filter coating is disposed on an end surface of the optical waveguide adjacent the collection device. In some implementations, a first optical filter coating is disposed on an end surface of the optical waveguide adjacent the collection device and a second optical filter coating is disposed on an end surface of the optical waveguide adjacent the diamond having nitrogen vacancies. In some implementations, the light pipe has an aperture with a size that is smaller than a size of the collection device. In some implementations, the light pipe has an aperture with a size greater than a size of a surface of the magneto-optical defect center element adjacent to the light pipe. In some implementations, the light pipe has an aperture with a size that is smaller than a size of the collection device and greater than a size of a surface of the magneto-optical defect center element adjacent the light pipe. In some implementations, the optical waveguide assembly further comprises an optical coupling material disposed between the light pipe and the magneto-optical defect center element, and the optical coupling material is configured to optically couple the light pipe to the magneto-optical defect center element. In some implementations, the optical waveguide assembly further comprises an optical coupling material disposed between the light pipe and the collection device, and the optical coupling material is configured to optically couple the light pipe to the collection device. In some implementations, an end surface of the light pipe adjacent to the magneto-optical defect center element extends in a plane parallel to a surface of the magneto-optical defect center element adjacent to the light pipe. In some implementations, the magneto-optical defect center magnetometer includes a second optical waveguide assembly and a second collection device, and the second optical waveguide assembly is configured to transmit light emitted from the magneto-optical defect center element to the second collection device. In some implementations, the magneto-optical defect center magnetometer includes an optical filter and the magneto-optical defect center element receives optical excitation based, at least in part, on generation of light corresponding to a first wavelength from the excitation source. The collection device is configured to receive at least a first portion of light corresponding to a second wavelength and the optical filter is configured to provide at least a portion of light corresponding to the second wavelength to the collection device. In some implementations, the optical filter is further configured to transmit light corresponding to the first wavelength. In some implementations, light corresponding to the first wavelength comprises green and light corresponding to the second wavelength comprises red. In some implementations, the optical filter comprises an optical coating, and wherein the optical coating comprises one or more layers configured to at least one of transmit or reflect light. In some implementations, the optical filter is disposed at least one of above, beneath, behind, or in front of the collection device. In some implementations, the optical filter is configured to enclose the magneto-optical defect center element. In some implementations, the optical filter is disposed at least one of above, beneath, behind, or in front of the magneto-optical defect center element. In some implementations, the collection device comprises a receiving ends, and wherein the receiving ends are disposed proximate to the magneto-optical defect center element. In some implementations, the collection device forms a gap, and wherein a predetermined dimension corresponding to the optical filter is configured to extend beyond a predetermined dimension corresponding to the gap. In some implementations, the magneto-optical defect center element is disposed between the receiving ends. In some implementations, the magneto-optical defect center magnetometer includes a RF excitation source configured to provide RF excitation to the magneto-optical defect center element. In some implementations, the optical filter comprises a dichroic filter. In some implementations, the excitation source, the magneto-optical defect center element, and the collection device are each aligned and positioned relative to the top plate, bottom plate, and printed circuit board by a corresponding two-point orientation system. In some implementations, the excitation source, the magneto-optical defect center element, and the collection device are positioned in a single plane. In some implementations, the magneto-optical defect center magnetometer includes a support element for the excitation source. In some implementations, the support element comprises one or more alignment pins for the two-point orientation system and wherein the top plate comprises one or more alignment openings for the two-point orientation system. In some implementations, the excitation source comprises one or more of a laser diode or a focusing lens. In some implementations, the support element comprises an asymmetrical alignment pin for the two-point orientation system and wherein the top plate comprises an asymmetrical alignment opening for the two-point orientation system. In some implementations, the excitation source comprises one or more of a laser diode or a focusing lens. In some implementations, the support element is formed of stainless steel, titanium, aluminum, carbon fiber, plastic, or a composite. In some implementations, the magneto-optical defect center magnetometer includes a support element for the collection device. In some implementations, the support element comprises one or more alignment pins for the two-point orientation system and wherein the top plate comprises one or more alignment openings for the two-point orientation system. In some implementations, the collection device comprises one or more of a light pipe or a photo diode. In some implementations, the support element comprises an asymmetrical alignment pin for the two-point orientation system and wherein the top plate comprises an asymmetrical alignment opening for the two-point orientation system. In some implementations, the collection device comprises one or more of a light pipe or a photo diode. In some implementations, the support element is formed of stainless steel, titanium, aluminum, carbon fiber, plastic, or a composite. In some implementations, the top plate is formed of stainless steel, titanium, aluminum, carbon fiber, or a composite. In some implementations, the bottom plate is formed of stainless steel, titanium, aluminum, carbon fiber, or a composite. In some implementations, the excitation source comprises an optical light source including a readout optical light source configured to provide optical excitation to the magneto-optical defect center element to transition relevant magneto-optical defect electrons to excited spin states in the magneto-optical defect center element and a reset optical light source configured to provide optical light to the magneto-optical defect center element to reset spin states in the magneto-optical defect center element to a ground state. The reset optical light source provides a higher power light than the readout optical light source. In some implementations, the readout optical light source is a laser and the reset optical light source is a bank of LED flash-bulbs. In some implementations, the readout optical light source is an LED and the reset optical light source is a bank of LED flash-bulbs. In some implementations, the readout optical light source has a higher duty cycle than the reset optical light source. In some implementations, the excitation source comprises an optical light source including a readout optical light source configured to illuminate light in a first illumination volume of the magneto-optical defect center element and a reset optical light source configured to illuminate light in a second illumination volume of the magneto-optical defect center element The second illumination volume is larger than and encompassing the first illumination volume, and the reset optical light source provides a higher power light than the readout optical light source. In some implementations, the readout optical light source is a laser and the reset optical light source is a bank of LED flash-bulbs. In some implementations, the readout optical light source is an LED and the reset optical light source is a bank of LED flash-bulbs. In some implementations, the readout optical light source has a higher duty cycle than the reset optical light source. In some implementations, the magneto-optical defect center magnetometer includes a radio frequency (RF) excitation source configured to provide RF excitation to the magneto-optical defect center element, the RF excitation source including an RF feed connector and a plurality of coils, each connected to the RF feed connector, and adjacent the magneto-optical defect center element, the coils each having a spiral shape. In some implementations, the coils are arranged in layers one above another. In some implementations, the magneto-optical defect center magnetometer includes a radio frequency (RF) excitation source configured to provide RF excitation to the magneto-optical defect center element, the RF excitation source including an RF feed connector and a plurality of coils, each connected to the RF feed connector, and adjacent the magneto-optical defect center element, the coils arranged in layers one above another and to have a uniform spacing between each other. In some implementations, the coils each have a spiral shape. In some implementations, the magneto-optical defect center element is a diamond having nitrogen vacancies.

Some embodiments relate to a magneto-optical defect center magnetometer that includes a magneto-optical defect center element, an excitation source, a collection device, a top plate, a bottom plate, a printed circuit board, excitation source circuitry mounted to the printed circuit board proximate to the excitation source, and collection device circuitry mounted to the printed circuit board proximate to the collection device. The excitation source, the magneto-optical defect center element, and the collection device are each mounted to the printed circuit board.

In some implementations, the excitation source is positioned along a first axis relative to the printed circuit board and wherein the collection device is positioned along a second axis relative to the printed circuit board. In some implementations, the magneto-optical defect center magnetometer includes an RF element mounted to the printed circuit board and RF amplifier circuitry mounted to the printed circuit board proximate to the RF device. In some implementations, the magneto-optical defect center magnetometer includes an optical waveguide assembly that includes an optical waveguide and at least one optical filter coating, wherein the optical waveguide assembly is configured to transmit light emitted from the diamond having nitrogen vacancies to the collection device. In some implementations, the magneto-optical defect center magnetometer includes an optical filter, and the magneto-optical defect center element receives optical excitation based, at least in part, on generation of light corresponding to a first wavelength from the excitation source. The collection device is configured to receive at least a first portion of light corresponding to a second wavelength, and the optical filter is configured to provide at least a portion of light corresponding to the second wavelength to the collection device. In some implementations, the excitation source, the magneto-optical defect center element, and the collection device are each aligned and positioned relative to the top plate, bottom plate, and printed circuit board by a corresponding two-point orientation system. In some implementations, the excitation source comprises an optical light source including a readout optical light source configured to provide optical excitation to the magneto-optical defect center element to transition relevant magneto-optical defect electrons to excited spin states in the magneto-optical defect center element and a reset optical light source configured to provide optical light to the magneto-optical defect center element to reset spin states in the magneto-optical defect center element to a ground state. The reset optical light source provides a higher power light than the readout optical light source. In some implementations, the excitation source comprises an optical light source including a readout optical light source configured to illuminate light in a first illumination volume of the magneto-optical defect center element and a reset optical light source configured to illuminate light in a second illumination volume of the magneto-optical defect center element. The second illumination volume is larger than and encompassing the first illumination volume, and the reset optical light source provides a higher power light than the readout optical light source. In some implementations, the magneto-optical defect center magnetometer includes a radio frequency (RF) excitation source configured to provide RF excitation to the magneto-optical defect center element, the RF excitation source including an RF feed connector and a plurality of coils, each connected to the RF feed connector, and adjacent the magneto-optical defect center element, the coils each having a spiral shape. In some implementations, the magneto-optical defect center magnetometer includes a radio frequency (RF) excitation source configured to provide RF excitation to the magneto-optical defect center element, the RF excitation source including an RF feed connector and a plurality of coils, each connected to the RF feed connector, and adjacent the magneto-optical defect center element, the coils arranged in layers one above another and to have a uniform spacing between each other. In some implementations, the magneto-optical defect center element is a diamond having nitrogen vacancies.

Some embodiments relate to a magneto-optical defect center magnetometer having a magneto-optical defect center element, an excitation source, a collection device, an RF element, a top plate, a bottom plate, a printed circuit board, excitation source circuitry mounted to the printed circuit board proximate to the excitation source, collection device circuitry mounted to the printed circuit board proximate to the collection device, and RF amplifier circuitry mounted to the printed circuit board proximate to the RF device. The excitation source, the magneto-optical defect center element, the collection device, and the RF element are each mounted to the printed circuit board and the excitation source is positioned along a first axis relative to the printed circuit board and the collection device is positioned along a second axis relative to the printed circuit board.

In some implementations, the magneto-optical defect center magnetometer includes an optical waveguide assembly that includes an optical waveguide and at least one optical filter coating, and the optical waveguide assembly is configured to transmit light emitted from the diamond having nitrogen vacancies to the collection device. In some implementations, the magneto-optical defect center magnetometer includes an optical filter. The magneto-optical defect center element receives optical excitation based, at least in part, on generation of light corresponding to a first wavelength from the excitation source, the collection device is configured to receive at least a first portion of light corresponding to a second wavelength, and the optical filter is configured to provide at least a portion of light corresponding to the second wavelength to the collection device. In some implementations, the excitation source, the magneto-optical defect center element, and the collection device are each aligned and positioned relative to the top plate, bottom plate, and printed circuit board by a corresponding two-point orientation system. In some implementations, the excitation source comprises an optical light source including a readout optical light source configured to provide optical excitation to the magneto-optical defect center element to transition relevant magneto-optical defect electrons to excited spin states in the magneto-optical defect center element and a reset optical light source configured to provide optical light to the magneto-optical defect center element to reset spin states in the magneto-optical defect center element to a ground state. The reset optical light source provides a higher power light than the readout optical light source. In some implementations, the excitation source comprises an optical light source including a readout optical light source configured to illuminate light in a first illumination volume of the magneto-optical defect center element and a reset optical light source configured to illuminate light in a second illumination volume of the magneto-optical defect center element. The second illumination volume is larger than and encompassing the first illumination volume, and the reset optical light source provides a higher power light than the readout optical light source. In some implementations, the magneto-optical defect center magnetometer includes a radio frequency (RF) excitation source configured to provide RF excitation to the magneto-optical defect center element, the RF excitation source including an RF feed connector and a plurality of coils, each connected to the RF feed connector, and adjacent the magneto-optical defect center element, the coils each having a spiral shape. In some implementations, the magneto-optical defect center magnetometer includes a radio frequency (RF) excitation source configured to provide RF excitation to the magneto-optical defect center element, the RF excitation source including an RF feed connector and a plurality of coils, each connected to the RF feed connector, and adjacent the magneto-optical defect center element, the coils arranged in layers one above another and to have a uniform spacing between each other. In some implementations, the magneto-optical defect center element is a diamond having nitrogen vacancies.

According to some embodiments, there is a system for magnetic detection that can include a housing, a magneto-optical defect center material including at least one magneto-optical defect center that emits an optical signal when excited by an excitation light, a radio frequency (RF) exciter system configured to provide RF excitation to the magneto-optical defect center material, an optical light source configured to direct the excitation light to the magneto-optical defect center material, and an optical detector configured to receive the optical signal emitted by the magneto-optical defect center material based on the excitation light and the RF excitation. According to some embodiments, the magneto-optical defect center material can include a nitrogen vacancy (NV) diamond material having one or more NV centers.

According to some embodiments, the housing further comprises: a top plate; a bottom plate; and at least one side plate. The top plate, the bottom plate, and the at least one side plate form an enclosure that contains the magneto-optical defect center material, the RF exciter system, the optical light source, and the optical detector.

According to some embodiments, the top plate is made from Noryl, the bottom plate is made from copper, stainless steel, aluminum or copper, and the at least one side plate is made from Noryl.

According to some embodiments, the housing further comprises one or more separation plates configured to isolate at least one of the magneto-optical defect center material, the RF exciter system, the optical light source, and the optical detector within the housing.

According to some embodiments, the housing further comprises a main plate provided between the side plate and the bottom plate. The magneto-optical defect center material, the RF exciter system, the optical light source, and the optical detector are mounted to the main plate.

According to some embodiments, the main plate is made from Noryl.

According to some embodiments, the main plate can include a plurality of holes positioned to allow the magneto-optical defect center material, the RF exciter system, the optical light source, and the optical detector to be mounted to the main plate in a plurality of locations on the main plate.

According to some embodiments, the system for magnetic detection can further include a gasket configured to hermetically seal the top plate, the bottom plate, the at least one side plate, and the main plate together.

According to some embodiments, the system for magnetic detection can further include a hydrogen absorber positioned within the housing, the hydrogen absorber configured to absorb hydrogen released by materials used in the system for magnetic detection.

According to some embodiments, the system for magnetic detection can further include a nitrogen cooling system configured to cool or otherwise reduce thermal loading on components of the system for magnetic detection. The nitrogen cooling system may be in thermal communication with the at least one of the top plate or the bottom plate including the cooling fins such that heat removed by the nitrogen cooling system is convectively dissipated to atmosphere via the cooling fins.

According to some embodiments, at least one of the top plate or the bottom plate include cooling fins can be configured to thermally dissipate heat transferred to the at least one of the top plate or the bottom plate.

According to some embodiments, the system for magnetic detection can further include a nitrogen cooling system configured to cool or otherwise reduce thermal loading on components of the system for magnetic detection. The nitrogen cooling system is in thermal communication with the at least one of the top plate or the bottom plate including the cooling fins such that heat removed by the nitrogen cooling system is convectively dissipated to atmosphere via the cooling fins.

According to some embodiments, the system for magnetic detection can further include a controller programmed to: receive an indication of a frequency of the excitation light; receive an indication of a frequency of the optical signal emitted by the magneto-optical defect center material; and determine a magnitude of an external magnetic field based at least in part on a comparison between the frequency of the excitation light and the frequency of the optical signal emitted by the magneto-optical defect center material. The controller may be further programmed to determine a direction of the external magnetic field based at least in part on a comparison between the frequency of the excitation light and the frequency of the optical signal emitted by the magneto-optical defect center material.

According to some embodiments, the RF exciter system can include a radio frequency (RF) source; a radio frequency (RF) input; a radio frequency (RF) ground; and a microstrip line electrically connected to the RF input and short circuited to the RF ground adjacent the magneto-optical defect center material. The controller is further programmed to control the RF source such that a standing wave RF field is created in the magneto-optical defect center material.

According to some embodiments, the RF exciter system can include an RF feed connector; and a metallic material coated on the magneto-optical defect center material and electrically connected to the RF feed material.

According to some embodiments, the RF exciter system can further include a circuit board comprising an insulating board and conductive traces formed on the insulating board, the conductive traces electrically connecting the RF feed connector to the metallic material.

According to some embodiments, the system for magnetic detection can further include a plurality of magnets configured to provide a bias magnetic field to the magneto-optical defect center material; a ring magnet holder comprising: an outer ring with an outside surface, and a plurality of holders extending from the ring, wherein the plurality of holders are configured to hold the plurality of magnets in a same orientation with respect to one another; and a mount comprising an inside surface, wherein the outside surface of the outer ring slides along the inside surface of the mount.

According to some embodiments, the ring magnet holder can further include a fixation member configured to secure the ring magnet holder in a location within the mount.

According to some embodiments, the mount can include a through-hole configured to allow the excitation light to pass through the through-hole of the mount.

According to some embodiments, the system for magnetic detection can further include a slot configured to adjust the optical light source in a respective linear direction relative to the main plate; a lens; and a drive screw mechanism configured to adjust a position of the lens relative to the optical light source.

According to some embodiments, the system for magnetic detection can further include a plurality of drive screw mechanisms configured to adjust a position of the lens relative to the optical light source, each of the plurality of drive screw mechanisms configured to adjust in a direction orthogonal to the other drive screw mechanisms.

According to some embodiments, the system for magnetic detection can further include a waveplate assembly comprising: a waveplate, a mounting disk adhered to the waveplate, and a mounting base configured such that the mounting disk can rotate relative to the mounting base around an axis of the waveplate. The excitation light emitted by the optical light source can be directed through the waveplate before the excitation light is directed to the magneto-optical defect center material.

According to some embodiments, the optical light source can emit green light, and the magneto-optical defect center material can include a plurality of defect centers in a plurality of orientations. According to some embodiments, the system for magnetic detection can further include a half-wave plate, through which at least some of the green light passes, rotating a polarization of such green light to thereby provide an orientation to light waves emitted from the half-wave plate, the half-wave plate capable of being orientated relative to the defect centers in a plurality of orientations. The orientation of the light waves can coincide with an orientation of the defect centers, thereby imparting substantially increased energy transfer to the defect center with coincident orientation while imparting substantially decreased energy transfer to the defect centers that are not coincident. The excitation light emitted by the optical light source can be directed through the half-wave plate before the excitation light is directed to the magneto-optical defect center material.

According to some embodiments, the system for magnetic detection can further include a beam former in electrical communication with the RF excitation source; and an array of Vivaldi antenna elements in electrical communication with the beam former. The magneto-optical defect center material can be positioned in a far field of the array of Vivaldi antenna elements. The array of Vivaldi antenna elements can generate a RF magnetic field that is uniform over the magneto-optical defect center material, wherein the optical light source transmits excitation light at a first wavelength to the magneto-optical defect center material to detect a magnetic field based on a measurement of excitation light at a second wavelength that is different from the first wavelength.

According to some embodiments, the system for magnetic detection can further include a mount base. The RF exciter system can include a radio frequency circuit board configured to generate a radio frequency field around the magneto-optical defect center material. The magneto-optical defect center material and the radio frequency circuit board can be mounted to the mount base. The mount base can be configured to be fixed to the housing in a plurality of orientations.

According to some embodiments, in each of the plurality of orientations, the excitation light can enter the magneto-optical defect center material in a respective side of the magneto-optical defect center material.

According to some embodiments, the excitation light can be injected into a first side of the magneto-optical defect center material when the mount base is fixed in a first orientation in the plurality of orientations, and the excitation light can be injected into a second side of the magneto-optical defect center material when the mount base is fixed in a second orientation in the plurality of orientations.

According to some embodiments, when the mount base is fixed in the first orientation, a portion of the excitation light can pass through the magneto-optical defect center material and can be detected by a second light sensor, and when the mount base is fixed in the second orientation, a portion of the excitation light cannot detected by the second light sensor.

Precision Adjustability of Optical Components in a Magnetometer Sensor

In order to adjust optical excitation through a plurality of lenses to magneto-optical defect center materials, the relative position of an optical excitation assembly material can be controlled. During manufacture of a sensor system, there may be small variations in how a magneto-optical defect center material is mounted or in the tolerances of sensor components including the lenses and spacers such that adjustment is needed after assembly to adjust and focus the generated optical excitation. In some implementations, the generated optical excitation is laser light from a laser diode. In some implementations, an initial calibration is done on the sensor system to adjust the relative position of the optical excitation assembly to a base structure to benefit the final intended purpose of the sensor.

According to some embodiments, there is an optical excitation assembly for attachment to a base structure that can include a defect center in a magneto-optical defect center material in a fixed position relative to the base structure, a slot configured to adjust the optical excitation assembly in a respective linear direction relative to the base structure, an optical excitation source, a lens, and a drive screw mechanism. The drive screw mechanism can be configured to adjust a position of the lens relative to the optical excitation source. In some implementations, the optical excitation assembly can further include a plurality of drive screw mechanisms, where the plurality of drive screw mechanisms are configured to adjust a position of the lens relative to the optical excitation source. In some implementations, each of the plurality of drive screw mechanisms may be configured to adjust in a direction orthogonal to the other drive screw mechanisms. According to some embodiments, the magneto-optical defect center material can include a nitrogen vacancy (NV) diamond material having one or more NV centers.

According to some embodiments, the optical excitation assembly can further include a shim configured to adjust the optical excitation assembly in a linear direction relative to the base structure. In some embodiments, the optical excitation assembly can further include a magneto-optical defect center material with defect centers. The light from the optical excitation source can be directed through the lens into the magneto-optical defect center material with defect centers.

According to some embodiments, the optical excitation assembly can further include a half-wave plate assembly. The half-wave plate assembly can include a half-wave plate, a mounting disk adhered to the half-wave plate, and a mounting base configured such that the mounting disk can rotate relative to the mounting base around an axis of the half-wave plate. In some embodiments, the lens can be configured to direct light from the optical excitation source through the half-wave plate before the light is directed to the magneto-optical defect center material. In some implementations, the optical excitation assembly can further include a pin adhered to the mounting disk. The mounting base can include a mounting slot configured to receive the pin. The pin can slide along the mounting slot and the mounting disk can rotate relative to the mounting base around the axis of the half-wave plate, with the axis perpendicular to a length of the mounting slot.

According to some embodiments, the optical excitation assembly can further include a screw lock inserted through the slot and configured to prevent relative motion of the optical excitation assembly to the base structure when tightened.

According to some embodiments, there is an assembly for attachment to a base structure that can include a slot configured to adjust the assembly in a respective linear direction relative to the base structure, an optical excitation source, a plurality of lenses, an adjustment mechanism, and a magneto-optical defect center material with defect centers. The adjustment mechanism can be configured to adjust a position of the plurality of lenses relative to the optical excitation source. The light from the optical excitation source can be directed through the plurality of lenses into the magneto-optical defect center material with defect centers. In some embodiments, the assembly can be configured to direct light from the optical excitation source through a half-wave plate before the light is directed to the magneto-optical defect center material.

According to some embodiments, the assembly can further include a mounting disk adhered to the half-wave plate. The mounting disk can be configured to rotate relative to the mounting base around the axis of the half-wave plate. In some embodiments, the assembly can further include a pin adhered to the mounting disk. The mounting base can include a mounting slot configured to receive the pin. The pin can slide along the slot and the mounting disk can rotate relative to the mounting base around the axis of the half-wave plate, the axis perpendicular to a length of the slot.

According to some embodiments, the optical excitation source can be one of a laser diode or a light emitting diode.

According to some embodiments, the assembly may further include a screw lock inserted through the slot. The screw lock can be configured to prevent relative motion of the optical excitation assembly to the base structure when tightened. A second screw lock attached to the mounting disk can be configured to prevent rotation of the mounting disk relative to the mounting base when tightened.

According to some embodiments, the lens of the assembly can be configured to direct light from the optical excitation source through the half-wave plate before the light is directed to the magneto-optical defect center material.

According to some embodiments, a sensor assembly can include a base structure and an optical excitation assembly. The optical excitation assembly can include an optical excitation means, for providing optical excitation through a plurality of lenses, magneto-optical defect center material comprising a plurality of magneto-optical defect centers, and an adjustment means, for adjusting the location of the provided optical excitation where it reaches the magneto-optical defect center material.

According to some embodiments, there is a method of adjusting an optical excitation assembly relative to a base structure that can include adjusting an optical excitation source in a respective linear direction relative to the base structure using a slot and adjusting a position of a lens in the optical excitation assembly relative to the optical excitation source using a drive screw mechanism. The adjusting the optical excitation source and adjusting the position of a lens may direct light from the optical excitation source to a defect center in a magneto-optical defect center that is in a fixed position relative to the base structure. According to some embodiments, the magneto-optical defect center material can include a nitrogen vacancy (NV) diamond material having one or more NV centers.

According to some embodiments, the method can further include adjusting the position of the lens in the optical excitation assembly using a plurality of drive screw mechanisms. Each of the plurality of drive screw mechanisms may adjust in a direction orthogonal to the other drive screw mechanisms. In some embodiments, the method may further include adjusting the optical excitation assembly in a linear direction relative to the base structure using a shim. In some implementations, the method may direct the light from the optical excitation source through the lens to the defect center.

According to some embodiments, the method can further include rotating a half-wave plate attached to the optical excitation assembly around an axis of the half-wave plate using a half-wave plate assembly. The half-wave plate assembly can include a mounting disk adhered to the half-wave plate. In some embodiments, the method may further include sliding a pin adhered to the mounting disk along a mounting slot in the mounting disk, the axis of the half-wave plate perpendicular to a length of the mounting slot when rotating the half-wave plate. In some embodiments, the method may further include tightening a screw lock inserted through the slot to prevent relative motion of the optical excitation assembly to the base structure.

Use of Waveplates in a Magnetometer Sensor

In order to tune the magnetic field measurement for certain axes of the magneto-optical defect center materials the polarization of light entering the magneto-optical defect center material may be controlled. During manufacture of a sensor system, there may be small variations in how a magneto-optical defect center material is mounted to the sensor such that axes have deviation in orientation as well as inherent differences between different magneto-optical defect center materials. In such manufacturing, a calibration can be conducted by adjusting the polarization of the light to benefit the final intended purpose of the sensor.

According to some embodiments, there is a sensor that can include an optical excitation source emitting green light, a magneto-optical defect center material with defect centers in a plurality of orientations, and a half-wave plate. At least some of the green light may pass through the half-wave plate, rotating a polarization of such green light to thereby provide an orientation to the light waves emitted from the half-wave plate. The half-wave plate may be capable of being orientated relative to the defect centers in a plurality of orientations, wherein the orientation of the light waves coincides with an orientation of the defect centers, thereby imparting substantially increased energy transfer to the defect center with coincident orientation while imparting substantially decreased energy transfer to the defect centers that are not coincident. According to some embodiments, the magneto-optical defect center material can include a nitrogen vacancy (NV) diamond material having one or more NV centers.

According to some embodiments, there is a sensor that can include a waveplate assembly, an optical excitation source and a magneto-optical defect center material with defect centers. The waveplate assembly can include a waveplate, mounting base, and a mounting disk. The mounting disk can be adhered to the waveplate. The mounting base can be configured such that the mounting disk can rotate relative to the mounting base around an axis of the waveplate. According to some embodiments, the magneto-optical defect center material can include a nitrogen vacancy (NV) diamond material having one or more NV centers.

According to some embodiments, the sensor can be configured to direct light from the optical excitation source through the waveplate before the light is directed to the magneto-optical defect center material. In some embodiments, the sensor can further comprise a pin adhered to the mounting disk. The mounting base can comprise a slot configured to receive the pin, the pin can slide along the slot and the mounting disk can rotate relative to the mounting base around the axis of the waveplate with the axis perpendicular to a length of the slot. In some embodiments, the magneto-optical defect center material with defect centers can be comprised of a nitrogen vacancy (NV) diamond material comprising a plurality of NV centers. In some embodiments, the optical excitation source can be one of a laser (e.g., a laser diode) or a light emitting diode. In some embodiments, the sensor can further comprise a screw lock attached to the mounting disk. The screw lock can be configured to prevent rotation of the mounting disk relative to the mounting base when tightened. In some embodiments, the sensor can further comprise a controller electrically coupled to the waveplate assembly. The controller can be configured to control an angle of the rotation of the waveplate relative to the mounting base.

According to some embodiments, there is an assembly that can include a half-wave plate, a mounting base, an optical excitation source, and a magneto-optical defect center material with defect centers. The mounting base can be configured such that the half-wave plate can rotate relative to the mounting base around an axis of the half-wave plate. In some embodiments, the assembly can further comprise a pin adhered to the mounting disk. The mounting base can comprise a slot configured to receive the pin, the pin can slide along the slot and the mounting disk can rotate relative to the mounting base around the axis of the half-wave plate with the axis perpendicular to a length of the slot. In some embodiments, the magneto-optical defect center material with defect centers can be comprised of a nitrogen vacancy (NV) diamond material comprising a plurality of NV centers. In some embodiments, the optical excitation source can be one of a laser (e.g., a laser diode) or a light emitting diode. In some embodiments, the assembly can further comprise a screw lock attached to the mounting disk. The screw lock can be configured to prevent rotation of the mounting disk relative to the mounting base when tightened. In some embodiments, the assembly can further comprise a controller electrically coupled to the half-wave plate assembly. The controller can be configured to control an angle of the rotation of the half-wave plate relative to the mounting base. According to some embodiments, the magneto-optical defect center material can include a nitrogen vacancy (NV) diamond material having one or more NV centers.

According to some embodiments, there is a sensor assembly that can include a mounting base and a half-wave plate assembly. The half-wave plate assembly can further comprise a half-wave plate, an optical excitation means for providing optical excitation through the half-wave plate, a magneto-optical defect center material comprising a plurality of magneto-optical defect centers, and a detector means, for detecting optical radiation. According to some embodiments, the magneto-optical defect center material can include a nitrogen vacancy (NV) diamond material having one or more NV centers.

According to some embodiments, there is a sensor assembly that can include a half-wave plate, a mounting base, an optical excitation source, and a magneto-optical defect center material with defect centers. The mounting base can be configured such that the half-wave plate can rotate relative to the mounting base around an axis of the half-wave plate. According to some embodiments, the magneto-optical defect center material can include a nitrogen vacancy (NV) diamond material having one or more NV centers.

According to some embodiments, there is a sensor that can include an optical excitation source emitting light, a magneto-optical defect center material with defect centers in a plurality of orientations, and a polarization controller. The polarization controller may control the polarization orientation of the light emitted from the optical excitation source, wherein the polarization orientation coincides with an orientation of the defect centers, thereby imparting substantially increased energy transfer to the defect center with coincident orientation while imparting substantially decreased energy transfer to the defect centers that are not coincident. In some embodiments, the magneto-optical defect center material with defect centers comprises a nitrogen vacancy (NV) diamond material comprising one or more NV centers. In some embodiments, the optical excitation source is one of a laser diode or a light emitting diode.

According to some embodiments, there is a sensor assembly that can include a mounting base and an optical excitation transmission assembly. The optical excitation transmission assembly may further comprise an optical excitation means for providing optical excitation, a polarization means, for changing a polarization of light received from the optical excitation means, a magneto-optical defect center material comprising one or more magneto-optical defect centers, and a detector means, for detecting optical radiation. According to some embodiments, the magneto-optical defect center material can include a nitrogen vacancy (NV) diamond material.

Magneto-Optical Defect Center Material Holder

According to some embodiments, there is a magnetometer that can include a housing; a light source configured to provide excitation light; a magneto-optical defect center material with at least one defect center that emits light when excited by the excitation light; a light sensor configured to receive the emitted light; a radio frequency circuit board configured to generate a radio frequency field around the magneto-optical defect center material; and a mount base, wherein the magneto-optical defect center material and the radio frequency circuit board are mounted to the mount base, and wherein the mount base is configured to be fixed to the housing in a plurality of orientations. According to some embodiments, the magneto-optical defect center material can include a nitrogen vacancy (NV) diamond material having one or more NV centers.

According to some embodiments, in each of the plurality of orientations, the excitation light can enter the magneto-optical defect center material in a respective side of the magneto-optical defect center material.

According to some embodiments, the excitation light can be injected into a first side of the magneto-optical defect center material when the mount base is fixed in a first orientation in the plurality of orientations, and the excitation light can be injected into a second side of the magneto-optical defect center material when the mount base is fixed in a second orientation in the plurality of orientations.

According to some embodiments, when the mount base is fixed in the first orientation, a portion of the excitation light can pass through the magneto-optical defect center material and is detected by a second light sensor, and when the mount base is fixed in the second orientation, a portion of the excitation light cannot detected by the second light sensor.

According to some embodiments, the mount base can be configured to be fixed to the housing in the plurality of orientations via a plurality of sets of fixation holes.

According to some embodiments, each of the fixation holes of the sets of fixation holes can include a threaded hole.

According to some embodiments, the mount base can be configured to be fixed to the housing via at least one threaded shaft.

According to some embodiments, each set of the plurality of sets of fixation holes can include two fixation holes.

According to some embodiments, each set of the plurality of sets of fixation holes can be two fixation holes.

According to some embodiments, the light source and the light sensor can be fixed to the housing.

According to some embodiments, the magnetometer can further include a processor configured to: receive an indication of a frequency of the excitation light; receive an indication of a frequency of the emitted light; and determine a magnitude of an external magnetic field based at least in part on a comparison between the frequency of the excitation light and the frequency of the emitted light.

According to some embodiments, the processor can be further configured to determine a direction of the external magnetic field based at least in part on a comparison between the frequency of the excitation light and the frequency of the emitted light.

According to some embodiments, the processor can be further configured to determine the magnitude of the external magnetic field based in part on the radio frequency field.

According to some embodiments, the radio frequency field can have a frequency that is time-varying.

According to some embodiments, a frequency of the excitation light can be different than a frequency of the emitted light.

According to some device embodiments, the magneto-optical defect center material can include at least one defect center that transmits emitted light when excited by excitation light. The devices may also include a radio frequency circuit board that can be configured to generate a radio frequency field around the magneto-optical defect center material. The devices may further include a mount base. The magneto-optical defect center material and the radio frequency circuit board can be mounted to the mount base. The mount base may be configured to be fixed to a housing in a plurality of orientations.

Vacancy Center Material with Highly Efficient RF Excitation

According to some embodiments, there is a system for magnetic detection that can include a magneto-optical defect center material comprising a plurality of magneto-optical defect centers; an optical light source configured to provide optical excitation to the magneto-optical defect center material; an optical detector configured to receive an optical signal emitted by the magneto-optical defect center material; and a radio frequency (RF) excitation source configured to provide RF excitation to the magneto-optical defect center material, the RF excitation source comprising: an RF feed connector; and a metallic material coated on the magneto-optical defect center material and electrically connected to the RF feed connector. According to some embodiments, the magneto-optical defect center material can include a nitrogen vacancy (NV) diamond material having one or more NV centers.

According to some embodiments, the RF excitation source can further include a circuit board comprising an insulating board and conductive traces formed on the insulating board, the conductive traces electrically connecting the RF feed connector to the metallic material.

According to some embodiments, the conductive traces can include a first trace having a first width and a first length, and a second trace contacting the first trace, the second trace having a second width and a second length different from the first width and the first length.

According to some embodiments, the second width can match the width of the magneto-optical defect center material.

According to some embodiments, the metallic material can be at least one of gold, copper, silver, or aluminum.

According to some embodiments, the RF excitations source can further include metallic material is coated at least over a top surface and a bottom surface of the magneto-optical defect center material.

According to some embodiments, there is a system for magnetic detection that can include a magneto-optical defect center material comprising a plurality of magneto-optical defect centers; a radio frequency (RF) excitation source configured to provide RF excitation to the magneto-optical defect center material; an optical detector configured to receive an optical signal emitted by the magneto-optical defect center material; and an optical light source comprising: a readout optical light source configured to provide optical excitation to the magneto-optical defect center material to transition relevant magneto-optical defect center electrons to excited spin states in the magneto-optical defect center material; and a reset optical light source configured to provide optical light to the magneto-optical defect center material to reset spin states in the magneto-optical defect center material to a ground state, wherein the RF excitation light source comprises a block portion having a support portion which supports the magneto-optical defect center material, the block portion having a first wall portion adjacent to and on one side of the support portion and a second wall portion adjacent to and on another side of the support portion opposite to the first side, a face of the second wall portion being slanted with respect to a face of the first wall portion so as to allow light emitted by the readout optical light source and the reset optical light source to be directed to the magneto-optical defect center material. According to some embodiments, the magneto-optical defect center material can include a nitrogen vacancy (NV) diamond material having one or more NV centers.

According to some embodiments, the block portion can be formed of an electrically and thermally conductive material.

According to some embodiments, the block portion can be formed of one of copper or aluminum.

According to some embodiments, the block portion can be a heat sink.

According to some embodiments, the block portion can have side holes and bottom holes to allow for side mounting and bottom mounting, respectively, of the block portion.

According to some embodiments, the RF excitation source can include an RF feed connector; and a metallic material coated on the magneto-optical defect center material and electrically connected to the RF feed connector.

According to some embodiments, upon the RF feed connector can be driven by an RF signal, the metallic material shorts to the block portion.

Standing-Wave Radio Frequency Exciter

According to some embodiments, there is a system for magnetic detection that can include a magneto-optical defect center material comprising a plurality of magneto-optical defect centers; a radio frequency (RF) exciter system configured to provide RF excitation to the magneto-optical defect center material; an optical light source configured to direct excitation light to the magneto-optical defect center material; and an optical detector configured to receive an optical signal emitted by the magneto-optical defect center material based on the excitation light and the RF excitation. The RF exciter system can include a RF source; a controller configured to control the RF source; the RF input; a RF ground; and a microstrip line electrically connected to the RF input and short circuited to the RF ground adjacent the magneto-optical defect center material. The controller is configured to control the RF source such that a standing wave RF field is created in the magneto-optical defect center material.

According to some embodiments, the microstrip line can include conductive traces comprising a first trace having a first width and a first length, and a second trace contacting the first trace, the second trace having a second width and a second length different from the first width and the first length.

According to some embodiments, the second trace can have an impedance of less than 10Ω.

According to some embodiments, the impedance of the first trace can match a system impedance.

According to some embodiments, the first trace can have an impedance of about 50Ω.

According to some embodiments, the microstrip line can include a metallic material coated at least over a top surface, a bottom surface, and a side surface of the magneto-optical defect center material, and is short circuited to the RF ground adjacent the magneto-optical defect center material.

According to some embodiments, the microstrip line can further include a metallic material coated at least over a top surface, a bottom surface, and a side surface of the magneto-optical defect center material, and short circuited to the RF ground adjacent the magneto-optical defect center material.

According to some embodiments, the microstrip line can have a wavelength of about a quarter wavelength of an RF carrier frequency.

According to some embodiments, there is radio frequency (RF) exciter system that can provide RF excitation to a magneto-optical defect center material comprising a plurality of magneto-optical defect centers. The RF exciter system include a RF input; a controller configured to control an RF source to apply a RF signal to the RF input; a RF ground; and a microstrip line electrically connected to the RF input and short circuited to the RF ground adjacent a magneto-optical defect center material; wherein the controller is configured to control the RF source to apply an RF signal to the RF input such that a standing wave RF field is created in the magneto-optical defect center material. According to some embodiments, the magneto-optical defect center material can include a nitrogen vacancy (NV) diamond material having one or more NV centers.

According to some embodiments, the microstrip line can include conductive traces comprising a first trace having a first width and a first length, and a second trace contacting the first trace, the second trace having a second width and a second length different from the first width and the first length.

According to some embodiments, the microstrip line can include a metallic material coated at least over a top surface, a bottom surface, and a side surface of the magneto-optical defect center material, and is short circuited to the RF ground adjacent the magneto-optical defect center material.

According to some embodiments, the microstrip line can have a wavelength of about a quarter wavelength of an RF carrier frequency.

According to some embodiments, there is a radio frequency (RF) exciter system that can include a RF exciter circuit for providing RF excitation to a magneto-optical defect center material comprising a plurality of magneto-optical defect centers, the RF exciter circuit comprising: a RF input; a RF ground; and a microstrip line electrically connected to the RF input and short circuited to the ground adjacent a magneto-optical defect center material; a controller configured to control an RF source to apply an RF signal to the RF input; wherein the controller is configured to control the RF source to apply an RF signal to the RF input such that a standing wave RF field is created in the magneto-optical defect center material; and a RF termination component configured to reduce back reflection of a RF signal from the short circuit. According to some embodiments, the magneto-optical defect center material can include a nitrogen vacancy (NV) diamond material having one or more NV centers.

According to some embodiments, the RF termination component can include one of a non-reciprocal isolator device, or a balanced amplifier configuration.

According to some embodiments, the microstrip line can include a metallic material coated at least over a top surface, a bottom surface, and a side surface of the magneto-optical defect center material, and is short circuited to the RF ground adjacent the magneto-optical defect center material.

According to some embodiments, the microstrip line can have a wavelength of about a quarter wavelength of an RF carrier frequency.

According to some embodiments, the polarization of light entering the magneto-optical defect center material can be changed through other ways such as free space phase modulators, fiber coupled phase modulators, and/or other ways known by persons of skill in the art. In some embodiments, the change of polarization may be affected by an applied electric field on the index of refraction of a crystal in the modulator. In some embodiments, the change of polarization is affected by phase modulation such that an electric field is applied along a principal axis of a crystal in the modulator and light polarized along any other principal axis experiences an index of refraction change that is proportional to the applied electric field. In some embodiments, an electro-optic amplitude modulator allows the crystal in the modulator to act as a variable waveplate, allowing linear polarization to change to circular polarization, as well as circular polarization to change to linear polarization, as an applied voltage is increased. In some embodiments, modulators allowing for polarization control may be in a fiber-coupled form in an optical fiber cable or other waveguide.

Bias Magnetic Array

According to some embodiments, there is a magnetometer that can include a light source configured to provide excitation light; a magneto-optical defect center material with at least one defect center that transmits emitted light when excited by the excitation light; a light sensor configured to receive the emitted light; a plurality of magnets configured to provide a bias magnetic field to the magneto-optical defect center material; a ring magnet holder; and a mount comprising an inside surface, wherein the outside surface of the outer ring slides along the inside surface of the mount. The ring magnet holder can include an outer ring with an outside surface; and a plurality of holders extending from the ring, wherein the plurality of holders are configured to hold the plurality of magnets in a same orientation with respect to one another. According to some embodiments, the magneto-optical defect center material can include a nitrogen vacancy (NV) diamond material having one or more NV centers.

According to some embodiments, the magnetometer can further include a processor configured to: receive an indication of a frequency of the excitation light; receive an indication of a frequency of the emitted light; and determine a magnitude of an external magnetic field based at least in part on a comparison between the frequency of the excitation light and the frequency of the emitted light.

According to some embodiments, the processor can be further configured to determine a direction of the external magnetic field based at least in part on a comparison between the frequency of the excitation light and the frequency of the emitted light.

According to some embodiments, the magnet holder can further include a fixation member configured to secure the ring magnet holder in a location within the mount. The fixation member may comprise a set screw.

According to some embodiments, the mount can include a through-hole configured to allow the excitation light to pass through the through-hole of the mount.

According to some embodiments, the inside surface of the mount can have a shape that is semi-spherical.

According to some embodiments, the outside surface of the mount can have a shape that is semi-spherical.

According to some embodiments, the mount can include a first portion and a second portion that are secured together with a plurality of fasteners.

According to some embodiments, the first portion can include half of the inside surface.

According to some embodiments, the plurality of magnets can be permanent magnets.

According to some embodiments, the plurality of holders can each comprise at least one magnet hole, wherein each of the at least one magnet hole can be configured to hold one of the plurality of magnets.

According to some embodiments, the ring magnet holder can further include at least one mounting tab, and the at least one mounting tab can include a fixation member configured to secure the ring magnet holder in a location within the mount.

According to some embodiments, the mounting tab can further include at least one through-hole, wherein the at least one through-hole can include a central axis that is coaxial to a central axis of one of the at least one magnet hole.

According to some embodiments, the bias magnetic field can be substantially uniform through the magneto-optical defect center material.

According to some embodiments, the magneto-optical material can be capable of fluorescing upon the application of certain light and providing different fluorescence depending upon applied magnetic fields.

According to some embodiments, a plurality of magnets that can be configured to provide a bias magnetic field to a magneto-optical defect center material. The devices may also include a ring magnet holder that has an outer ring with an outside surface and a plurality of holders extending from the ring. The plurality of holders may be configured to hold a plurality of magnets in a same orientation with respect to one another. The devices may further include a mount that has an inside surface. The outside surface of the outer ring may slide along the inside surface of the mount.

Magneto-Optical Defect Center Sensor with Vivaldi RF Antenna Array

According to some embodiments, there is a magnetic field sensor assembly that can include an optical excitation source; a radio frequency (RF) generator; a beam former in electrical communication with the RF generator; an array of Vivaldi antenna elements in electrical communication with the beam former; and a magneto-optical defect center material positioned in a far field of the array of Vivaldi antenna elements, wherein the array of Vivaldi antenna elements generate a RF magnetic field that is uniform over the magneto-optical defect center material, wherein the optical excitation source transmits optical light at a first wavelength to the magneto-optical defect center material to detect a magnetic field based on a measurement of optical light at a second wavelength that is different from the first wavelength. According to some embodiments, the magneto-optical defect center material can include a nitrogen vacancy (NV) diamond material having one or more NV centers.

According to some embodiments, the array of Vivaldi antenna elements can be configured to operate in a range from 2 gigahertz (GHz) to 50 GHz.

According to some embodiments, the array of Vivaldi antenna elements can include a plurality of Vivaldi antenna elements and an array lattice.

According to some embodiments, the beam former can be configured to operate the array of Vivaldi antenna elements at 2 GHz.

According to some embodiments, the beam former can be configured to operate the array of Vivaldi antenna elements at 2.8-2.9 GHz.

According to some embodiments, the beam former can be configured to spatially oversample the array of Vivaldi antenna elements.

According to some embodiments, the array of Vivaldi antenna elements can be adjacent the magneto-optical defect center material.

According to some embodiments, the magneto-optical defect center material can be a diamond having nitrogen vacancies.

Magneto-Optical Defect Center Material with Integrated Waveguide

Some embodiments relate to a magneto-optical defect center material that may include a first portion comprising a plurality of defect centers dispersed throughout the first portion. The magneto-optical material also may include a second portion adjacent to the first portion. The second portion may not contain significant defect centers. The second portion may be configured to facilitate transmission of light generated by the defect centers of the first portion away from the first portion.

Some illustrative magneto-optical defect center materials may include a first portion that can have a plurality of defect centers dispersed throughout the first portion. The materials may also include a second portion adjacent to the first portion. The second portion may not contain defect centers. The second portion may be configured to facilitate transmission of light generated by the defect centers of the first portion away from the first portion.

Some illustrative magnetometers may include a diamond. The diamond may include a first portion and a second portion. The first portion may include a plurality of nitrogen vacancy (NV) centers, and the second portion may not have substantial NV centers. The second portion may be configured to facilitate transmission of light generated from the NV centers of the first portion away from the first portion. The magnetometer may further include a light source that may be configured to transmit light into the first portion of the diamond. The magnetometer may further include a photo detector configured to detect light transmitted through at least one side of the second portion of the diamond. The magnetometer may also include a processor operatively coupled to the photo detector. The processor may be configured to determine a strength of a magnetic field based at least in part on the light detected by the photo detector.

Some illustrative magneto-optical defect center materials include means for absorbing first light with a first frequency and transmitting second light with a second frequency. The materials may also include means for directing the second light that may be adjacent to the means for absorbing the first light and transmitting the second light. The means for directing the second light may not absorb the first light. The means for directing the second light may be configured to facilitate transmission of the second light away from the means for absorbing the first light and transmitting the second light.

Some illustrative methods include receiving, at a plurality of defect centers of a first portion of a magneto-optical defect center material, first light with a first frequency. The plurality of defect centers may be dispersed throughout the first portion. The method can also include transmitting, from the plurality of defect centers, second light with a second frequency. The method may further include facilitating, via a second portion of the magneto-optical defect center material, the second light away from the first portion. The second portion may be adjacent to the first portion. The second portion may not contain defect centers.

Drift Error Compensation

According to some embodiments, a system for magnetic detection may include a nitrogen vacancy (NV) diamond material comprising a plurality of NV centers, a radio frequency (RF) excitation source configured to provide RF excitation to the NV diamond material, an optical excitation source configured to provide optical excitation to the NV diamond material, an optical detector configured to receive an optical signal emitted by the NV diamond material, a magnetic field generator configured to generate a magnetic field applied to the NV diamond material, and a controller. The controller may be configured to control the optical excitation source to apply optical excitation to the NV diamond material, control the RF excitation source to apply a first RF excitation to the NV diamond material, the first RF excitation having a first frequency, and control the RF excitation source to apply a second RF excitation to the NV diamond material, the second RF excitation having a second frequency. The first frequency may be a frequency associated with a first slope point of a fluorescence intensity response of an NV center orientation of a first spin state due to the optical excitation, the first slope point being a positive slope point, and the second frequency may be a frequency associated with a second slope point of the fluorescence intensity response of the NV center orientation of the first spin state due to the optical excitation, the second slope point being a negative slope point.

In some aspects, the controller may be configured to control the RF excitation source to alternately apply the first RF excitation as a single RF pulse and apply the second RF excitation as a single RF pulse.

In some aspects, the controller may be configured to control the RF excitation source to alternately apply the first RF excitation as two or more RF pulses in sequence and apply the second RF excitation as two or more RF pulses in sequence.

In some aspects, the controller may be configured to measure a first fluorescence intensity based on an average of a fluorescence intensity associated with each of the two or more RF pulses of the first RF excitation and measure a second fluorescence intensity based on an average of a fluorescence intensity associated with each of the two or more RF pulses of the second RF excitation.

In some aspects, the controller may be configured to control the RF excitation source to alternately apply the first RF excitation as three or more RF pulses in sequence and apply the second RF excitation as three or more RF pulses in sequence, measure a first fluorescence intensity based on an average of a fluorescence intensity associated with each of two or more RF pulses of the three or more RF pulses of the first RF excitation, measure a second fluorescence intensity based on an average of a fluorescence intensity associated with each of two or more RF pulses of the three or more RF pulses of the second RF excitation.

In some aspects, the two or more RF pulses of the first RF excitation may be applied last in the sequence of the three or more pulses, and wherein the two or more RF pulses of the second RF excitation are applied last in the sequence of the three or more pulses.

In some aspects, the positive slope point may be a maximum positive slope point of the fluorescence intensity response of the NV center orientation of the first spin state and the negative slope point may be a maximum negative slope point of the fluorescence intensity response of the NV center orientation of the first spin state.

In some aspects, the positive slope point and the negative slope point may be set as an average of a maximum positive slope point and a maximum negative slope point of the fluorescence intensity response of the NV center orientation of the first spin state due to the optical excitation.

In some aspects, the controller may be configured to measure a first fluorescence intensity at the positive slope point, measure a second fluorescence intensity at the negative slope point, and calculate a compensated fluorescence intensity based on a difference between the measured first fluorescence intensity and the measured second fluorescence intensity divided by a difference between the slope of the positive slope point and the slope of the negative slope point.

In some aspects, the controller may be configured to control the RF excitation source to apply a third RF excitation to the NV diamond material, the third RF excitation having a third frequency. The third frequency may be a frequency associated with a third slope point of the fluorescence intensity response of the NV center orientation of a second spin state due to the optical excitation.

In some aspects, the third slope point may be a positive slope point.

In some aspects, the third slope point may be a negative slope point.

According to some embodiments, a system for magnetic detection may include a nitrogen vacancy (NV) diamond material comprising a plurality of NV centers, a radio frequency (RF) excitation source configured to provide RF excitation to the NV diamond material, an optical excitation source configured to provide optical excitation to the NV diamond material, an optical detector configured to receive an optical signal emitted by the NV diamond material, a magnetic field generator configured to generate a magnetic field applied to the NV diamond material, and a controller. The controller may be configured to control the optical excitation source to apply optical excitation to the NV diamond material, control the RF excitation source to apply a first RF excitation to the NV diamond material, the first RF excitation having a first frequency, and control the RF excitation source to apply a second RF excitation to the NV diamond material, the second RF excitation having a second frequency. The first frequency may be a frequency associated with a first slope point of a fluorescence intensity response of an NV center orientation of a first spin state due to the optical excitation, and the second frequency may be a frequency associated with a second slope point of the fluorescence intensity response of the NV center orientation of a second spin state due to the optical excitation.

In some aspects, the first slope point may be a positive slope point.

In some aspects, the second slope point may be a negative slope point.

In some aspects, the first slope point may be a negative slope point.

In some aspects, the second slope point may be a negative slope point.

In some aspects, the controller may be configured to control the RF excitation source to alternately apply the first RF excitation as two or more RF pulses in sequence and apply the second RF excitation as two or more RF pulses in sequence.

In some aspects, the controller may be configured to measure a first fluorescence intensity based on an average of a fluorescence intensity associated with each of the two or more RF pulses of the first RF excitation and measure a second fluorescence intensity based on an average of a fluorescence intensity associated with each of the two or more RF pulses of the second RF excitation.

In some aspects, the controller may be configured to control the RF excitation source to alternately apply the first RF excitation as three or more RF pulses in sequence and apply the second RF excitation as three or more RF pulses in sequence, measure a first fluorescence intensity based on an average of a fluorescence intensity associated with each of two or more RF pulses of the three or more RF pulses of the first RF excitation, and measure a second fluorescence intensity based on an average of a fluorescence intensity associated with each of two or more RF pulses of the three or more RF pulses of the second RF excitation.

In some aspects, the two or more RF pulses of the first RF excitation may be applied last in the sequence of the three or more pulses, and wherein the two or more RF pulses of the second RF excitation are applied last in the sequence of the three or more pulses.

In some aspects, the controller may be configured to control the RF excitation source to apply a third RF excitation to the NV diamond material, the third RF excitation having a third frequency, and control the RF excitation source to apply a fourth RF excitation to the NV diamond material, the fourth RF excitation having a fourth frequency. The third frequency may be a frequency associated with a third slope point of the fluorescence intensity response of the NV center orientation of the first spin state due to the optical excitation, and the fourth frequency may be a frequency associated with a fourth slope point of the fluorescence intensity response of the NV center orientation of the second spin state due to the optical excitation.

According to some embodiments, a method for compensating for drift error in a magnetic detection system may include applying optical excitation to a nitrogen vacancy (NV) diamond material comprising a plurality of NV centers, applying a first RF excitation to the NV diamond material, the first RF excitation having a first frequency, applying a second RF excitation to the NV diamond material, the second RF excitation having a second frequency, applying a third RF excitation to the NV diamond material, the third RF excitation having a third frequency, and applying a fourth RF excitation to the NV diamond material, the third RF excitation having a fourth frequency. The first frequency may be a frequency associated with a first slope point of a fluorescence intensity response of an NV center orientation of a first spin state due to the optical excitation, the first slope point being a positive slope point. The second frequency may be a frequency associated with a second slope point of the fluorescence intensity response of the NV center orientation of the first spin state due to the optical excitation, the second slope point being a negative slope point. The third frequency may be a frequency associated with a third slope point of the fluorescence intensity response of the NV center orientation of a second spin state due to the optical excitation. The fourth frequency may be a frequency associated with a fourth slope point of the fluorescence intensity response of the NV center orientation of the second spin state due to the optical excitation.

In some aspects, the method may further include applying each of the steps to each of four NV center orientations of the NV diamond material.

According to some embodiments, a system for magnetic detection may include a nitrogen vacancy (NV) diamond material comprising a plurality of NV centers, a radio frequency (RF) excitation source configured to provide RF excitation to the NV diamond material, an optical excitation source configured to provide optical excitation to the NV diamond material, an optical detector configured to receive an optical signal emitted by the NV diamond material, a magnetic field generator configured to generate a magnetic field applied to the NV diamond material, a means for controlling the optical excitation source to apply optical excitation to the NV diamond material, controlling the RF excitation source to apply a first RF excitation to the NV diamond material, the first RF excitation having a first frequency, and controlling the RF excitation source to apply a second RF excitation to the NV diamond material, the second RF excitation having a second frequency. The first frequency may be a frequency associated with a first slope point of a fluorescence intensity response of an NV center orientation of a first spin state due to the optical excitation, the first slope point being a positive slope point, and the second frequency may be a frequency associated with a second slope point of the fluorescence intensity response of the NV center orientation of the first spin state due to the optical excitation, the second slope point being a negative slope point.

Thermal Drift Error Compensation

According to some embodiments, there is a system for magnetic detection of an external magnetic field, comprising: a nitrogen vacancy (NV) diamond material comprising a plurality of NV centers, the diamond material having a plurality of crystallographic axes each directed in different directions, the NV centers each corresponding to a respective one of the plurality of crystallographic axes; a radio frequency (RF) excitation source configured to provide RF excitations to the NV diamond material to excite electron spin resonances corresponding to the RF excitations, each crystallographic axis corresponding to a different electron spin resonance; an optical excitation source configured to provide optical excitation to the NV diamond material; an optical detector configured to receive an optical signal based on light emitted by the NV diamond material, the optical signal having a plurality of intensity changes corresponding respectively to electron spin resonances of the NV centers; and a controller configured to: receive a light detection signal from the optical detector based on the optical signal; determine the spectral position corresponding to some of the electron spin resonances based on the light detection signal; determine a measured four-dimensional projection of a magnetic field based on the determined spectral positions of a subset of all of the plurality of spin resonances, where the number of spin resonances in the subset is one half of a total number of the spin resonances; and determine an estimated three-dimensional magnetic field based on the measured four-dimensional magnetic field projections.

According to some embodiments, there are two different electron spin resonances for each of the crystallographic axes.

According to some embodiments, the total number of spin resonances is eight and the number of spin resonances in the subset of spin resonances is four.

According to some embodiments, the subset of spin resonances includes spin resonances corresponding to each of the crystallographic axes.

According to some embodiments, the controller is configured to determine the measured four-dimensional projected field based on a least squares fit.

According to some embodiments, spin resonances in the subset of spin resonances are selected to reduce thermal drift.

According to some embodiments, there is a system for magnetic detection of an external magnetic field, comprising: a magneto-optical defect center material comprising a plurality of magneto-optical defect centers, the magneto-optical defect center material having a plurality of crystallographic axes each directed in different directions, the magneto-optical defect centers each corresponding to a respective one of the plurality of crystallographic axes; a radio frequency (RF) excitation source configured to provide RF excitations to the magneto-optical defect center material to excite electron spin resonances corresponding to the RF excitations, each crystallographic axis corresponding to a different spin resonance; an optical excitation source configured to provide optical excitation to the magneto-optical defect center material; an optical detector configured to receive an optical signal based on light emitted by the magneto-optical defect center material, the optical signal having a plurality of intensity changes corresponding respectively to electron spin resonances of the magneto-optical defect centers; and a controller configured to: receive a light detection signal from the optical detector based on the optical signal; determine the spectral position corresponding to some of the electron spin resonances based on the light detection signal; determine a measured four-dimensional projection of a magnetic field based on the determined spectral positions of a subset of all of the plurality of spin resonances, where the number of spin resonances in the subset is one half of a total number of the spin resonances; and determine an estimated three-dimensional magnetic field based on the measured four-dimensional magnetic field projections.

According to some embodiments, the magneto-optical defect center material may comprise one of diamond, silicon carbide, or silicon.

According to some embodiments, there is a system for magnetic detection of an external magnetic field, comprising: a nitrogen vacancy (NV) diamond material comprising a plurality of NV centers, the diamond material having a plurality of crystallographic axes each directed in different directions, the NV centers each corresponding to a respective one of the plurality of crystallographic axes; a radio frequency (RF) excitation source configured to provide RF excitations to the NV diamond material to excite electron spin resonances corresponding to the RF excitations, each crystallographic axis corresponding to a different spin resonance; an optical excitation source configured to provide optical excitation to the NV diamond material; an optical detector configured to receive an optical signal based on light emitted by the NV diamond material, the optical signal having a plurality of intensity changes corresponding respectively to electron spin resonances of the NV centers; and a controller configured to: receive a light detection signal from the optical detector based on the optical signal; determine the spectral position corresponding to some of the electron spin resonances based on the light detection signal; determine a measured four-dimensional projection of a magnetic field based on some of the spectral positions of the plurality of spin resonances; determine an estimated three-dimensional magnetic field based on the measured four-dimensional magnetic field projection; and determine a shift in the estimated three-dimensional magnetic field due to thermal drift based on the estimated three-dimensional magnetic field and the measured four-dimensional magnetic field projection.

According to some embodiments, there is a method for determining an external magnetic field, comprising: applying RF excitations to nitrogen vacancy (NV) diamond material to excite electron spin resonances corresponding to the RF excitations, the NV diamond material comprising a plurality of NV centers, the NV diamond material having a plurality of crystallographic axes each directed in different directions, the NV centers each corresponding to a respective one of the plurality of crystallographic axes, each crystallographic axis corresponding to a different spin resonance; applying optical excitation to the NV diamond material; detecting an optical signal based on light emitted by the NV diamond material, the optical signal having a plurality of intensity changes corresponding respectively to electron spin resonances of the NV centers; receiving a light detection signal based on the detected optical signal; determining the spectral position corresponding to some of the electron spin resonances based on the light detection signal; determining a measured four-dimensional projection of a magnetic field based on the determined spectral positions of a subset of all of the plurality of spin resonances, where the number of spin resonances in the subset is one half of a total number of the spin resonances; and determining an estimated three-dimensional magnetic field based on the measured four-dimensional magnetic field projections.

According to some embodiments, there is a method for determining an external magnetic field, comprising: applying RF excitations to magneto-optical defect center material to excite electron spin resonances corresponding to the RF excitations, the magneto-optical defect center material comprising a plurality of magneto-optical defect centers, the magneto-optical defect center material having a plurality of crystallographic axes each directed in different directions, the magneto-optical defect centers each corresponding to a respective one of the plurality of crystallographic axes, each crystallographic axis corresponding to a different spin resonance; applying optical excitation to the magneto-optical defect center material; detecting an optical signal based on light emitted by the magneto-optical defect center material, the optical signal having a plurality of intensity changes corresponding respectively to electron spin resonances of the magneto-optical defect centers; receiving a light detection signal based on the detected optical signal; determining the spectral position corresponding to some of the electron spin resonances based on the light detection signal; determining a measured four-dimensional projection of a magnetic field based on the determined spectral positions of a subset of all of the plurality of spin resonances, where the number of spin resonances in the subset is one half of a total number of the spin resonances; and determining an estimated three-dimensional magnetic field based on the measured four-dimensional magnetic field projections.

According to some embodiments, there is a method for determining an external magnetic field, comprising: applying RF excitations to nitrogen vacancy (NV) diamond material to excite electron spin resonances corresponding to the RF excitations, the NV diamond material comprising a plurality of NV centers, the NV diamond material having a plurality of crystallographic axes each directed in different directions, the NV centers each corresponding to a respective one of the plurality of crystallographic axes, each crystallographic axis corresponding to a different spin resonance; applying optical excitation to the NV diamond material; detecting an optical signal based on light emitted by the NV diamond material, the optical signal having a plurality of intensity changes corresponding respectively to electron spin resonances of the NV centers; receiving a light detection signal based on the detected optical signal; determining the spectral position corresponding to some of the electron spin resonances based on the light detection signal; determining a measured four-dimensional projection of a magnetic field based on some of the spectral positions of the plurality of spin resonances; determining an estimated three-dimensional magnetic field based on the measured four-dimensional magnetic field projections; and determining a shift in the estimated three-dimensional magnetic field due to thermal drift based on the estimated three-dimensional magnetic field and the measured four-dimensional magnetic field projections.

According to some embodiments, there is a method for determining an external magnetic field, comprising: applying RF excitations to magneto-optical defect center material to excite electron spin resonances corresponding to the RF excitations, the magneto-optical defect center material comprising a plurality of magneto-optical defect centers, the magneto-optical defect center material having a plurality of crystallographic axes each directed in different directions, the magneto-optical defect centers each corresponding to a respective one of the plurality of crystallographic axes, each crystallographic axis corresponding to a different spin resonance; applying optical excitation to the magneto-optical defect center material; detecting an optical signal based on light emitted by the magneto-optical defect center material, the optical signal having a plurality of intensity changes corresponding respectively to electron spin resonances of the magneto-optical defect centers; receiving a light detection signal based on the detected optical signal; determining the spectral position corresponding to some of the electron spin resonances based on the light detection signal; determining a measured four-dimensional projection of a magnetic field based on some of the spectral positions of the plurality of spin resonances; determining an estimated three-dimensional magnetic field based on the measured four-dimensional magnetic field projections; and determining a shift in the estimated three-dimensional magnetic field due to thermal drift based on the estimated three-dimensional magnetic field and the measured four-dimensional magnetic field projections.

Pulsed RF Methods for Optimization of Continuous Wave Measurements

According to some embodiments, a method for magnetic detection comprises (a) providing optical excitation to a magneto-optical defect center material using an optical light source, (b) providing pulsed radio frequency (RF) excitation to the magneto-optical defect center material using a pulsed RF excitation source, and (c) receiving an optical signal emitted by the magneto-optical defect center material using an optical detector, wherein the magneto-optical defect center material comprises a plurality of magneto-optical defect centers, and wherein (a) and (c) occur during (b).

According to some embodiments, the step of providing pulsed RF excitation comprises at least one pulse sequence, the at least one pulse sequence including at least one period of idle time followed by at least one period of RF pulse. According to some embodiments, the at least one period of idle time comprises at least one period of reference collection time. According to some embodiments, the at least one period of reference collection time occurs during (a) and (c), but not during (b). According to some embodiments, the at least one period of RF pulse comprises at least one period of settling time and at least one period of collection time. According to some embodiments, the at least one pulse sequence is for a time ranging between 100 μs and 2000 μs.

According to some embodiments, the at least one period of idle time is shorter than the at least one period of RF pulse. According to some embodiments, the pulsed RF excitation occurs at a single frequency. According to some embodiments, a different single frequency is selected for each diamond lattice vector and associated ms=±1 spin state.

According to some embodiments, the at least one period of idle time is longer than the at least one period of RF pulse. According to some embodiments, the pulsed RF excitation frequency is swept.

According to some embodiments, the method further comprises, following the step of receiving an optical signal, suppressing the optical detector and the pulsed RF source. According to some embodiments, the method further comprises repolarizing the optical light source to set the magneto-optical defect center material for subsequent measurement. According to some embodiments, the optical light source is continuously applied throughout the method for magnetic detection.

According to some embodiments, a system for magnetic detection comprises a controller configured to (a) provide optical excitation to a magneto-optical defect center material using an optical light source, (b) provide pulsed radio frequency (RF) excitation to the magneto-optical defect center material using a pulsed RF excitation source, and (c) receive an optical signal emitted by the magneto-optical defect center material using an optical detector, wherein the magneto-optical defect center material comprises a plurality of magneto-optical defect centers, and wherein (a) and (c) occur during (b).

High Speed Sequential Cancellation for Pulsed Mode

Some embodiments provide methods and systems for high bandwidth acquisition of magnetometer data with increased sensitivity. In some implementations, a reference signal may be utilized prior to acquisition of a measured signal for a magnetometer. This reference signal may provide a full repolarization of a magneto-optical defect center material prior to acquiring the reference signal. The reference signal may then be used to adjust the measured signal to correct for potential fluctuations in optical excitation power levels, which can cause a proportional fluctuation in the measured signal. However, such a full repolarization and added reference signal before each measured signal may reduce the bandwidth of the magnetometer and may also increase measurement noise, and therefore decrease sensitivity, by including noise from the reference signal when calculating the resulting processed signal. To increase bandwidth and sensitivity, the reference signal may be omitted such that only a radiofrequency (RF) pulse excitation sequence is included between measurements. In some implementations, a fixed "system rail" photo measurement may be obtained initially and used as a fixed reference signal for subsequent measured signals. The fixed, nominal reference signal can substantially compensate for intensity shifts for the magnetometer without decreasing bandwidth or sensitivity. In other implementations, additional signal processing may be utilized to adjust for drift, jitter, or other variations in intensity levels.

Some embodiments may include a magnetometer and a controller. The magnetometer may include a magneto-optical defect center material, an optical excitation source, a radiofrequency (RF) excitation source, and an optical sensor. The controller may be configured to activate a radiofrequency (RF) pulse sequence for the RF excitation source to apply a RF field to the magneto-optical defect center material, acquire a nominal ground reference signal for the magneto-optical defect center material, and acquire a magnetic field measurement from the magneto-optical defect center material using the optical sensor. The magnetic field measurement may be acquired independent of a reference magnetic field measurement.

In some implementations, acquiring the repetitive magnetic field measurement can include a polarization pulse length. In some implementations, the controller may processes the repetitive magnetic field measurement directly to obtain magnetometry measurements. In some implementations, the controller may further be configured to determine a vector of the repetitive magnetic field measurement. In some implementations, the controller may use a fixed system rail photo measurement as a nominal reference value. The magneto-optical defect center material may be a diamond having nitrogen vacancies. The controller may be further configured to process the magnetic field measurement.

Other implementations may relate to a method for operating a magnetometer having a magneto-optical defect center material. The method may include activating a radiofrequency (RF) pulse sequence to apply an RF field to the magneto-optical defect center material, acquiring a nominal ground reference signal for the magneto-optical defect center material, and acquiring a magnetic field measurement using the magneto-optical defect center material. The magnetic field measurement may be acquired independent of a reference magnetic field measurement.

In some implementations, acquiring the magnetic field measurement can include a polarization pulse length. In some implementations, acquiring a magnetic field measurement may include processing the magnetic field measurement directly to obtain magnetometry measurements. In some implementations, the method may further include determining a vector of the repetitive magnetic field measurement. In some implementations, acquiring a magnetic field measurement may include using a fixed system rail photo measurement as a nominal reference value. The magneto-optical defect center material may be a diamond having nitrogen vacancies. The method can further include processing the magnetic field measurement using a controller.

Yet other implementations relate to a sensor that may include a magneto-optical defect center material, a radiofrequency (RF) excitation source, and a controller. The controller may be configured to activate a radiofrequency (RF) pulse sequence for the RF excitation source to apply a RF field to the magneto-optical defect center material, acquire a nominal ground reference signal for the magneto-optical defect center material, and acquire a magnetic field measurement from the magneto-optical defect center material. The magnetic field measurement may be acquired independent of a reference magnetic field measurement.

In some implementations, acquiring the magnetic field measurement can include a polarization pulse length. In some implementations, the controller may processes the magnetic field measurement directly to obtain magnetometry measurements. In some implementations, the controller may further be configured to determine a vector of the magnetic field measurement. In some implementations, the controller may use a fixed system rail photo measurement as a nominal reference value. The magneto-optical defect center material may be a diamond having nitrogen vacancies. The controller may be further configured to process the magnetic field measurement.

Photodetector Circuit Saturation Mitigation

Some embodiments relate to a system that may comprise: a magneto-optical defect center material, a first optical excitation source configured to provide a first optical excitation to the magneto-optical defect center material, a second optical excitation source configured to provide a second optical excitation to the magneto-optical defect center material, and an optical detection circuit comprising a photocomponent, the optical detection circuit configured to activate a switch between a disengaged state and an engaged state, receive, via the second optical excitation source, a light signal comprising a high intensity signal provided by the second optical excitation source, and cause at least one of the photocomponent or the optical detection circuit to operate in a non-saturated state responsive to the activation of the switch.

Some embodiments relate to an apparatus that may comprise at least one processor and at least one memory storing computer program code, the at least one memory and the computer program code configured to, with the processor, cause the apparatus to at least: activate a switch between a disengaged state and an engaged state, receive, via a second optical excitation source, a light signal comprising a high intensity signal provided by the second optical excitation source, wherein the second optical excitation source is configured to provide optical excitation to a magneto-optical defect center material, and cause at least one of a photocomponent or an optical detection circuit to operate in a non-saturated state responsive to the activation of the switch.

Some embodiments relate to a controller. The controller may be configured to: activate a switch between a disengaged state and an engaged state, and activate an optical excitation source configured to provide optical excitation to a magneto-optical defect center material responsive to the activation of the switch, wherein the switch is configured to cause at least one of a photocomponent or an optical detection circuit to operate in a non-saturated state.

Some embodiments relate to a method that may comprise: activating a switch between a disengaged state and an engaged state, receiving, via a second optical excitation source, a light signal comprising a high intensity signal provided by the second optical excitation source, wherein the second optical excitation source is configured to provide optical excitation to a magneto-optical defect center material, and causing at least one of a photocomponent or an optical detection circuit to operate in a non-saturated state responsive to the activation of the switch.

Shifted Magnetometry Adapted Cancellation for Pulse Sequence

According to some embodiments, a system for magnetic detection may include a magneto-optical defect center material comprising a plurality of defect centers, a radio frequency (RF) excitation source configured to provide RF excitation to the magneto-optical defect center material, an optical excitation source configured to provide optical excitation to the magneto-optical defect center material, an optical detector configured to receive an optical signal emitted by the magneto-optical defect center material, a bias magnet configured to separate RF resonance responses of the lattice oriented subsets of the magneto-optical defect center material, and a controller. The controller may be configured to control the optical excitation source and the RF excitation source to apply a first pulse sequence to the magneto-optical defect center material, the first pulse sequence comprising a first optical excitation pulse, a first pair of RF excitation pulses separated by a first time period, and a second optical excitation pulse to the magneto-optical defect center material. The controller may be configured to control the optical excitation source and the RF excitation source to further apply a second pulse sequence to the magneto-optical defect center material, the second pulse sequence comprising a third optical excitation pulse, a second pair of RF excitation pulses separated by a second time period, and a fourth optical excitation pulse to the magneto-optical defect center material. In some embodiments, a pulse width of the first pair of RF excitation pulses may be different than a pulse width of the second pair of RF excitation pulses, and the first time period may be different than the second time period. The controller may be further configured to receive a first light detection signal from the optical detector based on an optical signal emitted by the magneto-optical defect center material due to the first pulse sequence and may be configured to receive a second light detection signal from the optical detector based on an optical signal emitted by the magneto-optical defect center material due to the second pulse sequence. The controller may be further configured to compute a combined measurement based on a difference between a measured value of the first light detection signal and a measured value of the second light detection signal wherein the slope of the combined measurement is greater that the slope of the first light detection signal and the second light detection signal. The controller may be further configured to compute a combined measurement based on a difference between a measured value of the first light detection signal and a measured value of the second light detection signal wherein the slope of the combined measurement is greater than the slope of the measured value of the first and second light detection signals.

According to some embodiments, a method for magnetic detection using a magneto-optical defect center material comprising a plurality of defect centers may comprise applying a first pulse sequence to the magneto-optical defect center material, applying a second pulse sequence to the magneto-optical defect center material, receiving a first light detection signal using an optical detector, receiving a second light detection signal using the optical detector, and computing a combined measurement based on a difference between a measured value of the first light detection signal and a measured value of the second light detection signal. The first pulse sequence may comprise a first optical excitation pulse using an optical excitation source, a first pair of RF excitation pulses separated by a first time period using a radio frequency (RF) excitation source, and a second optical excitation pulse to the magneto-optical defect center material using the optical excitation source. The second pulse sequence may comprise a third optical excitation pulse using the optical excitation source, a second pair of RF excitation pulses separated by a second time period using the RF excitation source, and a fourth optical excitation pulse to the magneto-optical defect center material using the optical excitation source. In some embodiments, a pulse width of the first pair of RF excitation pulses is different than a pulse width of the second pair of RF excitation pulses. In some embodiments, the first time period is different than the second time period. Receiving the first light detection signal may be based on an optical signal emitted by the magneto-optical defect center material due to the first pulse sequence. The second light detection signal, may be based on an optical signal emitted by the magneto-optical defect center material due to the second pulse sequence.

In some embodiments, an RF excitation frequency used for the first pair of RF excitation pulses and the second pair of RF excitation pulses in a system for magnetic detection may be associated with an axis of a defect center of the magneto-optical defect center material. In some embodiments, the controller may be further configured to compute a change in an external magnetic field acting on the magneto-optical defect center material based on the combined measurement. In some embodiments, a method for magnetic detection using a magneto-optical defect center material has the RF excitation frequency used for the first pair of RF excitation pulses and the second pair of RF excitation pulses is associated with an axis of a defect center of the magneto-optical defect center material. In some embodiments, a method for magnetic detection using a magneto-optical defect center material further comprises computing a change in an external magnetic field acting on the magneto-optical defect center material based on the combined measurement. In some embodiments, the second pair of RF excitation pulses of the first pulse sequence may be applied at a frequency detuned from a resonance frequency of the magneto-optical defect center material. The pulse width of the second pair of RF excitation pulses may be associated with a null at center frequency representing a lack of dimming in the fluorescence of the magneto-optical defect center material. The second time period may be associated with a null at a center frequency representing a lack of dimming in the fluorescence of the magneto-optical defect center material. The pulse width of the second pair of RF excitation pulses and the second time period may be associated with a null at a center frequency representing a lack of dimming in the fluorescence of the magneto-optical defect center material. The RF excitation source may be a microwave antenna. In some embodiments, of a system for magnetic detection, the controller may be configured to apply the first pair of RF excitation pulses followed by the second pair of RF excitation pulses. In some embodiments, the pulse width of the first pair of RF excitation pulses and the first time period is associated with a high point at a center frequency representing dimming in the fluorescence of the magneto-optical defect center material. In some embodiments, a method for magnetic detection using a magneto-optical defect center material may have the first pair of RF excitation pulses applied followed by the second pair of RF excitation pulses. In some embodiments, the bias magnet is one of a permanent magnet, a magnet field generator, or a Halbach set of permanent magnets.

In some embodiments, computing the change in an external magnetic field acting on the magneto-optical defect center material based on the combined measurement comprise a plurality of pairs of RF excitation pulses. In some embodiments, once the magnetometry curves have been obtained for the pairs of RF excitation pulses at different frequencies, a SMAC measurement may be performed at a chosen frequency (e.g. at a frequency with a maximum slope for the curve) and the intensity of the SMAC measurement is monitored to provide an estimate of the magnetic field. In some embodiments, the maximum slope, positive and negative, may be determined from the curve obtained by the SMAC pairing and the corresponding frequencies. In some embodiments, the curve may be first smoothed and fit to a cubic spline. In some embodiments, only the corresponding frequencies may be stored for use in magnetic field measurements. In some implementations, the entire curve may be stored.

According to some embodiments, a magnetic detection system may comprise a defect center material responsive to an applied magnetic field, a radio frequency (RF) emitter operational to provide a first RF pulse sequence separated by at least one pause, a detector operational to measure the fluorescence of the defect center material in conjunction with the first RF pulse sequence and the second RF pulse sequence, thereby providing a first measurement curve and a second measurement curve affected by the applied magnetic field, respectfully, and a control circuit connected to the detector and operational to determine a difference between the first measurement curve and the second measurement curve to obtain greater sensitivity to variations in the applied magnetic field. The RF emitter may be operational to provide a second RF pulse sequence that is different from the first RF pulse sequence. The RF emitter may be operational to provide a second RF pulse sequence that is different from the first RF pulse sequence.

In some embodiments, the first RF pulse sequence and the second RF pulse sequence are applied at a frequencies detuned from a resonance frequency of the defect center material. In some embodiments, the first RF pulse sequence is applied followed by the second RF pulse sequence. The defect center material may be a nitrogen vacancy diamond. The defect center material may be Silicon Carbide (SiC).

According to some embodiments, a method for magnetic detection or a method for detecting a magnetic field, comprises emitting a first RF pulse sequence separated by at least one pause, using an RF emitter to a defect center material, emitting a second RF pulse sequence that is different from the first RF pulse sequence, using the RF emitter, to the defect center material, measure the fluorescence of the defect center material in conjunction with the first RF pulse sequence and the second RF pulse sequence, using a detector, providing a first measurement curve and a second measurement curve of the measured fluorescence of the defect center material affected by the applied magnetic field, respectfully for the first RF pulse sequence and the second RF pulse sequence, and determining a difference between the first measurement curve and the second measurement curve to obtain greater sensitivity to variations in the applied magnetic field.

In some embodiments of a method for magnetic detection, determining the difference between the first measurement curve and the second measurement curve may be performed by a control circuit. In some embodiments, the first RF pulse sequence and the second RF pulse sequence may be applied at a frequency detuned from a resonance frequency of the defect center material. In some embodiments, the first RF pulse sequence may be emitted followed by the second RF pulse sequence. In some embodiments, the defect center material may be a nitrogen vacancy diamond. In some embodiments, the defect center material is Silicon Carbide (SiC).

According to some embodiments, a system for magnetic detection may comprise, a magneto-optical defect center material comprising a plurality of defect centers, a means of providing RF excitation to the magneto-optical defect center material, a means of providing optical excitation to the magneto-optical defect center material, a means of receiving an optical signal emitted by the magneto-optical defect center material, and a means of controlling the provided RF excitation and provided optical excitation. The means of controlling the provided RF excitation and provided optical excitation may apply a first pulse sequence to the magneto-optical defect center material, the first pulse sequence comprising a first optical excitation pulse, a first pair of RF excitation pulses separated by a first time period, and a second optical excitation pulse to the magneto-optical defect center material, control the optical excitation source and the RF excitation source to apply a second pulse sequence to the magneto-optical defect center material, the second pulse sequence comprising a third optical excitation pulse, a second pair of RF excitation pulses separated by a second time period, and a fourth optical excitation pulse to the magneto-optical defect center material, receive a first light detection signal from the optical detector based on an optical signal emitted by the magneto-optical defect center material due to the first pulse sequence, receive a second light detection signal from the optical detector based on an optical signal emitted by the magneto-optical defect center material due to the second pulse sequence, and compute a combined measurement based on a difference between a measured value of the first light detection signal and a measured value of the second light detection signal. The pulse width of the first pair of RF excitation pulses may be different than the pulse width of the second pair of RF excitation pulses, and the first time period may be different than the second time period.

Magnetic Field Proxy Through RF Frequency Dithering

Some embodiments may include a system having a magnetometer and a controller. The magnetometer may include a magneto-optical defect center material, an optical excitation source, a radiofrequency (RF) excitation source, and an optical sensor. The controller may be configured to activate a radiofrequency (RF) pulse sequence for the RF excitation source to apply a RF field to the magneto-optical defect center material. The RF pulse sequence may be based on a magnetic field proxy modulation and a base RF wave, and the magnetic field proxy modulation may be indicative of a proxy magnetic field. The controller may be further configured to activate an optical pulse sequence for the optical excitation source to apply a laser pulse to the magneto-optical defect center material and acquire in conjunction with the optical pulse sequence a magnetic field measurement from the magneto-optical defect center material using the optical sensor. The magnetic field measurement comprises a proxy magnetic field based on the magnetic field proxy modulation.

In some implementations, the magnetic field proxy modulation may be a sinusoidal magnetic field proxy modulation. In some implementations, the sinusoidal magnetic field proxy modulation may be calculated based on $\gamma b_1 \sin(2\pi f_1 t)$, where $\gamma$ is the electron gyromagnetic ratio for the magneto-optical defect center material, $b_1$ is a selected projected magnitude for the proxy magnetic field, and $f_1$ is selected frequency for the proxy magnetic field. In some implementations, the selected projected magnitude for the proxy magnetic field may be between 100 picoTeslas and 1 microTesla. In some implementations, the selected frequency for the proxy magnetic field may be between 0 Hz and 100 kHz. In some implementations, the magnetic field measurement may include magnetic communication data. In some implementations, the magnetic field measurement may include magnetic navigation data. In some implementations, the magnetic field measurement may include magnetic location data. In some implementations, the magneto-optical defect center material may include a diamond having nitrogen vacancies.

Other implementations may relate to a method for operating a magnetometer having a magneto-optical defect center material. The method may include activating a radiofrequency (RF) pulse sequence to apply an RF field to the magneto-optical defect center material and acquiring a magnetic field measurement using the magneto-optical defect center material. The RF pulse sequence may be based on a magnetic field proxy modulation and a base RF wave, and the magnetic field proxy modulation is indicative of a proxy magnetic field. The magnetic field measurement may include a proxy magnetic field based on the magnetic field proxy modulation.

In some implementations, the magnetic field proxy modulation may be a sinusoidal magnetic field proxy modulation. In some implementations, the sinusoidal magnetic field proxy modulation may be calculated based on $\gamma b_1 \sin(2\pi f_1 t)$, where $\gamma$ is the electron gyromagnetic ratio for the magneto-optical defect center material, $b_1$ is a selected projected magnitude for the proxy magnetic field, and $f_1$ is a selected frequency for the proxy magnetic field. In some implementations, the selected projected magnitude for the proxy magnetic field may be between 100 picoTeslas and 1 microTesla. In some implementations, the selected frequency for the proxy magnetic field may be between 0 Hz and 100 kHz. In some implementations, the magnetic field measurement may include magnetic communication data. In some implementations, the magnetic field measurement may include magnetic navigation data. In some implementations, the magnetic field measurement may include magnetic location data. In some implementations, the magneto-optical defect center material may include a diamond having nitrogen vacancies.

Yet other implementations may relate to a sensor that includes a magneto-optical defect center material, a radiofrequency (RF) excitation source, and a controller. The controller is configured to activate a radiofrequency (RF) pulse sequence for the RF excitation source to apply a RF field to the magneto-optical defect center material and acquire a magnetic field measurement from the magneto-optical defect center material. The RF pulse sequence may be based on a magnetic field proxy modulation and a base RF wave, and the magnetic field proxy modulation is indicative of a proxy magnetic field. The magnetic field measurement may include a proxy magnetic field based on the magnetic field proxy modulation.

In some implementations, the magnetic field proxy modulation may be a sinusoidal magnetic field proxy modulation. In some implementations, the sinusoidal magnetic field proxy modulation may be calculated based on $\gamma b_1 \sin(2\pi f_1 t)$, where $\gamma$ is the electron gyromagnetic ratio for the magneto-optical defect center material, $b_1$ is a selected projected magnitude for the proxy magnetic field, and $f_1$ is selected frequency for the proxy magnetic field. In some implementations, the selected projected magnitude for the proxy magnetic field may be between 100 picoTeslas and 1 microTesla. In some implementations, the selected frequency for the proxy magnetic field may be between 0 Hz and 100 kHz.

Some embodiments relate to a magnetometer that includes a magneto-optical defect center material, a radiofrequency (RF) excitation source, an optical sensor, and a controller. The controller may be configured to activate a radiofrequency (RF) pulse sequence for the RF excitation source to apply a RF field to the magneto-optical defect center material and acquire a magnetic field measurement from the magneto-optical defect center material using the optical sensor. The RF pulse sequence may be based on a magnetic field proxy modulation and a base RF wave, and the magnetic field proxy modulation may be indicative of a proxy magnetic field. The magnetic field measurement may include a proxy magnetic field based on the magnetic field proxy modulation. The controller may be further configured to set a value for a flag indicative of passing an initial pass/fail test based on a processed proxy magnetic reference signal determined from the magnetic field measurement.

In some implementations, the magnetic field proxy modulation may be a sinusoidal magnetic field proxy modulation. In some implementations, the sinusoidal magnetic field proxy modulation may be calculated based on $\gamma b_1 \sin(2\pi f_1 t)$, where $\gamma$ is the electron gyromagnetic ratio for the magneto-optical defect center material, $b_1$ is a selected projected magnitude for the proxy magnetic field, and $f_1$ is selected frequency for the proxy magnetic field. In some implementations, the selected projected magnitude for the proxy magnetic field may be between 100 picoTeslas and 1 microTesla. In some implementations, the selected frequency for the proxy magnetic field may be between 0 Hz and 100 kHz.

Some embodiments relate to a magnetometer that includes a magneto-optical defect center material, a radiofrequency (RF) excitation source, an optical sensor, and a controller. The controller may be configured to activate a radiofrequency (RF) pulse sequence for the RF excitation source to apply a RF field to the magneto-optical defect center material and acquire a magnetic field measurement from the magneto-optical defect center material using the optical sensor. The RF pulse sequence may be based on a magnetic field proxy modulation and a base RF wave, and the magnetic field proxy modulation may be indicative of a proxy magnetic field. The magnetic field measurement may include a proxy magnetic field based on the magnetic field proxy modulation. The controller may be further configured to determine an attenuation value based on a processed proxy magnetic reference signal determined from the magnetic field measurement.

In some implementations, the magnetic field proxy modulation may be a sinusoidal magnetic field proxy modulation. In some implementations, the sinusoidal magnetic field proxy modulation may be calculated based on $\gamma b_1 \sin(2\pi f_1 t)$, where $\gamma$ is an electron gyromagnetic ratio for the magneto-optical defect center material, $b_1$ is a selected projected magnitude for the proxy magnetic field, and $f_1$ is selected frequency for the proxy magnetic field. In some implementations, the selected projected magnitude for the proxy magnetic field may be between 100 picoTeslas and 1 microTesla. In some implementations, the selected frequency for the proxy magnetic field may be between 0 Hz and 100 kHz.

Some embodiments relate to a magnetometer that includes a magneto-optical defect center material, a radiofrequency (RF) excitation source, an optical sensor, and a controller. The controller may be configured to activate a radiofrequency (RF) pulse sequence for the RF excitation source to apply a RF field to the magneto-optical defect center material and acquire a magnetic field measurement from the magneto-optical defect center material using the optical sensor. The RF pulse sequence may be based on a magnetic field proxy modulation and a base RF wave, and the bia magnetic field proxy modulation may be indicative of a proxy magnetic field. The magnetic field measurement may include a proxy magnetic field based on the magnetic field proxy modulation. The controller may be further configured to determine an estimated calibrated noise floor value based on a processed proxy magnetic reference signal determined from the magnetic field measurement.

In some implementations, the magnetic field proxy modulation may be a sinusoidal magnetic field proxy modulation. In some implementations, the sinusoidal magnetic field proxy modulation may be calculated based on $\gamma b_1 \sin(2\pi f_1 t)$, where $\gamma$ is an electron gyromagnetic ratio for the magneto-optical defect center material, $b_1$ is a selected projected magnitude for the proxy magnetic field, and $f_1$ is selected frequency for the proxy magnetic field. In some implementations, the selected projected magnitude for the proxy magnetic field may be between 100 picoTeslas and 1 microTesla. In some implementations, the selected frequency for the proxy magnetic field may be between 0 Hz and 100 kHz.

Other implementations relate to a magnetometer that includes a magneto-optical defect center material, an excitation source, an optical sensor, and a controller. The controller may be configured to activate an energy pulse sequence for the excitation source to apply an energy field to the magneto-optical defect center material and acquire a magnetic field measurement from the magneto-optical defect center material using the optical sensor. The energy pulse sequence may be based on a magnetic field proxy modulation and a base signal, and the magnetic field proxy modulation may be indicative of a proxy magnetic field. The magnetic field measurement may include a proxy magnetic field based on the magnetic field proxy modulation.

In some other implementations, a magnetic field proxy modulation may be a sinusoidal magnetic field proxy modulation. In some implementations, the sinusoidal magnetic field proxy modulation may be calculated based on $\gamma b_1 \sin(2\pi f_1 t)$, where $\gamma$ is the electron gyromagnetic ratio for the magneto-optical defect center material, $b_1$ is a selected projected magnitude for the proxy magnetic field, and $f_1$ is selected frequency for the proxy magnetic field. In some implementations, the selected projected magnitude for the proxy magnetic field may be between 100 picoTeslas and 1 microTesla. In some implementations, the selected frequency for the proxy magnetic field may be between 0 Hz and 100 kHz.

Spin Relaxometry Based Molecular Sequencing

According to some embodiments, a method for detecting a target molecule may comprise: allowing a fluid containing the target molecule to pass by a complementary moiety attached to a paramagnetic ion so as to cause the complementary moiety and the paramagnetic ion to change a position; detecting a magnetic effect change caused by the change in position of the paramagnetic ion; and identifying the target molecule based on the identity of the complementary moiety and the detected magnetic effect change.

According to some embodiments, the detecting a magnetic effect change comprises detecting a change in spin relaxation of an electron spin center.

According to some embodiments, the electron spin center comprises one or more of diamond nitrogen vacancy (DNV) centers, defect centers in silicon carbide, or defect centers in silicon.

According to some embodiments, the detecting a magnetic effect change comprises detecting a change in the spin relaxation time of the electron spin center.

According to some embodiments, the detecting a magnetic effect change comprises detecting a change in photoluminescence from the electron spin center.

According to some embodiments, the detecting a magnetic effect change is performed by detecting a change in an electrical read out.

According to some embodiments, the magnetic effect change is detected based on the fluid containing the target molecule passing through a pore of a substrate.

According to some embodiments, the method further comprises detecting a change in ionic current as the target molecule is in the pore, wherein the identifying the target molecule is further based on the detected change in the ionic current.

According to some embodiments, the substrate comprises an electron spin center, and the detecting a magnetic effect change comprises detecting a change in spin relaxation of the electron spin center.

According to some embodiments, the substrate comprises diamond, and the electron spin center comprises one or more diamond nitrogen vacancy (DNV) centers.

According to some embodiments, the substrate comprises DNV centers arranged in a band surrounding the pore.

According to some embodiments, the paramagnetic ion is attached to an inner surface of the pore via a ligand attachment of the paramagnetic ion.

According to some embodiments, the paramagnetic ion is attached to the complementary molecule. According to some embodiments, the paramagnetic ion is one of Gd3+, another Lathanide series ion, or Manganese.

According to some embodiments, the target molecule is part of a DNA molecule.

According to some embodiments, the identifying the target molecule is further based on a second effect detecting technique other than the magnetic effect change.

According to some embodiments, a method for detecting target moieties of a target molecule may comprise: allowing a fluid containing the target molecule to pass by a plurality of complementary moieties, each of the plurality of complementary moieties attached to a different respective paramagnetic ion and specific to a respective of the target moieties, so as to cause a respective complementary moiety and paramagnetic ion to change a position; detecting a magnetic effect change caused by the change in position of a respective of the paramagnetic ions for each of the plurality of target moieties; and identifying the target moieties based on the identities of the complementary moieties and the detected magnetic effect changes.

According to some embodiments, the detecting a magnetic effect change for each of the plurality of target moieties comprises detecting a change in spin relaxation of an electron spin center.

According to some embodiments, a system for detecting a target molecule comprises: a substrate comprising an electron spin center; a complementary moiety attached to a paramagnetic ion, which is attached to the substrate; a magnetic effect detector arranged to detect a magnetic effect change of the electron spin center caused by a change in position of the paramagnetic ion due to the target molecule passing by the complementary moiety; and a processor configured to identify the target molecule based on the identity of the complementary moiety and the detected magnetic effect change.

According to some embodiments, the magnetic effect detector may comprise a light source arranged to direct excitation light onto the electron spin center; and a light detector arranged to receive photoluminescence light from the electron spin center based on the excitation light.

According to some embodiments, the system for detecting target moieties of a target molecule comprises: a substrate comprising a plurality of electron spin centers; a plurality of complementary moieties attached to respective of a plurality of paramagnetic ions, which are attached to the substrate, each of the plurality of complementary moieties attached to a different respective paramagnetic ion and specific to a respective of the target moieties; a magnetic effect detector arranged to detect, for each of the target moieties, a magnetic effect change of a respective electron spin center caused by a change in position of a respective of the paramagnetic ions due to the target moieties passing by a respective of the complementary moieties; and a processor configured to identify the target moieties based on the identities of the complementary moieties and detected magnetic effect changes.

According to some embodiments, a method for detecting target moieties of a target molecule may comprise: allowing a fluid containing the target molecule to pass by a plurality of complementary moieties, each of the plurality of target moieties attached to a different respective paramagnetic ion and specific to a respective of the complementary moieties, so as to cause a respective target moiety and paramagnetic ion to change a position; detecting a magnetic effect change caused by the change in position of a respective of the paramagnetic ions for each of the plurality of target moieties; and identifying the target moieties based on the identities of the complementary moieties and the detected magnetic effect changes.

Micro Air Vehicle Implementation of Magnetometers

Some embodiments relate to a system that includes a plurality of unmanned aerial systems (UASs) and a plurality of magnetometers each attached to a respective one of the UASs. Each of the magnetometers are configured to generate a vector measurement of a magnetic field. Some systems also include a central processing unit in communication with each of the plurality of magnetometers. The central processing unit can be configured to receive, from each of the plurality of magnetometers, a first set of vector measurements and corresponding locations. The corresponding locations can indicate where a respective magnetometer was when the respective vector measurement of the first set of vector measurements was taken. The central processing unit can also configured to generate a magnetic baseline map using the first set of vector measurements and receive, from a first magnetometer of the plurality of magnetometers, a first vector measurement and a first corresponding location. The central processing unit can further configured to compare the first vector measurement with the magnetic baseline map using the first corresponding location to determine a first difference vector and determine that a magnetic object is in an area corresponding to the area of the magnetic baseline map based on the first difference vector.

Some embodiments relate to a method that includes receiving, from each of a plurality of magnetometers, a first set of vector measurements and corresponding locations. Each of the magnetometers can be attached to one of a plurality of unmanned aerial systems (UASs). Each of the magnetometers can be configured to generate a vector measurement of a magnetic field. The corresponding locations indicate where a respective magnetometer was when the respective vector measurement of the first set of vector measurements was taken. Some methods also include generating a magnetic baseline map using the first set of vector measurements and receiving, from a first magnetometer of the plurality of magnetometers, a first vector measurement and a first corresponding location. Some methods further include comparing the first vector measurement with the magnetic baseline map using the first corresponding location to determine a first difference vector. Some methods also include determining that a magnetic object is in an area corresponding to the area of the magnetic baseline map based on the first difference vector.

Some embodiments relate to a system that includes a plurality of magnetometers that are each configured to generate a vector measurement of a magnetic field. Some systems also include a central processing unit that can be communicatively coupled to each of the magnetometers. The central processing unit can be configured to receive from each of the plurality of magnetometers the respective vector measurement of the magnetic field. The central processing unit can be further configured to compare each of the vector measurements to determine differences in the vector measurements and to determine, based on the differences in the vector measurements, that a magnetic object is near the plurality of magnetometers.

Some embodiments relate to a method that includes receiving, from each of a plurality of magnetometers, a respective vector measurement of a magnetic field. Some methods also include comparing each of the vector measurements to determine differences in the vector measurements. Some methods further include determining, based on the differences in the vector measurements, that a magnetic object is near the plurality of magnetometers.

Some embodiments relate to a system that includes a first magnetometer configured to detect a first vector measurement of a magnetic field. The magnetic field can be generated by a magnetic device. Some systems also include a second magnetometer configured to detect a second vector measurement of the magnetic field. The first magnetometer and the second magnetometer can be spaced apart from one another. Some systems further include a processor in communication with the first magnetometer and the second magnetometer. The processor can be configured to determine a location of the magnetic device in a three-dimensional space based on the first vector measurement and the second vector measurement.

Buoy Implementation of Magnetometers

Some embodiments relate to systems that include a plurality of unmanned aerial systems (UASs) and a plurality of magnetometers each attached to a respective one of the UASs. Each of the magnetometers are configured to generate a vector measurement of a magnetic field. Some systems also include a central processing unit in communication with each of the plurality of magnetometers. The central processing unit can be configured to receive, from each of the plurality of magnetometers, a first set of vector measurements and corresponding locations. The corresponding locations may indicate where a respective magnetometer was when the respective vector measurement of the first set of vector measurements was taken. The central processing unit can also be configured to generate a magnetic baseline map using the first set of vector measurements and receive, from a first magnetometer of the plurality of magnetometers, a first vector measurement and a first corresponding location. The central processing unit can be further configured to compare the first vector measurement with the magnetic baseline map using the first corresponding location to determine a first difference vector and determine that a magnetic object is in an area corresponding to the area of the magnetic baseline map based on the first difference vector.

Some embodiments relate to methods that include receiving, from each of a plurality of magnetometers, a first set of vector measurements and corresponding locations. Each of the magnetometers can be attached to one of a plurality of unmanned aerial systems (UASs). Each of the magnetometers can be configured to generate a vector measurement of a magnetic field. The corresponding locations can indicate where a respective magnetometer was when the respective vector measurement of the first set of vector measurements was taken. Some embodiments relate to methods that also include generating a magnetic baseline map using the first set of vector measurements and receiving, from a first magnetometer of the plurality of magnetometers, a first vector measurement and a first corresponding location. Some embodiments relate to methods that further include comparing the first vector measurement with the magnetic baseline map using the first corresponding location to determine a first difference vector. Some embodiments relate to methods that also include determining that a magnetic object is in an area corresponding to the area of the magnetic baseline map based on the first difference vector.

Some embodiments relate to systems that include a plurality of magnetometers that are each configured to generate a vector measurement of a magnetic field. Some systems also include a central processing unit that is communicatively coupled to each of the magnetometers. The central processing unit can be configured to receive from each of the plurality of magnetometers the respective vector measurement of the magnetic field. The central processing unit can be further configured to compare each of the vector measurements to determine differences in the vector measurements and to determine, based on the differences in the vector measurements, that a magnetic object is near the plurality of magnetometers.

Some embodiments relate to methods that include receiving, from each of a plurality of magnetometers, a respective vector measurement of a magnetic field. Some methods also include comparing each of the vector measurements to determine differences in the vector measurements. Some methods further include determining, based on the differences in the vector measurements, that a magnetic object is near the plurality of magnetometers.

Some embodiments relate to systems that include a first magnetometer configured to detect a first vector measurement of a magnetic field. The magnetic field can be generated by a magnetic device. Some systems also include a second magnetometer configured to detect a second vector measurement of the magnetic field. The first magnetometer and the second magnetometer can be spaced apart from one another. Some systems can further include a processor in communication with the first magnetometer and the second magnetometer. The processor can be configured to determine a location of the magnetic device in a three-dimensional space based on the first vector measurement and the second vector measurement.

Di-Lateration Using Magnetometers

Some embodiments relate to systems that include a plurality of unmanned aerial systems (UASs) and a plurality of magnetometers each attached to a respective one of the UASs. Each of the magnetometers are configured to generate a vector measurement of a magnetic field. Some systems also include a central processing unit in communication with each of the plurality of magnetometers. The central processing unit can be configured to receive, from each of the plurality of magnetometers, a first set of vector measurements and corresponding locations. The corresponding locations can indicate where a respective magnetometer was when the respective vector measurement of the first set of vector measurements was taken. The central processing unit can also be configured to generate a magnetic baseline map using the first set of vector measurements and receive, from a first magnetometer of the plurality of magnetometers, a first vector measurement and a first corresponding location. The central processing unit can be further configured to compare the first vector measurement with the magnetic baseline map using the first corresponding location to determine a first difference vector and determine that a magnetic object is in an area corresponding to the area of the magnetic baseline map based on the first difference vector.

Some embodiments relate to methods that include receiving, from each of a plurality of magnetometers, a first set of vector measurements and corresponding locations. Each of the magnetometers can be attached to one of a plurality of unmanned aerial systems (UASs). Each of the magnetometers can be configured to generate a vector measurement of a magnetic field. The corresponding locations can indicate where a respective magnetometer was when the respective vector measurement of the first set of vector measurements was taken. Some methods also include generating a magnetic baseline map using the first set of vector measurements and receiving, from a first magnetometer of the plurality of magnetometers, a first vector measurement and a first corresponding location. Some methods further include comparing the first vector measurement with the magnetic baseline map using the first corresponding location to determine a first difference vector. Some methods also include determining that a magnetic object is in an area corresponding to the area of the magnetic baseline map based on the first difference vector.

Some embodiments relate to systems that include a plurality of magnetometers that are each configured to generate a vector measurement of a magnetic field. Some systems also include a central processing unit that is communicatively coupled to each of the magnetometers. The central processing unit can be configured to receive from each of the plurality of magnetometers the respective vector measurement of the magnetic field. The central processing unit can be further configured to compare each of the vector measurements to determine differences in the vector measurements and to determine, based on the differences in the vector measurements, that a magnetic object is near the plurality of magnetometers.

Some embodiments relate to methods that include receiving, from each of a plurality of magnetometers, a respective vector measurement of a magnetic field. Some methods also include comparing each of the vector measurements to determine differences in the vector measurements. Some methods further include determining, based on the differences in the vector measurements, that a magnetic object is near the plurality of magnetometers.

Some embodiments relate to systems that include a first magnetometer configured to detect a first vector measurement of a magnetic field. The magnetic field can be generated by a magnetic device. Some systems also include a second magnetometer configured to detect a second vector measurement of the magnetic field. The first magnetometer and the second magnetometer can be spaced apart from one another. Some systems further include a processor in communication with the first magnetometer and the second magnetometer. The processor can be configured to determine a location of the magnetic device in a three-dimensional space based on the first vector measurement and the second vector measurement.

Geolocation of Magnetic Sources Using Magnetometers

Some embodiments relate to a system including one or more diamond nitrogen vacancy (DNV) sensors and a controller. The controller can be configured to activate the DNV sensors, receive a set of vector measurements from the DNV sensors, and determine an angle of a magnetic source relative to the one or more DNV sensors based on the received set of vector measurements from the DNV sensors. In other implementations, the controller may be configured to determine geolocation of a magnetic source relative to the one or more DNV sensors based on the received set of vector measurements from the DNV sensors.

Some embodiments relate to a geolocating device that includes one or more diamond nitrogen vacancy (DNV) sensors and means for activating the DNV sensors, receiving a set of vector measurements from the DNV sensors, and determining an angle of a magnetic source relative to the one or more DNV sensors based on the received set of vector measurements from the DNV sensors.

Localization of Subsurface Liquids Using Magnetometers

Some embodiments relate to a system for locating a subsurface liquid. The system includes an excitation coil configured to induce a magnetic resonance in a subsurface liquid, an array of magnetometers associated with the excitation coil and configured to detect a magnetic vector of the magnetic resonance excited subsurface liquid, and a controller in communication with the array of magnetometers and configured to locate the subsurface liquid based on magnetic signals output from the array of magnetometers.

In some implementations, the array of magnetometers is an array of DNV magnetometers. In some implementations, the array of magnetometers is an array of SQUIDs. In some implementations, the excitation coil is a proton spin resonance excitation coil. In some implementations, the excitation coil and the array of magnetometers are mounted to a substructure. In some implementations, the controller is configured to deactivate the array of magnetometers during adiabatic passage preparation of the magnetic resonance signal. In some implementations, deactivating the array of magnetometers comprises deactivating an optical excitation source. In some implementations, deactivating the array of magnetometers comprises deactivating a RF excitation source. In some implementations, deactivating the array of magnetometers comprises deactivating an optical excitation source and a RF excitation source. In some implementations, the controller is configured to record an oscillatory proton ($^1$H) magnetic resonance (MR) Larmor precession in Earth's field by the array of magnetometers. In some implementations, the controller is configured to filter a local Earth field from a magnetic signal detected by the array of magnetometers. In some implementations, the filtering comprises periodic filtering ("AC") pulse sequence operation of the magnetometers. In some implementations, the filtering comprises reversal of $^1$H magnetization in alternating signal co-additions. In some implementations, locating the subsurface liquid includes the controller generating a numerical location of the subsurface liquid. In some implementations, locating the subsurface liquid includes the controller generating a two-dimensional reconstruction of the subsurface liquid. In some implementations, locating the subsurface liquid includes the controller generating a three-dimensional reconstruction of the subsurface liquid. In some implementations, the subsurface liquid is oil. In some implementations, the subsurface liquid is water.

Some embodiments relate to methods for locating a subsurface liquid. Some methods include activating a proton spin resonance excitation coil, activating an array of magnetometers, recording an oscillatory $^1$H MR precession in Earth's field by the array of magnetometers, and generating a location of the subsurface liquid based on the recorded oscillatory $^1$H MR precession.

In some implementations, the array of magnetometers is an array of DNV magnetometers. In some implementations, the array of magnetometers is an array of SQUIDs. In some implementations, the proton spin resonance excitation coil and the array of magnetometers are mounted to a substructure. In some implementations, the method further includes deactivating the array of magnetometers during adiabatic passage preparation. In some implementations, deactivating the array of magnetometers comprises deactivating an optical excitation source. In some implementations, deactivating the array of magnetometers comprises deactivating a RF excitation source. In some implementations, deactivating the array of magnetometers comprises deactivating an optical excitation source and a RF excitation source. In some implementations, the method further includes filtering a local Earth field from a magnetic signal detected by the array of magnetometers. In some implementations, the filtering includes AC filtering pulse sequence. In some implementations, the filtering includes reversal of $^1$H magnetization in alternating signal co-additions. In some implementations, generating a location of the subsurface liquid includes generating a numerical location of the subsurface liquid. In some implementations, generating a location of the subsurface liquid includes generating a two-dimensional reconstruction of the subsurface liquid. In some implementations, generating a location of the subsurface liquid includes generating a three-dimensional reconstruction of the subsurface liquid. In some implementations, the subsurface liquid is oil. In some implementations, the subsurface liquid is water.

Some embodiments relate to an apparatus. The apparatus includes a substructure, a proton spin resonance excitation coil mounted to the substructure and configured to induce a magnetic resonance in a subsurface liquid, an array of DNV magnetometers mounted to the substructure and configured to detect a magnetic vector of the magnetic resonance excited subsurface liquid, and a controller in communication with the array of magnetometers. The controller is configured to record an oscillatory $^1$H MR precession in Earth's field by the array of magnetometers and locate the subsurface liquid based on magnetic signals output from the array of magnetometers.

In some implementations, the controller is configured to deactivate the array of DNV magnetometers during adiabatic passage preparation. In some implementations, deactivating the array of magnetometers comprises deactivating an optical excitation source. In some implementations, deactivating the array of magnetometers comprises deactivating a RF excitation source. In some implementations, deactivating the array of magnetometers comprises deactivating an optical excitation source and a RF excitation source. In some implementations, the controller is further configured to filter a local Earth field from a magnetic signal detected by the array of magnetometers. In some implementations, the filtering comprises AC filtering pulse sequence. In some implementations, the filtering comprises reversal of $^1$H magnetization in alternating signal co-additions. In some implementations locating the subsurface liquid includes the controller generating a numerical location of the subsurface liquid. In some implementations, locating the subsurface liquid includes the controller generating a two-dimensional reconstruction of the subsurface liquid. In some implementations, locating the subsurface liquid includes the controller generating a three-dimensional reconstruction of the subsurface liquid. In some implementations, the subsurface liquid is oil. In some implementations, the subsurface liquid is water.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The details of one or more implementations are set forth in the accompanying drawings and the description below. Other features, aspects, and advantages will become apparent from the description, the drawings, and the claims, in which:

Example Magnetometer

Figure 7:
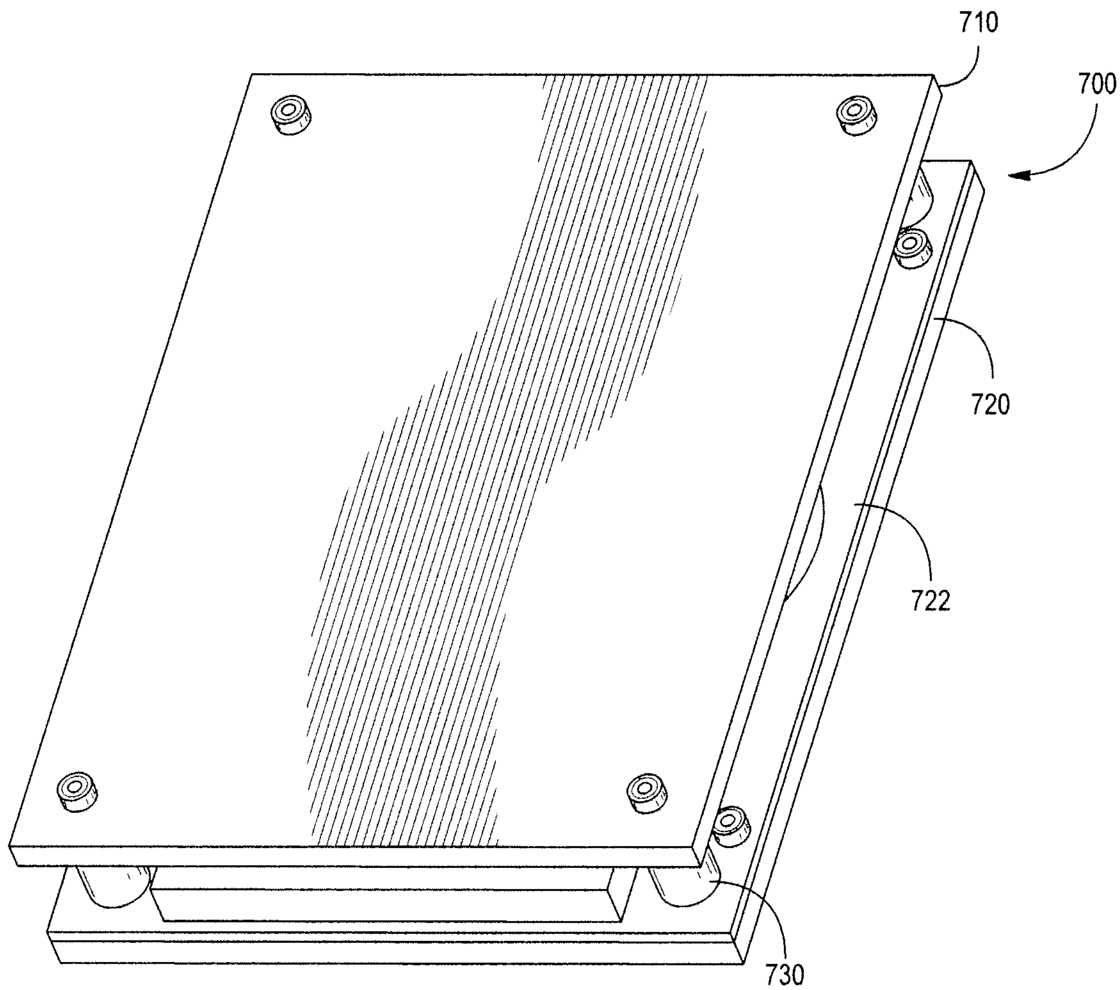
Figure 8:
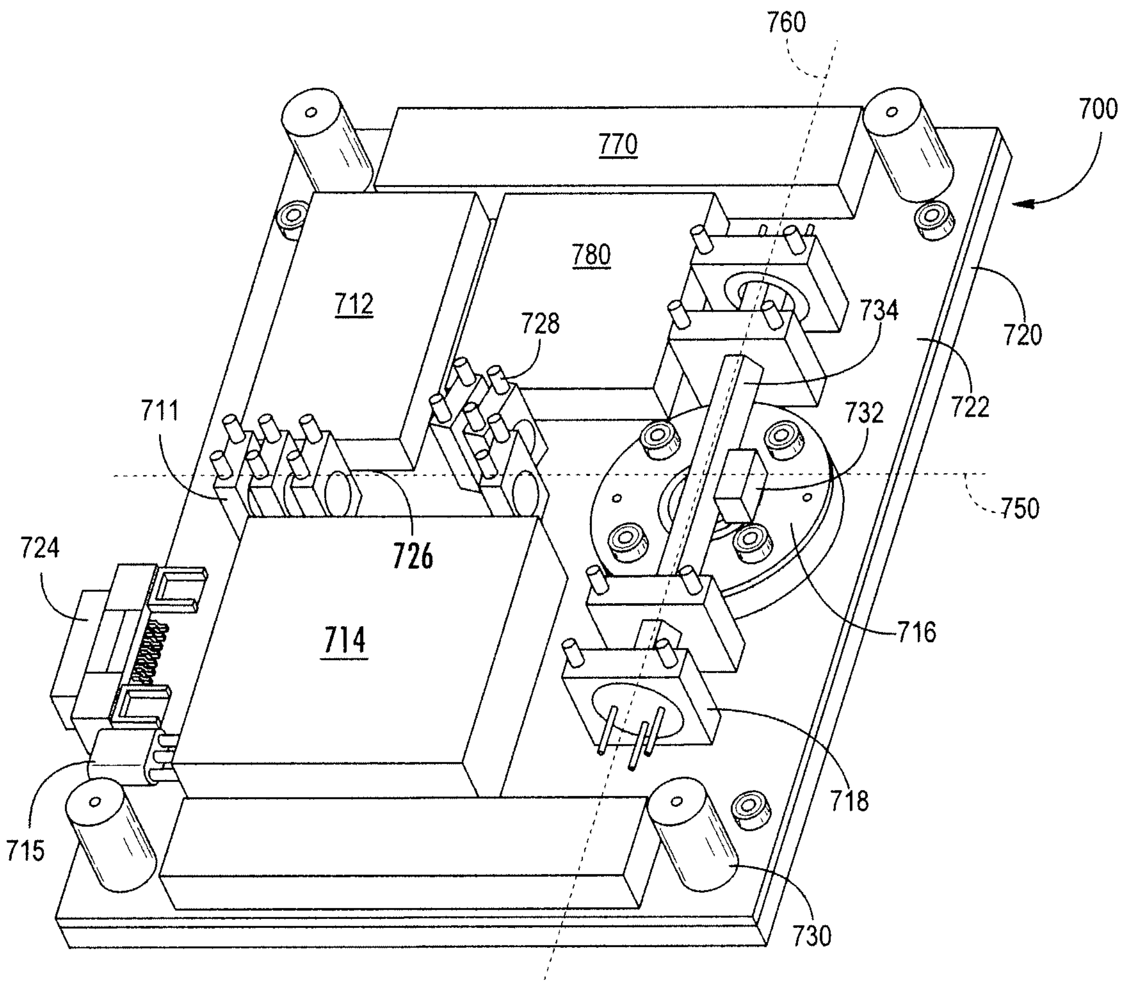
Figure 9:
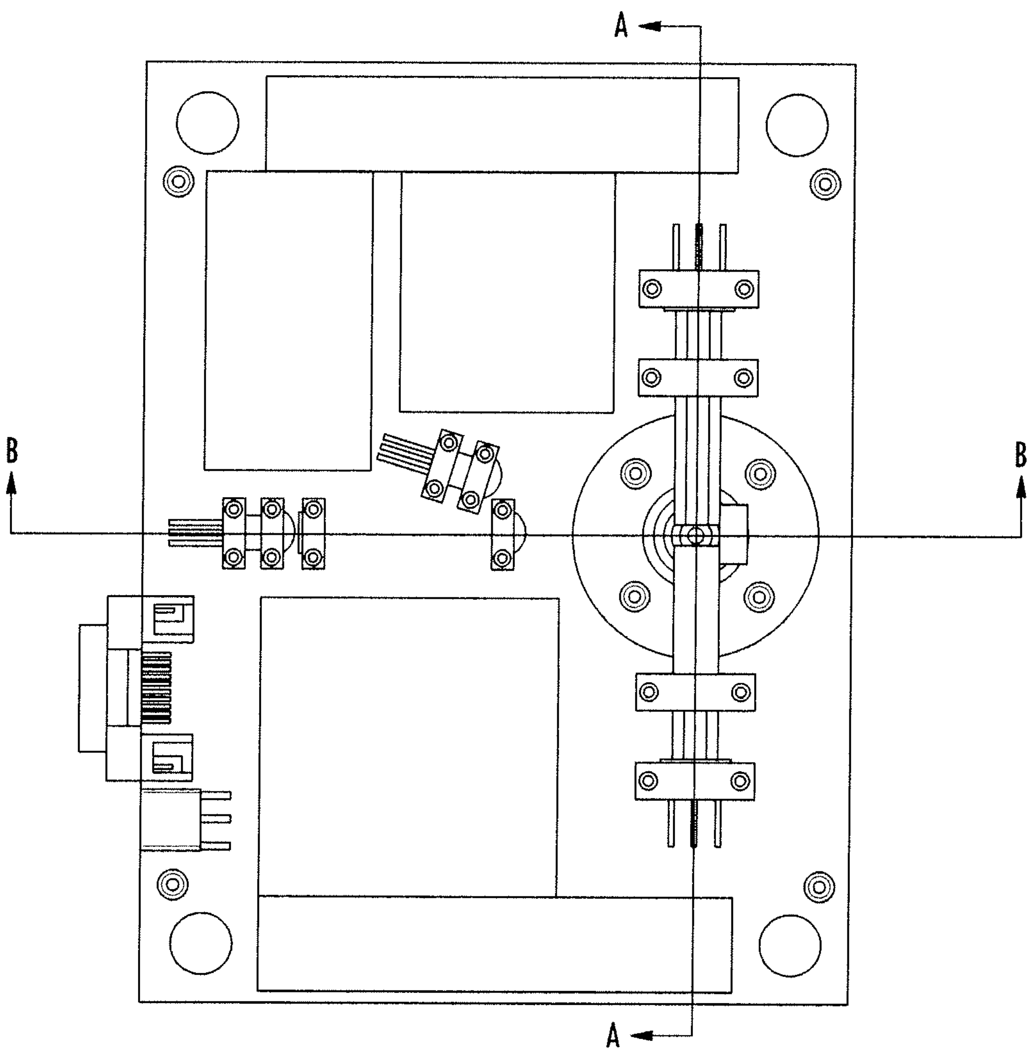
Figure 10:
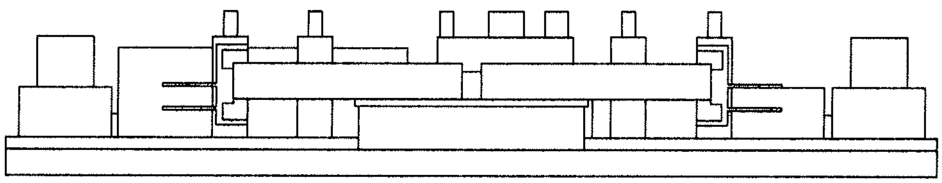
Figure 11:
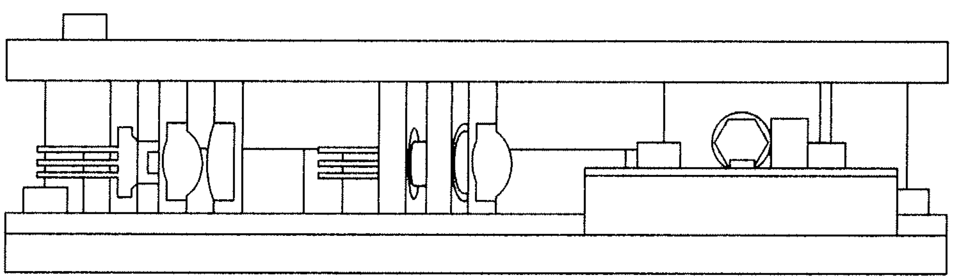
Figure 12:
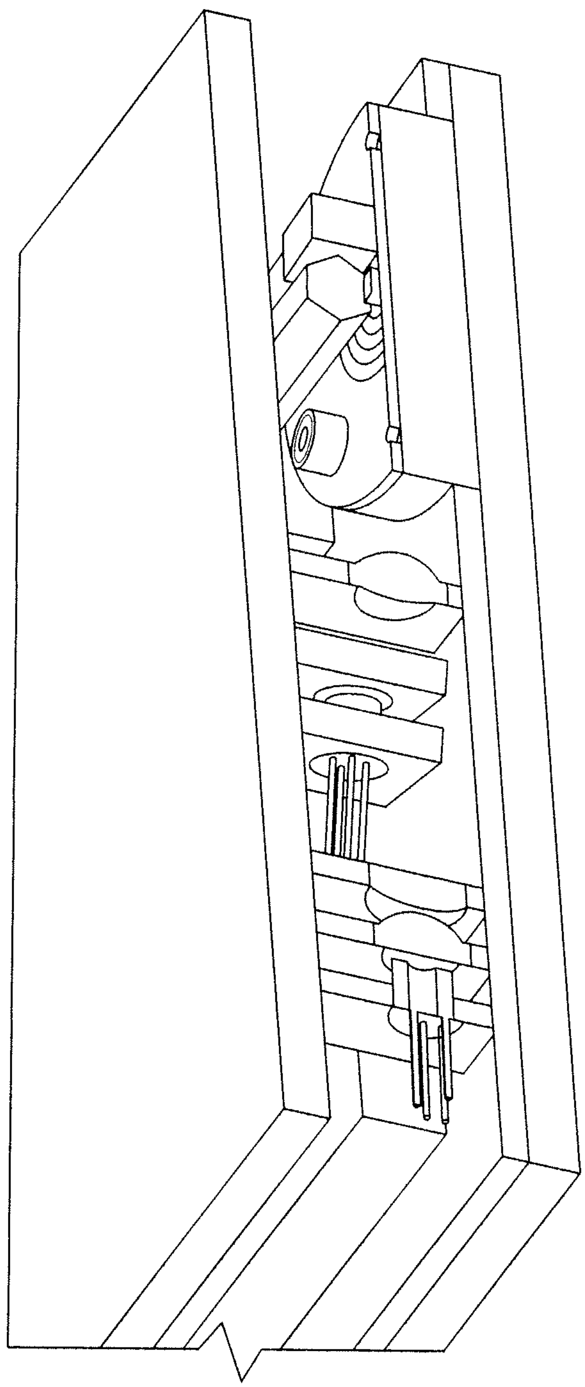
Figure 13:
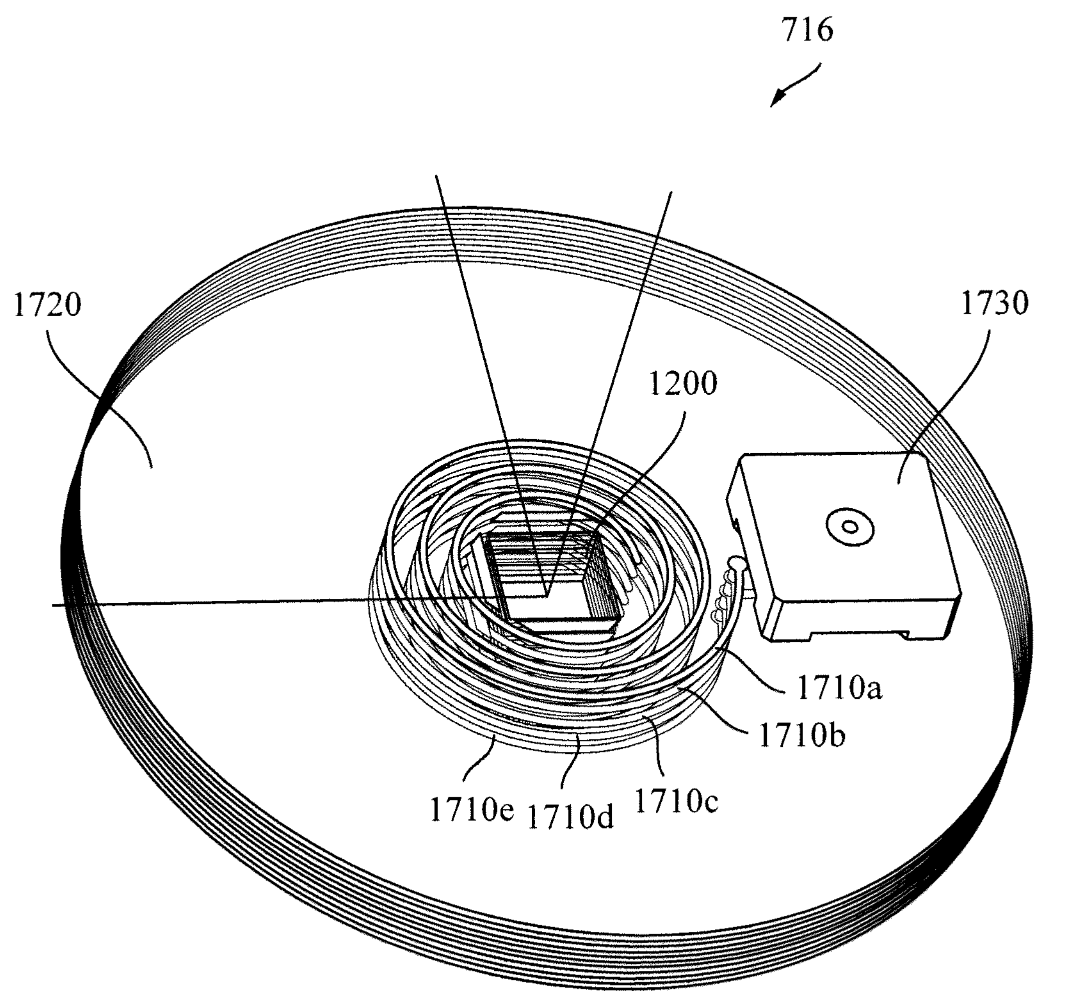
Figure 14A:
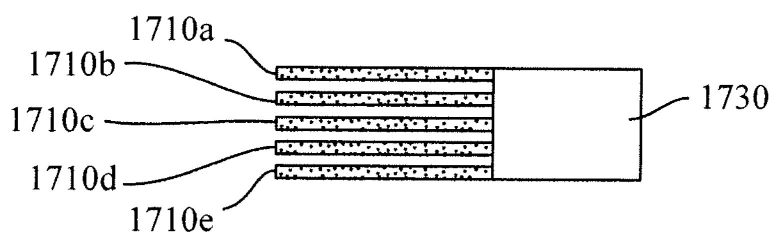
Figure 14B:
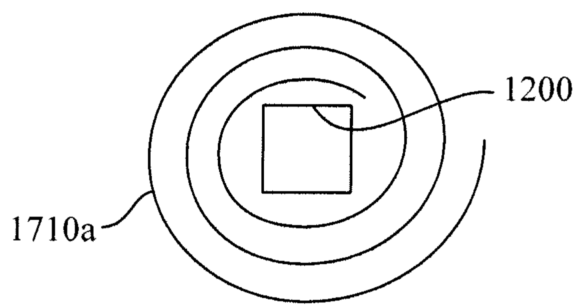
Figure 15A:
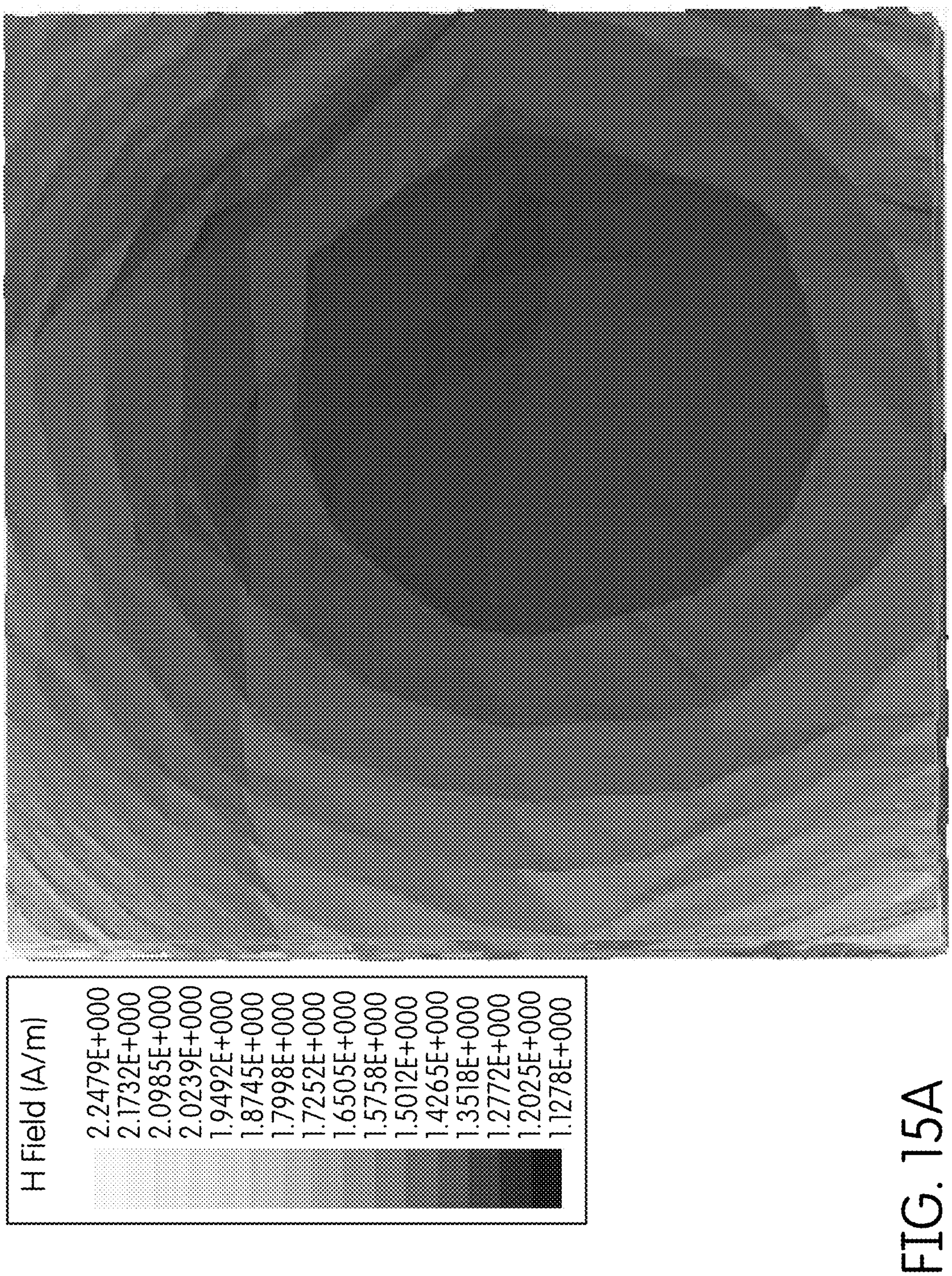
Figure 15B:
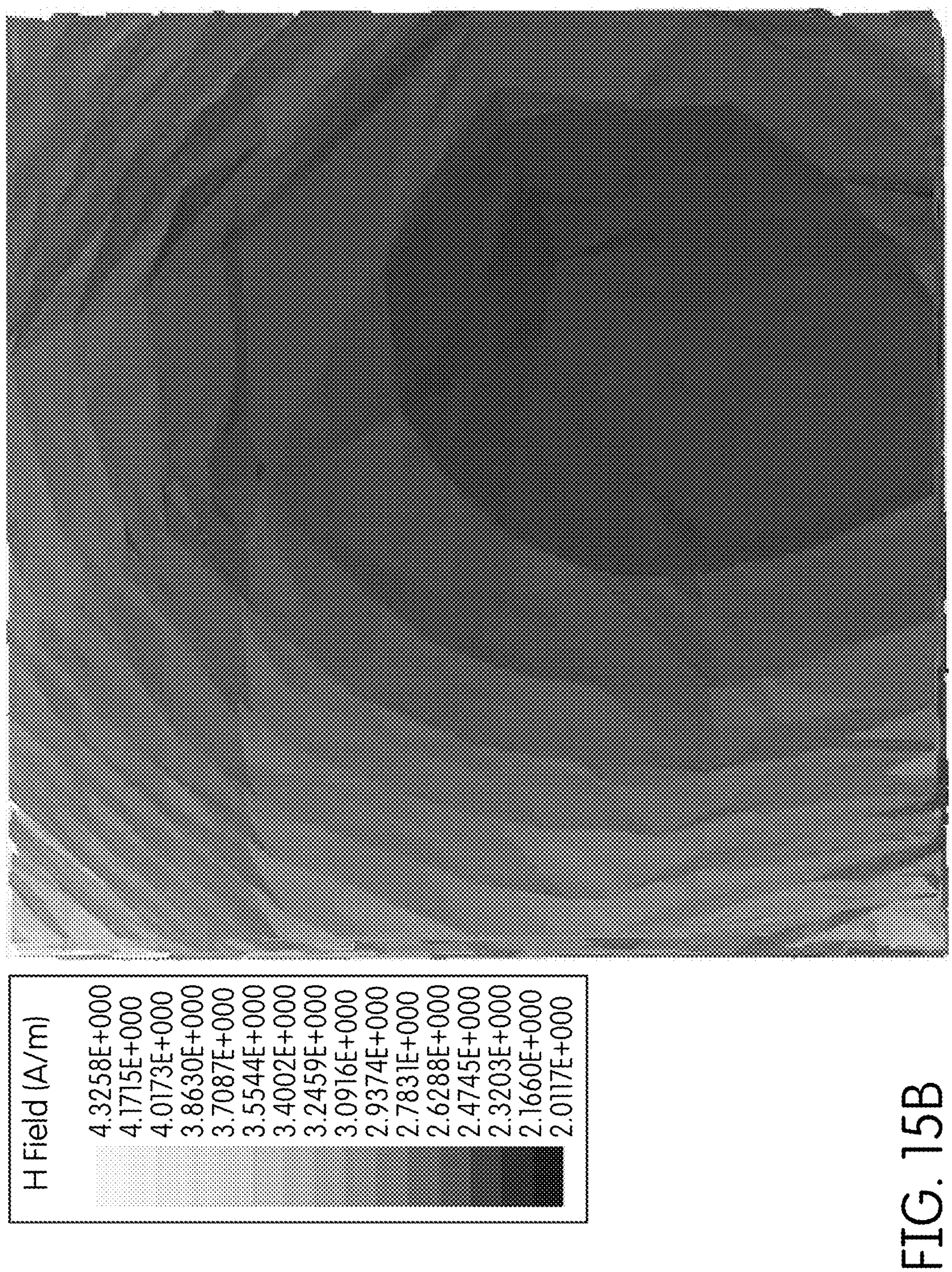
Figure 15C:
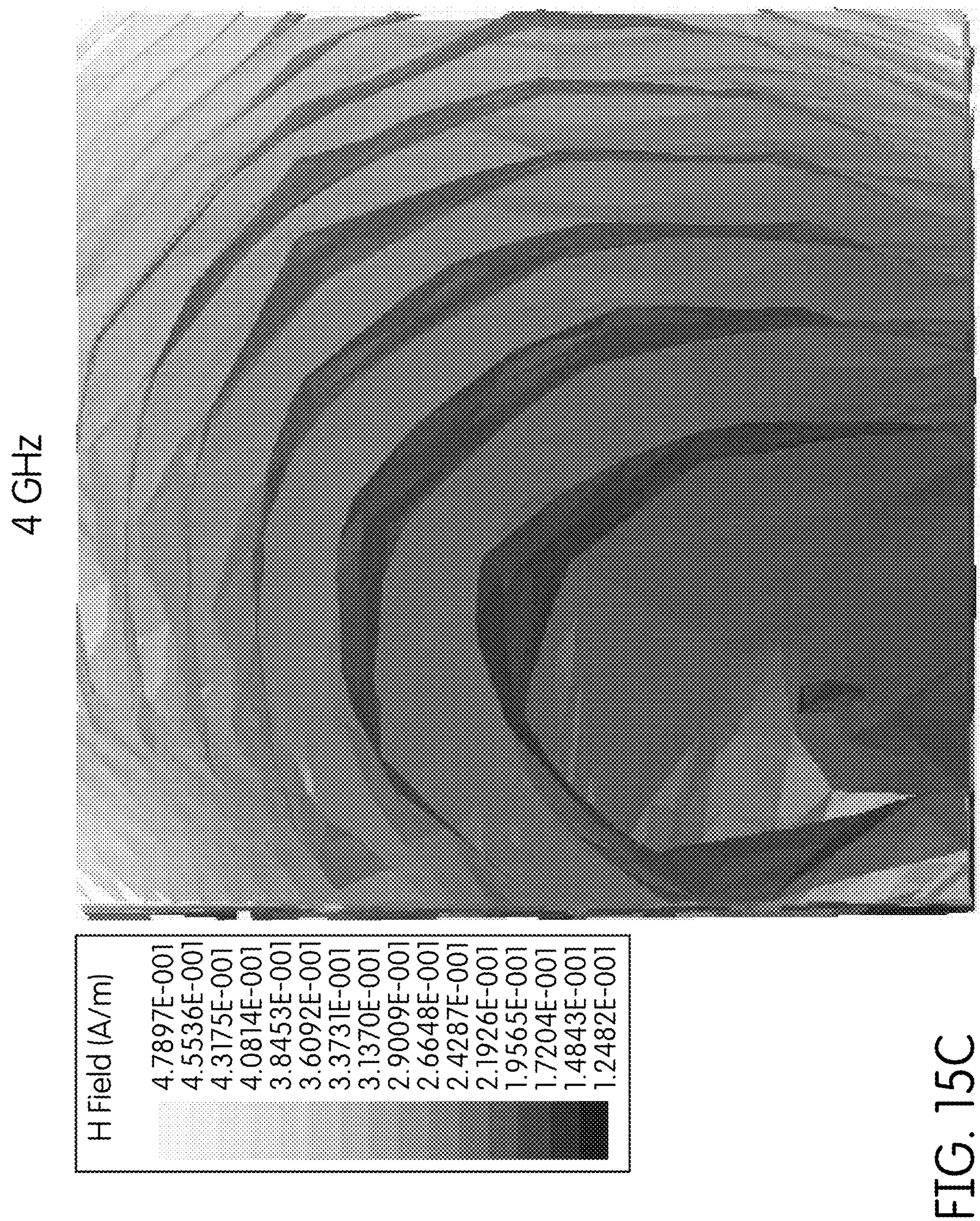
Figure 17:
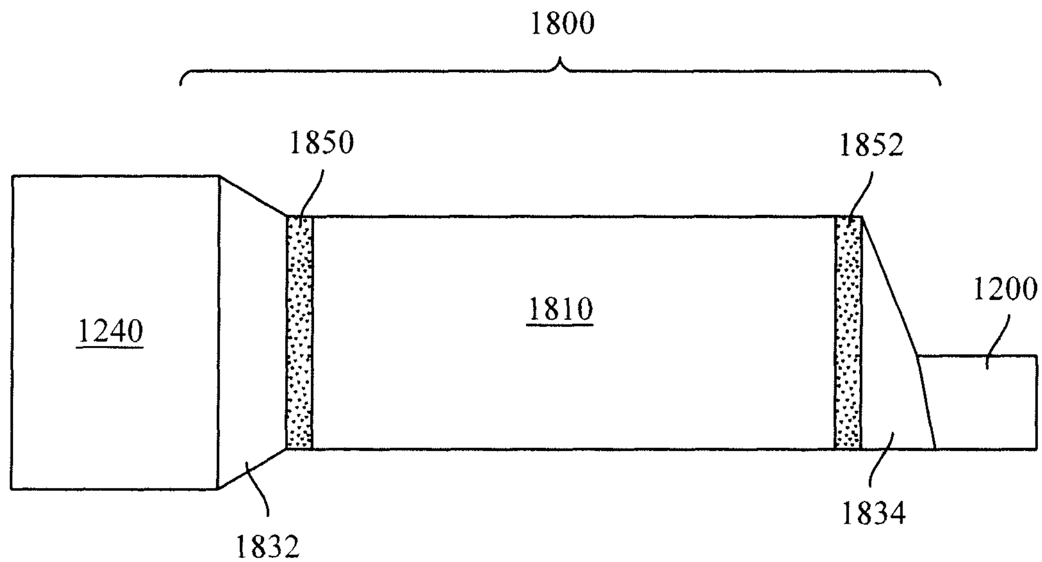
Figure 18:
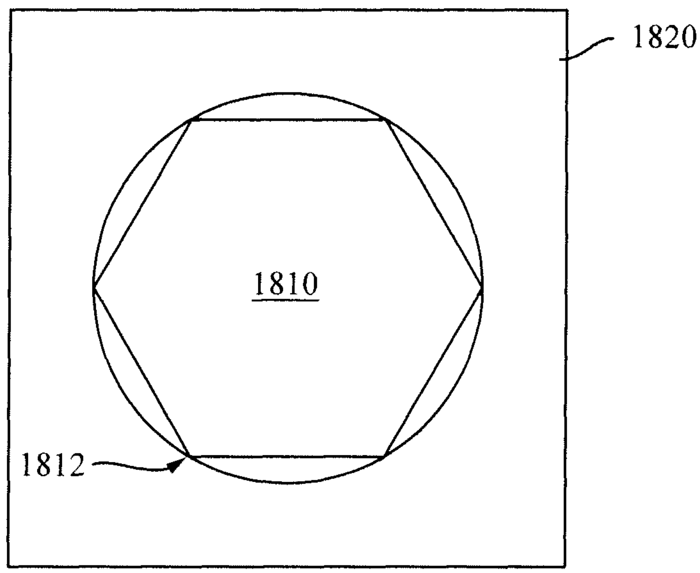
Figure 19:
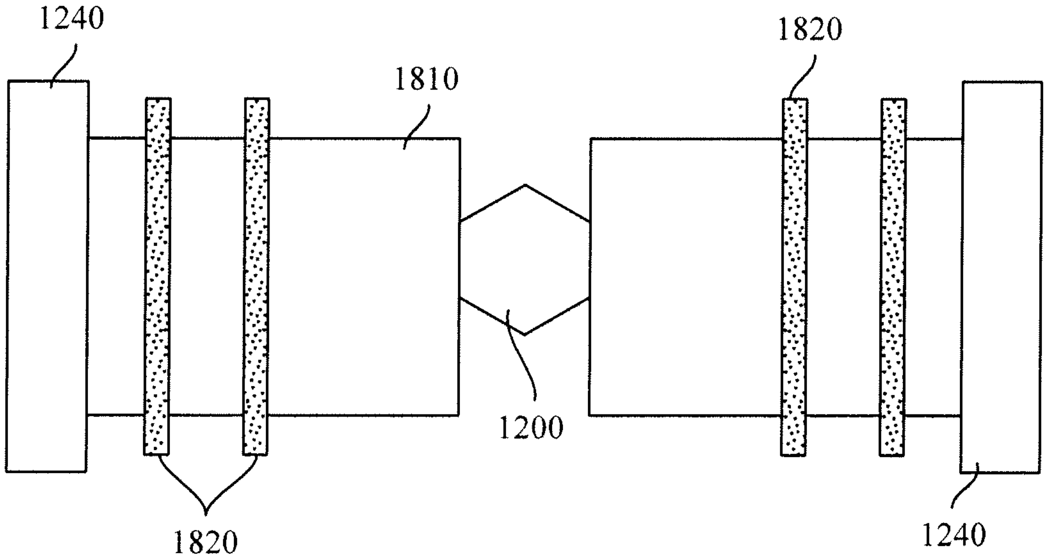
Figure 20:
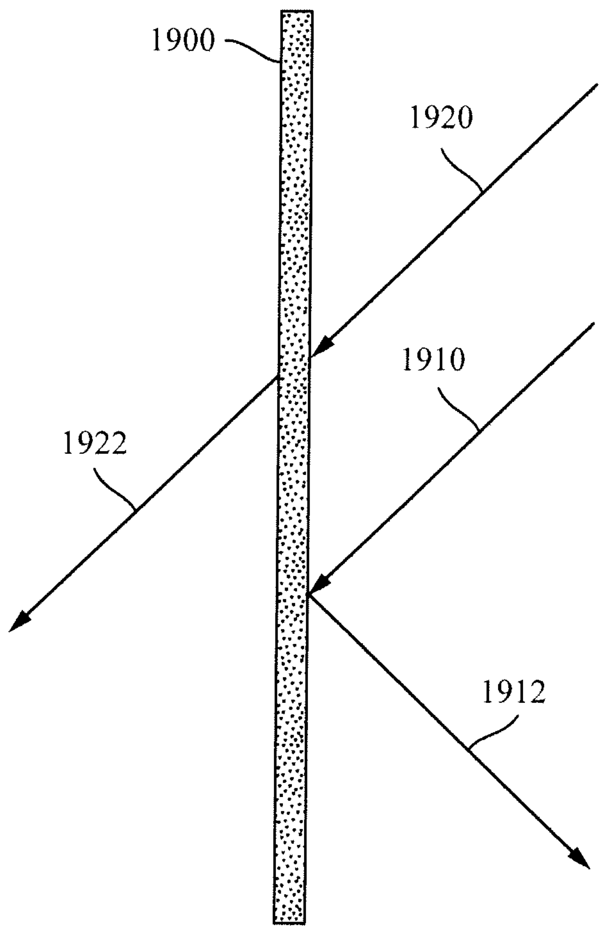
Figure 21:
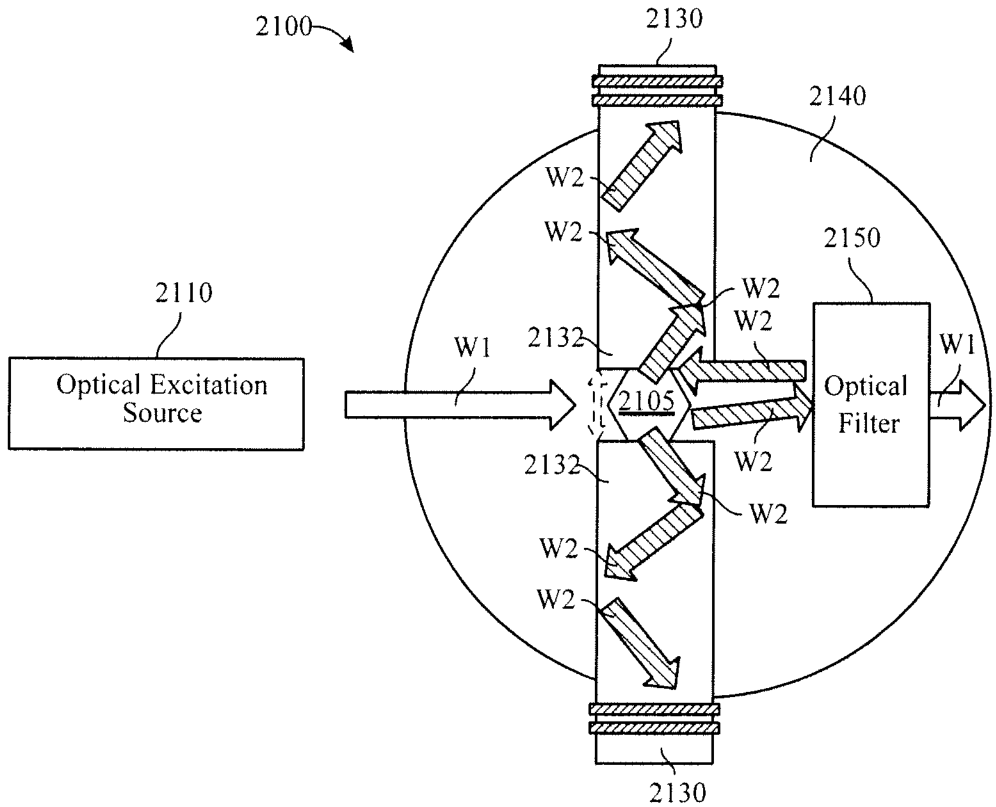
Figure 22:
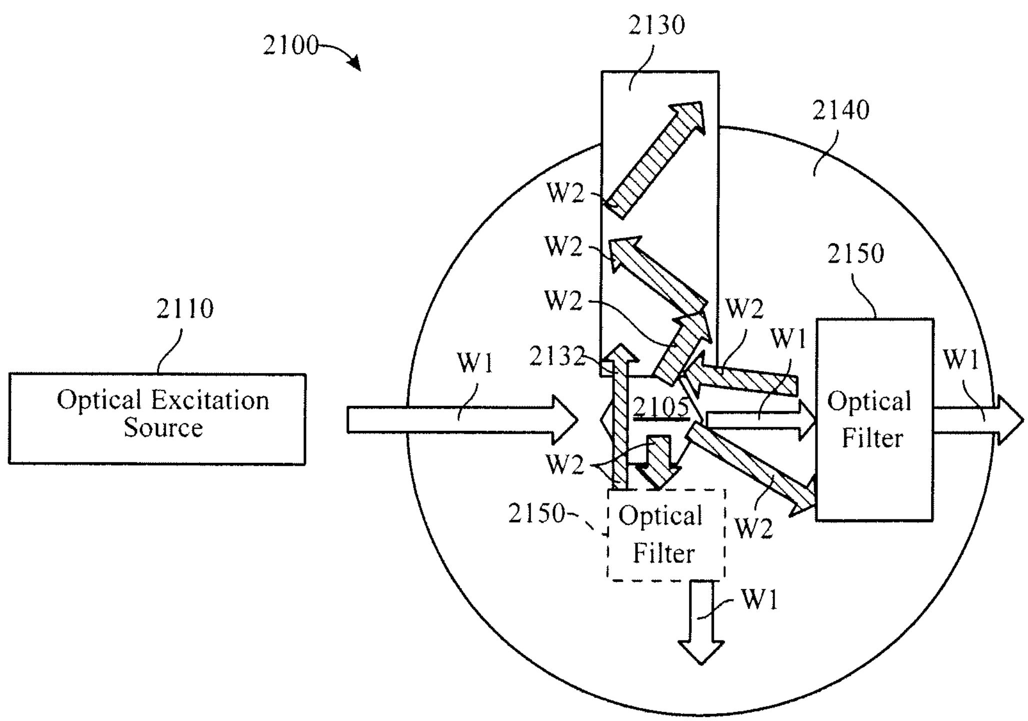
Figure 23:
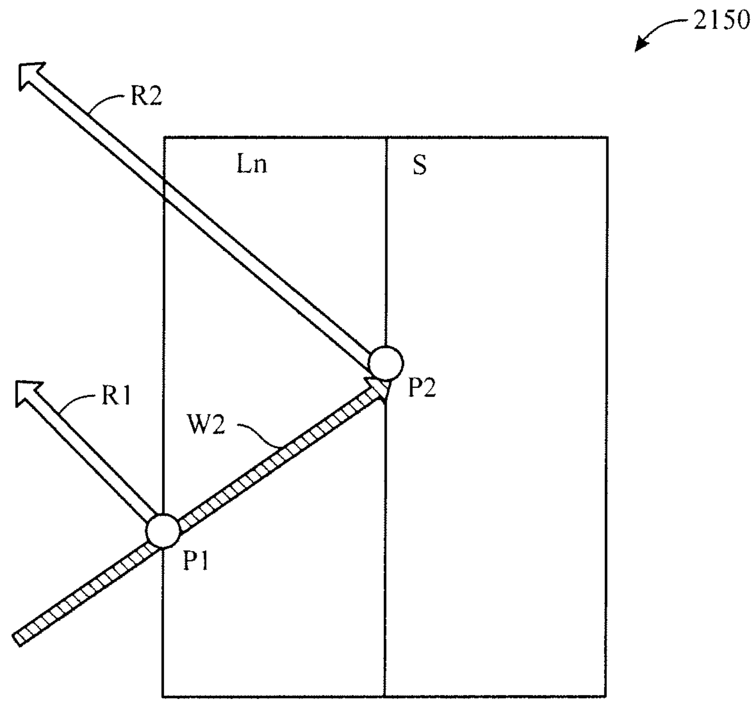
Figure 24:
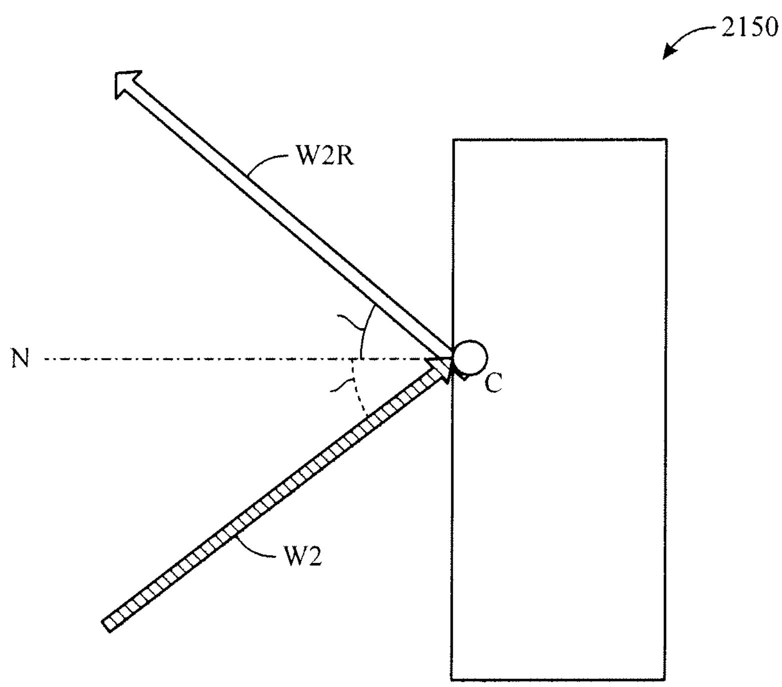
Figure 25:
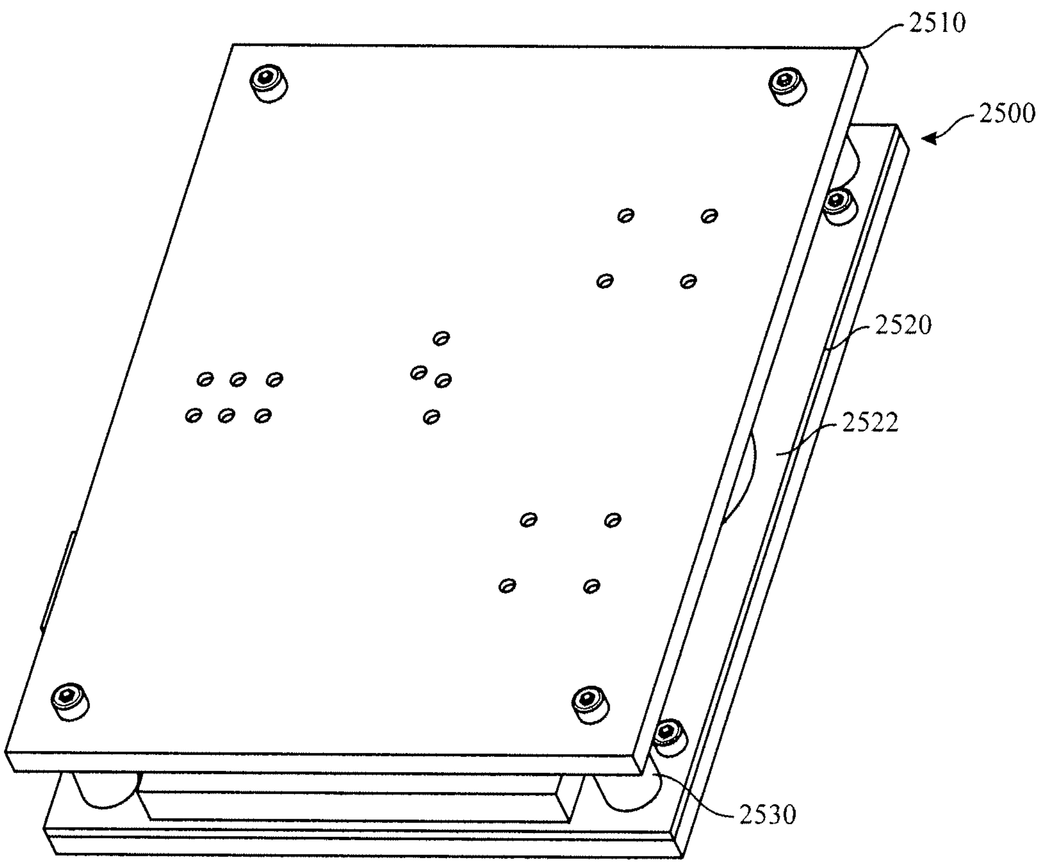
Figure 26:
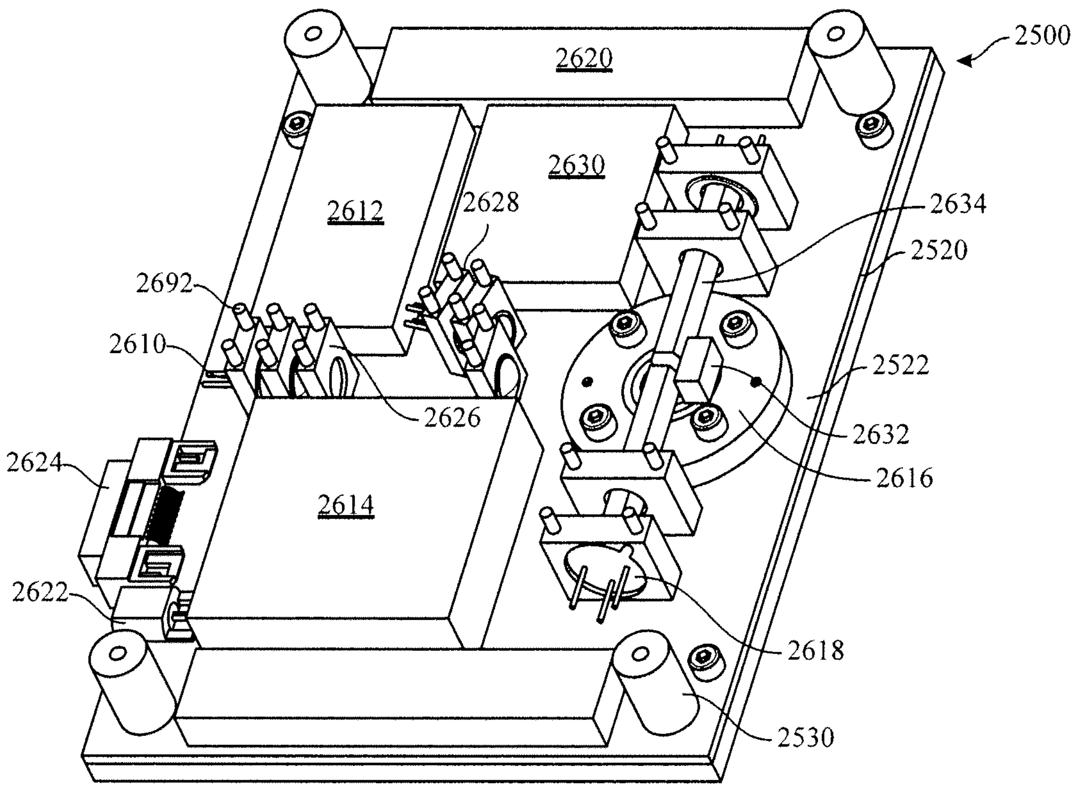
Figure 27:
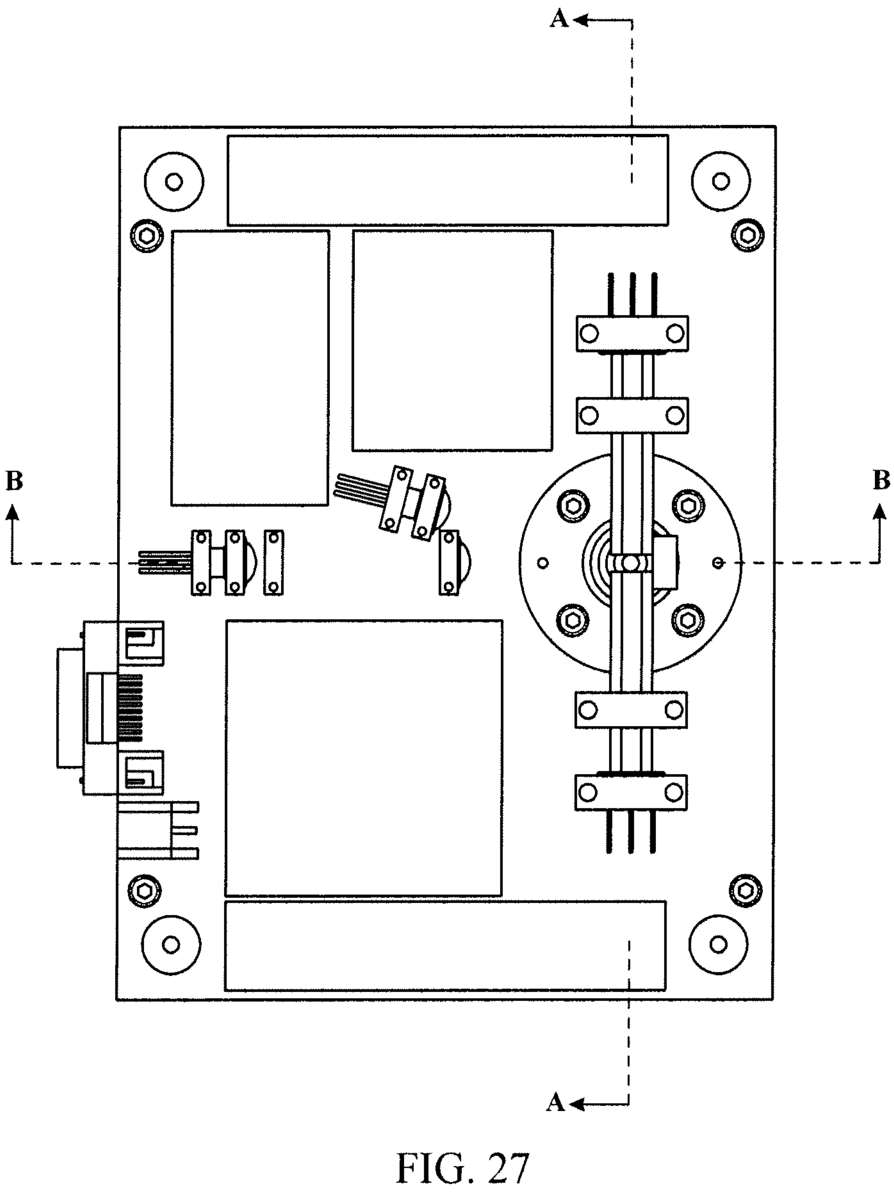
Figure 28:
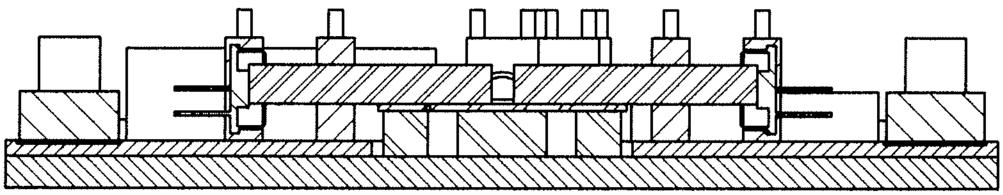
Figure 29:
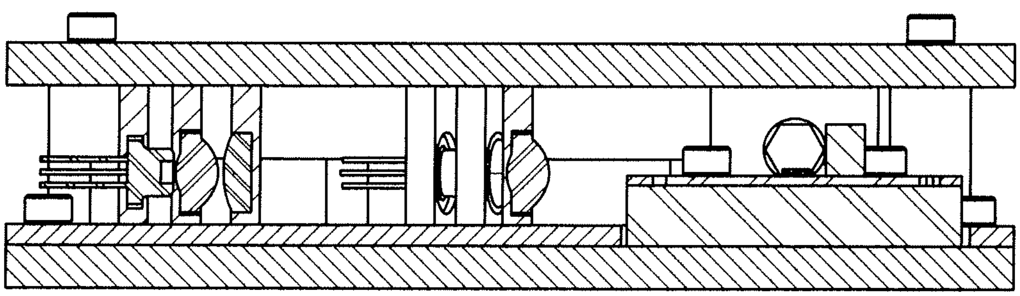
Figure 30:
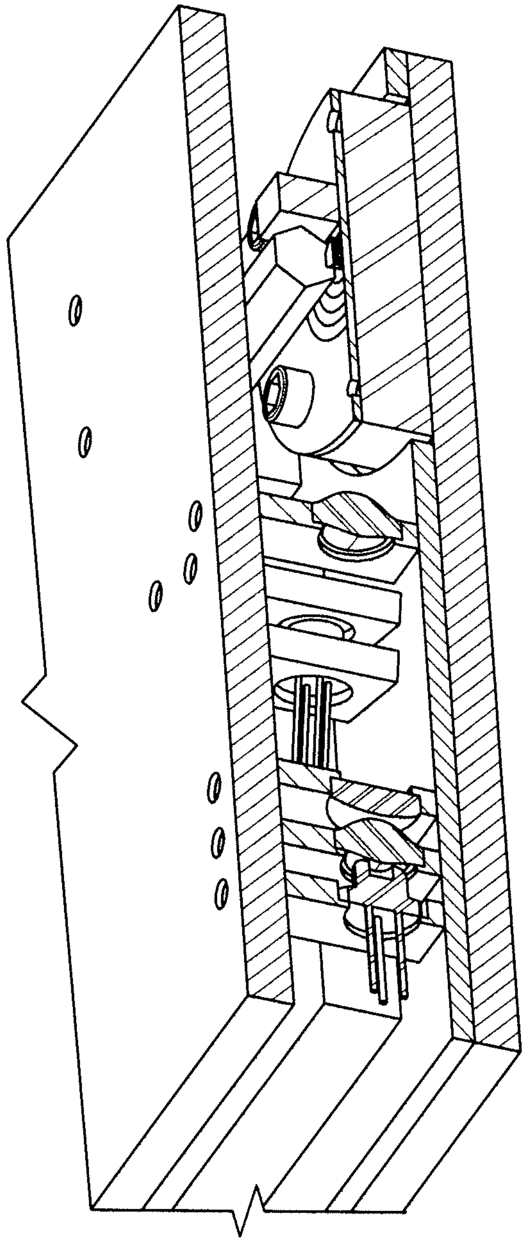
Figure 31:
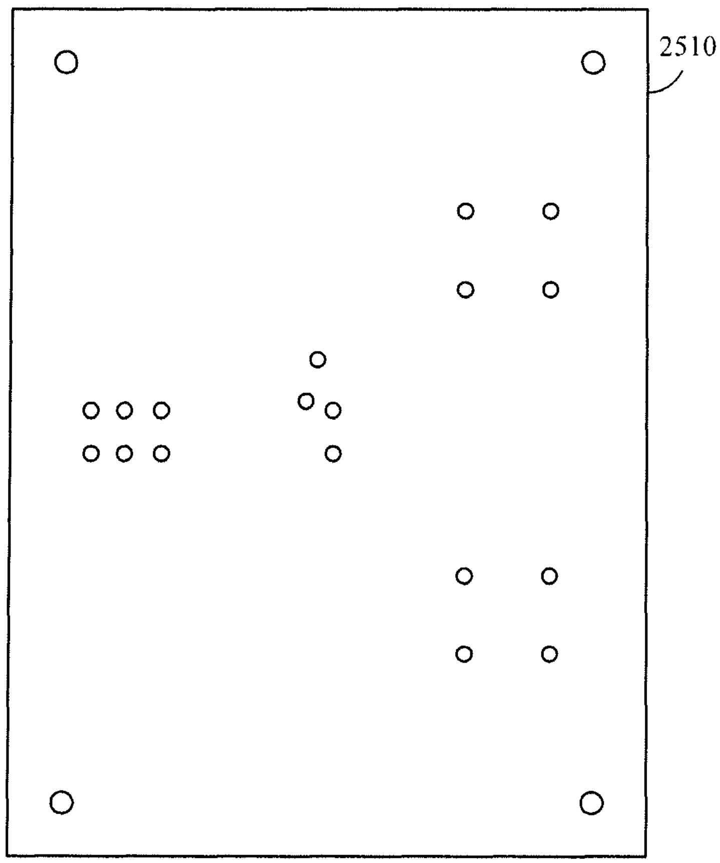
Figure 32:
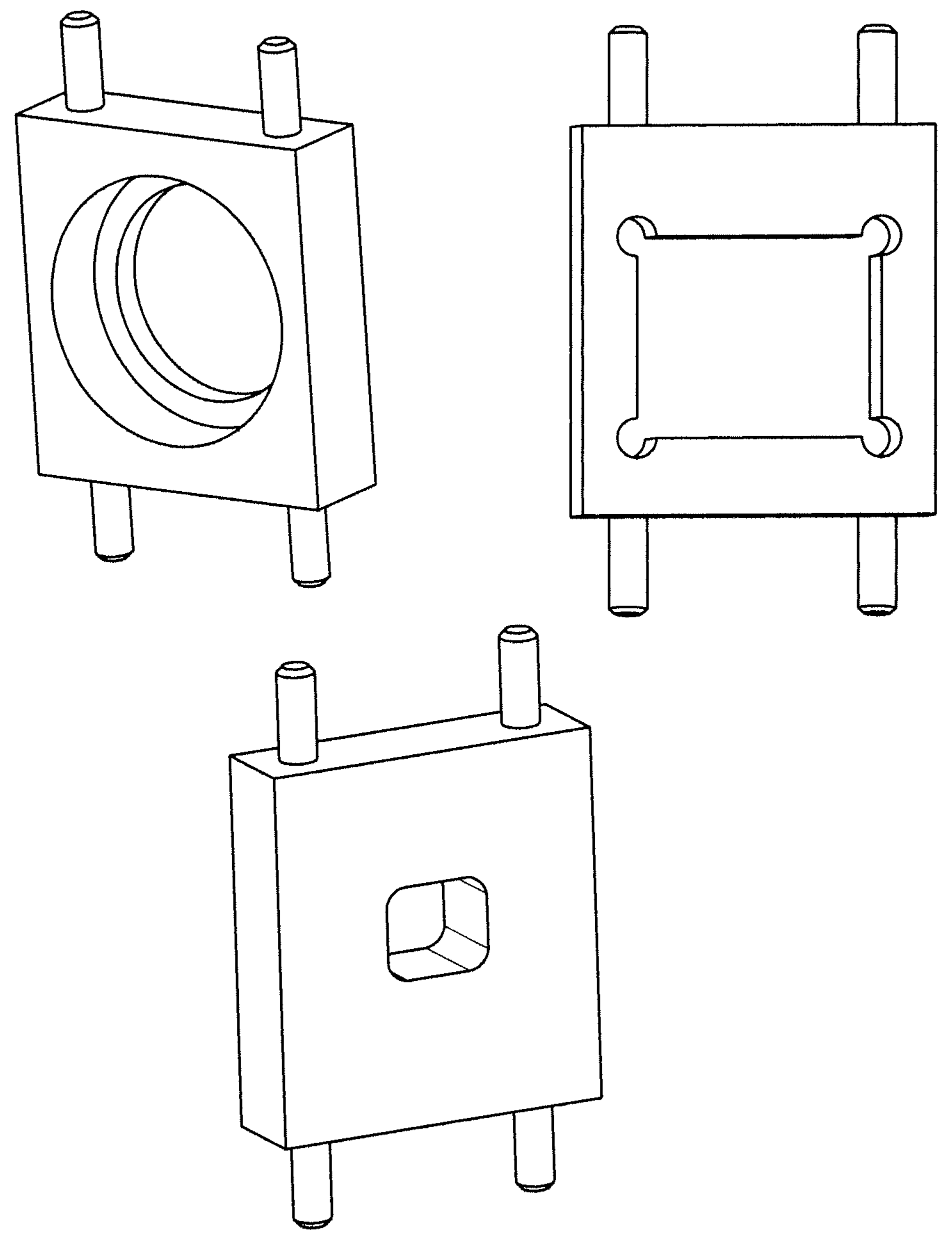
Figure 33:
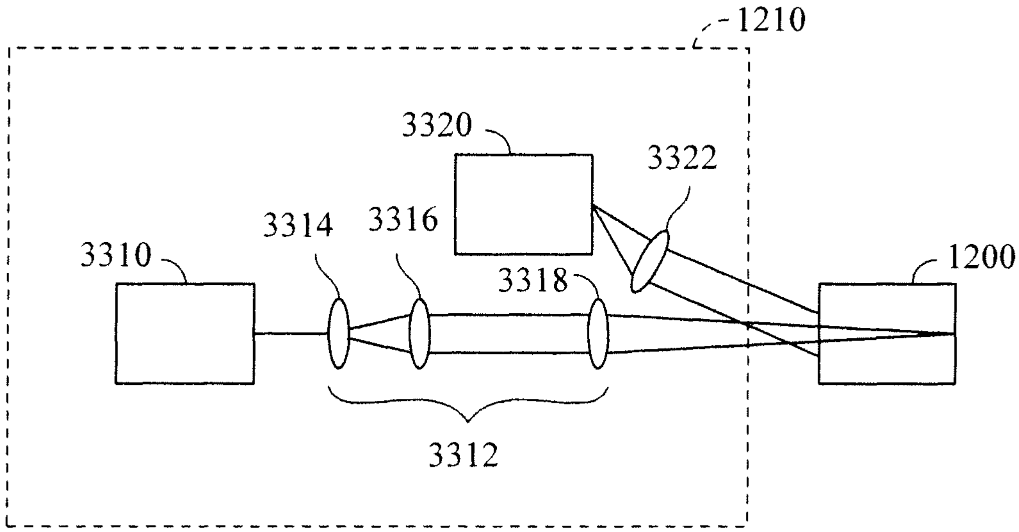
Figure 34:
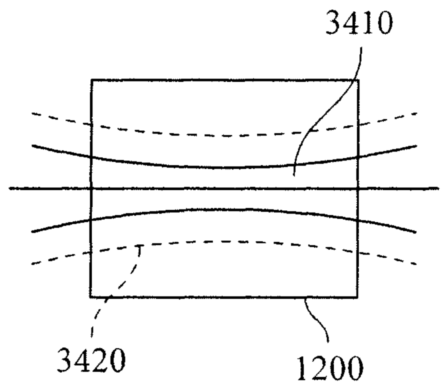
Figure 35:
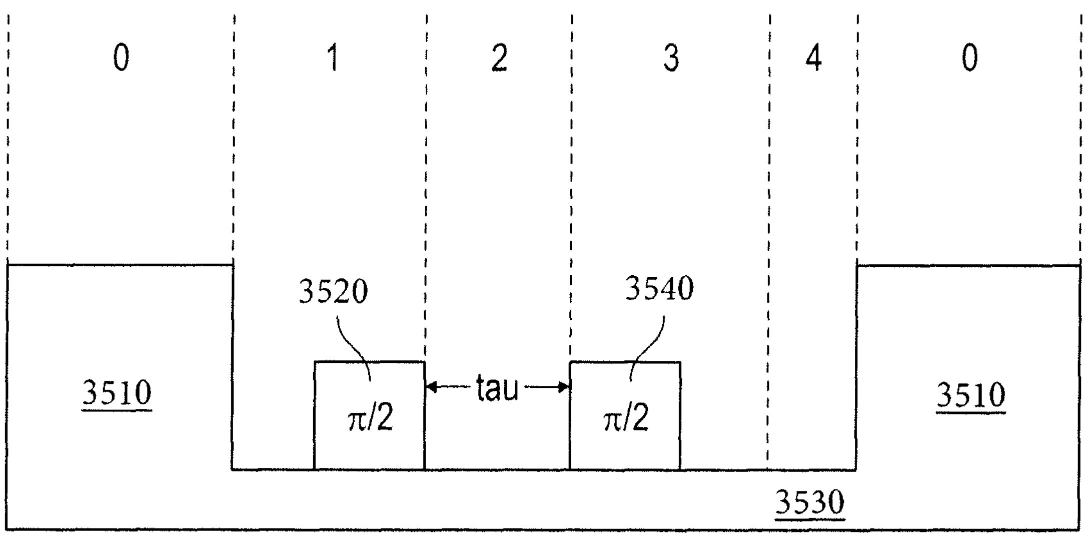
Figure 36:
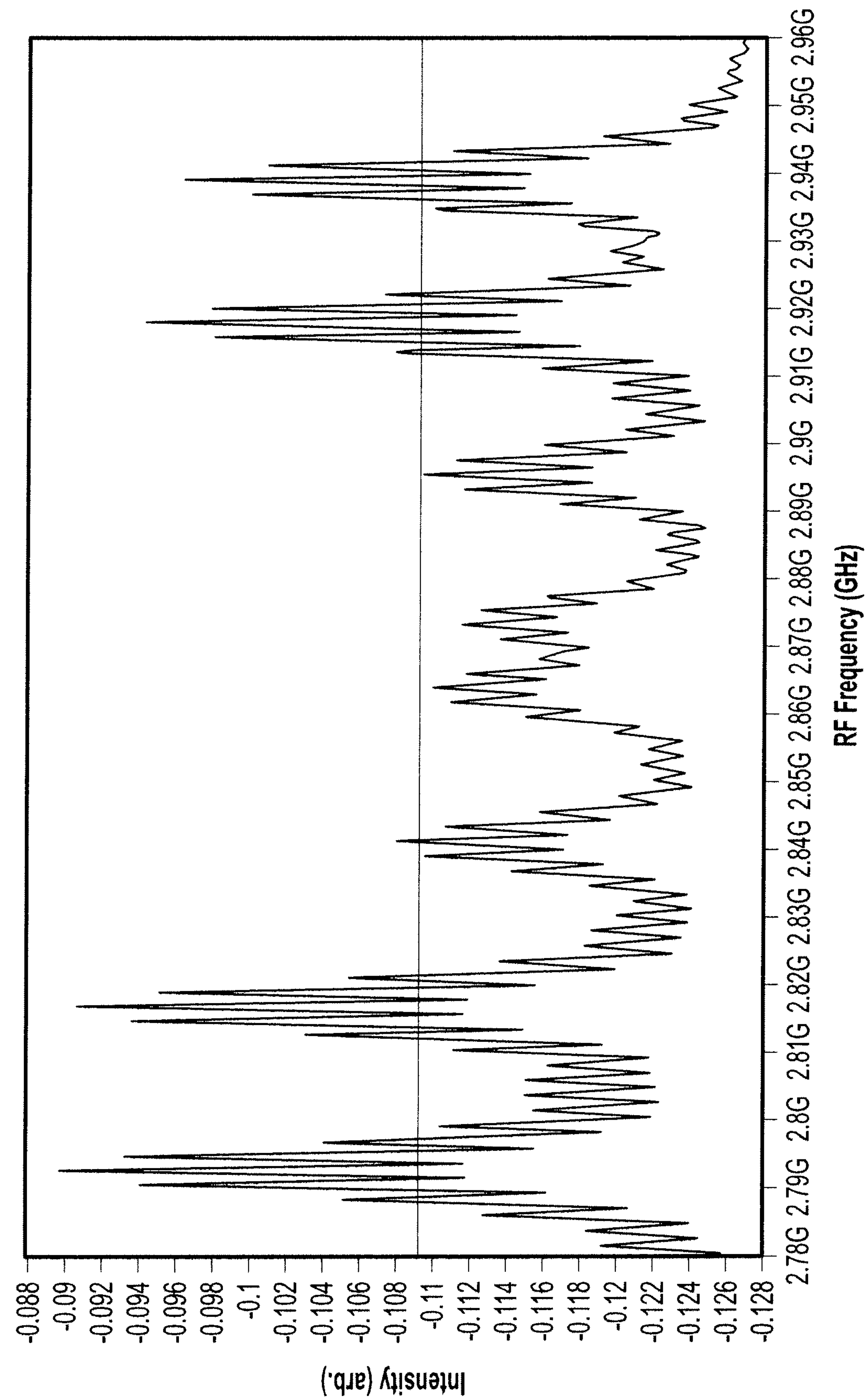
Figure 37:
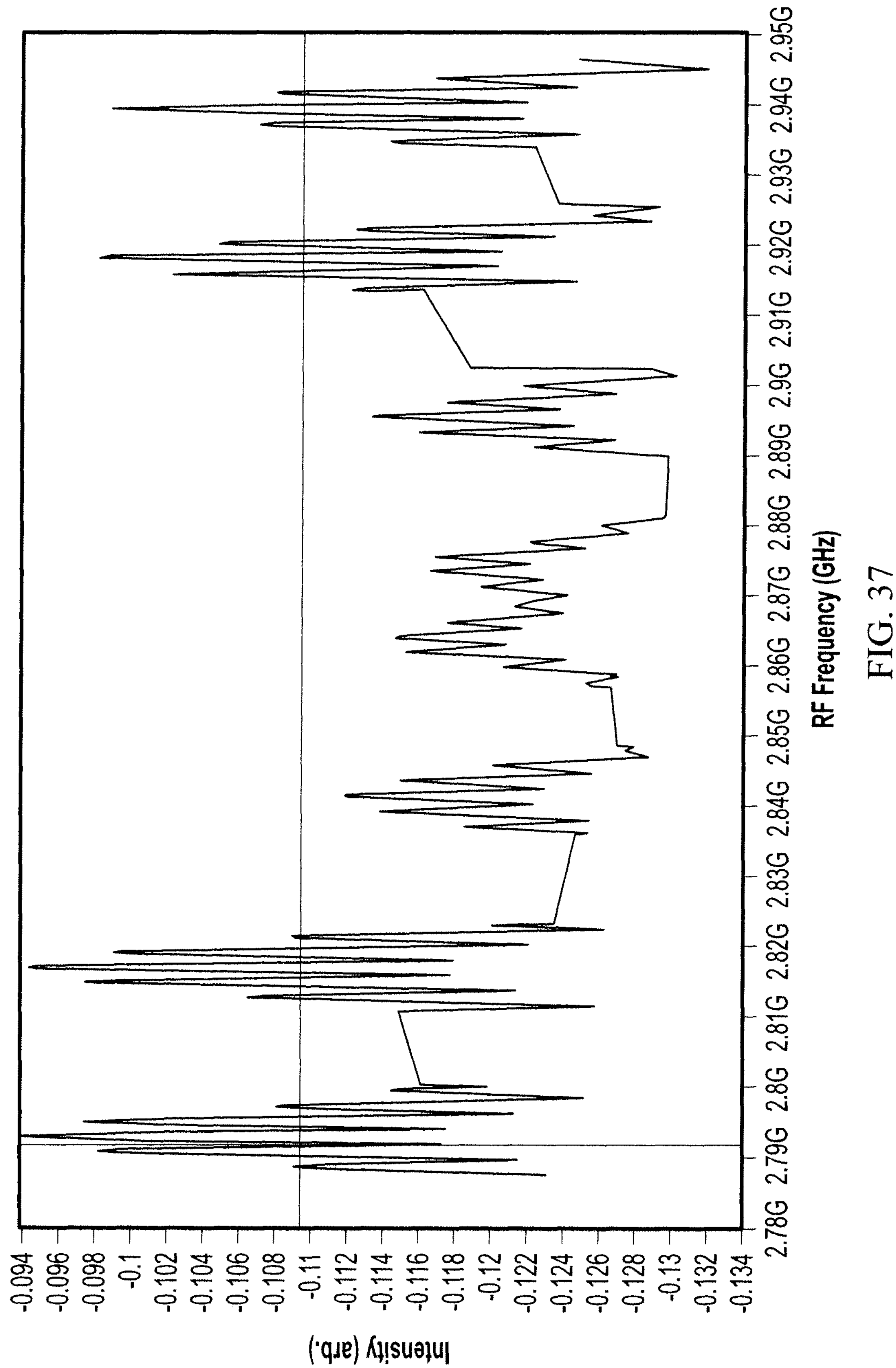
Figure 38:
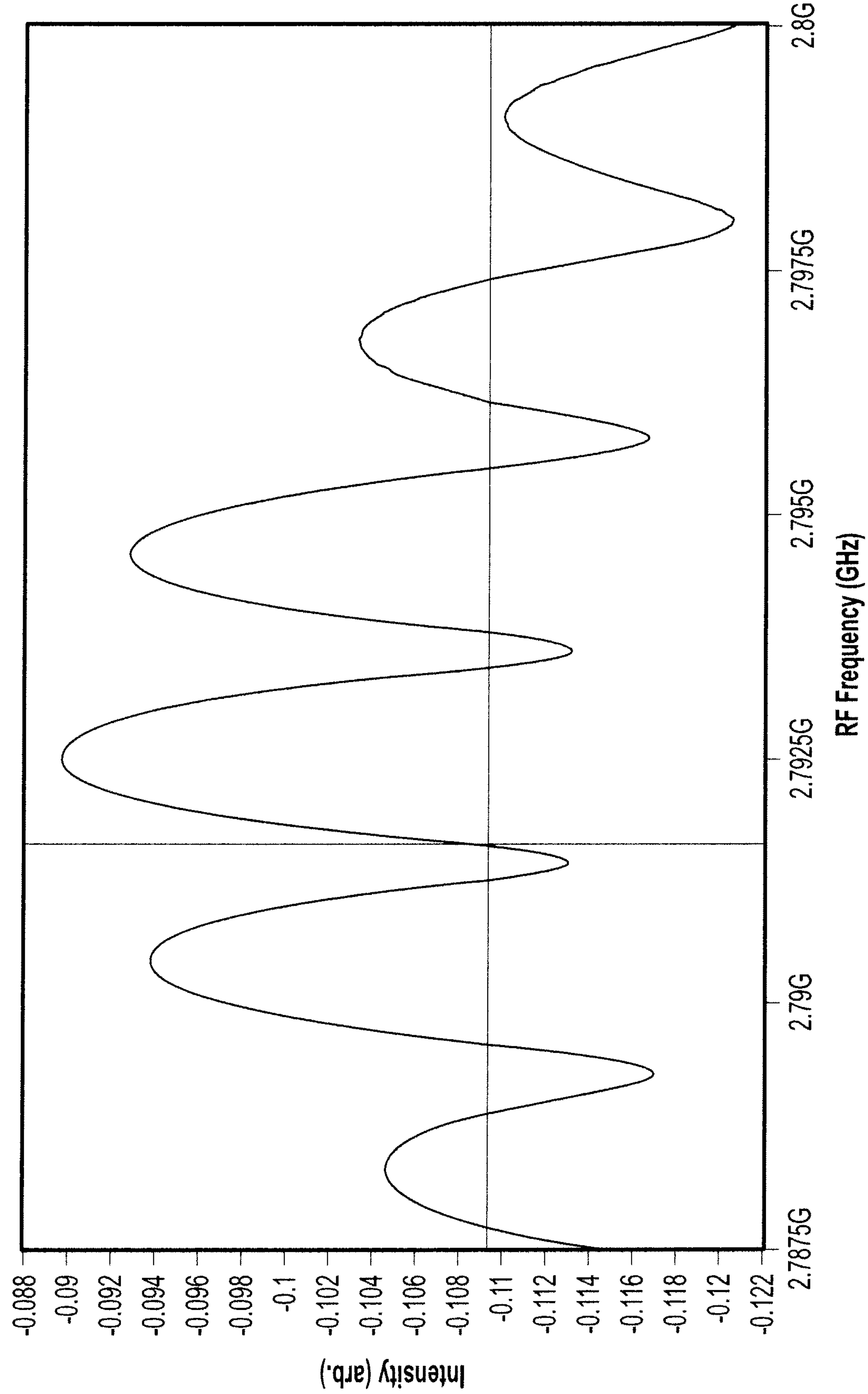
Figure 39:
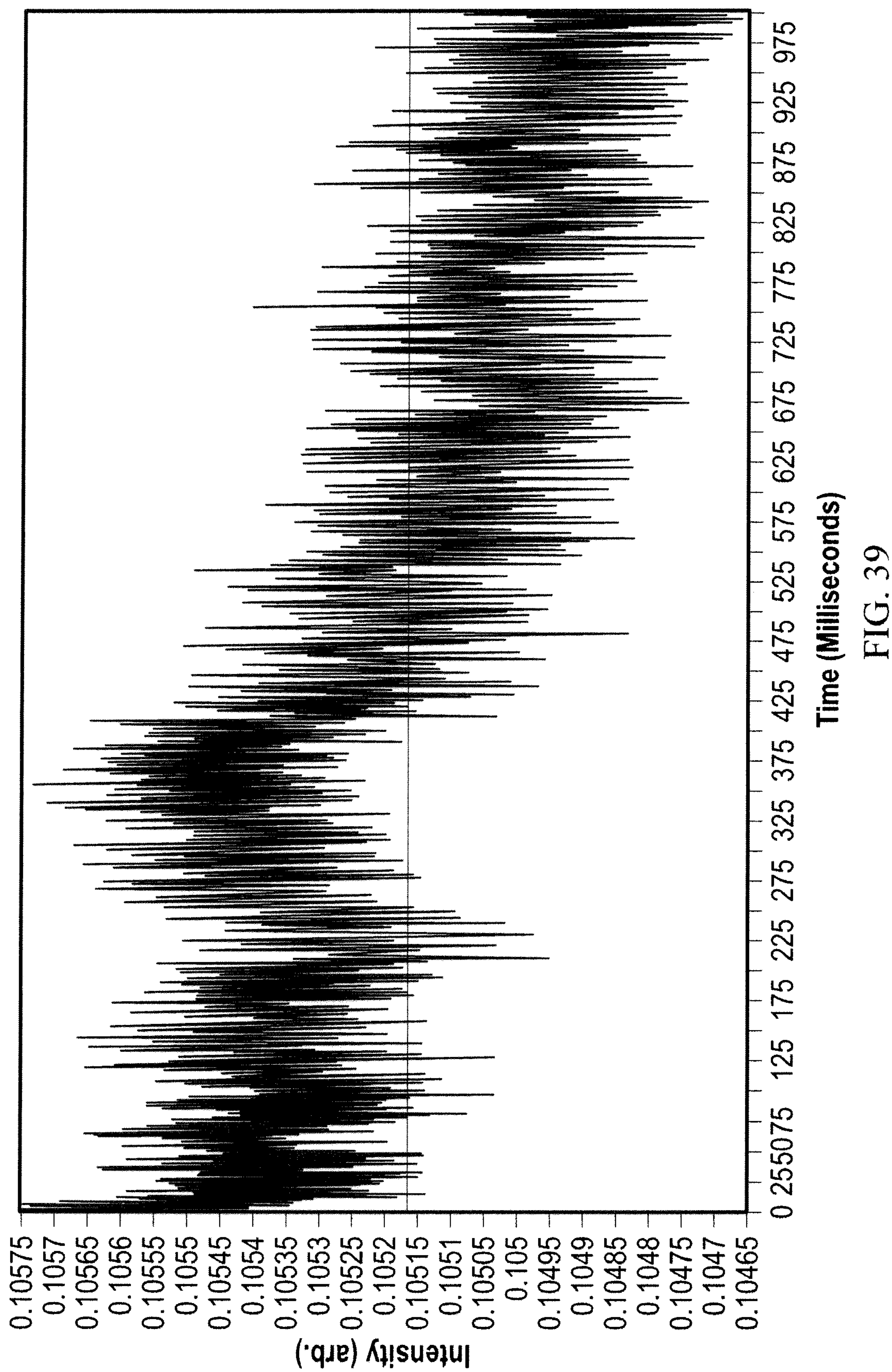
Figure 40:
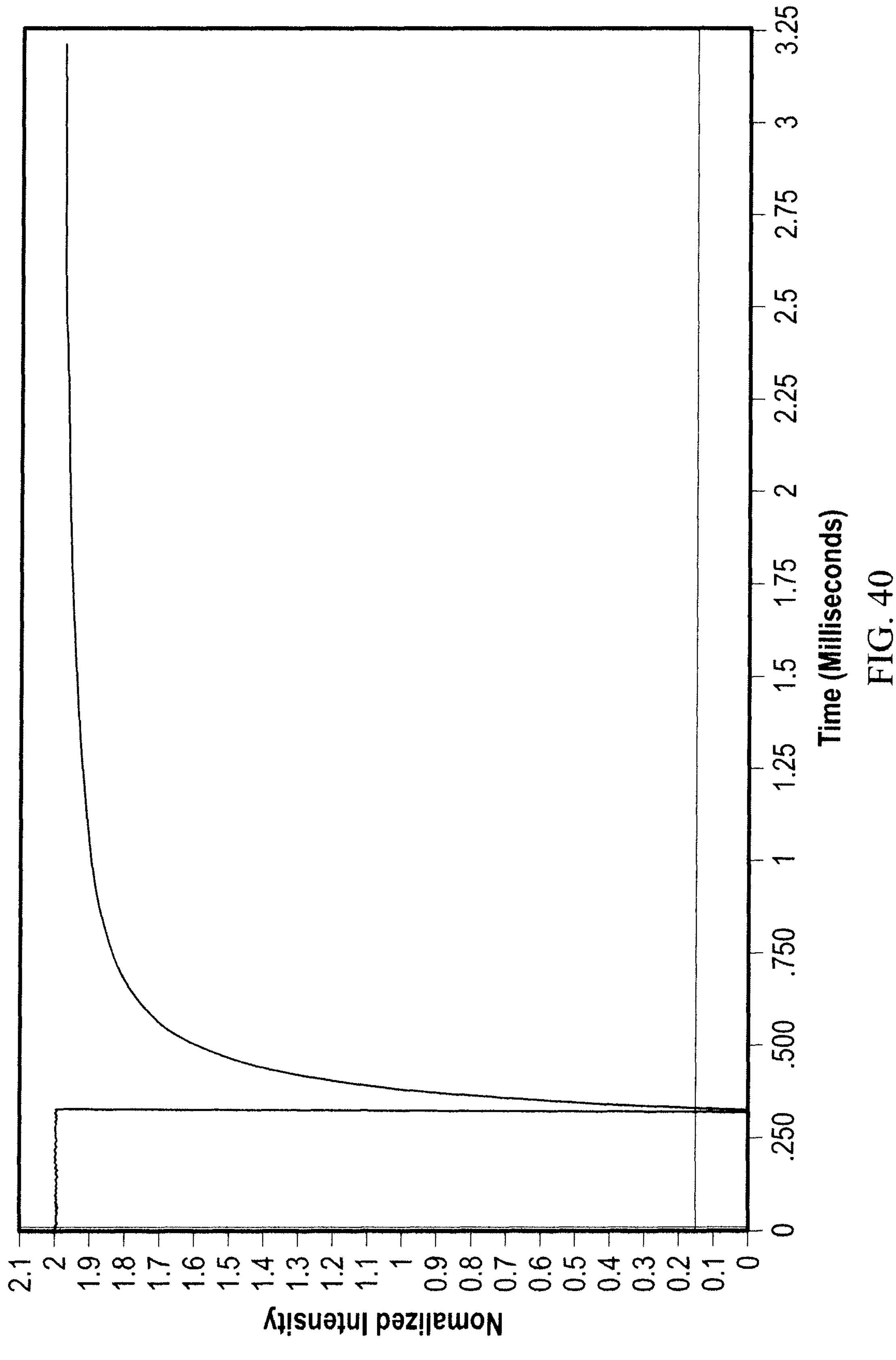
Figure 41:
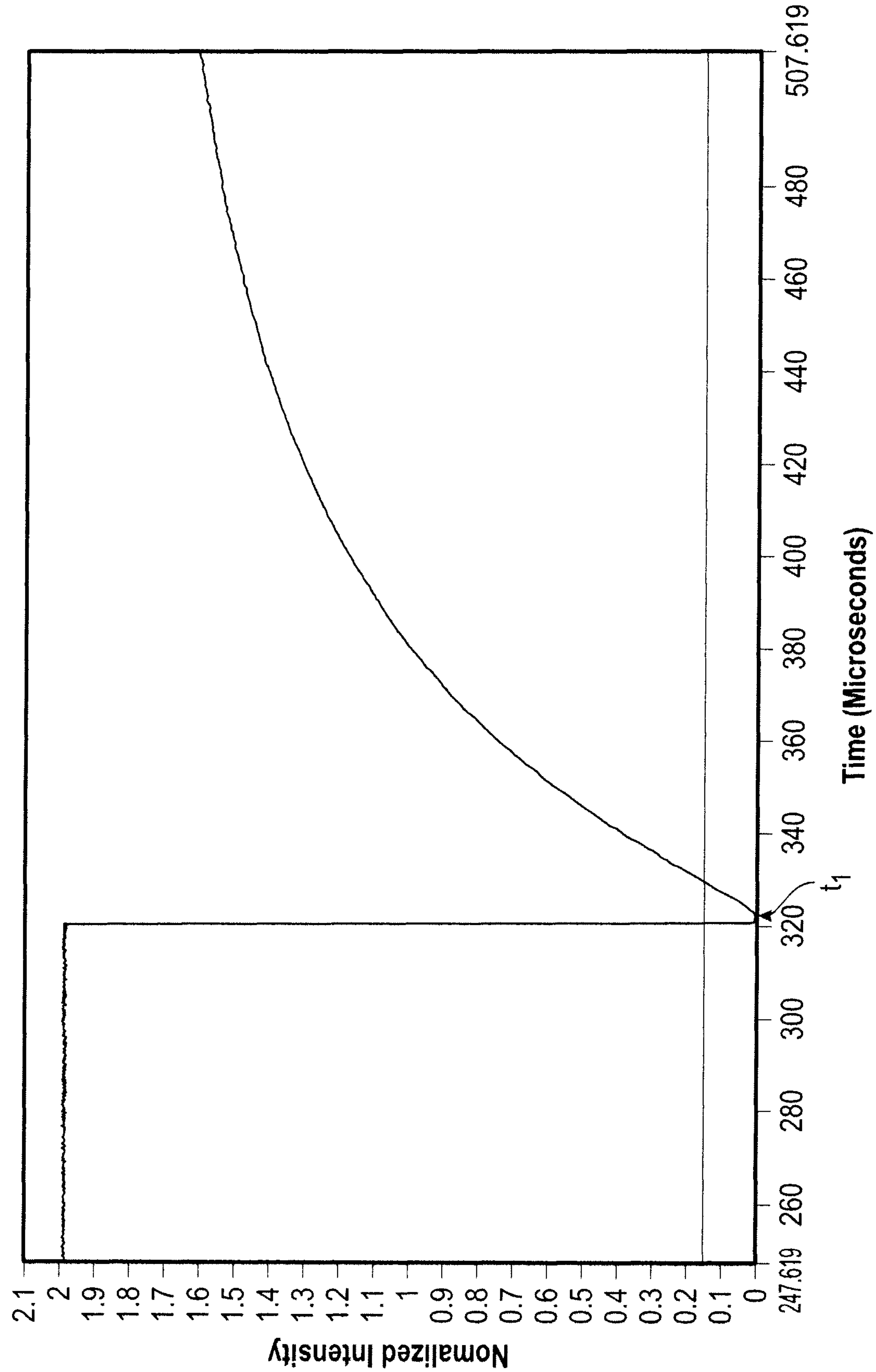

FIG. 7 is an illustrative a perspective view depicting some embodiments of a magneto-optical defect center magnetometer;

FIG. 8 is an illustrative perspective view of the magneto-optical defect center magnetometer of FIG. 7 with a top plate removed;

FIG. 9 is an illustrative top view depicting the magneto-optical defect center magnetometer of FIG. 7 with the top plate removed;

FIG. 10 is an illustrative cross-sectional view taken along line A-A and depicting the magneto-optical defect center magnetometer of FIG. 7 with the top plate removed;

FIG. 11 is an illustrative cross-sectional view taken along line B-B and depicting the magneto-optical defect center magnetometer of FIG. 7 with the top plate attached;

FIG. 12 is an illustrative perspective cross-sectional view taken along line B-B and depicting the DNV magnetometer of FIG. 7 with the top plate attached;

FIG. 13 is a perspective view of a RF excitation source with a plurality of coils according to some embodiments;

FIG. 14A is a side view of the coils and a RF feed connector of the RF excitation source of FIG. 13;

FIG. 14B is a top view of the coils and a RF feed connector of the RF excitation source of FIG. 13;

FIG. 15A is a graph illustrating the magnetic field generated by the RF excitation source at 2 GHz in the region of the NV diamond material for a five spiral shaped coil arrangement;

FIG. 15B is a graph illustrating the magnetic field generated by the RF excitation source at 3 GHz in the region of the NV diamond material for the five spiral shaped coil arrangement;

FIG. 15C is a graph illustrating the magnetic field generated by the RF excitation source at 4 GHz in the region of the NV diamond material for the five spiral shaped coil arrangement;

FIG. 16 is a table illustrating the electric field and magnetic field generated by the RF excitation source in a region of the NV diamond material at frequencies from 2.0 to 4.0 GHz for the five layer coil arrangement with spiral shaped coils;

FIG. 17 is a side-view illustrating details of the optical waveguide assembly of a magnetic field sensor system according to some embodiments;

FIG. 18 is a depiction of a cross-section of a light pipe and an associated mount according to some embodiments;

FIG. 19 is a top-down view of an optical waveguide assembly of a magnetic field sensor system according to some embodiments;

FIG. 20 is a schematic diagram illustrating a dichroic optical filter and the behavior of light interacting therewith according to some embodiments;

FIG. 21 is a schematic block diagram of some embodiments of an optical filtration system;

FIG. 22 is a schematic block diagram of some embodiments of an optical filtration system;

FIG. 23 is a diagram of an optical filter according to some embodiments;

FIG. 24 is a diagram of an optical filter according to some embodiments;

FIG. 25 is an illustrative perspective view depicting some embodiments of a magneto-optical defect center magnetometer;

FIG. 26 is an illustrative perspective view of the magneto-optical defect center magnetometer of FIG. 25 with a top plate removed;

FIG. 27 is an illustrative top view depicting the magneto-optical defect center magnetometer of FIG. 25 with the top plate removed;

FIG. 28 is an illustrative cross-sectional view taken along line A-A and depicting the magneto-optical defect center magnetometer of FIG. 25 with the top plate removed;

FIG. 29 is an illustrative cross-sectional view taken along line B-B and depicting the magneto-optical defect center magnetometer of FIG. 25 with the top plate attached;

FIG. 30 is an illustrative perspective cross-sectional view taken along line B-B and depicting the magneto-optical defect center magnetometer of FIG. 25 with the top plate attached;

FIG. 31 is an illustrative top view depicting the top plate of the magneto-optical defect center magnetometer of FIG. 25;

FIG. 32 is an illustrative perspective view of support elements for one or more components of the magneto-optical defect center magnetometer of FIG. 25;

FIG. 33 is a schematic illustrating details of the optical light source of the magnetic field detection system according to some embodiments;

FIG. 34 illustrates the illumination volume in NV diamond material for a readout optical light source and a reset optical light source of the optical light source of the magnetic field detection system according to an embodiment;

FIG. 35 illustrates a RF sequence according to some embodiments;

FIG. 36 is a magnetometry curve in the case of a continuous optical excitation RF pulse sequence according to some embodiments;

FIG. 37 is a magnetometry curve in the case of a continuous optical excitation RF pulse sequence where the waveform has been optimized for collection intervals according to some embodiments;

FIG. 38 is magnetometry curve for the left most resonance frequency of FIG. 37 according to some embodiments;

FIG. 39 is a graph illustrating the dimmed luminescence intensity as a function of time for the region of maximum slope of FIG. 38;

FIG. 40 is a graph illustrating the normalized intensity of the luminescence as a function of time for diamond NV material for a continuous optical illumination of the diamond NV material in a RF sequence measurement;

FIG. 41 is a graph of a zoomed in region of FIG. 40;

Example Magnetometer with Additional Features

Figure 42A:
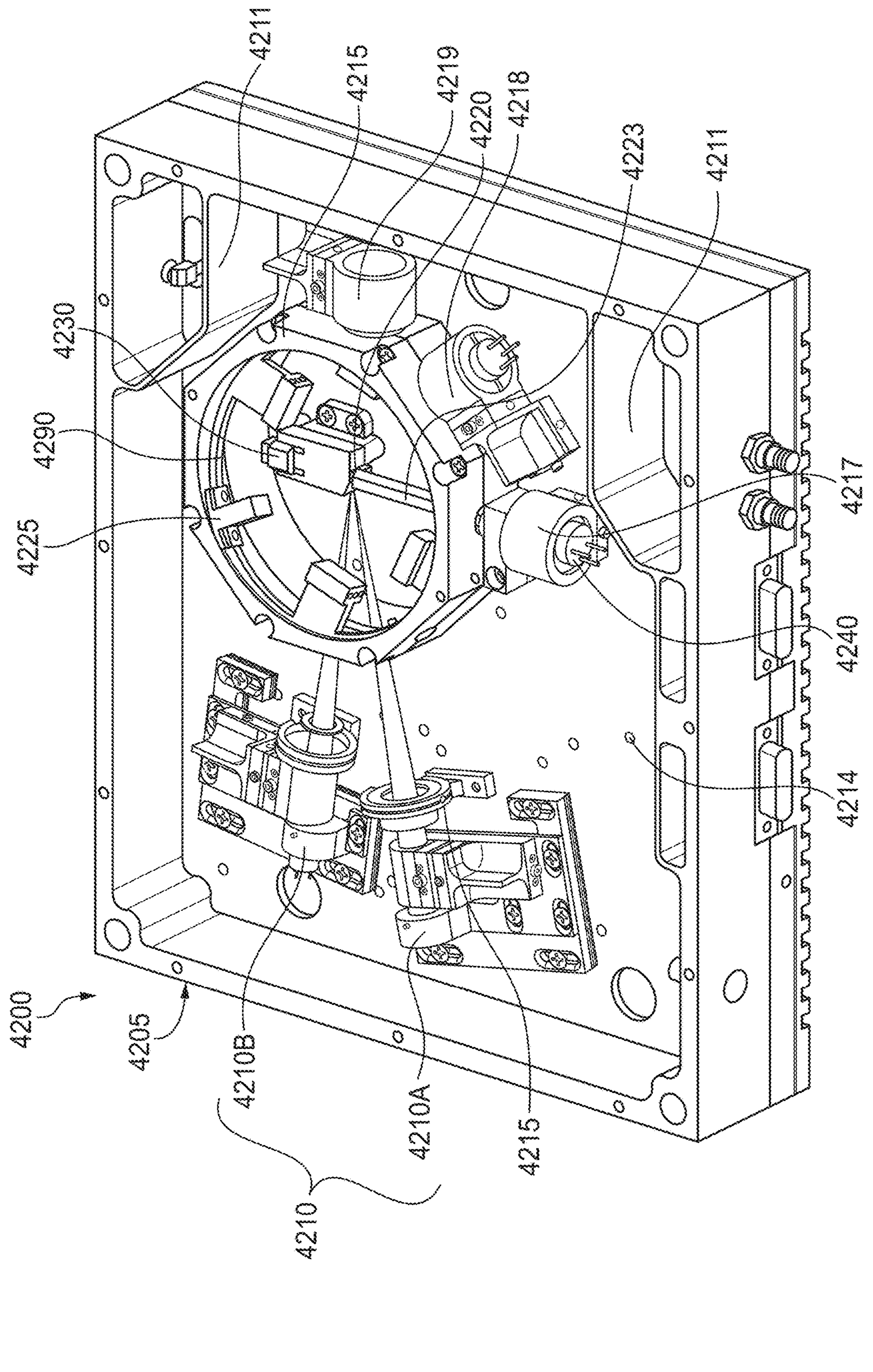
Figure 42B:
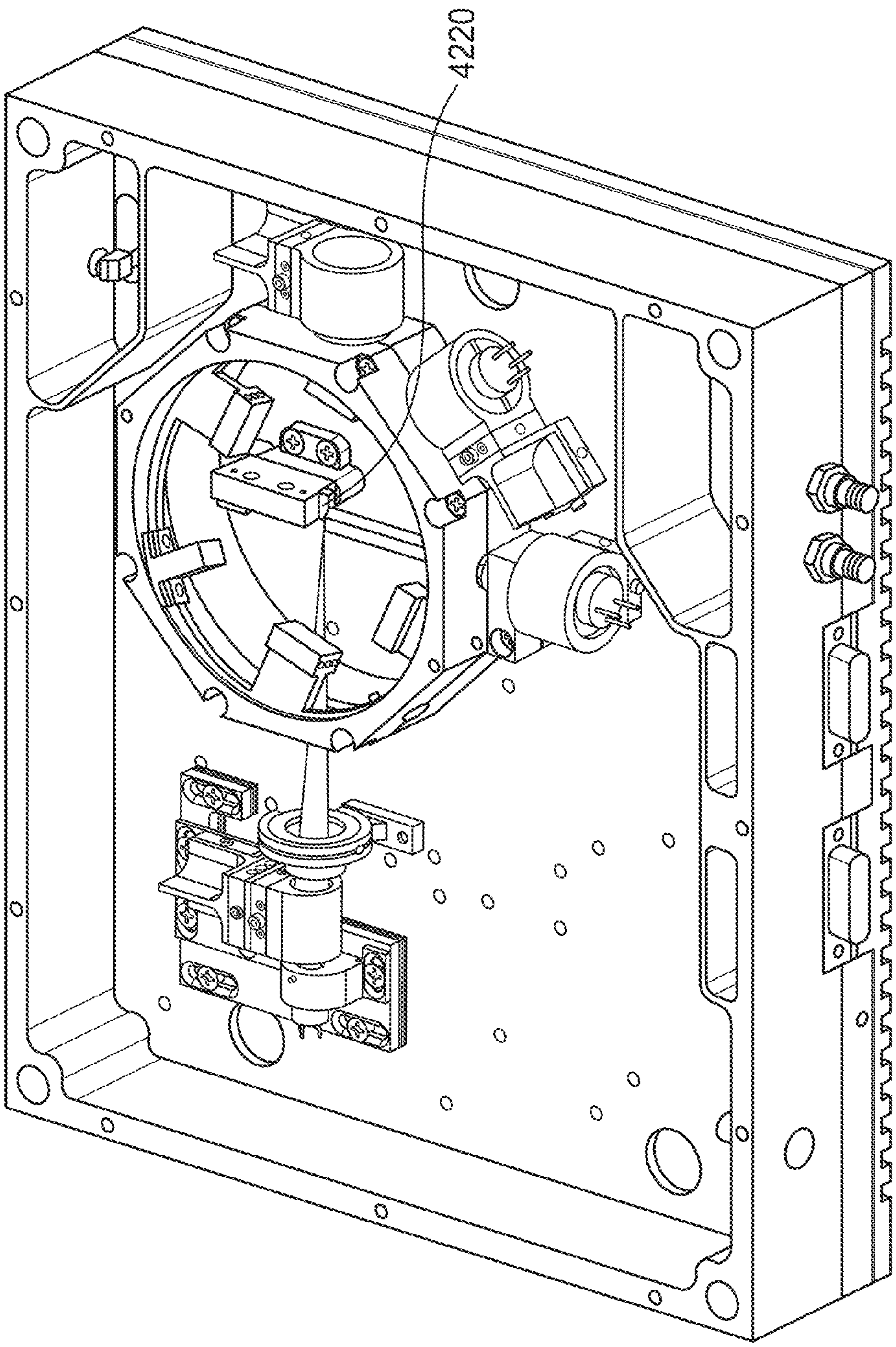
Figure 43A:
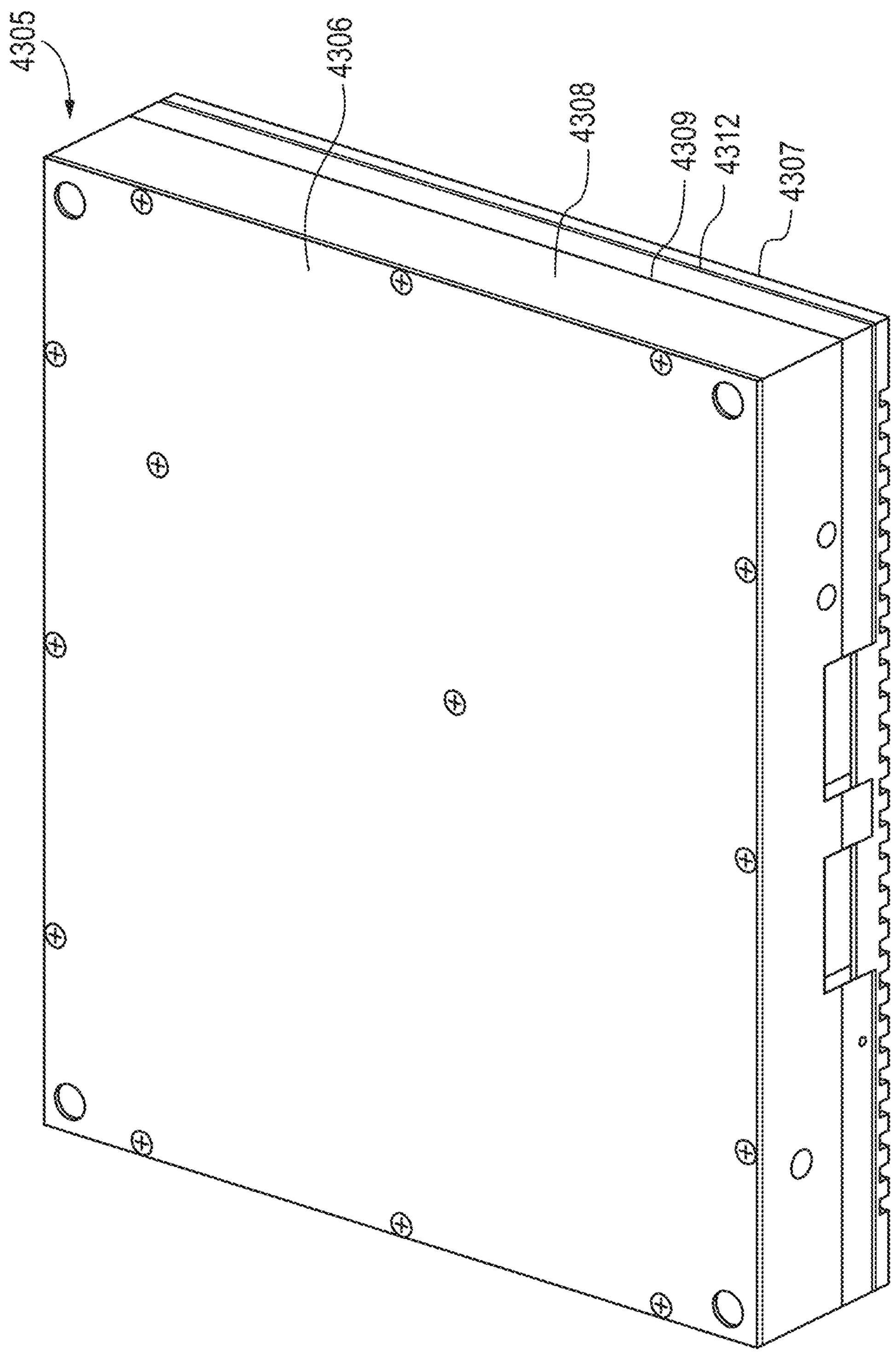
Figure 43B:
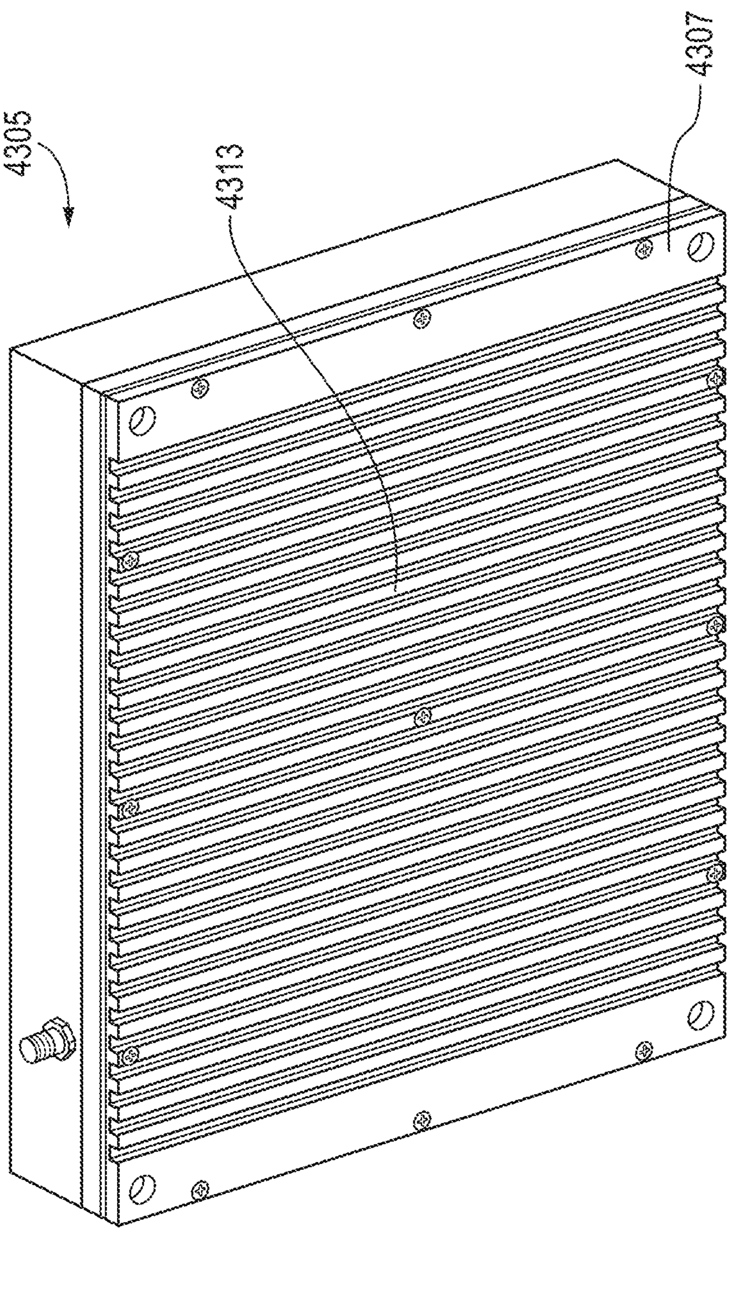
Figure 44A:
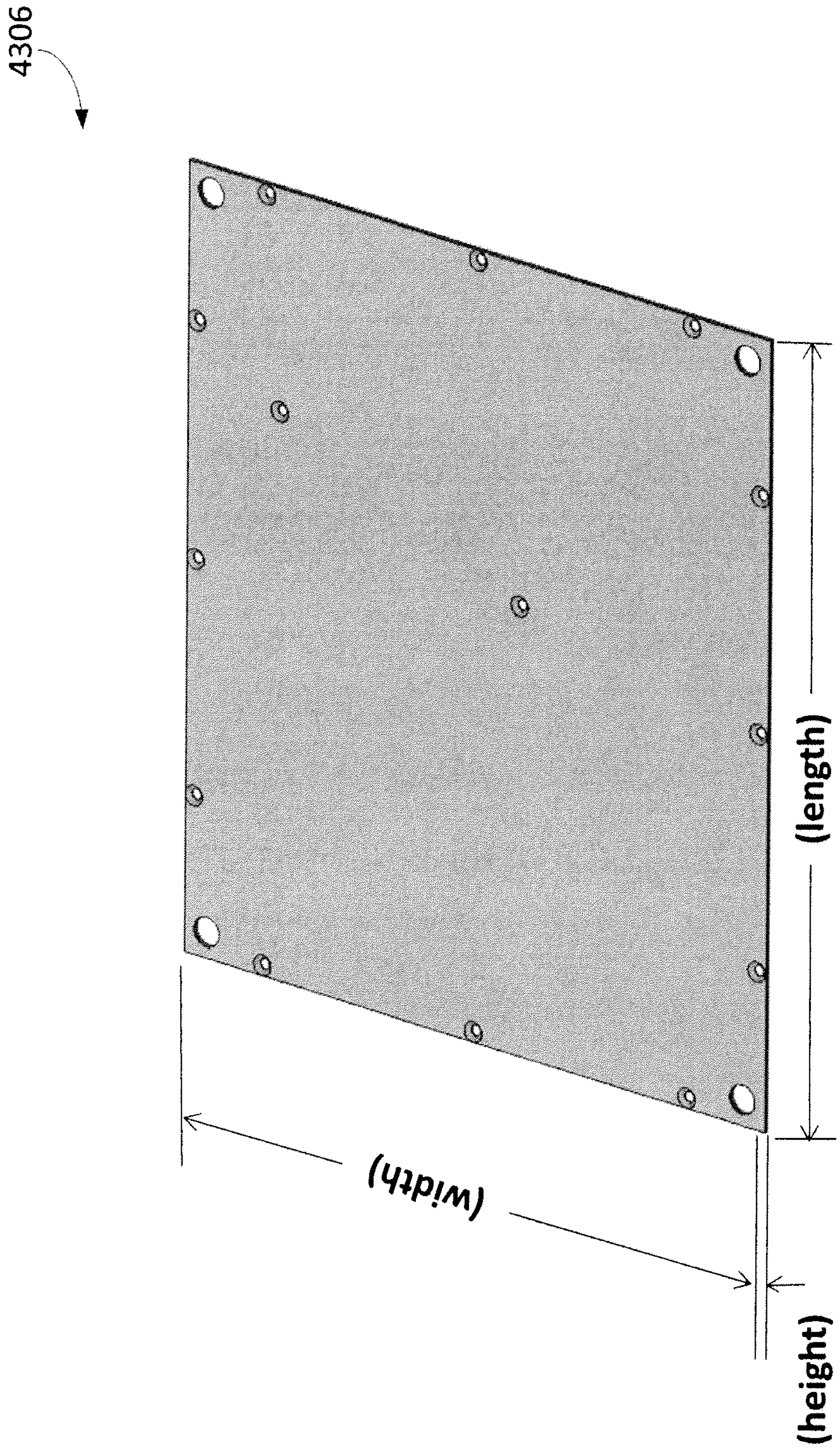
Figure 44B:
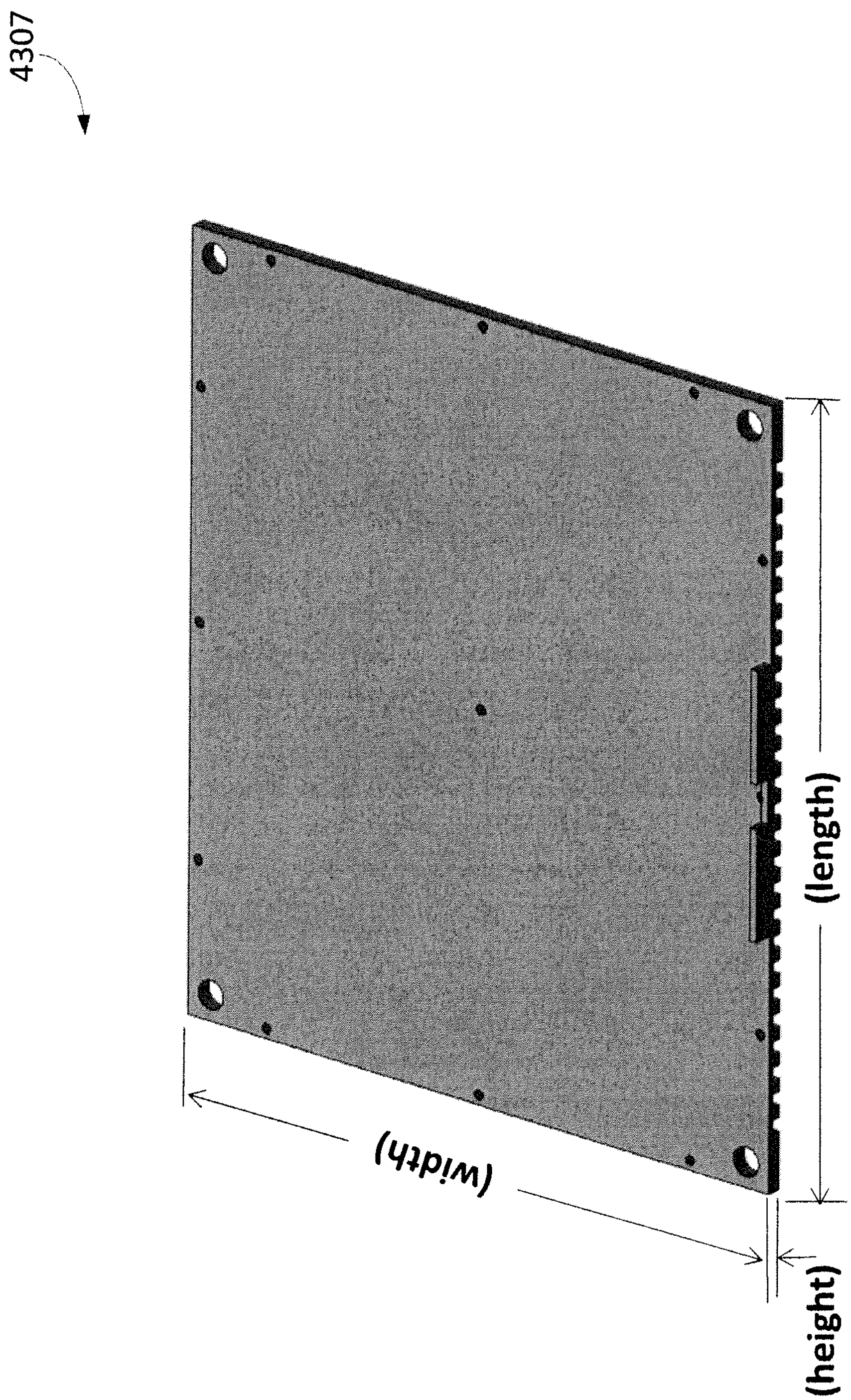
Figure 44C:
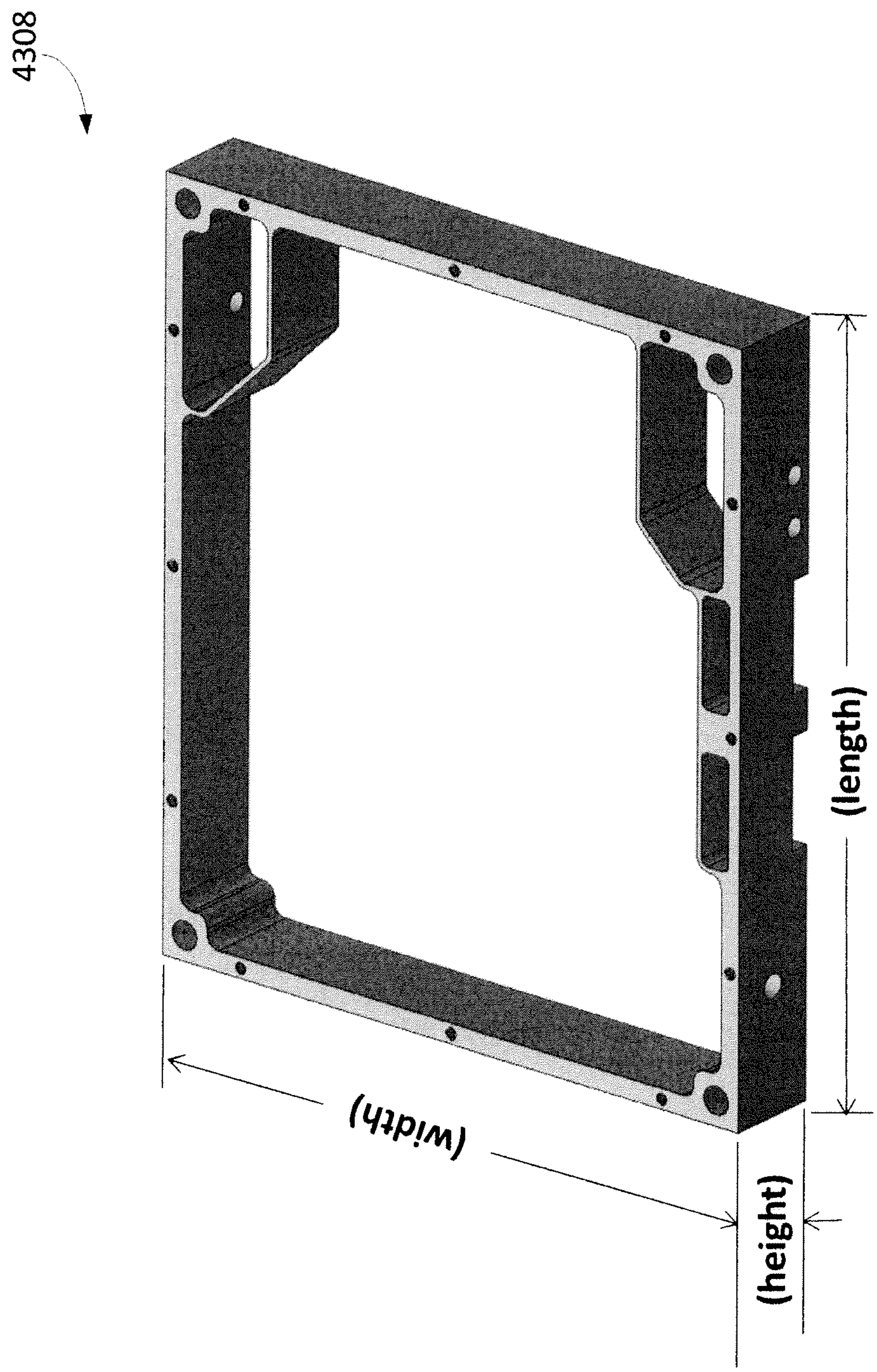
Figure 44E:
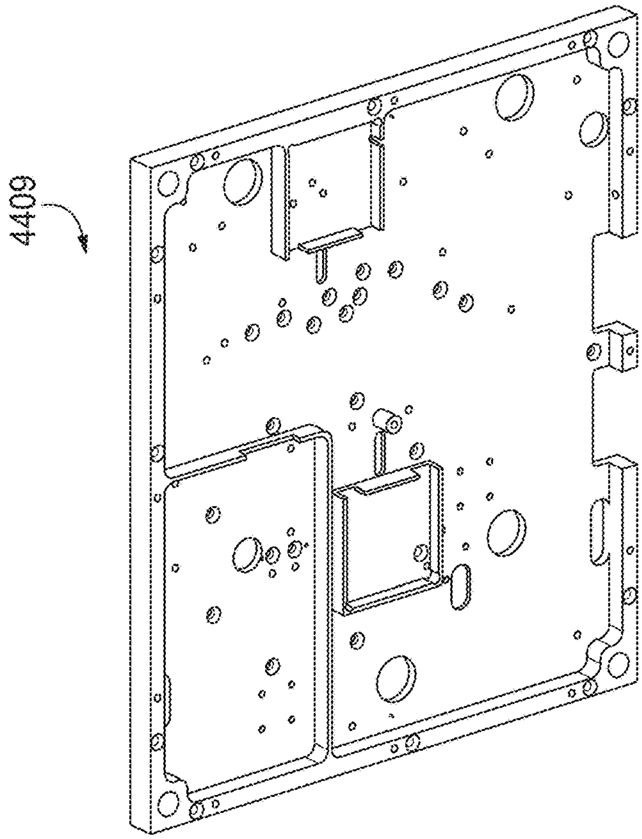
Figure 44D:
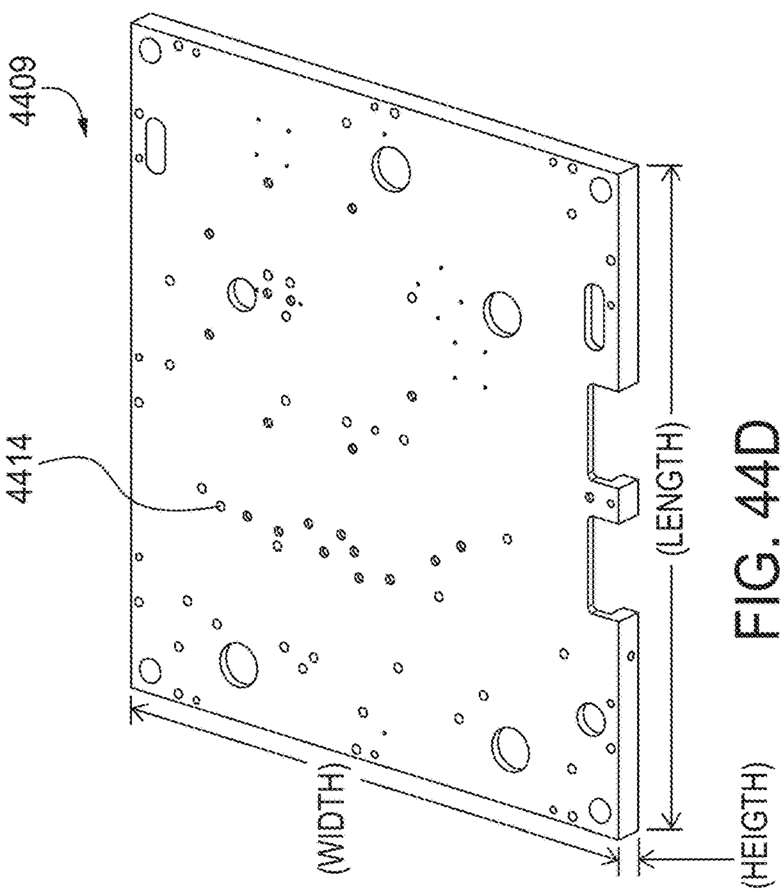
Figure 45:
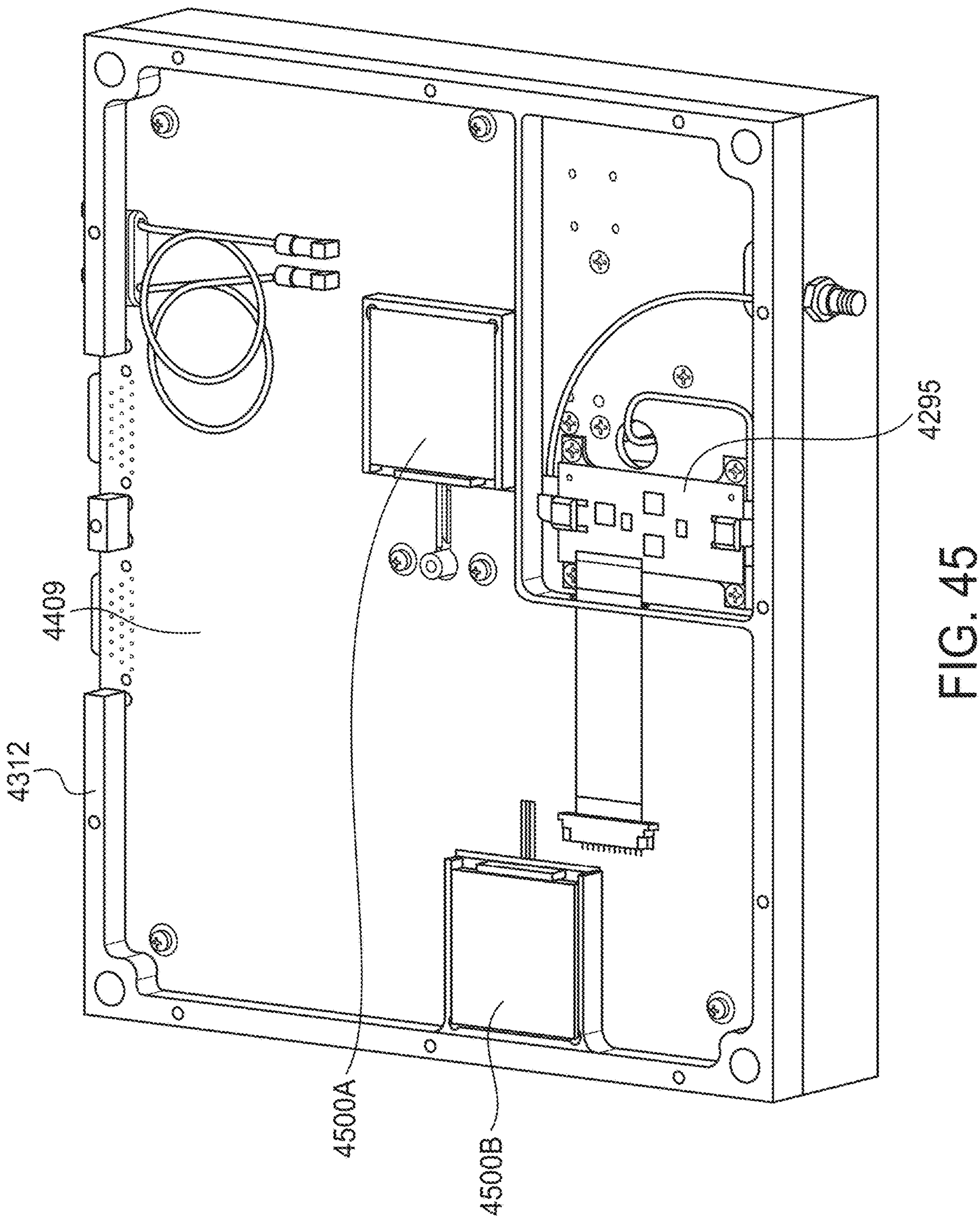
Figure 46A:
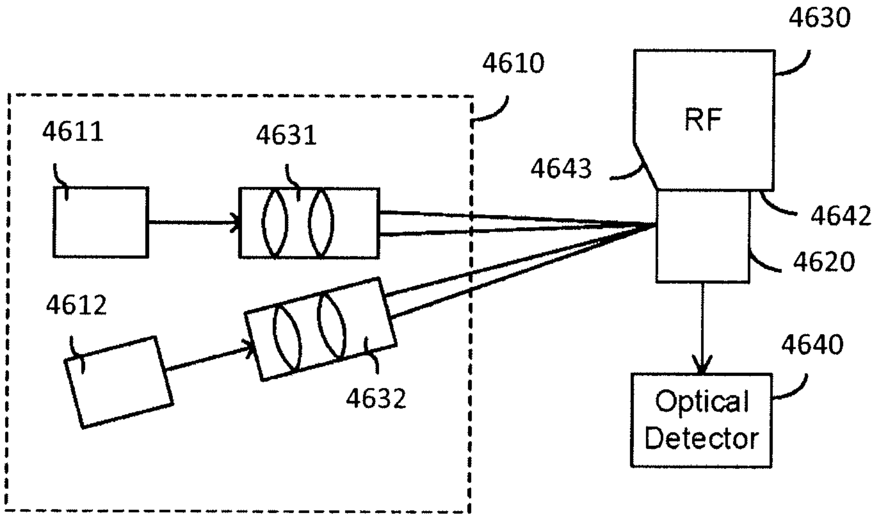
Figure 46B:
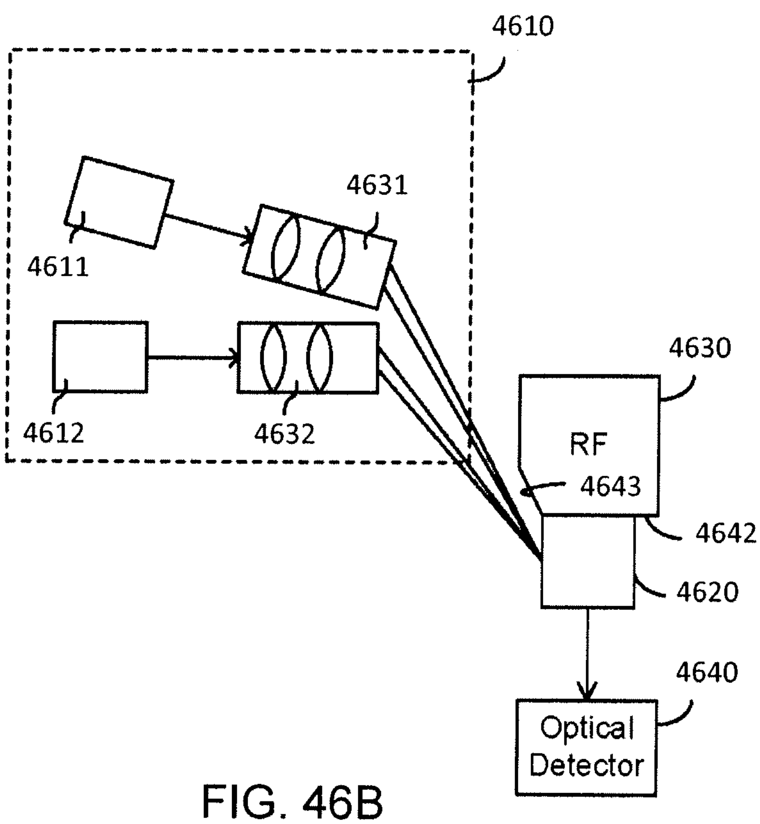
Figure 47:
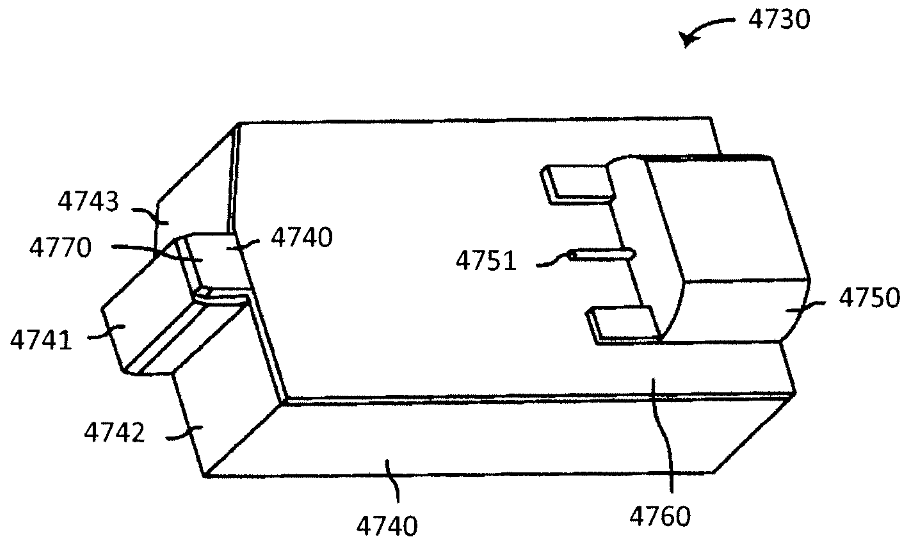
Figure 48:
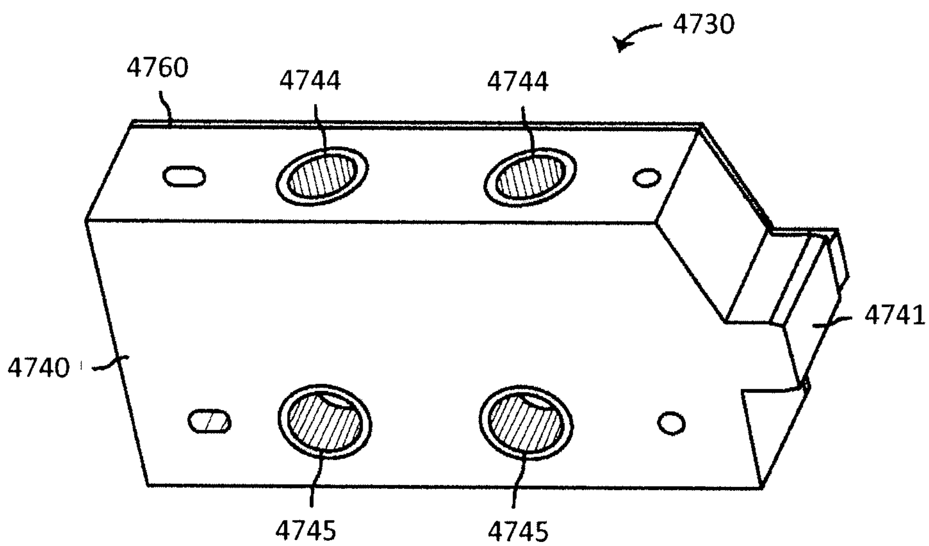
Figure 49:
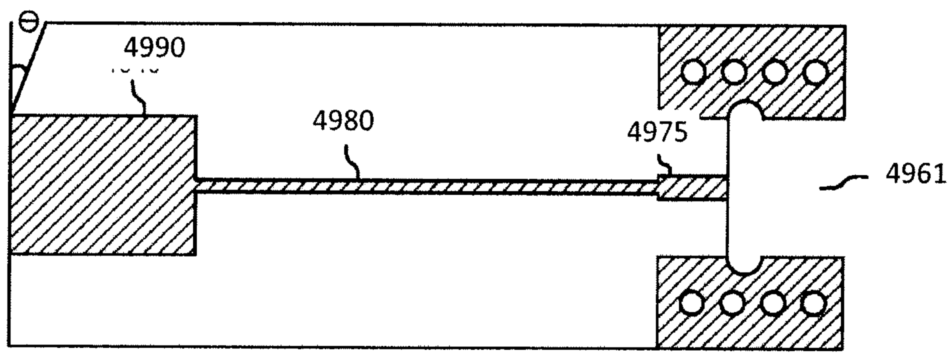
Figure 50A:
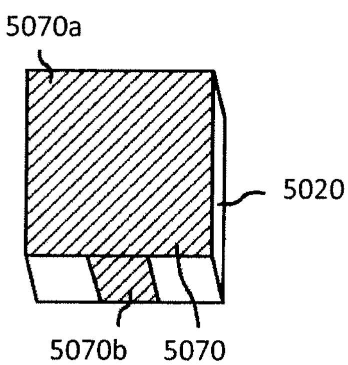
Figure 50B:
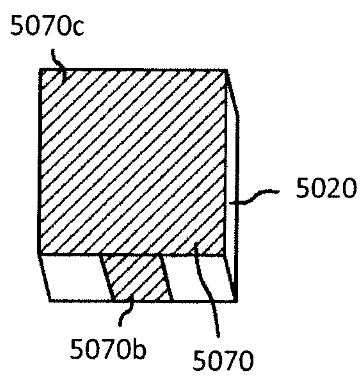
Figure 51:
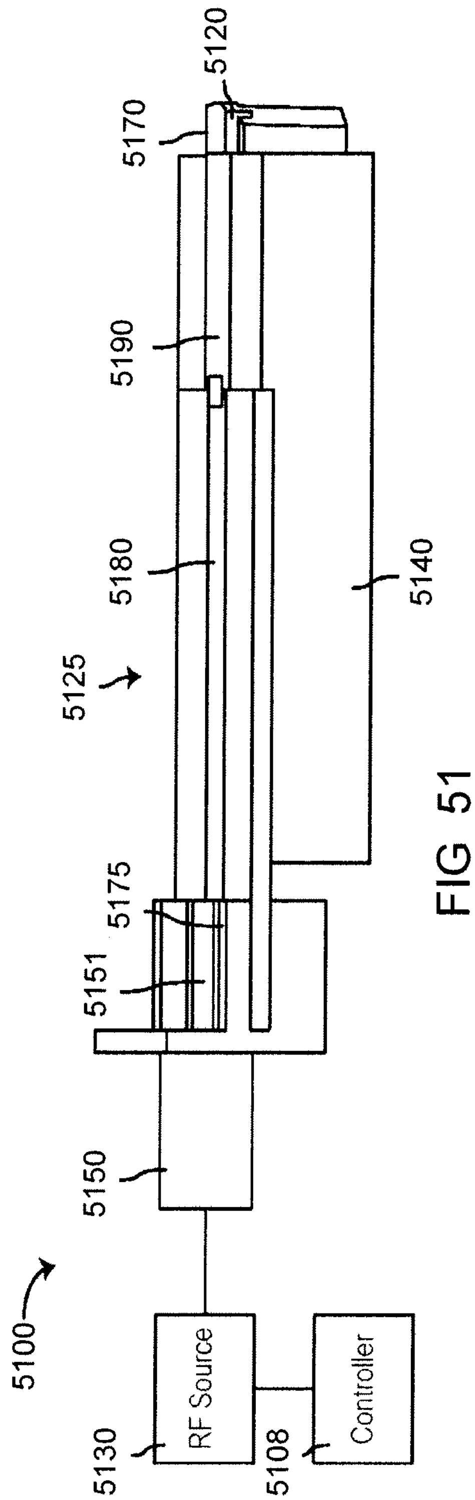
Figure 52A:
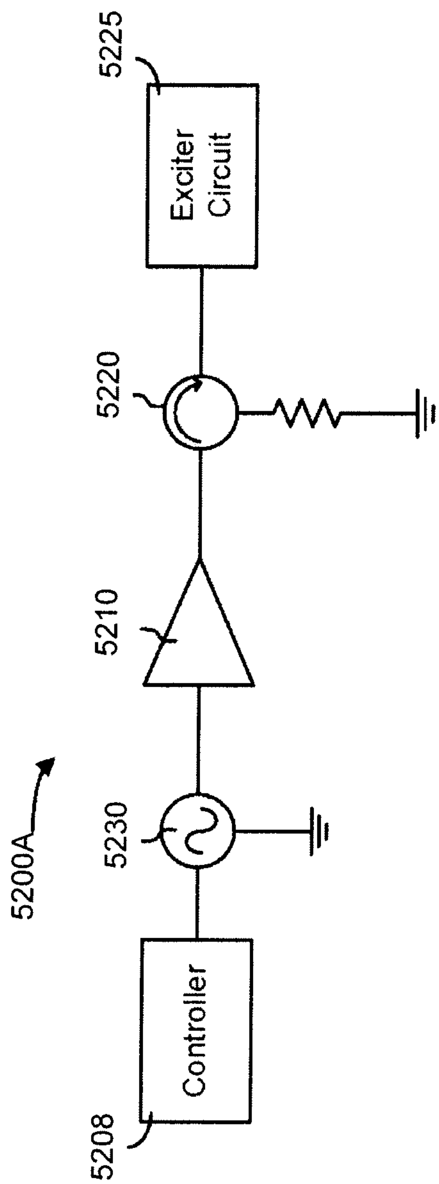
Figure 52B:
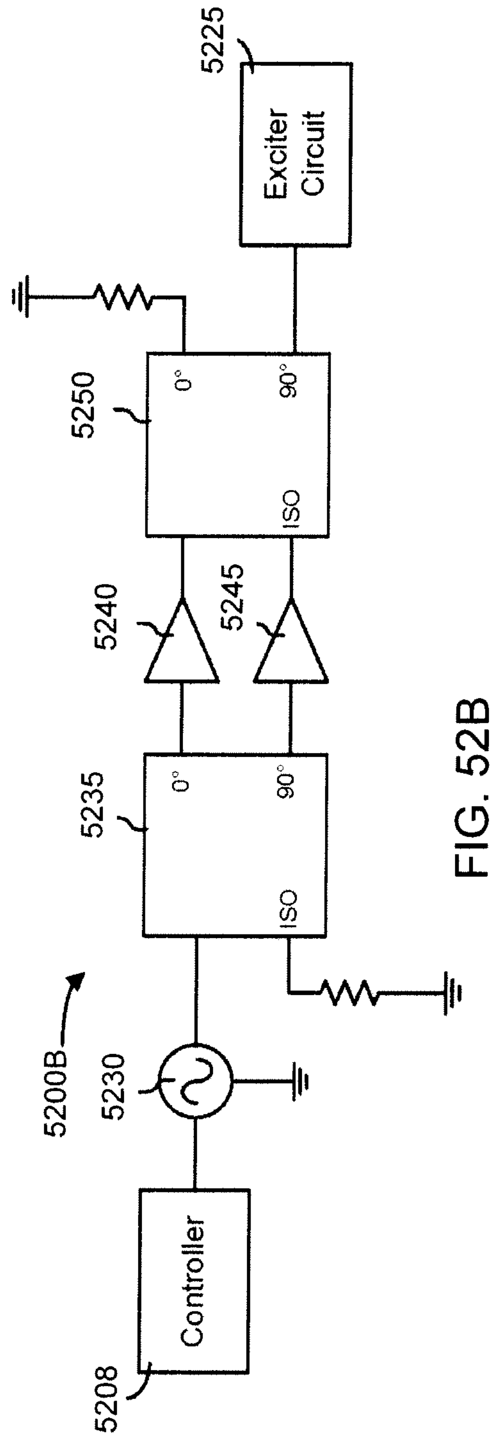
Figure 53A:
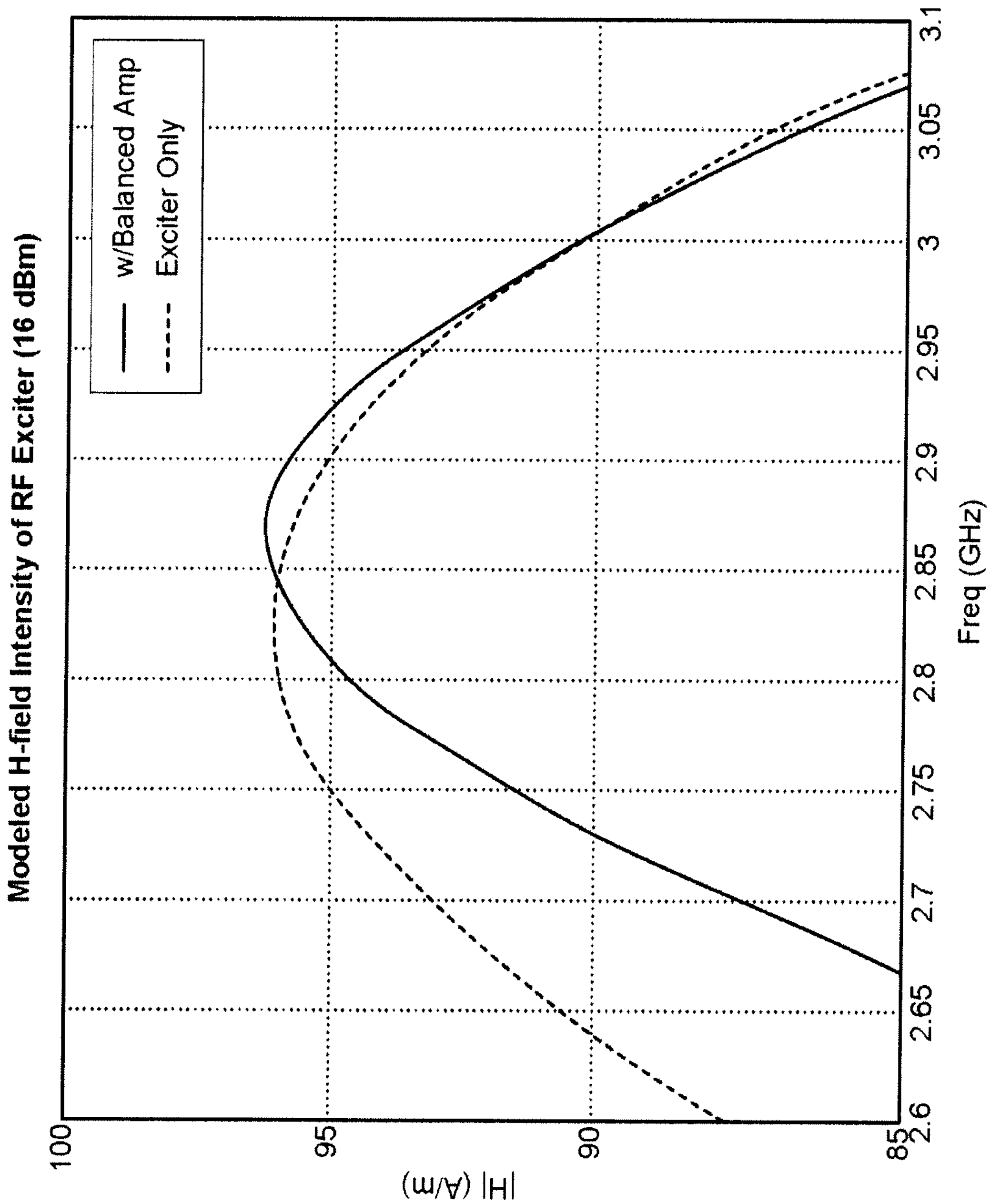
Figure 53B:
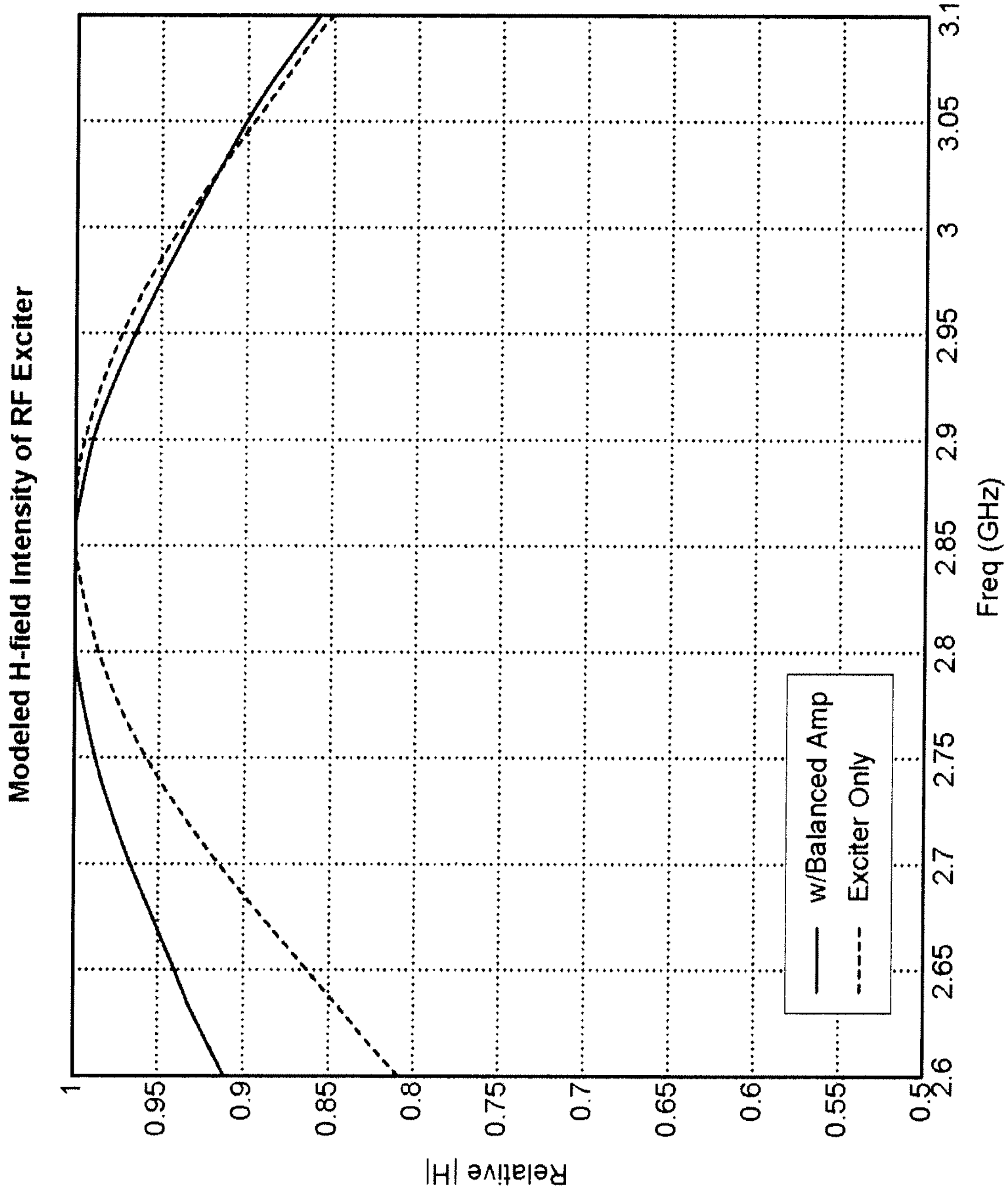
Figure 54:
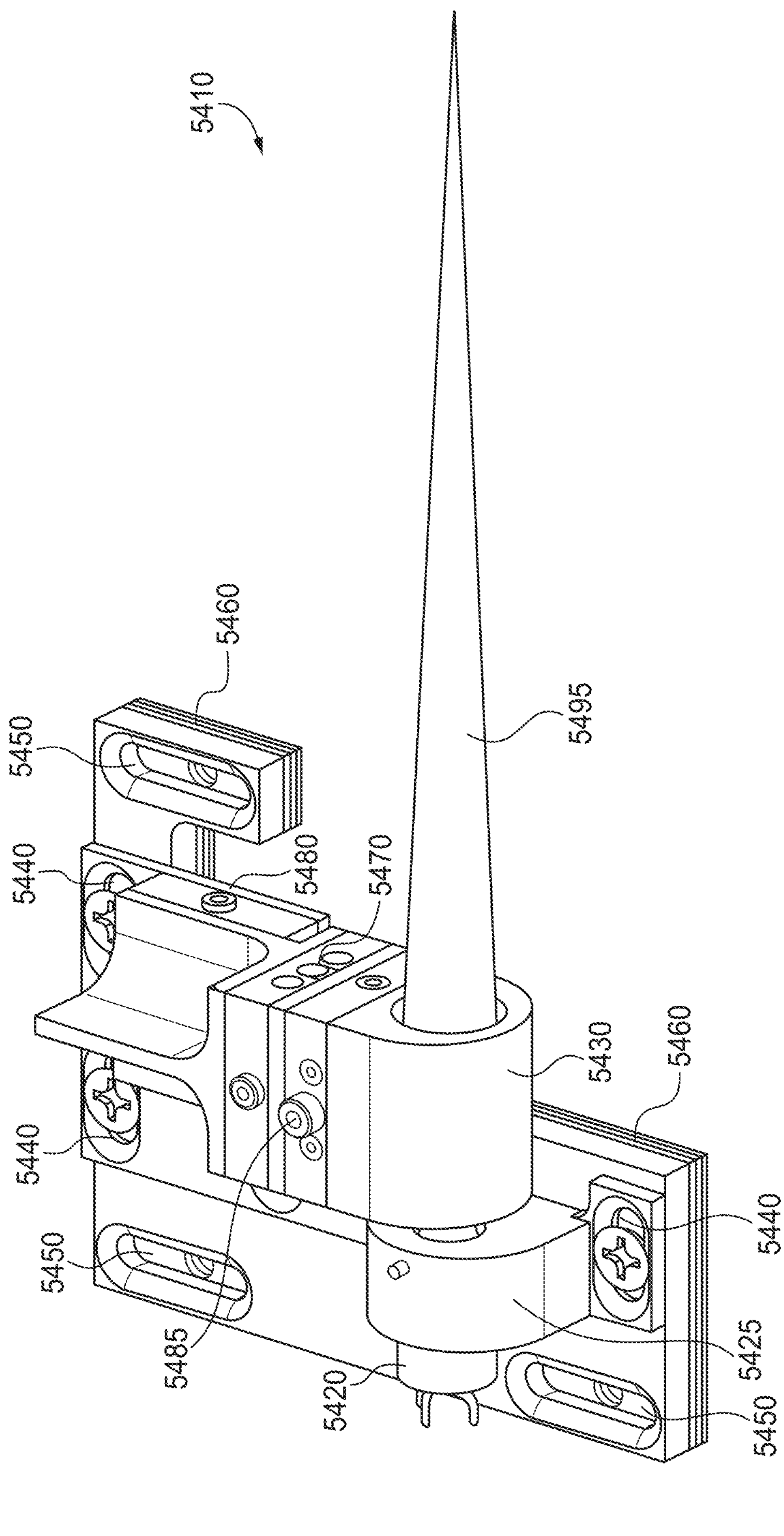
Figure 55:
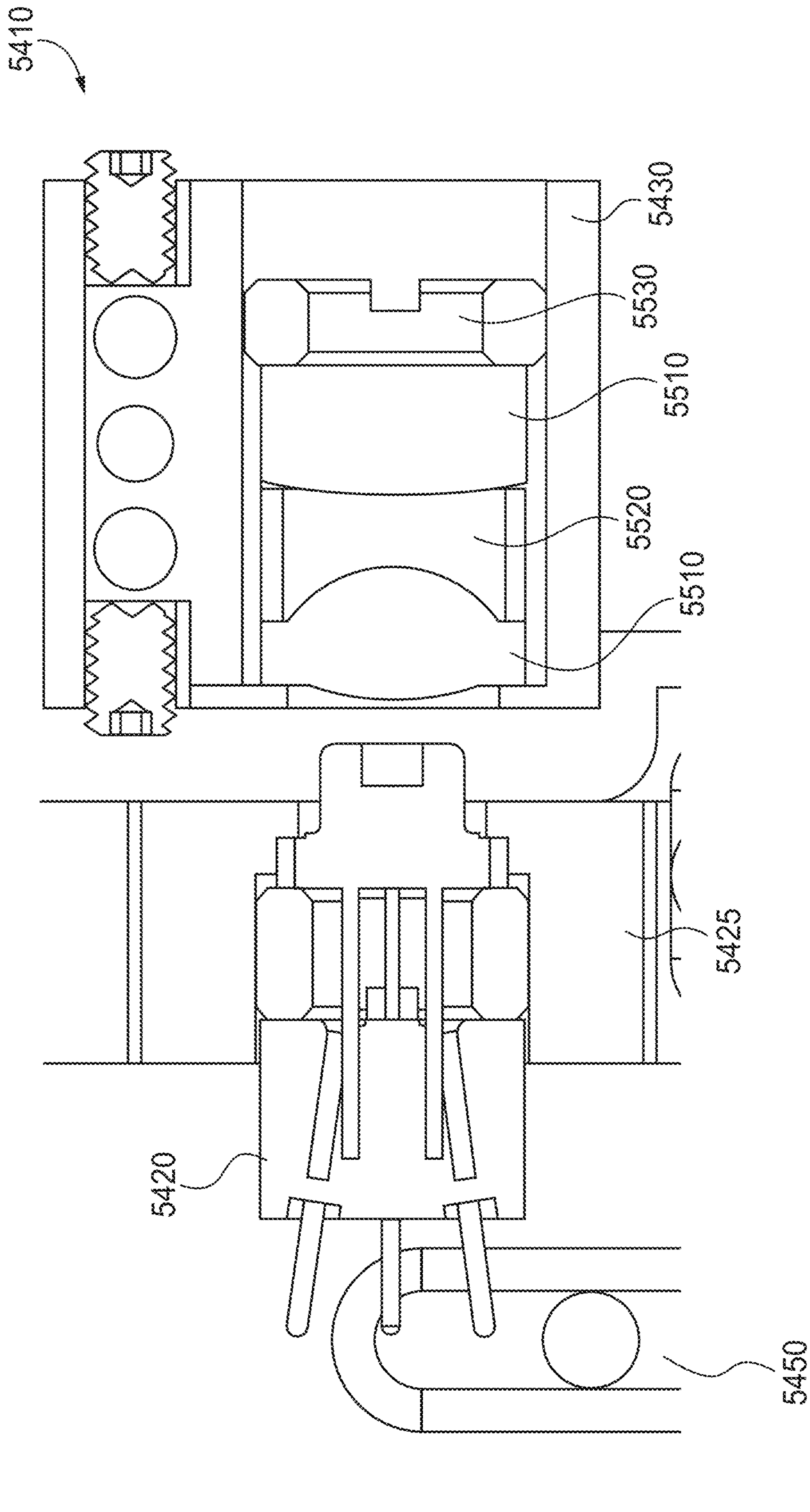
Figure 56:
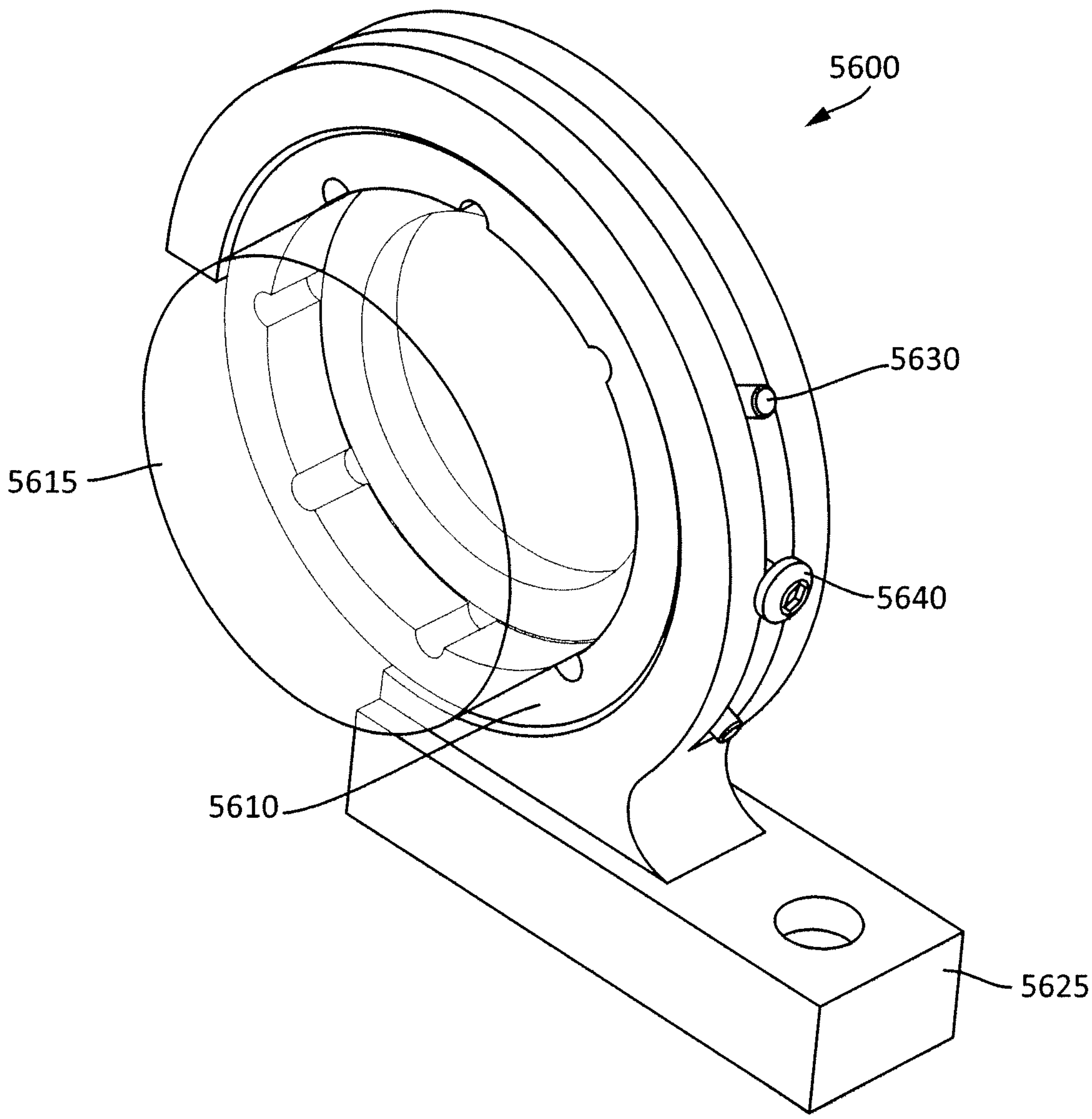
Figure 57:
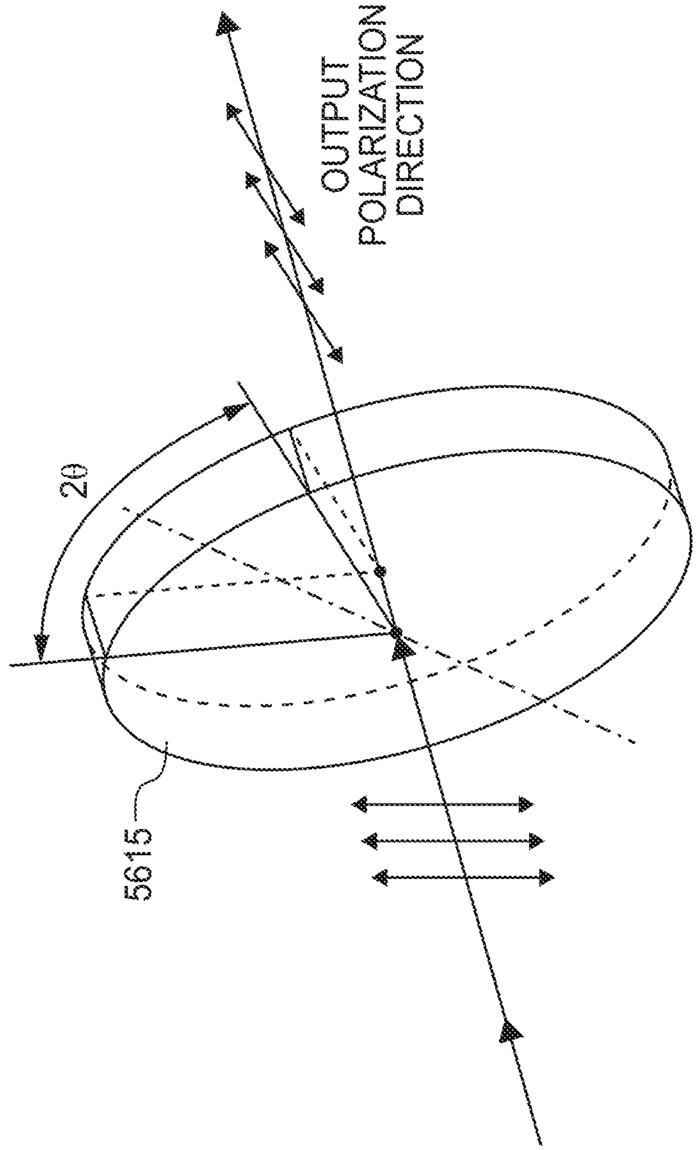
Figure 58:
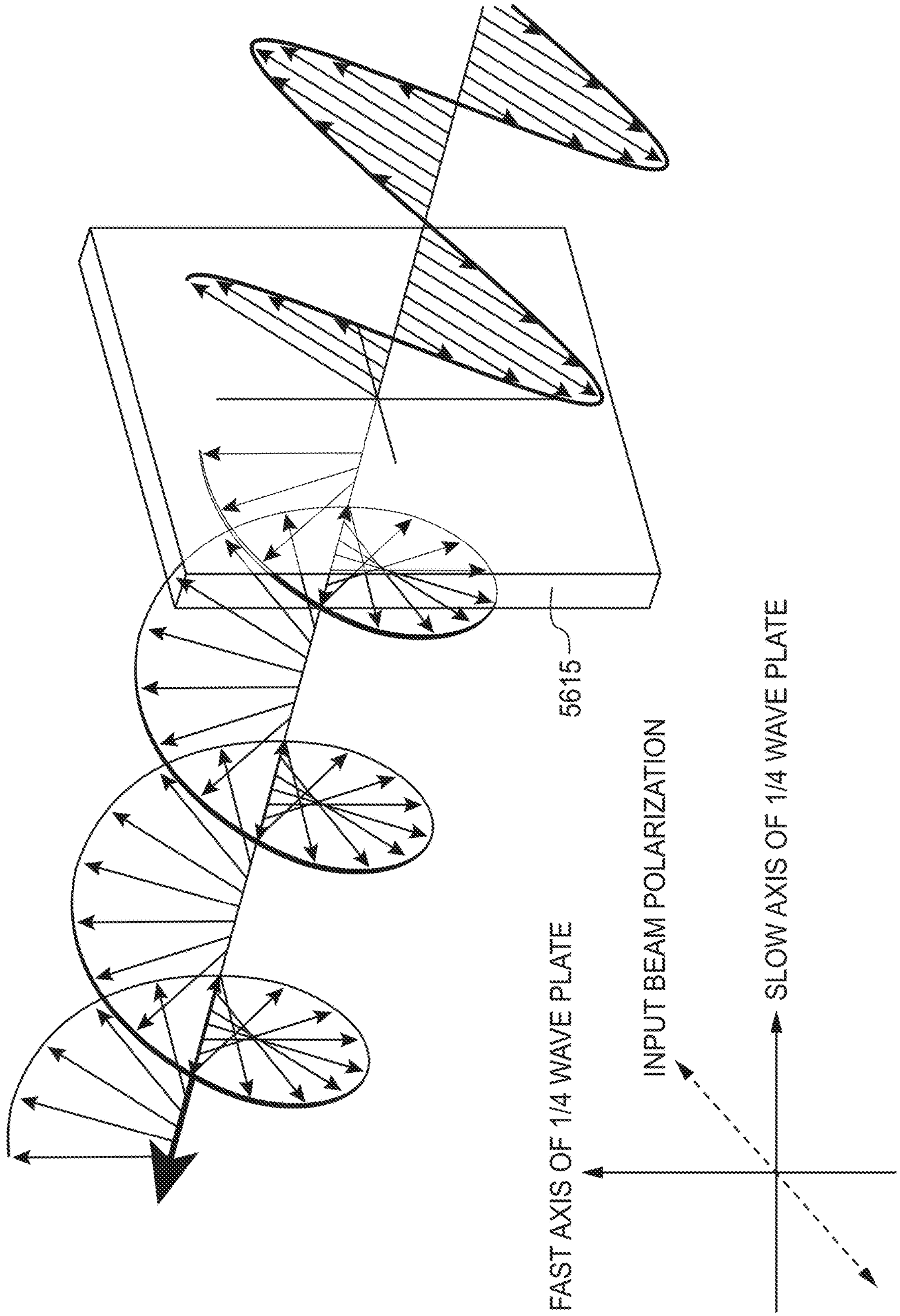
Figure 59A:
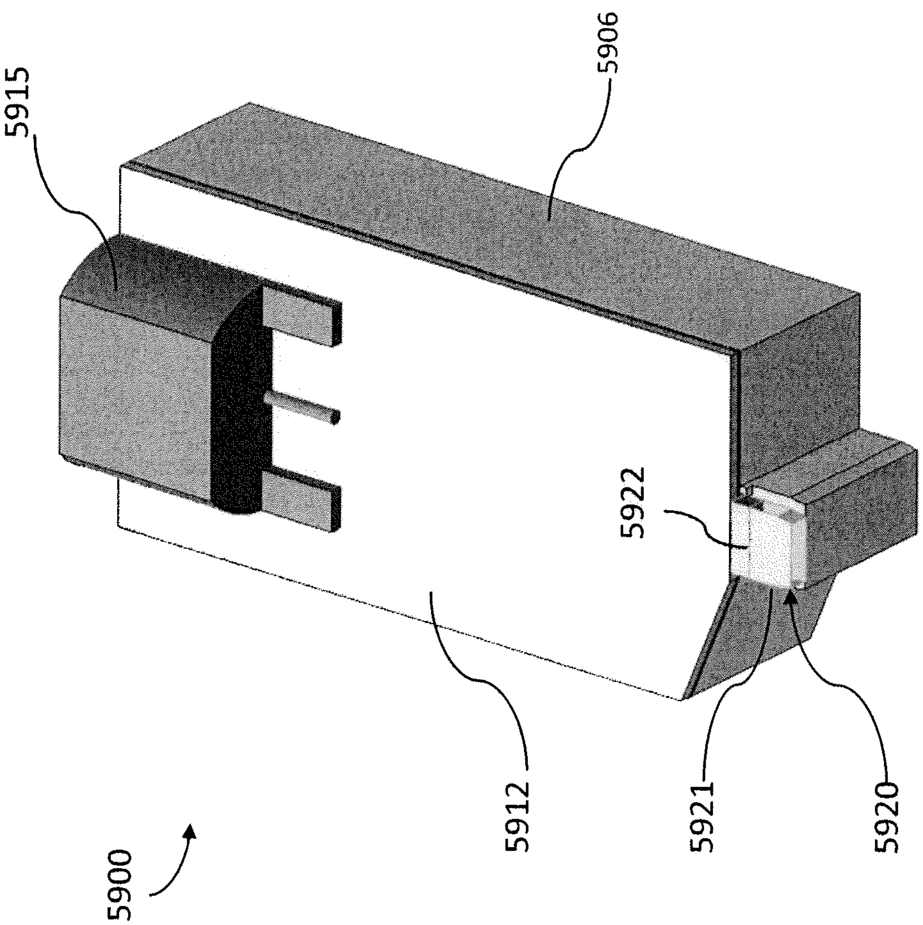
Figure 59B:
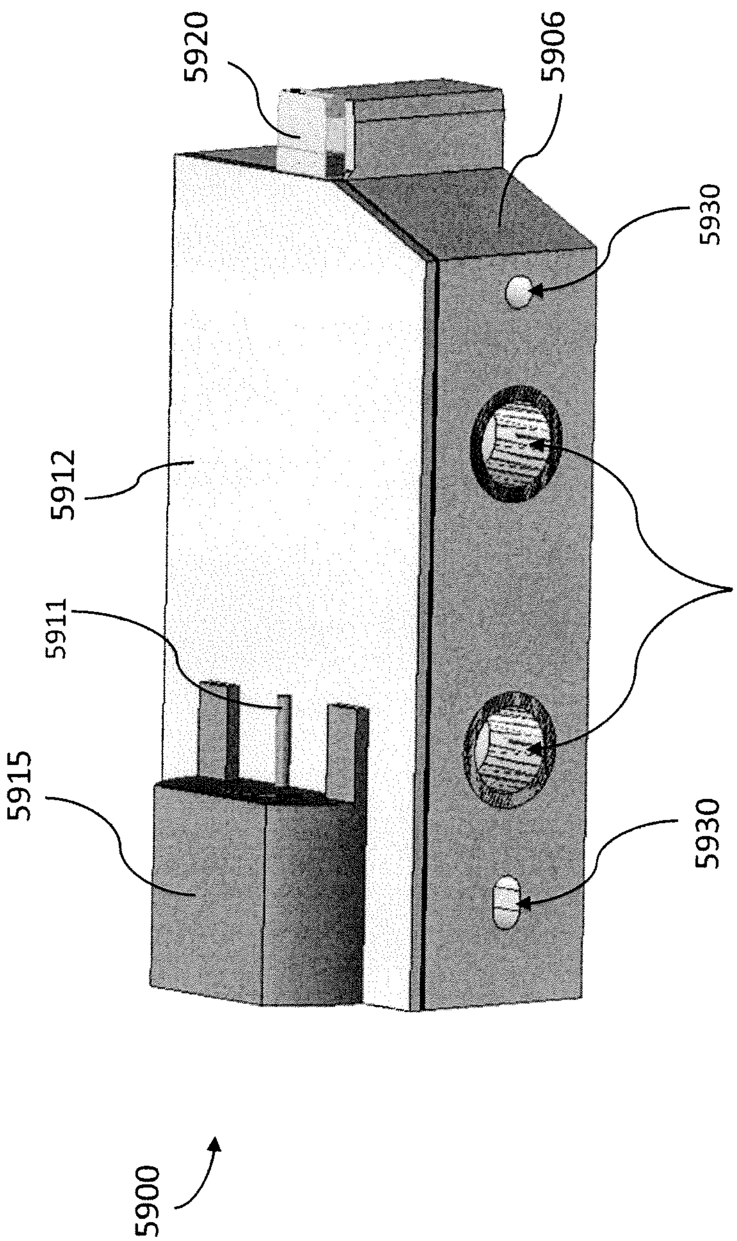
Figure 59C:
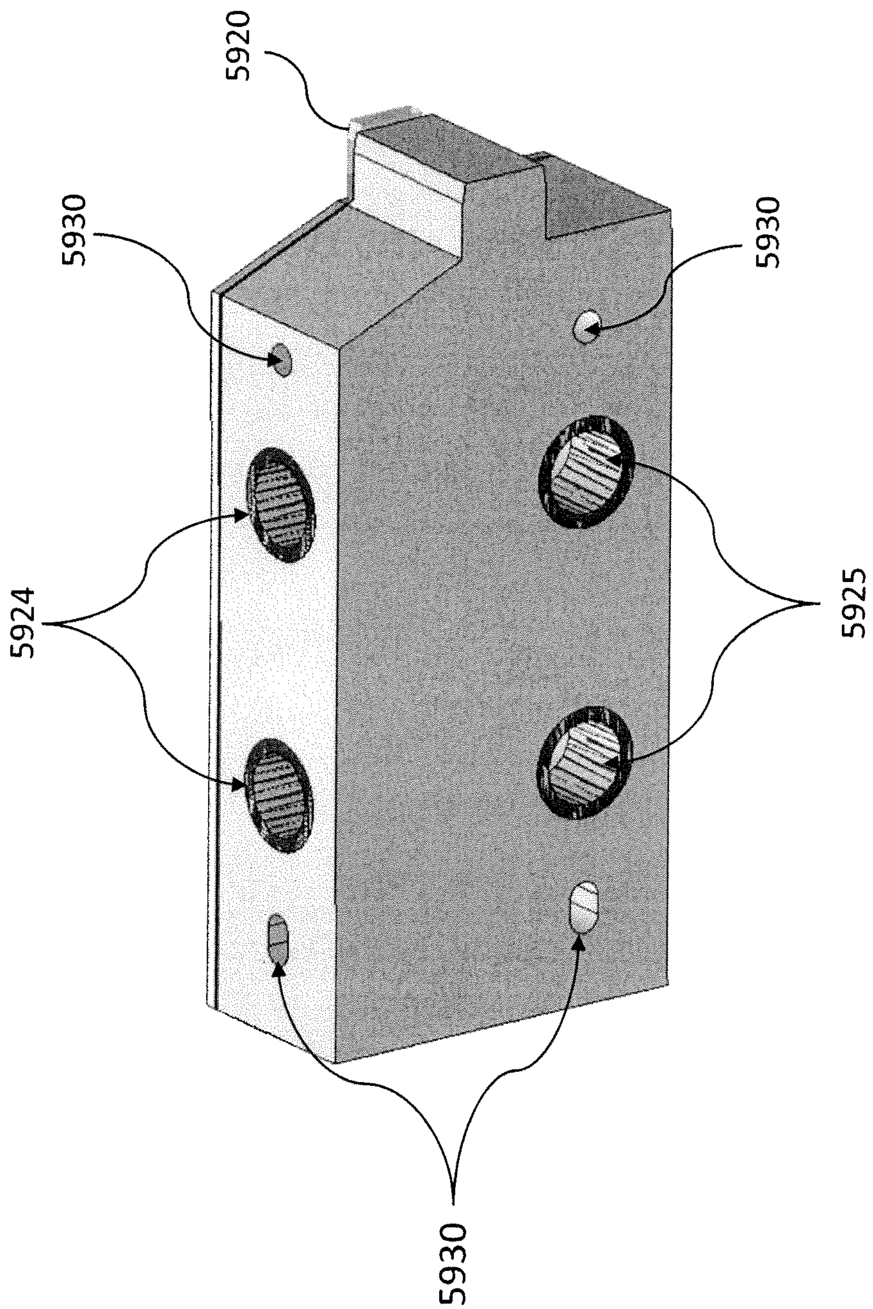
Figure 60:
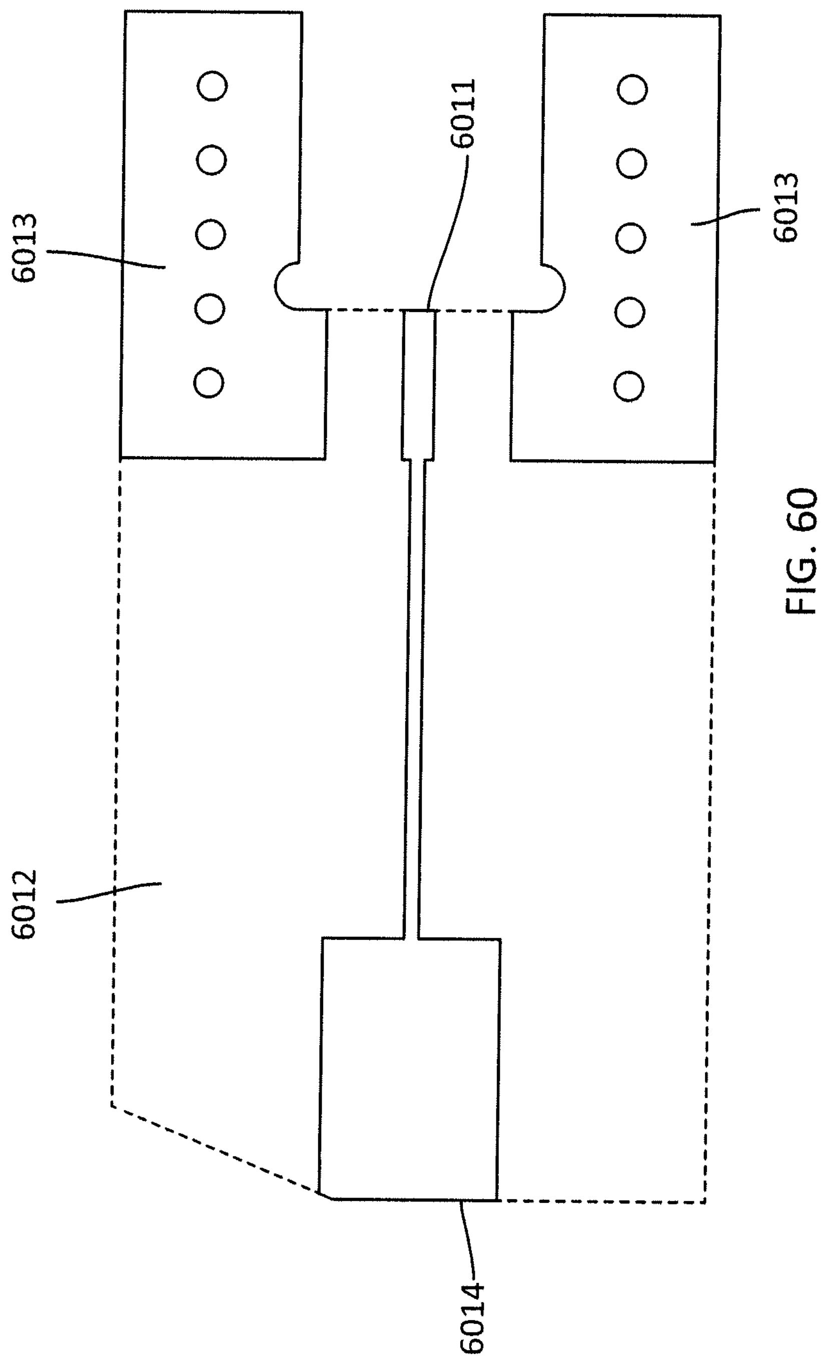
Figure 61A:
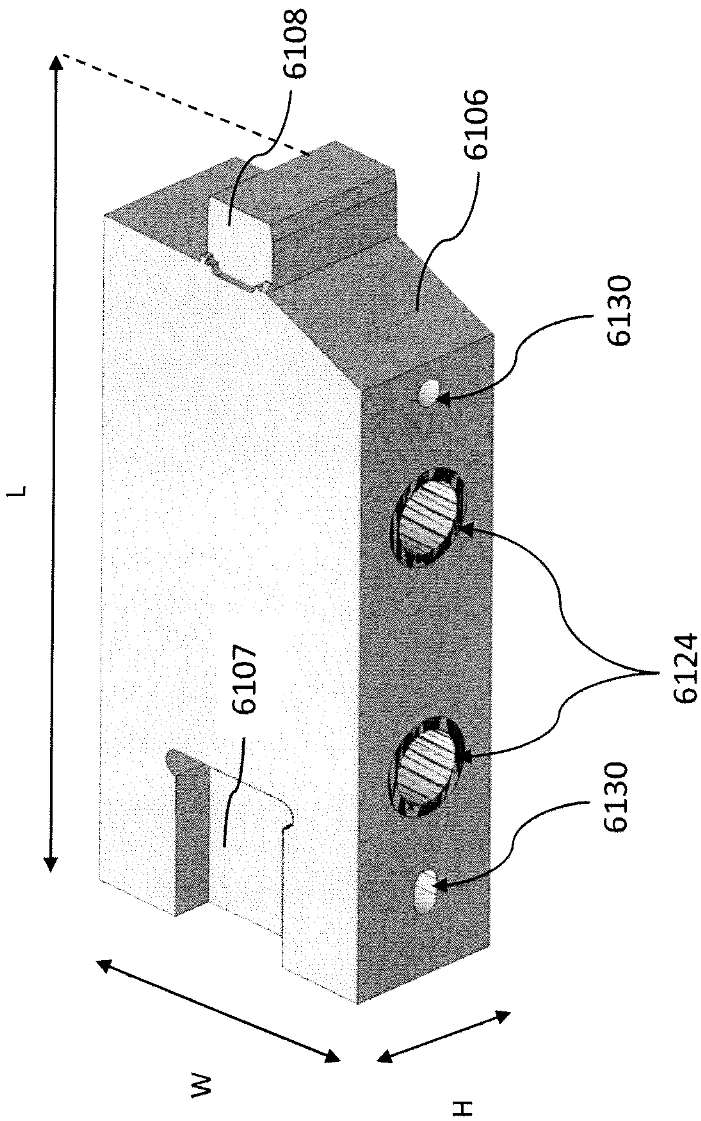
Figure 61B:
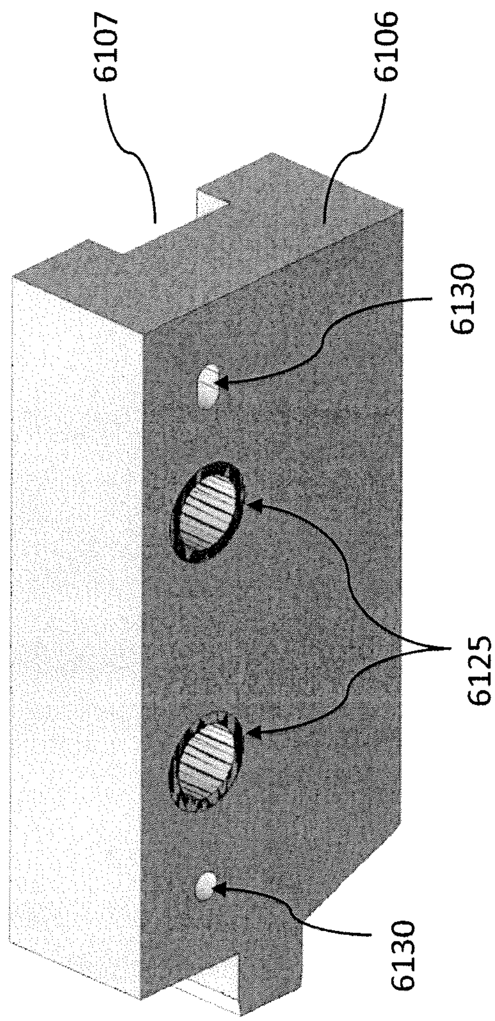
Figure 62:
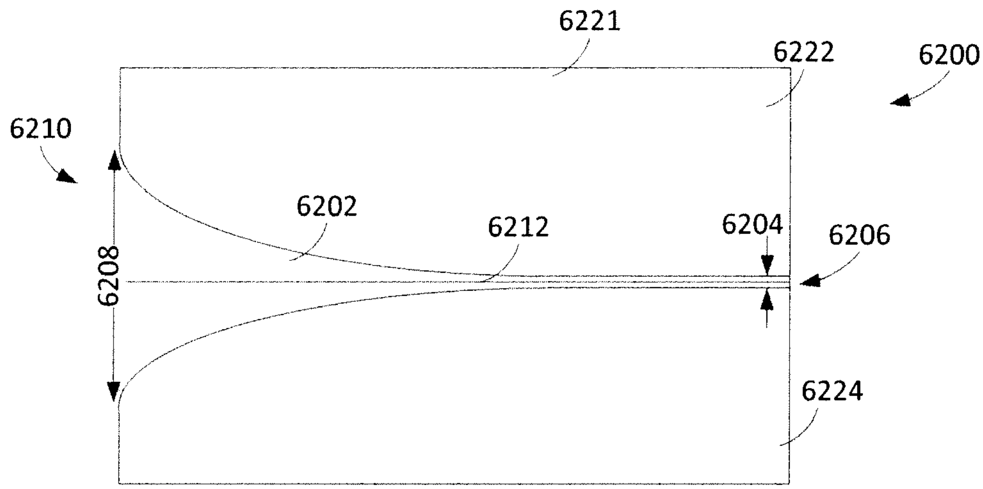
Figure 63:
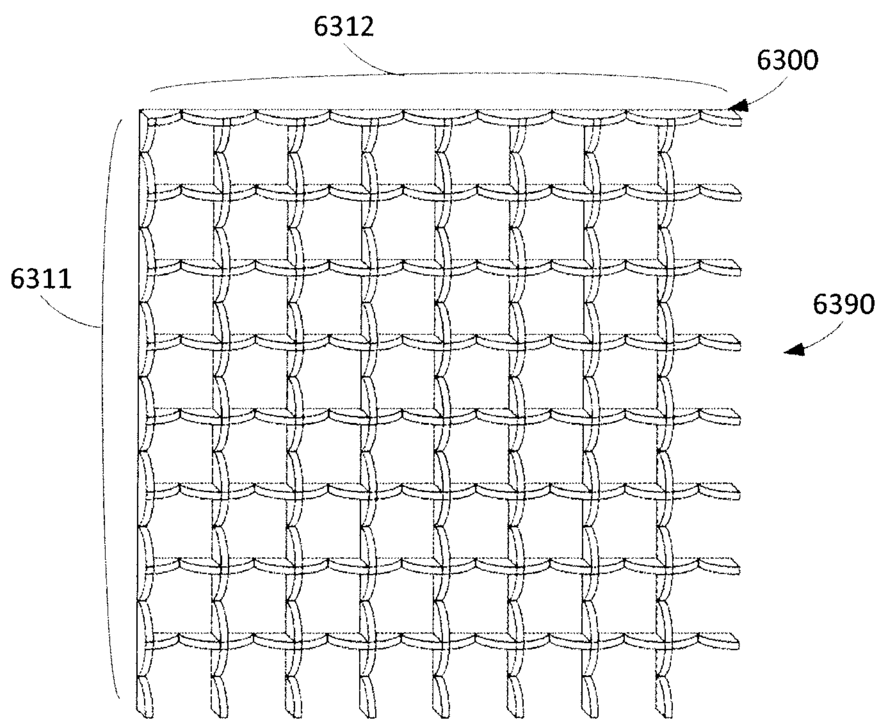
Figure 64:
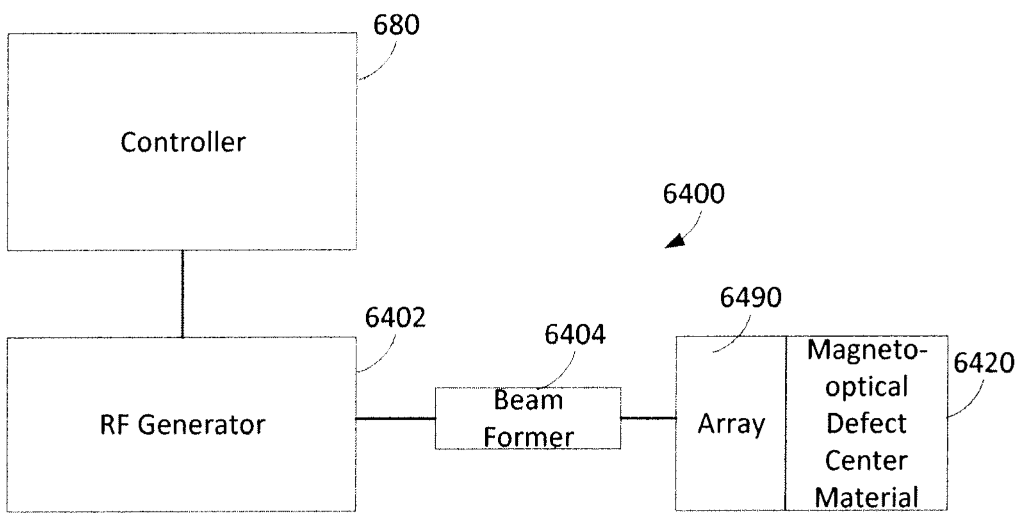
Figure 65:
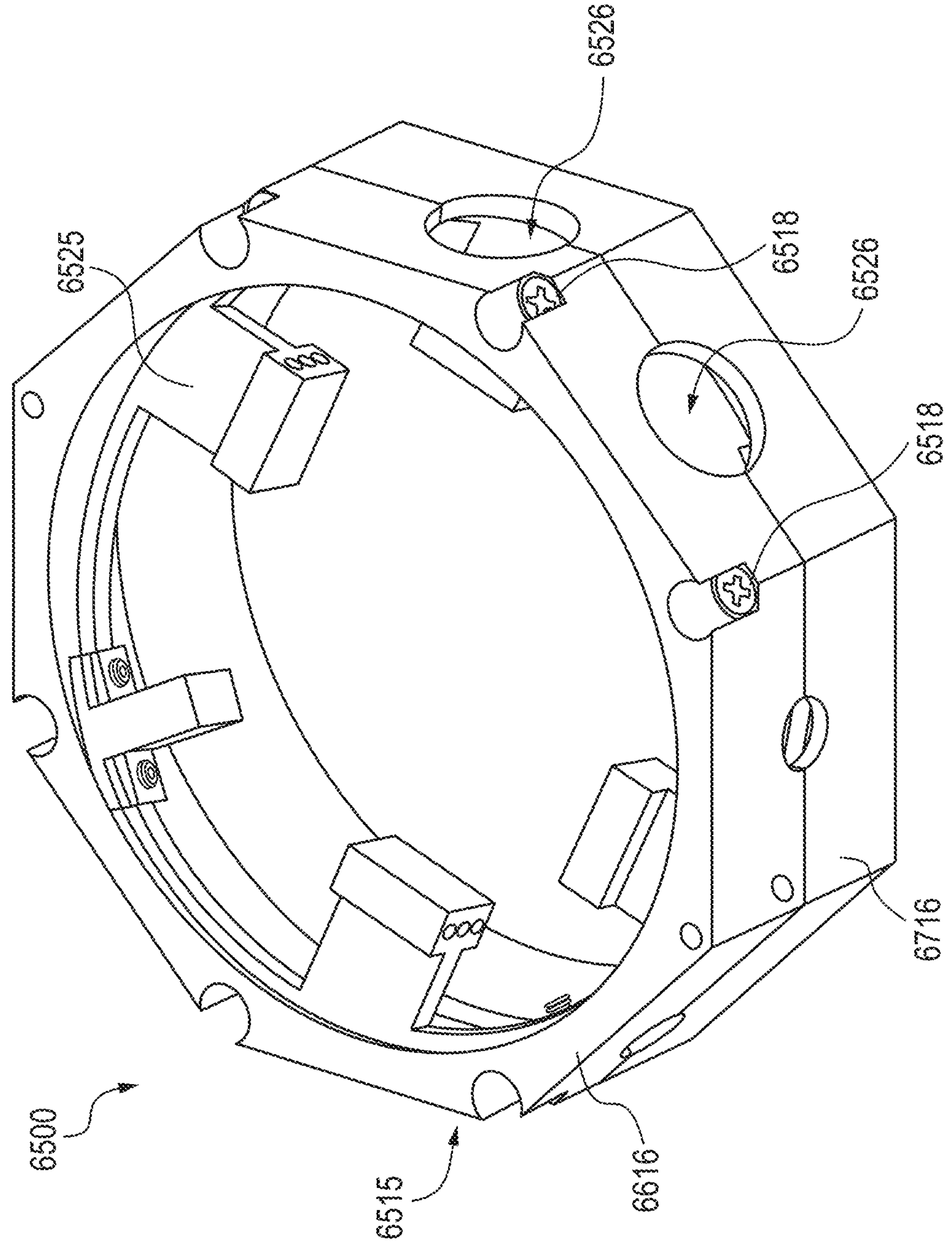
Figure 66:
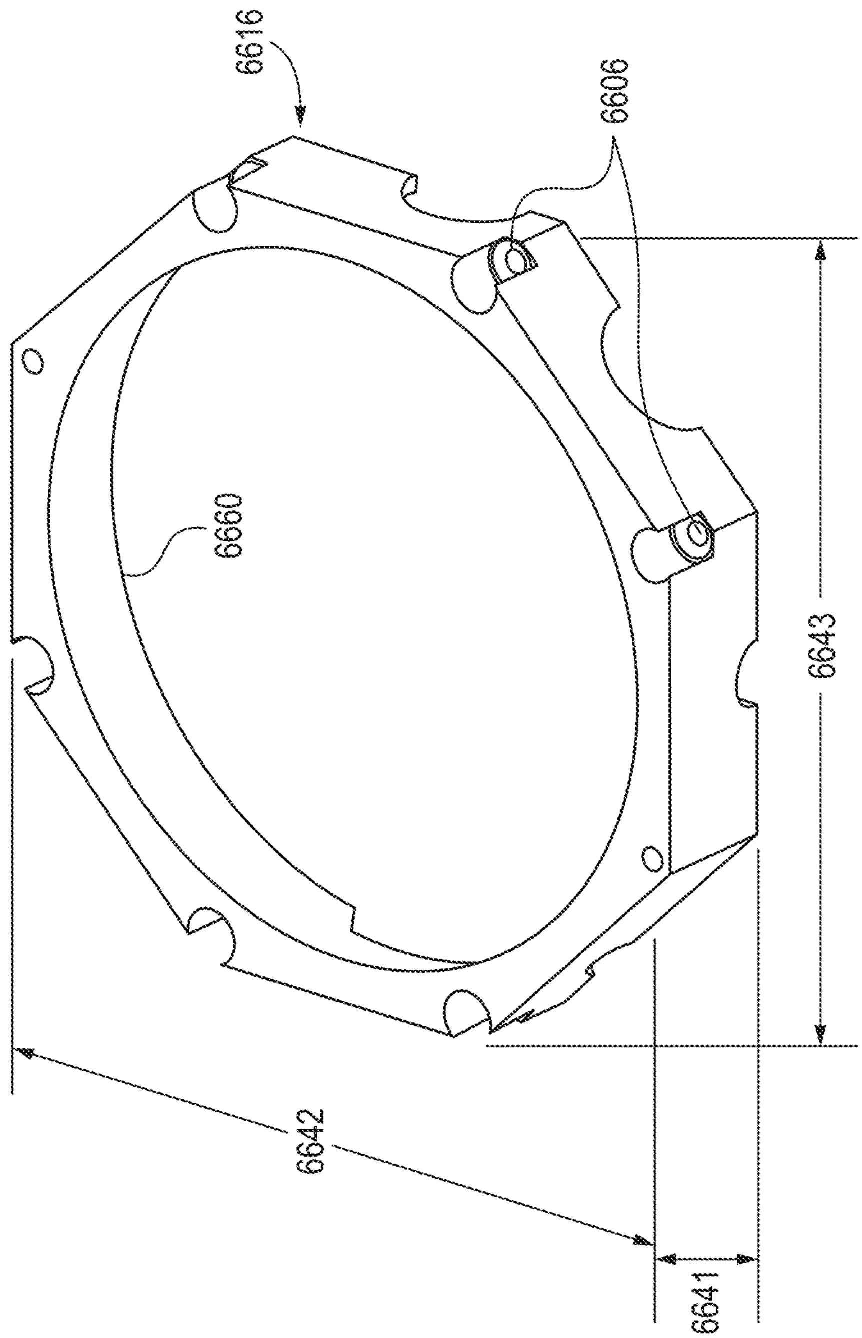
Figure 67:
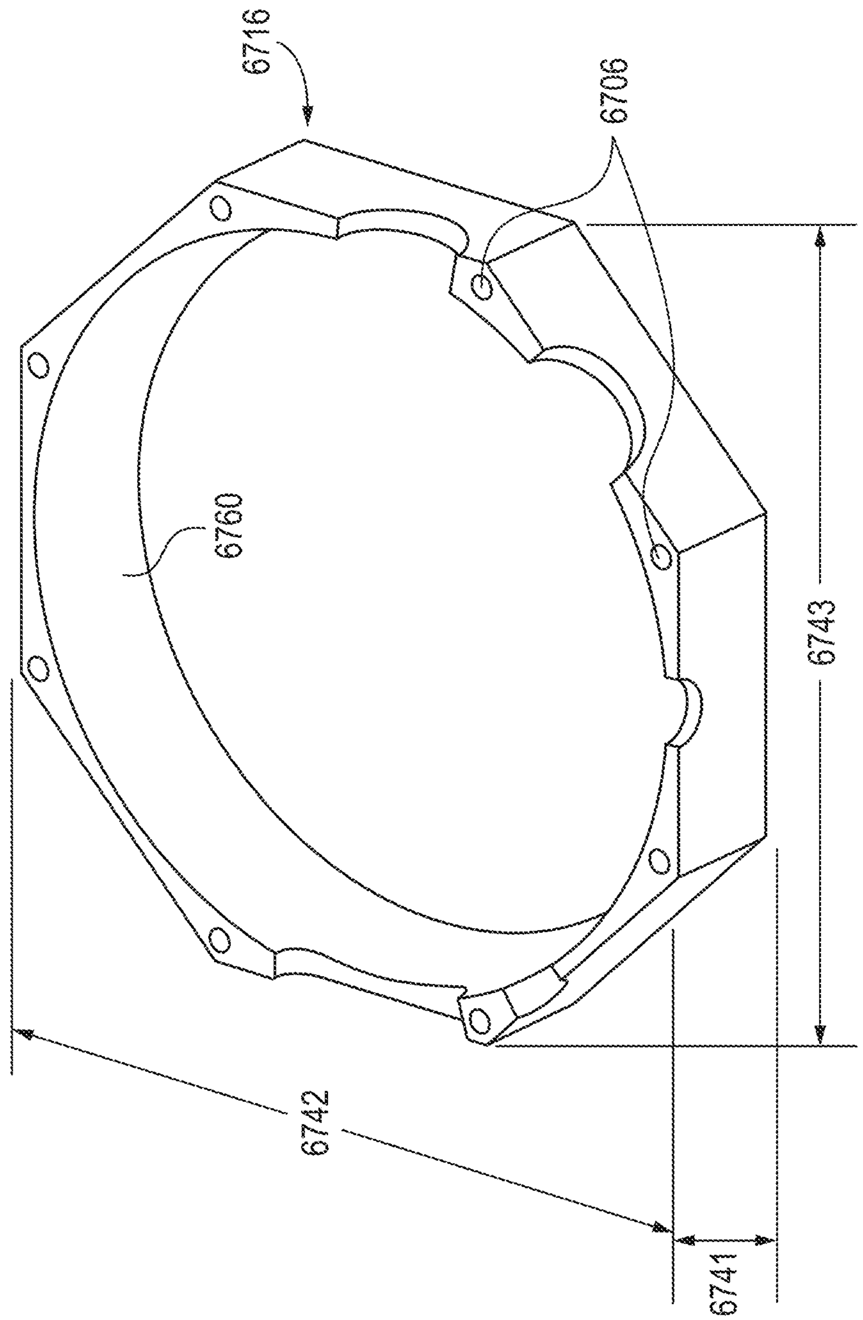
Figure 68:
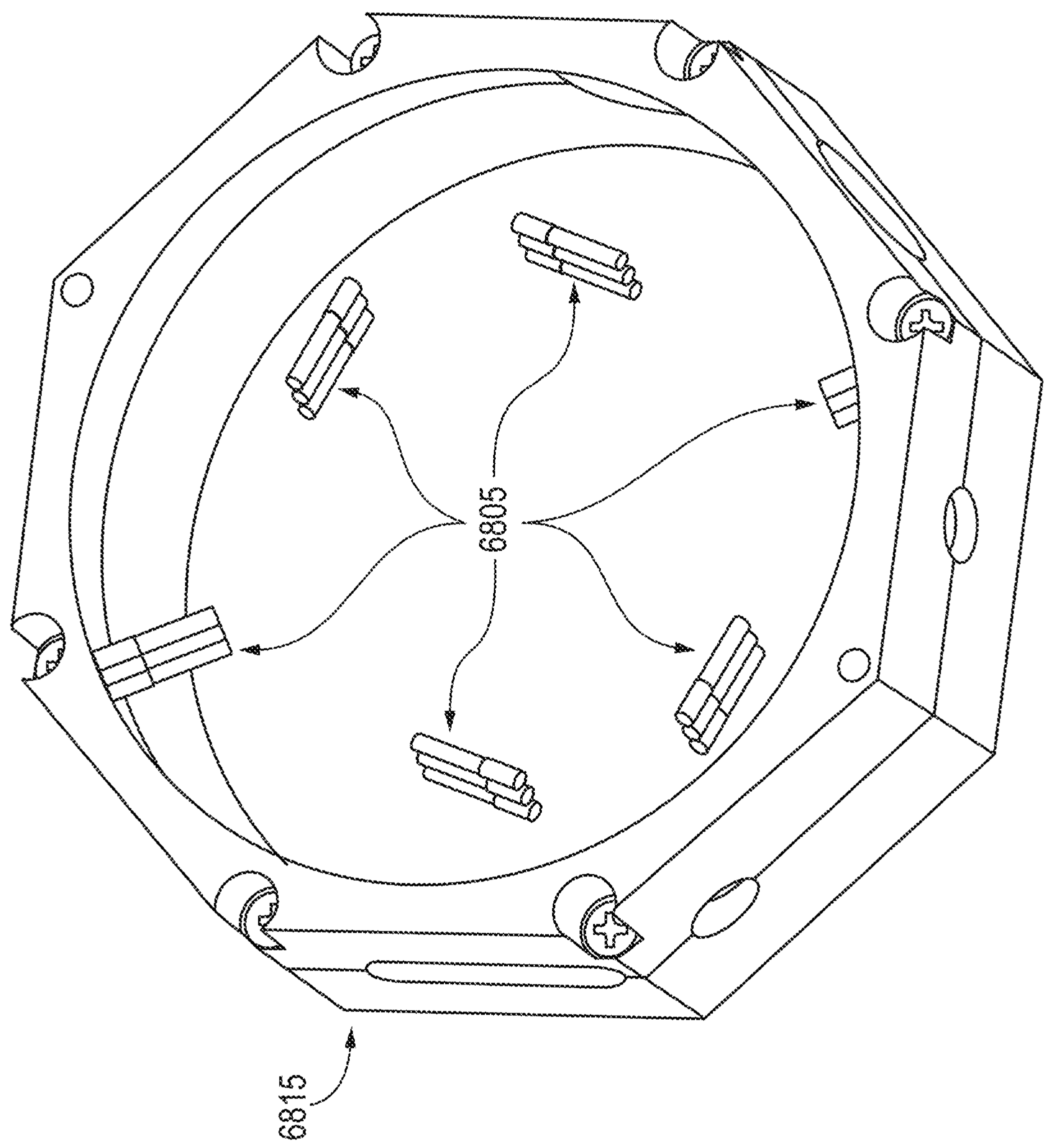
Figure 69:
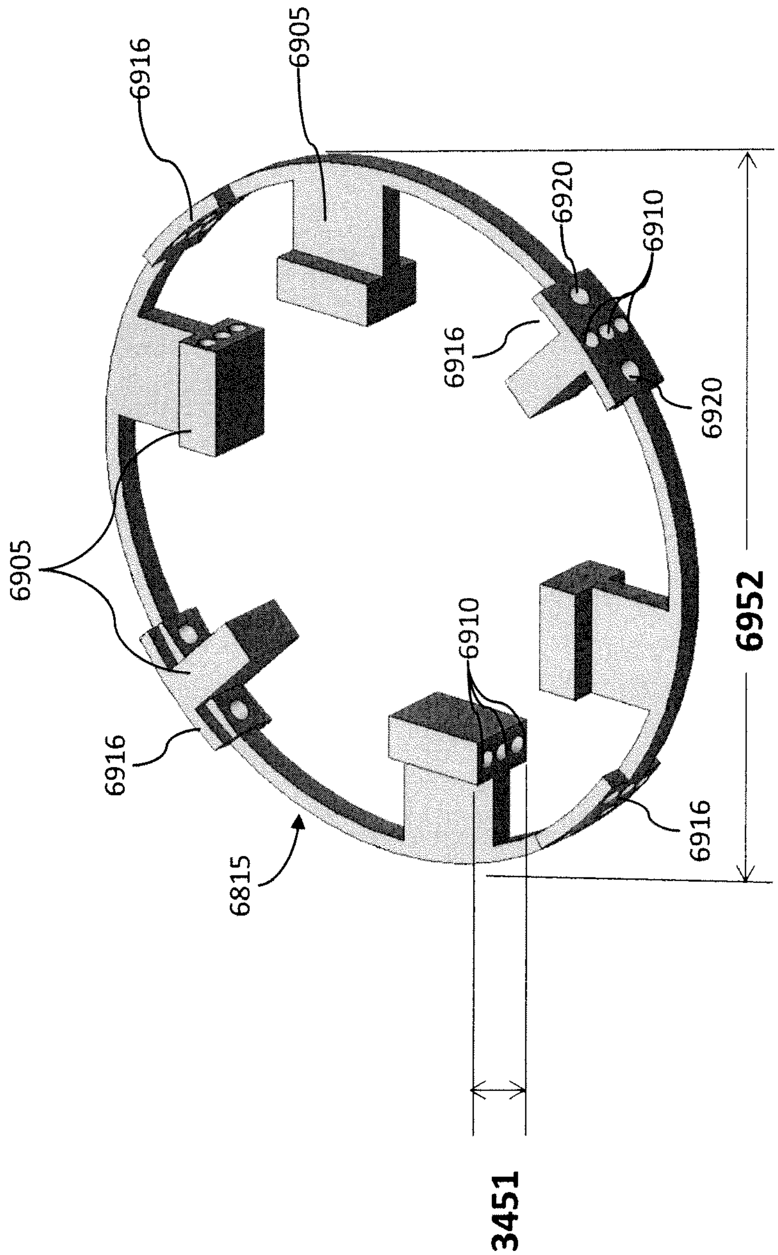
Figure 70:
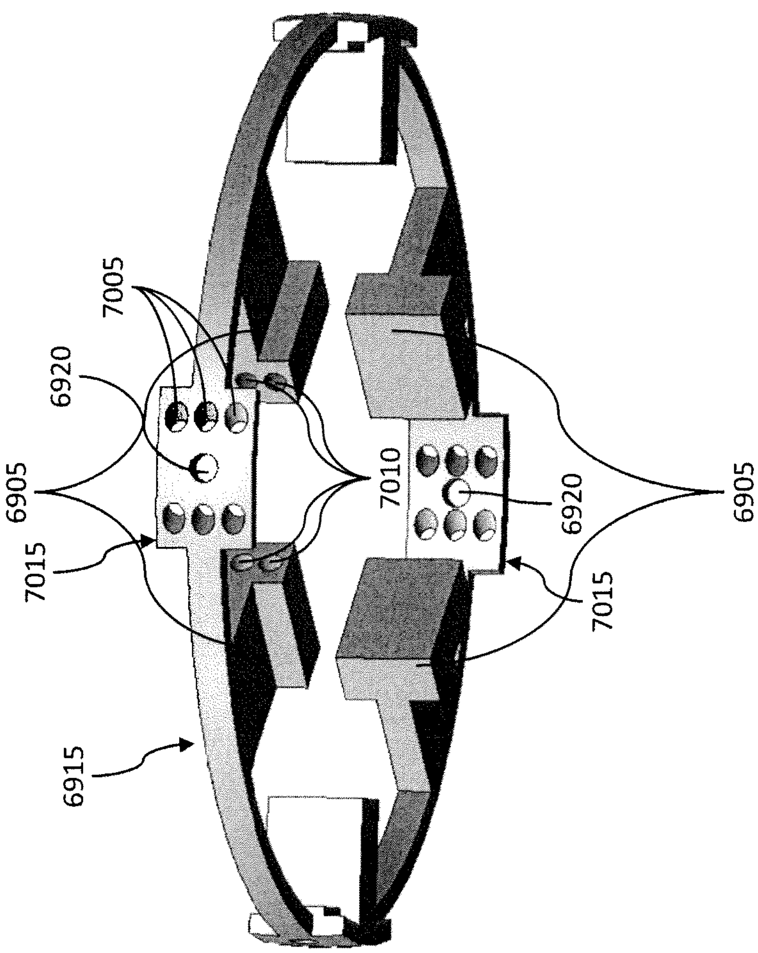

FIG. 42A illustrates an inside view of a magnetic field detection system in accordance with some illustrative embodiments;

FIG. 42B illustrates an inside view of a magnetic field detection system in accordance with some illustrative embodiments in which the NV diamond material is provided in a different orientation than in FIG. 42A;

FIG. 43A illustrates a housing of the magnetic field detection system of FIG. 42A, which includes a top plate, a bottom plate, one or more side plates, a main plate and a gasket;

FIG. 43B illustrates a bottom view of the housing of FIG. 43A in which the bottom plate includes cooling fins;

FIG. 44A illustrates the top plate of the housing of FIG. 43A;

FIG. 44B illustrates the bottom plate of the housing of FIG. 43A;

FIG. 44C illustrates the side plate of the housing of FIG. 43A;

FIG. 44D illustrates a top view of the main plate of the housing of FIG. 43A;

FIG. 44E illustrates a bottom view of the main plate of the housing of FIG. 43A;

FIG. 45 illustrates components fixed to a bottom side of the main plate of the housing of FIG. 44A, where the components are provided between the bottom side of the main plate and a top side of the bottom plate;

FIG. 46A is a schematic diagram illustrating some embodiments of a portion of a magnetic field detection system;

FIG. 46B is a schematic diagram illustrating some embodiments of a portion of a magnetic field detection system with a different arrangement of the light sources than in FIG. 46A;

FIG. 47 illustrates some embodiments of an RF excitation source of a magnetic field detection system;

FIG. 48 illustrates some embodiments of an RF excitation source oriented on its side;

FIG. 49 illustrates some embodiments of a circuit board of an RF excitation source;

FIG. 50A illustrates some embodiments of a diamond material coated with a metallic material from a top perspective view;

FIG. 50B illustrates some embodiments of a diamond material coated with a metallic material from a bottom perspective view;

FIG. 51 illustrates some embodiments of a standing-wave RF exciter system;

FIG. 52A illustrates some embodiments of a circuit diagram of a RF exciter system;

FIG. 52B illustrates some embodiments of a circuit diagram of another RF exciter system;

FIG. 53A is a graph illustrating an applied RF field as a function of frequency for a prior exciter;

FIG. 53B is a graph illustrating an applied RF field as a function of frequency for some embodiments of an exciter;

FIG. 54 illustrates an optical light source with adjustable spacing features in accordance with some illustrative embodiments;

FIG. 55 illustrates a cross section as viewed from above of a portion of the optical light source in accordance with some illustrative embodiments;

FIG. 56 is a schematic diagram illustrating a waveplate assembly in accordance with some illustrative embodiments;

FIG. 57 is a half-wave plate schematic diagram illustrating a change in polarization of light when the waveplate of FIG. 56 is a half-wave plate;

FIG. 58 is a quarter-wave plate schematic diagram illustrating a change in polarization of light when the waveplate of FIG. 56 is a quarter-wave plate;

FIGS. 59A-59C are three-dimensional views of an element holder assembly in accordance with some illustrative embodiments;

FIG. 60 is a circuit outline of a radio frequency element circuit board in accordance with some illustrative embodiments;

FIGS. 61A and 61B are three-dimensional views of an element holder base in accordance with some illustrative embodiments;

FIG. 62 is a schematic illustrating some implementations of a Vivaldi antenna;

FIG. 63 is a schematic illustrating some implementations of an array of Vivaldi antennae;

FIG. 64 is a block diagram of some RF systems for the magneto-defect center sensor;

FIG. 65 illustrates a magnet mount assembly in accordance with some illustrative embodiments;

FIG. 66 illustrates parts of a disassembled magnet ring mount in accordance with some illustrative embodiments;

FIG. 67 illustrates parts of a disassembled magnet ring mount in accordance with some illustrative embodiments;

FIG. 68 illustrates a magnet ring mount showing locations of magnets in accordance with some illustrative embodiments;

FIG. 69 illustrates a bias magnet ring mount in accordance with some illustrative embodiments;

FIG. 70 illustrates a bias magnet ring mount in accordance with some illustrative embodiments;

Magneto-Optical Defect Center with Waveguide

Figure 71:
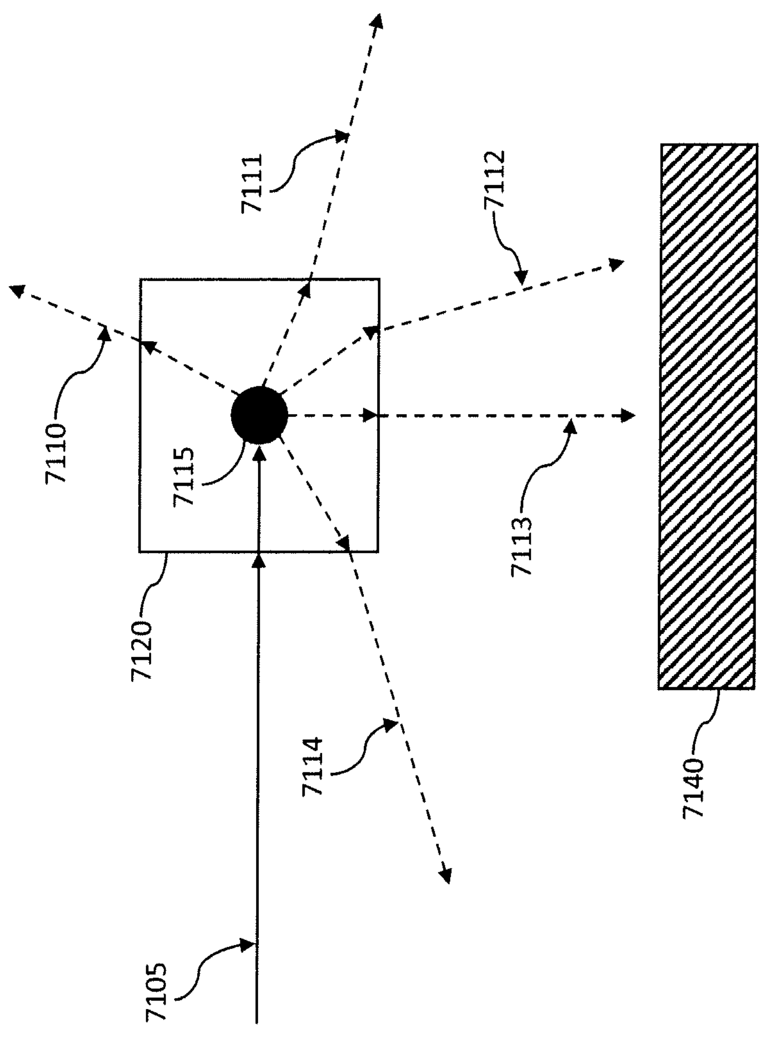
Figure 72A:
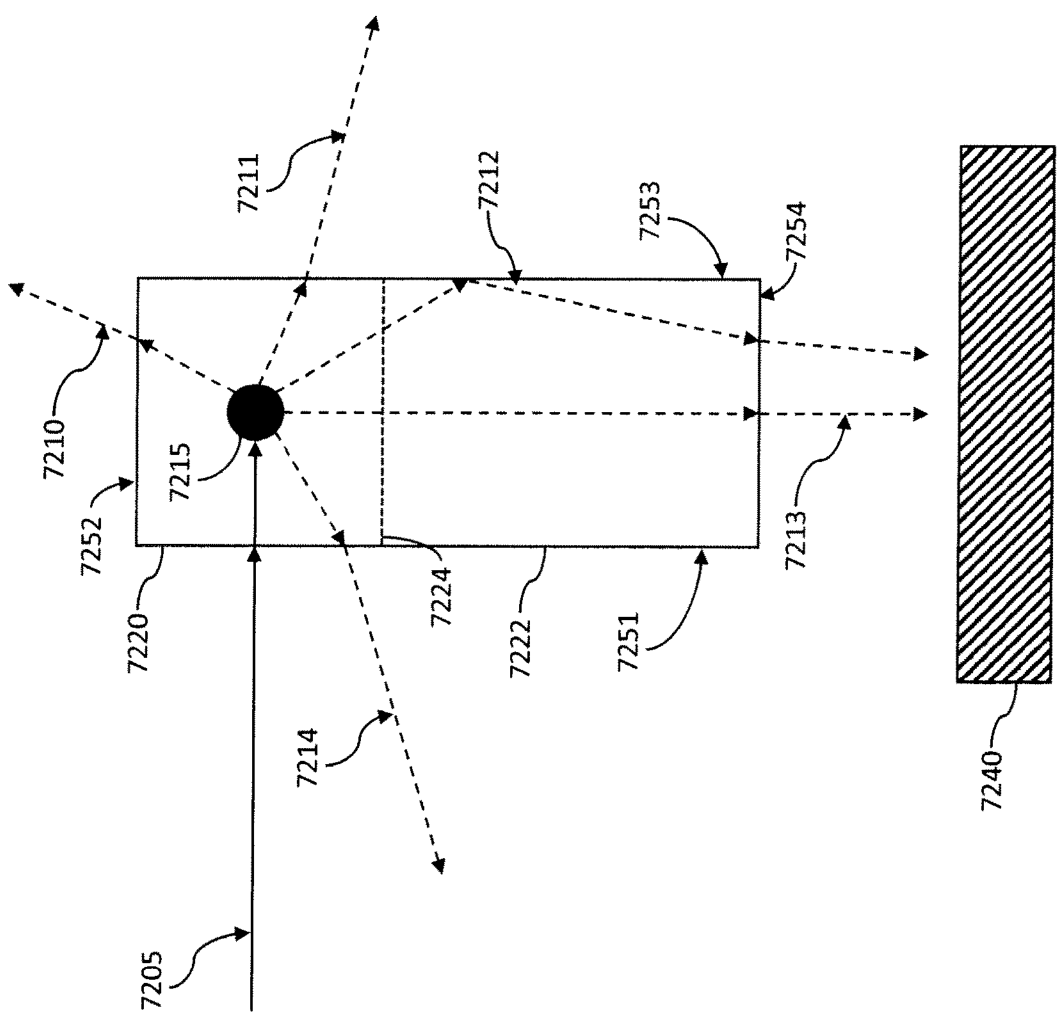
Figure 72B:
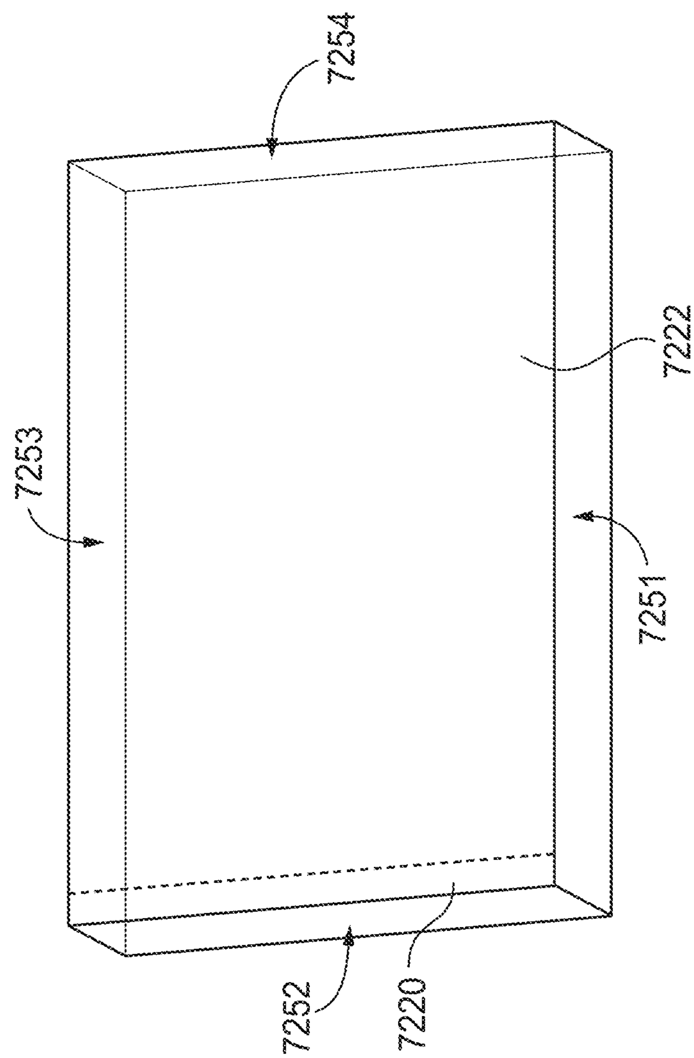
Figure 73A:
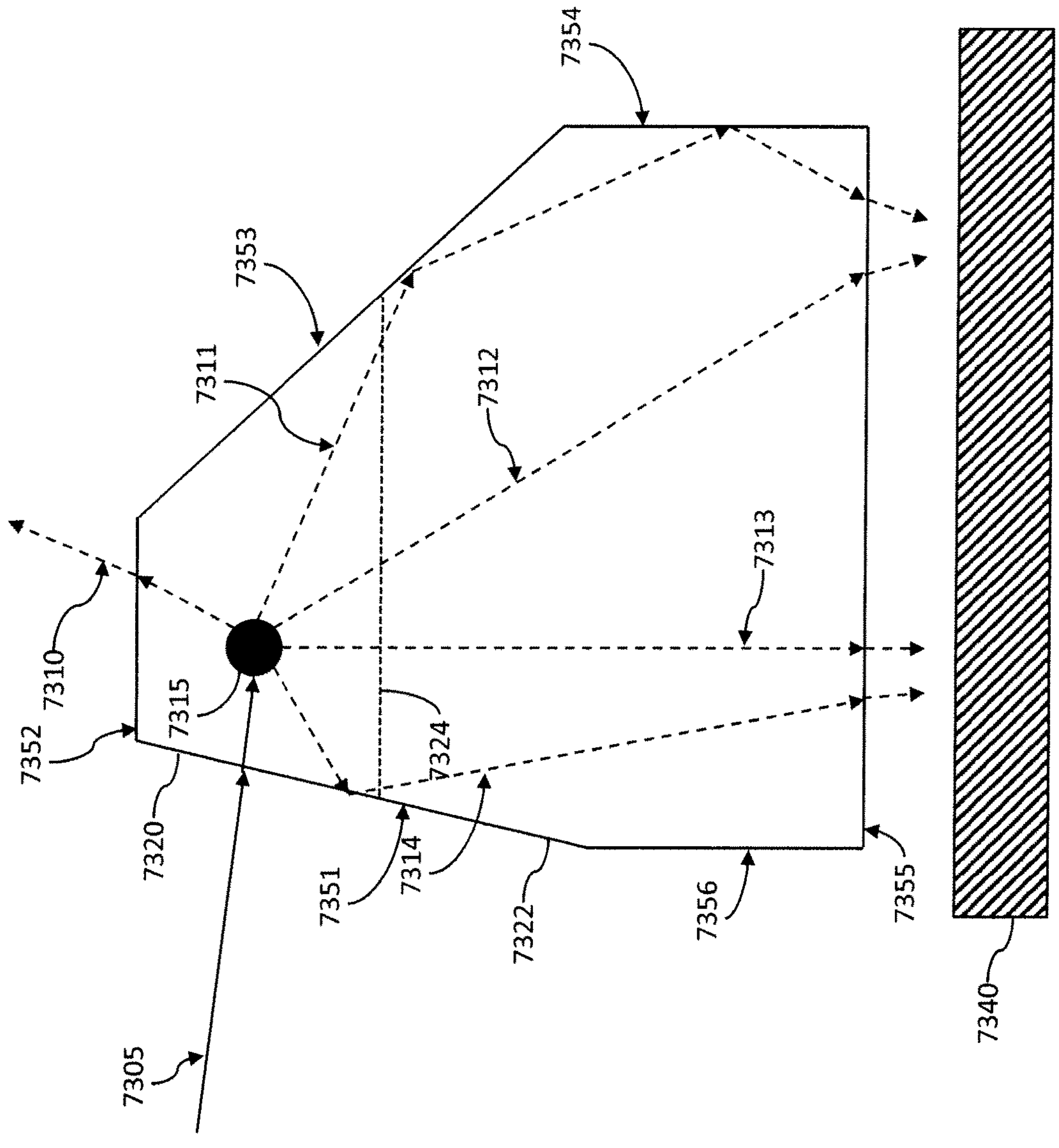
Figure 73B:
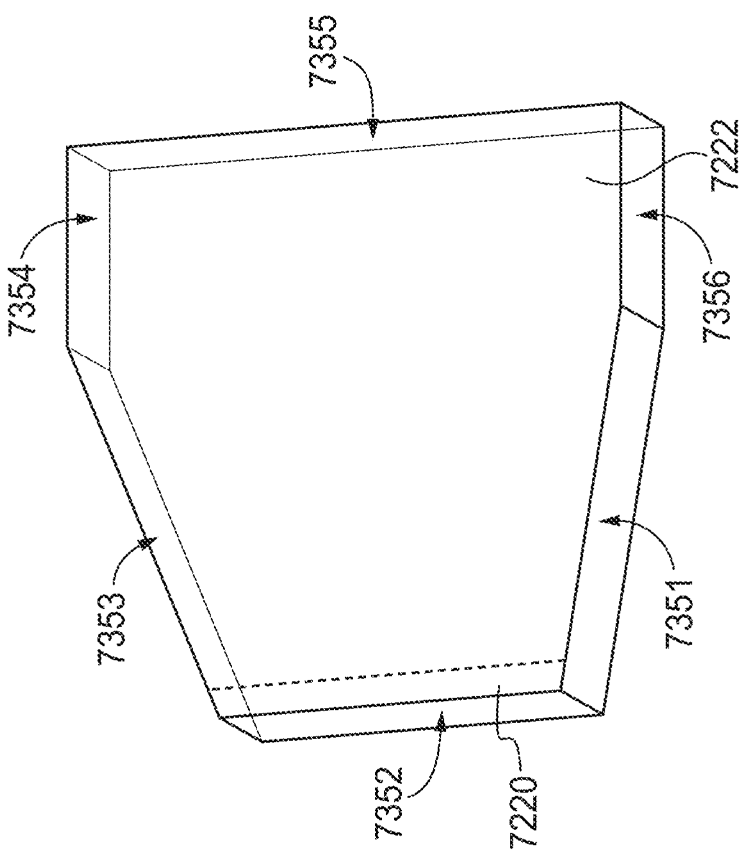
Figure 74A:
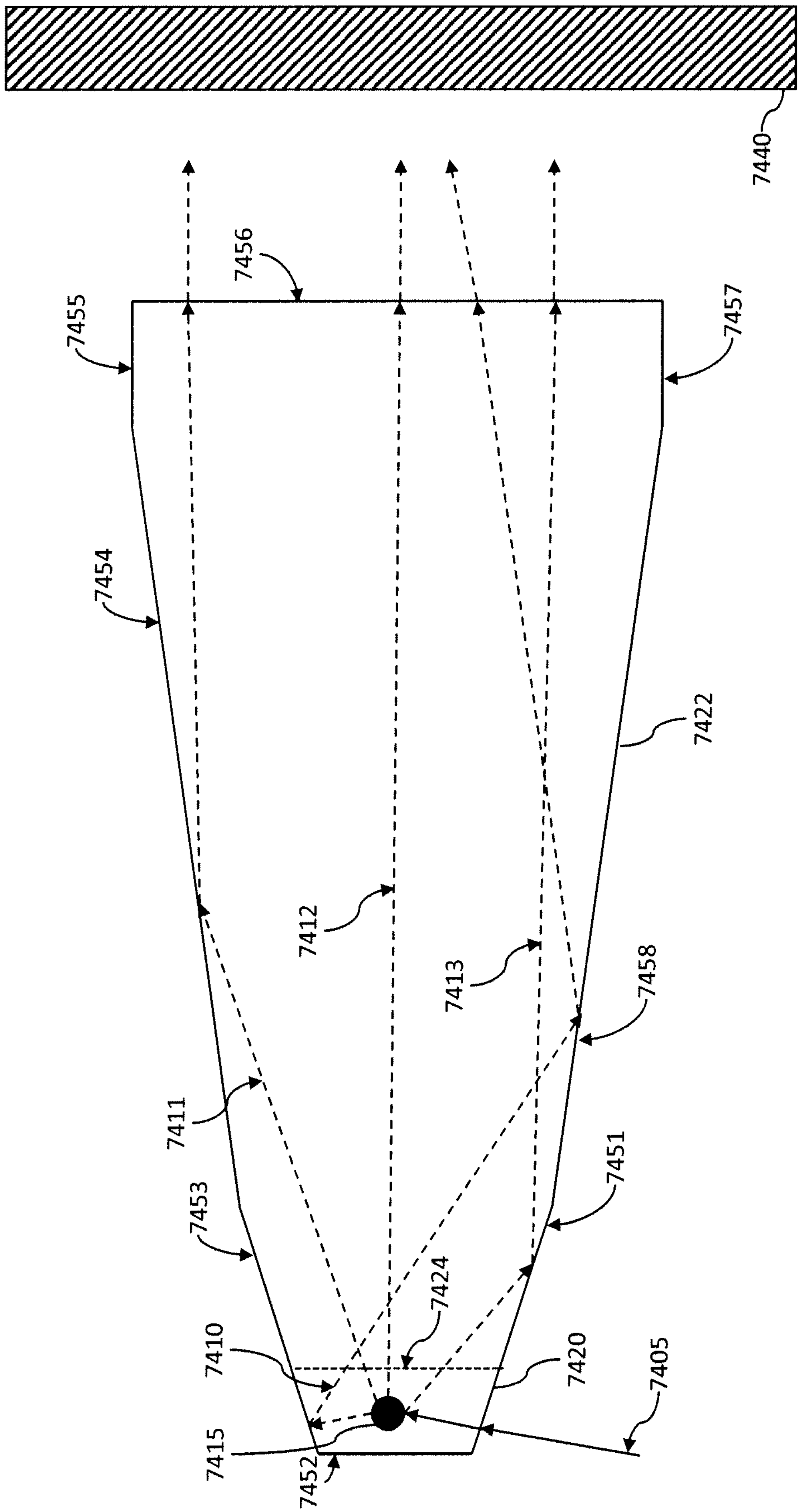
Figure 74B:
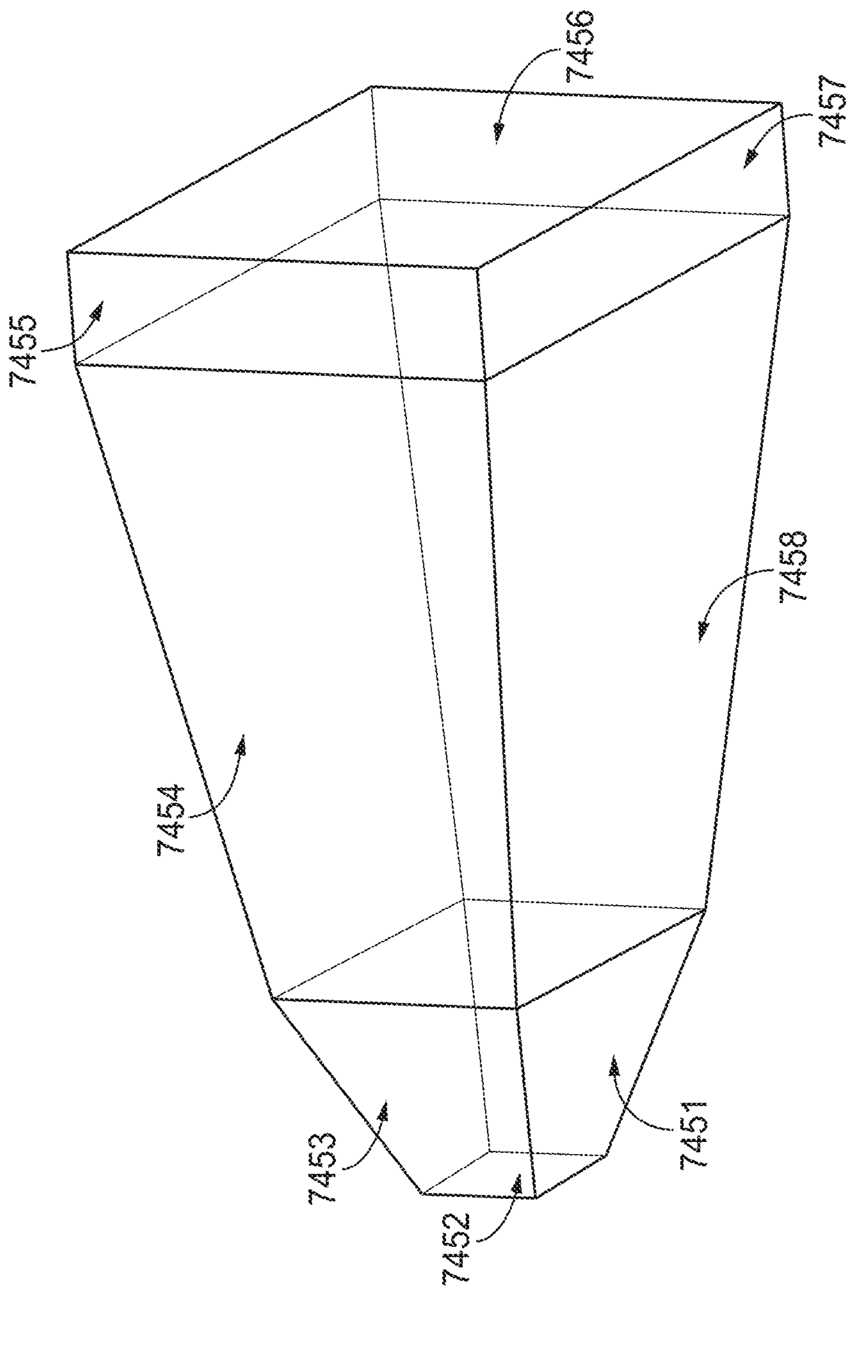
Figure 74E:
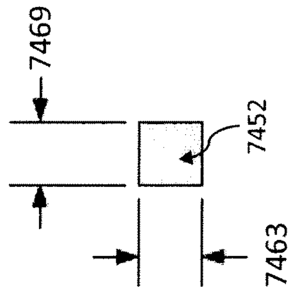
Figure 74D:
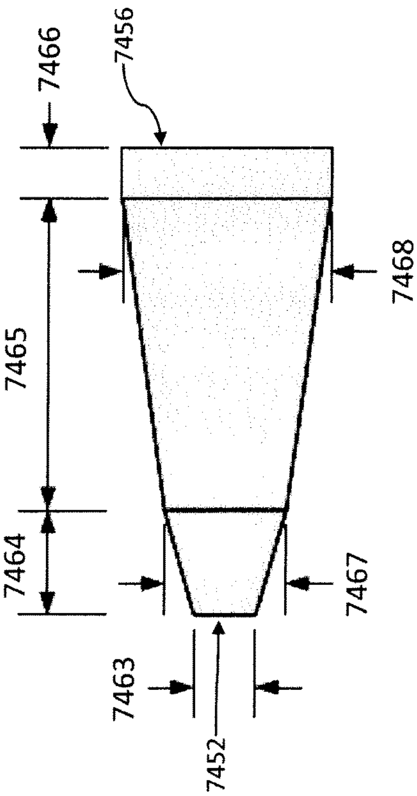
Figure 74C:
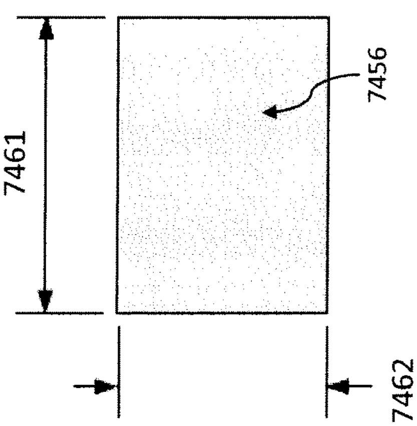
Figure 74F:
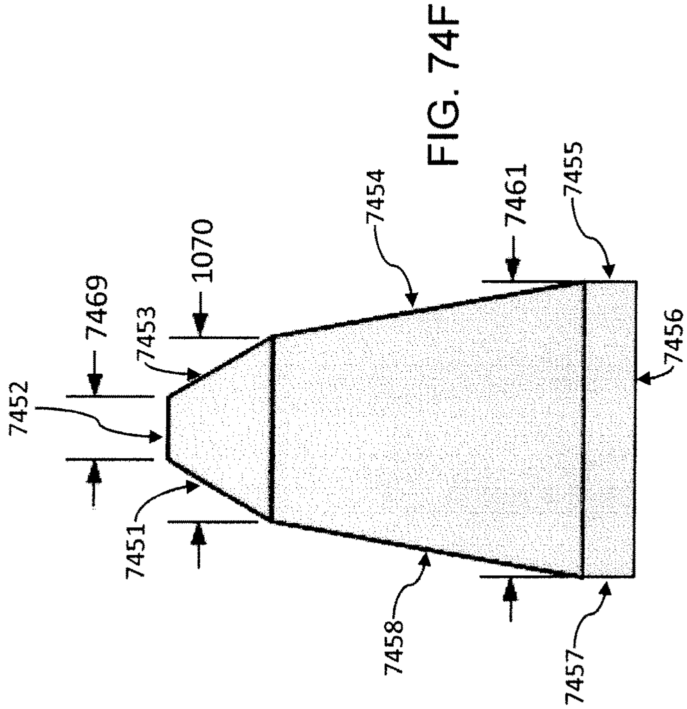
Figure 75:
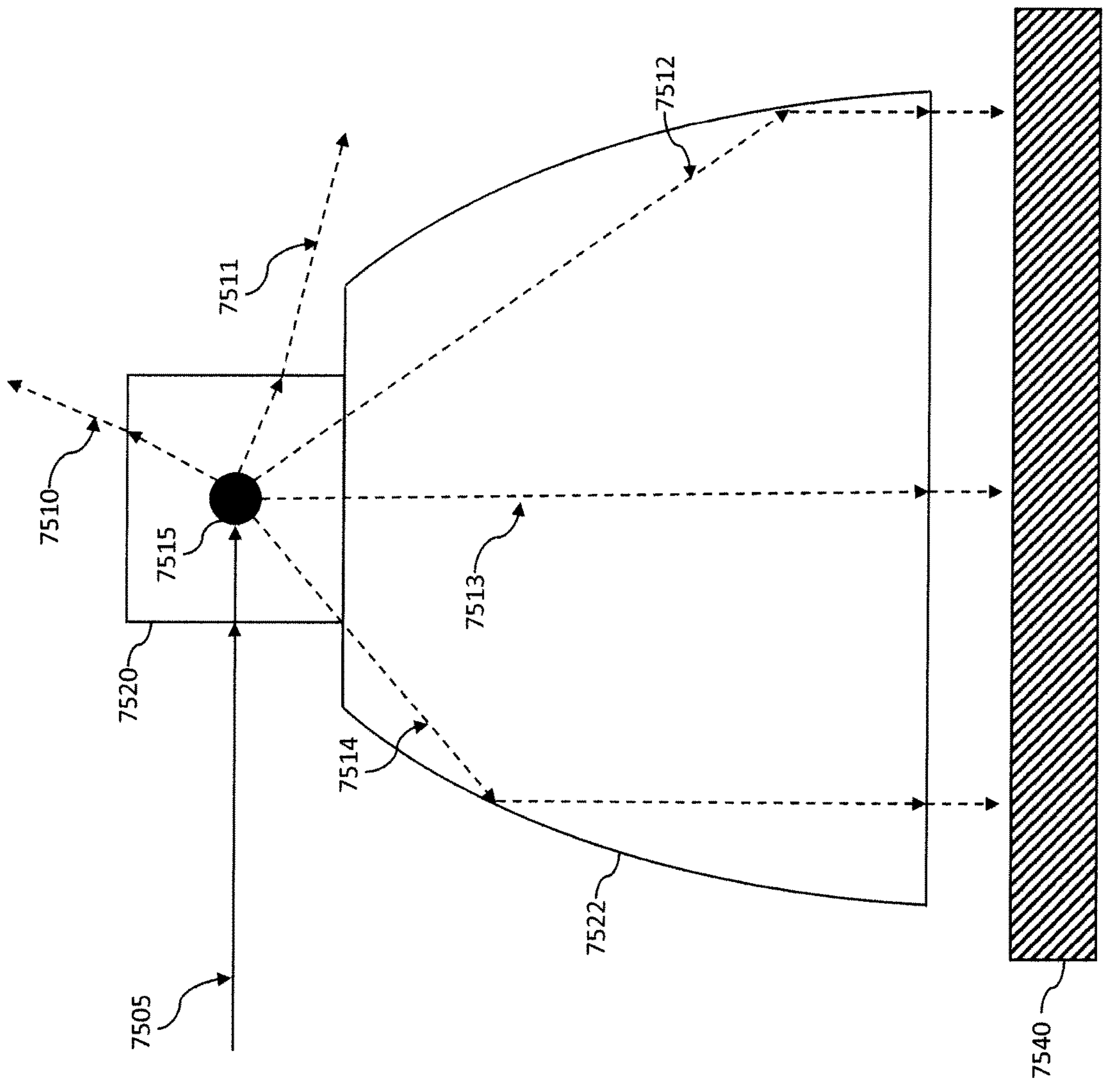
Figure 76:
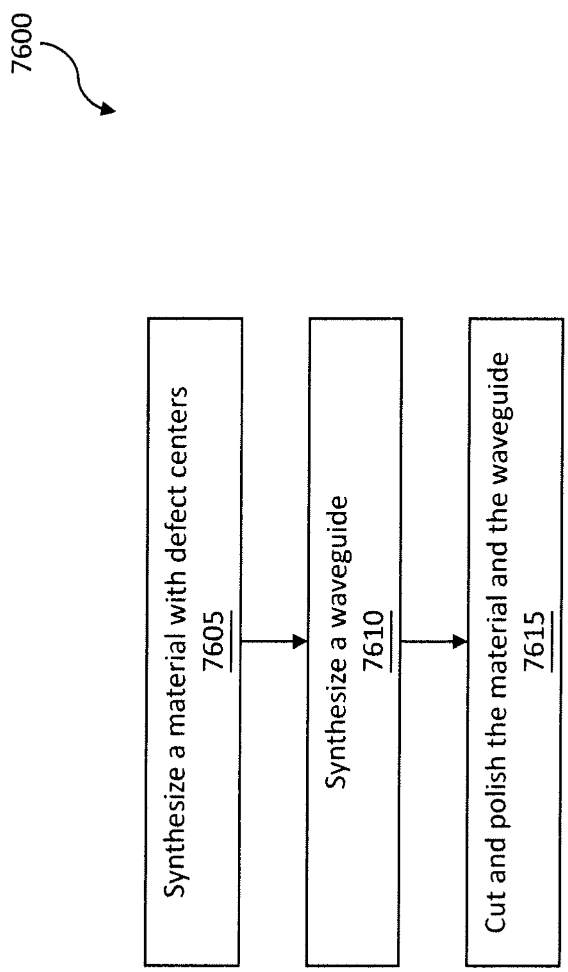
Figure 77:
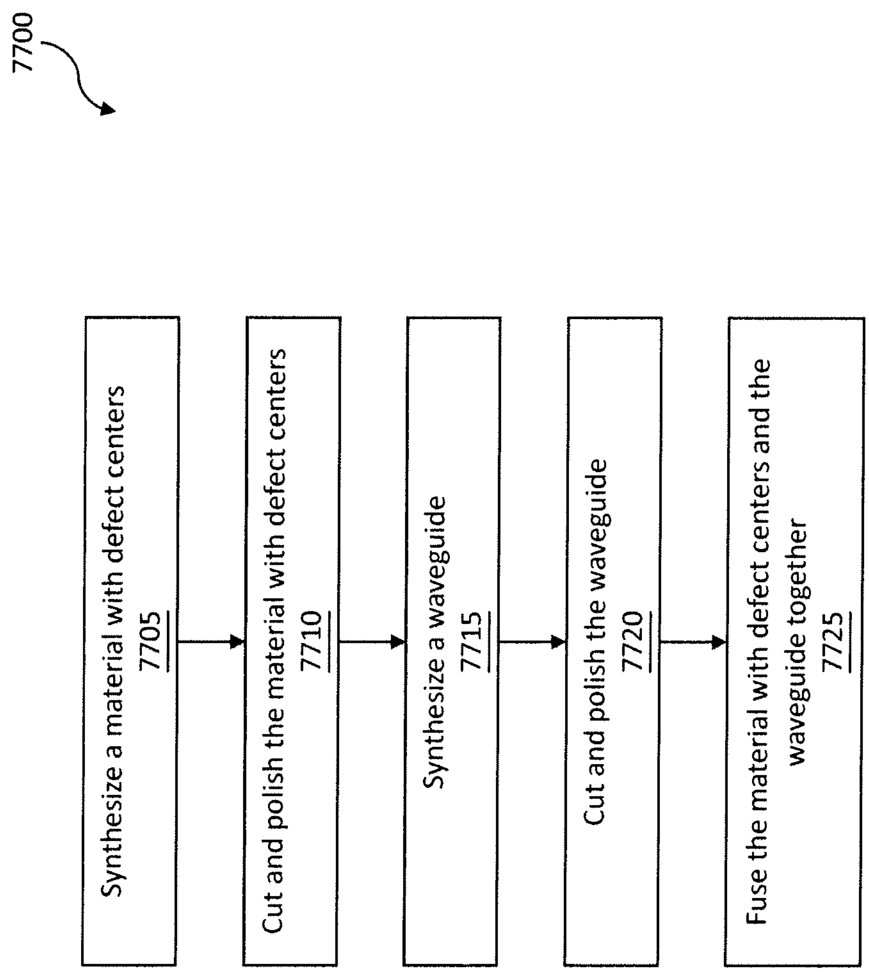

FIG. 71 is a diagram illustrating possible paths of light emitted from a material with defect centers in accordance with some illustrative embodiments;

FIG. 72A is a diagram illustrating possible paths of light emitted from a material with defect centers and a rectangular waveguide in accordance with some illustrative embodiments;

FIG. 72B is a three-dimensional view of the material and rectangular waveguide of FIG. 72A in accordance with some illustrative embodiments;

FIG. 73A is a diagram illustrating possible paths of light emitted from a material with defect centers and an angled waveguide in accordance with some illustrative embodiments;

FIG. 73B is a three-dimensional view of the material and angular waveguide of FIG. 73A in accordance with some illustrative embodiments;

FIG. 74A is a diagram illustrating possible paths of light emitted from a material with defect centers and a three-dimensional waveguide in accordance with some illustrative embodiments;

FIG. 74B is a three-dimensional view of the material and a three-dimensional waveguide of FIG. 74A in accordance with some illustrative embodiments;

FIG. 74C-74F are two-dimensional cross-sectional drawings of a three-dimensional waveguide in accordance with some illustrative embodiments;

FIG. 75 is a diagram illustrating a material attached to a waveguide in accordance with some illustrative embodiments;

FIG. 76 is a flow chart of a method of forming a material with a waveguide in accordance with some illustrative embodiments;

FIG. 77 is a flow chart of a method of forming a material with a waveguide in accordance with some illustrative embodiments;

Drift Error Compensation

Figure 78A:
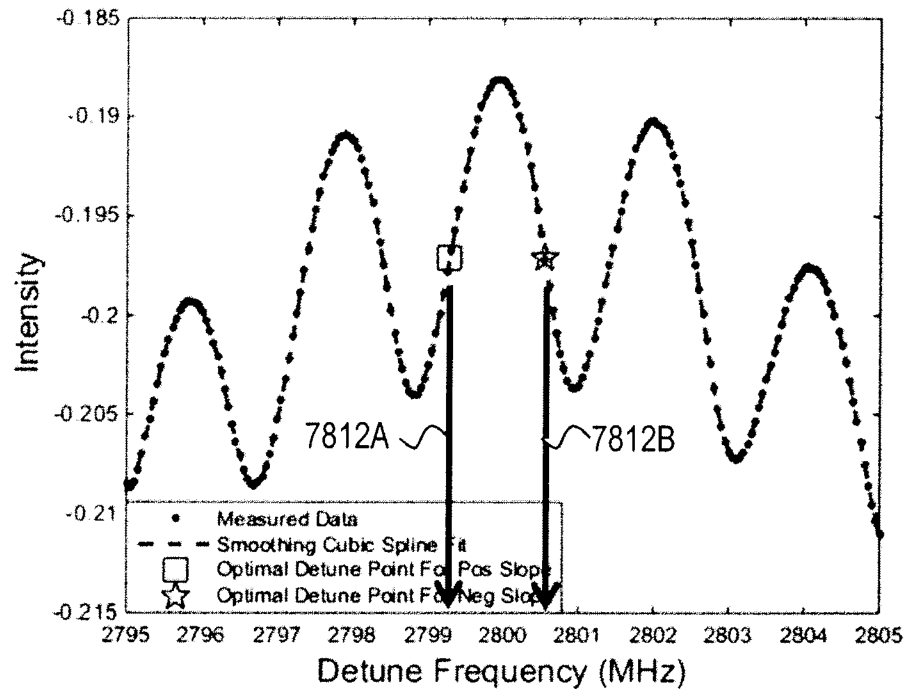
Figure 78B:
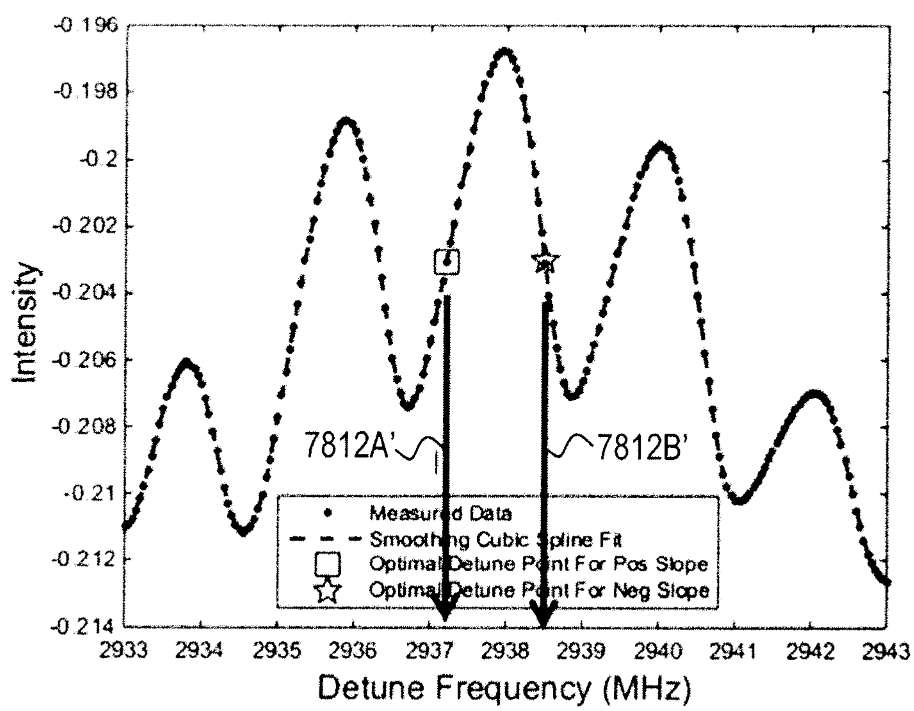
Figure 79A:
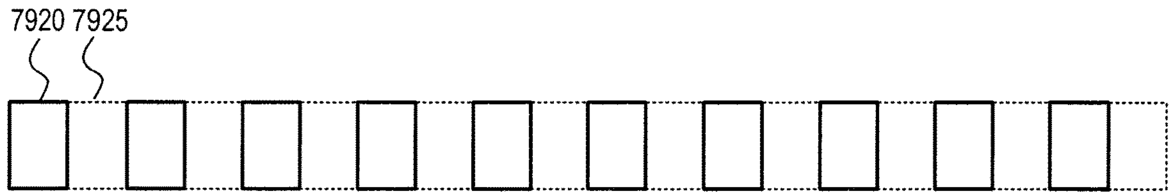
Figure 79B:
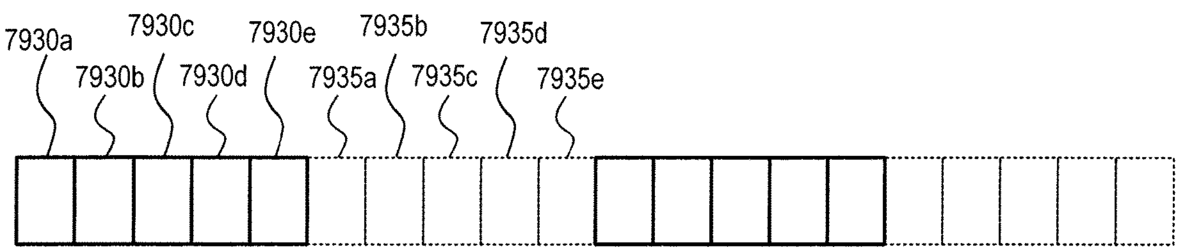
Figure 79C:
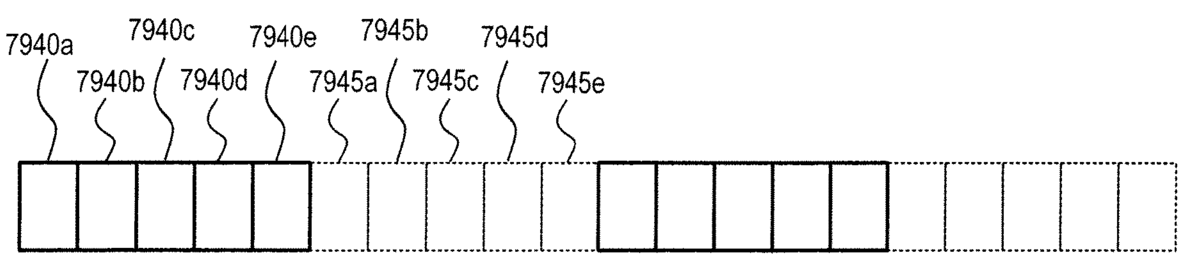

FIG. 78A is a graph illustrating fluorescence reduction as a function of an applied RF frequency for a positive spin state of an NV center orientation;

FIG. 78B is a graph illustrating fluorescence reduction as a function of an applied RF frequency for a negative spin state of the NV center orientation of FIG. 78A;

FIG. 79A illustrates a measurement collection scheme for vertical drift error compensation according to some embodiments;

FIG. 79B shows a measurement collection scheme for vertical drift error compensation according to some embodiments;

FIG. 79C shows a measurement collection scheme for horizontal drift error compensation according to some embodiments;

Thermal Drift Error Compensation

Figure 80:
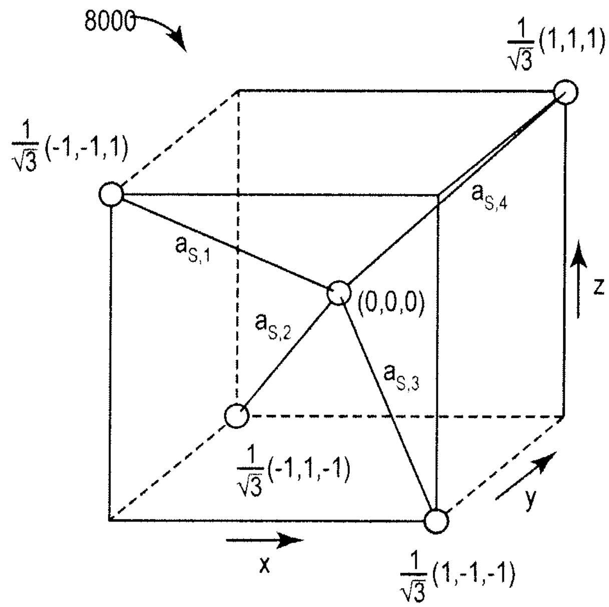
Figures 81A, 81B:
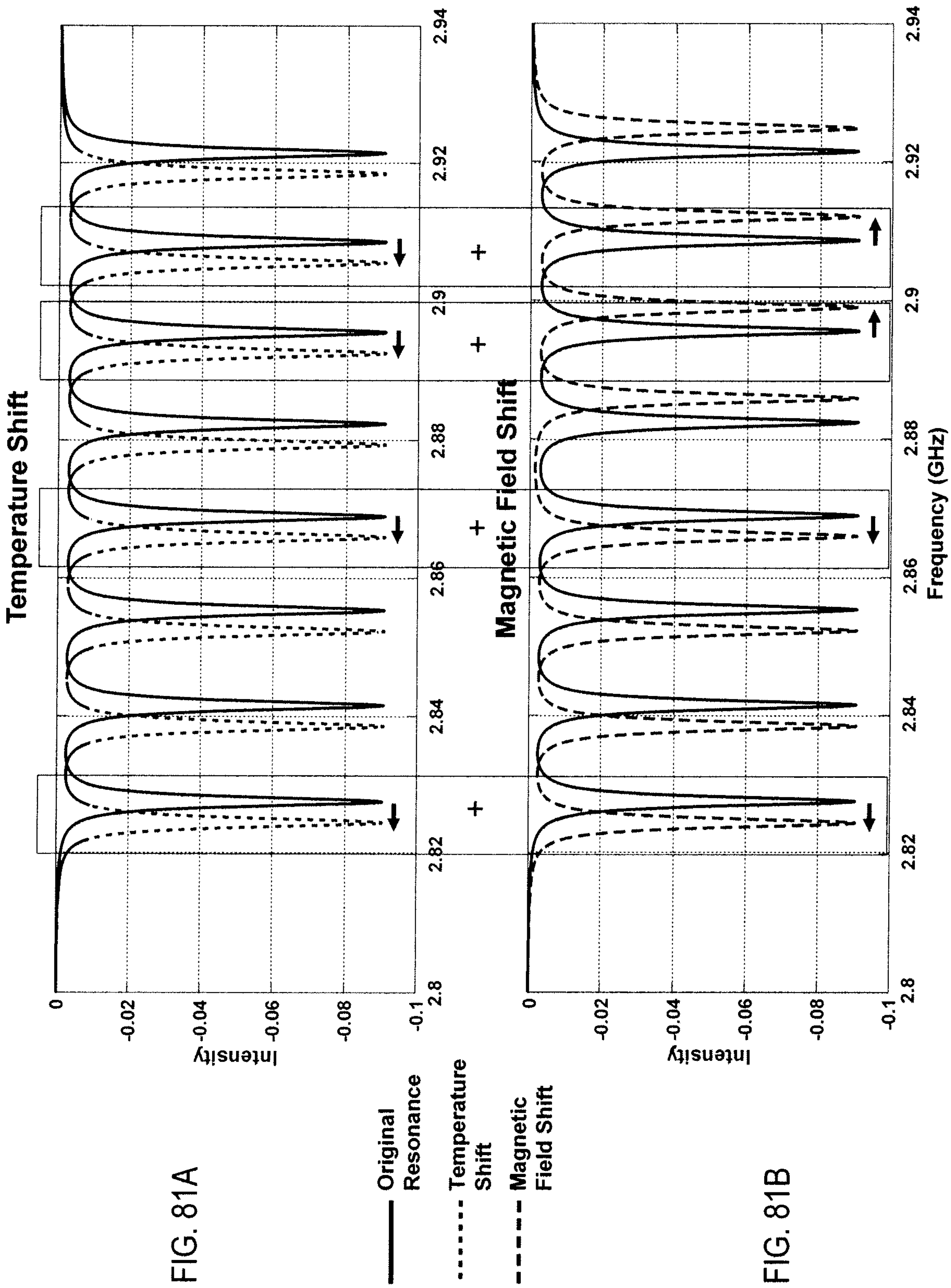
Figure 81C:
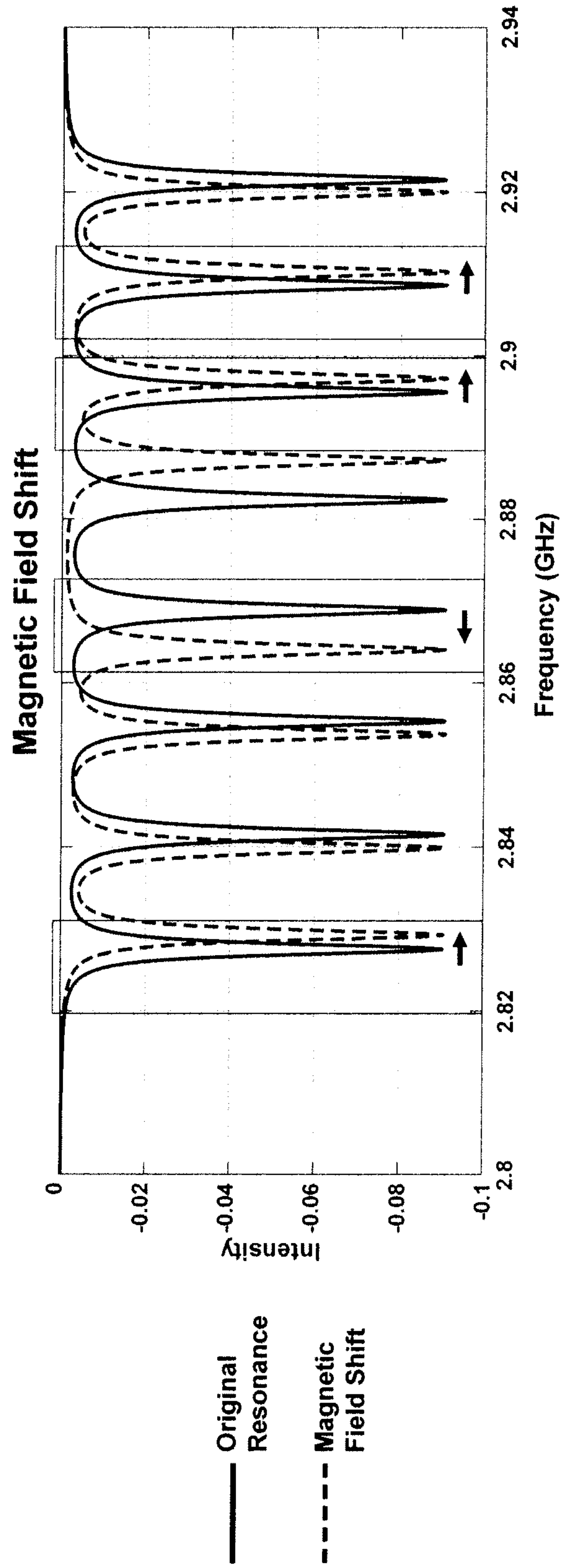

FIG. 80 is a unit cell diagram of the crystal structure of a diamond lattice having a standard orientation;

FIG. 81A is a graph illustrating two fluorescence curves as a function of RF frequency for two different temperatures where electron spin resonances 1, 4, 6 and 7 are selected in the case where the external magnetic field is aligned with the bias magnetic field;

FIG. 81B is a graph illustrating two fluorescence curves as a function of RF frequency for two different magnetic fields where electron spin resonances 1, 4, 6 and 7 are selected in the case where the external magnetic field is aligned with the bias magnetic field;

FIG. 81C is a graph illustrating two fluorescence curves as a function of RF frequency for two different magnetic fields where electron spin resonances 1, 4, 6 and 7 are selected in the case of a general external magnetic field;

Pulsed RF Methods of Continuous Wave Measurement

Figure 82:
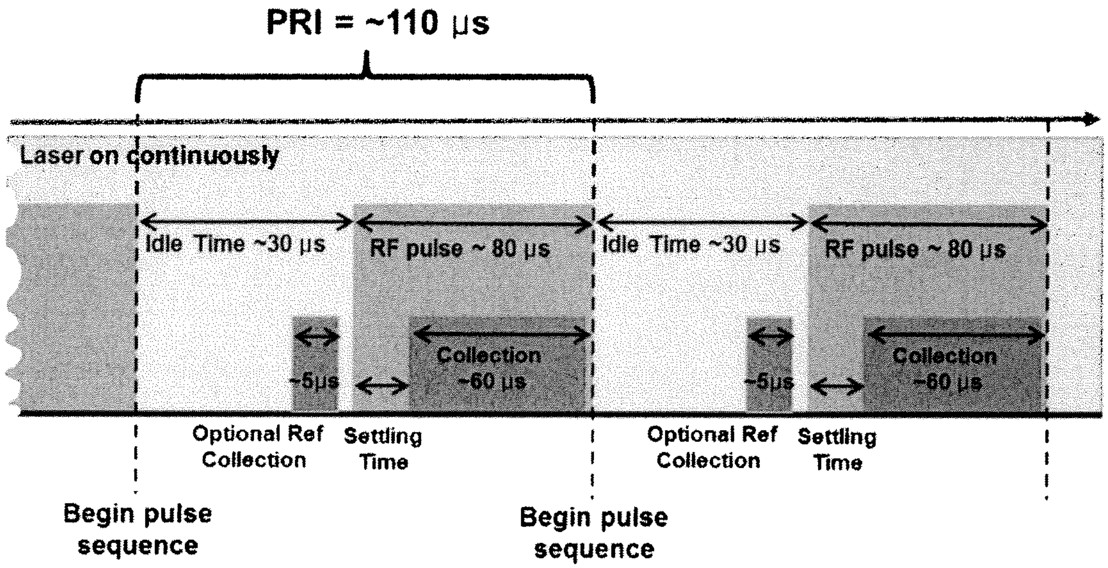
Figure 83:
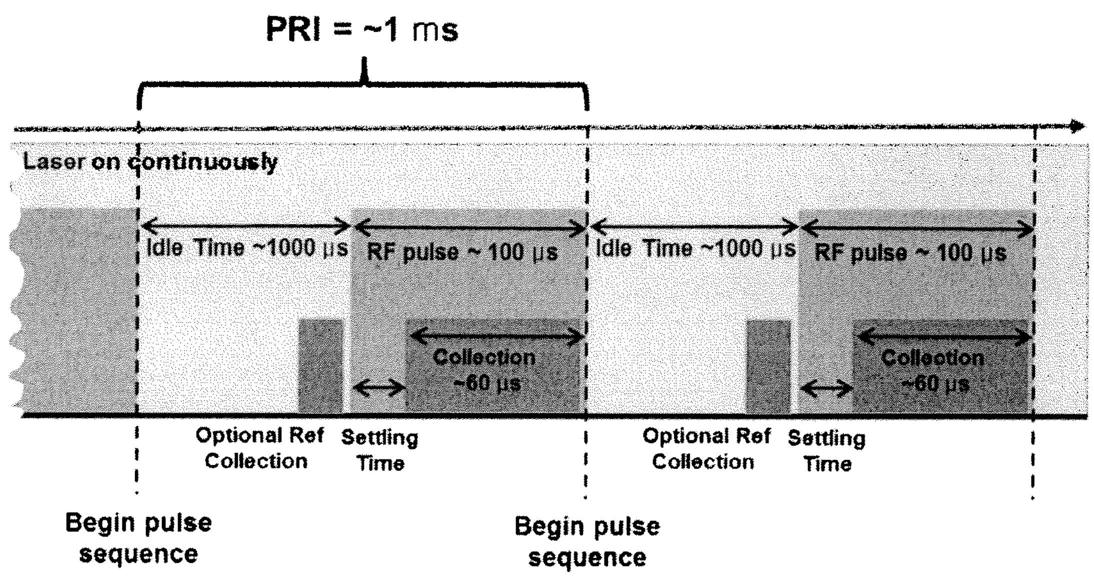

FIG. 82 illustrates a magneto-optical defect center material excitation scheme operating in CW Sit mode using a CW laser functioning throughout and a pulsed RF excitation source operating at a single frequency having a pulse repetition period of approximately 110 μs;

FIG. 83 illustrates a magneto-optical defect center material excitation scheme operating in CW Sweep mode using a CW laser functioning throughout and a pulsed RF excitation source swept at different frequencies having a pulse repetition period of approximately 1100 μs;

High Speed Sequential Cancellation for Pulsed Mode

Figure 5:
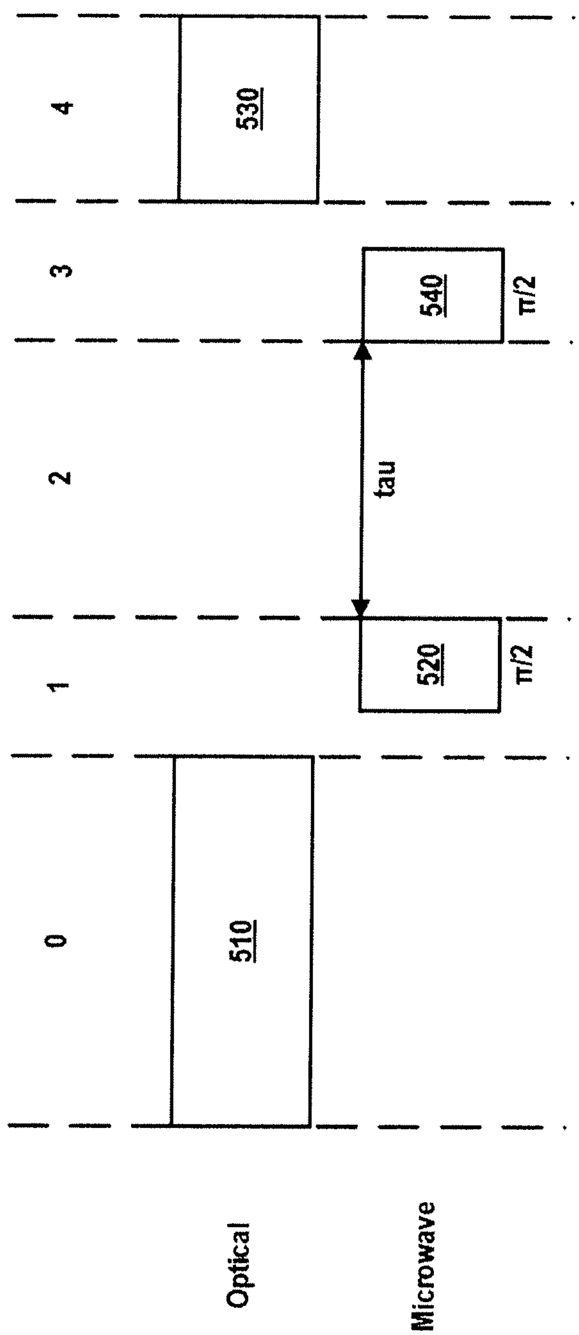
FIG. 5 is a schematic illustrating a Ramsey sequence of optical excitation pulses and RF excitation pulses.
Figure 84:
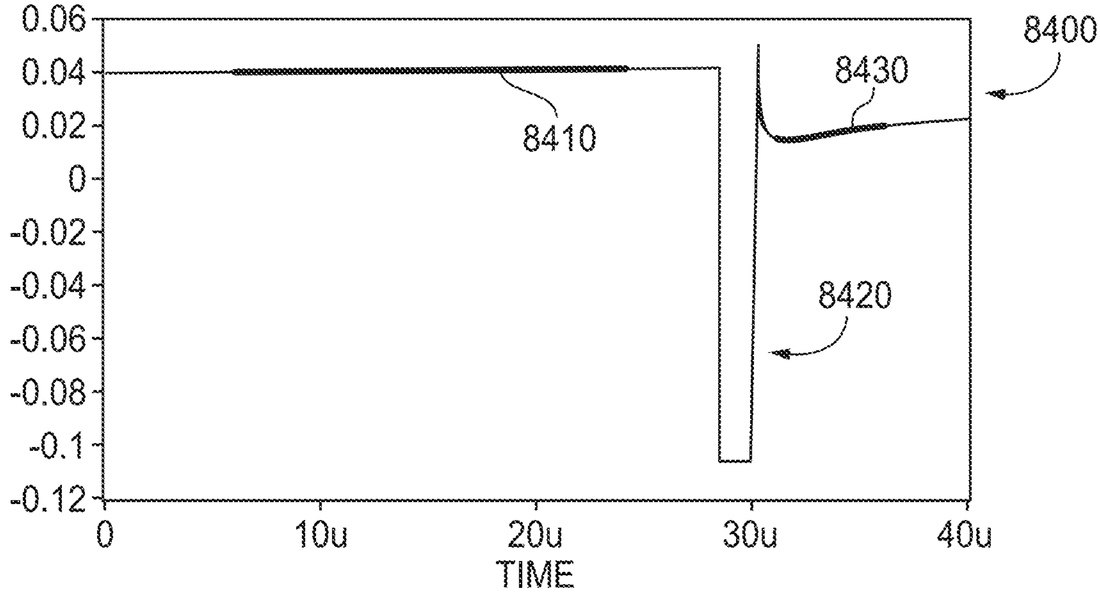
Figure 85:
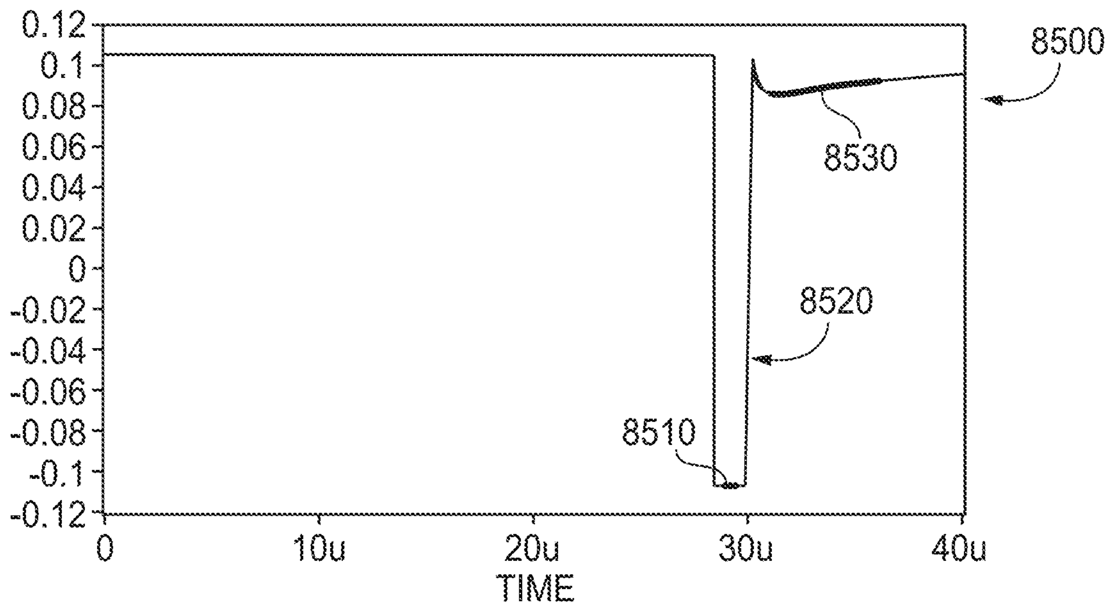
Figure 86:
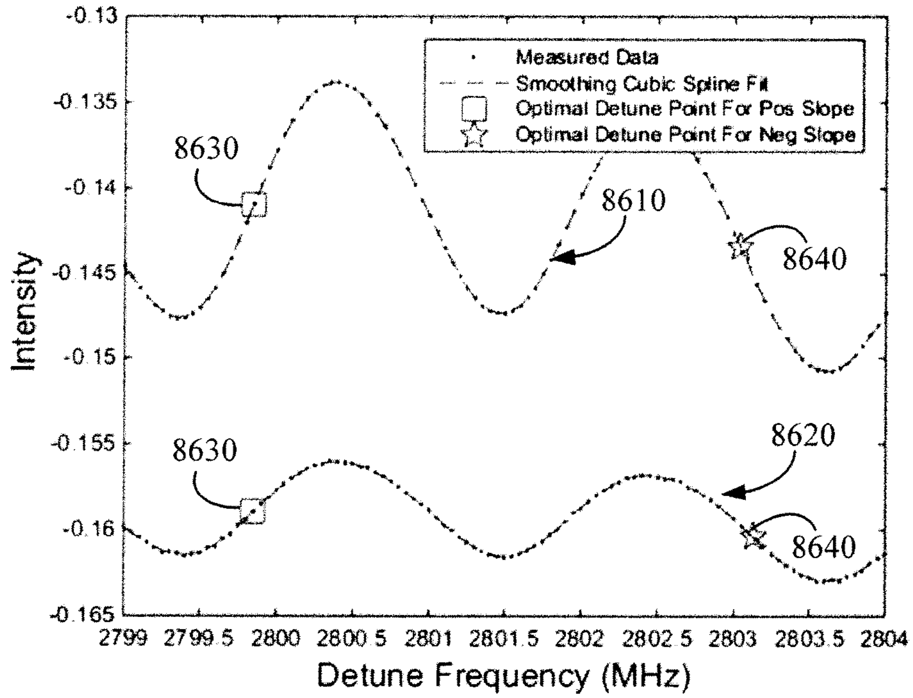
Figure 87:
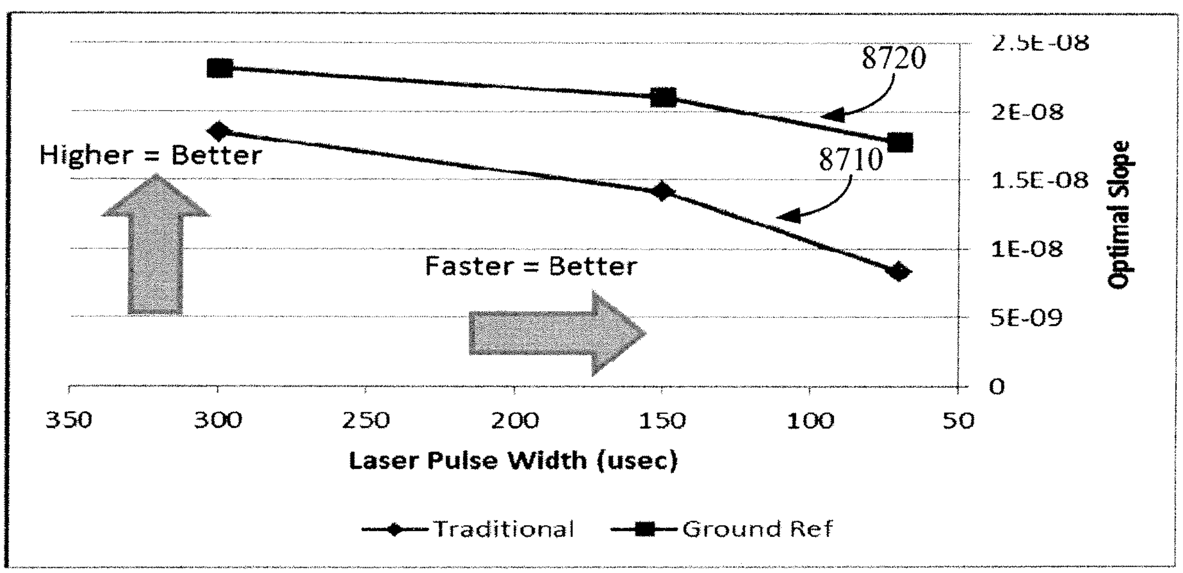
Figure 88:
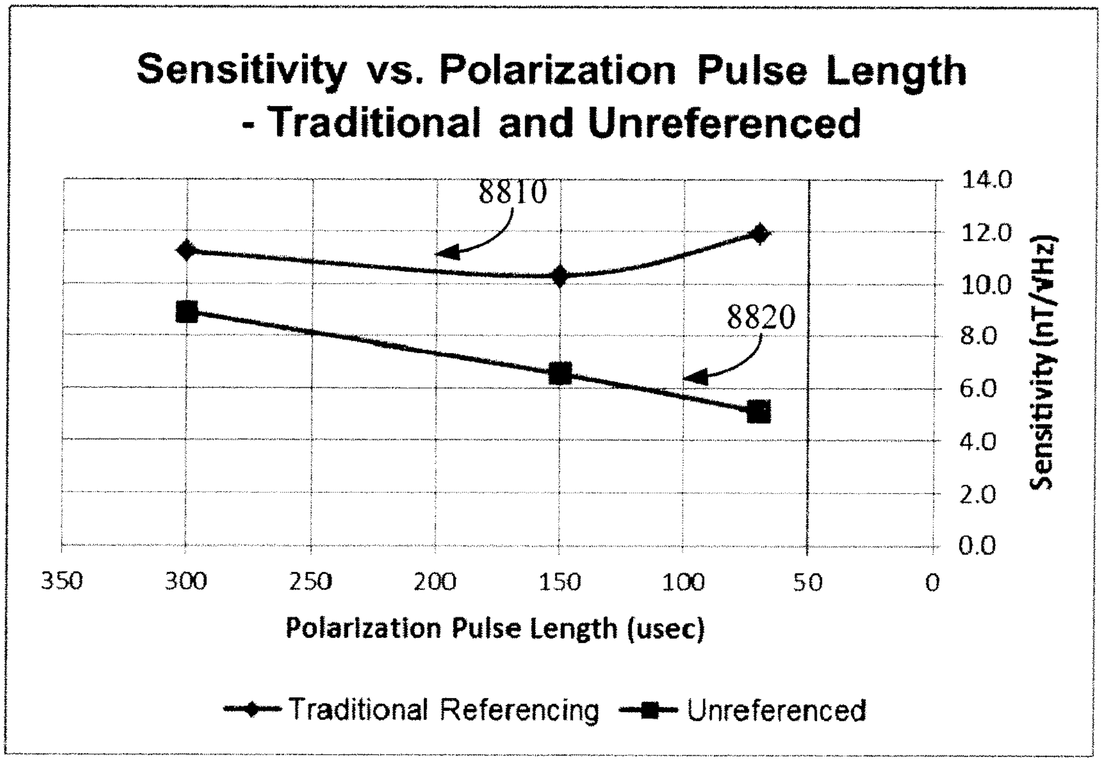
Figure 89:
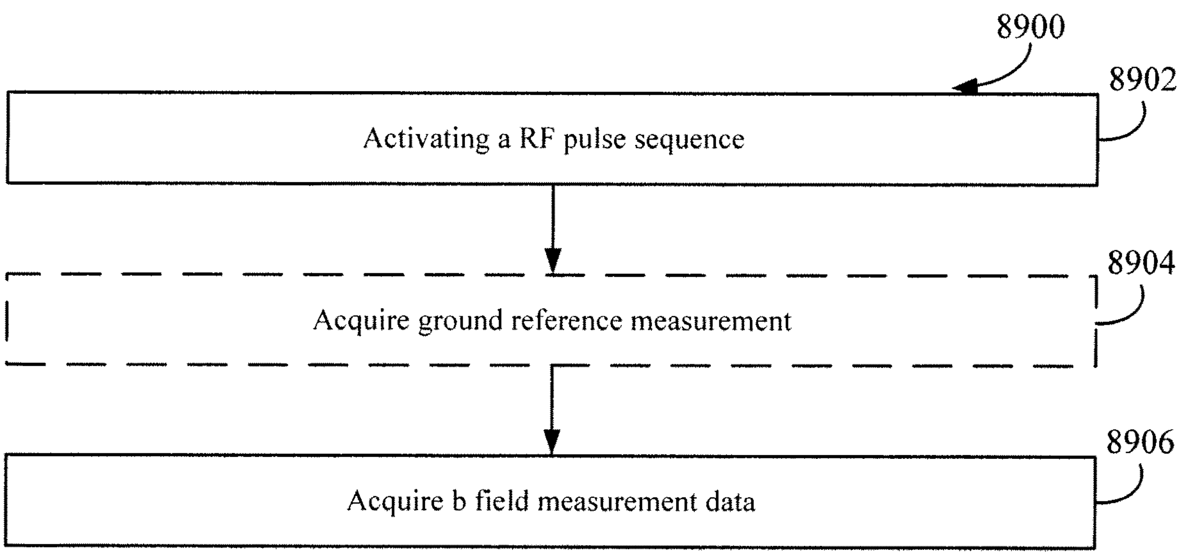

FIG. 84 is a graphical diagram of a magnetometer system using a reference signal acquisition prior to RF pulse excitation sequence and measured signal acquisition;

FIG. 85 is a graphical diagram of a magnetometer system omitting the reference signal acquisition of FIG. 5 prior to RF pulse excitation sequence and measured signal acquisition;

FIG. 86 is a graphical diagram depicting a reference signal intensity relative to detune frequency and a measured signal intensity relative to detune frequency;

FIG. 87 is a graphical diagram depicting a slope relative to laser pulse width for a system implementing a reference signal and a system omitting the reference signal;

FIG. 88 is a graphical diagram depicting a sensitivity relative to polarization pulse length for a system implementing a reference signal and a system omitting the reference signal;

FIG. 89 is a process diagram for operating a magnetometer without using a reference signal;

Photodetector Circuit Saturation Mitigation

Figure 90:
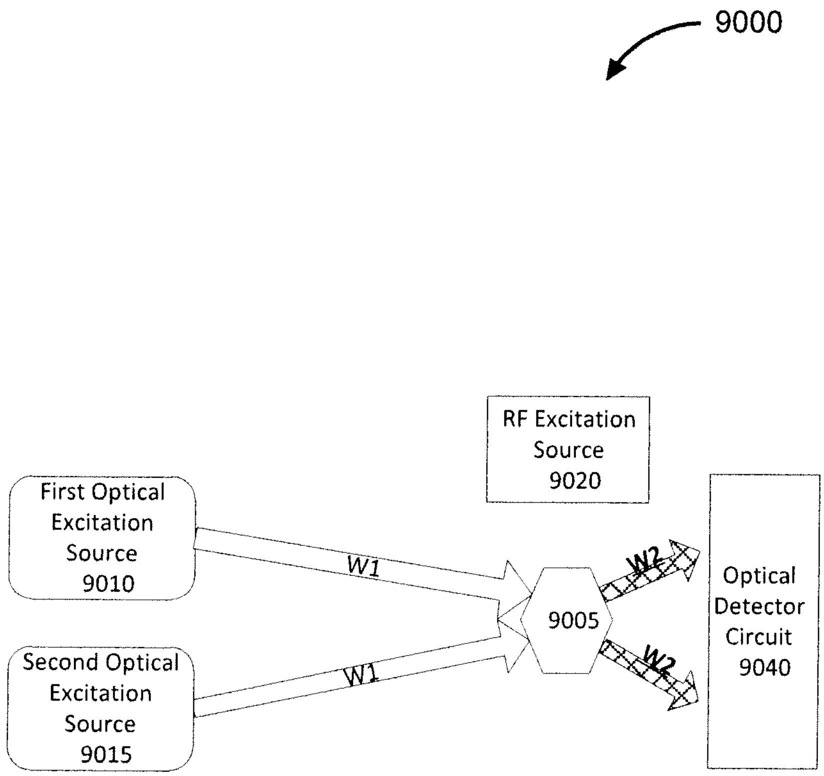
Figure 91:
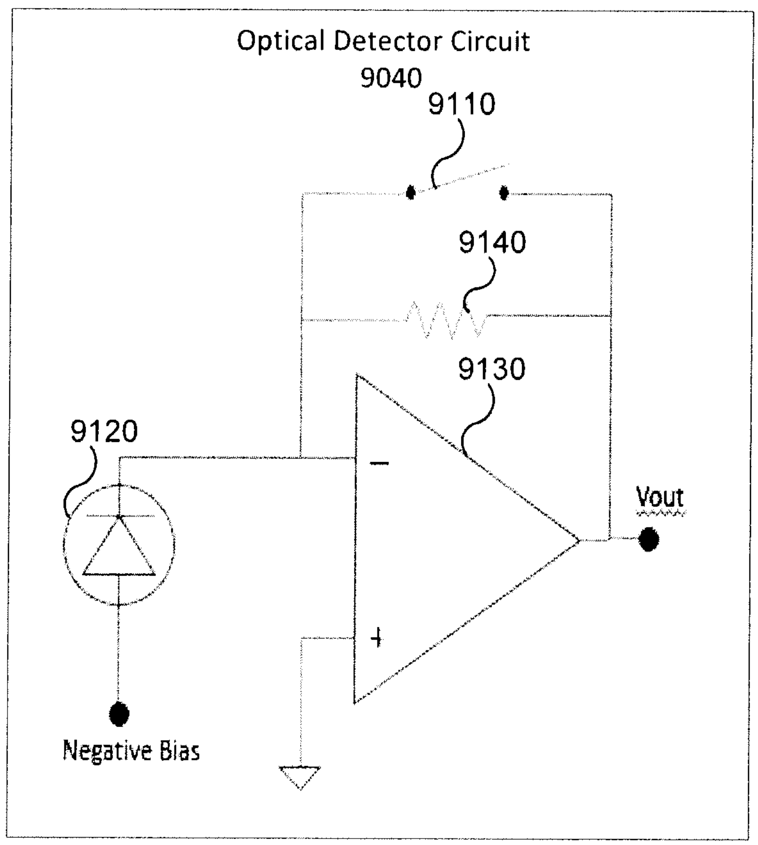
Figure 92:
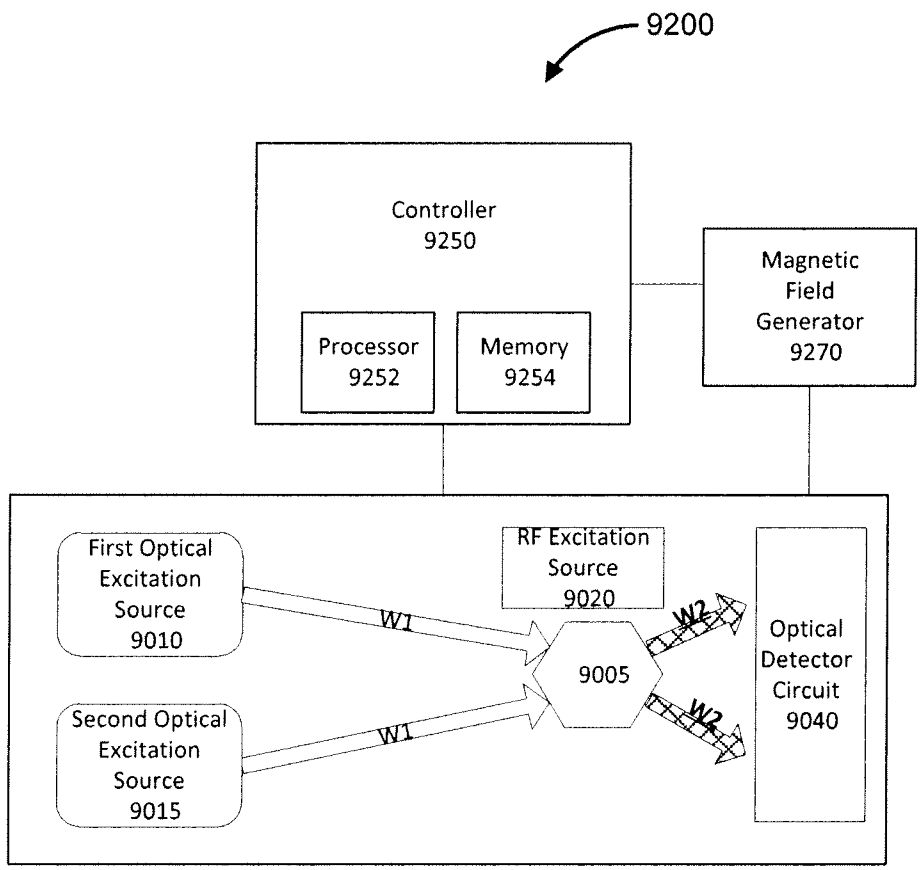
Figure 93A:
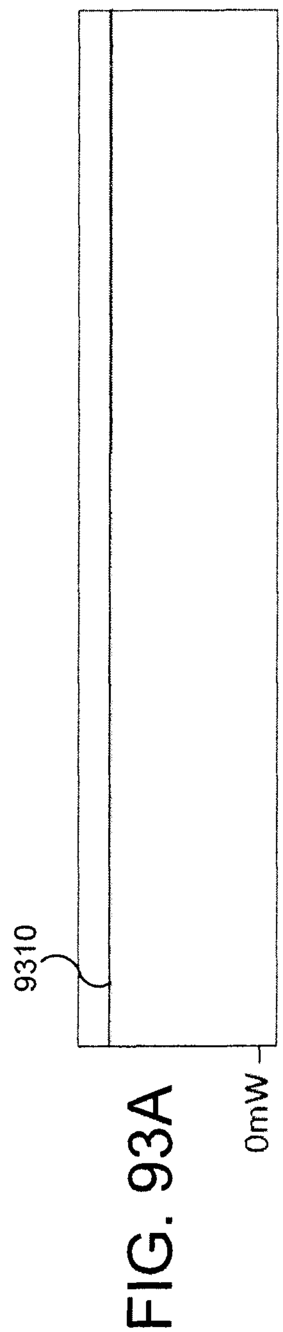
Figure 93B:
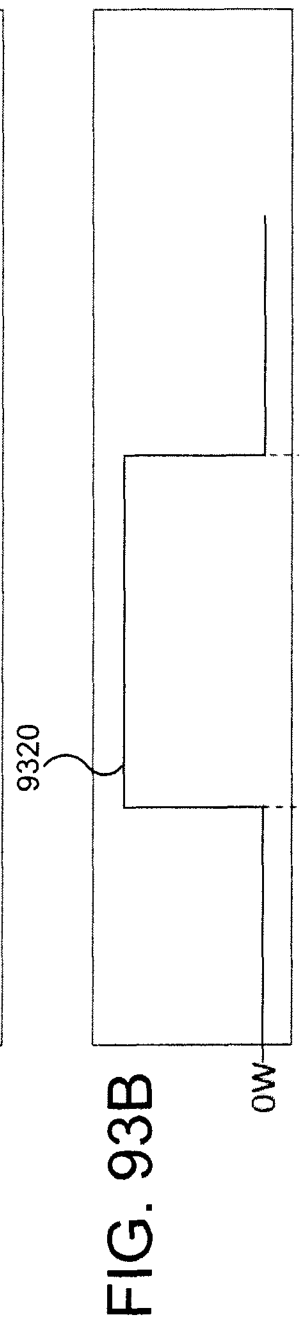
Figures 93C, 93D:
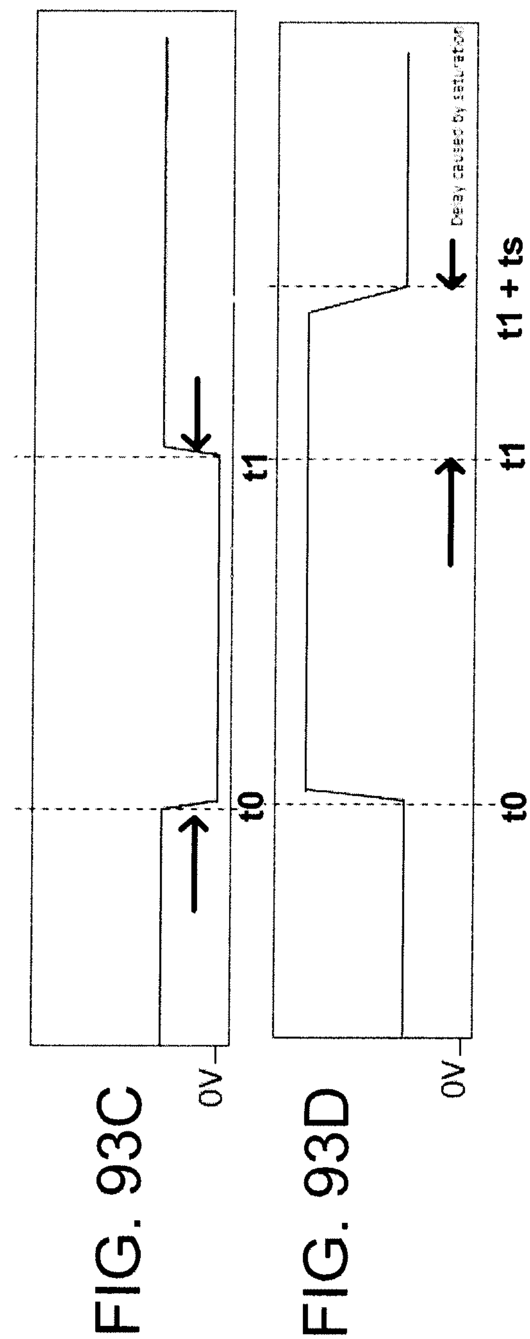
Figure 94:
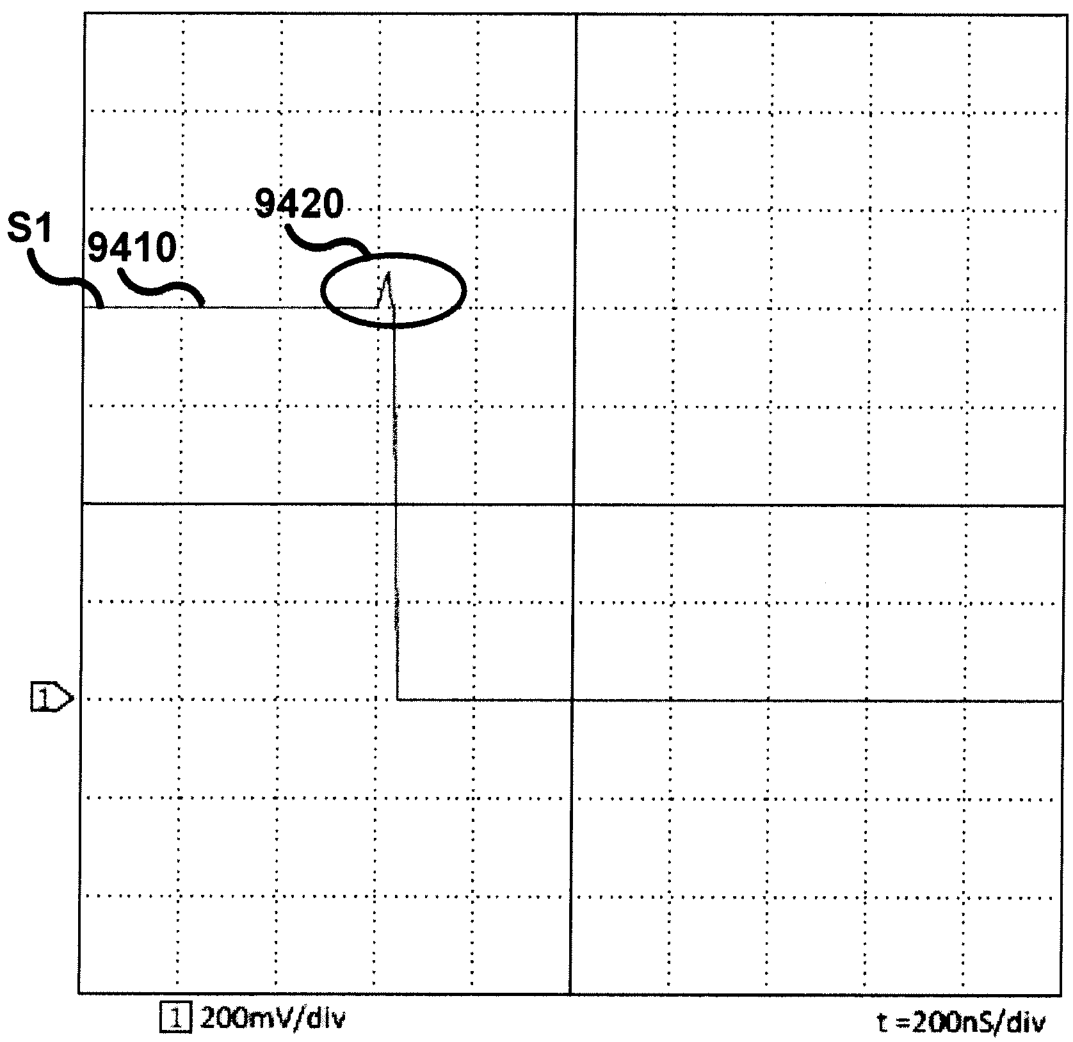
Figure 95:
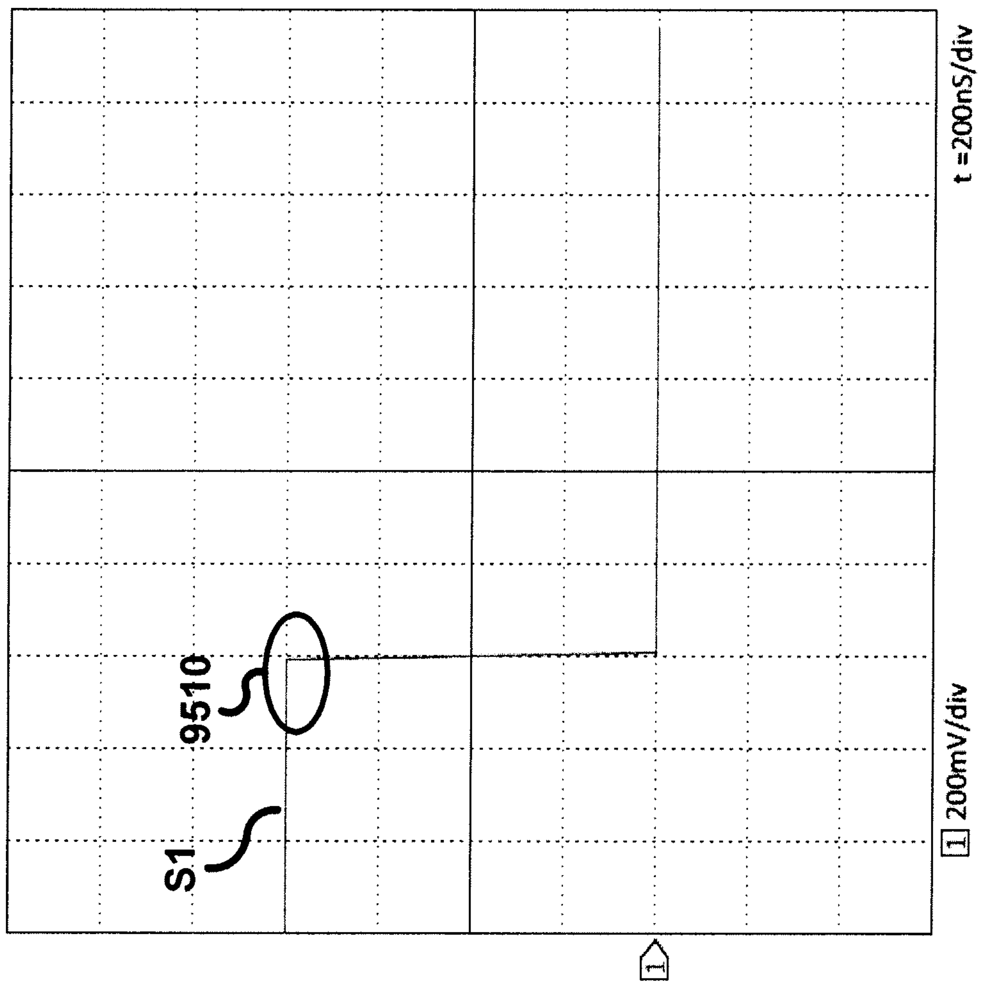

FIG. 90 is a schematic block diagram of some embodiments of a circuit saturation mitigation system;

FIG. 91 is a schematic block diagram of some embodiments of an optical detection circuit;

FIG. 92 is a schematic block diagram of some embodiments of system for a circuit saturation mitigation system;

FIG. 93A is a diagram of the power output of a low intensity light signal according to some embodiments;

FIG. 93B is a diagram of the power output of a high intensity light signal according to some embodiments;

FIG. 93C is a diagram of the voltage output according to some embodiments;

FIG. 93D is a diagram of the voltage output according to some embodiments;

FIG. 94 is a diagram of the voltage output of an optical detection circuit according to some embodiments;

FIG. 95 is a diagram of the voltage output of an optical detection circuit according to some embodiments;

Shifted Magnetometry Adapted Cancellation for Pulse Sequence

Figure 96:
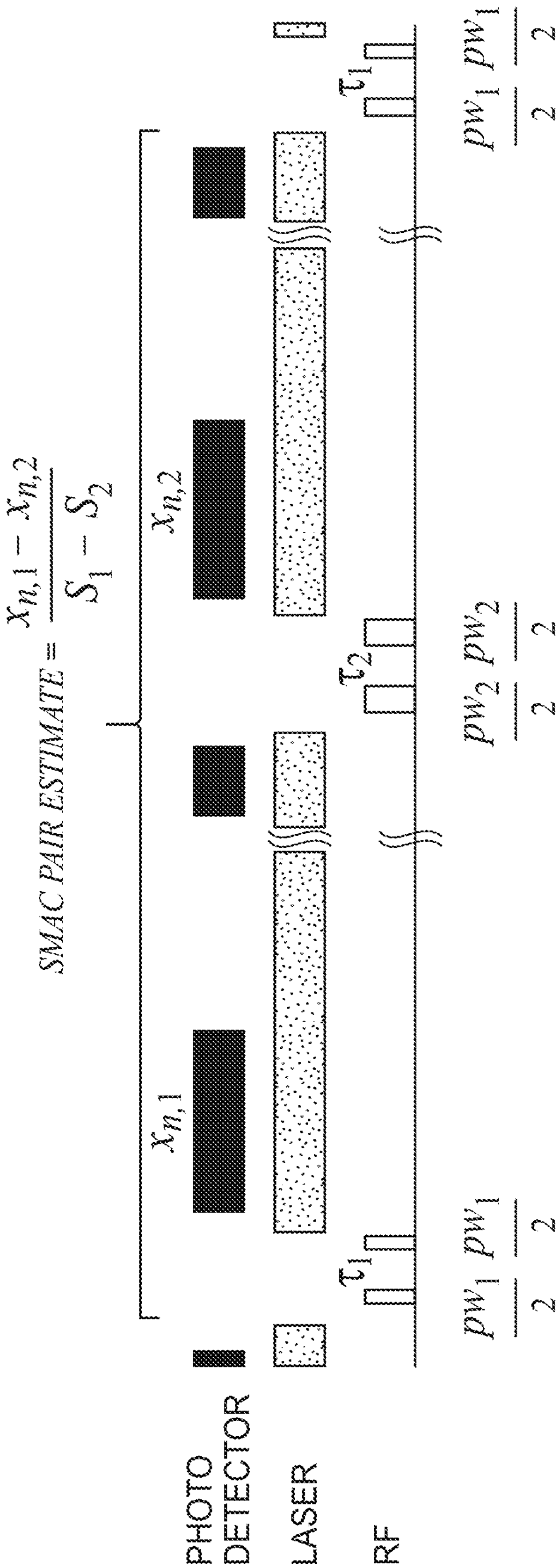
Figure 97A:
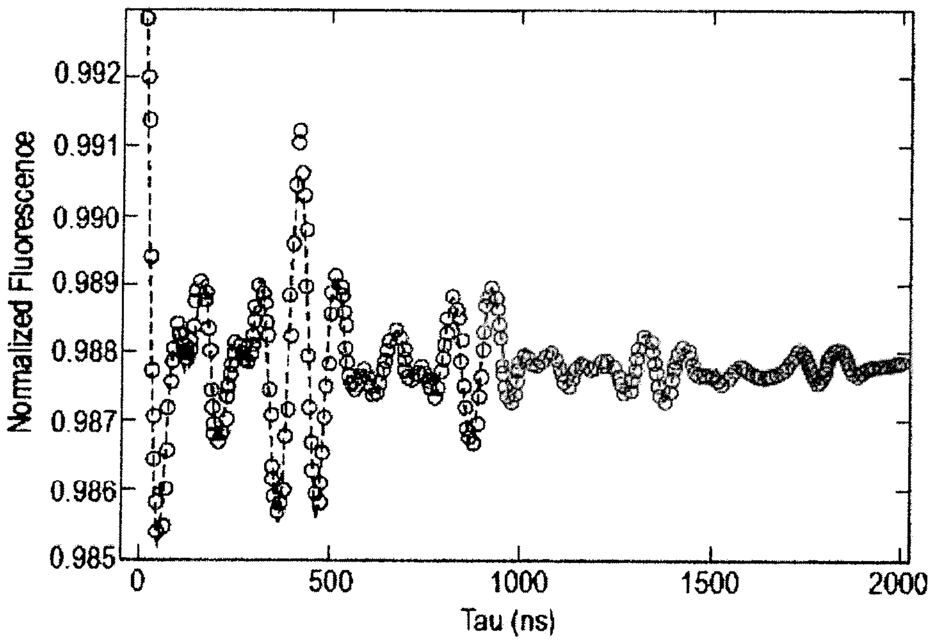
Figure 97B:
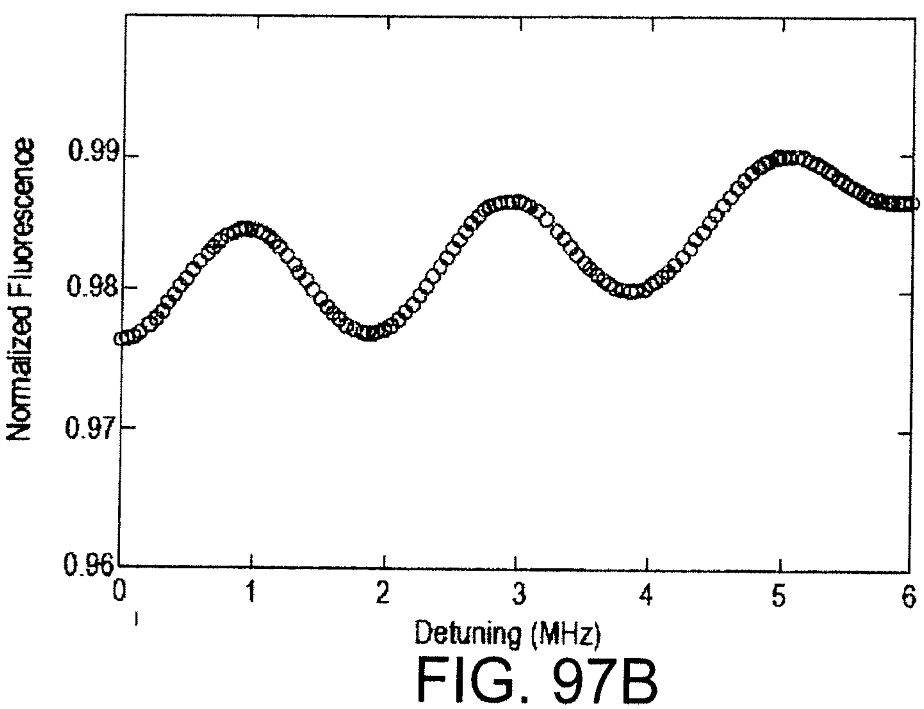
Figure 98:
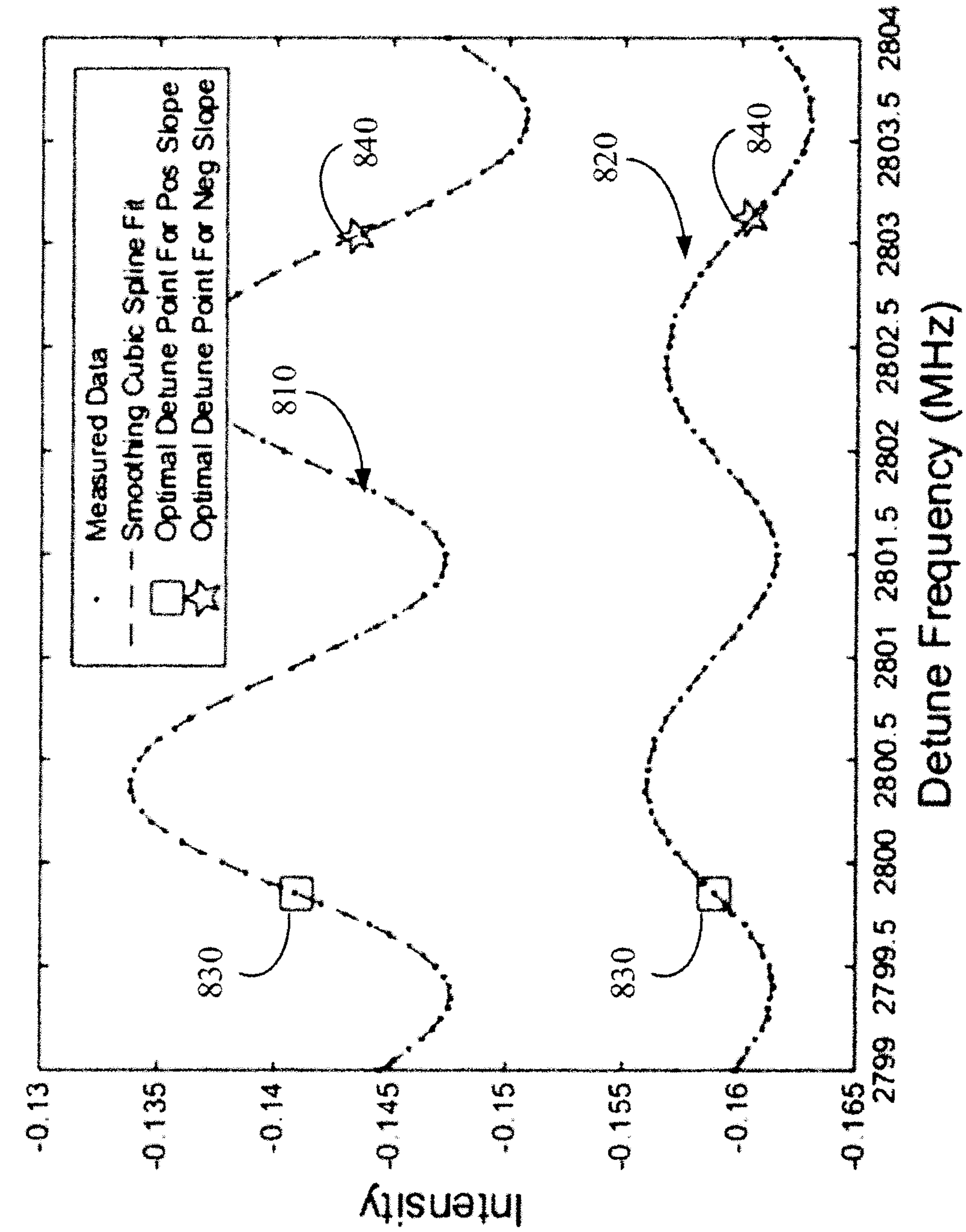
Figure 99:
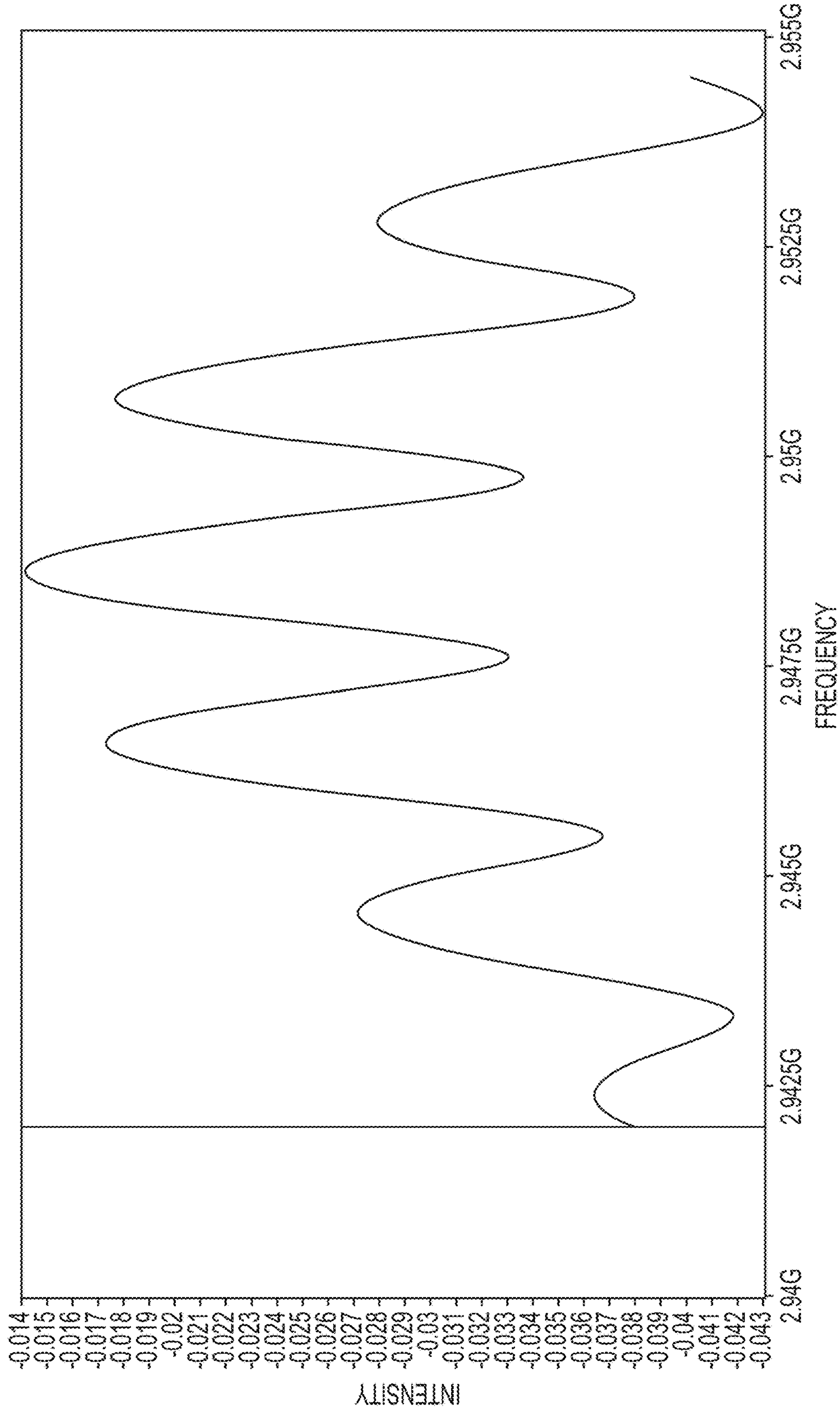
Figure 100:
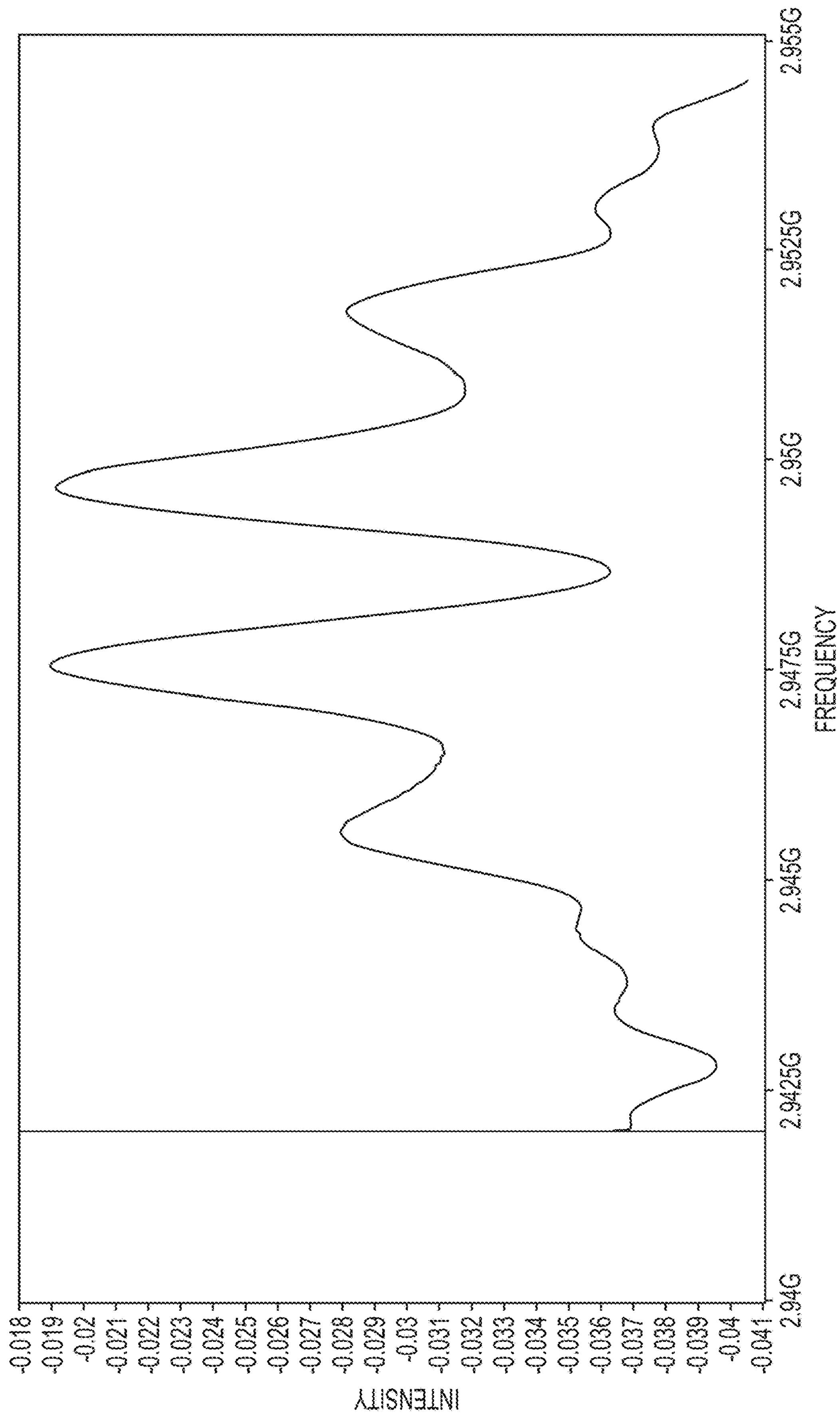
Figure 101:
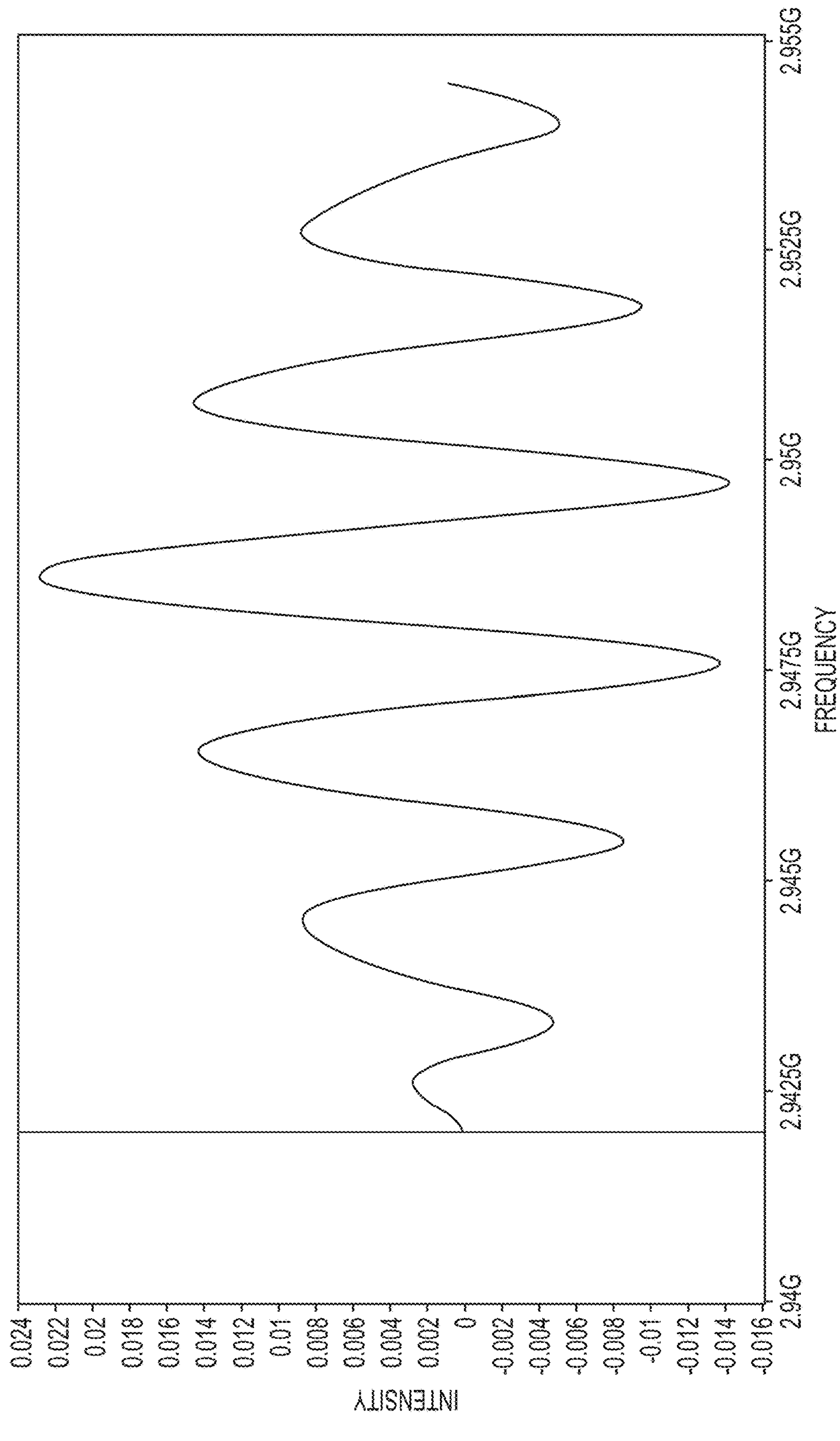

FIG. 96 is a schematic illustrating a Ramsey sequence of optical excitation pulses and RF excitation pulses according to an operation of the system in some embodiments;

FIG. 97A is a free induction decay curve where a free precession time $\tau$ is varied using a Ramsey sequence in some embodiments;

FIG. 97B is a magnetometry curve where a RF detuning frequency $\Delta$ is varied using a Ramsey sequence in some embodiments;

FIG. 98 is a graphical diagram depicting a reference signal intensity relative to detune frequency and a measured signal intensity relative to detune frequency in accordance with some embodiments;

FIG. 99 is a plot showing a traditional magnetometry curve using a Ramsey sequence in accordance with some embodiments;

FIG. 100 is a plot showing an invented magnetometry curve using a Ramsey sequence in accordance with some embodiments;

FIG. 101 is a plot showing a combined magnetometry curve of a traditional and inverted curve in accordance with some embodiments;

Generation of Magnetic Field Proxy Through RF Dithering

Figure 102:
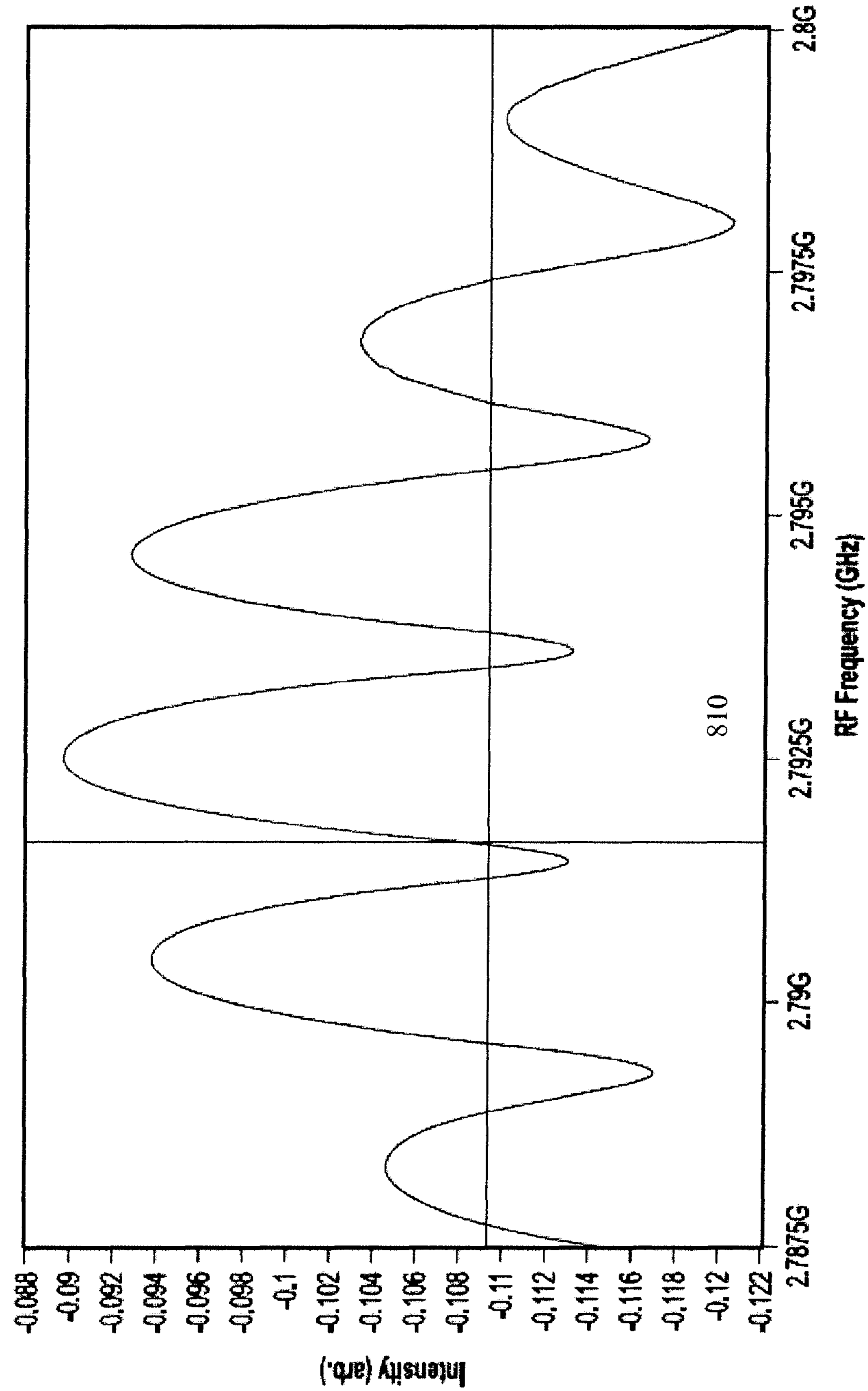
Figure 103:
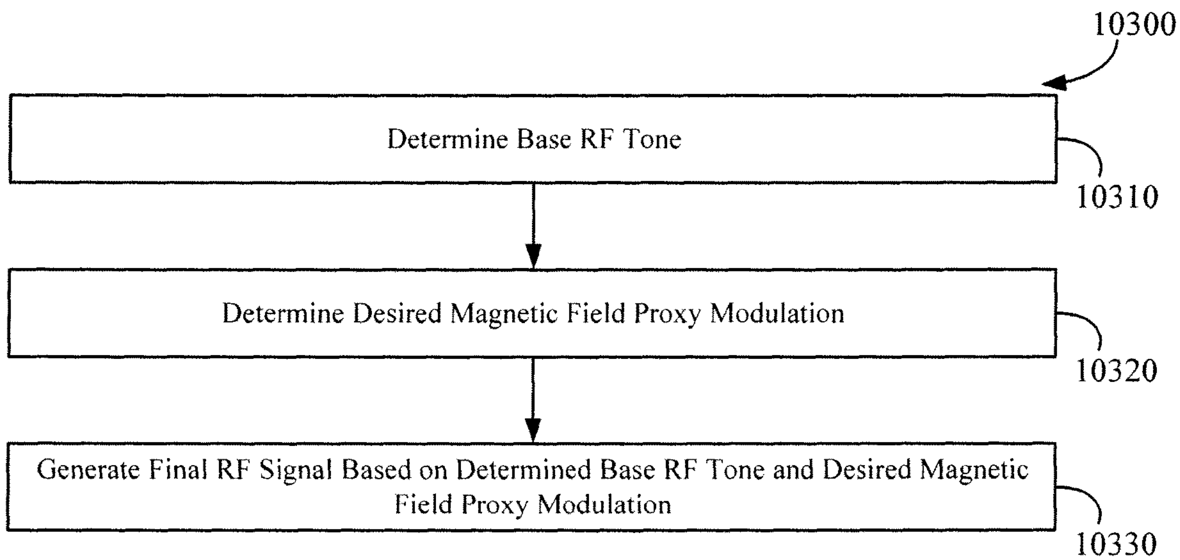
Figure 104:
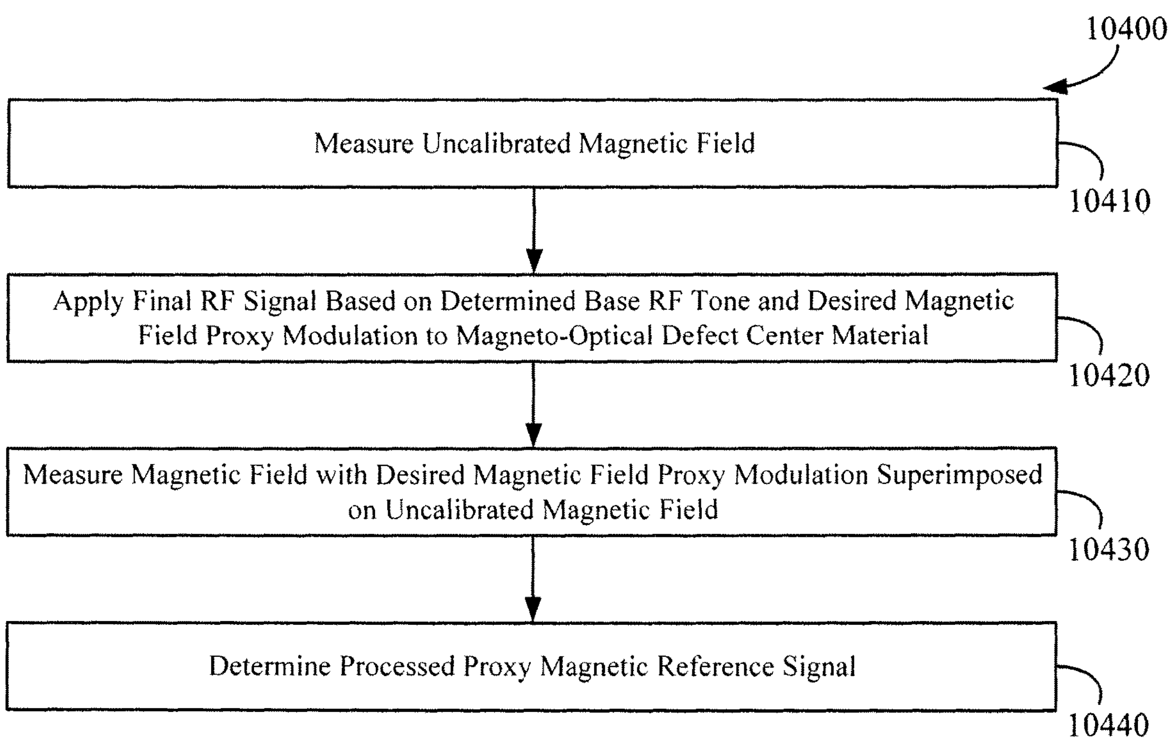
Figure 105:
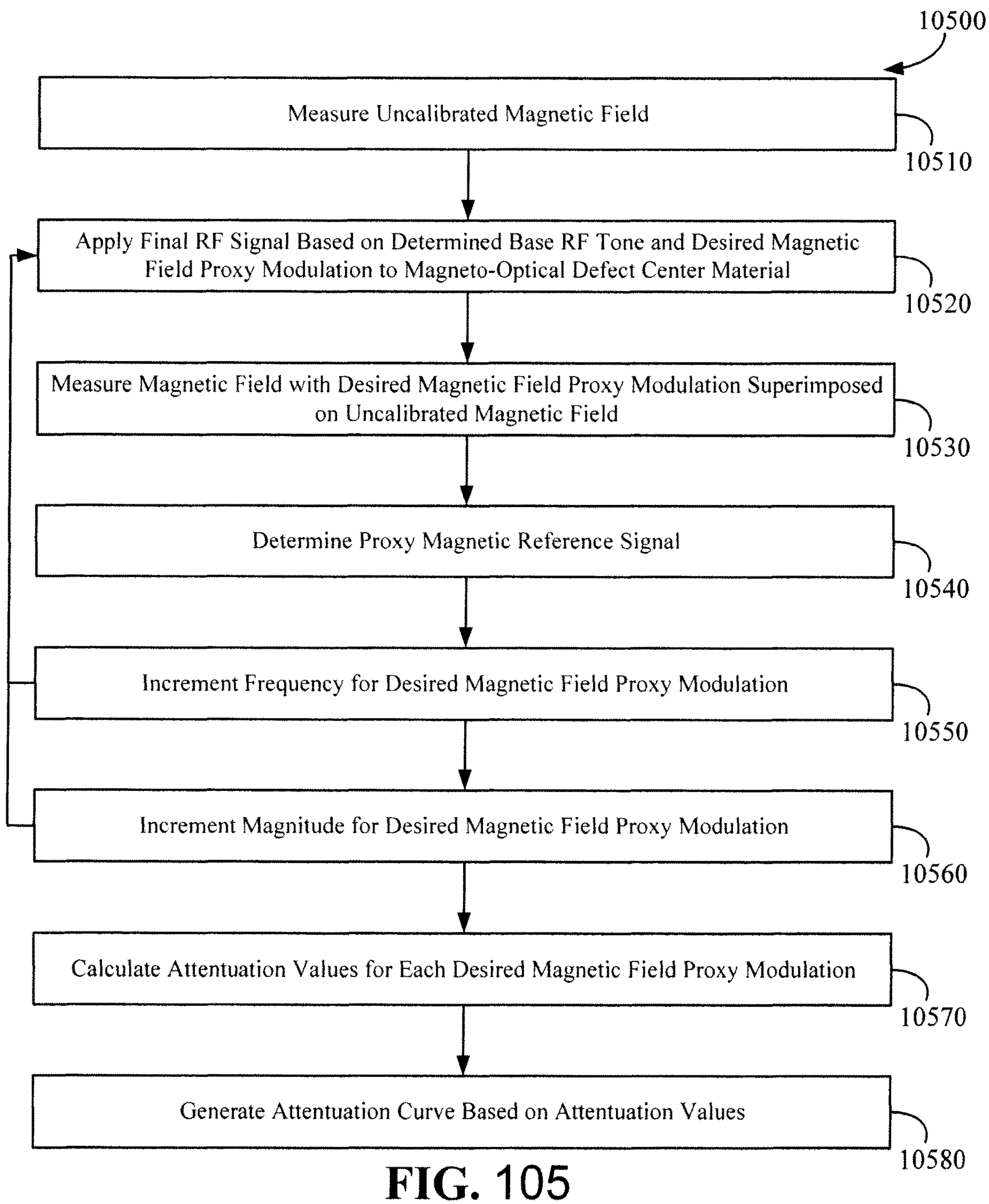
Figure 106:
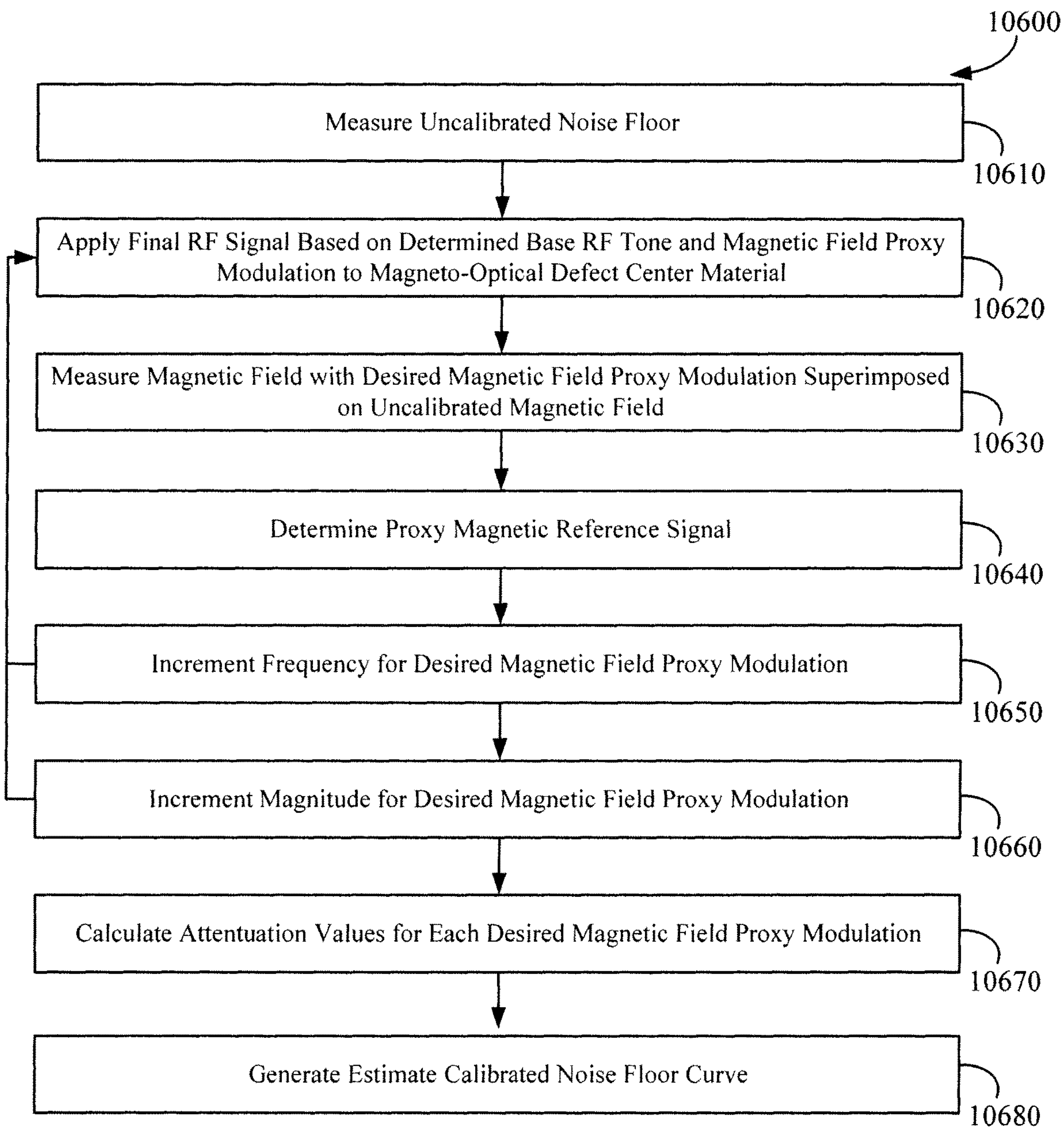

FIG. 102 is a magnetometry curve for an example resonance frequency;

FIG. 103 is a process diagram depicting a process for generating a proxy magnetic reference signal;

FIG. 104 is a process diagram depicting a process for determining a processed proxy magnetic reference signal;

FIG. 105 is a process diagram depicting a process for generating a sensor attenuation curve of external magnetic fields as a function of frequency using proxy magnetic reference signals;

FIG. 106 is a process diagram depicting a process for generating a calibrated noise floor as a function of frequency using proxy magnetic reference signals;

Spin Relaxometry Based Molecular Sequencing

Figure 107:
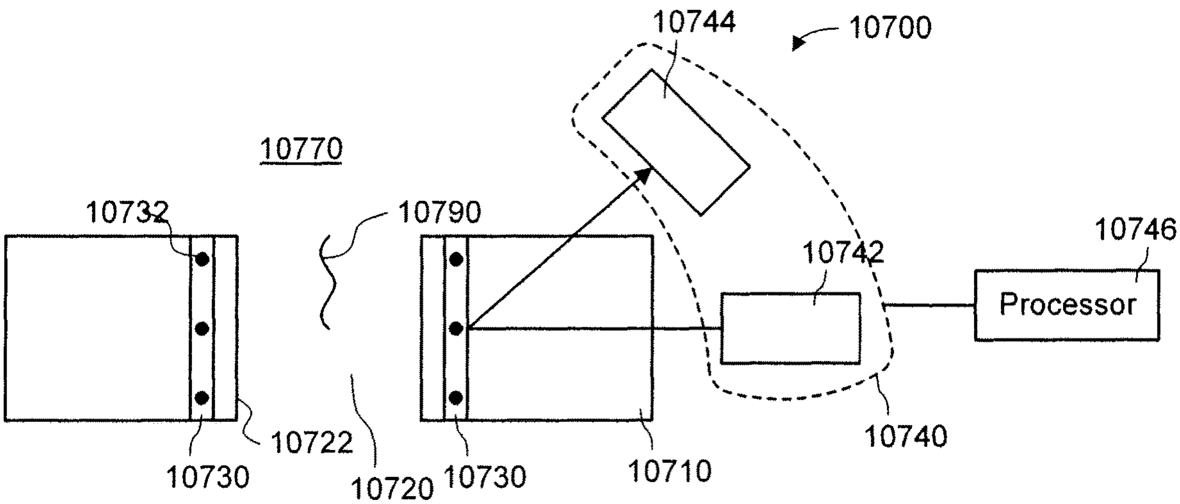
Figure 108:
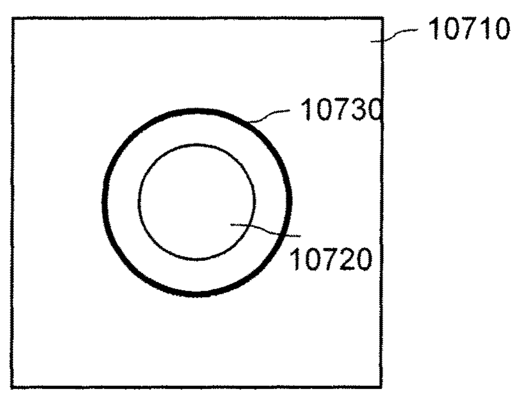
Figure 109:
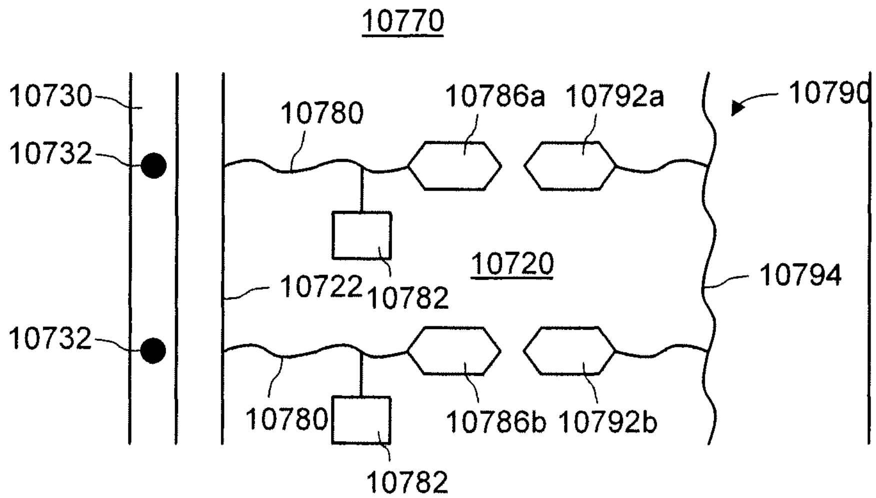
Figure 110A:
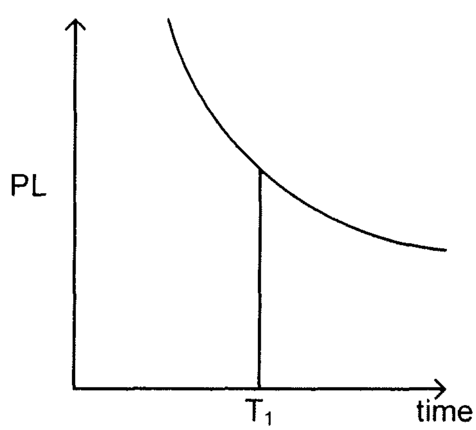
Figure 110B:
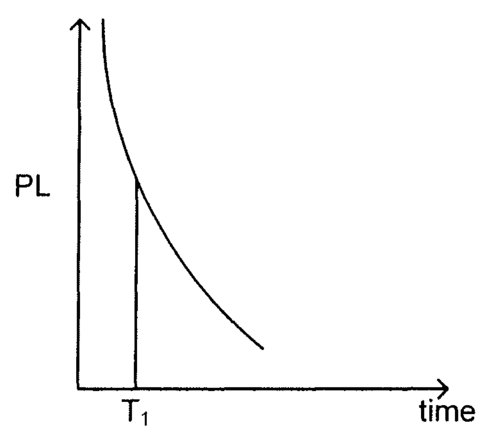
Figure 111:
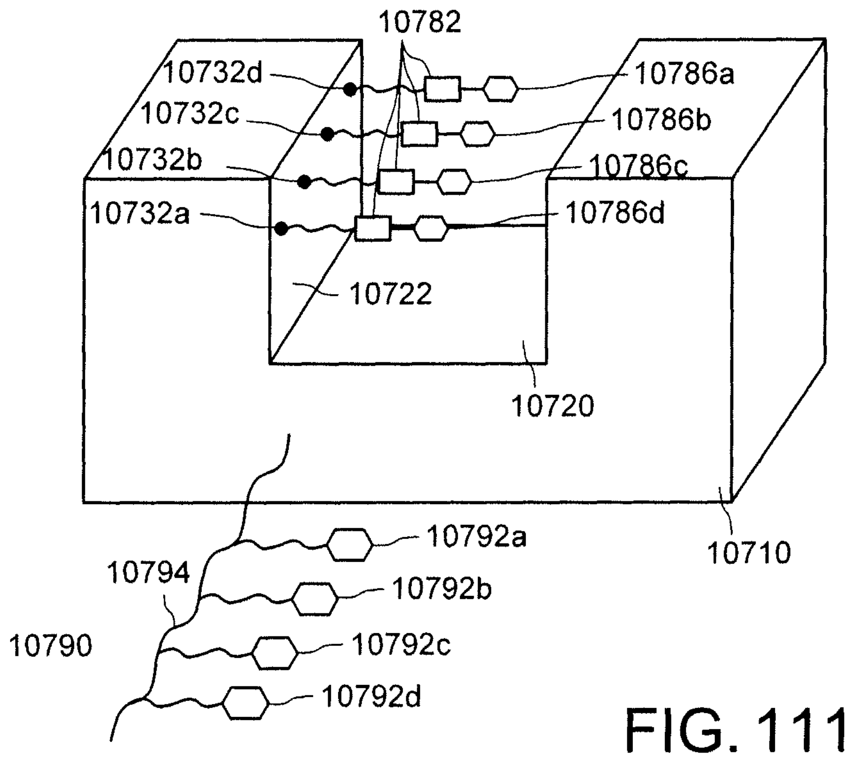
Figure 112:
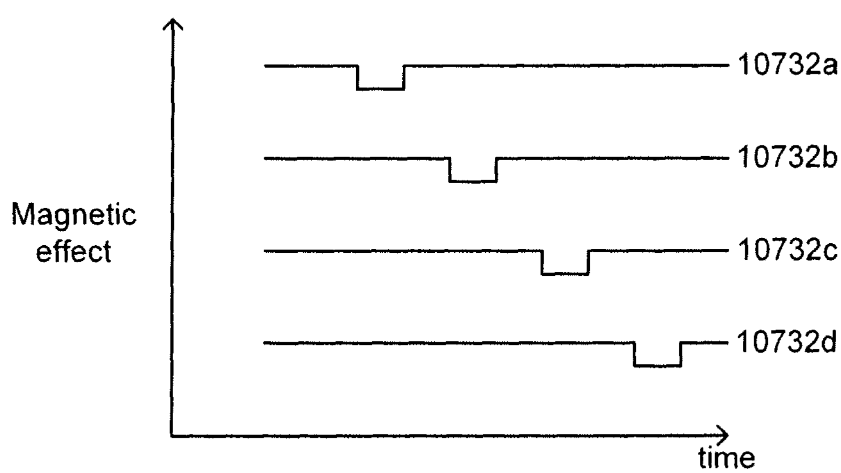
Figure 113:
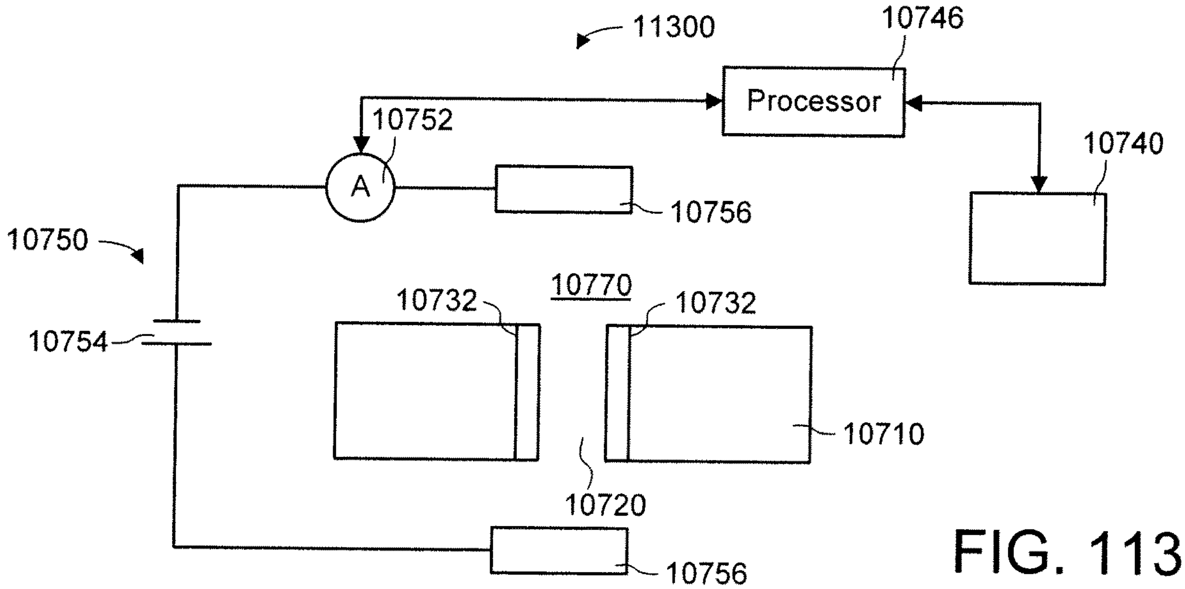
Figure 114:
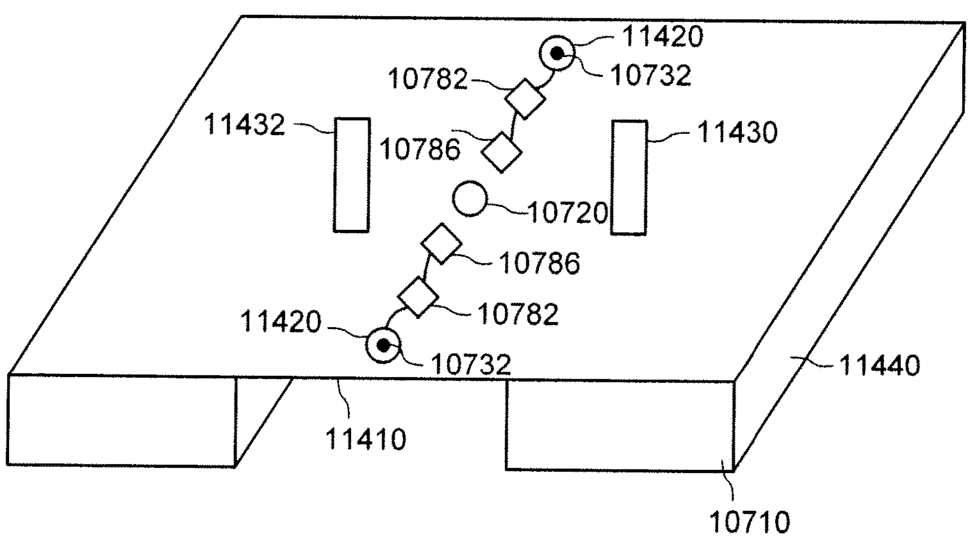

FIG. 107 is a schematic diagram illustrating a system for detecting a target molecule according to embodiments;

FIG. 108 is a top view of a pore of the substrate shown in FIG. 107;

FIG. 109 is a magnified cross-sectional view of a portion of the side wall of a pore of the substrate shown in FIG. 107;

FIG. 110A is a graph illustrating the photoluminescence of a spin center as a function of time in the case where the paramagnetic ion is relatively far from the spin center;

FIG. 110B is a graph illustrating the photoluminescence of a spin center as a function of time in the case where the paramagnetic ion is relatively close to the spin center;

FIG. 111 illustrates a target molecule with individual target moities passing through a pore of the substrate;

FIG. 112 is a graph illustrating the magnetic effect signal as a function of time for four different spin centers;

FIG. 113 is a schematic diagram illustrating a system for detecting a target molecule according to embodiments using both a magnetic effect detector and a second effect detector;

FIG. 114 illustrates embodiments of the substrate of the system which includes electronic read out of the magnetic spin change;

Micro Air Vehicle and Buoy Arrays of Magnetometer Sensors

Figure 115A:
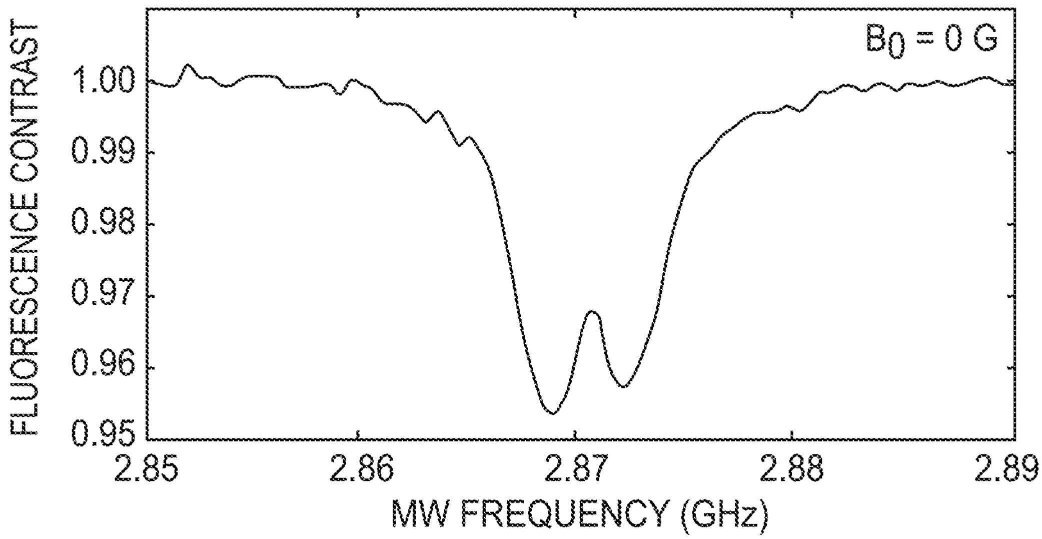
Figure 115B:
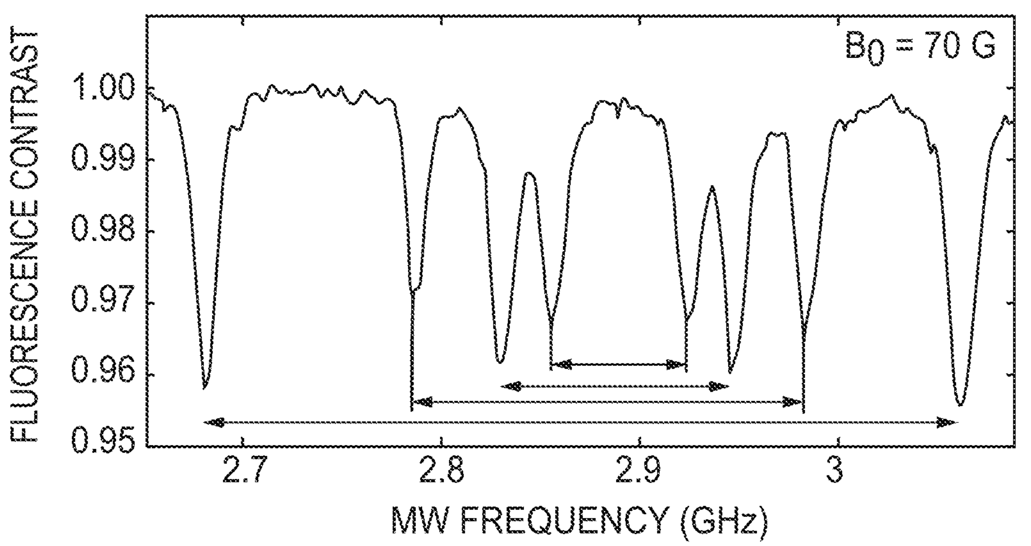
Figure 116A:
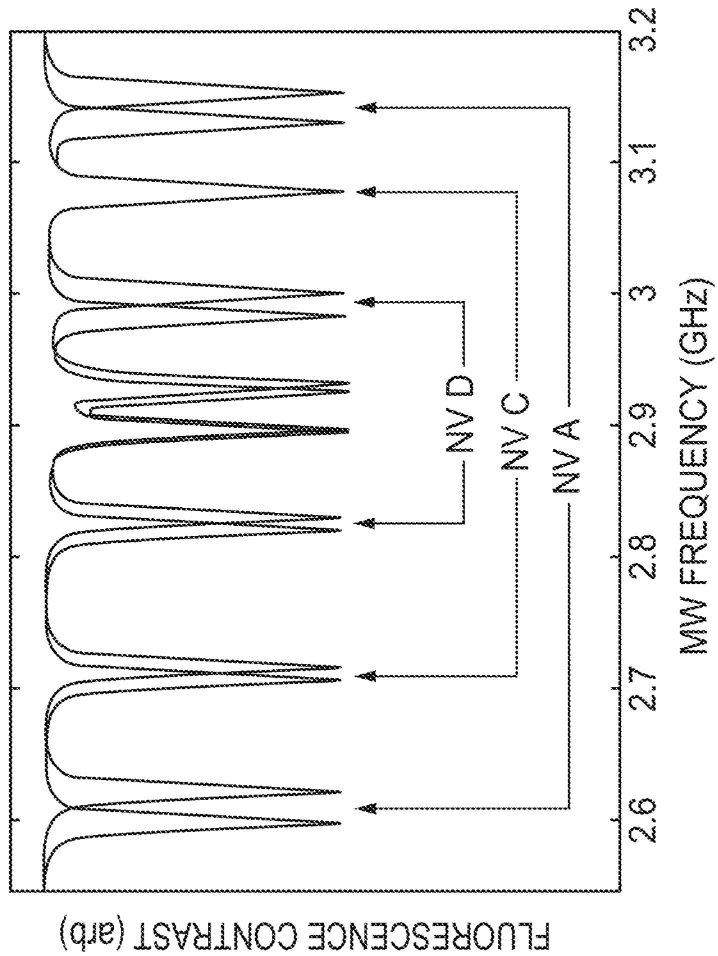
Figure 116B:
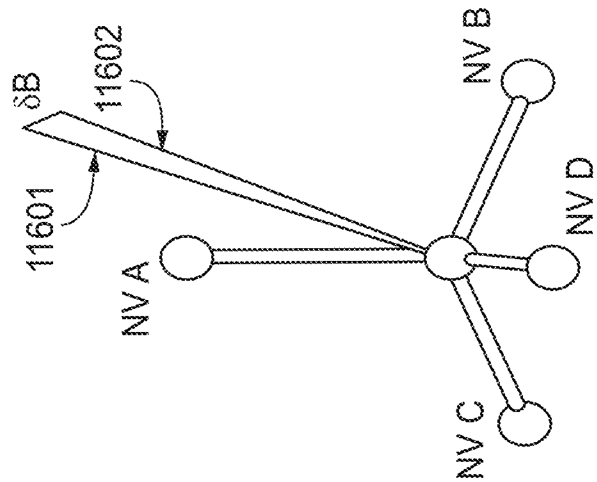
Figure 117A:
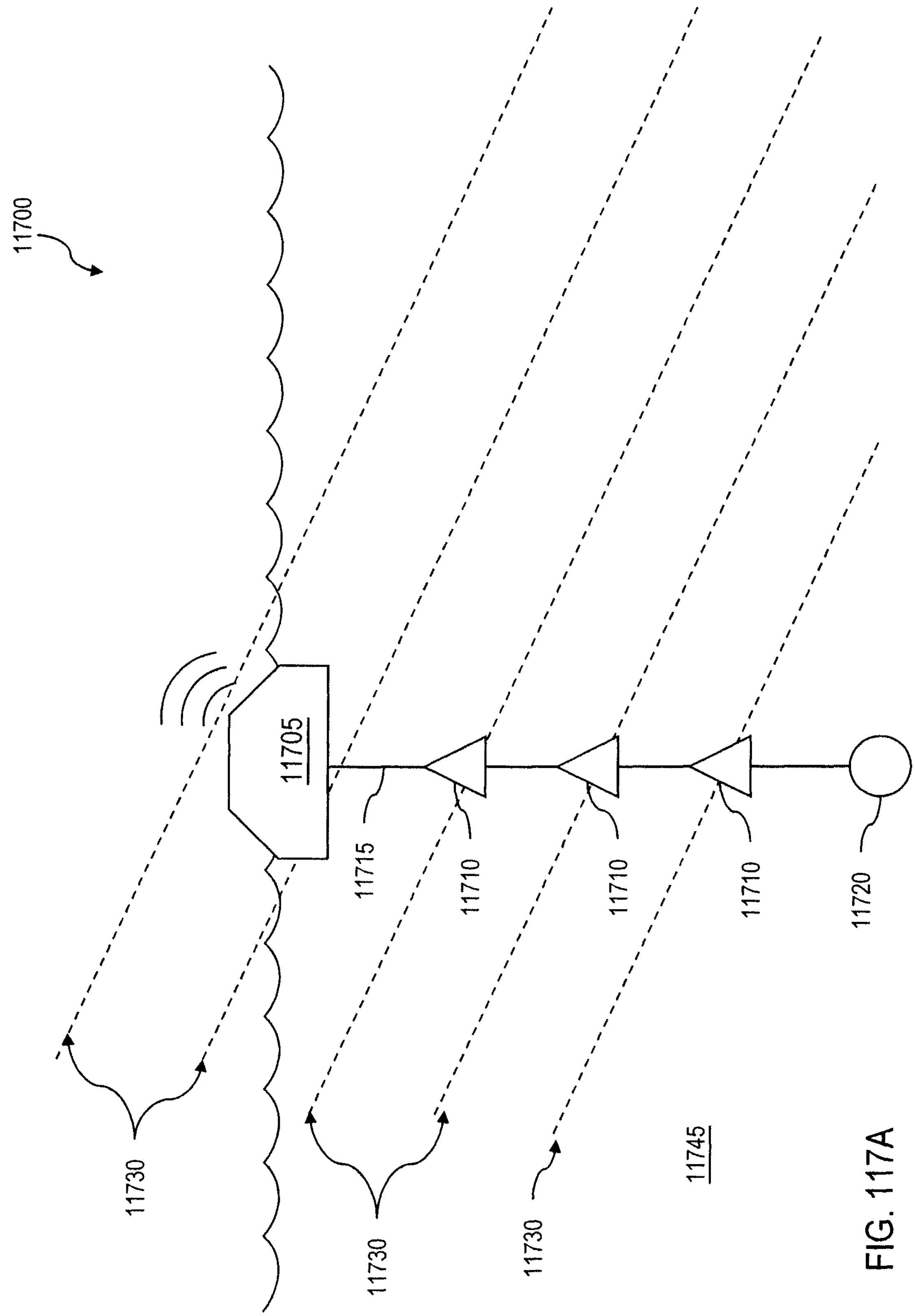
Figure 117B:
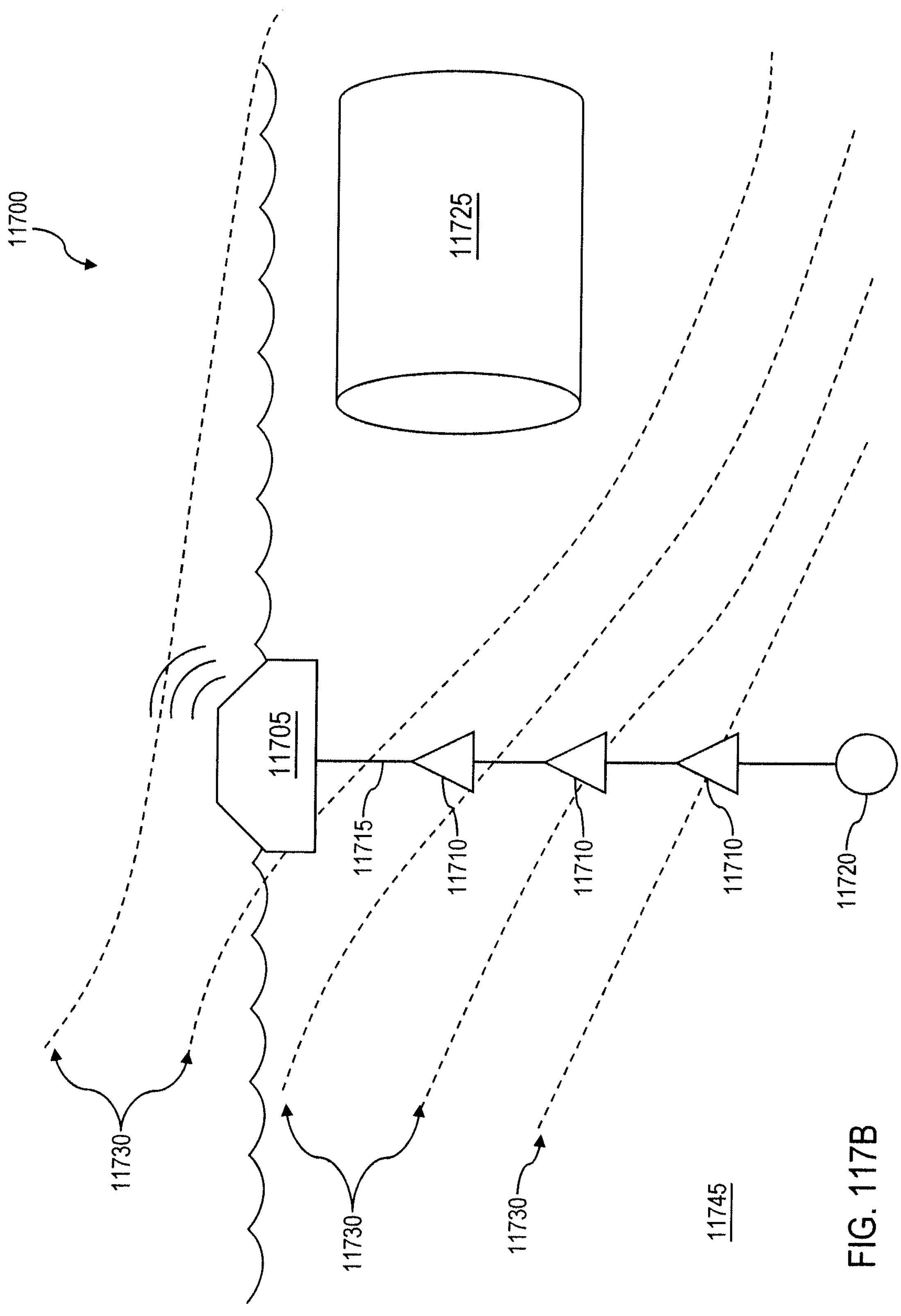
Figure 118:
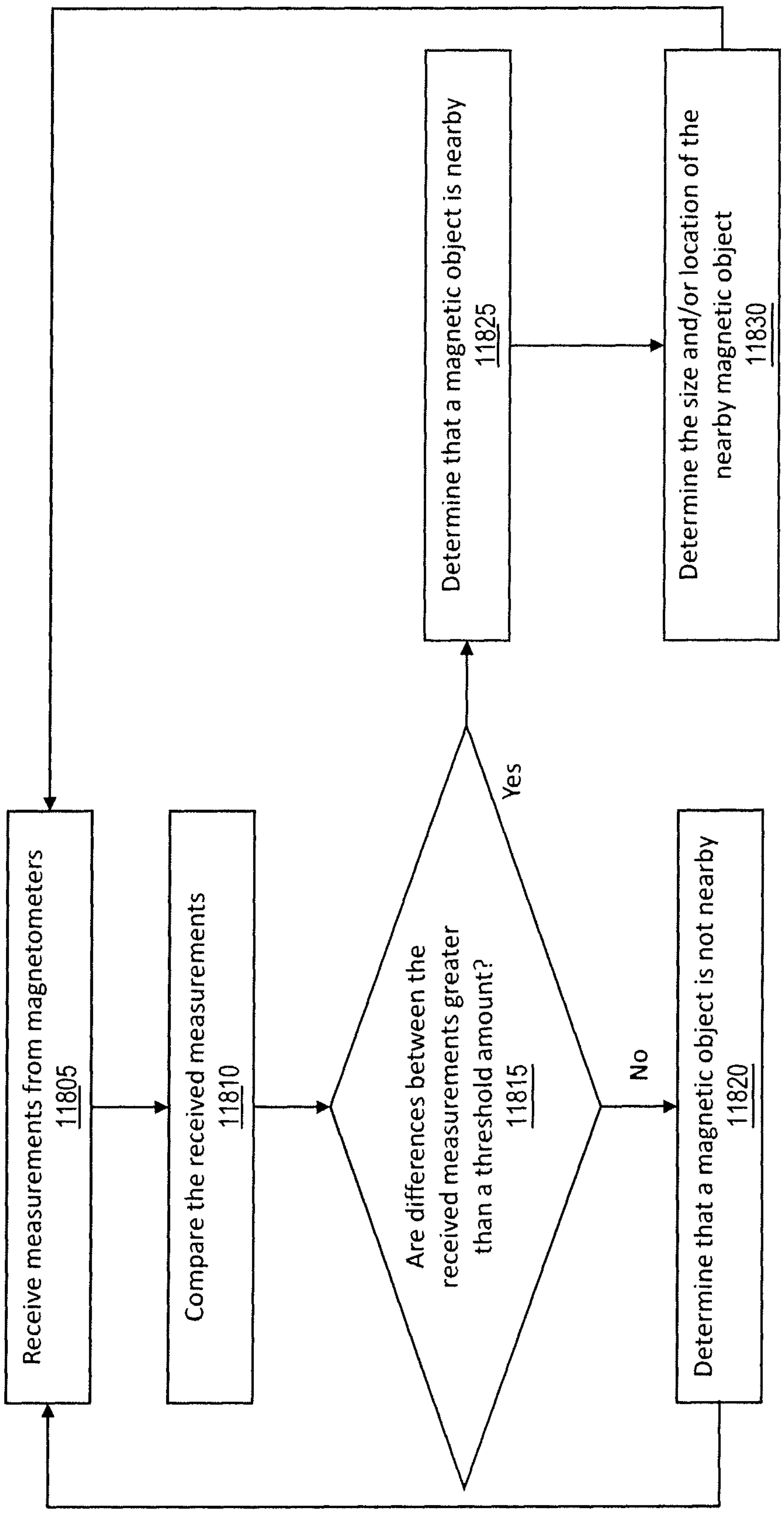
Figure 119:
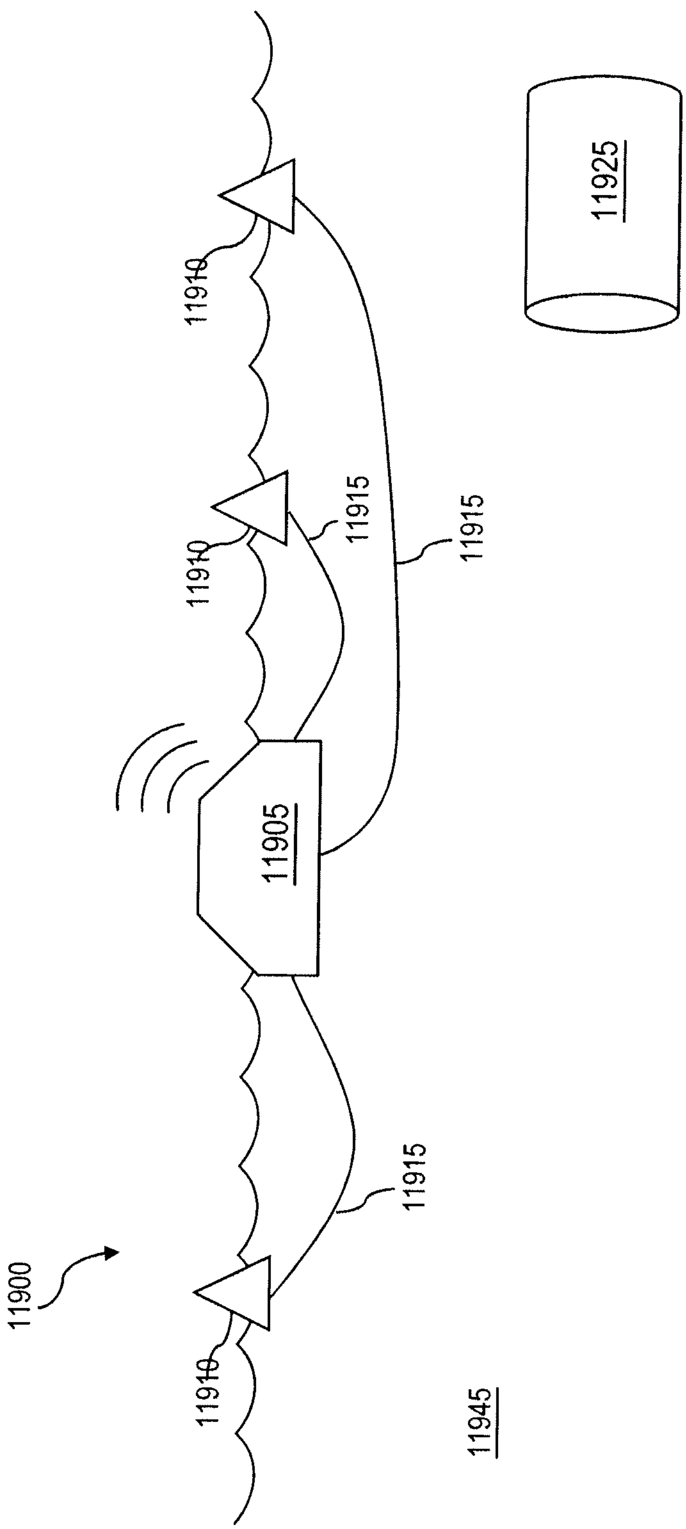
Figure 120:
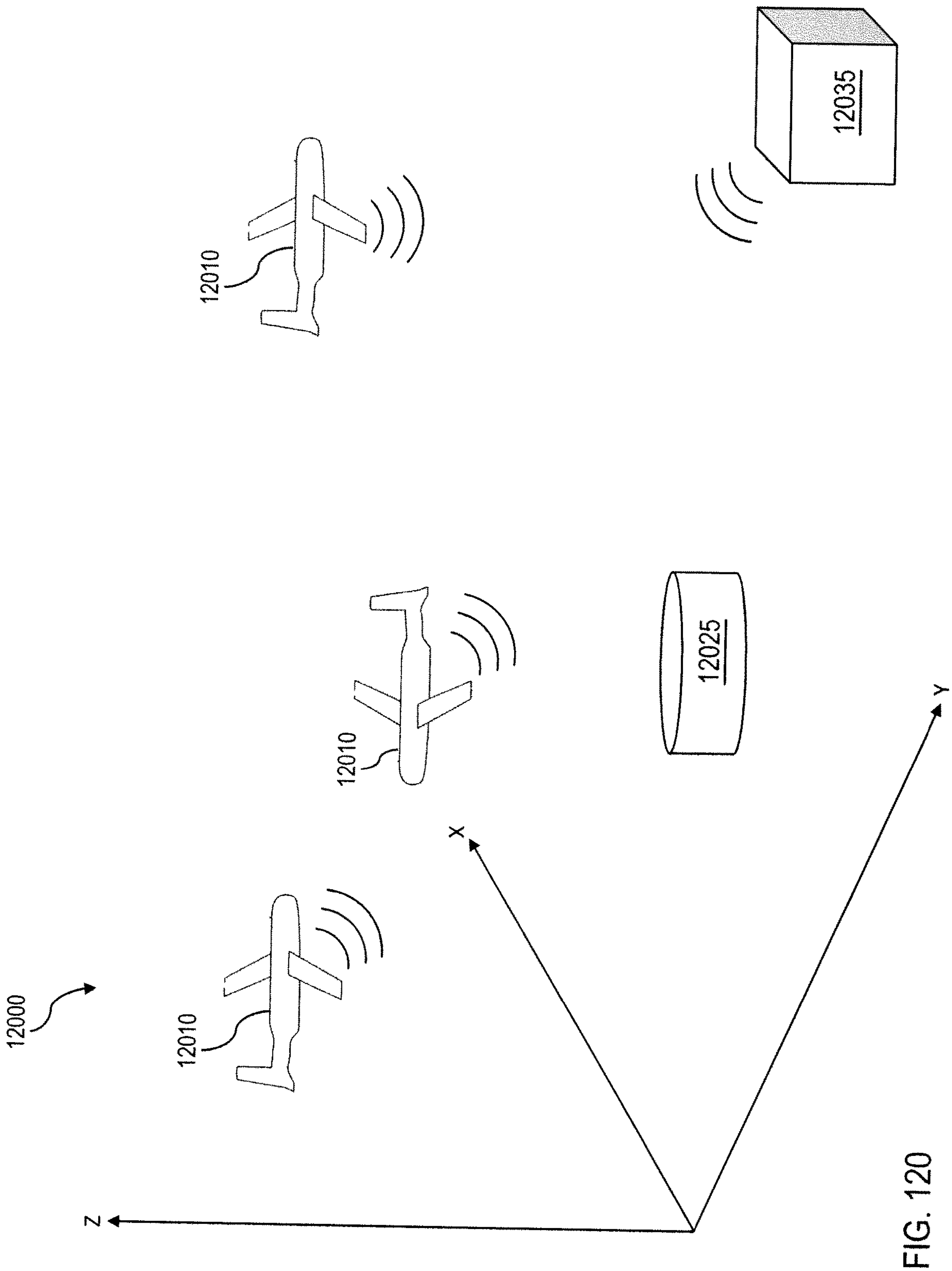
Figure 121:
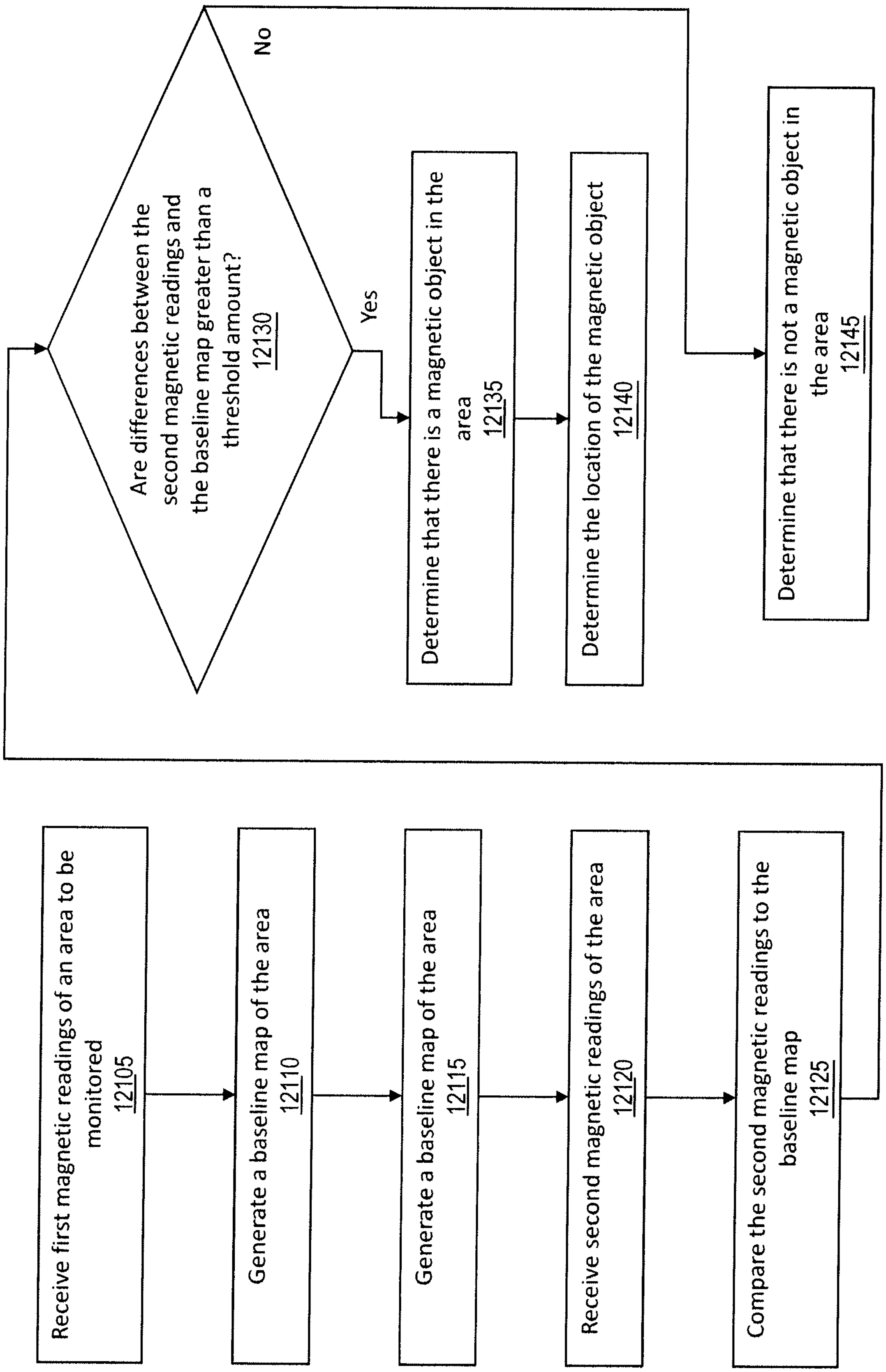

FIGS. 115A and 115B are graphs illustrating the frequency response of a DNV sensor in accordance with some illustrative embodiments;

FIG. 116A is a diagram of NV center spin states in accordance with some illustrative embodiments;

FIG. 116B is a graph illustrating the frequency response of a DNV sensor in response to a changed magnetic field in accordance with some illustrative embodiments;

FIGS. 117A and 117B are diagrams of a buoy-based DNV sensor array in accordance with some illustrative embodiments;

FIG. 118 is a flow chart of a method for monitoring for magnetic objects in accordance with some illustrative embodiments;

FIG. 119 is a diagram of a buoy-based DNV sensor array in accordance with some illustrative embodiments;

FIG. 120 is a diagram of an aerial DNV sensor array in accordance with some illustrative embodiments;

FIG. 121 is a flow chart of a method for monitoring for magnetic objects in accordance with some illustrative embodiments;

Di-Lateration Using Magnetometers

Figure 122B:
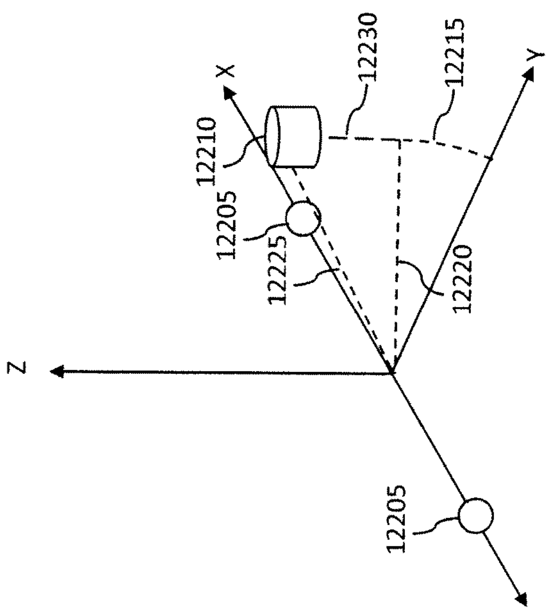
Figure 122C:
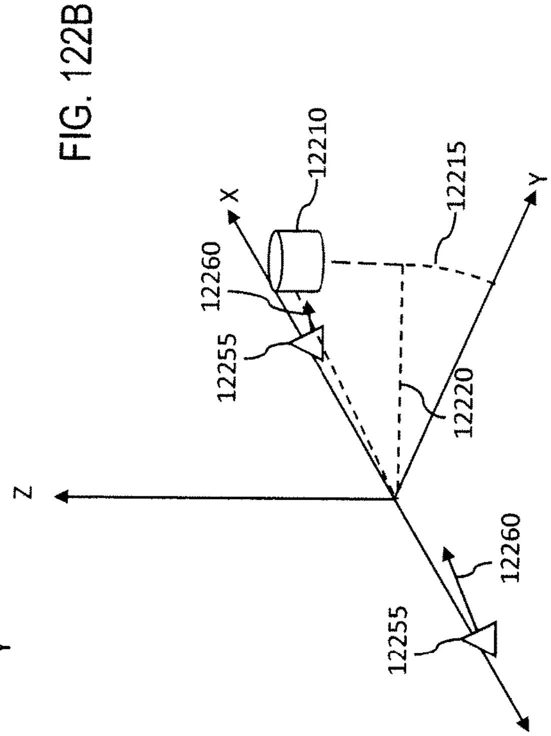
Figure 122A:
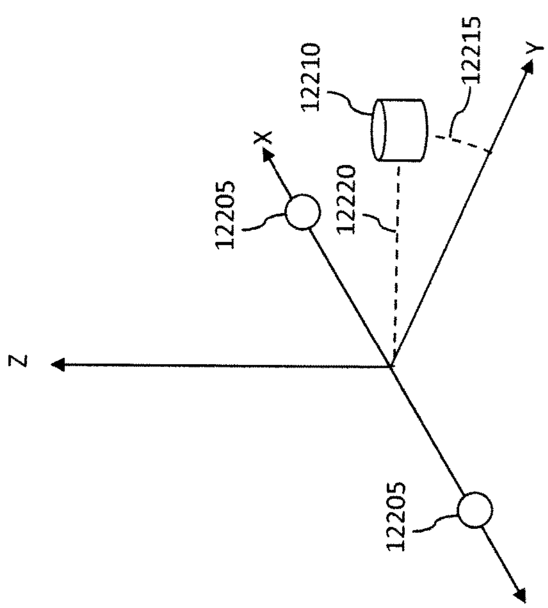

FIGS. 122A-122C are diagrams illustrating di-lateration techniques in accordance with some illustrative embodiments;

Geolocation of Magnetic Sources Using Magnetometers

Figure 123:
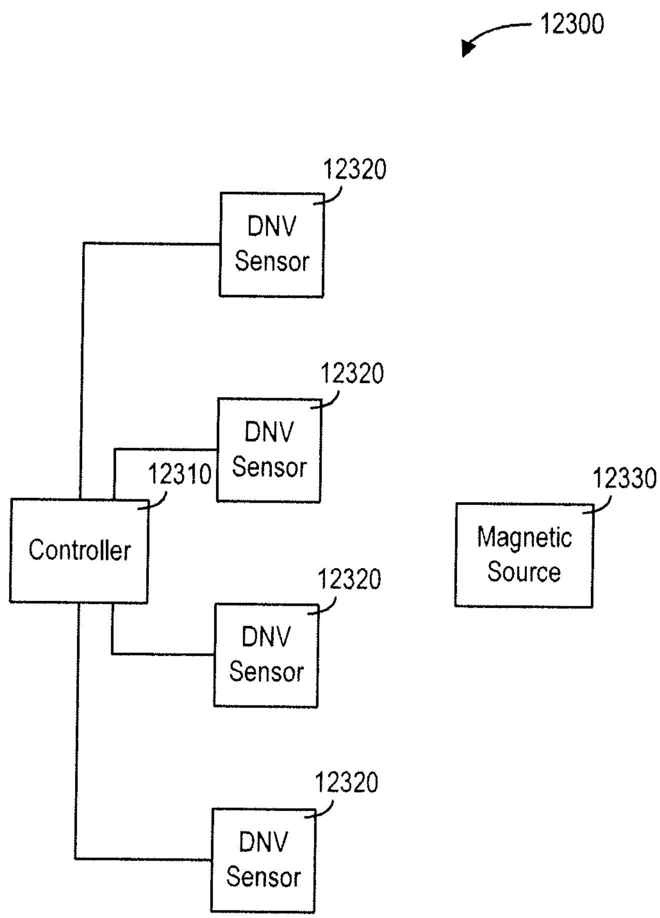

FIG. 123 is a schematic illustrating a controller and several DNV sensors for detecting an angle and/or position of a magnetic source relative to the DNV sensors;

Localization of Subsurface Liquids Using Magnetometers

Figure 124:
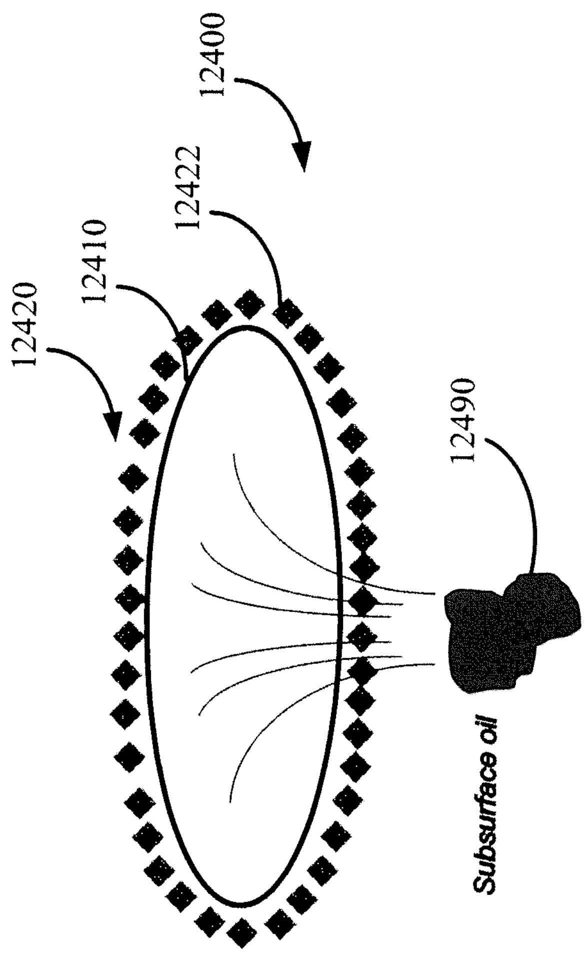
Figure 126:
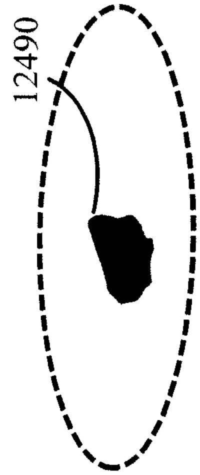
Figure 125:
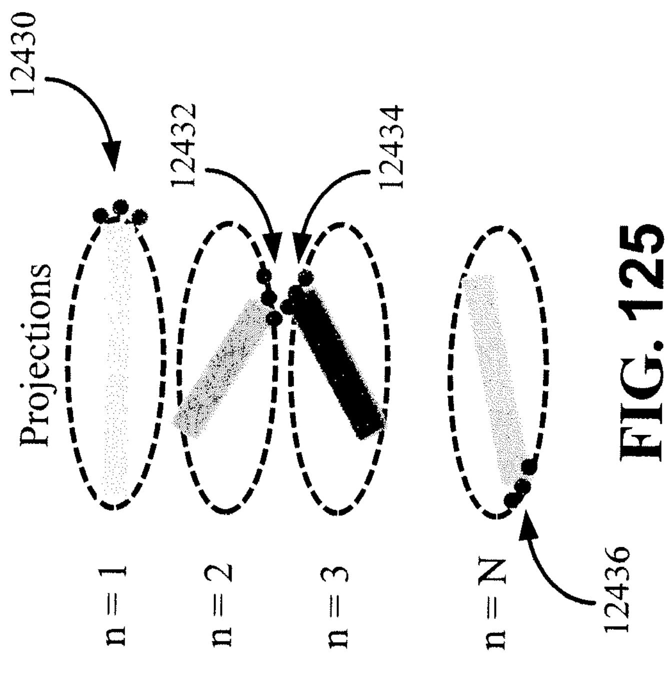
Figure 127:
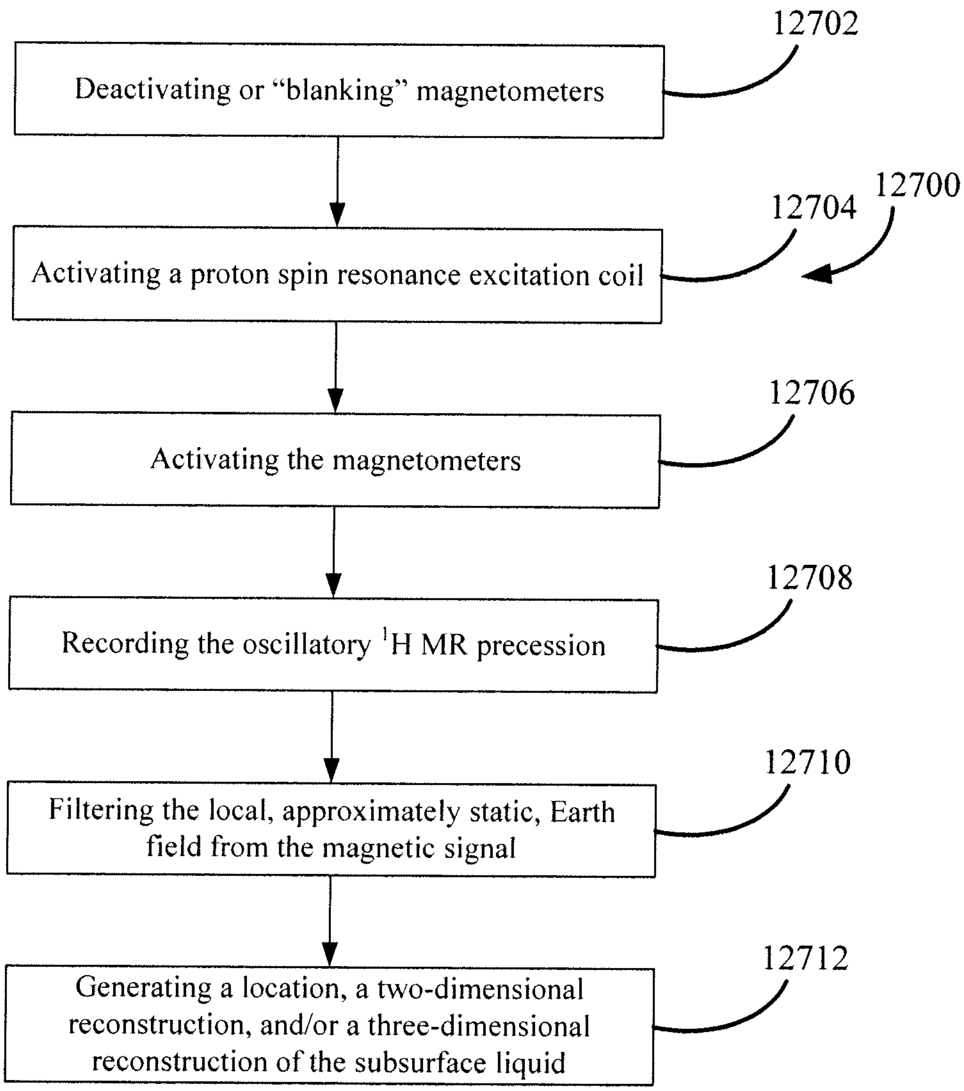

FIG. 124 is an illustrative overview of a system for localization of a subsurface liquid using a proton spin resonance excitation coil for inducing a magnetization in the subsurface liquid and an array of vector magnetometers to detect the location of the subsurface liquid;

FIG. 125 is an illustrative overview of sets of magnetometers of FIG. 124 outputting detection signals from the magnetized subsurface liquid;

FIG. 126 is an illustrative view depicting the detected location of the subsurface liquid based on the detection signals from the sets of magnetometers of FIG. 125;

FIG. 127 is a process diagram for an illustrative process for detecting the location of the subsurface liquid using the array of magnetometers;

System to Map and/or Monitor Hydraulic Fractures Using Magnetometers

Figure 128A:
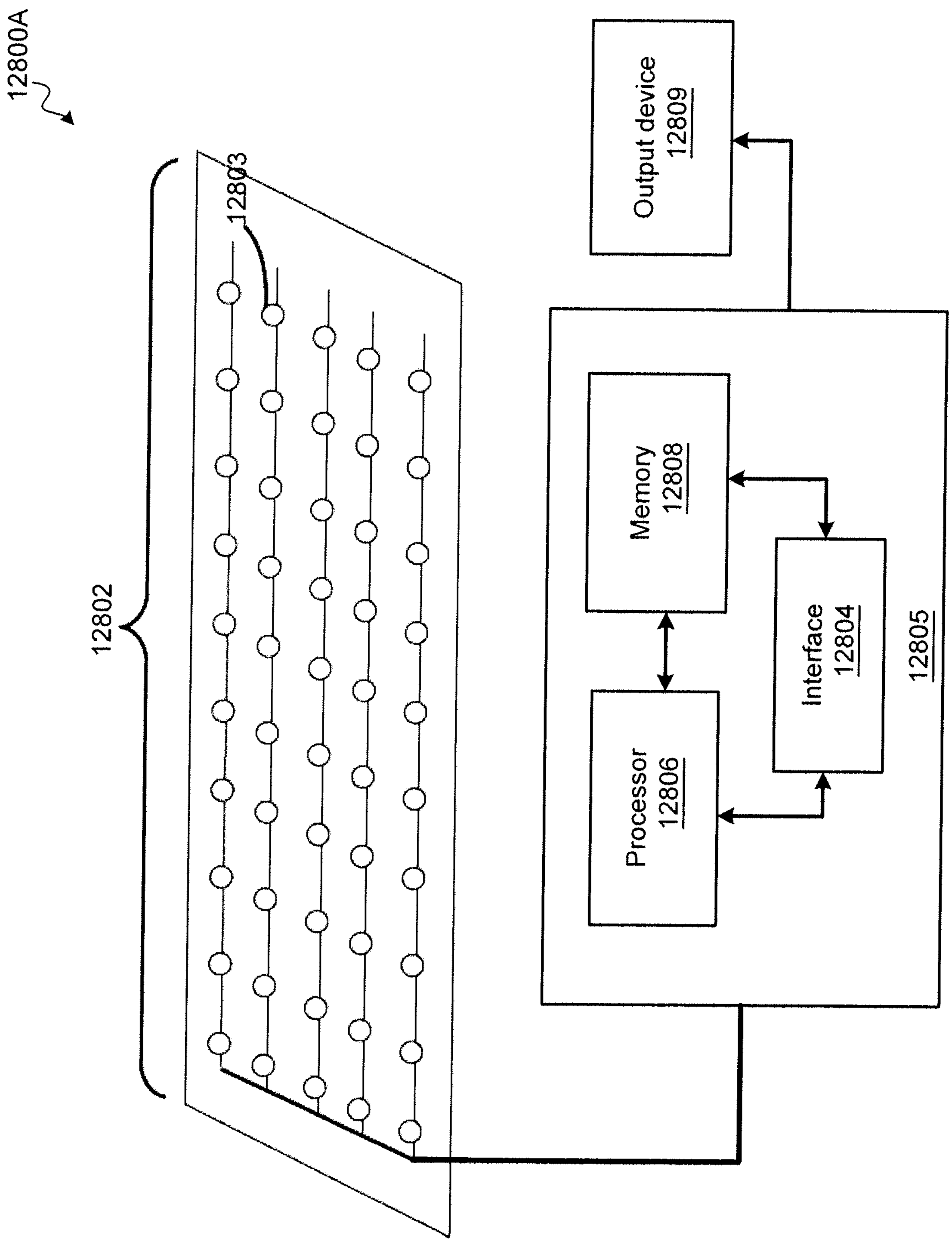
Figure 128B:
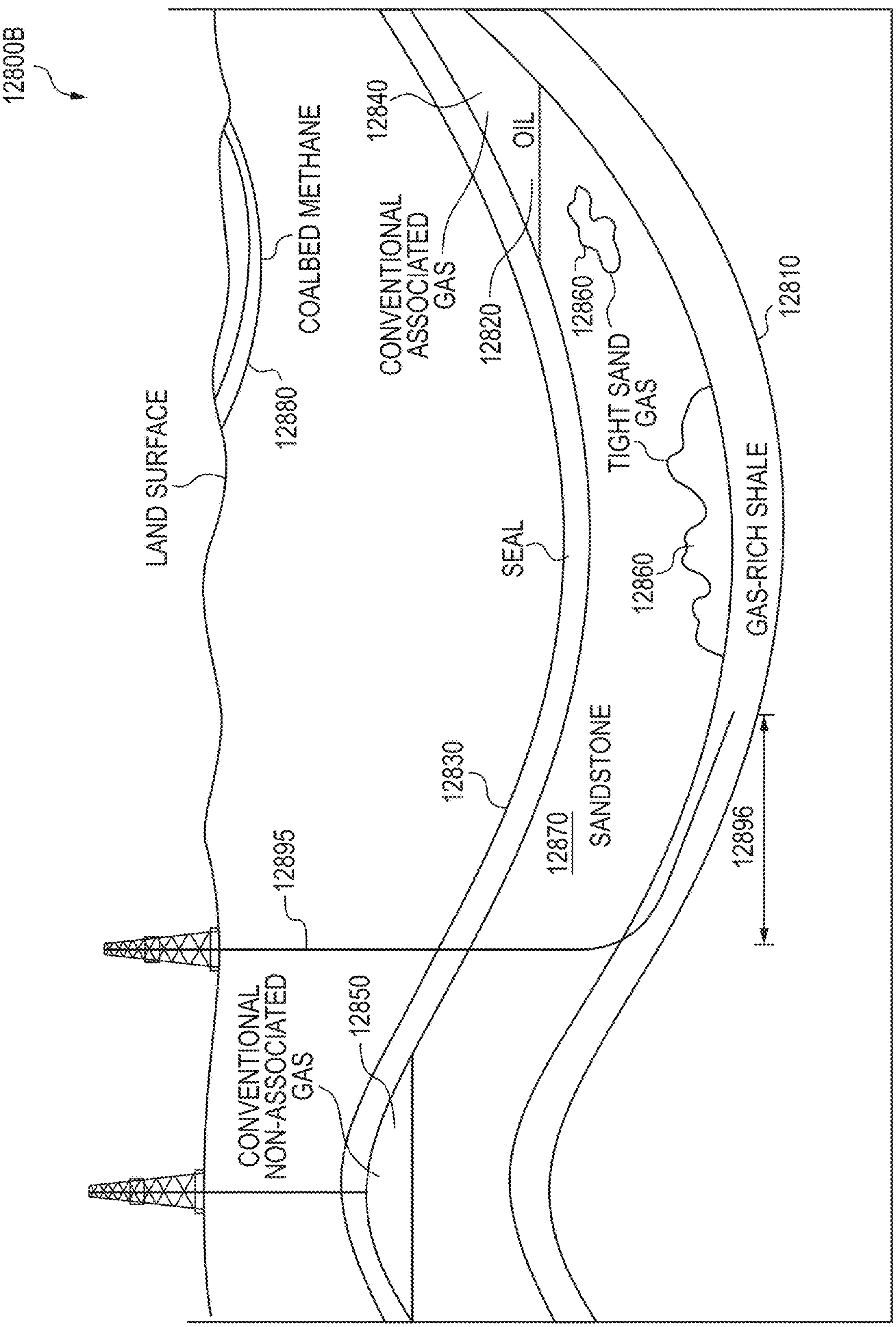
Figure 129:
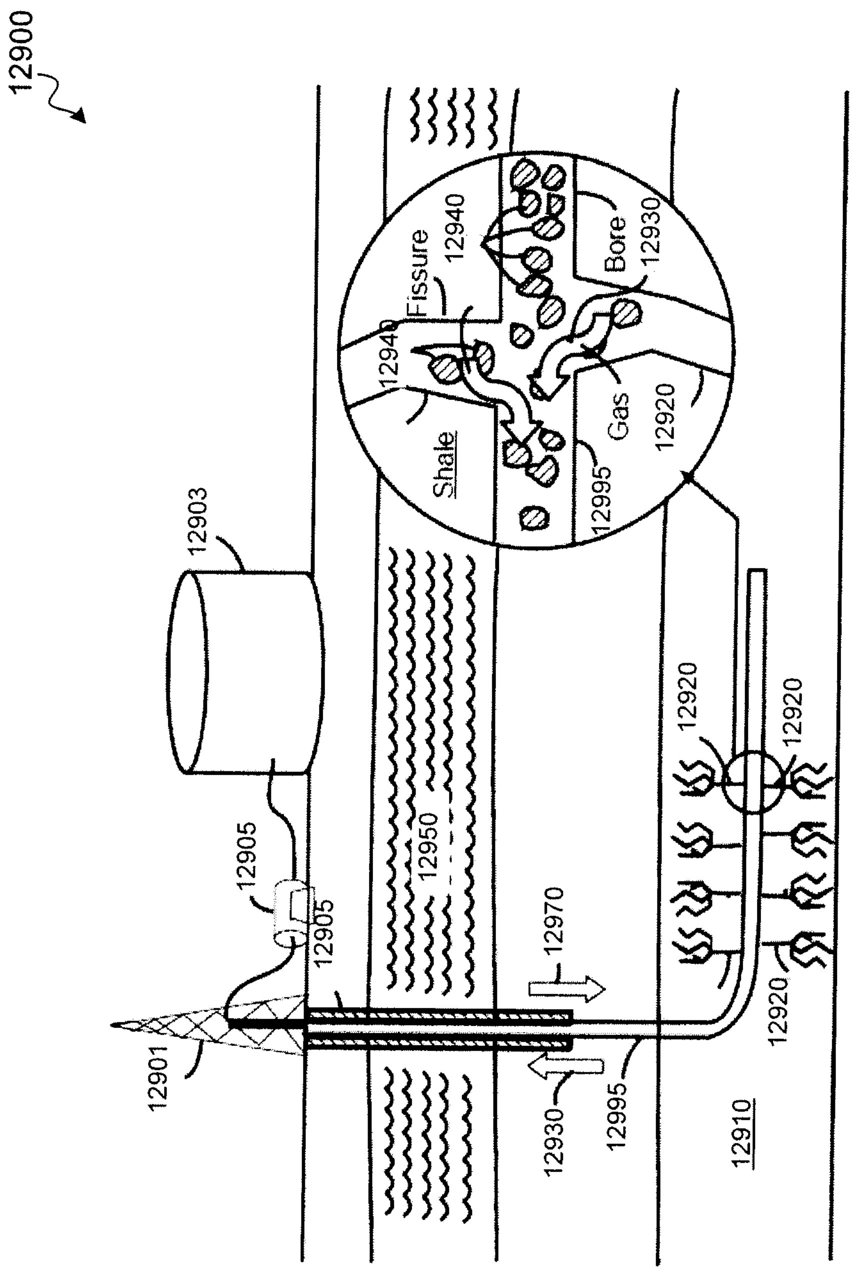
Figure 130A:
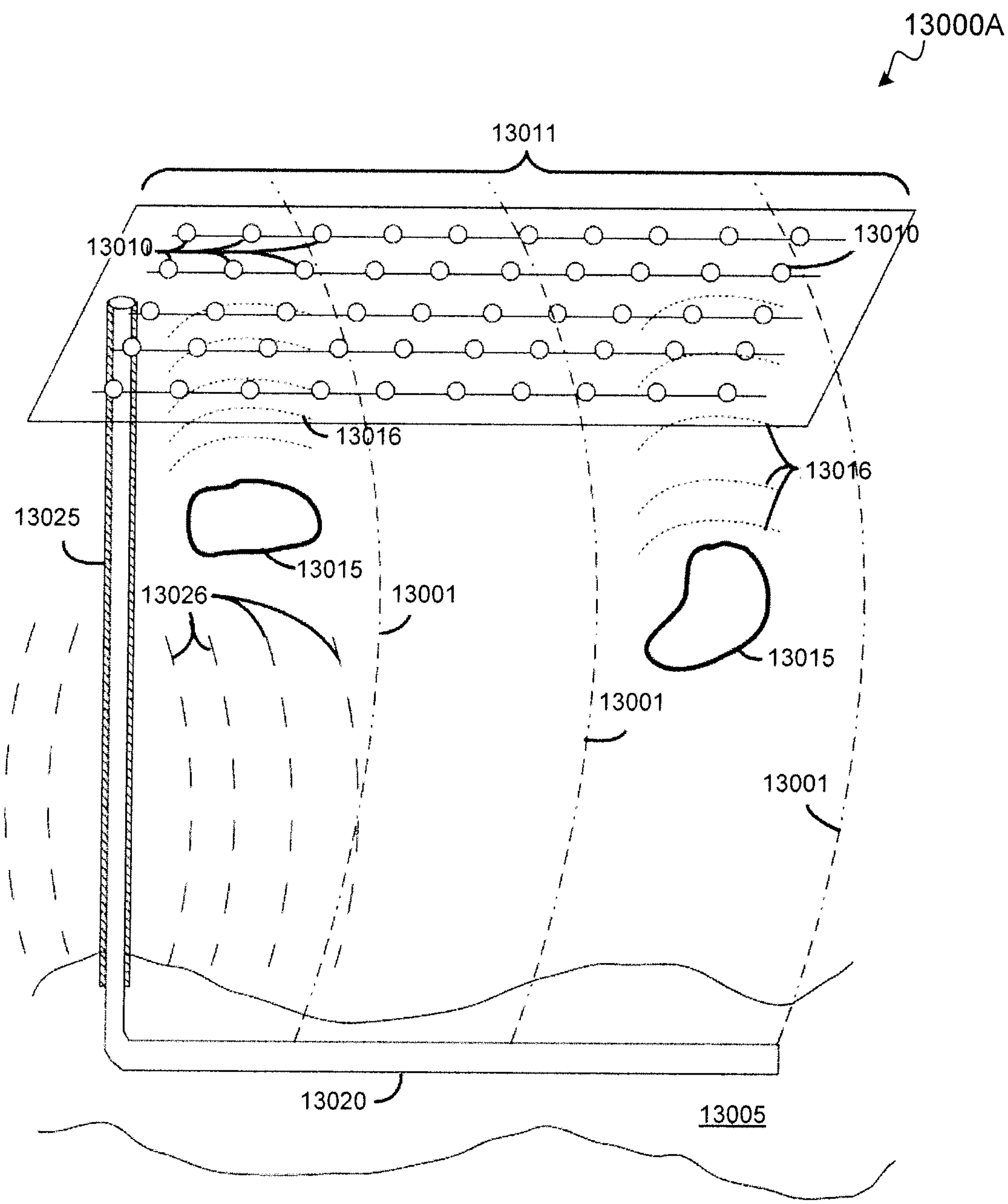
Figure 130B:
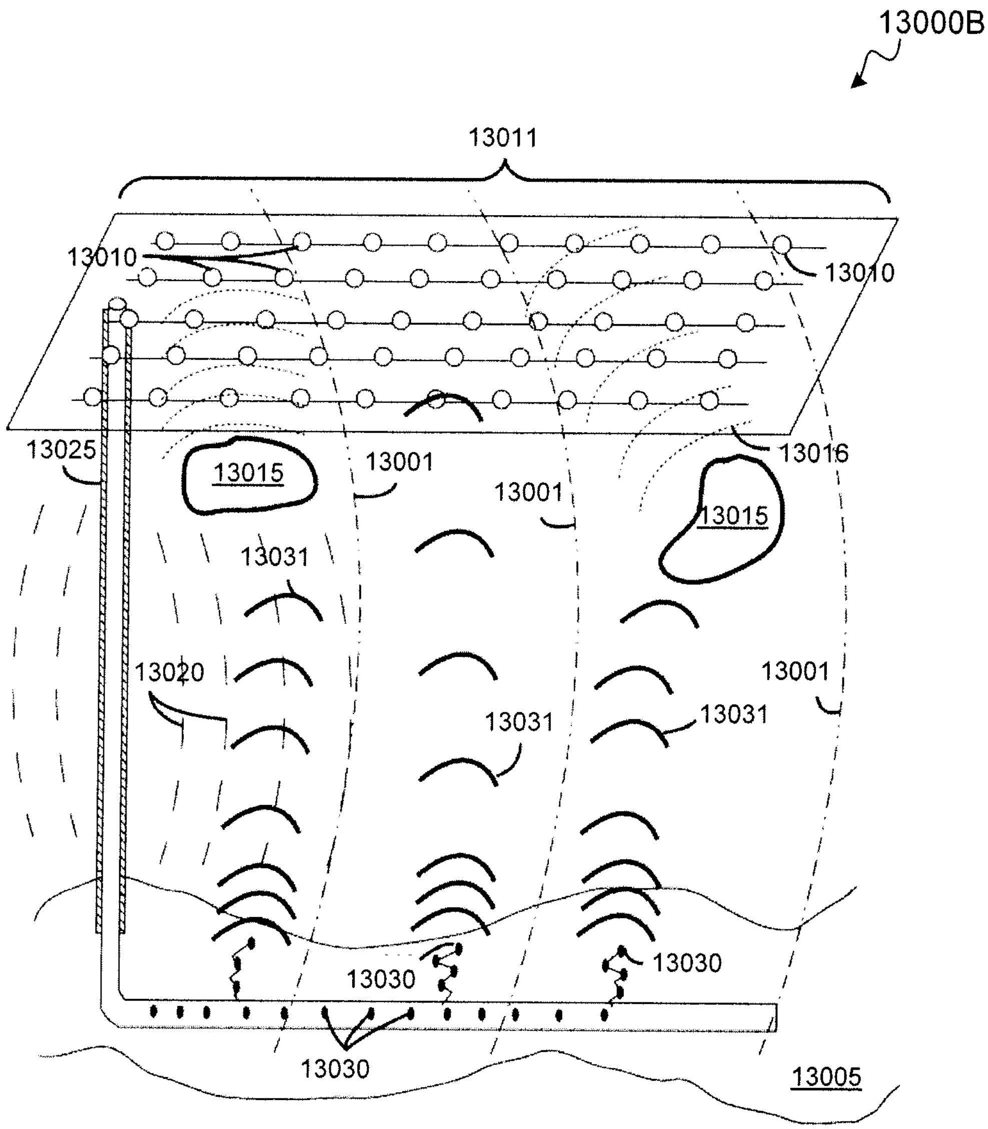
Figure 131:
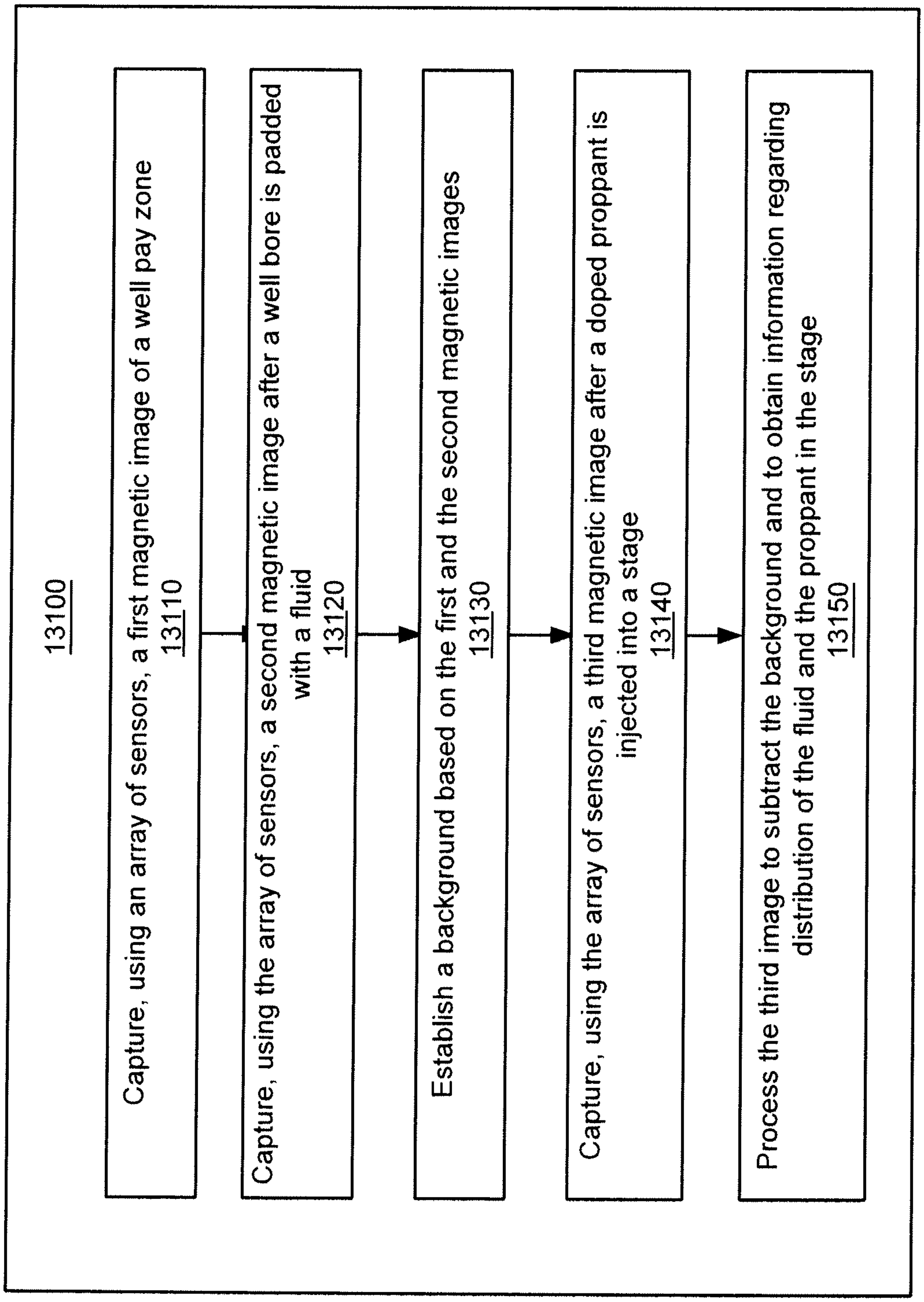
Figure 132:
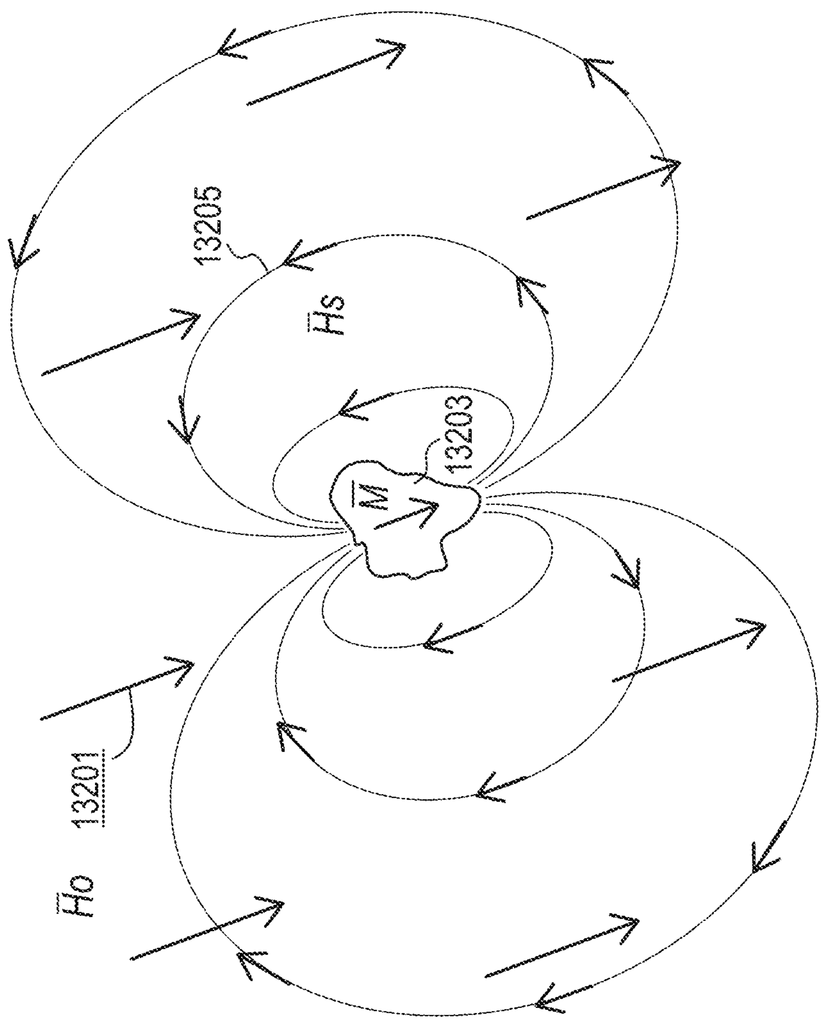

FIGS. 128A-128B are diagrams illustrating examples of a high-level architecture of a system for mapping and monitoring of hydraulic fracture and an environment where the system operates, according to certain embodiments;

FIG. 129 is a high-level diagram illustrating an example of implementation of hydraulic fracturing of a well to release gas reserves, according to certain embodiments;

FIG. 130A is a diagram illustrating an example background magnetic signature of a well, according to certain embodiments;

FIG. 130B is a diagram illustrating an example implementation of a mapping system for hydraulic fracturing of the well shown in FIG. 130A, according to certain embodiments;

FIG. 131 is a diagram illustrating an example of a method for mapping and monitoring of hydraulic fracture, according to certain embodiments;

FIG. 132 is a diagram illustrating examples of primary and secondary magnetic fields in the presence of a doped proppant, according to certain embodiments;

High Bit-Rate Magnetic Communication Using Magnetometers

Figure 133A:
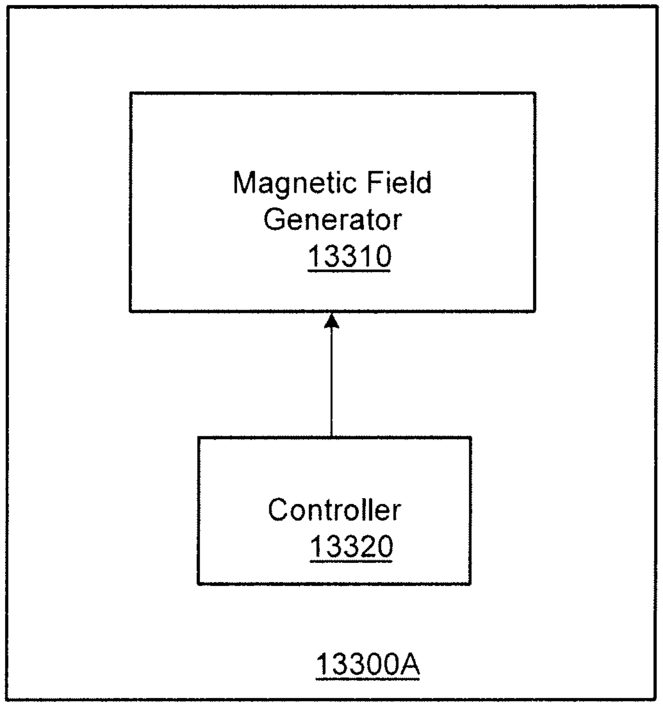
Figure 133B:
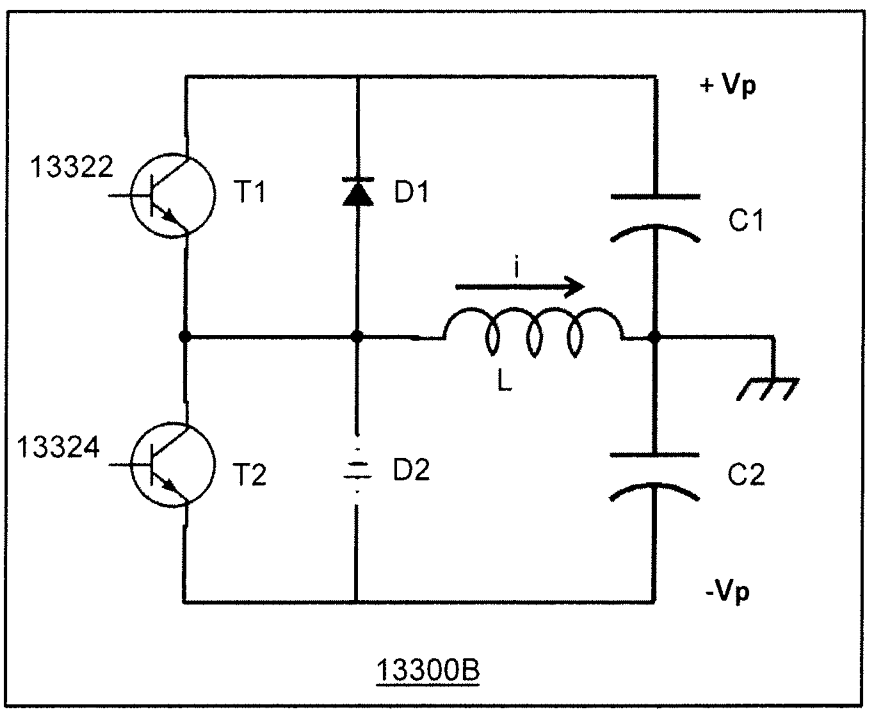
Figure 134B:
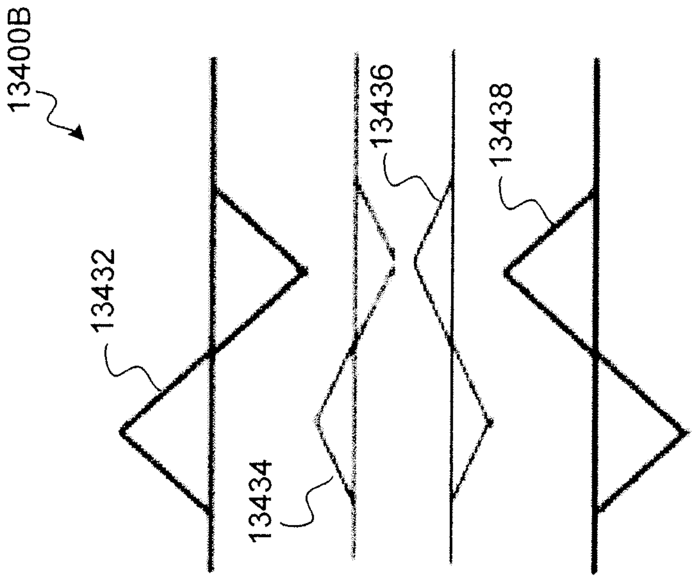
Figure 134A:
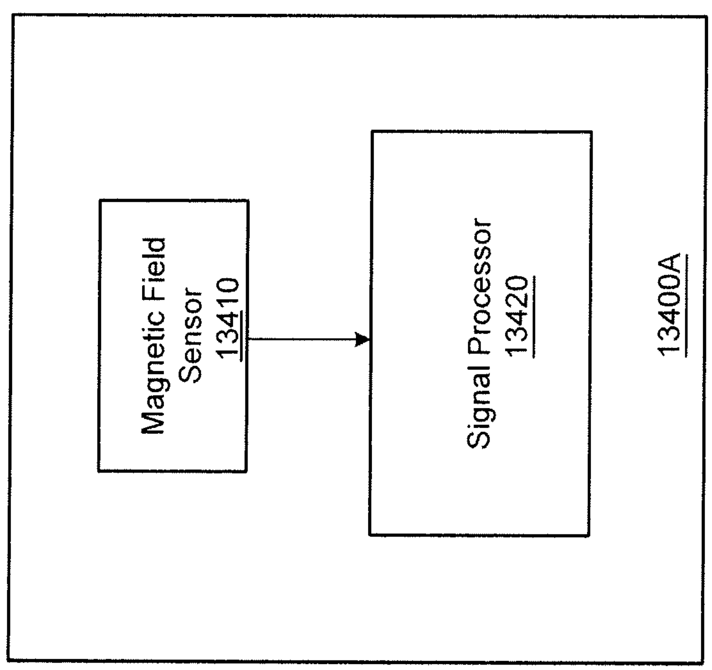
Figure 135:
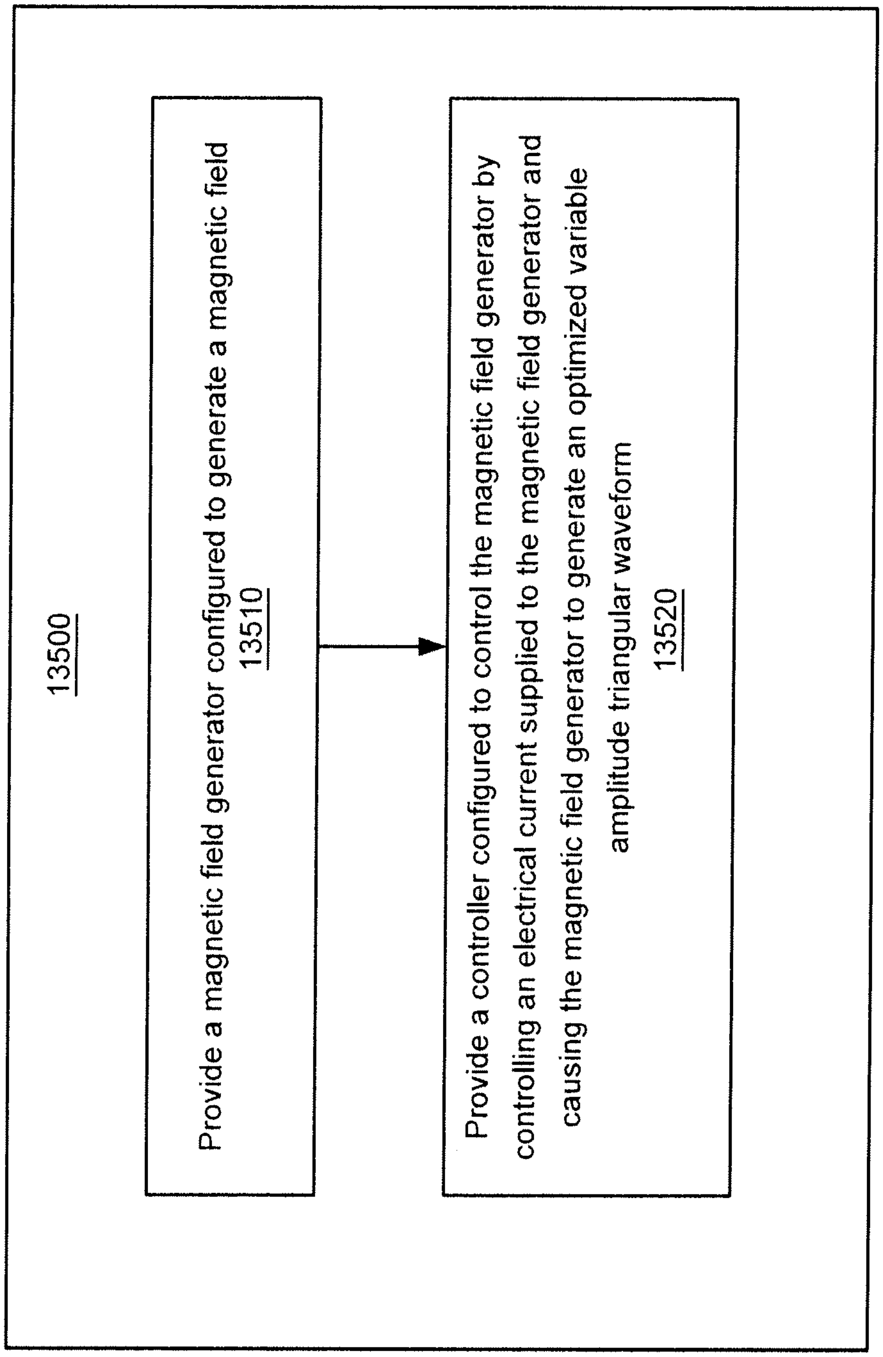
Figure 136:
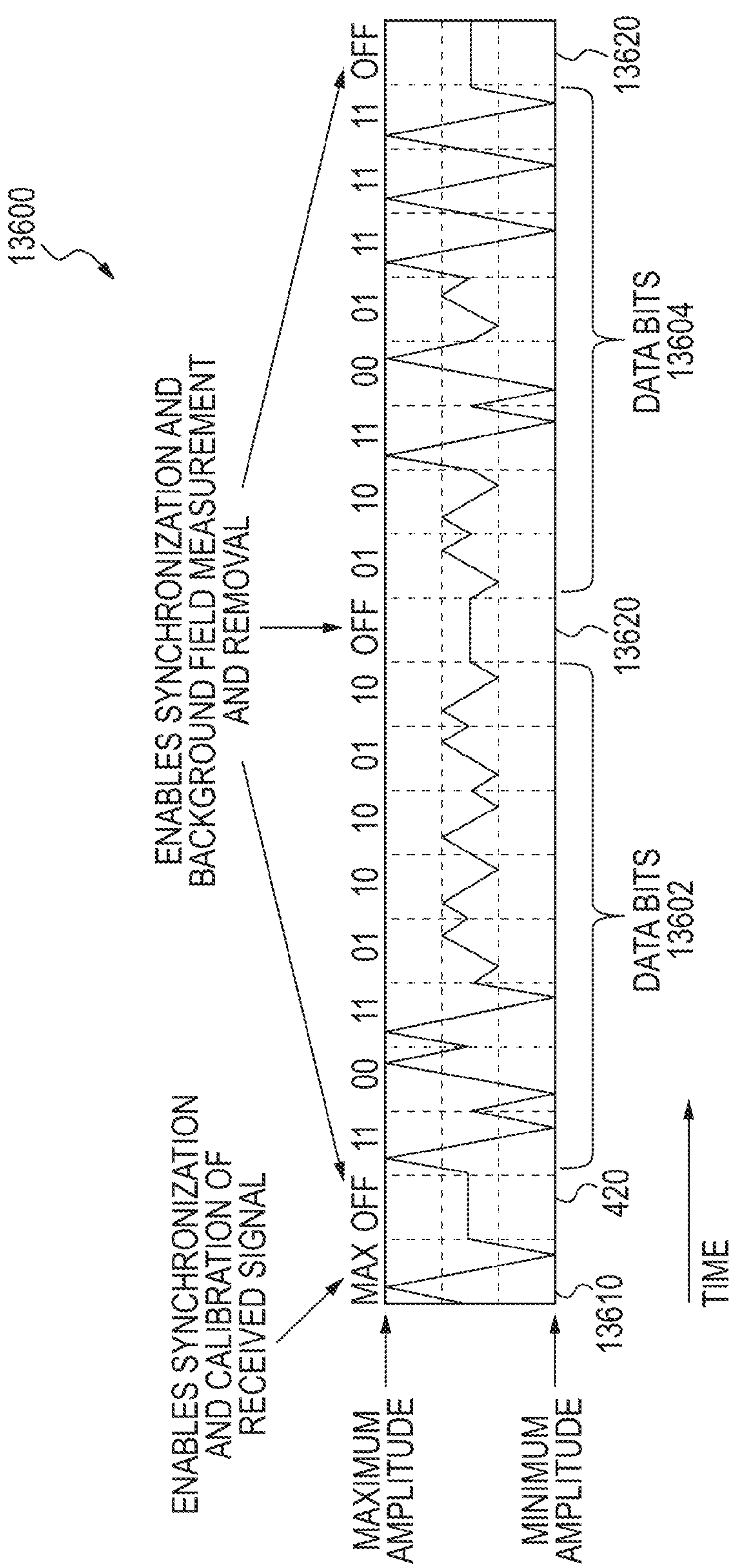
Figure 137:
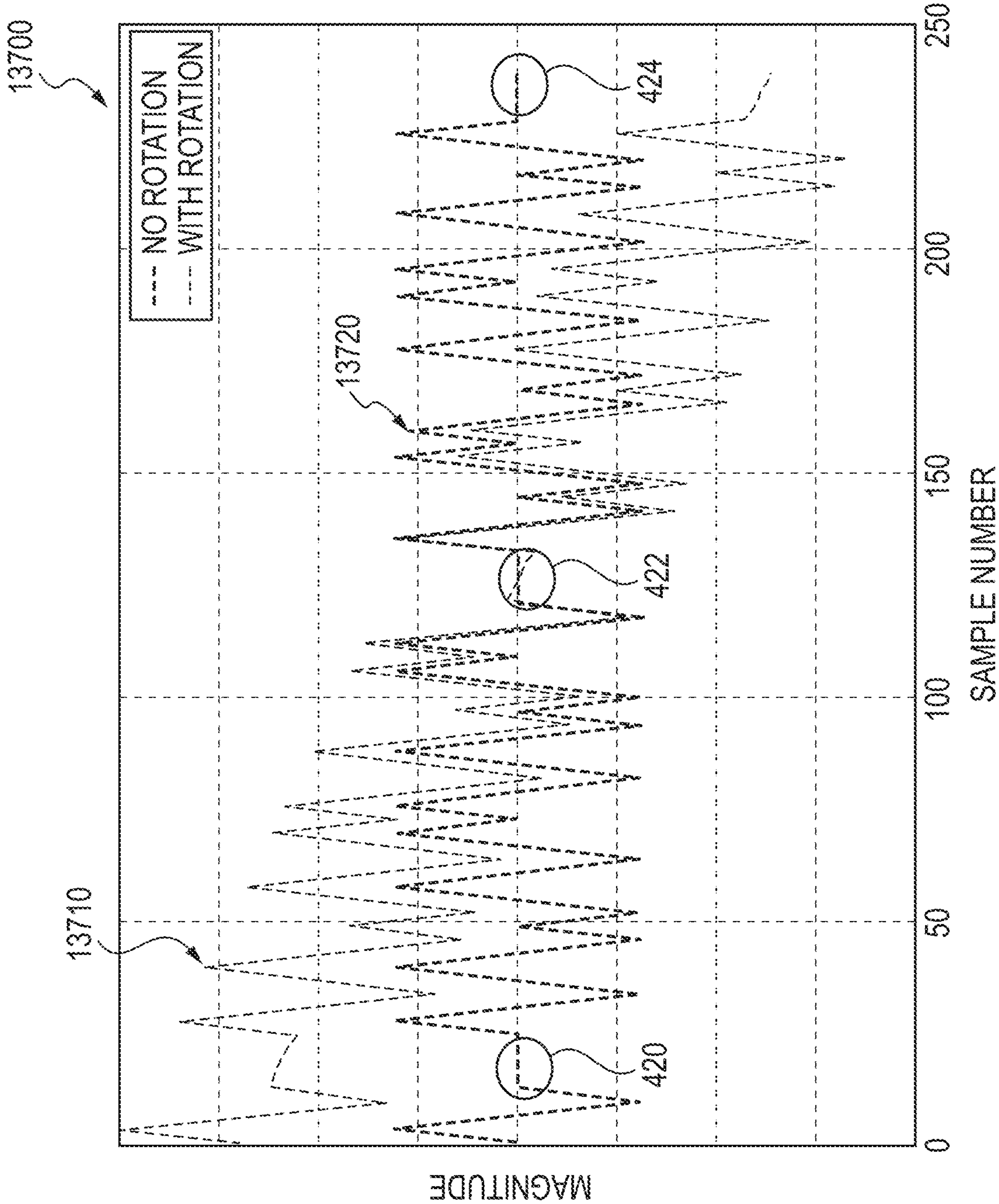
Figure 138A:
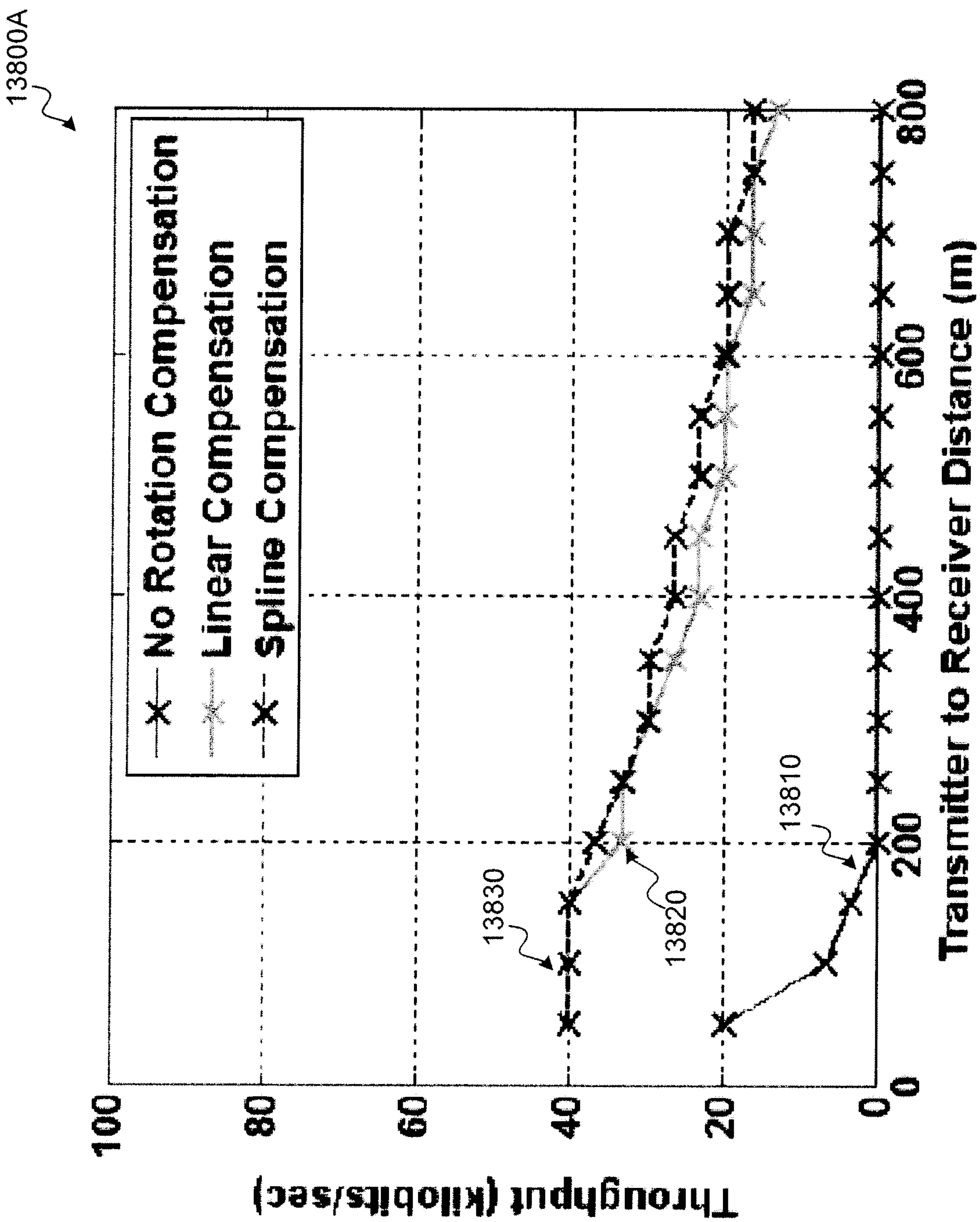
Figure 138B:
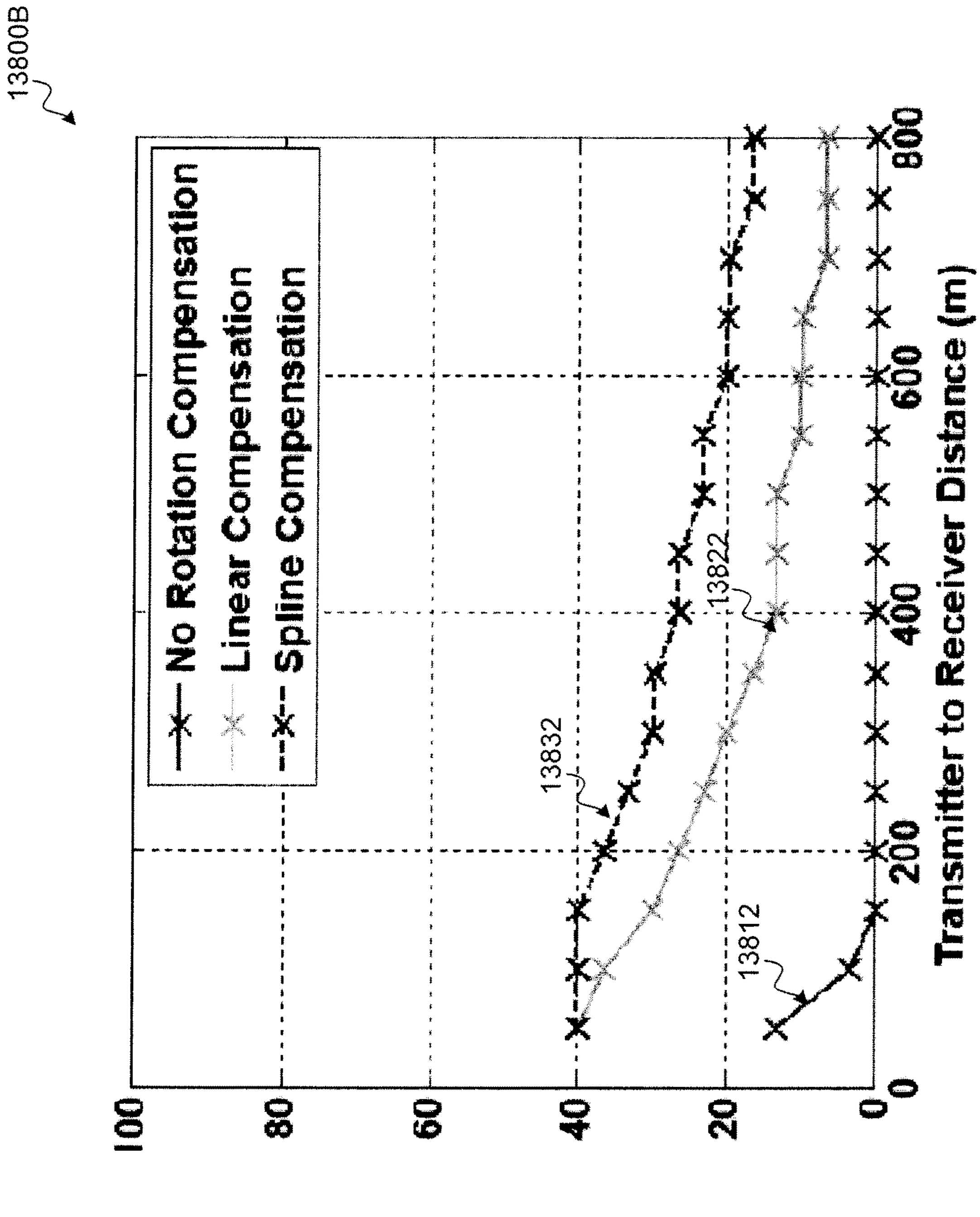
Figure 139:
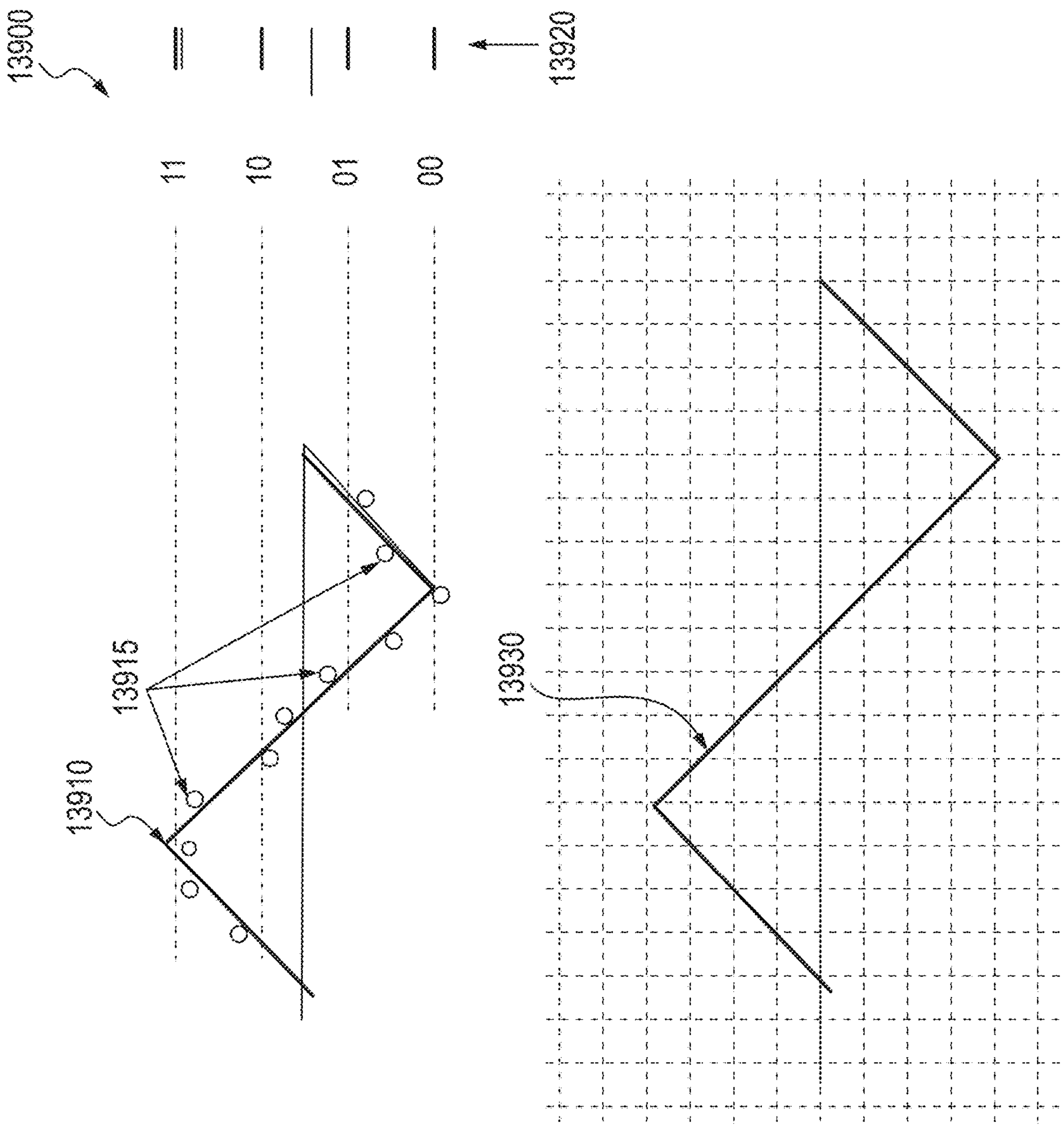
Figure 140A:
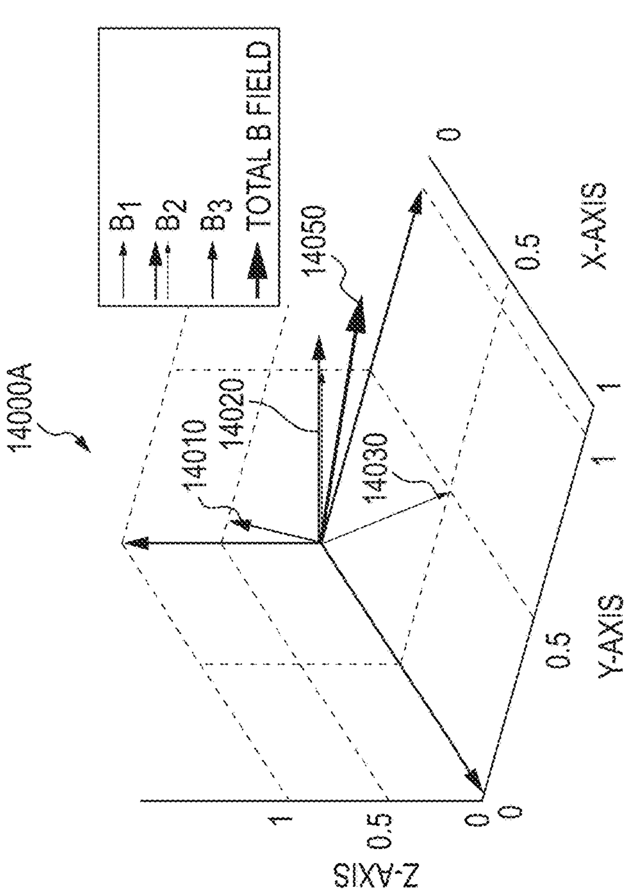
Figure 140B:
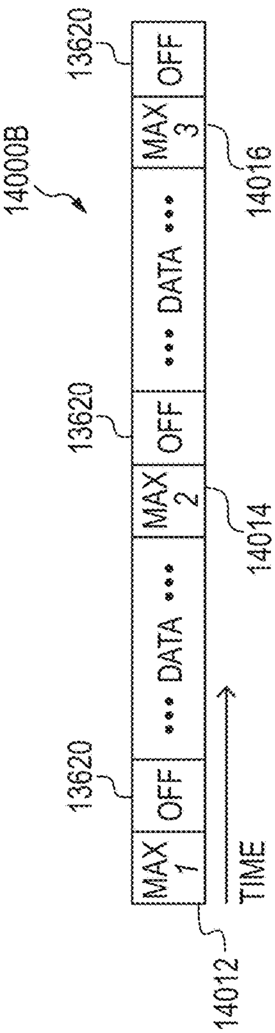
Figure 141A:
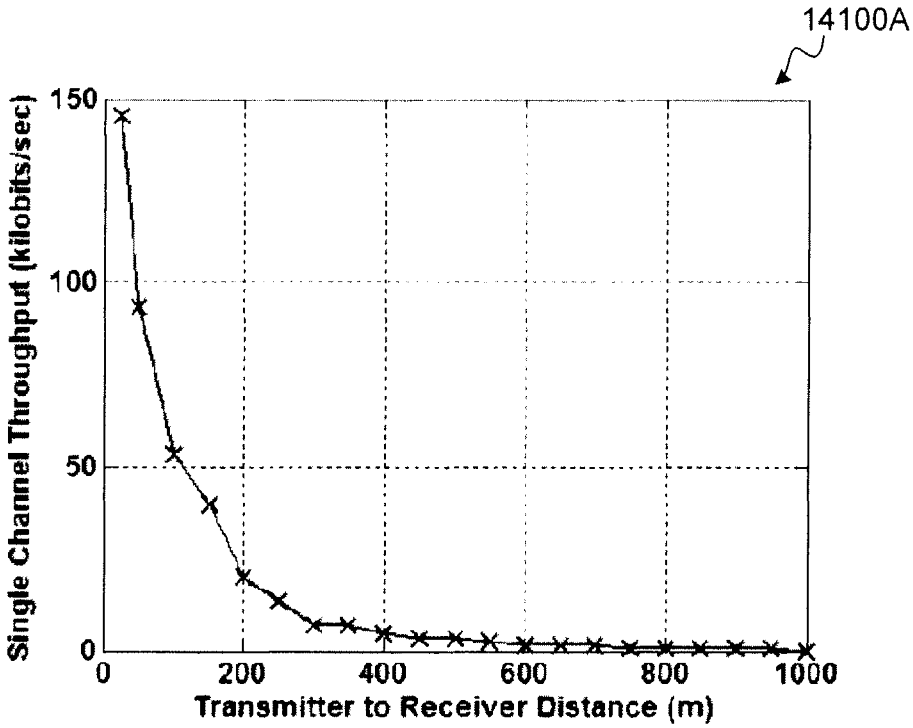
Figure 141B:
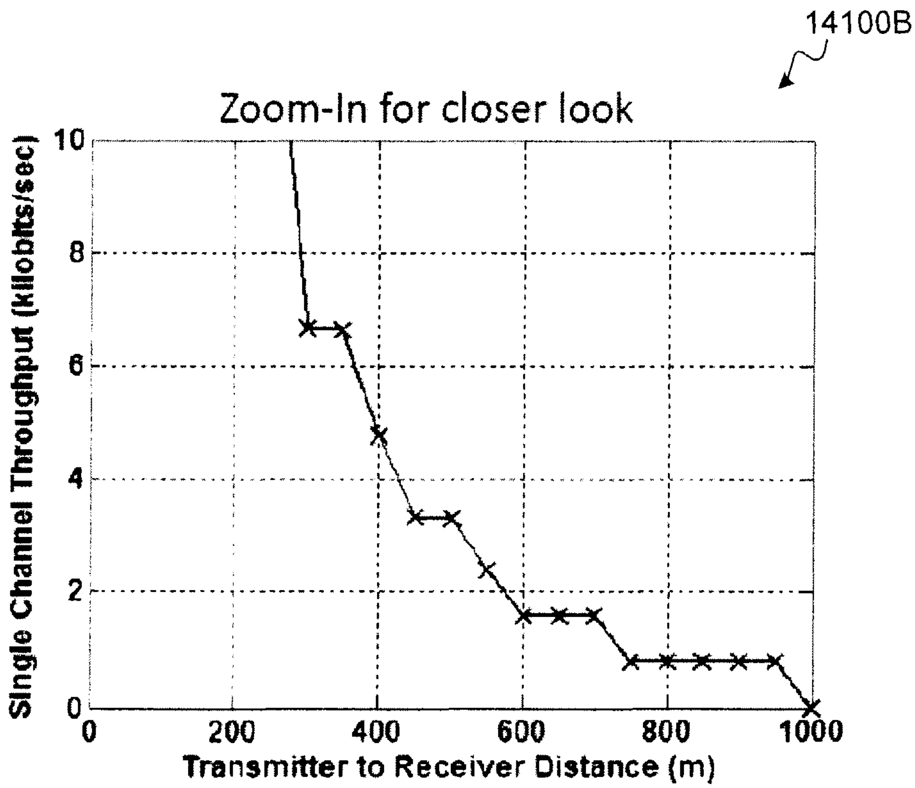
Figure 142B:
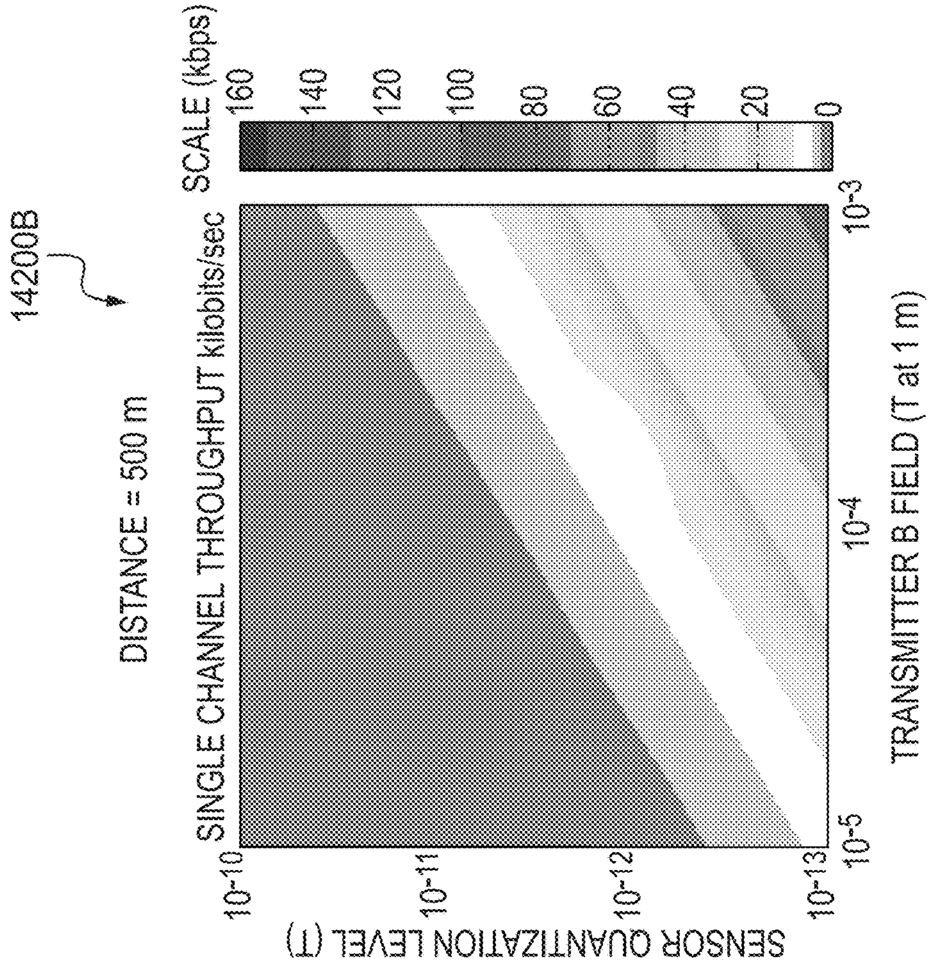
Figure 142A:
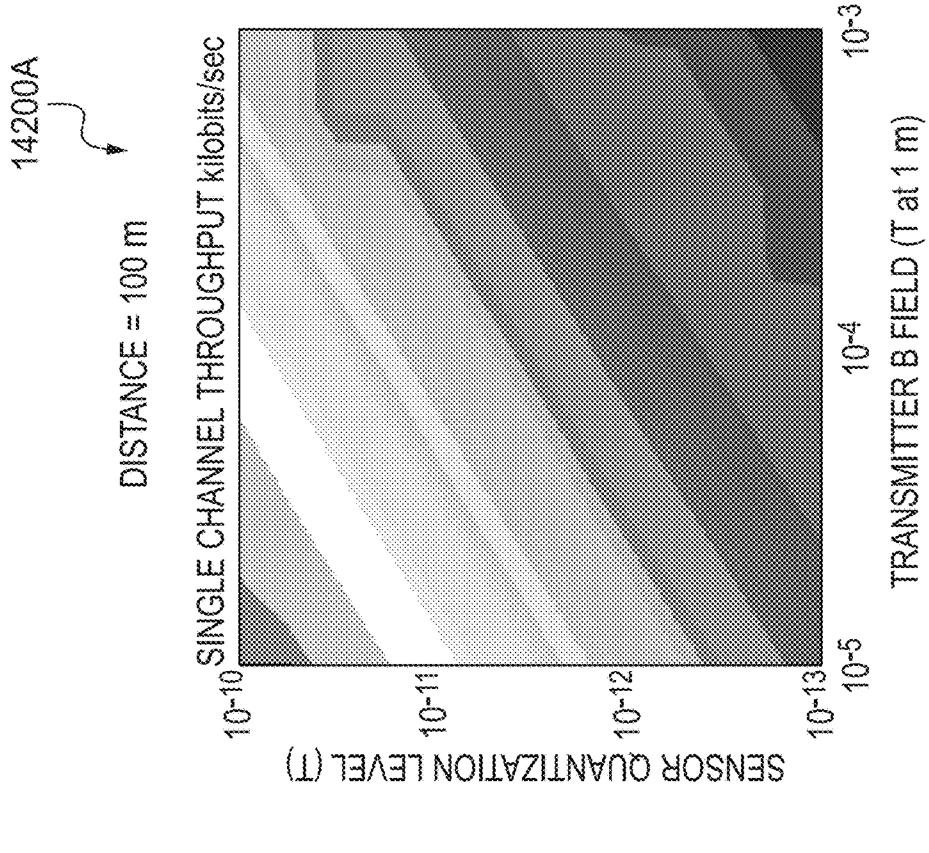

FIGS. 133A-133B are diagrams illustrating examples of a high-level architecture of a magnetic communication transmitter and a schematic of a circuit of a controller, according to certain embodiments;

FIGS. 134A-134B are diagrams illustrating examples of a high-level architecture of a magnetic communication receiver and a set of amplitude modulated waveforms, according to certain embodiments;

FIG. 135 is a diagram illustrating an example of a method for providing a magnetic communication transmitter, according to certain embodiments;

FIG. 136 is a diagram illustrating an example of a data frame of a magnetic communication transmitter, according to certain embodiments;

FIG. 137 is a diagram illustrating an example of motion compensation scheme, according to certain embodiments;

FIGS. 138A-138B are diagrams illustrating examples of throughput results with turning, rolling and low-frequency compensation, according to certain embodiments;

FIG. 139 is a diagram illustrating an example adaptive modulation scheme, according to certain embodiments;

FIGS. 140A through 140C are diagrams illustrating components for implementing an example technique for multiple channel resolution, according to certain embodiments;

FIGS. 141A-141B are diagrams illustrating single channel throughput variations versus transmitter-receiver distance, according to certain embodiments;

FIGS. 142A-142B are diagrams illustrating simulated performance results, according to certain embodiments;

Communication by Magnio Using Magnetometers

Figure 143:
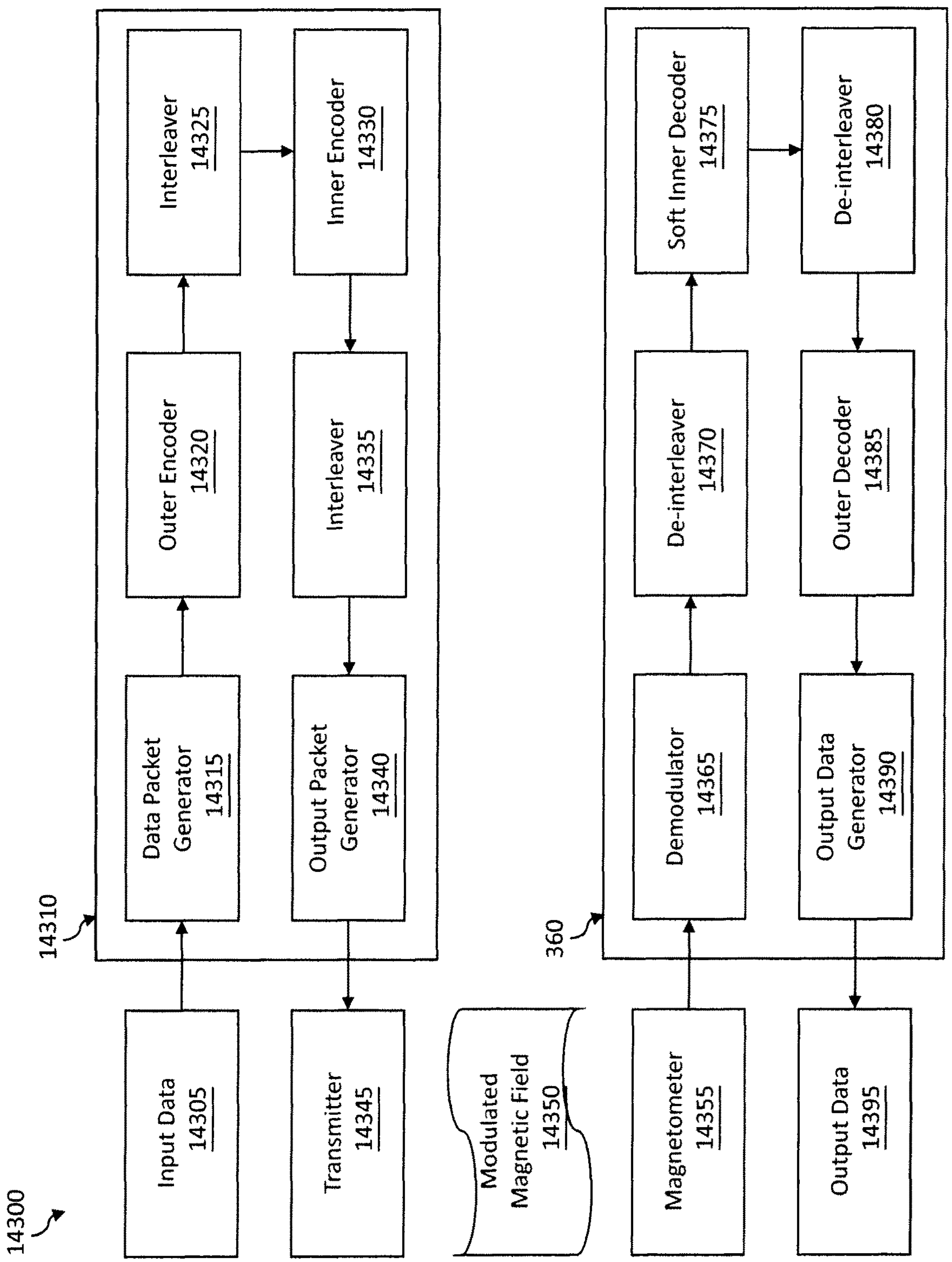
Figure 144A:
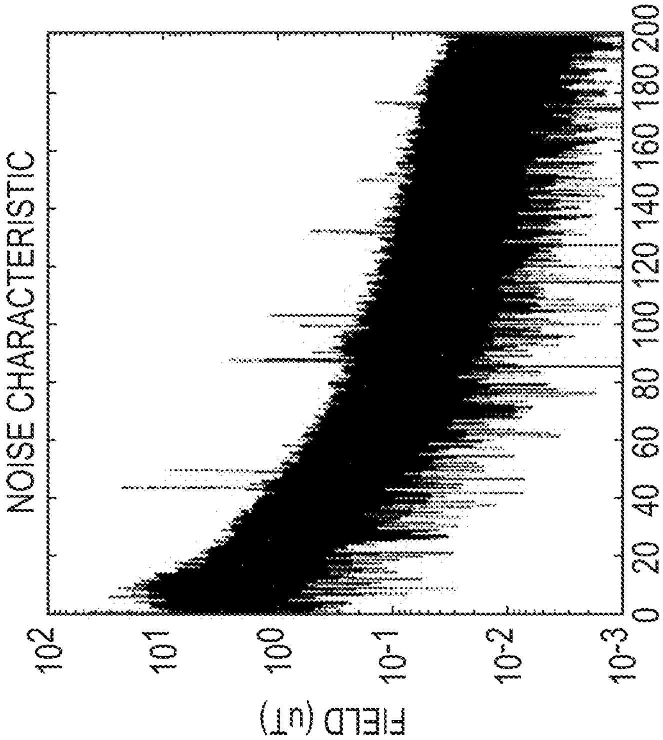
Figure 144B:
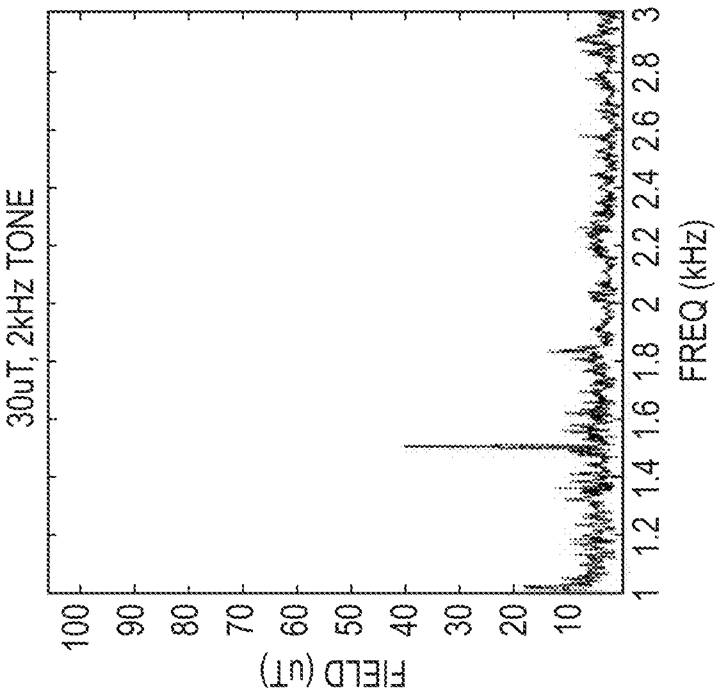
Figure 145:
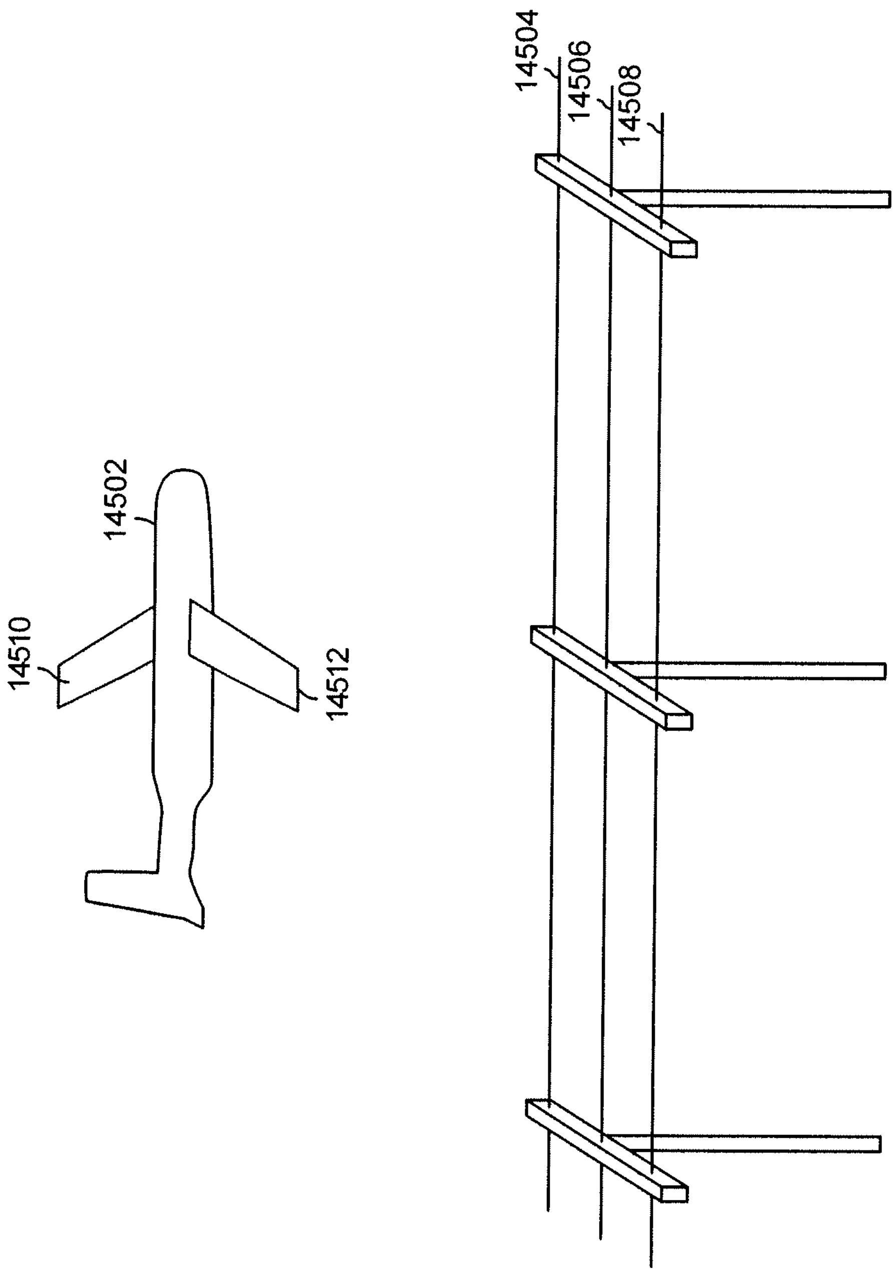
Figure 146A:
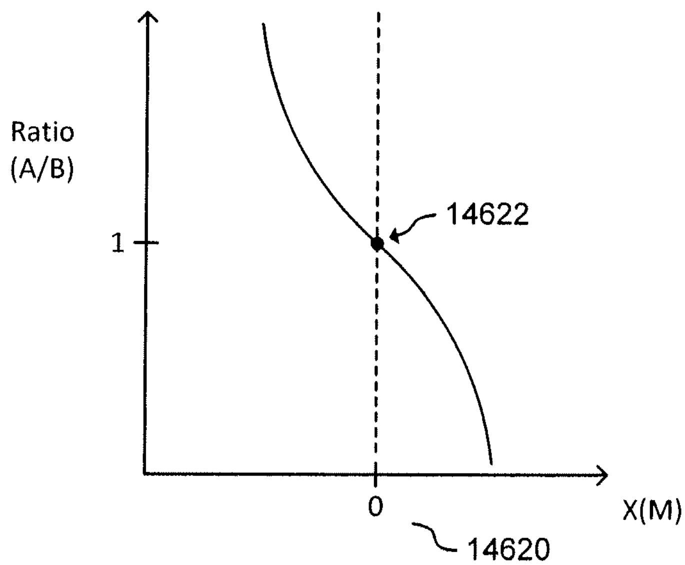
Figure 146B:
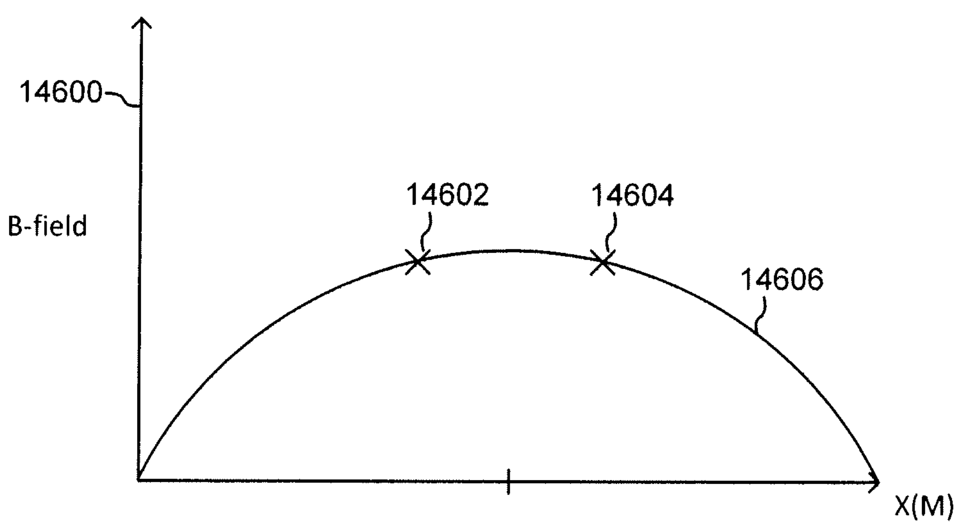
Figure 147:
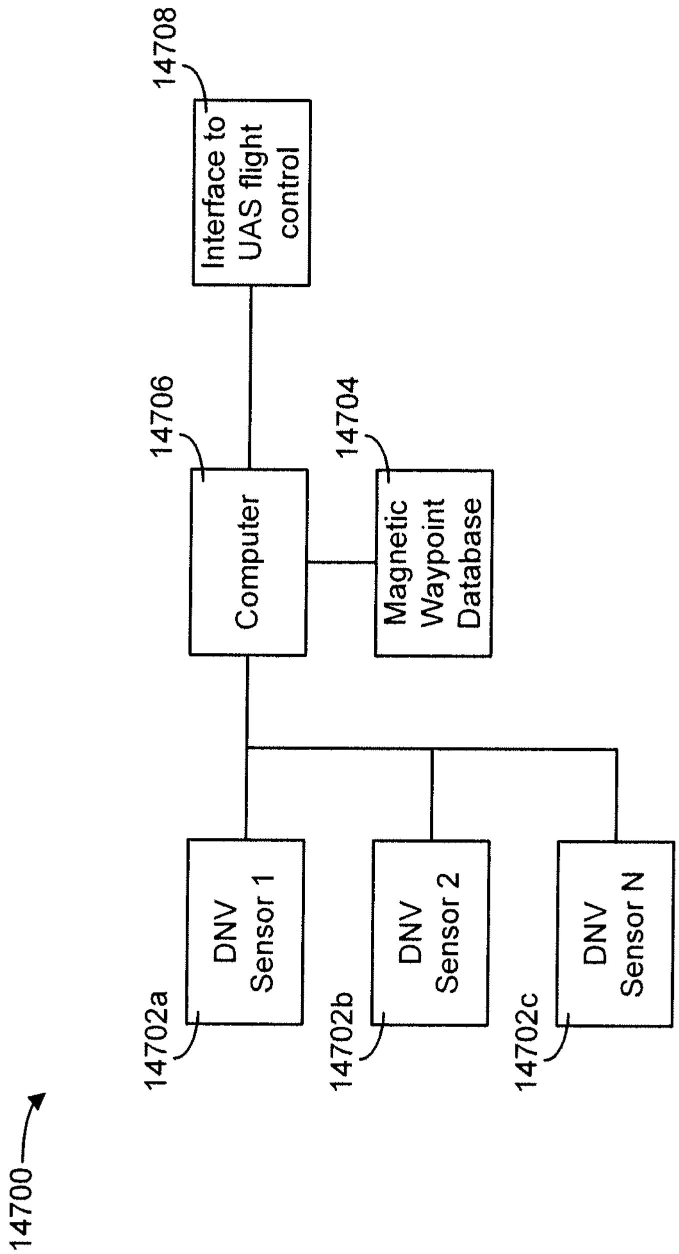
Figure 148:
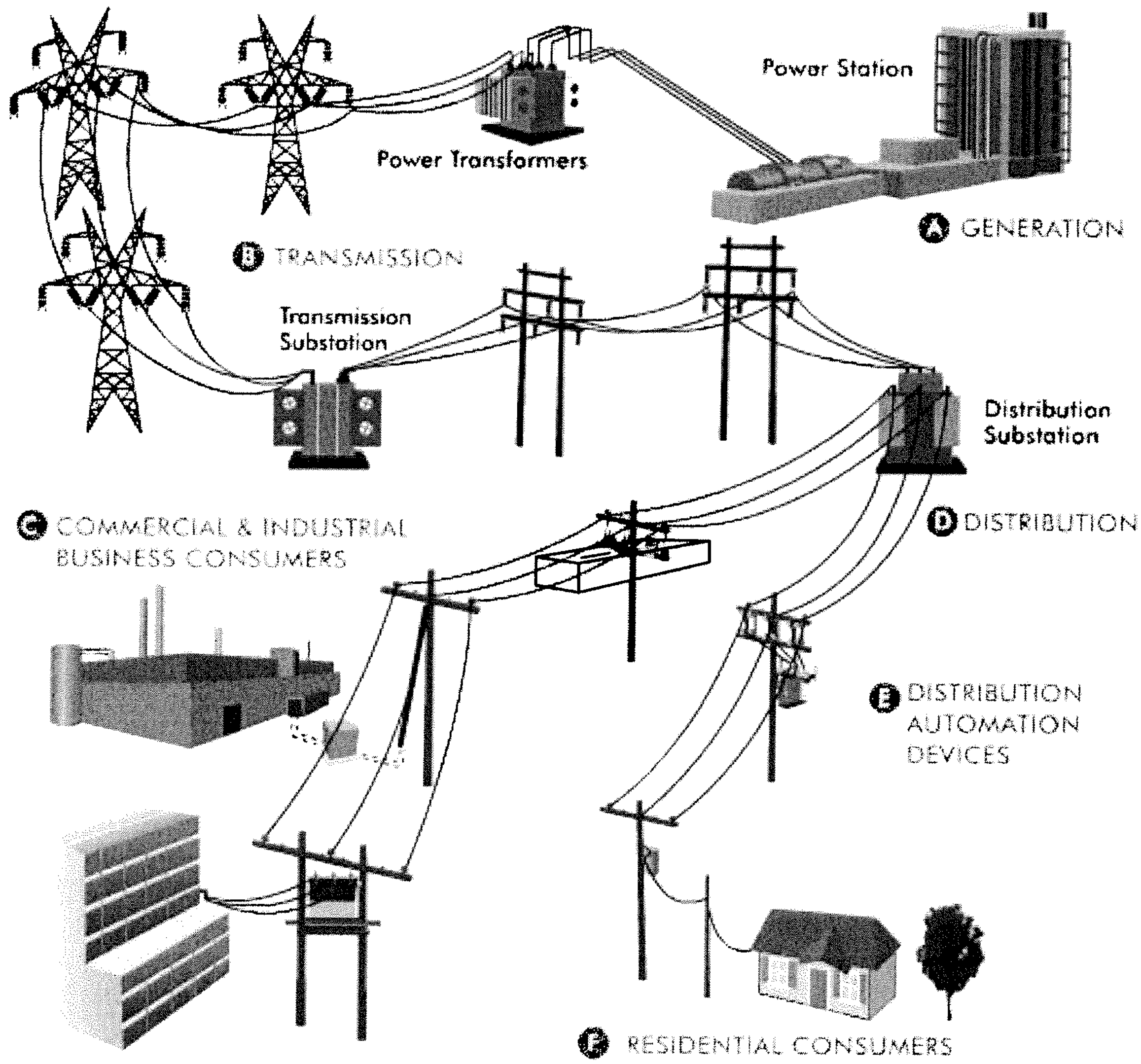
Figure 149A:
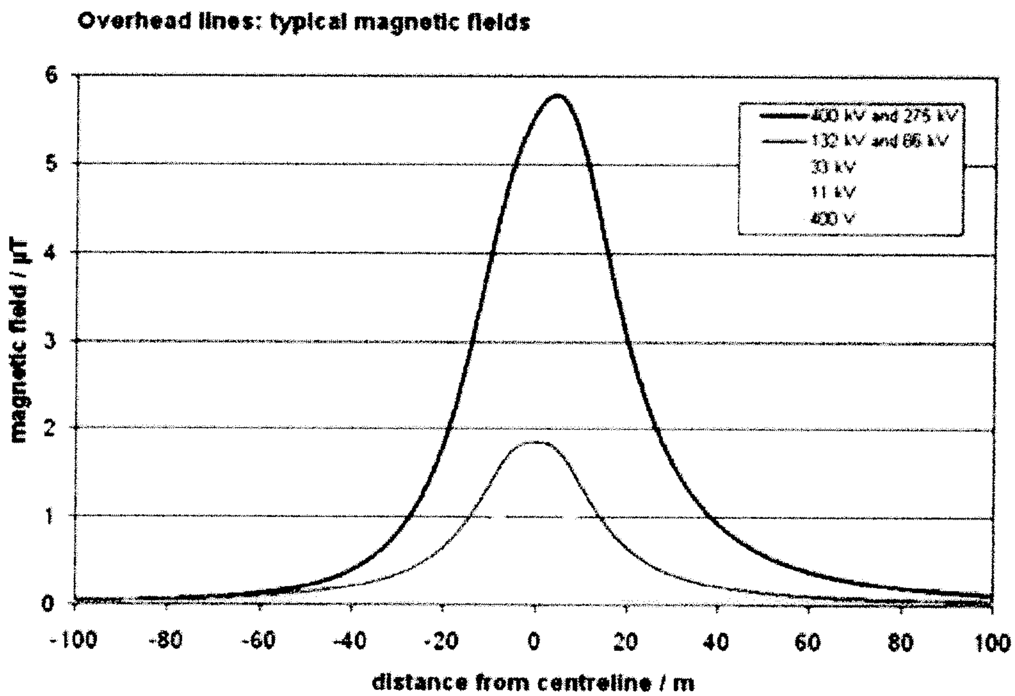
Figure 149B:
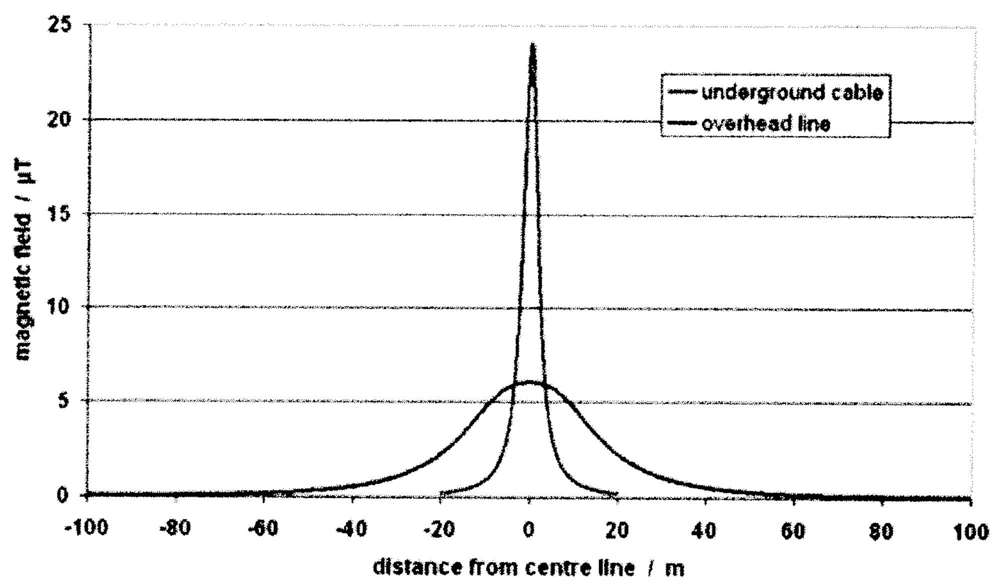
Figure 150:
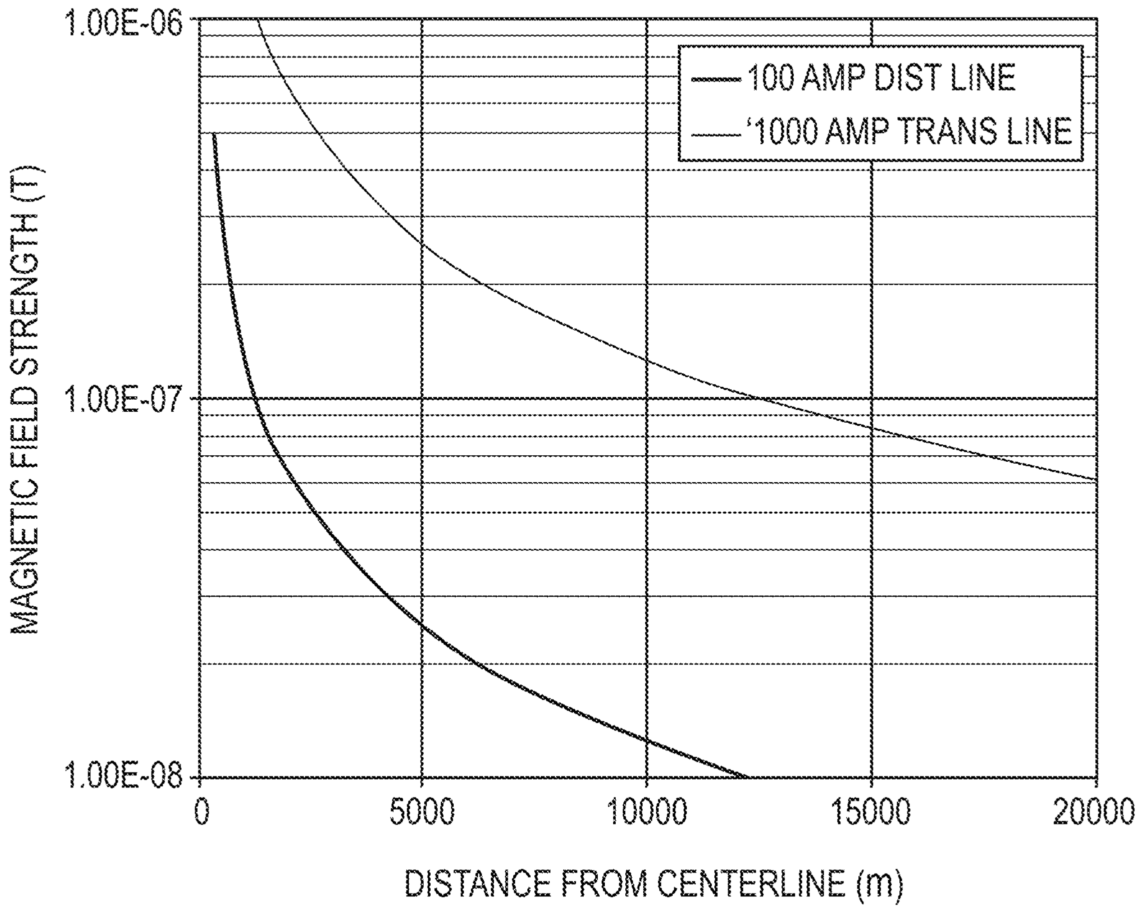
Figure 151:
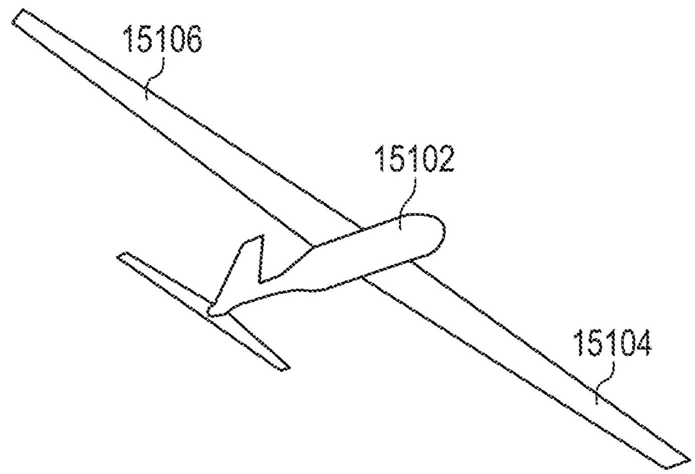
Figure 152:
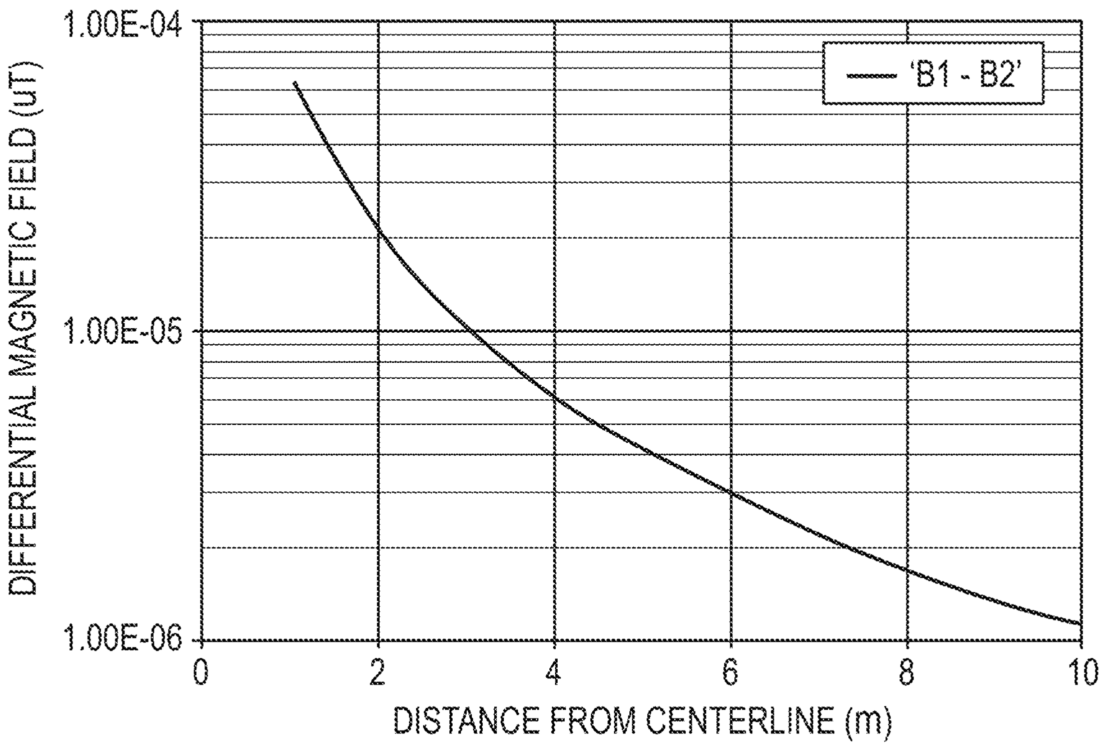
Figure 153:
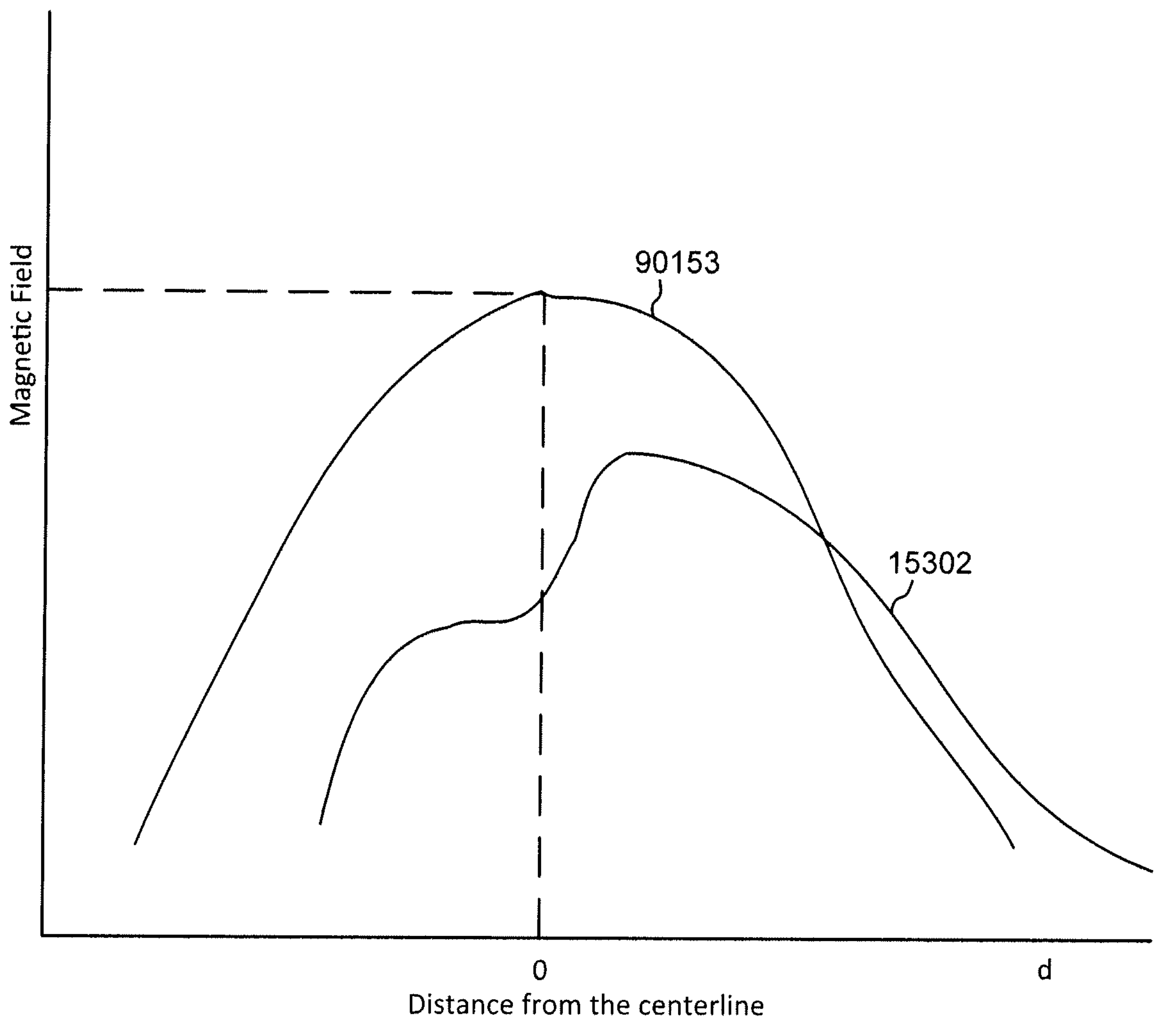

FIG. 143 is a block diagram of a magnetic communication system in accordance with an illustrative embodiment;

FIGS. 144A and 144B show the strength of a magnetic field versus frequency in accordance with an illustrative embodiment;

Navigation System Using Power Transmission and/or Communication System Using Magnetometers FIG. 145 illustrates a low altitude flying object in accordance with some illustrative implementations;

FIG. 146A illustrates a ratio of signal strength of two magnetic sensors, A and B, attached to wings of the UAS 102 as a function of distance, x, from a center line of a power in accordance with some illustrative implementations;

FIG. 146B illustrates a composite magnetic field (B-field) in accordance with some illustrative implementations;

FIG. 147 illustrates a high-level block diagram of an example UAS navigation system in accordance with some illustrative implementations;

FIG. 148 illustrates an example of a power line infrastructure;

FIGS. 149A and 149B illustrate examples of magnetic field distribution for overhead power lines and underground power cables;

FIG. 150 illustrates examples of magnetic field strength of power lines as a function of distance from the centerline;

FIG. 151 illustrates an example of a UAS equipped with DNV sensors in accordance with some illustrative implementations;

FIG. 152 illustrates a plot of a measured differential magnetic field sensed by the DNV sensors when in close proximity of the power lines in accordance with some illustrative implementations;

FIG. 153 illustrates an example of a measured magnetic field distribution for normal power lines and power lines with anomalies according to some implementations;

Defect Detection in Power Transmission Lines Using Magnetometers

Figure 154A:
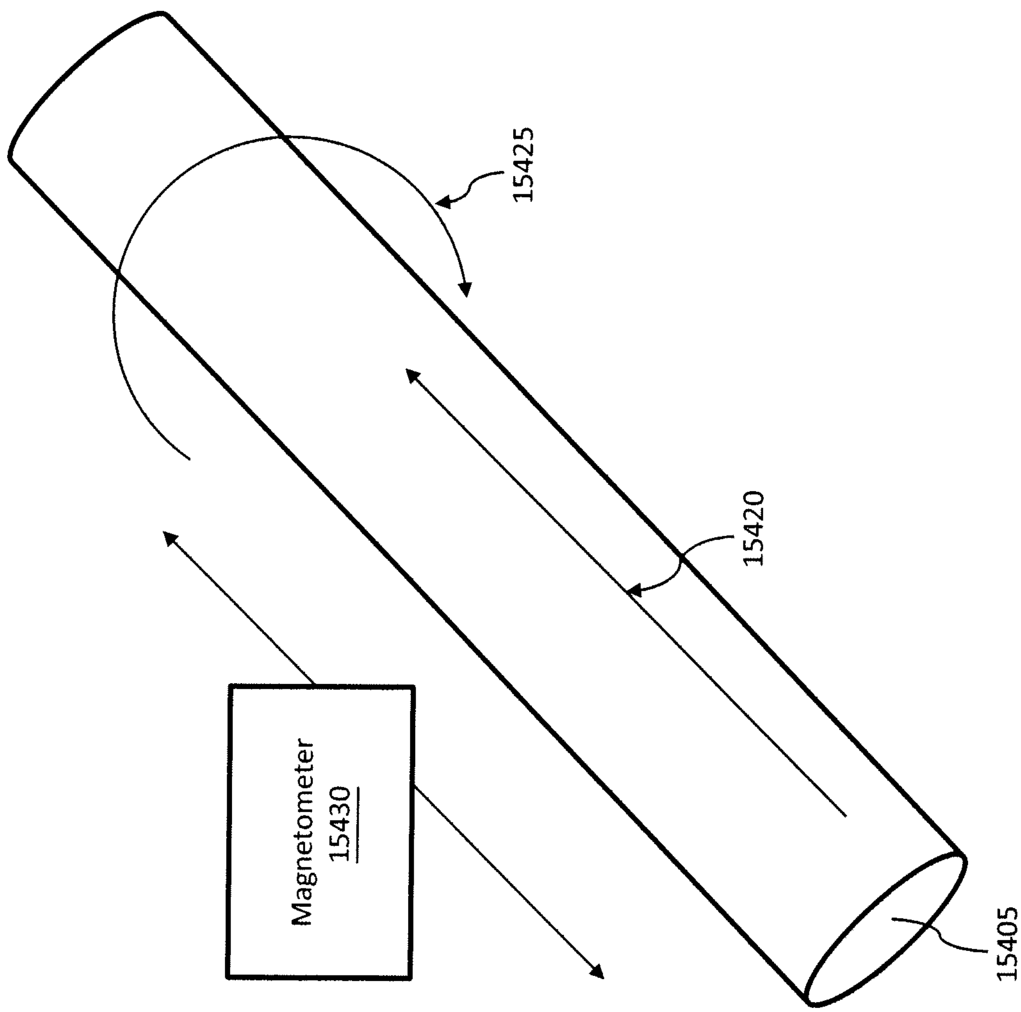
Figure 154B:
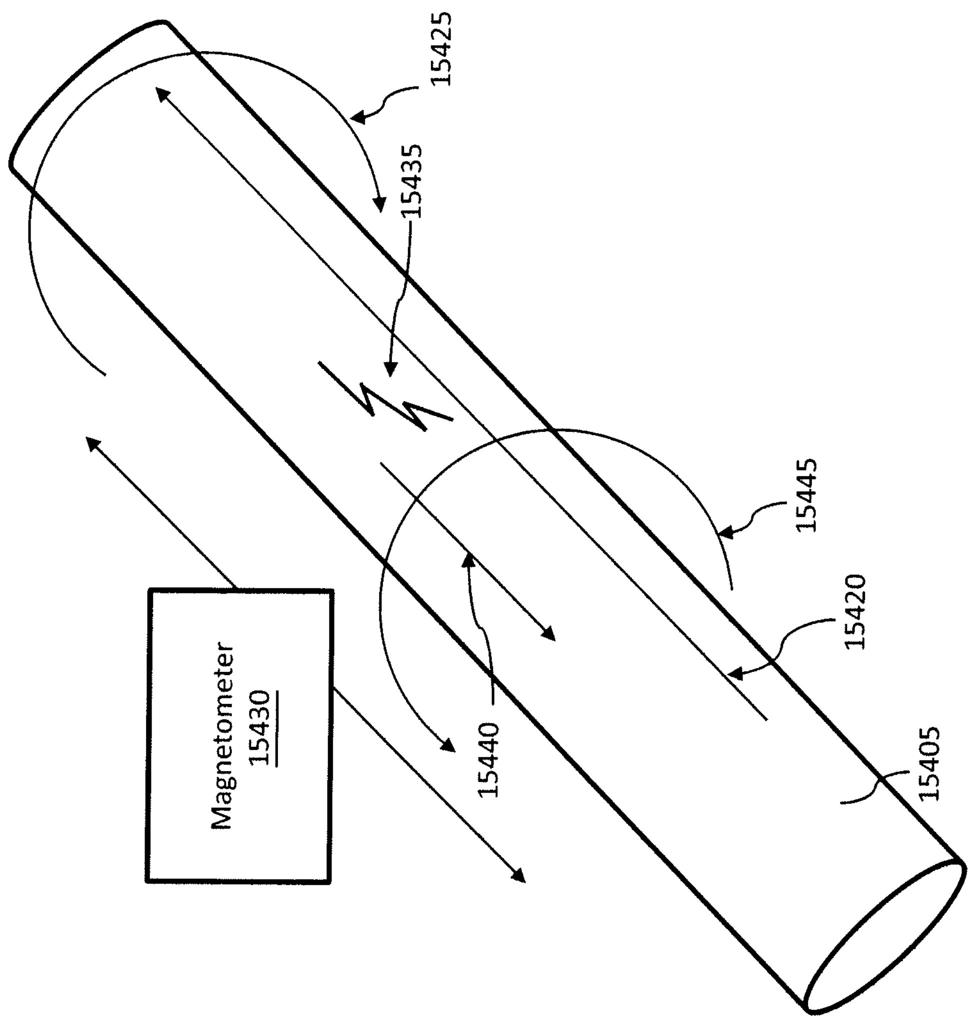
Figure 155:
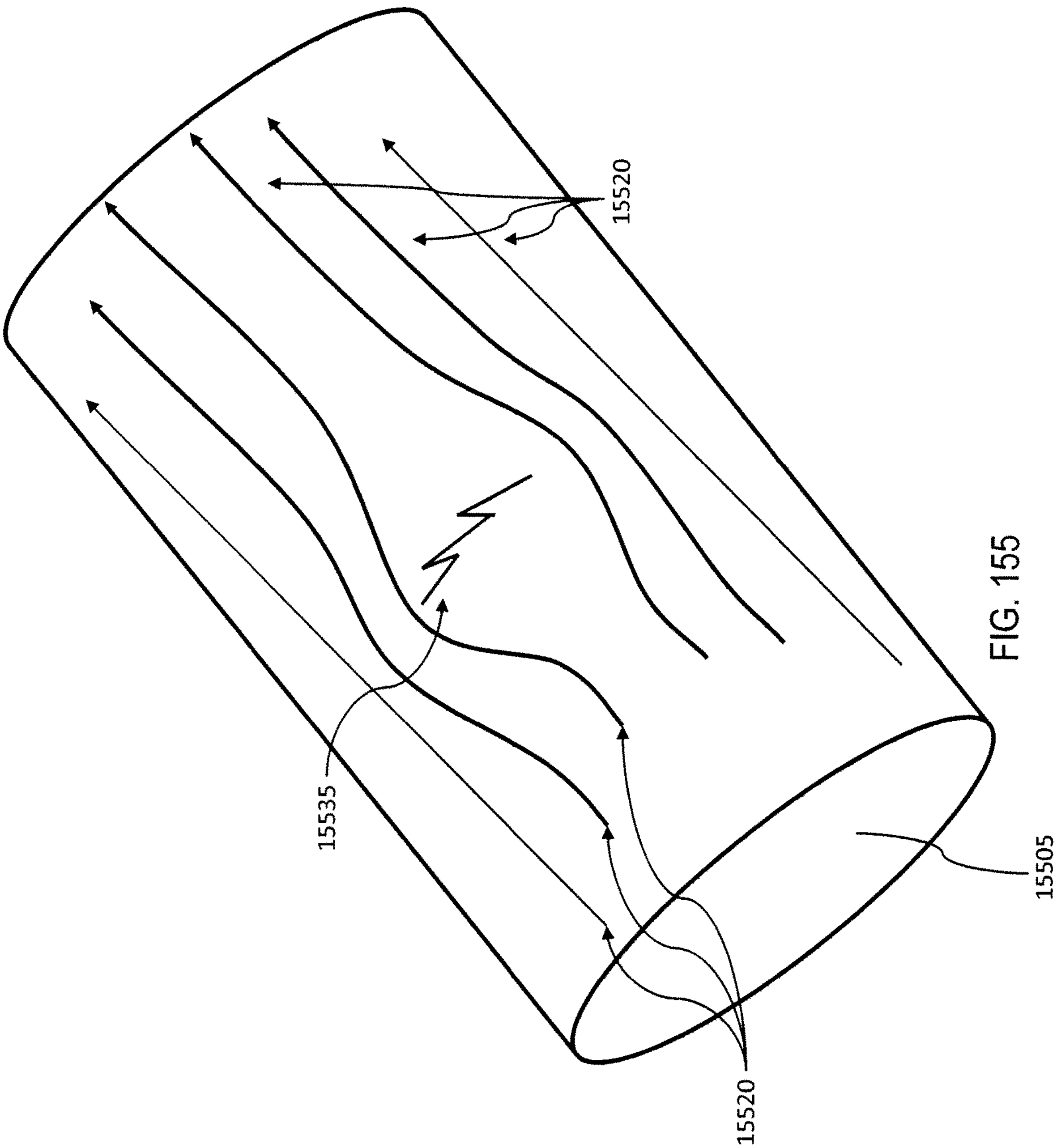
Figure 156:
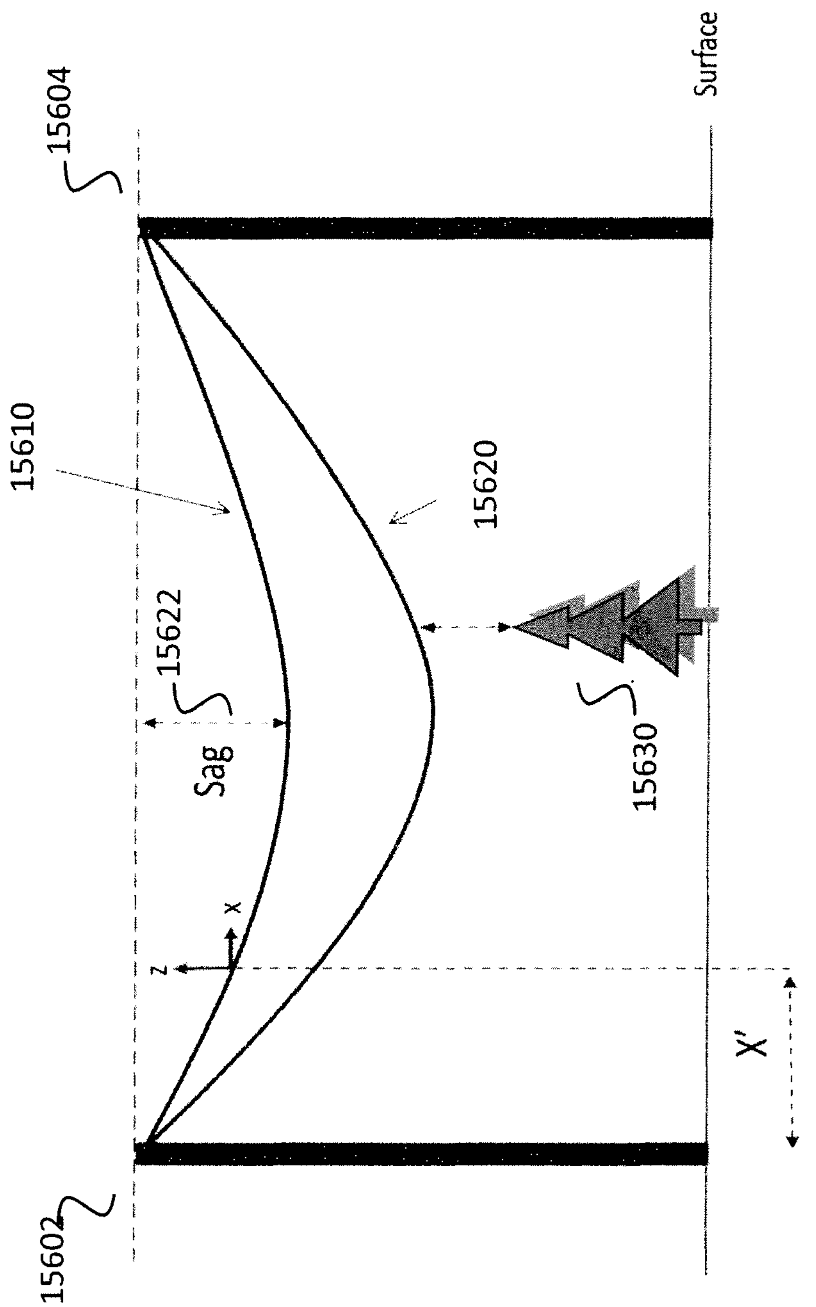
Figure 157:
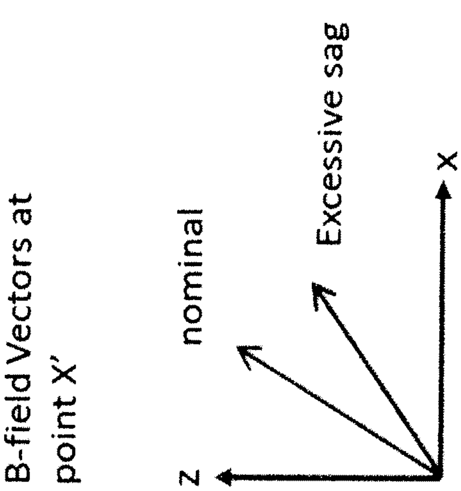
Figure 158:
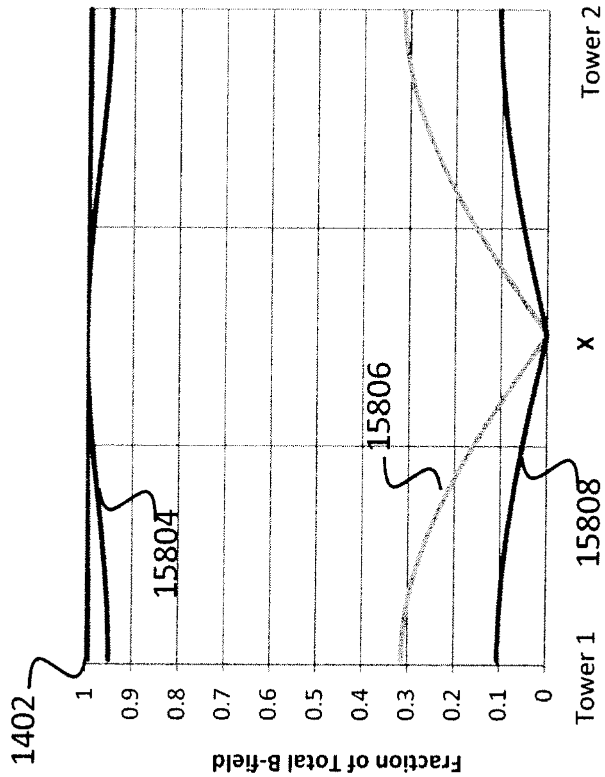

FIGS. 154A and 154B are block diagrams of a system for detecting deformities in transmission lines in accordance with an illustrative embodiment;

FIG. 155 illustrates current paths through a transmission line with a deformity in accordance with an illustrative embodiment;

FIG. 156 illustrates power transmission line sag between transmission towers in accordance with an illustrative embodiment;

FIG. 157 illustrates vector measurements indicating power transmission line sag in accordance with an illustrative embodiment;

FIG. 158 illustrates vector measurements along a path between adjacent towers in accordance with an illustrative embodiment;

In-Situ Power Charging Using Magnetometers

Figure 159:
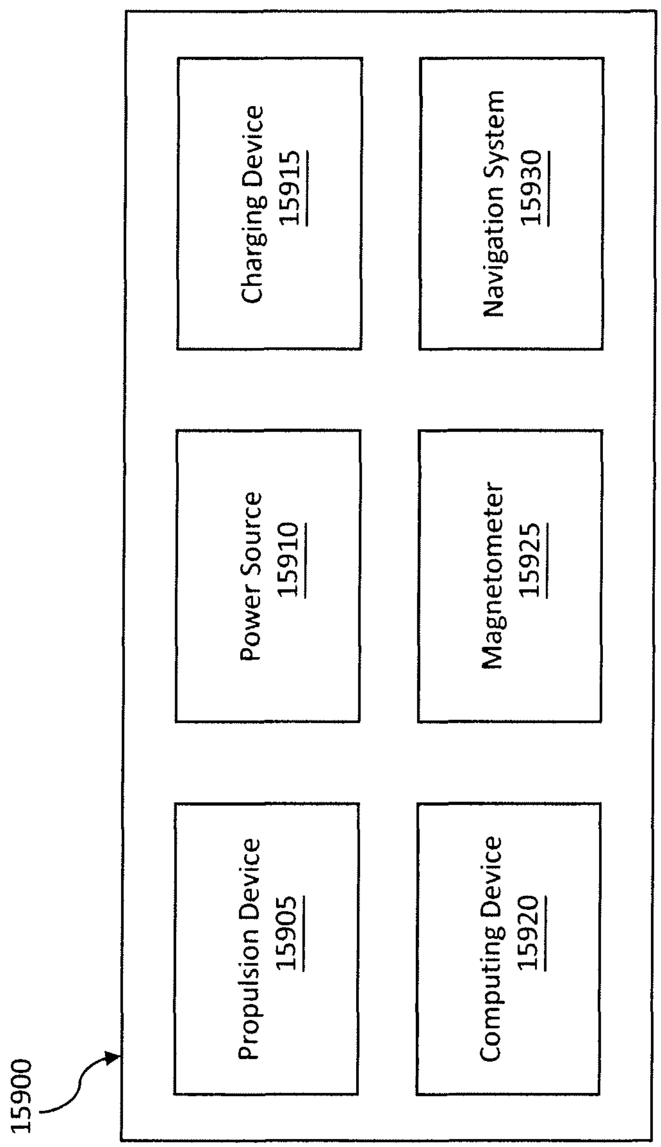
Figure 160:
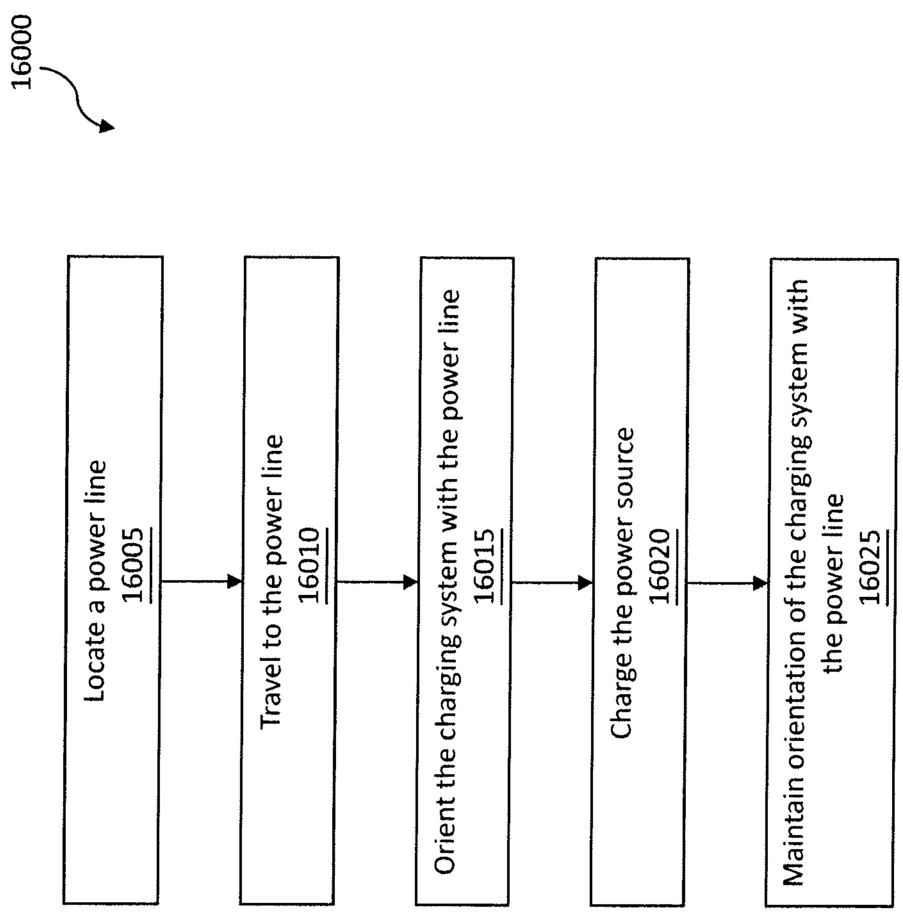
Figure 161:
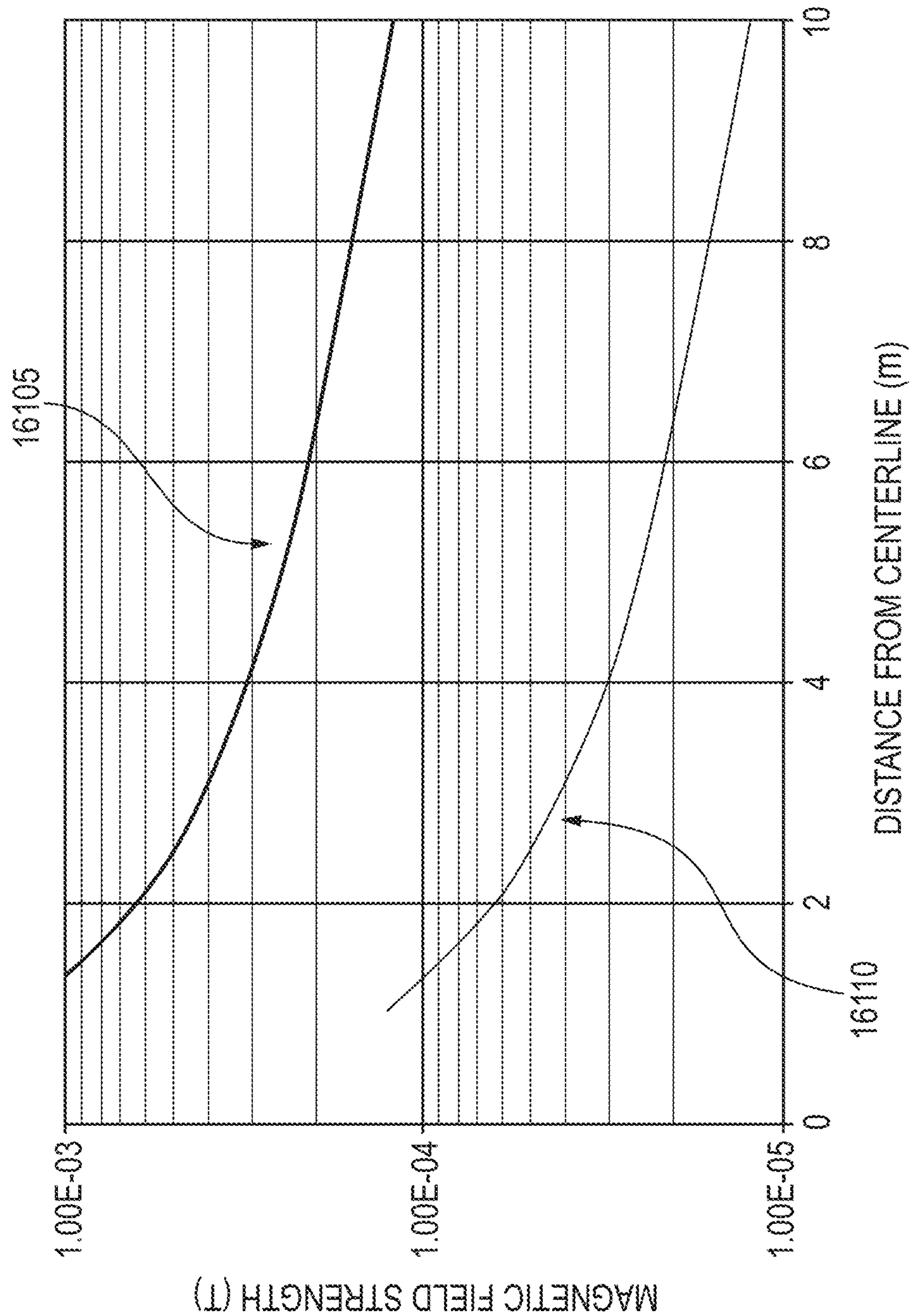

FIG. 159 is a block diagram of a vehicular system in accordance with an illustrative embodiment;

FIG. 160 is a flow chart of a method for charging a power source in accordance with an illustrative embodiment;

FIG. 161 is a graph of the strength of a magnetic field versus distance from the conductor in accordance with an illustrative embodiment;

Position Encoder Using Magnetometers

Figure 162:
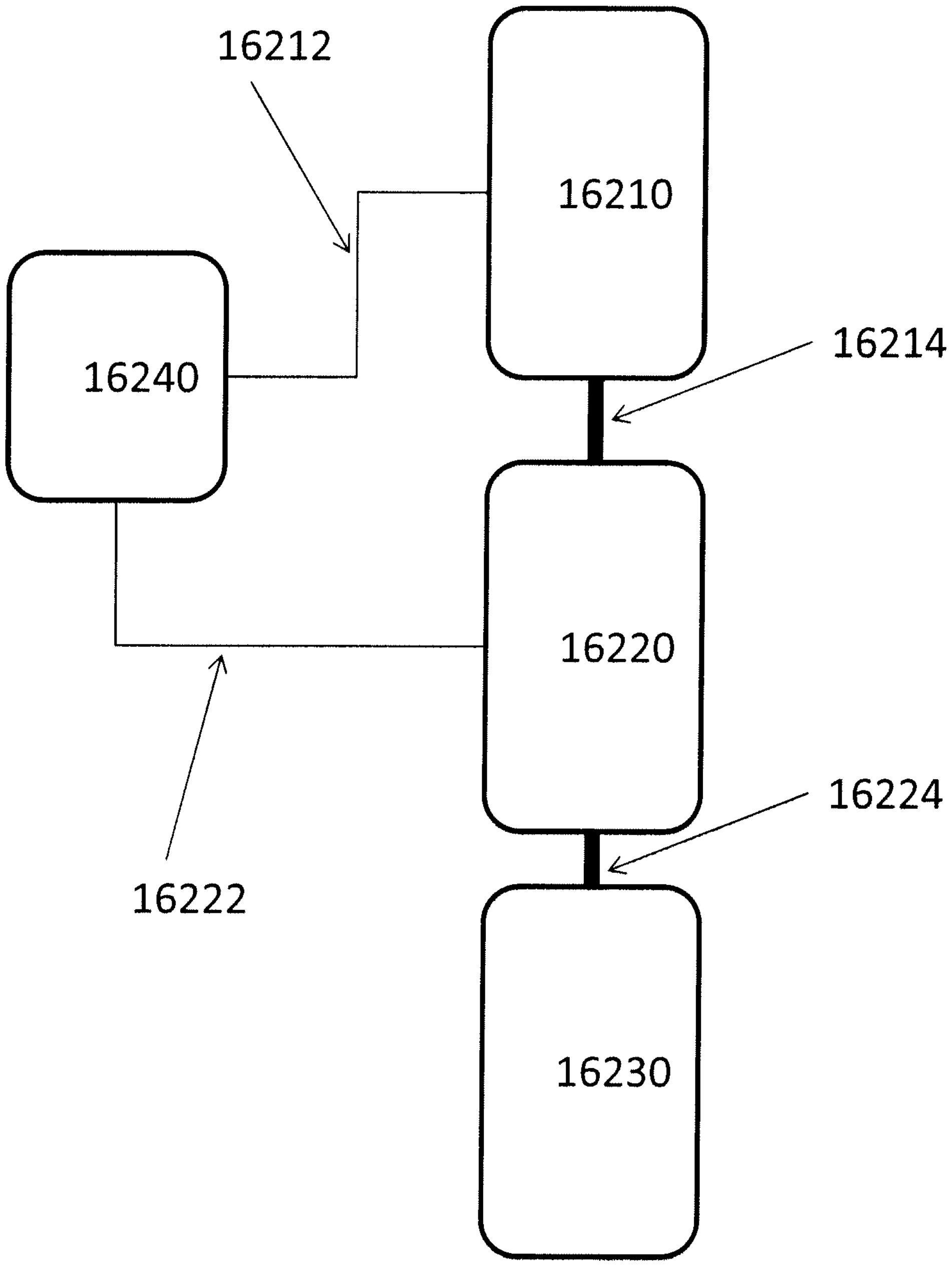
Figure 163:
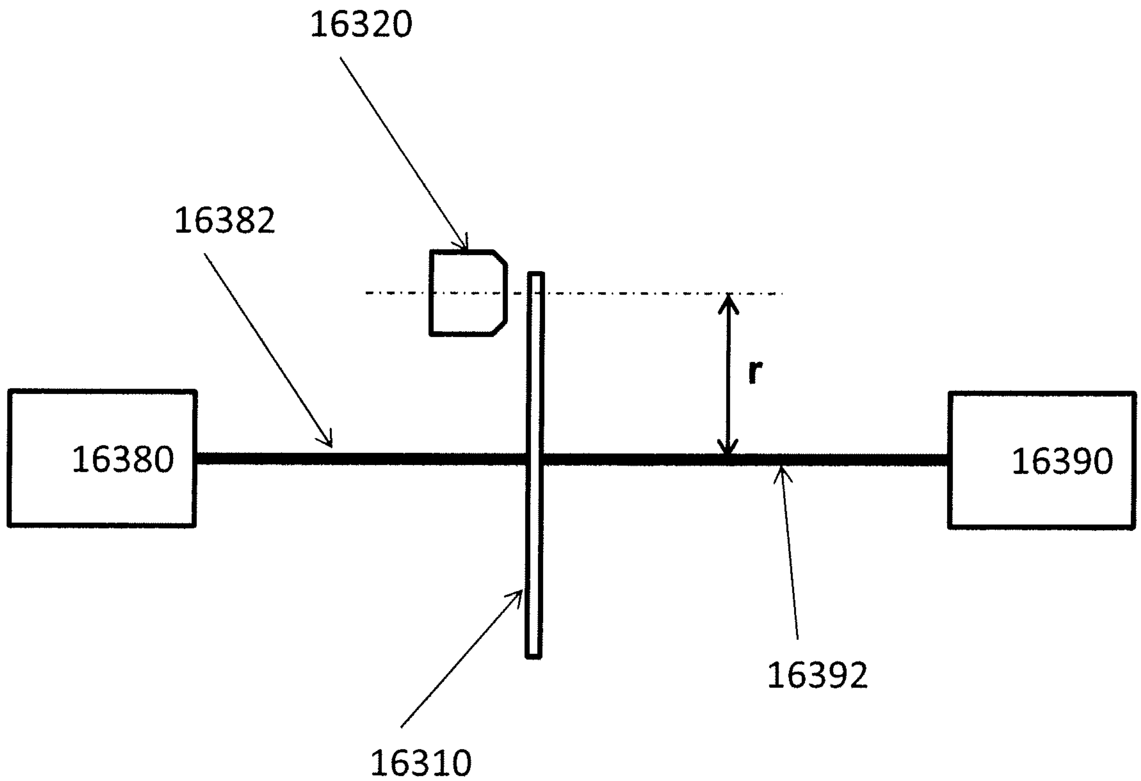
Figure 164:
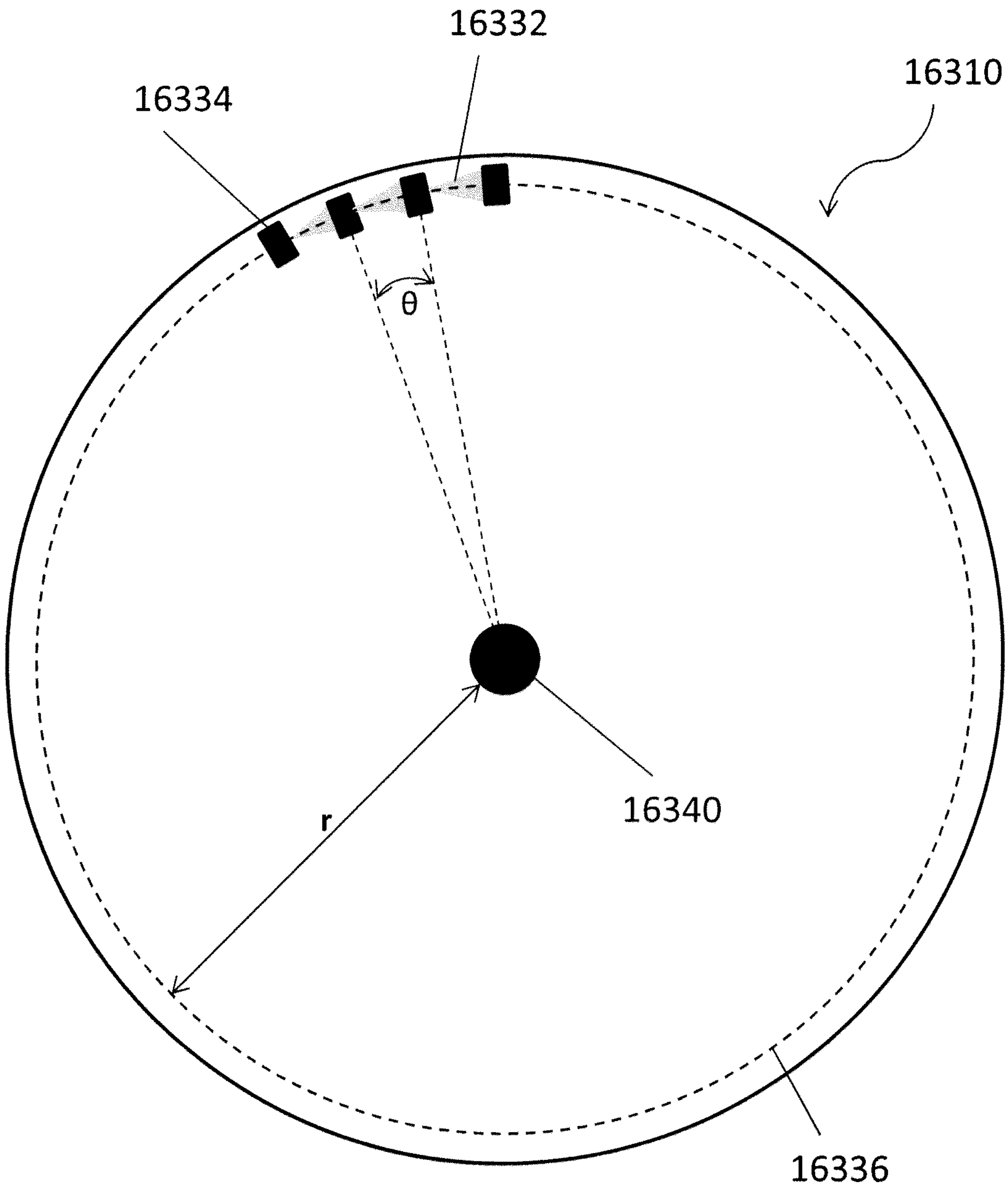
Figure 165:
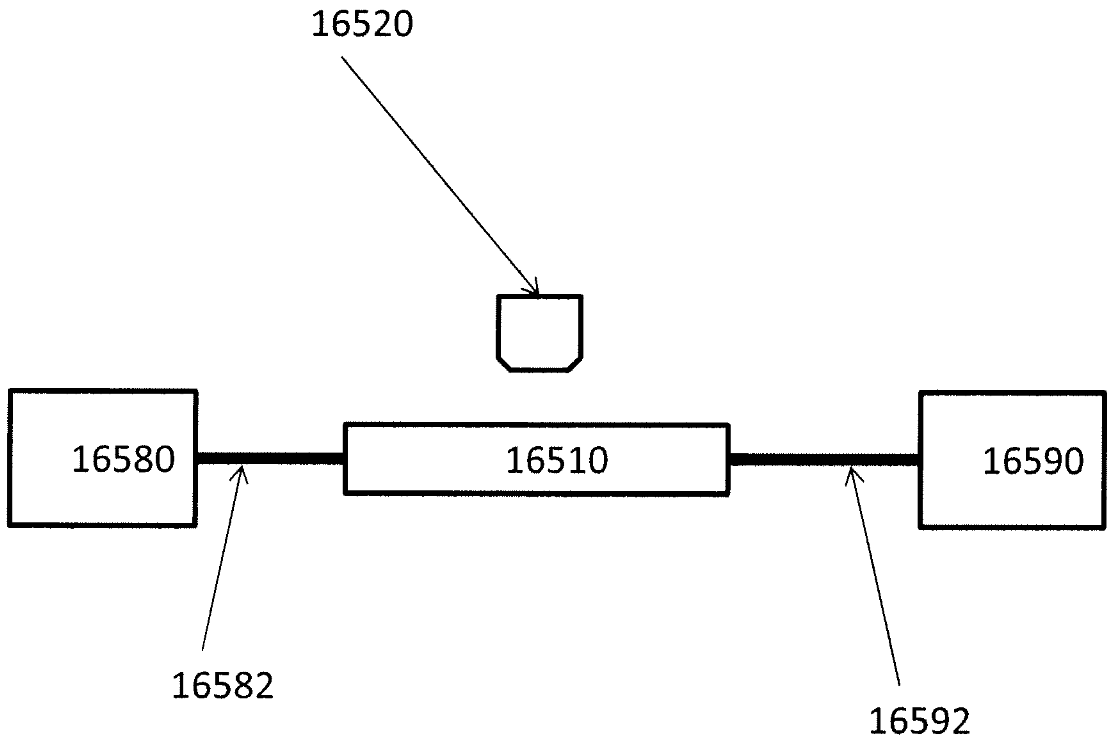
Figure 166:
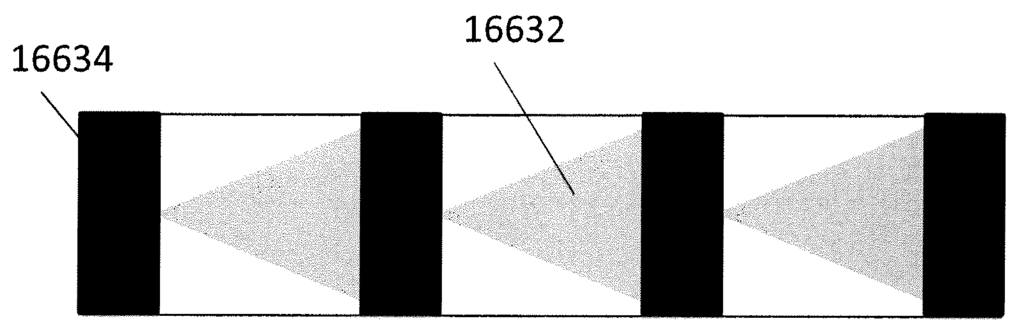
Figure 167:
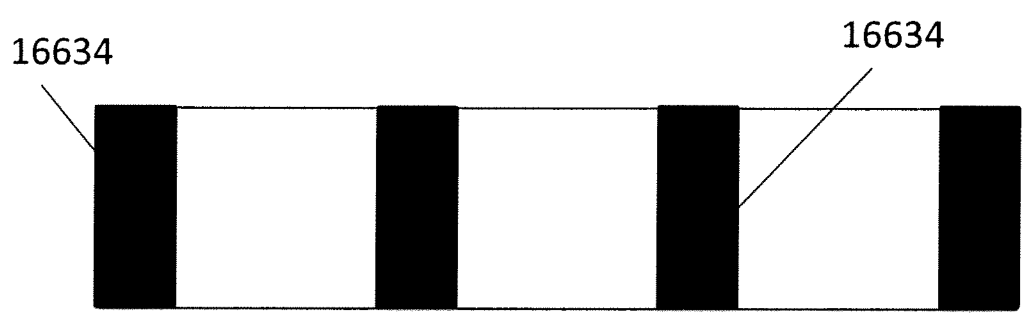
Figure 168:
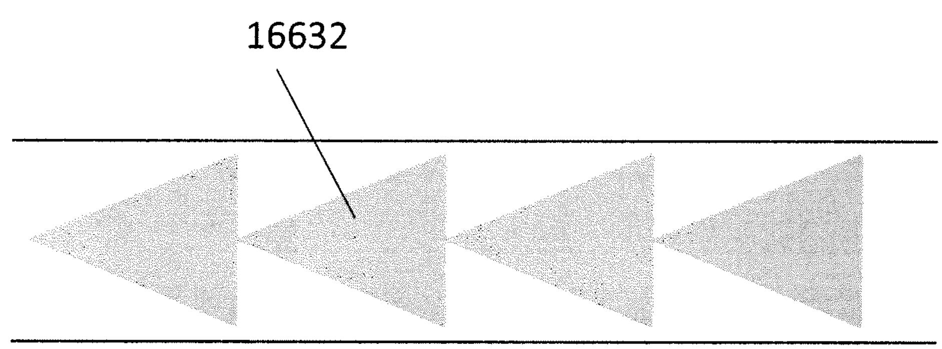
Figure 169:
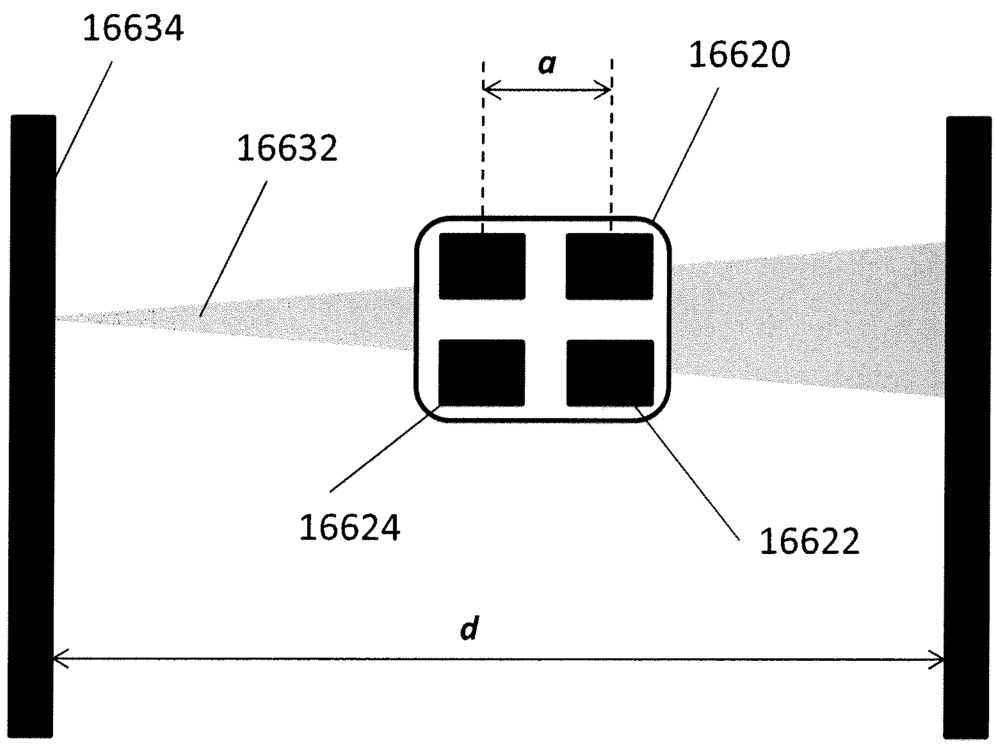
Figure 170:
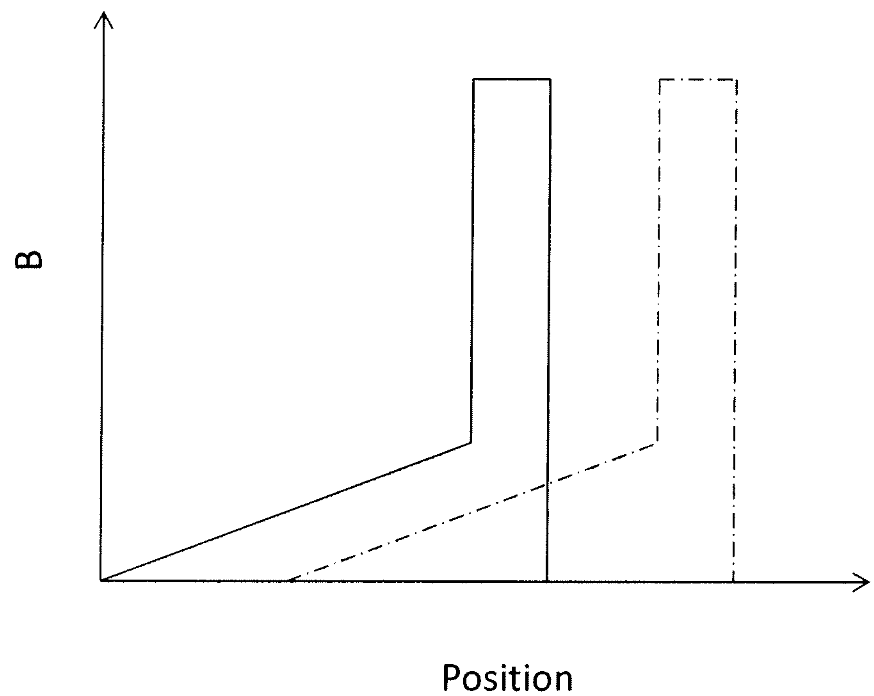
Figure 171:
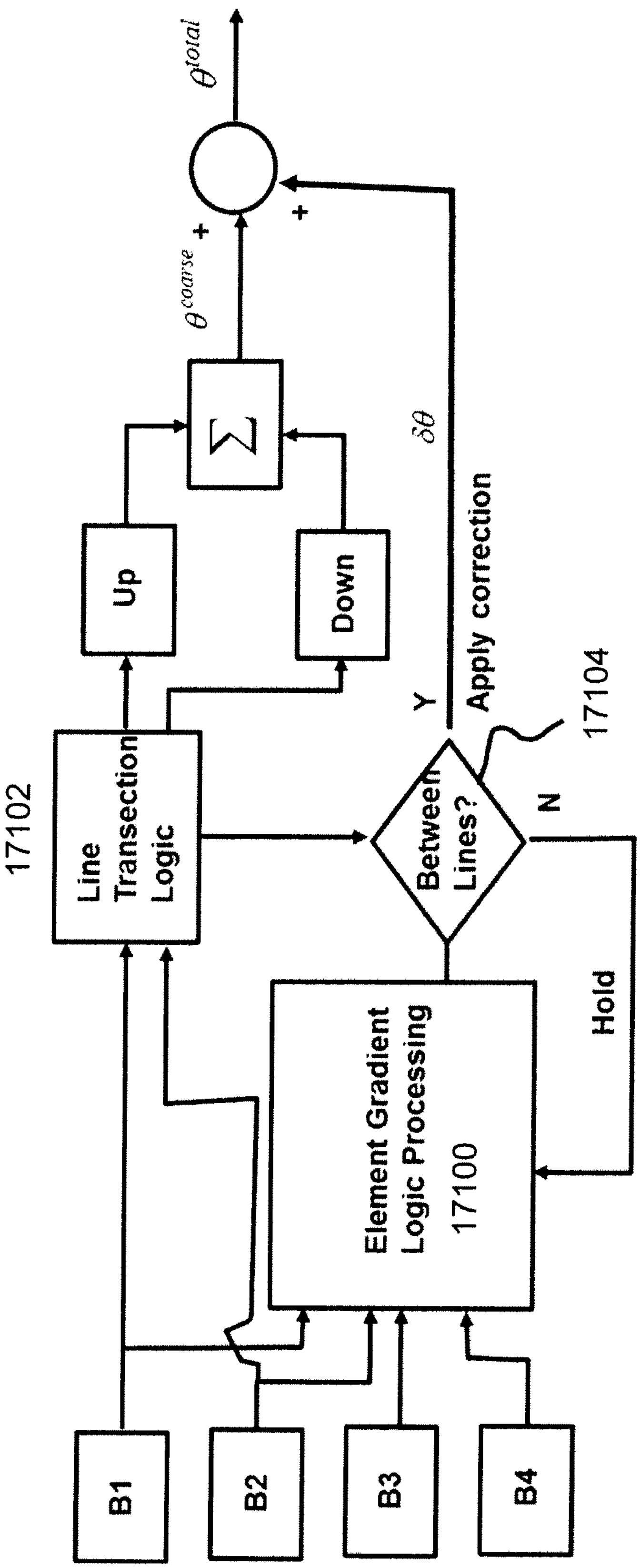

FIG. 162 is a schematic illustrating a position sensor system according to some embodiments;

FIG. 163 is a schematic illustrating a position sensor system including a rotary position encoder;

FIG. 164 is a schematic illustrating a top down view of a rotary position encoder;

FIG. 165 is a schematic illustrating a position sensor system including a linear position encoder;

FIG. 166 is a schematic illustrating a magnetic element arrangement of a position encoder according to some embodiments;

FIG. 167 is a schematic illustrating a magnetic element arrangement of a position encoder according to other embodiments;

FIG. 168 is a schematic illustrating a magnetic element arrangement of a position encoder according to other embodiments;

FIG. 169 is a schematic illustrating the relationship of a position sensor head and the magnetic elements of a position encoder;

FIG. 170 is a graph of measured magnetic field intensity attributable to magnetic elements of a position encoder for a first magnetic field sensor and a second magnetic field sensor of a position sensor head;

FIG. 171 is a flow chart illustrating the process of determining a position utilizing a position sensor system according to some embodiments;

Wake Detector Using Magnetometers

Figure 172:
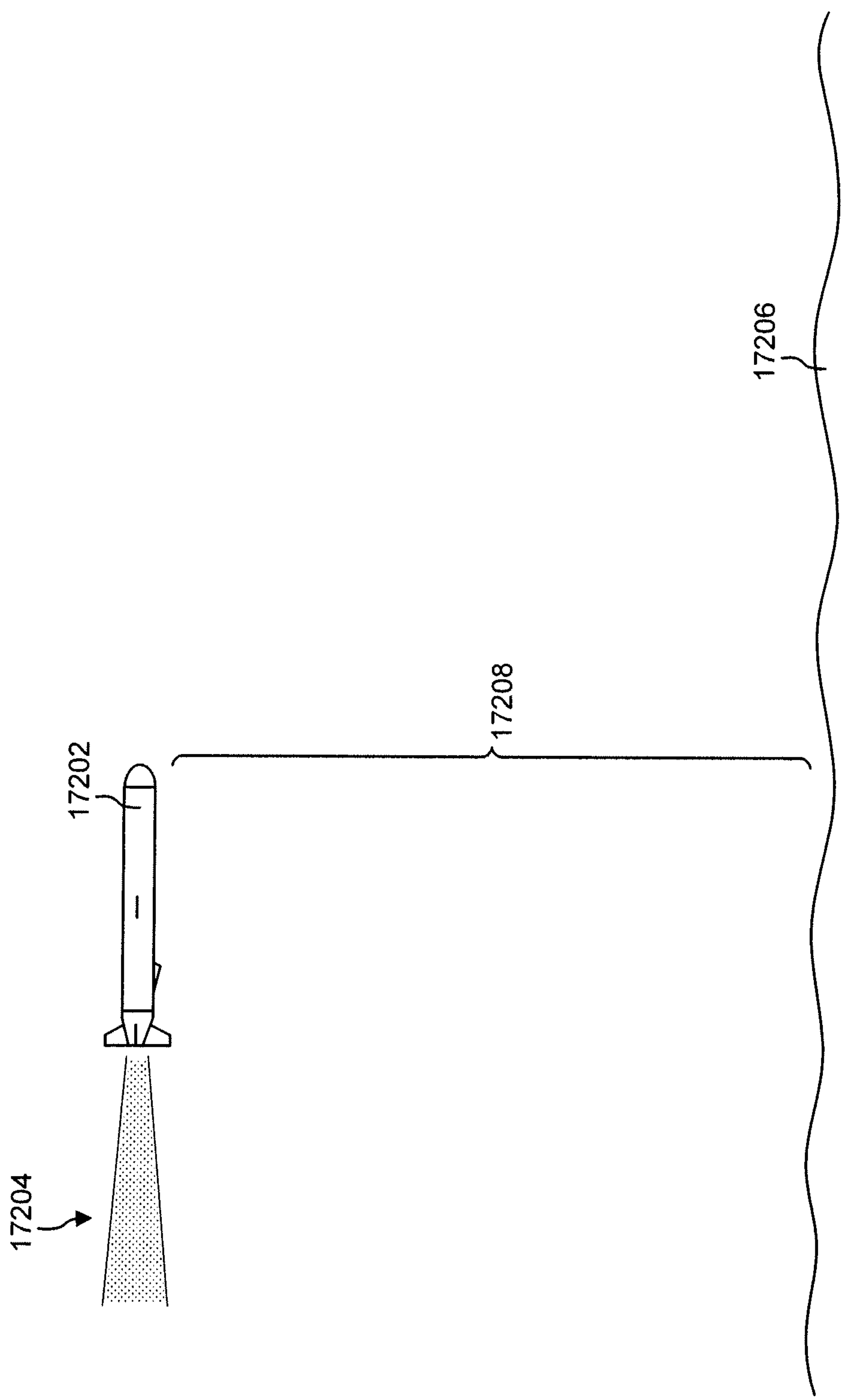
Figure 173:
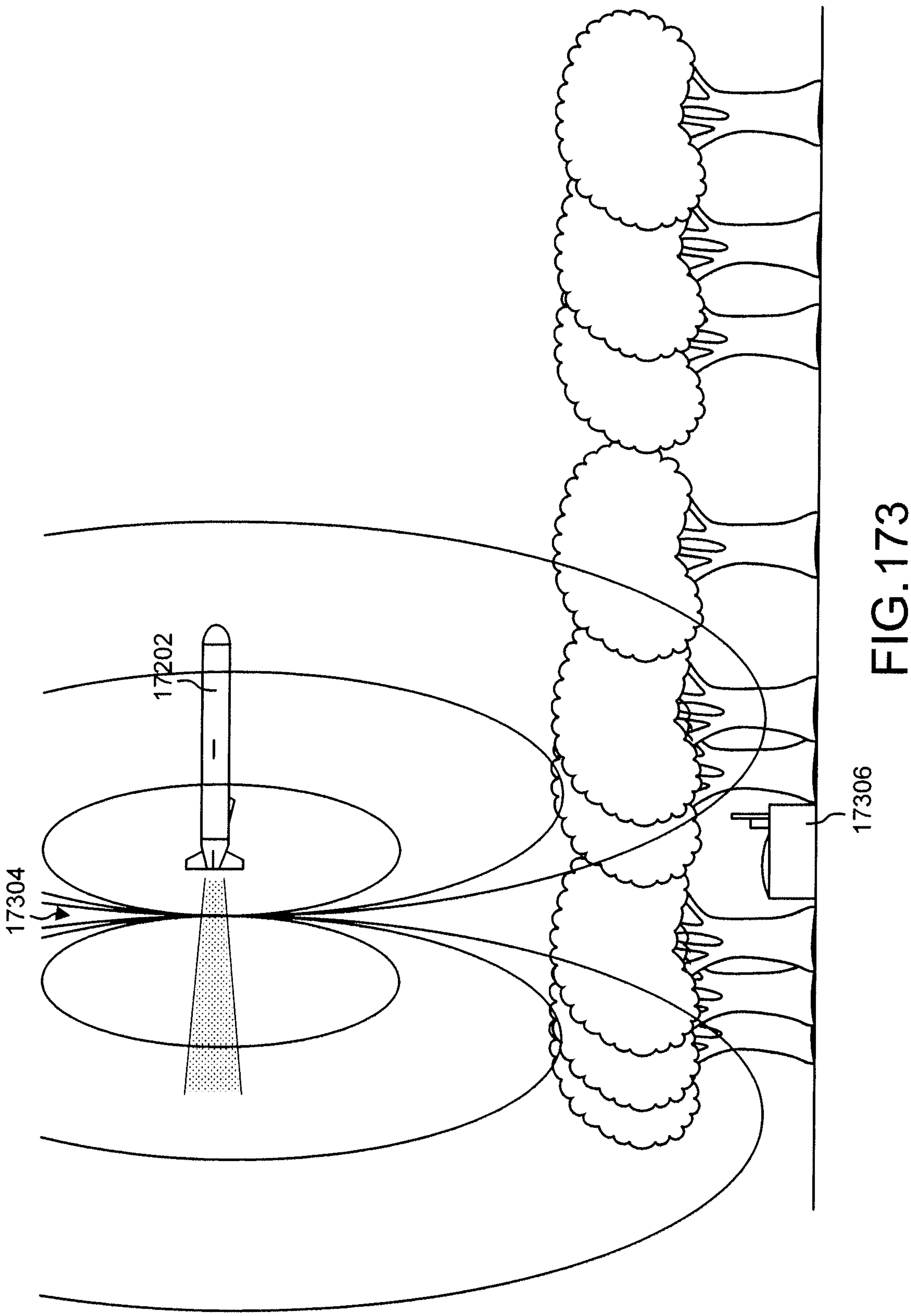
Figure 174A:
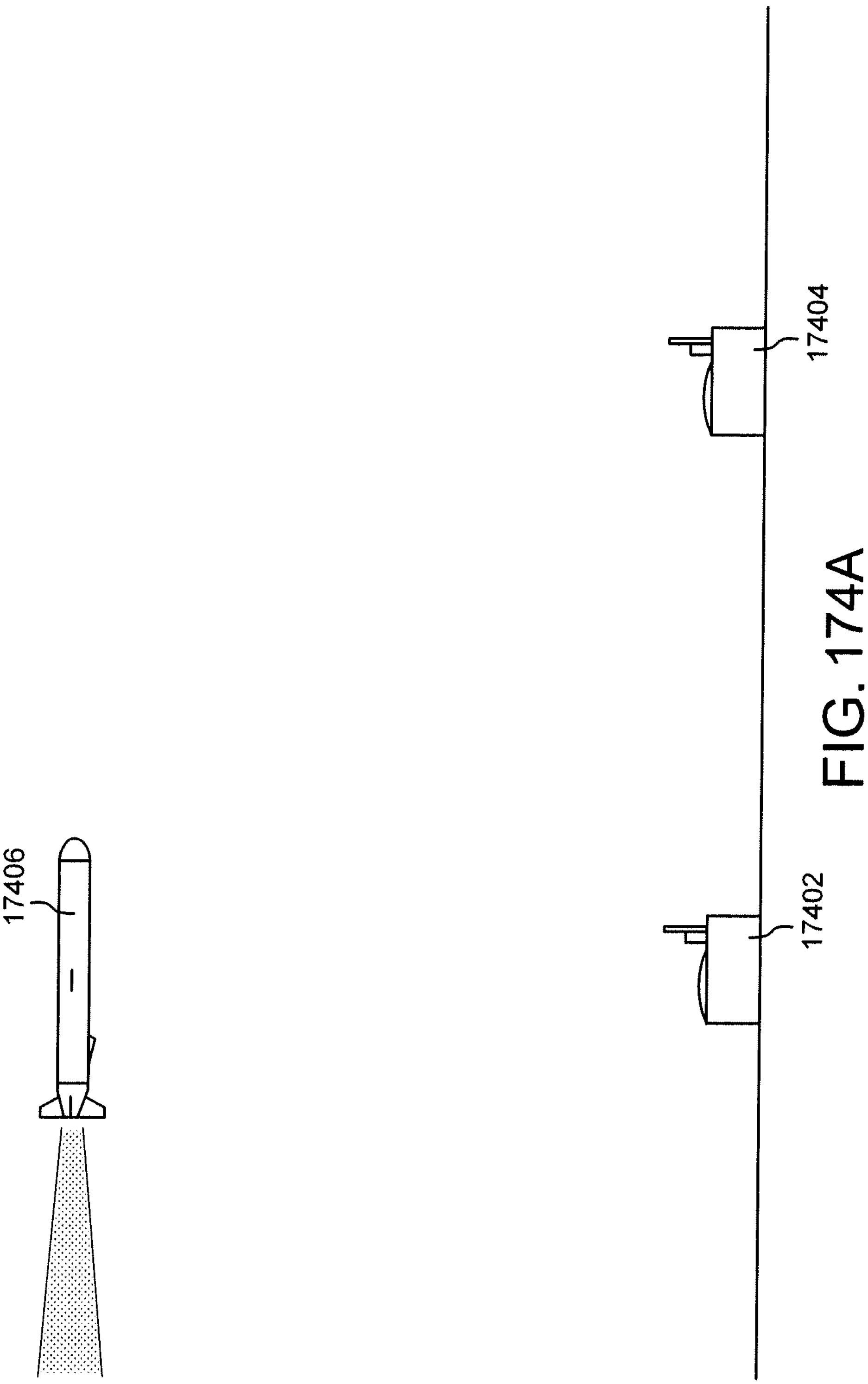
Figure 174B:
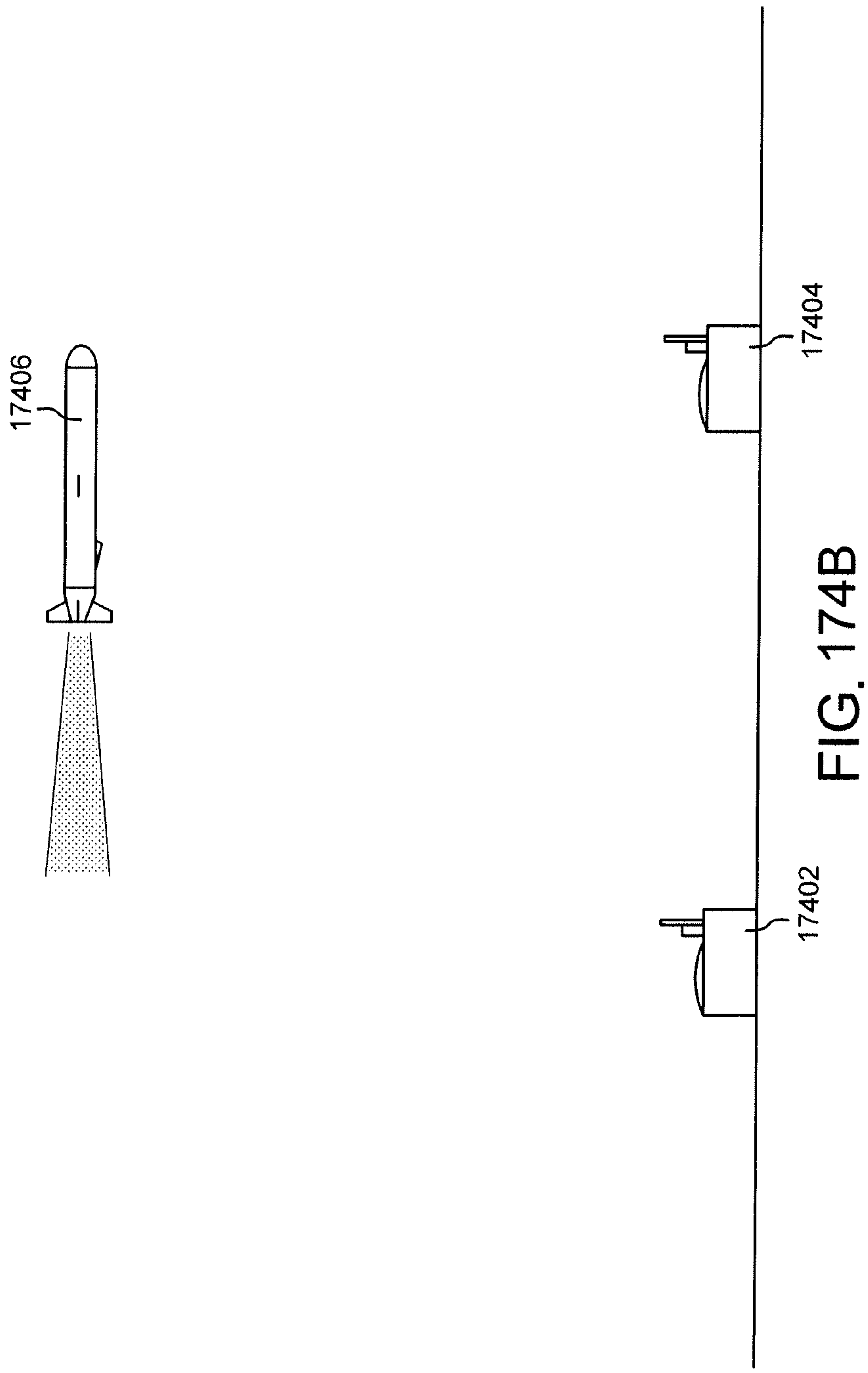

FIG. 172 illustrates a low altitude flying object in accordance with some illustrative implementations;

FIG. 173 illustrates a magnetic field detector in accordance with some illustrative implementations;

FIGS. 174A and 174B illustrate a portion of a detector array in accordance with some illustrative implementations;

Defect Detector Using Magnetometers

Figure 175A:
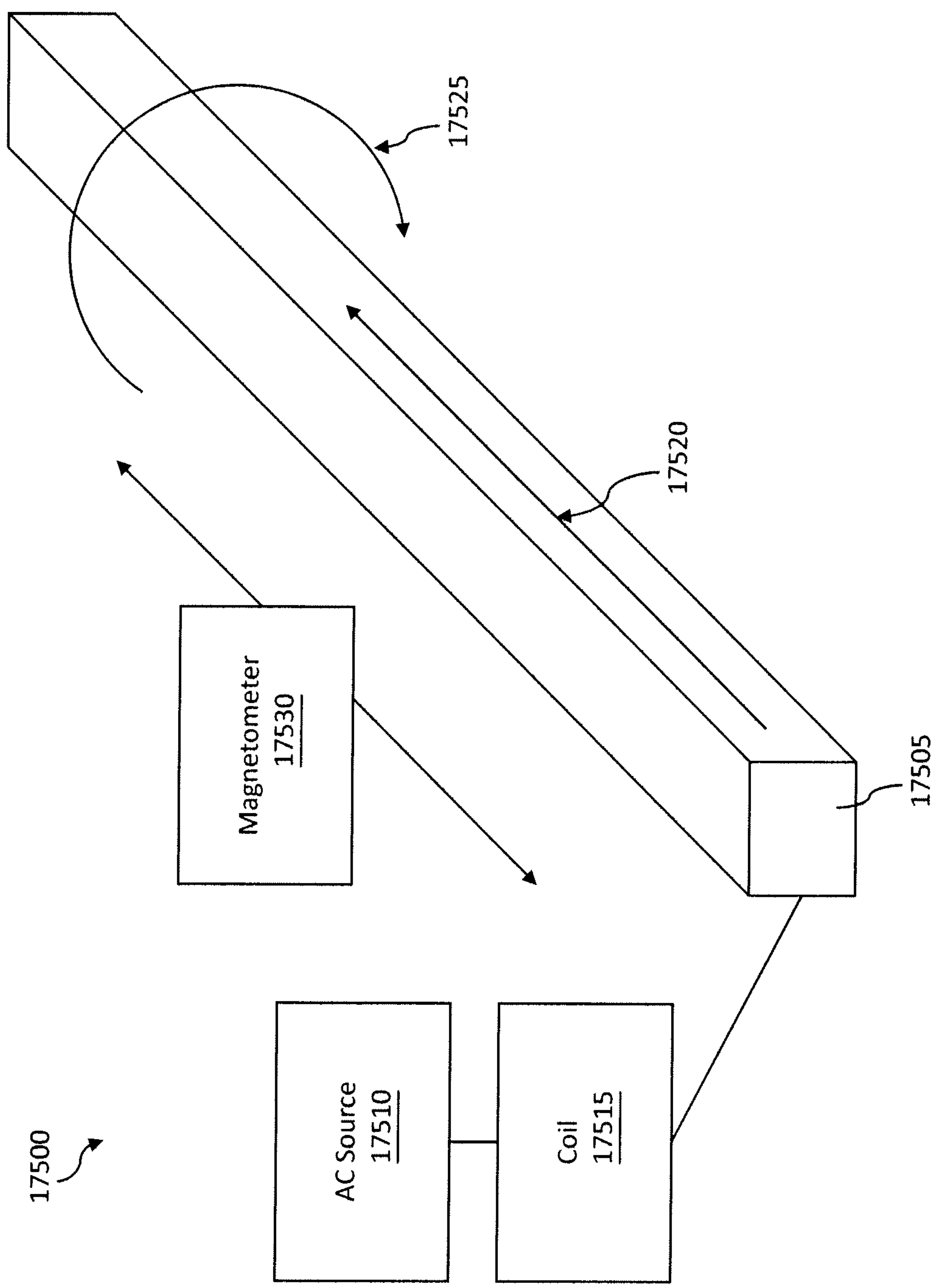
Figure 175B:
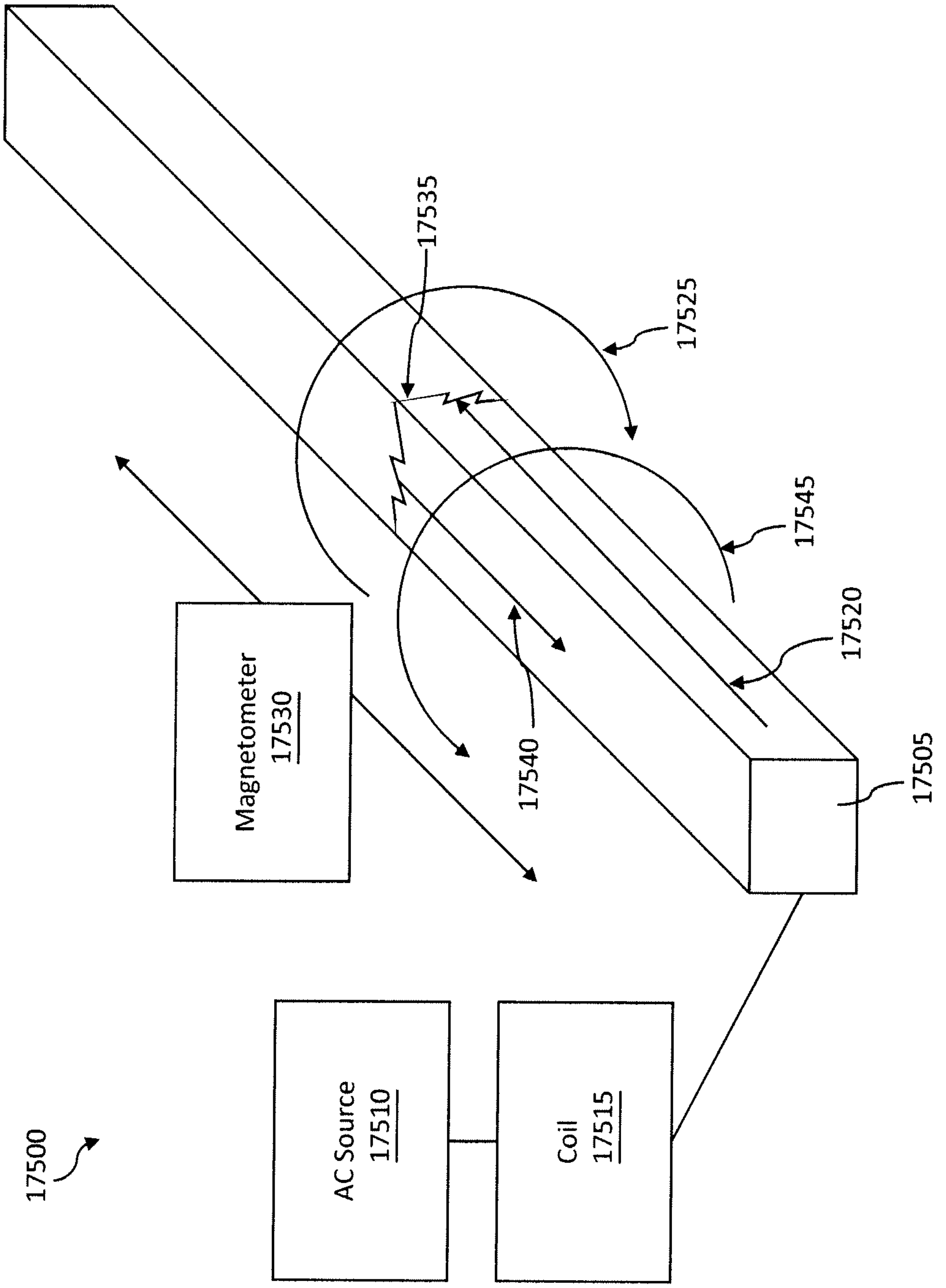
Figure 176:
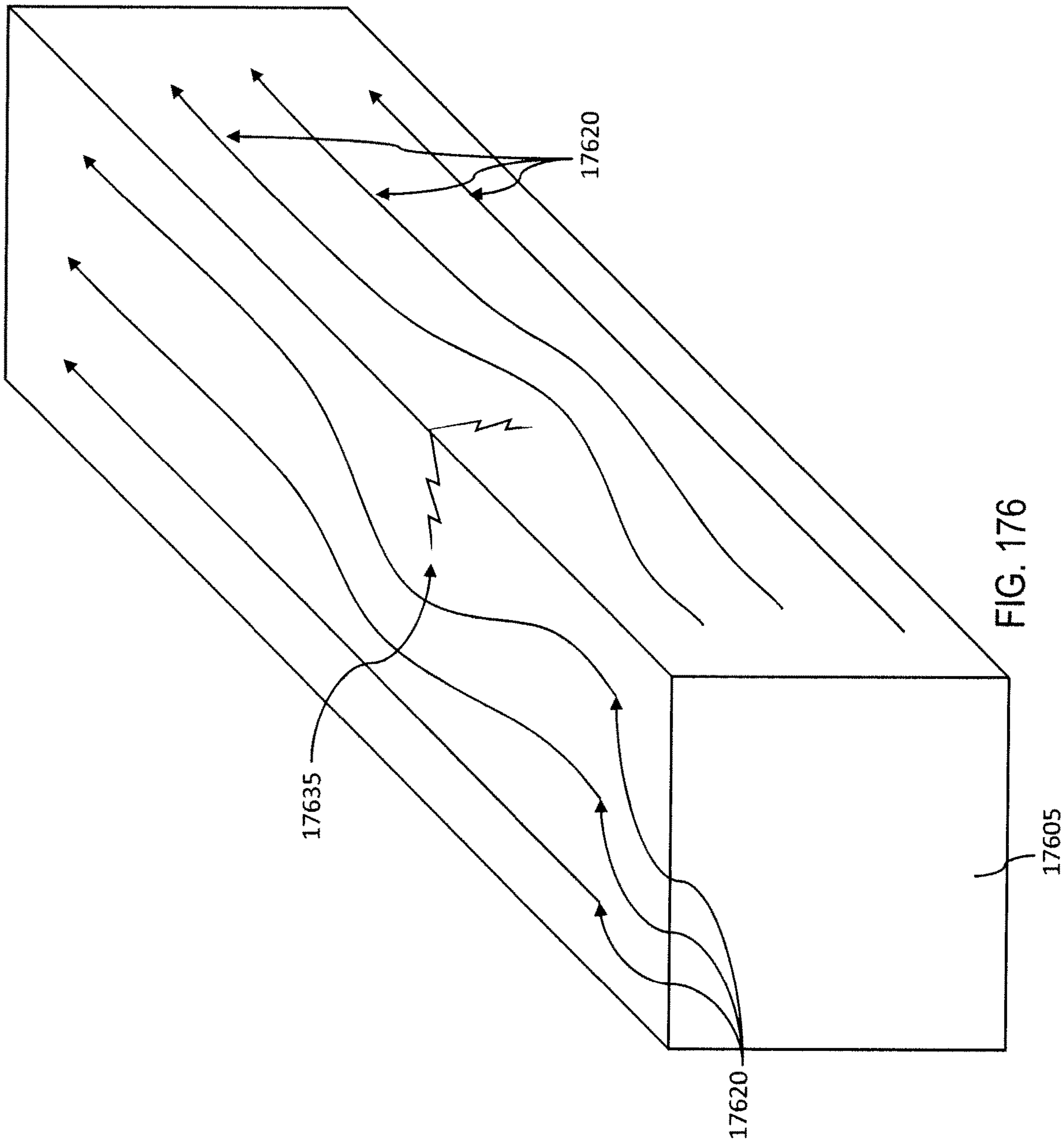
Figure 177:
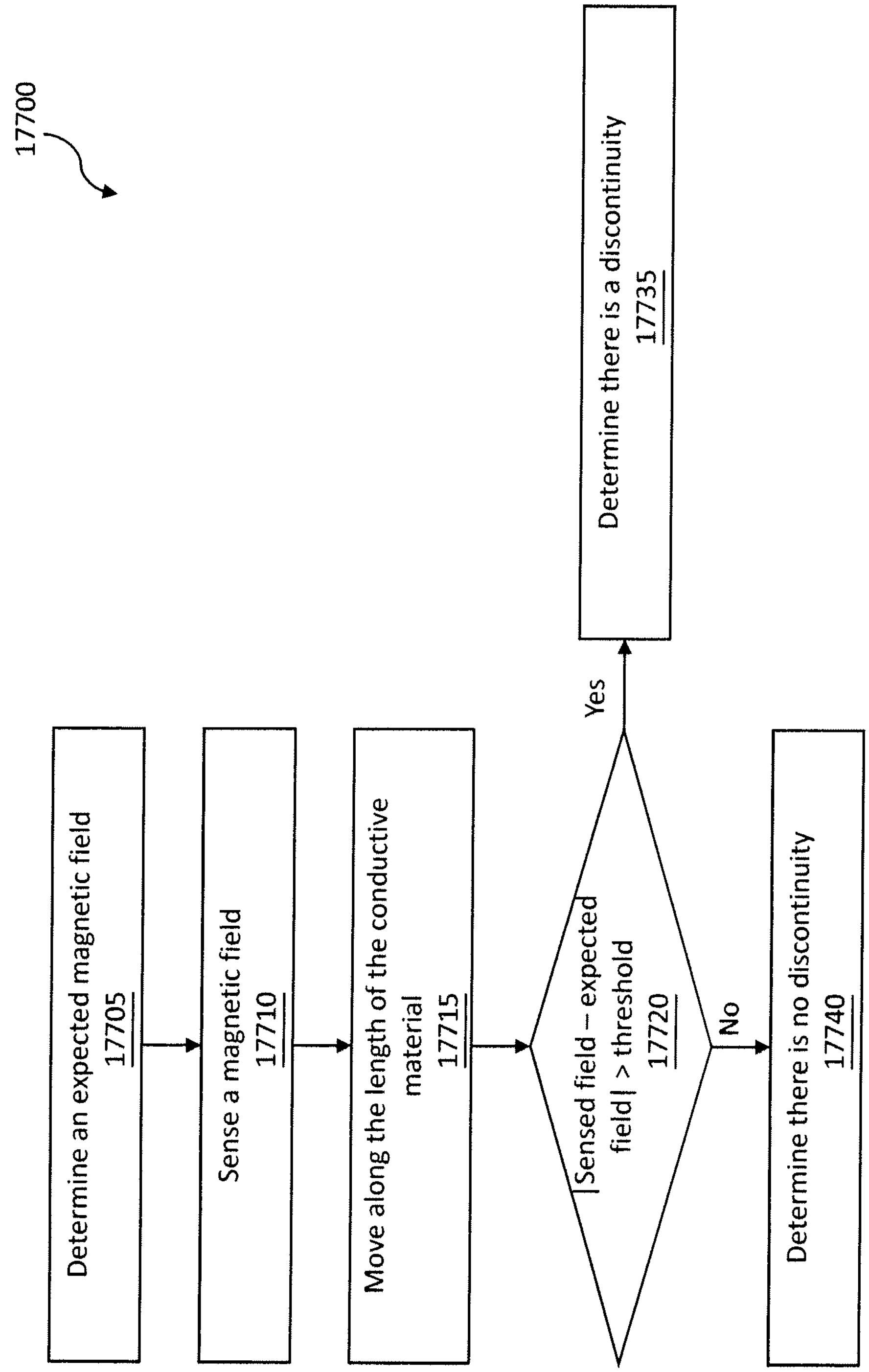

FIGS. 175A and 175B are block diagrams of a system for detecting deformities in a material in accordance with an illustrative embodiment;

FIG. 176 illustrates current paths through a conductor with a deformity in accordance with an illustrative embodiment;

FIG. 177 is a flow diagram of a method for detecting deformities in accordance with an illustrative embodiment;

Ferro-Fluid Hydrophone Using Magnetometers

Figure 178:
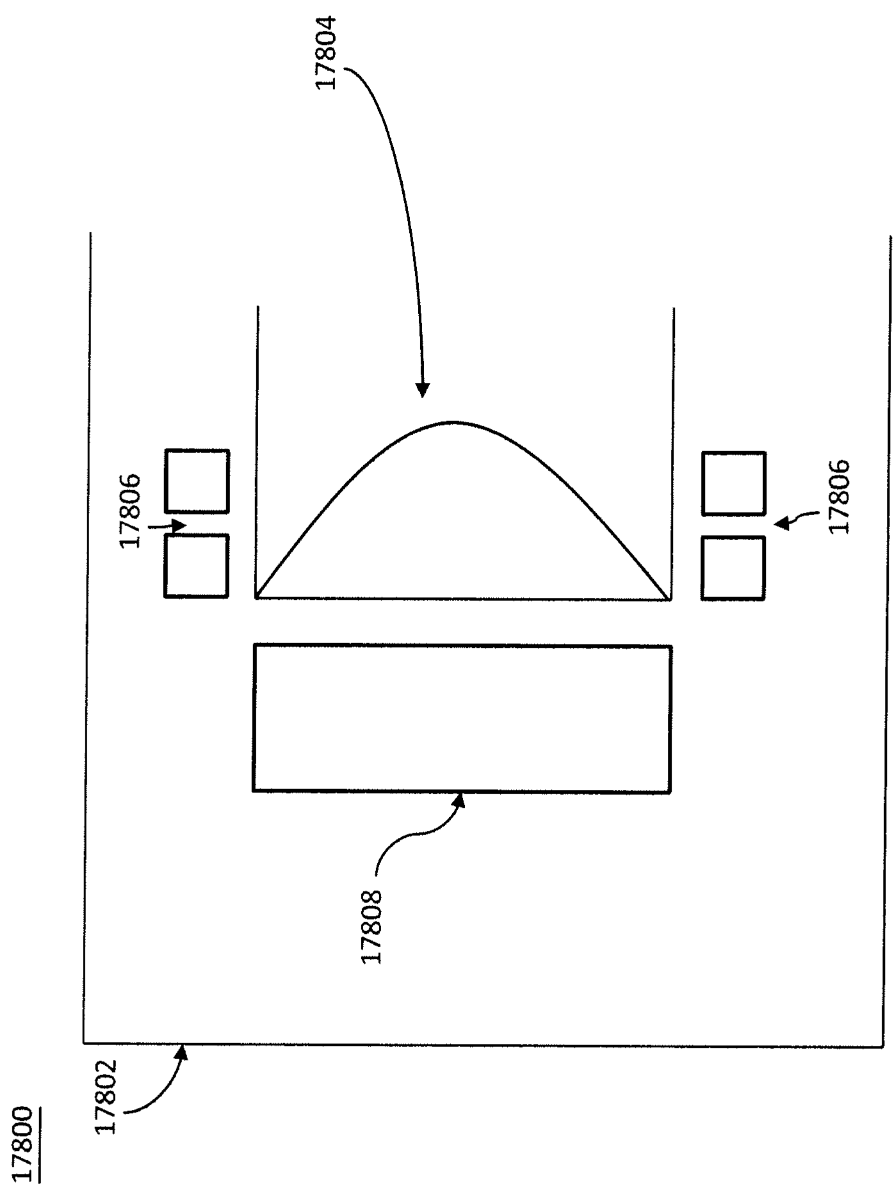
Figure 179:
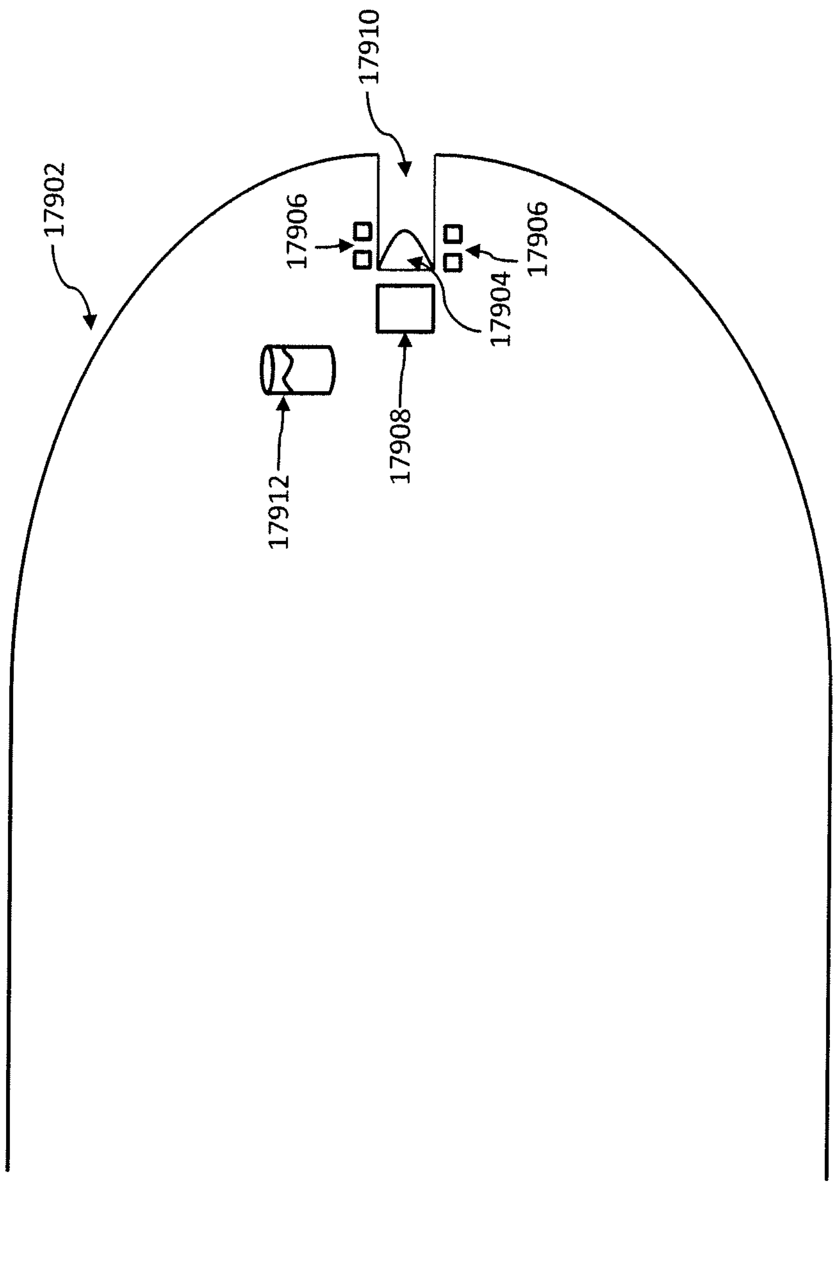
Figure 180:
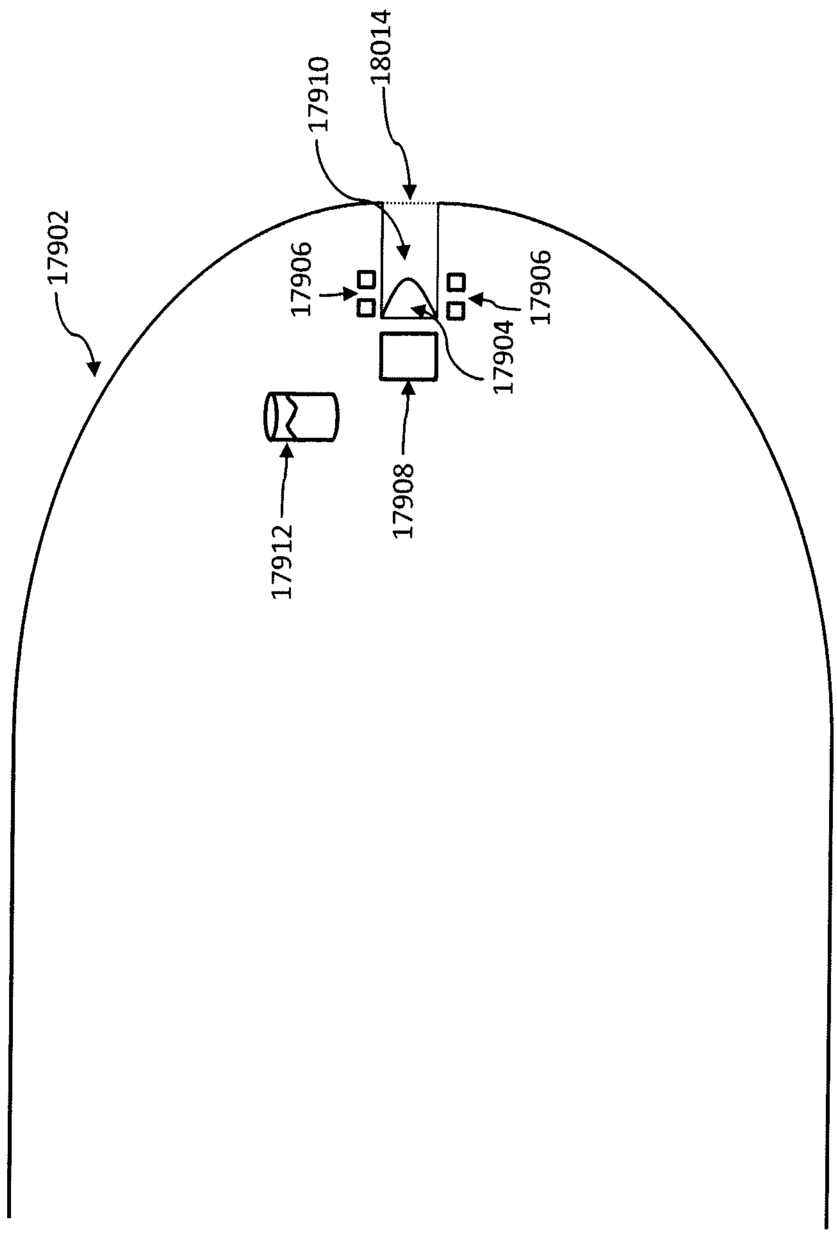
Figure 181:
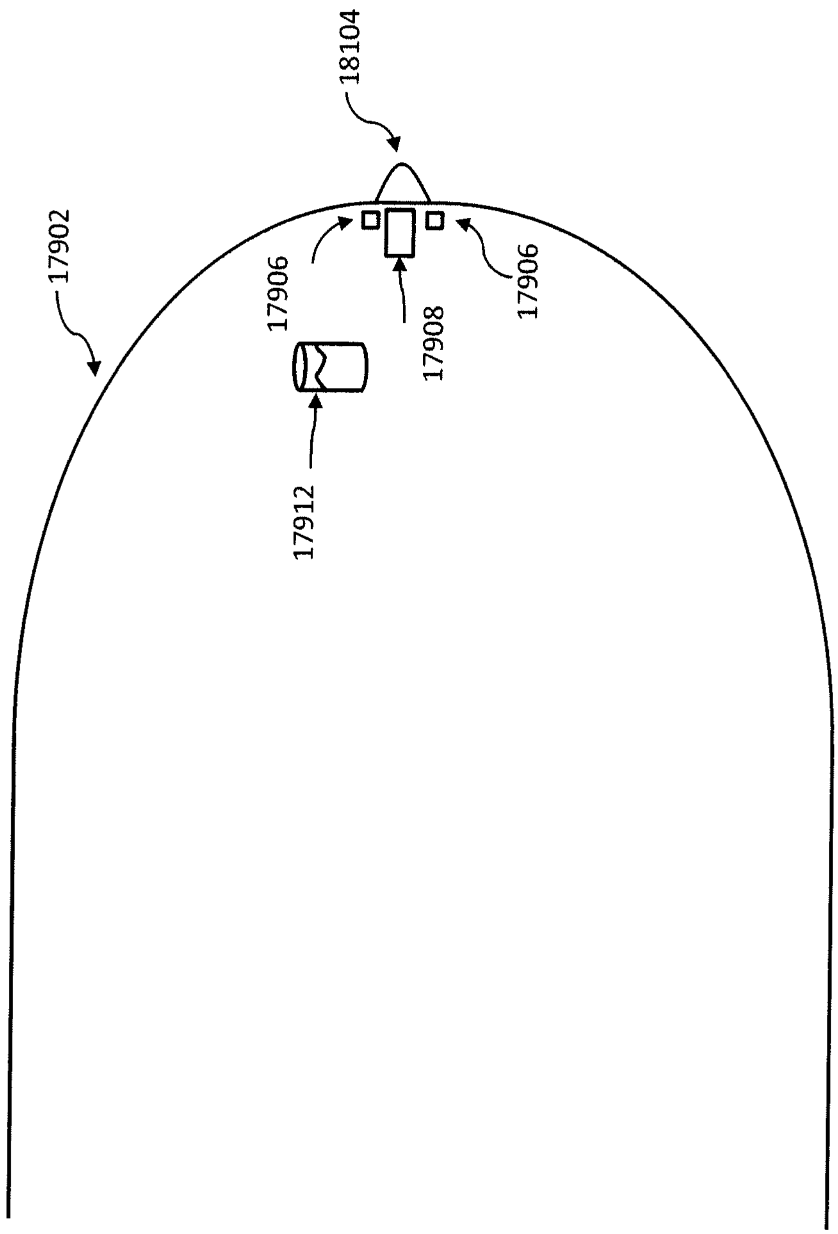
Figure 182:
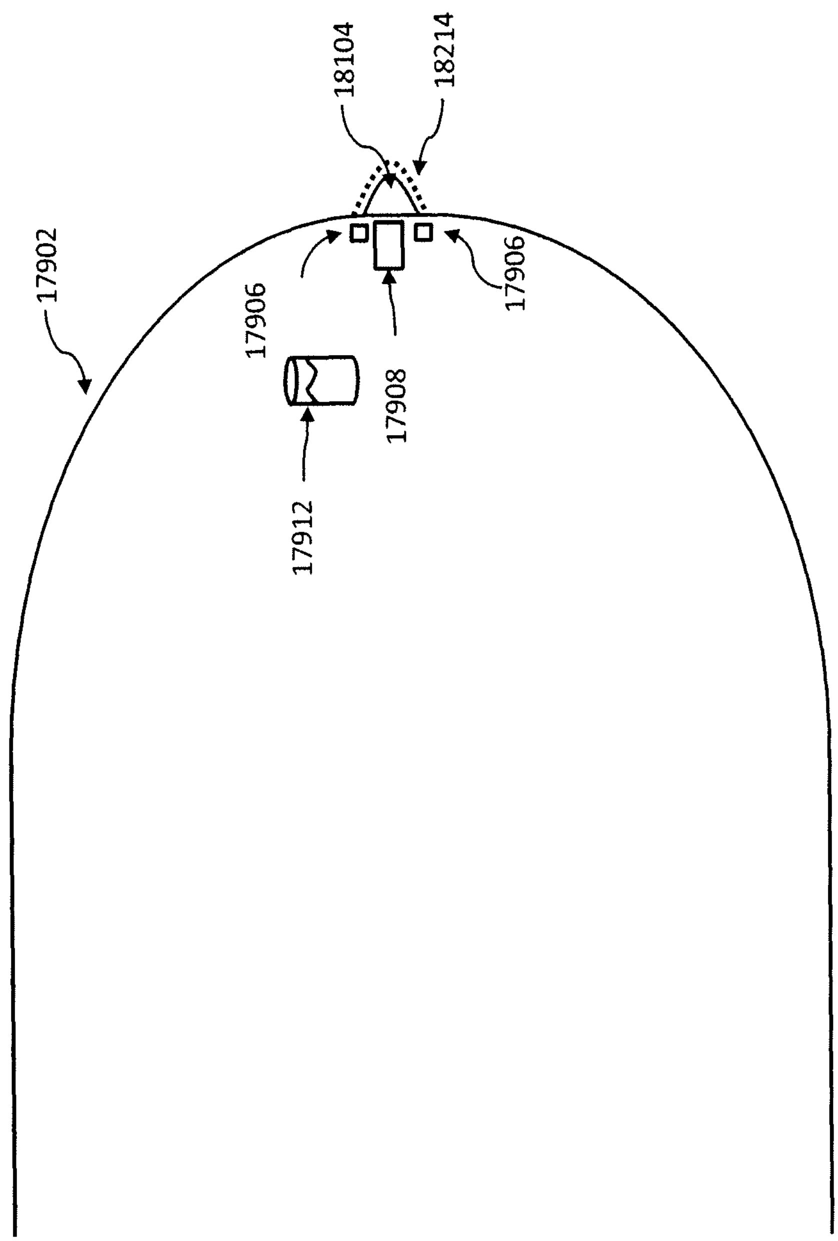

FIG. 178 is a schematic illustrating a hydrophone in accordance with some illustrative implementations;

FIG. 179 is a schematic illustrating a portion of a vehicle with a hydrophone in accordance with some illustrative implementations;

FIG. 180 is a schematic illustrating a portion of a vehicle with a hydrophone with a containing membrane in accordance with some illustrative implementations;

FIG. 181 is a schematic illustrating a portion of a vehicle with a hydrophone in accordance with some illustrative implementations;

FIG. 182 is a schematic illustrating a portion of a vehicle with a hydrophone with a containing membrane in accordance with some illustrative implementations;

Dissolved Ion Hydrophone Using Magnetometers

Figure 183A:
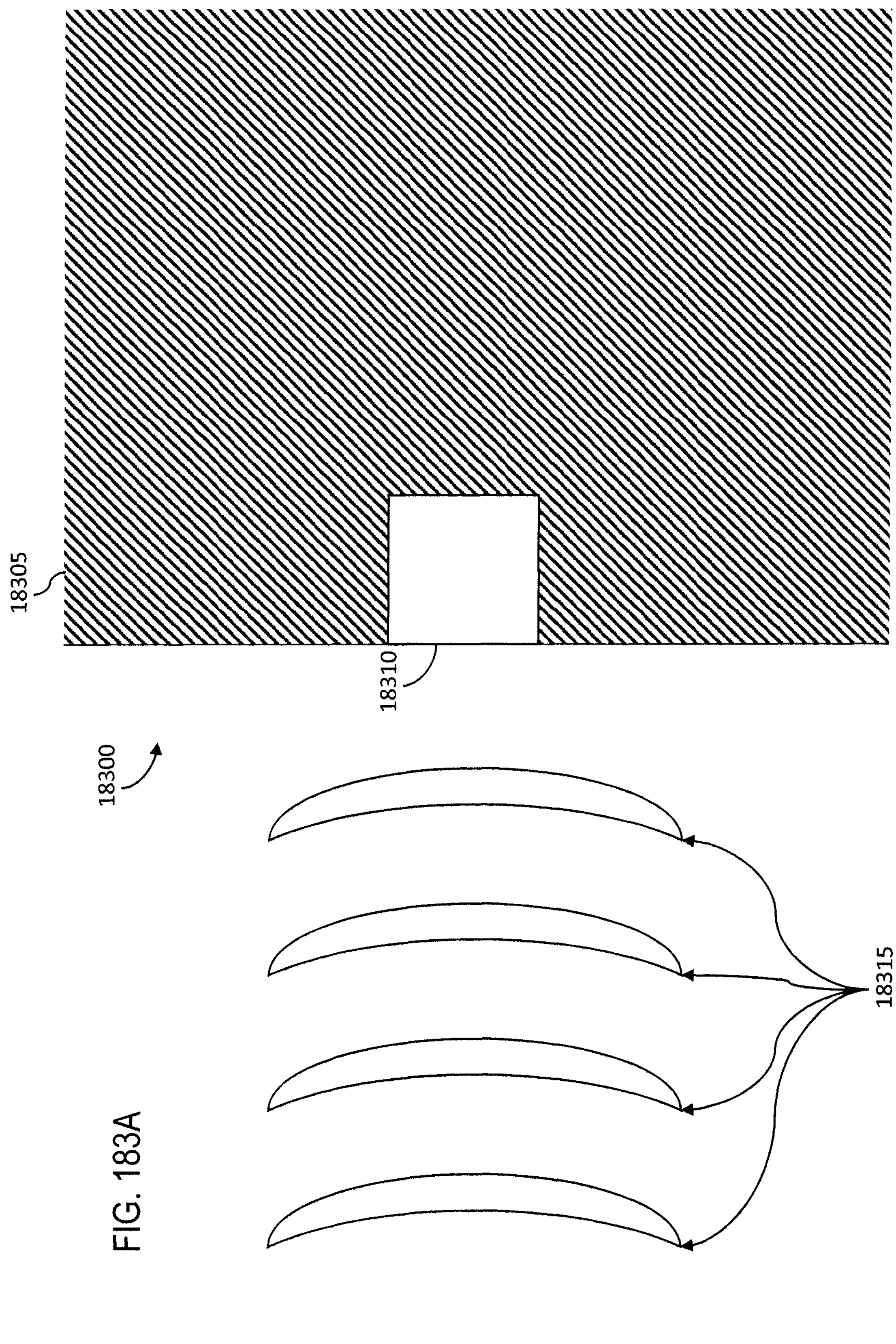
Figure 183B:
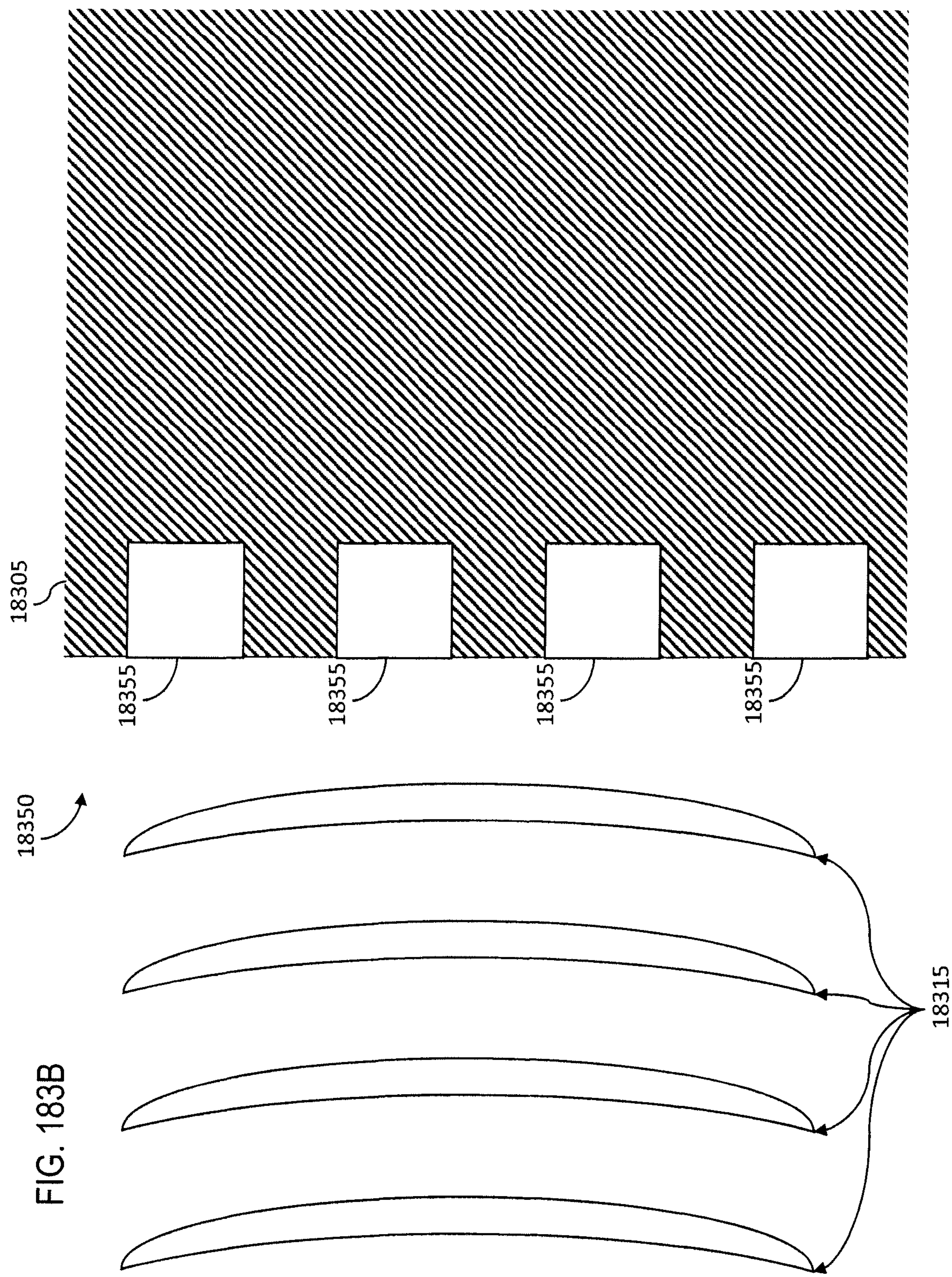
Figure 184:
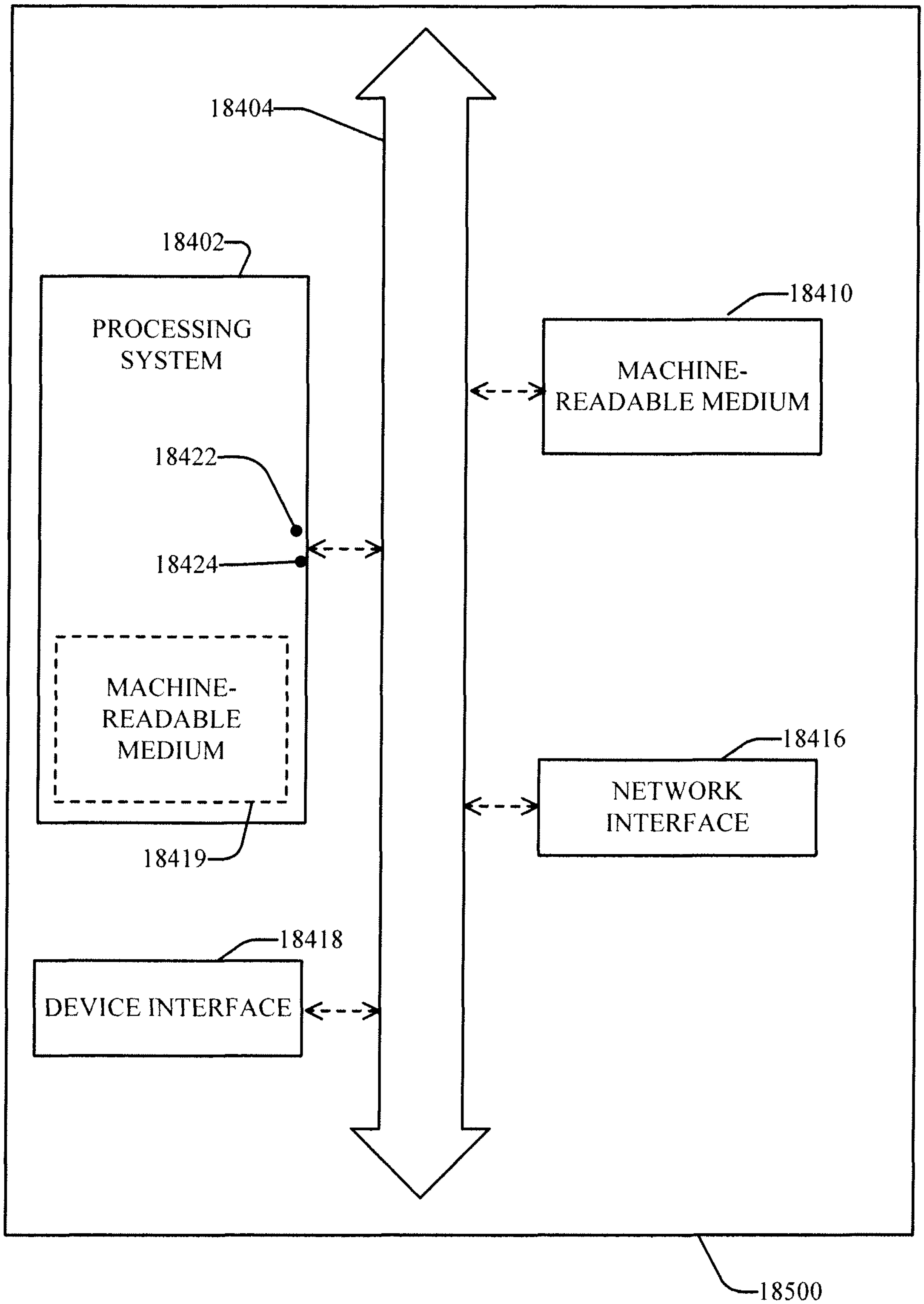

FIGS. 183A and 183B are diagrams illustrating hydrophone systems in accordance with illustrative embodiments; and FIG. 184 is a diagram illustrating an example of a computing system for implementing some aspects of the subject technology.

It will be recognized that some or all of the figures are schematic representations for purposes of illustration. The figures are provided for the purpose of illustrating embodiments with the explicit understanding that they will not be used to limit the scope or the meaning of the claims.

DETAILED DESCRIPTION

Atomic-sized magneto-optical defect centers, such as nitrogen-vacancy (NV) centers in diamond lattices, can have excellent sensitivity for magnetic field measurement and enable fabrication of small magnetic sensors. Magneto-optical defect center materials include but are not be limited to diamonds, Silicon Carbide (SiC), Phosphorous, and other materials with nitrogen, boron, carbon, silicon, or other defect centers. Diamond nitrogen vacancy (DNV) sensors may be maintained in room temperature and atmospheric pressure and can be even used in liquid environments. A green optical source (e.g., a micro-LED) can optically excite NV centers of the DNV sensor and cause emission of fluorescence radiation (e.g., red light) under off-resonant optical excitation. A magnetic field generated, for example, by a microwave coil can probe triplet spin states (e.g., with $m_s$=−1, 0, +1) of the NV centers to split based upon an external magnetic field projected along the NV axis, resulting in two spin resonance frequencies. The distance between the two spin resonance frequencies is a measure of the strength of the external magnetic field. A photo detector can measure the fluorescence (red light) emitted by the optically excited NV centers.

Magneto-optical defect center materials are those that can modify an optical wavelength of light directed at the defect center based on a magnetic field in which the magneto-defect center material is exposed. In some implementations, the magneto-optical defect center material may utilize nitrogen vacancy centers. Nitrogen-vacancy (NV) centers are defects in a diamond's crystal structure. Synthetic diamonds can be created that have these NV centers. NV centers generate red light when excited by a light source, such as a green light source, and microwave radiation. When an excited NV center diamond is exposed to an external magnetic field, the frequency of the microwave radiation at which the diamond generates red light and the intensity of the generated red light change. By measuring this change and comparing the change to the microwave frequency that the diamond generates red light at when not in the presence of the external magnetic field, the external magnetic field strength can be determined. Accordingly, NV centers can be used as part of a magnetic field sensor.

The NV Center, its Electronic Structure, and Optical and RF Interaction

Figure 1:
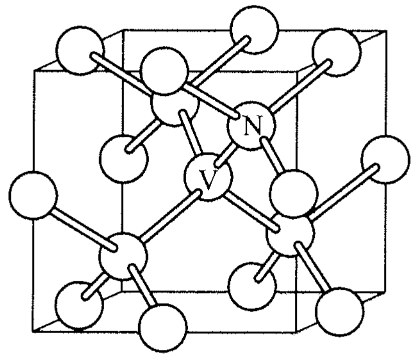
FIG. 1 illustrates one orientation of an Nitrogen-Vacancy (NV) center in a diamond lattice.

The NV center in a diamond comprises a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state. The neutral charge state uses the nomenclature $NV^0$, while the negative charge state uses the nomenclature NV, which is adopted in this description.

The NV center has a number of electrons, including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
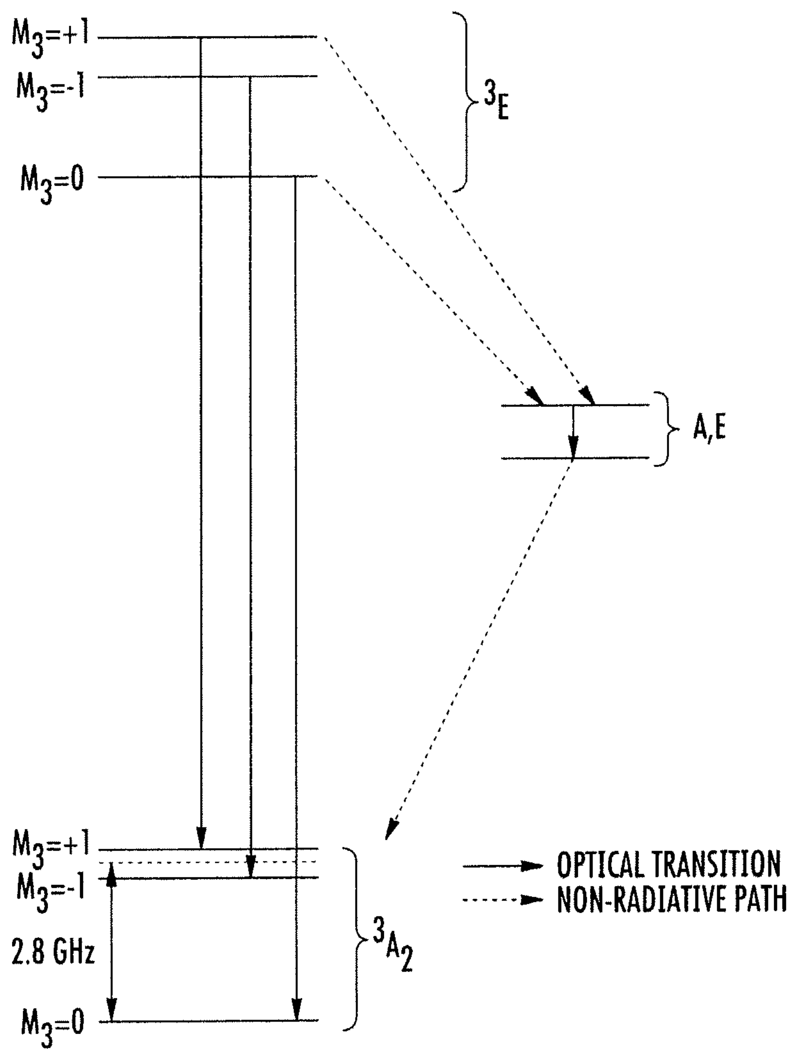
FIG. 2 illustrates an energy level diagram showing energy levels of spin states for the NV center.

The NV center has rotational symmetry, and as shown in FIG. 2, has a ground state, which is a spin triplet with $^3A_2$ symmetry with one spin state $m_s$=0, and two further spin states $m_s$=+1, and $m_s$=−1. In the absence of an external magnetic field, the $m_s$=±1 energy levels are offset from the $m_s$=0 due to spin-spin interactions, and the $m_s$=±1 energy levels are degenerate, i.e., they have the same energy. The $m_s$=0 spin state energy level is split from the $m_s$=±1 energy levels by an energy of approximately 2.87 GHz for a zero external magnetic field.

Introducing an external magnetic field with a component along the NV axis lifts the degeneracy of the $m_s$=±1 energy levels, splitting the energy levels $m_s$=±1 by an amount $2g\mu_B B_z$, where g is the g-factor, $\mu_B$ is the Bohr magneton, and $B_z$ is the component of the external magnetic field along the NV axis. This relationship is correct to a first order and inclusion of higher order corrections is a straightforward matter and will not affect the computational and logic steps in the systems and methods described below.

The NV center electronic structure further includes an excited triplet state $^3E$ with corresponding $m_s$=0 and $m_s$=±1 spin states. The optical transitions between the ground state $^3A_2$ and the excited triplet $^3E$ are predominantly spin conserving, meaning that the optical transitions are between initial and final states that have the same spin. For a direct transition between the excited triplet $^3E$ and the ground state $^3A_2$, a photon of red light is emitted with a photon energy corresponding to the energy difference between the energy levels of the transitions.

There is, however, an alternative non-radiative decay route from the triplet $^3E$ to the ground state $^3A_2$ via intermediate electron states, which are thought to be intermediate singlet states A, E with intermediate energy levels. Significantly, the transition rate from the $m_s$=±1 spin states of the excited triplet $^3E$ to the intermediate energy levels is significantly greater than the transition rate from the $m_s$=0 spin state of the excited triplet $^3E$ to the intermediate energy levels. The transition from the singlet states A, E to the ground state triplet $^3A_2$ predominantly decays to the $m_s$=0 spin state over the $m_s$=±1 spins states. These features of the decay from the excited triplet $^3E$ state via the intermediate singlet states A, E to the ground state triplet $^3A_2$ allows that if optical excitation is provided to the system, the optical excitation will eventually pump the NV center into the $m_s$=0 spin state of the ground state $^3A_2$. In this way, the population of the $m_s$=0 spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s$=±1 states than for the $m_s$=0 spin state. This is so because the decay via the intermediate states does not result in a photon emitted in the fluorescence band, and because of the greater probability that the $m_s$=±1 states of the excited triplet $^3E$ state will decay via the non-radiative decay path. The lower fluorescence intensity for the $m_s$=±1 states than for the $m_s$=0 spin state allows the fluorescence intensity to be used to determine the spin state. As the population of the $m_s$=±1 states increases relative to the $m_s$=0 spin, the overall fluorescence intensity will be reduced.

The NV Center, or Magneto-Optical Defect Center, Magnetic Sensor System

Figure 3A:
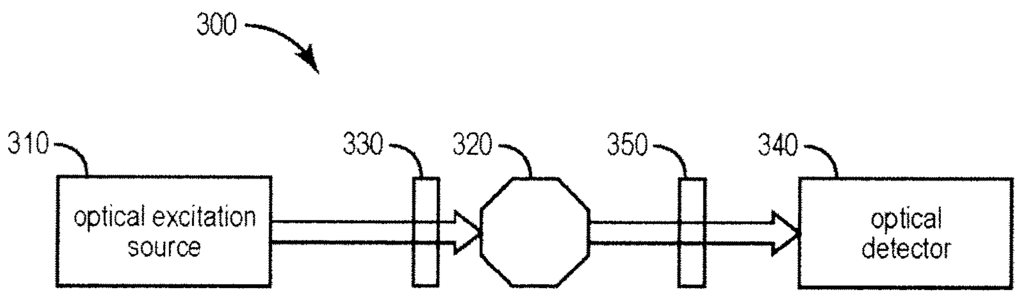
FIG. 3A is a schematic diagram illustrating a NV center magnetic sensor system.

FIG. 3A is a schematic diagram illustrating a NV center magnetic sensor system 300A that uses fluorescence intensity to distinguish the $m_s$=±1 states, and to measure the magnetic field based on the energy difference between the $m_s$=+1 state and the $m_s$=−1 state, as manifested by the RF frequencies corresponding to each state. The system 300A includes an optical excitation source 310, which directs optical excitation to an NV diamond material 320 with NV centers. The system further includes an RF excitation source 330, which provides RF radiation to the NV diamond material 320. Light from the NV diamond may be directed through an optical filter 350 to an optical detector 340.

The RF excitation source 330 may be a microwave coil, for example. The RF excitation source 330, when emitting RF radiation with a photon energy resonant with the transition energy between ground $m_s$=0 spin state and the $m_s$=+1 spin state, excites a transition between those spin states. For such a resonance, the spin state cycles between ground $m_s$=0 spin state and the $m_s$=+1 spin state, reducing the population in the $m_s$=0 spin state and reducing the overall fluorescence at resonances. Similarly, resonance and a subsequent decrease in fluorescence intensity occurs between the $m_s$=0 spin state and the $m_s$=−1 spin state of the ground state when the photon energy of the RF radiation emitted by the RF excitation source is the difference in energies of the $m_s$=0 spin state and the $m_s$=−1 spin state.

The optical excitation source 310 may be a laser or a light emitting diode, for example, which emits light in the green (light having a wavelength such that the color is green), for example. The optical excitation source 310 induces fluorescence in the red, which corresponds to an electronic transition from the excited state to the ground state. Light from the NV diamond material 320 is directed through the optical filter 350 to filter out light in the excitation band (in the green, for example), and to pass light in the red fluorescence band, which in turn is detected by the optical detector 340. The optical excitation source 310, in addition to exciting fluorescence in the NV diamond material 320, also serves to reset the population of the $m_s$=0 spin state of the ground state $^3A_2$ to a maximum polarization, or other desired polarization.

Figure 4A:
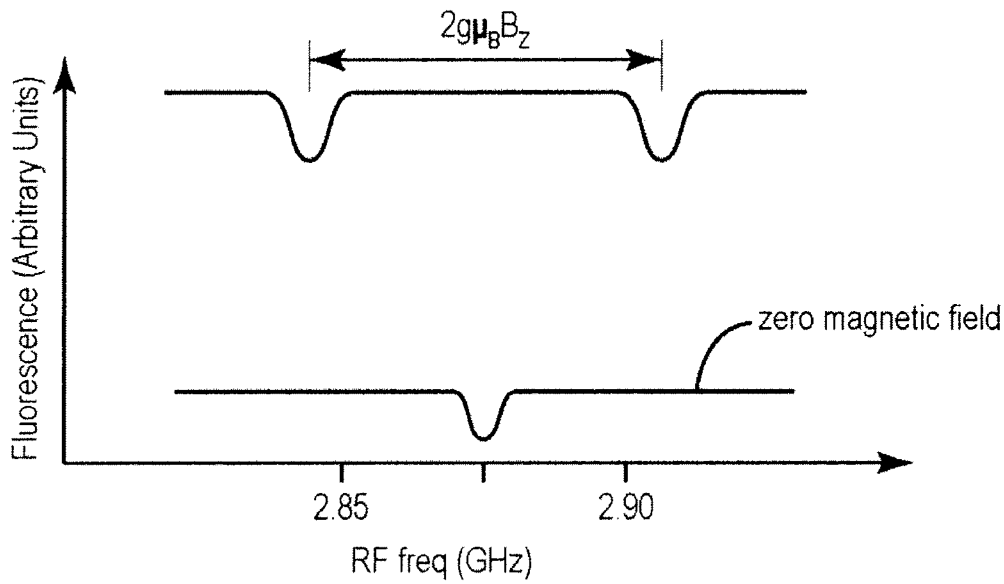
FIG. 4A is a graph illustrating the fluorescence as a function of an applied RF frequency of an NV center along a given direction for a zero magnetic field, and also for a non-zero magnetic field having a component along the NV axis.

For continuous wave excitation, the optical excitation source 310 continuously pumps the NV centers, and the RF excitation source 330 sweeps across a frequency range that includes the zero splitting (when the $m_s$=±1 spin states have the same energy) photon energy of approximately 2.87 GHz. The fluorescence for an RF sweep corresponding to a NV diamond material 320 with NV centers aligned along a single direction is shown in FIG. 4A for different magnetic field components $B_z$ along the NV axis, where the energy splitting between the $m_s$=−1 spin state and the $m_s$=+1 spin state increases with $B_z$. Thus, the component $B_z$ may be determined. Optical excitation schemes other than continuous wave excitation are contemplated, such as excitation schemes involving pulsed optical excitation, and pulsed RF excitation. Examples of pulsed excitation schemes include Ramsey pulse sequence, and spin echo pulse sequence.

The Ramsey pulse sequence is a pulsed RF-pulsed laser scheme that measures the free precession of the magnetic moment in the NV diamond material 320 with NV centers, and is a technique that quantum mechanically prepares and samples the electron spin state. FIG. 5 is a schematic diagram illustrating the Ramsey pulse sequence. As shown in FIG. 5, a Ramsey pulse sequence includes optical excitation pulses and RF excitation pulses over a five-step period. In a first step, during a period 0, a first optical excitation pulse 510 is applied to the system to optically pump electrons into the ground state (i.e., $m_s$=0 spin state). This is followed by a first RF excitation pulse 520 (in the form of, for example, a microwave (MW) π/2 pulse) during a period 1. The first RF excitation pulse 520 sets the system into superposition of the $m_s$=0 and $m_s$=+1 spin states (or, alternatively, the $m_s$=0 and $m_s$=−1 spin states, depending on the choice of resonance location). During a period 2, the system is allowed to freely precess (and dephase) over a time period referred to as tau (τ). During this free precession time period, the system measures the local magnetic field and serves as a coherent integration. Next, a second RF excitation pulse 540 (in the form of, for example, a MW π/2 pulse) is applied during a period 3 to project the system back to the $m_s$=0 and $m_s$=+1 basis. Finally, during a period 4, a second optical pulse 530 is applied to optically sample the system and a measurement basis is obtained by detecting the fluorescence intensity of the system. The RF excitation pulses applied are provided at a given RF frequency, which correspond to a given NV center orientation.

Figure 4B:
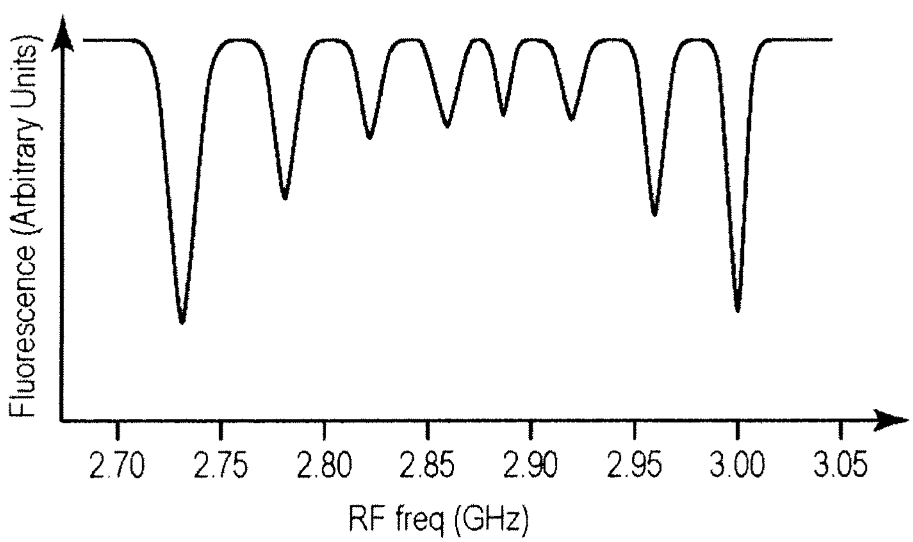
FIG. 4B is a graph illustrating the fluorescence as a function of an applied RF frequency for four different NV center orientations for a non-zero magnetic field.

In general, the NV diamond material 320 will have NV centers aligned along directions of four different orientation classes. FIG. 4B illustrates fluorescence as a function of RF frequency for the case where the NV diamond material 320 has NV centers aligned along directions of four different orientation classes. In this case, the component $B_z$ along each of the different orientations may be determined. These results, along with the known orientation of crystallographic planes of a diamond lattice, allow not only the magnitude of the external magnetic field to be determined, but also the direction of the magnetic field.

Figure 3B:
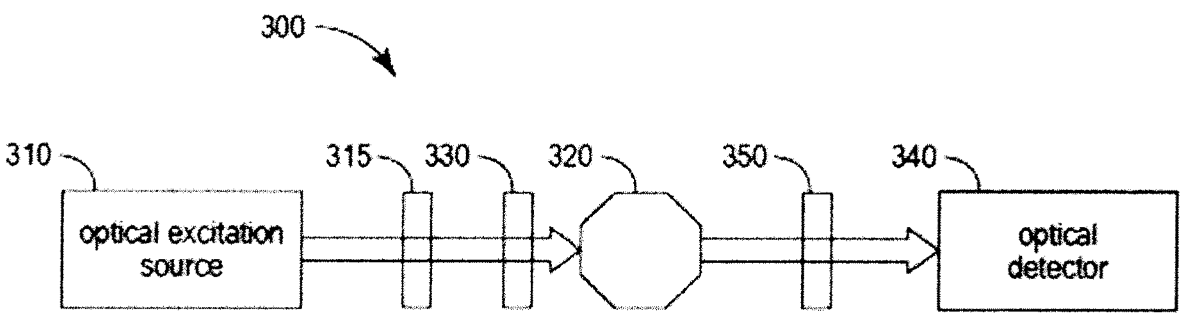
FIG. 3B is a schematic diagram illustrating a NV center magnetic sensor system with a waveplate in accordance with some illustrative embodiments.

FIG. 3B is a schematic diagram illustrating a NV center magnetic sensor system 300B with a waveplate 315. The NV center magnetic sensor system 300B uses fluorescence intensity to distinguish the $m_s$=±1 states, and to measure the magnetic field based on the energy difference between the $m_s$=+1 state and the $m_s$=−1 state. The system 300B includes an optical excitation source 310, which directs optical excitation through a waveplate 315 to a NV diamond material 320 with defect centers (e.g, NV diamond material). The system further includes an RF excitation source 330, which provides RF radiation to the NV diamond material 320. Light from the NV diamond may be directed through an optical filter 350 to an optical detector 340.

In some implementations, the RF excitation source 330 may be a microwave coil. The RF excitation source 330, when emitting RF radiation with a photon energy resonant with the transition energy between ground $m_s$=0 spin state and the $m_s$=+1 spin state, excites a transition between those spin states. For such a resonance, the spin state cycles between ground $m_s$=0 spin state and the $m_s$=+1 spin state, reducing the population in the $m_s$=0 spin state and reducing the overall fluorescence at resonances. Similarly, resonance occurs between the $m_s$=0 spin state and the $m_s$=−1 spin state of the ground state when the photon energy of the RF radiation emitted by the RF excitation source is the difference in energies of the $m_s$=0 spin state and the $m_s$=−1 spin state, or between the $m_s$=0 spin state and the $m_s$=+1 spin state, there is a decrease in the fluorescence intensity.

In some implementations, the optical excitation source 310 may be a laser or a light emitting diode which emits light in the green. In some implementations, the optical excitation source 310 induces fluorescence in the red, which corresponds to an electronic transition from the excited state to the ground state. In some implementations, the light from the optical excitation source 310 is directed through a waveplate 315. In some implementations, light from the NV diamond material 320 is directed through the optical filter 350 to filter out light in the excitation band (in the green, for example), and to pass light in the red fluorescence band, which in turn is detected by the optical detector 340. The optical excitation source 310, in addition to exciting fluorescence in the NV diamond material 320, also serves to reset the population of the $m_s$=0 spin state of the ground state $^3A_2$ to a maximum polarization, or other desired polarization.

In some implementations, the light is directed through a waveplate 315. In some implementations, the waveplate 315 may be in a shape analogous to a cylinder solid with an axis, height, and a base. In some implementations, the performance of the system is affected by the polarization of the light (e.g., light from a laser) as it is lined up with a crystal structure of the NV diamond material 320. In some implementations, a waveplate 315 may be mounted to allow for rotation of the waveplate 315 with the ability to stop and/or lock the waveplate 315 in to position at a specific rotation orientation. This allows the tuning of the polarization relative to the NV diamond material 320. Affecting the polarization of the system allows for the affecting the responsive Lorentzian curves. In some implementations where the waveplate 315 is a half-wave plate such that, when a laser polarization is lined up with the orientation of a given lattice of the NV diamond material 320, the contrast of the dimming Lorentzian, the portion of the light sensitive to magnetic fields, is deepest and narrowest so that the slope of each side of the Lorentzian is steepest. In some implementations where the waveplate 315 is a half-wave plate, a laser polarization lined up with the orientation of a given lattice of the NV diamond material 320 allows extraction of maximum sensitivity for the measurement of an external magnetic field component aligned with the given lattice. In some implementations, four positions of the waveplate 315 are determined to maximize the sensitivity to different lattices of the NV diamond material 320. In some implementations, a position of the waveplate 315 is determined to get similar sensitivities or contrasts to the four Lorentzians corresponding to lattices of the NV diamond material 320.

In some implementations where the waveplate 315 is a half-wave plate, a position of the waveplate 315 is determined as an initial calibration for a light directed through a waveplate 315. In some implementations, the performance of the system is affected by the polarization of the light (e.g., light from a laser) as it is lined up with a crystal structure of the NV diamond material 320. In some implementations, a waveplate 315 is mounted to allow for rotation of the waveplate 315 with the ability to stop and/or lock the half-wave after an initial calibration determines the eight Lorentzians associated with a given lattice with each pair of Lorentzians associated with a given lattice plane symmetric around the carrier frequency. In some implementations, the initial calibration is set to allow for high contrast with steep Lorentzians for a particular lattice plane. In some implementations, the initial calibration is set to create similar contrast and steepness of the Lorentzians for each of the four lattice planes. The structural details of the waveplate 315 will be discussed in further detail below While FIGS. 3A-3B illustrate an NV center magnetic sensor system 300A, 300B with NV diamond material 320 with a plurality of NV centers, in general, the magnetic sensor system may instead employ a different magneto-optical defect center material, with a plurality of magneto-optical defect centers. The electronic spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material. Magneto-optical defect center materials include but are not limited to diamonds, Silicon Carbide (SiC) and other materials with nitrogen, boron, or other chemical defect centers. Our references to diamond-nitrogen vacancies and diamonds are applicable to magneto-optical defect center materials and variations thereof.

Figure 6A:
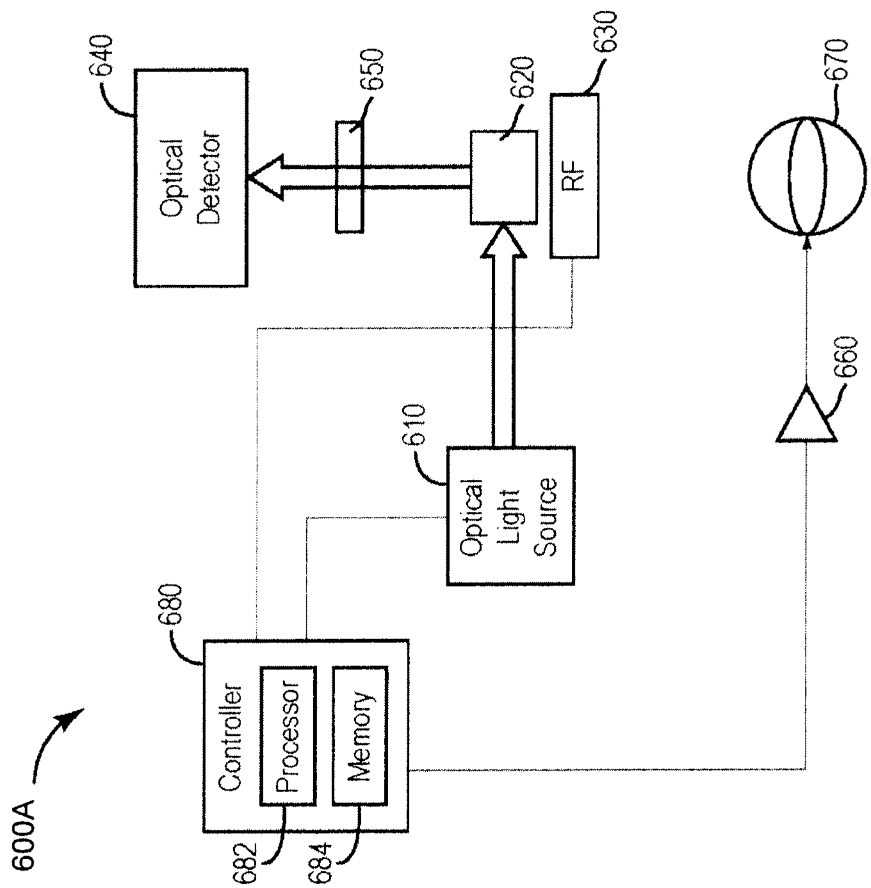
FIG. 6A is a schematic diagram illustrating some embodiments of a magnetic field detection system.

FIG. 6A illustrates a magnetic field detection system 600A according to some embodiments. The system 600A includes an optical light source 610 (i.e., the optical light source 310 of FIGS. 3A and 3B), which directs optical light to an NV diamond material 620 (i.e., the NV diamond material 320 of FIGS. 3A and 3B) with NV centers, or another magneto-optical defect center material with magneto-optical defect centers. An RF excitation source 630 (i.e., the RF excitation source 330 of FIGS. 3A and 3B) provides RF radiation to the NV diamond material 620. The system 600A may include a magnetic field generator 670 which generates a magnetic field, which may be detected at the NV diamond material 620, or the magnetic field generator 670 may be external to the system 600A. The magnetic field generator 670 may provide a biasing magnetic field.

Figure 6B:
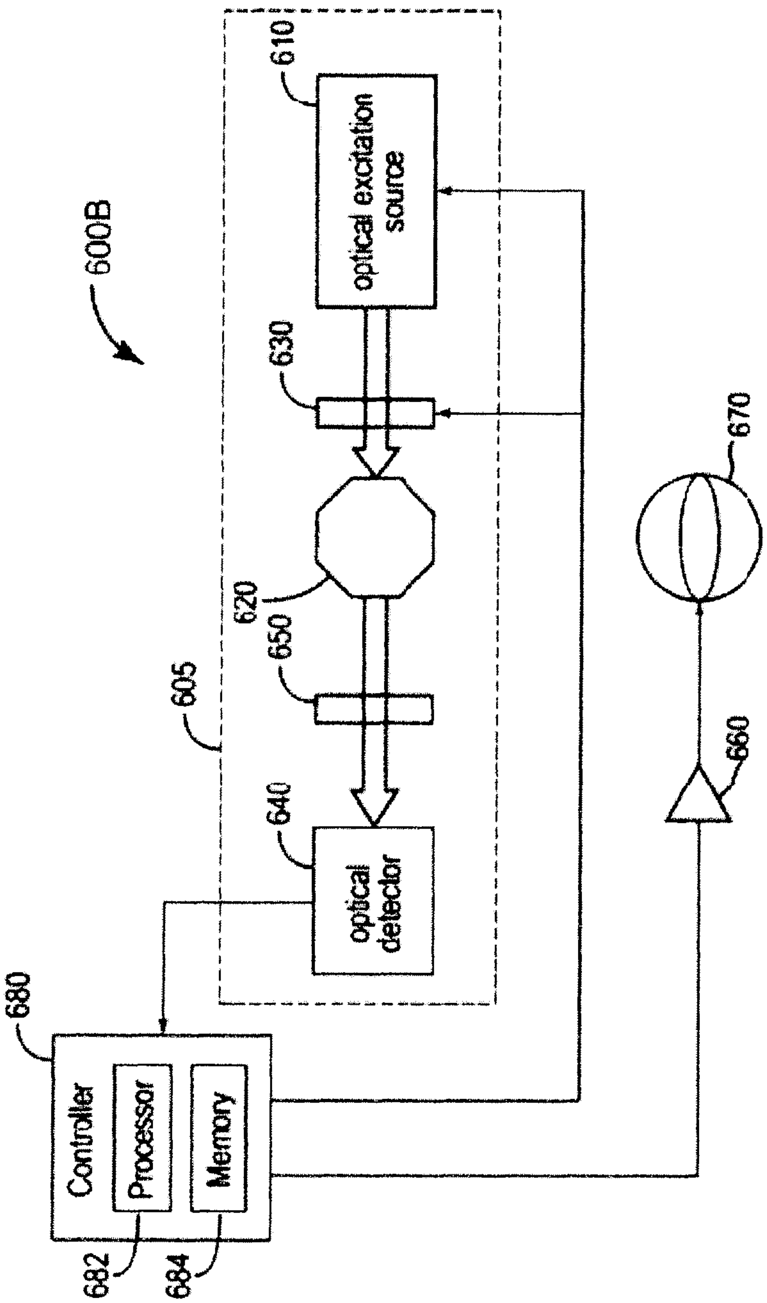
FIG. 6B is another schematic diagram illustrating some embodiments of a magnetic field detection system.

FIG. 6B is another schematic diagram of a magnetic field detection system 600B according to some embodiments. The system 600B includes an optical excitation source 610 (i.e., the optical excitation source 310 of FIGS. 3A and 3B), which directs optical excitation to a NV diamond material 620 (i.e., the NV diamond material 320 of FIGS. 3A and 3B) with defect centers. An RF excitation source 630 (i.e., the RF excitation source 330 of FIGS. 3A and 3B) provides RF radiation to the NV diamond material 620. A magnetic field generator 670 generates a magnetic field, which is detected at the NV diamond material 620.

Referring to both FIGS. 6A and 6B, the system 600A, 600B further includes a controller 680 arranged to receive a light detection signal from the optical detector 640 (i.e., the optical detector 340 of FIGS. 3A and 3B) and to control the optical light source 610, the RF excitation source 630, and the magnetic field generator 670. The controller 680 may be a single controller, or multiple controllers. For a controller 680 including multiple controllers, each of the controllers may perform different functions, such as controlling different components of the system 600A, 600B. The magnetic field generator 670 may be controlled by the controller 680 via an amplifier 660, for example.

The RF excitation source 630 may be controlled to emit RF radiation with a photon energy resonant with the transition energy between the ground $m_s=0$ spin state and the $m_s=\pm1$ spin states as discussed above with respect to FIG. 3A or 3B, or to emit RF radiation at other nonresonant photon energies.

The controller 680 is arranged to receive a light detection signal from the optical detector 640 and to control the optical light source 610, the RF excitation source 630, and the magnetic field generator 670. The controller 680 may include a processor 682 and a memory 684, in order to control the operation of the optical light source 610, the RF excitation source 630, and the magnetic field generator 670. The memory 684, which may include a nontransitory computer readable medium, may store instructions to allow the operation of the optical light source 610, the RF excitation source 630, and the magnetic field generator 670 to be controlled. That is, the controller 680 may be programmed to provide control.

The magnetic field generator 670 may generate magnetic fields with orthogonal polarizations, for example. In this regard, the magnetic field generator 670 may include two or more magnetic field generators, such as two or more Helmholtz coils. The two or more magnetic field generators may be configured to provide a magnetic field having a predetermined direction, each of which provide a relatively uniform magnetic field at the NV diamond material 620. The predetermined directions may be orthogonal to one another. In addition, the two or more magnetic field generators of the magnetic field generator 670 may be disposed at the same position, or may be separated from each other. In the case that the two or more magnetic field generators are separated from each other, the two or more magnetic field generators may be arranged in an array, such as a one-dimensional or two-dimensional array, for example.

The system 600A may be arranged to include one or more optical detection systems 605, where each of the optical detection systems 605 includes the optical detector 640, optical excitation source 610, and NV diamond material 620. Similarly, the system 600B also includes the optical detector 640, optical excitation source 610, and NV diamond material 620. The magnetic field generator 670 may have a relatively high power as compared to the optical detection systems 605. In this way, the optical systems 605 may be deployed in an environment that requires a relatively lower power for the optical systems 605, while the magnetic field generator 670 may be deployed in an environment that has a relatively high power available for the magnetic field generator 670 so as to apply a relatively strong magnetic field.

The RF excitation source 630 may be a microwave coil, for example behind the light of the optical excitation source 610. The RF excitation source 630 is controlled to emit RF radiation with a photon energy resonant with the transition energy between the ground $m_s=0$ spin state and the $m_s=\pm 1$ spin states as discussed above with respect to FIGS. 3A and 3B.

The optical excitation source 610 may be a laser or a light emitting diode, for example, which emits light in the green, for example. The optical excitation source 610 induces fluorescence in the red from the NV diamond material 620, where the fluorescence corresponds to an electronic transition from the excited state to the ground state. Light from the NV diamond material 620 is directed through the optical filter 650 to filter out light in the excitation band (in the green, for example), and to pass light in the red fluorescence band, which in turn is detected by the optical detector 640. The optical excitation light source 610, in addition to exciting fluorescence in the NV diamond material 620, also serves to reset the population of the $m_s=0$ spin state of the ground state $^3A_2$ to a maximum polarization, or other desired polarization.

The controller 680 is arranged to receive a light detection signal from the optical detector 640 and to control the optical excitation source 610, the RF excitation source 630, and a second magnetic field generator (not illustrated). The controller may include a processor 682 and a memory 684, in order to control the operation of the optical excitation source 610, the RF excitation source 630, and the second magnetic field generator. The memory 684, which may include a nontransitory computer readable medium, may store instructions to allow the operation of the optical excitation source 610, the RF excitation source 630, and the second magnetic field generator to be controlled. That is, the controller 680 may be programmed to provide control.

Figure 6C:
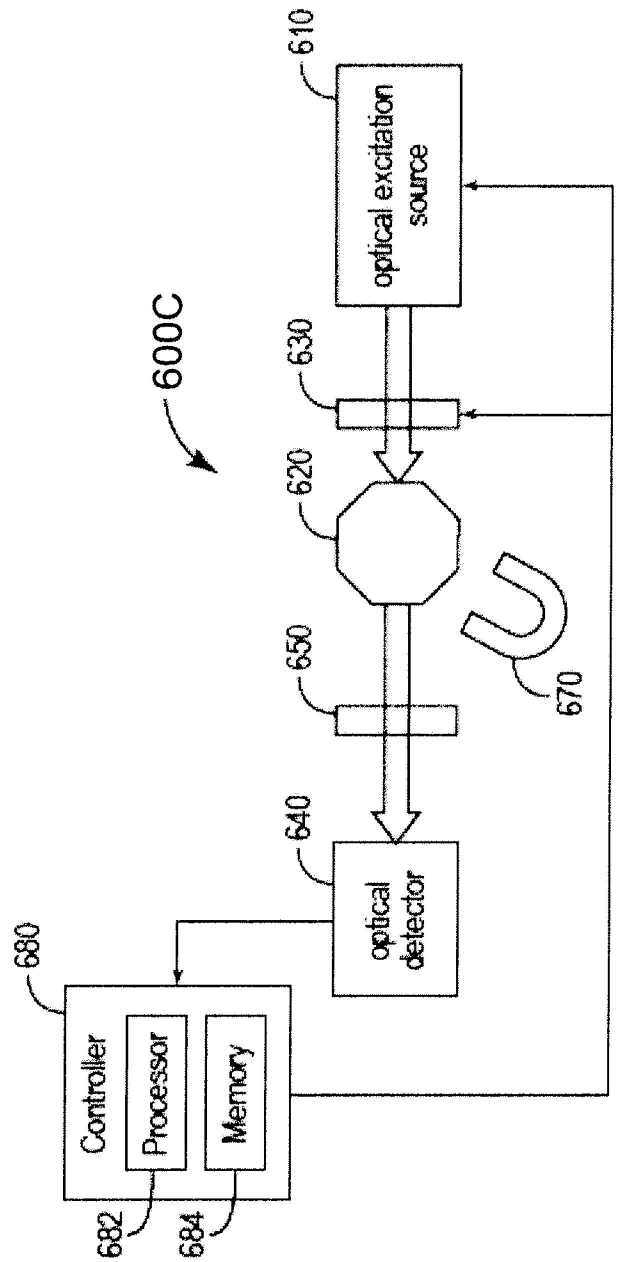
FIG. 6C is another schematic diagram illustrating some embodiments of a magnetic field detection system.

FIG. 6C is a schematic of an NV center magnetic sensor system 600C, according to an embodiment. The sensor system 600C includes an optical excitation source 610, which directs optical excitation to an NV diamond material 620 with NV centers, or another magneto-optical defect center material with magneto-optical defect centers. An RF excitation source 630 provides RF radiation to the NV diamond material 620. The NV center magnetic sensor system 600C may include a bias magnet (bias magnetic field generator 670) applying a bias magnetic field to the NV diamond material 620. Unlike FIGS. 6A and 6B, the sensor system 600C of FIG. 6C does not include the amplifier 660. However, in some implementations of the NV center magnetic sensor system 600C, an amplifier 660 may be utilized. Light from the NV diamond material 620 may be directed through an optical filter 650 and optionally, an electromagnetic interference (EMI) filter (not illustrated), which suppresses conducted interference, to an optical detector 640. The sensor system 600C further includes a controller 680 arranged to receive a light detection signal from the optical detector 640 and to control the optical excitation source 610 and the RF excitation source 630.

The optical excitation source 610 may be a laser or a light emitting diode, for example, which emits light in the green, for example. The optical excitation source 610 induces fluorescence in the red, which corresponds to an electronic transition from the excited state to the ground state. Light from the NV diamond material 620 is directed through the optical filter 650 to filter out light in the excitation band (in the green for example), and to pass light in the red fluorescence band, which in turn is detected by the optical detector 640. In implementations including the EMI filter, the EMI filter is arranged between the optical filter 650 and the optical detector 640 and suppresses conducted interference. The optical excitation light source 610, in addition to exciting fluorescence in the NV diamond material 620, also serves to reset the population of the $m_s=0$ spin state of the ground state $^3A_2$ to a maximum polarization, or other desired polarization.

Magnetic Detection Systems

Example Magneto-Optical Defect Center System

As shown in FIG. 7, the magneto-optical defect center magnetometer 700 has several components mounted between top plate 710, the bottom plate 720, and the PCB 722. The components of the magneto-optical defect center magnetometer 700 include a green laser diode 711, laser diode circuitry 712, a magneto-optical defect center element, such as diamond having nitrogen vacancies (DNV), RF amplifier circuitry 714, an RF element 716, one or more photo diodes 718, and photo diode circuitry 770. In operation, the green laser diode 711 emits green wavelength light toward the magneto-optical defect center element based on a control signal from the laser diode circuitry 712. The RF amplifier circuitry 714 receives an RF input signal via an RF connector 715. In some implementations, the RF signal is generated by a separate controller, such as an external RF wave form generator circuit. In other implementations, the RF waveform generator may be included with the magneto-optical defect center magnetometer 700. The RF amplifier circuitry 714 uses the RF input signal to control the RF element 716. The RF element 716 may include a microwave coil or coils. The RF element 716 emits RF radiation to control the spin of the magneto-optical defect centers of the magneto-optical defect center element to be aligned along a single direction, such as prior to a measurement by the magneto-optical defect center magnetometer 700. The magneto-optical defect center element, when excited by the green laser light, emits red wavelength based on external magnet fields and the emitted red light is detected by the one or more photo diodes 718. The detected red light by the photo diodes 718 may be processed by the photo diode circuitry 720 and/or may be outputted to an external circuit for processing. Based on the detected red light, the magneto-optical defect center magnetometer 700 can detect the directionality and intensity (e.g., vector) of the external magnetic field. Such a vector magnetometer may be used to detect other objects that generate magnetic fields. Power for the components and/or circuits of the magneto-optical defect center magnetometer 700 and data transmission to and/or from the magneto-optical defect center magnetometer 700 may be provided via a digital signal and power connector 724.

In some implementations, the magneto-optical defect center magnetometer 700 may include several other components to be mounted via the top plate 710, bottom plate 720, and PCB 722. Such components may include one or more focusing lenses 726, a flash laser 728 and/or flash laser focusing lenses, flash bulb driver circuitry 730, a mirror and/or filtering element 732, and/or one or more light pipes 734. The focusing lenses 726 may focus the emitted green wavelength light from the green laser diode 711 towards the magneto-optical defect center element. The flash laser 728 and/or flash laser focusing lenses may provide additional excitation green wavelength light to the magneto-optical defect center element, and the flash bulb driver circuitry 730 may control the operation of the flash laser 728. The mirror and/or filtering element 732 may be an element that is reflective for red wavelength light, but permits green wavelength light to pass through. In some implementations, the mirror and/or filtering element 732 may be applied to the magneto-optical defect center element, such as a coating, to reflect red wavelength light towards the photo diodes 718. In other implementations, the mirror and/or filtering element 732 may be a separate component that substantially surrounds or encases the magneto-optical defect center element. The one or more light pipes 734 transports red wavelength light emitted from the magneto-optical defect center element to the one or more photo diodes 718 such that the one or more photo diodes 718 may be positioned remote from the magneto-optical defect center element. Additional description may include the applications incorporated by reference.

As shown in FIG. 7, the components of the magneto-optical defect center magnetometer 700 are mounted to a single PCB 722 such that a compact magneto-optical defect center magnetometer 700 is constructed. In some current magneto-optical defect center magnetometry systems, separate components are assembled on to large stainless steel plates in laboratories for individual experimentation. Such configurations are large, cumbersome, and heavy, which limits the useful applications. Indeed, for certain configurations of magneto-optical defect center magnetometry systems with resolutions of approximately 300 picoteslas, the size of the system may be a meter or more in one or more directions. In contrast to such magneto-optical defect center magnetometry systems, the magneto-optical defect center magnetometer 700 of FIGS. 7-12 may have a weight of less than 0.5 kilograms, a power range of 1-5 watts, and a size of approximately 7.62 centimeters in the x-direction by 10.16 centimeters in the y-direction by 1.905 centimeters in the z-direction. The magneto-optical defect center magnetometer 700 may have a resolution of approximately 300 picoteslas, a bandwidth of 1 MHz, and a measurement range of 1000 microteslas. Such a compact magneto-optical defect center magnetometer 700 expands the range of potential applications for vector magneto-optical defect center magnetometry by providing a small weight, size and power magneto-optical defect center magnetometer 700. Such applications may include magneto-optical defect center vector magnetometry in aircraft, submersibles, vehicles, satellites, etc.

In the implementation shown in FIGS. 7-8, the excitation source components of the magneto-optical defect center magnetometer 700, such as the green laser diode 711 and one or more focusing lenses 726 are aligned along a first axis 750 and are mounted to the PCB 722. The collection components of the magneto-optical defect center magnetometer 700, such as the one or more photo diodes 718, mirror and/or filtering element 732, and/or one or more light pipes 734 are aligned along a second axis 760 and are mounted to the PCB 722. The second axis 760 is in the same plane as the first axis 750 and perpendicular to the first axis 750 such that the z-dimension of the magneto-optical defect center magnetometer 700 may be reduced to a minimum that is based on the z-dimensions of the components. Furthermore, by providing the excitation source components of the magneto-optical defect center magnetometer 700 along the first axis 750 perpendicular to the collection components of the magneto-optical defect center magnetometer 700 along the second axis 760, interference (e.g., magnetic, electrical, etc.) between the components may be reduced.

As shown in FIG. 7, the corresponding circuitry (e.g., the laser diode circuitry 712, RF amplifier circuitry 714, photo diode circuitry 720, etc.) for each component of the excitation and collection components are also mounted to the single PCB 722. Thus, electrical contact etchings on the PCB 722 can be used electrically couples the corresponding circuitry to each corresponding component, thereby eliminating any unnecessary connections and/or wiring between components. Furthermore, the corresponding circuitry is positioned on the PCB 722 near each corresponding component in open portions of the PCB 722 where the optical components of the excitation source components and/or collection components are not located. Such positioning reduces the x- and y-dimensional size of the magneto-optical defect center magnetometer while also reducing the length of any electrical contact etchings to electrically couple the corresponding circuitry to a corresponding component.

Referring generally to FIGS. 7-12, the components of the magneto-optical defect center magnetometer 700 also include a planar arrangement to reduce a z-direction size of the magneto-optical defect center magnetometer 700. The reduced z-direction size may be useful for positioning the magneto-optical defect center magnetometer 700 in a vehicle or other device to control for any vibratory influences and/or space constraints. Moreover, in some implementations, the size and/or weight of the magneto-optical defect center magnetometer 700 may be important. For instance, in aircraft, size and weight may be tightly controlled, so a small z-directional size may permit the magneto-optical defect center magnetometer to be positioned on a bulkhead and/or within a cockpit with minimal space impact. Moreover, the high stiffness and low mass of the top plate 710 and bottom plate 720 limit the weight of the magneto-optical defect center magnetometer 700.

The planar arrangement of the components of the magneto-optical defect center magnetometer 700 may also be useful. The planar arrangement allows for the excitation source, such as the green laser diode 711, and the collection device, such as the one or more photo diodes 718, to be positioned anywhere in the plane, thereby permitting varying configurations for the magneto-optical defect center magnetometer 700 to accommodate space constraints. Further still, the planar configuration also permits multiple excitation sources and/or collection devices to be utilized by the magneto-optical defect center magnetometer 700. As shown in FIGS. 7-12, a primary green laser diode 711 and a flash laser 728 can be used as excitation sources, while two light pipes 734 and photo diodes 718 are utilized for collection devices. Of course additional excitation sources and/or collection devices may be used as well. The planar arrangement of the components of the magneto-optical defect center magnetometer 700 is also beneficial for the mounting of optical components, such as the laser diodes, focusing lenses, light pipes, etc. on the PCB 722 because the planar arrangement limits any z-direction variability such that alignment using the pins and alignment openings positions the optical components in a known position relative to the other components of the magneto-optical defect center magnetometer 700. Further still, the planar arrangement of the components of the magneto-optical defect center magnetometer 700 provides a controlled reference plane for determining the vector of the detected external magnetic field. Still further, the planar arrangement permits usage of the mirror and/or filtering element 732 that can be configured to confine any and/or substantially all of the emitted red light from the magneto-optical defect center element to within a small z-direction area to be directed toward the one or more photo diodes 718. That is, the mirror and/or filtering element 732 can be configured to direct any emitted red wavelength light from the magneto-optical defect center element to within the plane defined by the planar arrangement.

By providing a magneto-optical defect center magnetometer 700 with the excitation source components and collection device components mounted to a single PCB 722, a small form factor magneto-optical defect center vector magnetometer may be provided for a range of applications.

In some implementations, the RF element 716 may be constructed in accordance with the teachings of U.S. Provisional Patent Application No. 62/343,492, filed May 31, 2016, entitled "LAYERED RF COIL FOR MAGNETOMETER", and U.S. Non-Provisional patent application Ser. No. 15/380,691, filed Dec. 15, 2016, entitled "LAYERED RF COIL FOR MAGNETOMETER," the entire contents of which are incorporated by reference herein in their entirety. In some implementations, the one or more light pipes 734 may be constructed in accordance with the teachings of U.S. Provisional Patent Application No. 62/343,746, filed May 31, 2016, entitled "DNV DEVICE INCLUDING LIGHT PIPE WITH OPTICAL COATINGS", U.S. Provisional Patent Application No. 62/343,750, filed May 31, 2016, entitled "DNV DEVICE INCLUDING LIGHT PIPE", the entire contents of each are incorporated by reference herein in their entirety. In some implementations, the mirror and/or filtering element 732 may be constructed in accordance with the teachings of U.S. Provisional Patent Application No. 62/343,758, filed May 31, 2016, entitled "OPTICAL FILTRATION SYSTEM FOR DIAMOND MATERIAL WITH NITROGEN VACANCY CENTERS", the entire contents of each are incorporated by reference herein in its entirety. In some implementations, the magneto-optical defect center magnetometer 700 may be constructed in accordance with the teachings of U.S. Provisional Patent Application No. 62/343,818, filed May 31, 2016, entitled "DIAMOND NITROGEN VACANCY MAGNETOMETER INTEGRATED STRUCTURE", U.S. Provisional Patent Application No. 62/343,600, filed May 31, 2016, entitled "TWO-STAGE OPTICAL DNV EXCITATION", U.S. Non-Provisional patent application Ser. No. 15/382,045, filed Dec. 16, 2016, entitled "TWO-STAGE OPTICAL DNV EXCITATION," U.S. Provisional Patent Application No. 62/343,602, filed May 31, 2016, entitled "SELECTED VOLUME CONTINUOUS ILLUMINATION MAGNETOMETER", the entire contents of each are incorporated by reference herein in their entirety.

FIG. 13 illustrates the RF element 716 with an arrangement of coils 1710 and an NV diamond material 1200. The RF element 716 includes a plurality of coils 1710*a*, 1710*b*, 1710*c*, 1710*d* and 1710*e* which may be arranged around the NV diamond material 1200, where the coils 1710 are in a layered arrangement one above the other. While the number of coils shown in FIG. 13 is five, the number may be more or less than five. The coils 1710 may be formed in a substrate 1720. The coils 1710 may be connected to an RF feed connector 1730 to allow power to be provided to the coils. The coils 1710 may be connected in parallel to the RF feed connector 1730.

While FIG. 13 illustrates the coils 1710 to be arranged around the NV diamond material 1200, the NV diamond material 1200 may have other arrangements relative to the coils 1710. For example, the NV diamond material 1200 may be arranged above or below the coils 1710. The NV diamond material 1200 may be arranged normal to the coils 1710, or at some other angle relative to the coils 1710.

The substrate 1720 may be a printed circuit board (PCB), for example, and the coils 1710 may be layered in the PCB and separated from each other by dielectric material. The coils 1710 may be formed of a conducting material such as a metal, such as copper, for example.

FIG. 14A is a side view of the coils 1710 and the RF connector 1730. The coils 1710 are spaced from each other in the layered arrangement, and may be spaced by a uniform spacing. The coils may have any shape, such as square or spiral. Preferably, the coils may have a spiral shape, as shown in FIG. 13 and in FIG. 14B, which is a top view of the coils 1710 and the RF connector 1730. In FIG. 14B, only the top coil 1710*a* can be seen, because the coils 1710*b*, 1710*c*, 1710*d* and 1710*e* are below the top coil 1710*b*.

The uniform spacing of the coils 1710 and uniform spacing between the spiral shape coils allow the RF element 716 to provide a uniform RF field in the NV diamond material 1200 over the frequency range needed for magnetic measurement of the NV diamond material 1200, which may enclosed by the coils 1710. This arrangement provides both uniformity in phase and gain of the RF signal throughout the needed frequency range, and throughout the different regions of the NV diamond material 1200. Further, the layered coils may be operated in a pulsed manner and in this arrangement in order to avoid unnecessary overlap interference. The interference is reduced in pulsed operation of the coils 1710.

FIGS. 15A, 15B and 15C illustrate the magnetic field H generated by the RF excitation source 716 in a plane parallel to the plane of the coils 1710 in the region of the NV diamond material 1200 at frequencies of 2 GHz, 3 GHz and 4 GHz, respectively. The arrangement is for a five layer coil with spiral shaped coils. FIG. 16 is a table illustrating the electric field E and magnetic field H generated by the RF element 716 in the region of the NV diamond material 1200 at frequencies from 2.0 to 4.0 GHz for the five layer coil arrangement with spiral shaped coils. Thus, FIGS. 15A, 15B and 15C illustrate the uniformity of the magnetic field, and FIG. 16 illustrates the uniformity of the electric field E and magnetic field H in the NV diamond material 1200 over the needed frequency range, and throughout the different regions of the NV diamond material 1200.

Optical Waveguide or Light Pipe

FIG. 17 is a schematic illustrating details of an optical waveguide assembly 1800 that transmits light from the NV diamond material 1200 to an optical detector 640, such as photo diodes 718 of FIG. 8, in some embodiments. The optical waveguide assembly 1800 may include an optical waveguide 1810 and an optical filter 1850 to filter out light in the excitation band (in the green, for example), and to pass light in the red fluorescence band, which in turn is detected by the optical detector 640.

The optical waveguide 734 may be any appropriate optical waveguide. In some embodiments, the optical waveguide is a light pipe. The light pipe may have any appropriate geometry. In some embodiments, the light pipe may have a circular cross-section, square cross-section, rectangular cross-section, hexagonal cross-section, or octagonal cross-section. A hexagonal cross-section may be preferred, as a light pipe with a hexagonal cross-section exhibits less light loss than a light pipe with a square cross-section and is capable of being mounted with less contact area than a light pipe with a circular cross-section.

The light pipe 1810 may be formed from any appropriate material. In some embodiments, the light pipe may be formed from a borosilicate glass material. The light pipe may be formed of a material capable of transmitting light in the wavelength range of about 350 nm to about 2,200 nm. In some embodiments, the light pipe may be a commercially available light pipe.

The optical filter 1850 may be any appropriate optical filter capable of transmitting red light and reflecting other light, such as green light. In some embodiments, the optical filter 1850 may be a coating applied to an end surface of the light pipe 1810. The coating may be any appropriate anti-reflection coating for red light. In some embodiments, the anti-reflective coating may exhibit greater than 99% transmittance for light in the wavelength range of about 650 nm to about 850 nm. Preferably, the anti-reflective coating may exhibit greater than 99.9% transmittance for light in the wavelength range of about 650 nm to about 850 nm. The optical filter 1850 may be disposed on an end surface of the light pipe 1810 adjacent to the optical detector 640.

In some embodiments, the optical filter 1850 may also be highly reflective for light other than red light, such as green light. Such an optical filter may be a dichroic coating or multiple coatings with the desired cumulative optical properties. The optical filter may exhibit less than about 0.1% transmittance for light with a wavelength of less than about 600 nm. Preferably, the optical filter may exhibit less than about 0.01% transmittance for light with a wavelength of less than about 600 nm. FIG. 20 is a schematic illustrating the behavior of an optical filter 1900 with respect to green light 1910 and red light 1920 according to some embodiments. The optical filter 1900 can be anti-reflective for the red light 1920, resulting in at least some of the red light 1912 transmitted through the optical filter 1900. The optical filter 1900 can be highly reflective for the green light 1910, resulting in green light 1922 being reflected by the optical filter 1900 and at least most of the green light 1922 not transmitted therethrough.

The optical filter 1850 may be a coating formed by any appropriate method. In some embodiments, the optical filter 1850 may be formed by an ion beam sputtering (IBS) process. The coating may be a single-layer coating or a multi-layer coating. The coating may include any appropriate material, such as magnesium fluoride, silica, hafnia, or tantalum pentoxide. The material for the coating may be selected based on the light pipe material and the material which the coating will be in contact with, such as an optical coupling material, to produce the desired optical properties. The coating may have a hardness that approximately matches the hardness of the light pipe. The coating may have a high density, and exhibit good stability with respect to humidity and temperature.

The optical waveguide assembly 1800 may optionally include a second optical filter 1852. The second optical filter 1852 may be a coating disposed on an end surface of the light pipe 1810 adjacent to the diamond material 1200. The second optical filter 1852 may be any of the coatings described above with respect to the optical filter 1850. The inclusion of a second optical filter 1852 may improve the performance of the optical waveguide assembly by about 10%, in comparison to an optical waveguide assembly with a single optical filter.

As shown in FIG. 17, the optical waveguide assembly 1800 may include an optical coupling material 1834 disposed between the light pipe 1810 or second optical filter 1852 and the diamond material 1200. An optical coupling material 1832 may also be disposed between the light pipe 1810 or optical filter 1850 and the optical detector 640. The optical coupling material may be any appropriate optical coupling material, such as a gel or epoxy. In some embodiments, the optical coupling material may be selected to have optical properties, such as an index of refraction, that improves the light transmission between the coupled components. The coupling material may be in the form of a layer formed between the components to be coupled. In some embodiments, the coupling material layer may have a thickness of about 1 microns to about 5 microns. The coupling material may serve to eliminate air gaps between the components to be coupled, increasing the light transmission efficiency. As shown in FIG. 17, the coupling materials 1832 and 1834 may also account for size mismatches between the components to be coupled. The coupling material may be selected such that an efficiency of the optical waveguide assembly is increased by about 10%. The coupling material may produce a light transmission between the components to be coupled that is functionally equivalent to direct contact between the components to be coupled. In some embodiments, an epoxy coupling material may also serve to mount the diamond material to the optical waveguide assembly, such that other supports for the diamond material are not required. In some embodiments, a coupling material may not be necessary where direct contact between the optical filter or light pipe and the optical detector is achieved. Similarly, a coupling material may not be necessary where direct contact between the light pipe or second optical filter and the diamond material is achieved.

FIG. 18 shows a light pipe 1810 with a hexagonal cross-section and the interaction with a mount 1820 securing the light pipe 1810 within the device in some embodiments. The light pipe 1810 may be mounted such that only the vertices 1812 of the light pipe 1810 contact the mount 1820. Such an arrangement allows the light pipe to be securely and rigidly supported by the mount 1820, while also reducing the contact area between the mount 1820 and the surface of the light pipe 1810. Contact between the light pipe and the mount may result in a reduction in the efficiency of the optical waveguide assembly 1800. As shown in FIG. 18, a mount 1820 with a circular support opening may be successfully employed to support a light pipe 1810 with a hexagonal cross-section.

FIG. 19 shows a top down schematic of an arrangement of optical waveguide assemblies according to some embodiments. The optical filters and optical coupling materials are not shown in FIG. 19 for the sake of clarity. As shown in FIG. 19, more than one optical waveguide assembly may be included in the magnetic sensor system, such as two or more optical waveguide assemblies. The inclusion of more than one optical waveguide assemblies allows more than one optical detector 640 to be included in the magnetic sensor device, increasing the amount of light collected and measured by the optical detectors 640. The inclusion of additional optical detectors 640 also increases the amount of noise in the system, which may negatively impact the sensitivity or accuracy of the system. The use of two optical waveguide assemblies may provide a compromise between increased light collection and increased noise. Each optical waveguide assembly in the magnetic sensor system may be associated with a different optical detector, but the same diamond material.

The light pipe 1810 may be mounted to the magnetic sensor system by at least one mount 1820. In some embodiments, two mounts 1820 may support each light pipe 1810 in the magnetic sensor system. The light pipe may be mounted to the device rigidly, such that the alignment of the light pipe 1810, the optical detector 640, and the diamond material 1200 is maintained during operation of the system. The mounting of the light pipe to the magnetic sensor system may be sufficiently rigid to prevent a mechanical response of the light pipe in the region that would affect the measurement of light by the optical detector.

The light pipe can be selected to have an appropriate aperture size. The aperture of the light pipe can be selected to be matched to or smaller than the optical detector. This size relationship allows the optical detector to capture the highest possible percentage of the light emitted by the light pipe. The aperture of the light pipe can be also selected to be larger than the surface of the diamond material to which it is coupled. This size relationship allows the light pipe to capture the highest possible percentage of light emitted by the diamond material. In some embodiments, the light pipe may have an aperture of about 4 mm. In some other embodiments, the light pipe may have an aperture of about 2 mm. In some embodiments, the light pipe may have an aperture of 4 mm, and the diamond material may have a coupled surface with a height of 0.6 mm and a length of 2 mm, or less. The light pipe may have any appropriate length, such as about 25 mm.

As shown in FIG. 19, the light pipe can be positioned such that the end surface of the light pipe adjacent the diamond material is parallel, or substantially parallel, to the associated surface of the diamond material. This arrangement allows the light pipe to capture an increased amount of the light emitted by the diamond material. The alignment of the surfaces of the light pipe and the diamond material ensures that a maximum amount of the light emitted by the diamond material will intersect the end surface of the light pipe, thereby being captured by the light pipe.

Optical Filtration System

With reference to FIG. 21, some embodiments of an optical filtration system 2100 is illustrated. In these embodiments, the optical filtration system 2100 includes an optical excitation source 2110, a vacancy material 2105 with vacancy centers, a RF excitation source 2120, optical guide 2130, and an optical filter 2150.

The optical filter 2150 is configured to provide at least a second portion of light corresponding to a second wavelength W2 to a plurality of optical collectors 2130 as described herein.

The optical excitation source 2110 may be a laser or a light emitting diode. The optical excitation source may be configured to generate light corresponding to a first wavelength W1. For example, the optical excitation source 2110 may emit light corresponding to green.

The vacancy material 2105 may be configured to receive optical excitation based, at least in part, on the generation of light corresponding to a first wavelength W1. In some further embodiments, the NV diamond material 2105 may be configured to receive radio frequency (RF) excitation provided via the RF excitation source as described herein above.

In turn, the vacancy material 2105 may be configured to generate light corresponding to a second wavelength W2 (e.g., a wavelength corresponding to red) responsive to the RF excitation and the optical excitation received. In this regard, the optical excitation source 2110 induces fluorescence by the vacancy material 2105 corresponding to the second wavelength W2. The inducement of fluorescence causes an electronic transition from the excited state to the ground state. The optical excitation source 2110, in addition to exciting fluorescence in the NV diamond material 2105, also serves to reset the population of the $m_s=0$ spin state of the ground state $^3A_2$ to a maximum polarization, or other desired polarization.

The optical filtration system 2100 includes a plurality of optical collectors 2130 configured to receive at least a first portion of light corresponding to the second wavelength W2. The optical collectors may take the form of light pipes, light tubes, lenses, optical fibers, optical waveguides, etc. For example, as the vacancy material 2105 generates light corresponding to the second wavelength W2 (e.g., red light), a first portion of the light corresponding to the second wavelength W2 may enter or is otherwise received by the optical collectors 2130. The light corresponding to the wavelength W2 may be received by the receiving ends 2132 of each respective optical collector 2130. In some embodiments, the receiving ends 2132 may be disposed proximate to (e.g., adjacent to or otherwise near) the vacancy material 2105. Although a plurality of optical collectors 2130 is depicted, in some embodiments, one optical collector 2130 (as depicted in FIG. 22) may be configured to receive at least a first portion of light corresponding to the second wavelength W2.

As illustrated in FIG. 21, the NV diamond material 2105 is disposed between the receiving ends 2132 such that the optical collectors 2130 are configured to form a gap G. A second portion of the light corresponding to the wavelength W2 may be directed beyond the gap G and/or the optical collectors 2130. For example, the light directed beyond the gap G may not enter or otherwise be received by the optical collectors 2130. The gap G may include an adhesive material such as a gel or an epoxy. Although a gap G is depicted, the gap G may be filled or otherwise inexistent such that the NV diamond material 2105 may generate light without the gap G as described herein.

The optical filtration system 2100 further includes the optical filter 2150. The optical filter 2150 is configured to provide at least a second portion of light corresponding to the second wavelength W2 to the plurality of optical collectors 2130. As used herein, the term "optical filter" may be used to refer to a filter configured to transmit (e.g. pass) light corresponding to one or more predetermined wavelengths (e.g., a first wavelength corresponding to green) while reflecting light corresponding to other predetermined wavelengths (e.g., a second wavelength corresponding to red). In some embodiments, the optical filter 2150 may take the form of a dichroic filter, interference filter, thin-film filter, dichroic mirror, dichroic reflector, or a combination thereof. The optical filter 2150 (e.g., a dichroic filter) may be configured to reflect light corresponding to the second wavelength W2 (e.g., light in the red fluorescence band) from the vacancy material 2105 which, in turn, is received by the optical collectors 2130. For example, the optical filter 2150 may reflect the light directed beyond the gap G to the optical collectors 2130 that would otherwise not enter or be received by the optical collectors 2130.

Alternatively or additionally, light corresponding to the first wavelength W1 from the vacancy material 2105 may be directed through the optical filter 2150 to filter out the light corresponding to the first wavelength W1 (e.g., in the green fluorescence band). Although a single optical filter 2150 is depicted, in some embodiments, a plurality of optical filters 2150 (as depicted in FIG. 22) may be configured to provide at least a second portion of light corresponding to a second wavelength W2 to one or more optical collectors 2130.

In some embodiments, the optical filter 2150 includes an optical coating (e.g., an anti-reflection coating, high reflective coating, filter coating, beamsplitter coating, etc.) configured to facilitate transmission of light corresponding to the first wavelength W1 (e.g., light corresponding to green) through the optical filter 2150. The optical coating may include at least one of a soft coating (e.g., one or more layers of thin film) or a hard coating. The optical coating may be made of a material such as zinc sulfide, cryolyte, silver, and/or any other like suitable material, or a combination thereof.

The optical coating (e.g., the anti-reflective coating) is further configured to facilitate the provision of the light corresponding to the second wavelength W2 to the optical collectors 2130. For example, the optical coating facilitates the reflection of the light corresponding to the second wavelength W2 from the vacancy material 2105 to the optical collectors 2130.

As illustrated in FIG. 23, the optical coating may include a substrate S and one or more layers Ln configured to at least one of transmit or reflect light according to at least one refractive index which describes how light propagates through the optical filter 2150. In this regard, the phase shift between the light corresponding to the second wavelength W2 reflected, for example, at the first and second points P1, P2 of the layer Ln is 180°. In turn, the reflections R1, R2 (e.g., the reflected rays) are cancelled responsive to interference such as, but not limited to, destructive interference. Advantageously, the optical coating increases transmission, efficiency by which the light corresponding to the second wavelength W2 is received by the optical collectors 2130 and resists environmental damage to the optical filter 2150.

With reference back to FIG. 21, the optical filter 2150 may be disposed at least one of above, beneath, behind, or in front of the vacancy material 2105 to receive and, in turn, provide the light corresponding to the second wavelength W2 (e.g., light in the red fluorescence band) to the optical collectors 2130. As illustrated, the optical filter 2150 is disposed behind the NV diamond material 2105 such that the optical filter 2150 reflects light corresponding to the second wavelength W2 from the vacancy material 2105. In some embodiments, the optical filter 2150 may be configured to enclose or otherwise surround the vacancy material 2105. The enclosing of the vacancy material 2105 increases the reflection of light corresponding to the second wavelength W2 from the vacancy material 2105 to the optical collectors 2130.

In some embodiments, the optical filter 2150 is disposed proximate to the plurality of optical collectors 2130. The optical filter 2150 may be disposed within a predetermined distance to the optical collectors 2130. For example, the optical filter 2150 may be disposed next to the optical collectors 2130 as depicted. The optical filter 2150 may be disposed at least one of above, beneath, behind, or in front of the plurality of optical collectors 2130. As depicted, the optical filter 2150 is disposed behind the plurality of optical collectors 2130. Advantageously, disposing the optical filter 2150 behind the plurality of optical collectors 2130 facilitates the removal of light corresponding to the first wavelength W1 (e.g., light corresponding to green) by the optical filter 2150 which reduces noise and/or other errors introduced by W1.

In further embodiments, a predetermined dimension (e.g., length, width, height, etc.) corresponding to the optical filter 2150 may be configured to extend beyond a predetermined dimension (e.g., length, width, height, etc.) corresponding to the gap G and/or the optical collectors 2130. For example, the width of the optical filter 2150 may be configured to be greater than the width of the gap G to compensate for over tolerances in manufacturing such that the optical filter 2150 covers the gap G. As the light corresponding to the second wavelength W2 makes contact C with or otherwise hits the optical filter 2150, the light W2 is reflected (as illustrated in FIG. 24) from the optical filter 2150 to the optical collectors 2130. The light ray W2 R is reflected at an angle of incidence a and an angle of reflection β as depicted across the normal N. The angle of incidence may equal the angle of reflection. Each respective angle may measure between 0 degrees and 180 degrees based on one or more refractive indices corresponding to the optical filter 2150. Alternatively or additionally, the height of the optical filter 2150 may be configured to be greater than the height of the optical collectors 2130 to compensate for over tolerances in manufacturing such that the optical filter 2150 receives light (e.g., light corresponding to the second wavelength W2) directed beyond the optical collectors 2130. In turn, the optical filter 2150 reflects or otherwise provides the light corresponding to the second wavelength W2 to the optical collectors 2130.

Magneto-Optical Defect Center Magnetometer Integrated Structure

Referring generally to FIG. 25, a magneto-optical defect center magnetometer 2500 may be provided that includes a top plate 2510 and a bottom plate 2520. The bottom plate 2520 may include a printed circuit board (PCB) 2522 that is configured to mount the components of the magneto-optical defect center magnetometer 2500 thereto. The top plate 2510 and bottom plate 2520 may be formed of a material with a high stiffness and a low mass, such as stainless steel, titanium, aluminum, carbon fiber, a composite material, etc. The high stiffness of the top plate 2510 and bottom plate 2520 is such that any vibration modes occur outside of the range of frequencies that may negatively affect the magneto-optical defect center magnetometer 2500 sensor performance. The top plate 2510, bottom plate 2520, and PCB 2522 includes alignment holes into which pins for one or more components of the magneto-optical defect center magnetometer 2500 may be inserted to align the one or more components and, when the top plate and bottom plate 2520 are pressed together, the pins lock the components in place to maintain alignment of the one or more components after assembly of the magneto-optical defect center magnetometer 2500.

As shown in FIG. 26, the magneto-optical defect center magnetometer 2500 has several components mounted between top plate 2510, the bottom plate 2520, and the PCB 2522. The components of the magneto-optical defect center magnetometer 2500 include a green laser diode 2610, laser diode circuitry 2612, a magneto-optical defect center element, such as a diamond having nitrogen vacancies (DNV), RF amplifier circuitry 2614, an RF element 2616, one or more photo diodes 2618, and photo diode circuitry 2620. In operation, the green laser diode 2610 emits green wavelength light toward the magneto-optical defect center element based on a control signal from the laser diode circuitry 2612. The RF amplifier circuitry 2614 receives an RF input signal via an RF connector 2622. In some implementations, the RF signal is generated by a separate controller, such as an external RF wave form generator circuit. In other implementations, the RF waveform generator may be included with the magneto-optical defect center magnetometer 2500. The RF amplifier circuitry 2614 uses the RF input signal to control the RF element 2616. The RF element 2616 may include a microwave coil or coils. The RF element 2616 emits RF radiation to control the spin of the centers of the magneto-optical defect center element to be aligned along a single direction, such as prior to a measurement by the magneto-optical defect center magnetometer 2500. The magneto-optical defect center element, when excited by the green laser light, emits red wavelength based on external magnet fields and the emitted red light is detected by the one or more photo diodes 2618. The detected red light by the photo diodes 2618 may be processed by the photo diode circuitry 220 and/or may be outputted to an external circuit for processing. Based on the detected red light, the magneto-optical defect center magnetometer 2500 can detect the directionality and intensity (e.g., vector) of the external magnetic field. Such a vector magnetometer may be used to detect other objects that generate or distort magnetic fields. Power for the components and/or circuits of the magneto-optical defect center magnetometer 2500 and data transmission to and/or from the magneto-optical defect center magnetometer 2500 may be provided via a digital signal and power connector 2624.

In some implementations, the magneto-optical defect center magnetometer 2500 may include several other components to be mounted via the top plate 2510, bottom plate 2520, and PCB 2522. Such components may include one or more focusing lenses 2626, a flash laser 2628 and/or flash laser focusing lenses, excitation driver circuitry 2630, a mirror and/or filtering element 2632, and/or one or more light pipes 2634. The focusing lenses 2626 may focus the emitted green wavelength light from the green laser diode 2610 towards the magneto-optical defect center element. The flash laser 2628 and/or flash laser focusing lenses may provide additional excitation green wavelength light to the magneto-optical defect center element, and the excitation driver circuitry 2630 may control the operation of the flash laser 2628. The mirror and/or filtering element 2632 may be an element that is reflective for red wavelength light, but permits green wavelength light to pass through. In some implementations, the mirror and/or filtering element 2632 may be applied to the magneto-optical defect center element, such as a coating, to reflect red wavelength light towards the photo diodes 2618. In other implementations, the mirror and/or filtering element 2632 may be a separate component that substantially surrounds or encases the magneto-optical defect center element. The one or more light pipes 2634 transports red wavelength light emitted from the magneto-optical defect center element to the one or more photo diodes 2618 such that the one or more photo diodes 2618 may be positioned remote from the magneto-optical defect center element. Additional description may include the applications incorporated by reference.

As can be seen in FIG. 26, the elements of the magneto-optical defect center magnetometer 2500 need to be aligned such that the emitted green light from the green laser diode 2610 is directed towards the magneto-optical defect center element and the emitted red wavelength light from the magneto-optical defect center element is directed toward the one or more photo diodes 2618 to be detected. Thus, the various elements must be mounted to the magneto-optical defect center magnetometer 2500 in a manner that aligns and holds the elements in position both during assembly and operation. In some implementations, the elements to be aligned include the green laser diode 2610, any focusing lenses 2626, any flash laser 2628, the RF element 2616, any mirror and/or filtering element 2632, any support elements for any light pipes 2634, and the one or more photo diodes 2618. In some implementations, a two-point orientation system may be implemented to align and secure the elements to be mounted for the magneto-optical defect center magnetometer 2500. That is, the components to be aligned and mounted, or a support or mounting element for each component, includes two points to be aligned relative to the top plate 2510 and two points to be aligned relative to the bottom plate 2520 and PCB 2522. When the two points are aligned and secured relative to the top plate 2510, then the component and/or support or mounting element is rotationally and translationally fixed relative to the top plate 2510. Similarly, when the two points are aligned and secured relative to the bottom plate 2520 and PCB 2522, then the component and/or support or mounting element is rotationally and translationally fixed relative to the bottom plate 2520 and PCB 2522. When the component and/or support or mounting element is positioned between the top plate 2510 and the bottom plate 2520 and PCB 2522, then the component and/or support or mounting element is secured such that the component and/or support or mounting element has a fixed orientation and position for the magneto-optical defect center magnetometer 2500. In some implementations, the two-point orientation system can include two separate components, such as two top pins and two bottom pins. In other implementations, the two-point orientation system may include two surfaces of a single component, such as two different surfaces of a single top pin and single bottom pin. In still other implementations, additional alignment and/or securing points may be used, such as three pins and/or surfaces, four pins and/or surfaces, etc.

In the implementations shown, the top plate 2510, bottom plate 2520, and PCB 2522 are manufactured and/or machined to include one or more alignment openings, such as alignment openings of the top plate 2510 shown in FIG. 31. In some implementations, the alignment openings may be circular, triangular, square, ovular, ellipsoidal, pentagonal, hexagonal, star shaped, etc. Two or more alignment openings may be provided for the two-point orientation system for each component, such as two circular alignment openings. In other implementations, the alignment openings may be asymmetric openings such that a corresponding pin can only be inserted in a particular orientation. For instance, the alignment openings may be semicircular, etc. The asymmetrical alignment openings may provide two surfaces for the two-point orientation system to align and secure each component and/or a support or mounting element for each component.

Each support or mounting element, such as the supports or mounting elements shown in FIG. 32, for each of the components to be aligned for the magneto-optical defect center magnetometer 2500 may include one or more corresponding pins, such as pin 2692 shown in FIG. 26. In some implementations, the one or more corresponding pins may have an asymmetrical cross-sectional geometry to provide two surfaces for the two-point orientation system to align the components relative to the top plate 2510, bottom plate 2520, and PCB 2522. In some implementations, each support or mounting element for each component of the DNV magnetometer 2500 may include two top pins and two bottom pins to align each component relative to the top plate 2510, bottom plate 2520, and PCB 2522. The two top pins and two bottom pins may further limit misalignment. In some implementations, the support or mounting elements may be formed of a plastic, aluminum, titanium, stainless steel, carbon fiber, a composite material, etc. In some implementations, the pins of the support or mounting elements may be configured to be press-fit pins such that the pins compress and form an interference fit with the corresponding alignment openings of the top plate 2510, bottom plate 2520, and PCB 2522. In some implementations, the components may be affixed, such as by an adhesive, mechanical attachment, etc., to a corresponding support or mounting element. For instance, as shown in FIG. 32, support or mounting elements for a laser diode and/or focusing lens, photo diode, and light pipe are shown.

When the magneto-optical defect center magnetometer 2500 is assembled, a bottom pin for each component is inserted through an alignment opening of the PCB 2522 and bottom plate 2520 to initially mount the component. The top plate 2510 may then be aligned with the top pins for each component and the top plate 2510 and bottom plate 2520 are pressed together to secure and maintain alignment of the components of the magneto-optical defect center magnetometer 2500. In some implementations, the pins may be soldered to the top plate 2510 and/or bottom plate 2520 to fix the components in position. In some implementations, standoffs 2530 are provided to mechanically couple the top plate 2510 to the bottom plate 2520 and PCB 2522. The standoffs 2530 may be formed with the bottom plate 2520 and extend through the PCB 2522 and/or may be separate components attached to the bottom plate 2520 and PCB 2522. In the implementation shown, the standoffs 2530 include threading for a screw, bolt, or other attachment component to be inserted through an opening of the top plate 2510 and secured to the standoff 2530. In other implementations, the standoffs 2530 may be welded or otherwise secured to the top plate 2510.

By providing alignment pins for the various components of the magneto-optical defect center magnetometer 2500, the components can be secured in a preset position during assembly and operation of the magneto-optical defect center magnetometer 2500. Moreover, by providing a high stiffness and low mass material for the top plate 2510 and bottom plate 2520, any low frequency vibrations can be transmitted through the magneto-optical defect center magnetometer 2500 without affecting the higher frequency operations of the magneto-optical defect center magnetometer 2500.

Referring generally to FIGS. 25-32, the components of the magneto-optical defect center magnetometer 2500 also include a planar arrangement to reduce a z-direction size of the magneto-optical defect center magnetometer 2500. The reduced z-direction size may be useful for positioning the magneto-optical defect center magnetometer 2500 in a vehicle or other device to control for any vibratory influences and/or space constraints. Moreover, in some implementations, the size and/or weight of the magneto-optical defect center magnetometer 2500 may be important. For instance, magneto-optical defect center aircraft, size and weight may be tightly controlled, so a small z-directional size may permit the magneto-optical defect center magnetometer to be positioned on a bulkhead and/or within a cockpit with minimal space impact. Moreover, the high stiffness and low mass of the top plate 2510 and bottom plate 2520 limit the weight of the magneto-optical defect center magnetometer 2500.

The planar arrangement of the components of the magneto-optical defect center magnetometer 2500 may also be useful. The planar arrangement allows for the excitation source, such as the green laser diode 2610, and the collection device, such as the one or more photo diodes 2618, to be positioned anywhere in the plane, thereby permitting varying configurations for the magneto-optical defect center magnetometer 2500 to accommodate space constraints. Further still, the planar configuration also permits multiple excitation sources and/or collection devices to be utilized by the magneto-optical defect center magnetometer 2500. As shown in FIGS. 25-31, a primary green laser diode 2610 and a flash laser 2628 can be used as excitation sources, while two light pipes 2634 and photo diodes 2618 are utilized for collection devices. Of course additional excitation sources and/or collection devices may be used as well. The planar arrangement of the components of the magneto-optical defect center magnetometer 2500 is also beneficial for the mounting of optical components, such as the laser diodes, focusing lenses, light pipes, etc. on the PCB 2522 because the planar arrangement limits any z-direction variability such that alignment using the pins and alignment openings positions the optical components in a known position relative to the other components of the magneto-optical defect center magnetometer 2500. Further still, the planar arrangement of the components of the magneto-optical defect center magnetometer 2500 provides a controlled reference plane for determining the vector of the detected external magnetic field. Still further, the planar arrangement permits usage of the mirror and/or filtering element 2632 that can be configured to confine any and/or substantially all of the emitted red light from the magneto-optical defect center element to within a small z-direction area to be directed toward the one or more photo diodes 2618. That is, the mirror and/or filtering element 2632 can be configured to direct any emitted red wavelength light from the magneto-optical defect center element to within the plane defined by the planar arrangement.

In some implementations, the magneto-optical defect center magnetometer 2500 may have a weight of less than 0.5 kilograms, a range of power of 1-5 watts, and a size of approximately 7.62 centimeters in the x-direction by 10.16 centimeters in the y-direction by 1.905 centimeters in the z-direction. The magneto-optical defect center magnetometer 2500 may have a resolution of approximately 300 picoteslas, a bandwidth of 1 MHz, and a measurement range of 1000 microteslas.

Two-Stage Optical Excitation

FIG. 33 is a schematic illustrating details of an optical light source 610, such as the green laser diode 711 of FIG. 8. The optical light source 610 may include a readout optical light source 3310 and reset optical light source 3320. The readout optical light source 3310 may be a laser or a light emitting diode, for example, which emits light in the green, for example. The readout optical light source 3310 induces fluorescence in the red from the NV diamond material 1200, where the fluorescence corresponds to an electronic transition of the NV electron pair from the excited state to the ground state. Light from the NV diamond material 1200 can be directed through an optical filter to filter out light in the excitation band (in the green, for example), and to pass light in the red fluorescence band, which in turn is detected by an optical detector. Thus, the readout optical light source 3310 induces fluorescence which is then detected by the optical detector, such as optical detector 640 and/or photo diodes 718, i.e., the fluorescence induced by the readout optical light source 3310 is read out.

The reset optical light source 3320 of the optical light source 610 serves to reset the population of the $m_s$=0 spin state of the ground state $^3A_2$ to a maximum polarization, or other desired polarization. In general, it may be desired in a reset stage to reset the spin population to the desired spin state relatively quickly to reduce the reset time, and thus to increase sensor bandwidth. In this case the reset optical light source 3320 provides light of a relatively high power. Further, the reset optical light source 3320 may have a lower duty cycle than readout optical light source 3310, thus providing reduced heating of the system.

On the other hand, a relatively lower power may be desired for the readout optical light source 3310 to provide a higher accuracy readout. The relatively lower power readout optical light source 3310 beneficially allows for easier control of the spectral purity, a slower readout time with lower noise, reduced laser heating, and may be light weight and compact. Thus, the reset optical light source 3320 may provide light of a higher power than that of the readout optical light source 3310. The readout optical light source 3310 does provide some amount of a reset function. However, a lower powered light source takes longer to provide a reset and thus is tolerable.

Thus, the higher powered reset optical light source 3320 provides advantages such as decreasing the time required for reset. Moreover, the higher powered reset optical light source 3320 clears the previous polarization of the spin states of the NV centers. This may be important particularly in the case where the previous polarization is at another frequency pertaining to a different NV center crystallographic orientation. This is applicable to both pulse excitation schemes such as RF pulse sequence or spin-echo pulse sequence, as well as for continuous wave excitation where the RF field is scanned during the continuous wave excitation. For example, for continuous wave excitation where the RF field is scanned, the reset optical light source 3320 may reduce the time required to jump between Lorentzians, and clears out prior residual RF information, for, for example, vector magnetometry or thermally compensated scalar magnetometry. This reduction of time allows for better vector estimation and/or increased sampling bandwidth. Thus the benefits of a higher power reset optical light source of lower duty cycle, wider beamwidth, and stronger power apply to either pulsed or continuous wave applications.

This combination of two optical light sources, one with a relatively high power to provide reset of the spin polarization and another to induce fluorescence for the readout provides a system with shorter reset times, while at the same time providing a high accuracy readout. The ratio of the power of the reset optical light source 3320 to the readout optical light source 3310 may be 10 to 1 or 20 to 1, or greater, for example.

Further the two optical light source magnetometer systems described herein improve the efficiency of the magnetometer by allowing for sensitive optical collection to be performed over a longer period using a low light density, low noise, light source while maintaining reasonable repolarization and reset times with a higher power light source when measurements are not critical. These two optical light source magnetometer systems allow for optimization of sensitivity via full excitation power versus collection integration time trade space, and further improves SWaP-C (size, weight, power and cost) design space by tailoring excitation source performance to specific needs.

The readout optical light source 3310 may be a laser or an LED, for example, while the reset optical light source 3320 may a laser, or an LED. Exemplary arrangements are as follows. The readout optical light source 3310 may be a lower powered laser, and the reset optical light source 3320 may be a higher powered laser with a lower duty cycle. The readout optical light source 3310 may be a lower powered laser, and the reset optical light source 3320 may be a bank of LED flash-bulbs. The readout optical light source 3310 may be an LED, and the reset optical light source 3320 may be a bank of LED flash-bulbs.

Reset and Read Out Illumination Volumes

Referring to FIG. 33, the optical light source 610 may include a focusing lens 3322 to focus light from the reset optical light source 3320 onto the NV diamond material 1200. Similarly, the optical light source 610 may include focusing optics 3312 to focus light from the readout optical light source 3310 onto the NV diamond material 1200. For example, the focusing optics 3312 may include lenses 3314, 3316, and 3318.

FIG. 34 illustrates the illumination volume 3410 of the light beam from the readout optical light source 3310 and the illumination volume 3420 of the light beam from the reset optical light source 3320 in the diamond material 1200. The illumination volume 3410 is shown between solid lines in FIG. 34, while the illumination volume 3420 is shown between the dashed lines. The focusing optics 3312 reduces the size of the illumination volume 3410 of the diamond material 1200, which is illuminated with the excitation beam from the readout optical light source 3310. In general, the illumination volume depends on the spot size of the focused light beam in the diamond material 1200. By reducing the illumination volume 3410 in the diamond material 1200, a higher light density for a given readout optical light source 3310 power is achieved, and further magnetic bias field inhomogeneities and RF field variations over the optically excited region of the diamond material can be reduced.

On the other hand, the illumination volume 3420 of the diamond material 1200, which is illuminated by the reset optical light source 3320 does not need to be as small as that for the readout optical light source 3310. The illumination volume 3420 of the diamond material 1200, which is illuminated by the reset optical light source 3320 should encompass the illumination volume 3410 of the diamond material 1200, which is illuminated by the readout optical light source 3310. In this way the reset optical light source 3320 will act to reset the NV spin states in the region of the diamond material 1200, which will be illuminated with the readout optical light source 3310.

Continuous Wave/RF Pulse Sequence Example

The present system may be used for continuous optical excitation, or pulsed excitation, such as modified Ramsey pulse sequence, modified Hahn-Echo, or modified spin echo pulse sequence. This section describes an exemplary continuous wave/pulse (cw-pulse) sequence. According to certain embodiments, a controller, such as controller 680 of FIGS. 6A-6C, controls the operation of the optical light source 610, the RF excitation source 630, and the magnetic field generator 670 to perform Optically Detected Magnetic Resonance (ODMR). The component of the magnetic field $B_z$ along the NV axis of NV centers aligned along directions of the four different orientation classes of the NV centers may be determined by ODMR, for example, by using an ODMR pulse sequence according to a pulse sequence. The pulse sequence is a pulsed RF scheme that measures the free precession of the magnetic moment in the NV diamond material 620 and is a technique that quantum mechanically prepares and samples the electron spin state.

FIG. 35 is a timing diagram illustrating the continuous wave/pulse sequence. As shown in FIG. 35, a cw-pulse sequence includes optical excitation pulses and RF excitation pulses over a five-step period. In a first step, during a period 0, a first optical reset pulse 3510 from the reset optical light source 3320 is applied to the system to optically pump electrons into the ground state (i.e., $m_s$=0 spin state). This is followed by a first RF excitation pulse 3520 (in the form of, for example, a microwave (MW) $\pi/2$ pulse), provided by the RF excitation source 630, during a period 1. The first RF excitation pulse 3520 sets the system into superposition of the $m_s=0$ and $m_s=+1$ spin states (or, alternatively, the $m_s=0$ and $m_s=-1$ spin states, depending on the choice of resonance location). During a period 2, the system is allowed to freely precess (and accumulate phase) over a time period referred to as tau ($\tau$). Next, a second RF excitation pulse 3540 (in the form of, for example, a MW $\pi/2$ pulse) is applied during a period 3 to project the system back to the $m_s=0$ and $m_s=+1$ basis. During period 4 which corresponds to readout, optical light 3530 is provided by the readout optical light source 3310, to optically sample the system and a measurement basis is obtained by detecting the fluorescence intensity of the system. The optical light 3530 may be provided as an optical pulse, or as discussed further below, in a continuous manner throughout periods 0 through 4. Finally, the first optical reset pulse 3510 from the reset optical light source 3320 is applied again to begin another cycle of the cw-pulse sequence.

When the first optical reset pulse 3510 is applied again to reset to the ground state at the beginning of another sequence, the readout stage is ended. The cw-pulse sequence shown in FIG. 35 may be performed multiple times, wherein each of the MW pulses applied to the system during a given cw-pulse sequence includes a different frequency over a frequency range that includes RF frequencies corresponds to different NV center orientations. The magnetic field may be then be determined based on the readout values of the fluorescence change correlated to unknown magnetic fields.

Low Power Continuous Optical Excitation for RF Pulse Sequence

Still referring to FIG. 35, the optical light 3530 is provided by the readout optical light source 3310 in a continuous optical excitation manner. This provides a number of advantages over systems which turn on and off the light source providing light for optical readout during a RF sequence. Such systems which turn on and off the light source are susceptible to jitter noise interfering with the RF excitation source, and address this issue by increasing the laser light path length using optics so as to not be close to the RF excitation source, or by including a digital current source for the laser, for example.

By operating the readout optical light source 3310 in a continuous optical excitation manner, the system provides a number of advantages. The system does not need extra components such as an acousto-optic modulator (AOM), or a digital current source. Further, optics, such as mirrors and lenses, are not needed to increase the path length of the laser light path. Thus, the system may be less expensive. Still further, there is no need to synchronize turning on and off the light from readout optical light source 3310 with the RF excitation source, since the readout optical light source 3310 remains continuously on during the RF pulse sequence.

For the continuous optical excitation for RF pulse sequence, the readout optical light source 3310 is continuously on during the sequence, and thus continuously performs some amount of reset to the ground state throughout the sequence. Since the readout optical light source 3310 provides a relatively low power beam, however, the reset is tolerable.

FIG. 36 illustrates a magnetometry curve in the case of using a continuous optical excitation RF pulse sequence. FIG. 36 shows the dimmed luminescence intensity at readout as a function of RF frequency applied during the RF pulse sequences. As can be seen, there are 8 spin state transition envelopes, each having a respective resonance frequency, for the case where the diamond material has NV centers aligned along directions of four different orientation classes. This is similar to the 8 spin state transitions shown in FIG. 5 for continuous wave optical excitation where the RF frequency is scanned. The magnetic field component along each of the four different orientation classes can be determined in a similar manner to that in FIG. 5. FIG. 37 illustrates a magnetometry curve similar to that of FIG. 36, where the RF waveform, including $\tau$, has been optimized for each ~12.5 MHz collection interval.

FIG. 38 illustrates a magnetometry curve for the left most resonance frequency of FIG. 37. In monitoring the magnetic field, the dimmed luminescence intensity, i.e., the amount the fluorescence intensity diminishes from the case where the spin states have been set to the ground state, of the region having the maximum slope may be monitored. If the dimmed luminescence intensity does not change with time, the magnetic field component does not change. A change in time of the dimmed luminescence intensity indicates that the magnetic field is changing in time, and the magnetic field may be determined as a function of time. For example, FIG. 39 illustrates the dimmed luminescence intensity as a function of time for the region of the maximum slope of FIG. 38.

FIG. 40 illustrates the normalized intensity of the luminescence as a function of time for diamond NV material for a continuous optical illumination of the diamond NV material during a time which includes application of RF excitation according to a RF pulse sequence. Initially, the NV centers have all been reset to the ground state and the normalized intensity has a maximum value. At a time $t_1$, RF excitation according to a RF sequence is applied and the normalized polarization drops to a minimum value. The normalized intensity continues to increase after $t_1$ as the ground state population continues to increase. FIG. 41 illustrates a zoomed in region of FIG. 40 including time $t_1$. The intensity may be read out for a time starting after $t_1$ and integrated. The time at which the read out stops and high power reset begins may be set based on the application.

Example Magneto-Optical Defect Center System with Additional Features

Referring to FIGS. 42A and 42B, a magnetic detection system 4200 includes a magneto-optical defect center material comprising at least one magneto-optical defect center that emits an optical signal when excited by an excitation light, a radio frequency (RF) exciter system configured to provide RF excitation to the magneto-optical defect center material, an optical light system configured to direct the excitation light to the magneto-optical defect center material, and an optical detector configured to receive the optical signal emitted by the magneto-optical defect center material based on the excitation light and the RF excitation. In particular, the magnetic detection system 4200 includes a housing 4205, an optical excitation source 4210, which directs optical light to a magneto-optical defect center material 4220 (e.g., a nitrogen vacancy (NV) diamond material with one or more NV centers, or another magneto-optical defect center material with one or more magneto-optical defect centers), a magnet ring mount 4215, and a bias magnet ring 4225. In alternative embodiments, additional, fewer, and/or different elements may be used. For example, although two light sources 4210A and 4210B are shown in the embodiments of FIGS. 42A and 42B, the optical excitation source 4210 may include any suitable number of light sources, such as one, three, four, etc. light sources. The magneto-optical defect center material 4220 may be held by a holder 4290. FIGS. 42A and 42B illustrate the same components, except that an orientation of the magneto-optical defect center material 4220 is different in FIG. 42A than in FIG. 42B (discussed in further detail below).

Referring to FIGS. 43A and 43B, in some implementations, a housing 4305 can include a top plate 4306, a bottom plate 4307, one or more side plates 4308 and a main plate 4409 containing the components of the system 4200 therein. In some embodiments, the housing 4305 may be the housing 4205 of FIG. 42A. The one or more side plates 4308 may be integrated into the top plate 4306, the main plate 4409 and/or bottom plate 4307. The top plate 4306, bottom plate 4307, and/or main plate 4409 can be secured to the one or more side plates 4308 and/or the one or more side plates 4308 may include one or more openings therethrough with an attachment member, such as a screw, bolt, etc., to couple the top plate 4306, the bottom plate 4307 and/or the main plate 4409 with the one or more side plates 4308. The coupling of the top plate 4306, the bottom plate 4307, and/or the main plate 4409 to the one or more side plates 4308 and/or to each other may substantially seal the magnetic detection system (e.g., the magnetic detection system 4200 of FIG. 42A) to limit exposure of the components therein to external light and/or contaminants. External light may interfere with reception of light from the magneto-optical defect center material when detecting a magnetic field, thereby introducing error into the measurements. Similarly, external contaminants, such as dust, dirt, etc., may disrupt transmission of the excitation source to the magneto-optical defect center material and/or reception of light from the magneto-optical defect center material, such as dust or dirt on the optical excitation source, on one or more lenses, on the magneto-optical defect center material itself, on a light tube transmitting light from the magneto-optical defect center component to the optical detector, and/or on the optical detector itself. The top plate and/or bottom plate may include convective cooling features, such as cooling fins 4313, to thermally dissipate heat transferred to the top plate 4306 and/or bottom plate 4307.

Referring to FIG. 44A, the top plate 4306 may be made from any suitable material, for example, Noryl such as Black Noryl PPO Plastic from McMaster-Carr, which is a modified PPE resin including amorphous blends of PPO polyphenylene ether (PPE) resin and polystyrene. Noryl provides high heat resistance, good electrical insulation properties, dimensional stability, low thermal conductivity, low reflection, and low density. Referring to FIG. 44B, the bottom plate 4307 may be made from the same material as the top plate 4306 or from a different material than the top plate 4306. For example, the bottom plate 4307 may be made from copper (e.g., copper per UNS C10100, full hard to half hard temper), stainless steel (e.g., 316 stainless steel), aluminum (e.g., aluminum 6061-T6 per ASTM 8209), or titanium grade 5 (e.g., Ti 6Al-4V). Referring to FIG. 44C, the side plate 4308 may be made from the same material as the top plate 4306 or the bottom plate 4307, or a different material than the top plate 4306 or the bottom plate 4307. In some implementations, the side plate 4308 may be made from Noryl such as Black Noryl PPO Plastic from McMaster-Carr. In other implementations, the side plate 4308 may be made of metal, or a metal coated with a low reflecting paint. Referring to FIGS. 44D (top view) and 44E (bottom view), the main plate 4409 may be made from the same material as the top plate 4306, the bottom plate 4307, or the side plate 4308, or the main plate 4409 can be made from a different material than the top plate 4306, the bottom plate 4307, or the side plate 4308. For example, the main plate 4409 may be made from copper (e.g., copper per UNS C10100, full hard to half hard temper), stainless steel (e.g., 316 stainless steel), aluminum (e.g., aluminum 6061-T6 per ASTM 8209), or titanium grade 5 (e.g., Ti 6Al-4V).

Referring to FIGS. 44A-44E, the top plate 4306, the bottom plate 4307, the side plate 4308 and the main plate 4409 may be any suitable shape having the same overall width and length. For example, each of the top plate 4306, the bottom plate 4307, the side plate 4308 and the main plate 4409 may be rectangular and have a width of 6.5 inches and a length of 7.5 inches. The top plate 4306, the bottom plate 4307, the side plate 4308 and the main plate 4409 may have the same thickness (i.e., height) or may vary in thickness. For example, the top plate 4306 may have a thickness of 0.050 inches, the bottom plate 4307 may have a thickness of 0.150 inches, the side plate 4308 may have a thickness of 0.950 inches, and the main plate 4409 may have a thickness of 0.325 inches. In the example illustrated in FIG. 43A, the housing components have the following ascending order in thickness: the top plate 4306, the bottom plate 4307, the main plate 4409, and the side plate 4308. The housing 4305 may have the overall dimensions of 7.5 inches×6.5 inches×1.515 inches (length×width×height). These dimensions are representative sizes that are foreseen to reduce as the technology progresses.

Referring to FIGS. 42A and 42B, in some embodiments, the components of the system 4200 may be mounted on a main plate such as the main plate 4409. In these embodiments, the main plate 4409 includes a plurality of through holes 4414 positioned to allow the location of the system components (e.g., the optical excitation source, the optical detection systems, the waveplate, the magneto-optical defect center material, the RF excitation source, the optical detector, the optical filter, the bias magnet ring mount, the bias magnet ring, the magnetic field generator, etc. of the system 4200 of FIG. 42A) to be repositioned within the housing 4305. As seen in FIG. 42A, components of the system 4200, for example, the optical components and the magnetic components, may be directly mounted to a top surface of the main plate 4409. Other components, for example, a circuit board, may be directly mounted to a bottom surface of the main plate 4409. The circuit board includes circuitry, for example, circuitry that drives the optical excitation source 4210, the photo diodes in the red collection 4217 and the green collection 4218 (described below), the RF exciter system (e.g., an RF amplifier), the thermal electric coolers 4500A, 4500B (described below), etc. By repositioning the location of the system components, it is possible to change at least one of a location or angle of incidence of the excitation light on the magneto-optical defect center material. The system components may be repeatedly mounted to, removed from, relocated, and remounted to the main plate 4409. Any of the system components may be mounted in a particular set of through holes 4414 with attachment members, such as screws, bolts, etc. The through holes 4414 and attachment members may be threaded.

In the system 4200, light from the magneto-optical defect center material 4220 is directed through an optical filter to filter out light in the excitation band (in the green, for example), and to pass light in the red fluorescence band through a light pipe 4223, which in turn is detected by the optical detector 4240. A red collection 4217, a green collection 4218 and a beam trap 4219 may be mounted to an exterior of the bias magnet ring mount 4215 (i.e., the side of the bias magnet ring mount 4215 that does not face the magneto-optical defect center material 4220. The position of the green collection 4218 and the beam trap 4219 may be switched in other implementations. The red collection 4217 is a system of parts that includes, for example, a photo diode, the light pipe 4223, and filters that measure the red light emitted from the magneto-optical defect center material 4220. The red collection 4217 provides the main signal of interest, used to measure external magnetic fields. The green collection 4218 is a system of parts that includes, for example, a photo diode, a light pipe, and filters that measure the green light from the excitation light that passes through the magneto-optical defect center material 4220. The green collection 4218 may be used in tandem with the red collection 4217 to remove common mode noise in the detection signal, and therefore, increase device sensitivity. The green beam 4219 is configured to capture any portion of the excitation light (e.g., a green light portion) that is not absorbed by the magneto-optical defect center material 4220 to ensure that that the excitation light does not bounce around and add noise to the measurement. This noise could result from the excitation light bouncing off other components of the system 4200 and hitting the magneto-optical defect center material 4220 at a later time, where the excitation light would be absorbed and contaminate the signal. The excitation light that is not absorbed by the magneto-optical defect center material 4220 might also be captured on the green or red collection photodiodes, directly adding noise to those signals.

In some implementations, one or more separation plates 4211 may be provided between optical components of the system 4200 and other components of the system 4200, thereby physically isolating the optical components from other components (e.g., control circuitry, data analytics circuitry, signal generation circuitry, etc.). The separation plate 4211 may be a ground shield to also electrically isolate the optical components from the other components. In some implementations, the separation plate 4211 may also thermally isolate the optical components from the other components. In the example illustrated in FIG. 42A, the separation plate 4211 is integrally formed with the side plate of the housing 4205 (e.g., the separation plate 4211 is integrally formed with the side plate 4308 of the housing 4305 of FIG. 44C). In other examples, the separation plate 4211 maybe a separate piece provided within an inner perimeter of the side plate.

In some implementations, the system 4200 may be hermetically sealed such as through the use of a gasket or other sealant (e.g., a gasket 4312 of the housing 4305 of FIG. 43A). The gasket 4312 is configured to seal the top plate 4306, bottom plate 4307, one or more side plates 4308, and main plate 4409 together. The gasket 4312 may be made of any suitable material, for example, Noryl such as black Noryl PPO from McMaster-Carr and/or aluminum (e.g., aluminum 6061-T6 per ASTM B209). In one example, the gasket 4312 may have the following dimensions: 6.5 inches×7.5 inches×0.040 inches. In implementations in which the housing includes a separation plate, the gasket 4312 is provided may include an internal contour corresponding to the location of the separator plate 4211.

Referring to FIG. 45, which illustrates components fixed to a bottom side of the main plate 4409, the system 4200 may further include one or more thermal electric coolers (TECs) configured to move heat from the main plate 4409. In the example of FIG. 45, two thermal electric coolers 4500A and 4500B are illustrated, but in other implementations, any number of thermal electric coolers may be used (for example, one, three, four, five, ten, etc.). A controller such as the controller 680 of FIGS. 6A-6C or separate controller (e.g., a proportional-integral-derivative (PID) controller) controls the thermal electric coolers 4500A and 4500B to maintain a predetermined temperature of the main plate 4409. This, in turn, controls a temperature of the components of the system 4200 (e.g., the laser diode of the optical excitation system 4210) and keeps the temperature stable. If the temperature of the components of the system 4200 (e.g., the laser diode of the optical excitation system 4210) is not stable, the sensitivity of the system 4200 is lowered.

The system 4200 further includes an RF exciter system 4230 that will be discussed in further detail below. The RF exciter system 4230 may include an RF amplifier assembly 4295. The RF amplifier assembly 4295 includes the RF circuitry that amplifies the signal from the RF source to a desired power level needed in the RF excitation element.

In implementations in which the system 4200 is hermetically sealed, a hydrogen absorber (not illustrated) and/or nitrogen cooling system (not illustrated) may be used. The hydrogen absorber can be positioned within a magnetic detection system such as the system 4200 of FIG. 42A to absorb hydrogen released from components therein that results from hydrogen trapped in materials used to make the components (e.g., metals, thermoplastics, etc.). The hydrogen absorber or hydrogen getter may be, for example, Cookson Group's STAYDRY® H2-3000 Hydrogen and Moisture Getter, which employs an active hydrogen getter and desiccant for water absorption, dispersed in a flexible silicone polymer matrix. The hydrogen absorber material may be a film or a sheet that can be molded or stamped to a desired shape. In other implementations, other commercially available hydrogen absorbers or hydrogen getters may be used.

The nitrogen cooling system can be implemented in a magnetic detection system such as the system 4200 of FIG. 42A to cool or otherwise reduce thermal loading on components therein, such as the optical excitation source 4210, the magneto-optical defect center material 4220, control circuitry, etc, and/or to prevent condensation. The nitrogen cooling system may include a nitrogen source, a pressure regulator valve, and a controller configured to control a flow rate of nitrogen from the nitrogen source to the system 4200. The nitrogen source may be, for example, a nitrogen air tank or a system capable of extracting nitrogen from air. In some implementations, the nitrogen cooling system may be in thermal communication (e.g., conductive) with the housing, for example the top plate 4306 and/or bottom plate 4307 of FIGS. 44A and 44B having the convective cooling features 4313. Accordingly, the nitrogen cooling system can form a heat transfer system to remove heat from one or more components within the system 4200 to be convectively dissipated to atmosphere via the convective cooling features. As seen in FIG. 45, the various cables (e.g., the green and red collection cables, the RF cables, etc. are provided between the bottom side of the main plate 4409 and the bottom plate 4307 such that all of the components of the system 4200 are located within the housing 4205 (e.g., the housing 4305 of FIG. 44A).

Readout Optical Light Source and Reset Optical Light Source

FIG. 46A is a schematic diagram of a portion 4600 of a magnetic detection system according to some embodiments. In some embodiments, the portion 4600 may be part of the magnetic detection system 4200 of FIG. 42A. The portion 4600 includes an optical excitation source 4610, a magneto-optical defect center material 4620, an RF excitation system 4630, and an optical detector 4640. In some embodiments, the optical excitation source 4610, the magneto-optical defect center material 4620, the RF excitation system 4630, and the optical detector 4640 correspond to the optical excitation source 4210, the magneto-optical defect center material 4220, the RF excitation system 4230, and the optical detector 4240, respectively, of the system 4200 of FIG. 42A.

The optical excitation source 4610 may include a readout optical light source 4611 and reset optical light source 4612. The readout optical light source 4611 may be a laser or a light emitting diode, for example, which emits light in the green which may be focused to the magneto-optical defect center material 4620 via focusing optics 4631. The readout optical light source 4611 induces fluorescence in the red from the magneto-optical defect center material 4620, where the fluorescence corresponds to an electronic transition of the NV electron pair from the excited state to the ground state. Referring back to FIGS. 3A and 3B, light from the magneto-optical defect center material (NV diamond material) 320 is directed through the optical filter 350 to filter out light in the excitation band (in the green, for example), and to pass light in the red fluorescence band, which in turn is detected by the optical detector 340. The readout optical light source 4611 induces fluorescence which is then detected by the optical detector 4640, i.e., the fluorescence induced by the readout optical light source 4611 is read out.

The reset optical light source 4612 may provide light which is focused to the magneto-optical defect center material 4620 via focusing optics 4632. The reset optical light source 4612 of the optical excitation source 4610 serves to reset the population of the $m_s$=0 spin state of the ground state $^3A_2$ to a maximum polarization, or other desired polarization. In general, it may be desired in a reset stage to reset the spin population to the desired spin state relatively quickly to reduce the reset time, and thus to increase sensor bandwidth. In this case the reset optical light source 4612 provides light of a relatively high power. Further, the reset optical light source 4612 may have a lower duty cycle than readout optical light source 4611, thus providing reduced heating of the system.

On the other hand, a relatively lower power may be desired for the readout optical light source 4611 to provide a higher accuracy readout. The relatively lower power readout optical light source 4611 beneficially allows for easier control of the spectral purity, a slower readout time with lower noise, reduced laser heating, and may be light weight and compact. Thus, the reset optical light source 4612 may provide light of a higher power than that of the readout optical light source 4611. The readout optical light source 4611 does provide some amount of a reset function. However, a lower powered light source takes longer to provide a reset and thus is tolerable.

The readout optical light source 4611 may be a laser or an LED, for example, while the reset optical light source 4612 may a laser, or an LED. Exemplary arrangements are as follows. The readout optical light source 4611 may be a lower powered laser, and the reset optical light source 4612 may be a higher powered laser with a lower duty cycle. The readout optical light source 4611 may be a lower powered laser, and the reset optical light source 4612 may be a bank of LED flash-bulbs. The readout optical light source 4611 may be an LED, and the reset optical light source 4612 may be a bank of LED flash-bulbs.

RF Excitation Source and NV Diamond Material

FIG. 47 illustrates some embodiments of a RF excitation source 4730 with the magneto-optical defect center material 4720 with NV centers. In some embodiments, the RF excitation source 4730 and the magneto-optical defect center material 4720 may correspond to the RF excitation source 4630 and the magneto-optical defect center material 4620, respectively, of FIGS. 46A and 46B. The RF excitation source 4730 includes a block portion 4740, RF feed connector 4750 with output 4751, and circuit board 4760. The RF feed connector 4750 may be electronically connected to a controller, such as the controller 680 of FIGS. 6A-6C, via a cable, for example, where the controller 680 provides an RF signal whereby the controller 680 may provide an RF signal to the RF feed connector 4750.

The block portion 4740 may include a support portion 4741, which supports the magneto-optical defect center material 4720. The block portion 4740 may further include a first wall portion 4742 and a second wall portion 4743 adjacent the support portion 4741. The first wall portion 4742 is on one side of the support portion 4741, while the second wall portion 4743 is on another side of the support portion 4741 opposite to the first side. The face of the second wall portion 4743 is slanted with respect to the first wall portion 4742, and thus the second wall portion 4743 makes an angle θ with respect to the first wall portion 4742.

FIG. 46B shows some embodiments of a portion of a magnetic field detection system with a different arrangement of the light sources than in FIG. 46A. In the embodiments in which the RF excitation source 4730 and the magneto-optical defect center material 4720 correspond to the RF excitation source 4630 and the magneto-optical defect center material 4620 of FIGS. 46A and 46B, respectively, the slanted second wall portion 4743 allows both the light emitted by the readout optical light source 4611 and the light emitted by the reset optical light source 4612 (see FIGS. 42A and 42B) to be directed at a proper angle to the magneto-optical defect center material 4620, 4720 with NV centers over a variety of arrangements of the readout optical light source 4611 and the reset optical light source 4612. In particular, the slanted second wall portion 4743 allows the readout optical light source 4611 and the reset optical light source 4612 to be positioned relatively close to each other, over a variety of arrangements of the readout optical light source 4611 and the reset optical light source 4612, while directing light to the same portion of the NV magneto-optical defect center material 4620, 4720 with NV centers.

In the arrangement of FIG. 46A, the readout optical light source 4611 and the reset optical light source 4612 direct light on one side of the first wall portion 4742, while in FIG. 46B the readout optical light source 4611 and the reset optical light source 4612 direct light on another side of the of the first wall portion 4742. The face of the second wall portion 4743 is slanted with respect to the first wall portion 4742 to allow either of the arrangements of the plurality of the readout optical light source 4611 and the reset optical light source 4612 in FIG. 46A or 46B to direct light to the magneto-optical defect center material 4620 with NV centers without blocking the light.

The block portion 4740 may comprise an electrically and thermally conductive material. For example, the block portion 4740 may be formed of a metal such as copper or aluminum. The good thermal conductivity of the block portion 4740 allows the block portion to function as a heat sink drawing heat away from the magneto-optical defect center material 4720 with NV centers. The electrically conductive nature of the block portion 4740 allows that a metallic material 4770 provided on the magneto-optical defect center material 4720 with NV centers may electrically short with the block portion 4740.

FIG. 48 illustrates the RF excitation source 4730 with the magneto-optical defect center material 4720 of FIG. 47 oriented on its side. The block portion 4740 has both side holes 4744 and bottom holes 4745. The side holes 4744 allow for mounting the block portion 4740 on its side for edge injection of light into the magneto-optical defect center material 4720. The bottom holes 4745 allow for mounting the block portion 4740 on its bottom for side injection of light. Other orientations for the block portion 4740 are possible.

FIG. 49 illustrates a top view of the circuit board 4760 of FIG. 47 in more detail with conductive traces shown. The circuit board 4760 includes a notch 4961 within which the RF feed connector 4750 is positioned. The circuit board 4760 may include an insulating board with conductive traces thereon. The output 4751 of the RF feed connector 4750 is electrically connected to a RF connector output trace 4975, which in turn is connected to a first trace 4980, which in turn is electrically connected to a second trace 4990. The traces 4975, 4980, and 4990 may be conducting metals, for example, such as copper or aluminum.

FIG. 50A illustrates a magneto-optical defect center material 5020 coated with a metallic material 5070 from a top perspective view. FIG. 50B illustrates the magneto-optical defect center material 5020 coated with a metallic material 5070 from a bottom perspective view. In some embodiments, the magneto-optical defect center material 5020 of FIGS. 50A and 50B corresponds to the magneto-optical defect center material 4620 of FIGS. 46A and 46B or the magneto-optical defect center material 4720 of FIG. 47. The metallic material 5070 may be gold, copper, silver, or aluminum, for example. The metallic material 5070 has a top **5070*a*, bottom 5070*c*, and a side portion 5070*b* connecting the top 5070*a* and bottom 5070*c*, and is designed to electrically short to the underlying block portion (e.g., the underlying block portion 4740 of FIG. 47) via the metallic material on the side portion, where the block portion 4740 functions as a RF ground. The second trace 4790 (see FIG. 49) is electrically connected to the metallic material 5070 on the magneto-optical defect center material 4720, 5020 with NV centers. As mentioned above, the electrically conductive nature of the block portion 4740 allows that the metallic material 4770 provided on the magneto-optical defect center material 4720 with NV centers may electrically short with the block portion 4740. In this regard, the second trace 4790 is electrically connected to the metallic material 4770, 5070, and the RF feed connector 4750 is driven by an RF signal, where the signal propagates along the traces 4775, 4780 and 4790. The second trace 4790 may have a width corresponding to the width of the magneto-optical defect center material 4720, 5020 with NV centers, and may be electrically connected to the metallic material 4770, 5070 along the width of the second trace 4790. The second trace 4790 may be electrically connected to the metallic material 5070** by a ribbon bond, for example.

Because the magneto-optical defect center material 4720, 5020 with NV centers is coated with a metallic material 5070, where the metallic material 5070 functions to provide an RF excitation to the magneto-optical defect center material 4720, 5020 with NV centers, a highly efficient RF excitation to the diamond material is possible.

Standing-Wave RF Exciter

Referring to FIG. 51 the RF excitation source 5130 provides RF radiation to the magneto-optical defect center material (NV diamond material) 5120. The system 5100 may include a magnetic field generator which generates a magnetic field, which may be detected at the magneto-optical defect center material 5120, or the magnetic field generator may be external to the system 5100. The magnetic field generator may provide a biasing magnetic field.

FIG. 51 illustrates a standing-wave RF exciter system 5100 (i.e., RF excitation source 330) according to some embodiments. In some embodiments, the RF exciter system 5100 corresponds to the RF excitation source 4730 of FIG. 47 and may be utilized in the system 4200 of FIG. 42A. The system 5100 includes a controller 5108 and an RF exciter circuit 5125. The RF exciter circuit 5125 includes an RF feed connector 5150 with an RF feed connector output 5151, and a conducting trace including a RF connector output trace 5175, a first trace 5180 and a second trace 5190. In some embodiments, the RF feed connector 5150, the RF feed connector output 5151, the RF connector output trace 5175, the first trace 5180 and the second trace 5190 correspond to the RF feed connector 4750, the RF feed connector output 4751, the RF connector output trace 4775, the first trace 4780 and the second trace 4790, respectively, of FIG. 47. The RF feed connector output 5151 of the RF feed connector 5150 is electrically connected to the RF connector output trace 5175. The RF connector output trace 5175 in turn is electrically connected to the first trace 5180, which in turn is electrically connected to second trace 5190. The first trace 5180 has an impedance which matches that of the system circuit impedance, for example, if the system circuit impedance is 50Ω, which is typical, the first trace 5180 should have an impedance of 50Ω.

The second trace 5190 has a width where the impedance of the second trace 5190 is lower than that of the first trace 5180. The second trace 5190 is electrically connected to a metallic material 5170 on a magneto-optical defect center material 5120. The metallic material 5170 is formed on a top, a bottom, and a side portion connecting the metal on the top and bottom, of the magneto-optical defect center material 5120, and is designed to electrically short to the underlying block portion 5140, which functions as a RF ground.

The controller 5108 is programmed or otherwise configured to control an RF excitation source 5130 so as to apply an RF signal to the RF feed connector output 5151. The controller 5108 may cause the RF excitation source 5130 to apply an RF signal to the RF feed connector 5150 which is then applied to the traces 5175, 5180, and 5190, which are short-circuited to the block portion 5140 via the metallic material 5170 on the magneto-optical defect center material 5120.

The controller 5108 may control the RF excitation source 5130 so as apply an RF signal to RF feed connector 5150 such that a standing wave is produced within the magneto-optical defect center material 5120. In this regard, the controller 5108 may include or control the RF excitation source 5130, which may comprise an external or internal oscillator circuit, for example. The signal may be a modulated sinusoidal with a RF carrier frequency, for example. The second trace 5190 has a width where the impedance of the second trace 5190 is lower relative to that of the first trace 5180. For example, if the impedance of the first trace 5180 is about 50Ω, then the impedance of the second trace 5190 may be less than 10Ω, for example. The low impedance of the second trace 5190 provides a relatively high RF field which is applied to the magneto-optical defect center material 5120.

The second trace 5190 may have a relatively wide width, such as for example greater than 2 mm, so that the second trace 5190 has a relatively low impedance. The traces 5180 and 5190, along with the metallic material 5170 on the magneto-optical defect center material 5120, act as a microstrip line. The relatively wide second trace 5190 along with the metallic material 5170 which is coated on the magneto-optical defect center material 5120 beneficially provides for a small field gradient of the RF field applied to the NV diamond material 5120. The good RF field uniformity is due in part to the arranged microstrip line.

The metallic material 5170 on the magneto-optical defect center material 5120 is located at the end, and is part of, the microstrip line, which also comprises the traces 5180 and 5190. The short circuiting of the metallic material 5170 to the block portion 5140 provides current and thus an applied field maxima at the diamond. The standing wave field which is applied results in doubling the RF field applied to the magneto-optical defect center material 5120. This means a 4-times decrease in the power needed to maintain a particular RF field.

Thus, providing a standing wave application of the RF field to the magneto-optical defect center material 5120 using a microstrip line short circuit at the magneto-optical defect center material 5120 provided with the metallic material 5170 covering the magneto-optical defect center material 5120 provides a power reduction needed to maintain the RF field intensity in the magneto-optical defect center material 5120, and a low RF field gradient in the magneto-optical defect center material 5120.

The magnitude of the RF field applied at the magneto-optical defect center material 5120 will also depend on the length of the microstrip line, which includes traces 5180 and 5190, along with the metallic material 5170 on the magneto-optical defect center material 5120. In an ideal case a length of the microstrip line of a quarter wavelength of the RF carrier frequency will produce the maximum current, and thus the maximum RF field applied to the magneto-optical defect center material 5120. Incorporating the diamond to the system, however, affects the nature of the standing wave, resulting in a different optimal length than a quarter wavelength. This length can be found computationally, and is generally shorter than a quarter wavelength. Thus, the length of the microstrip lines is about a quarter wavelength and is set to provide a maximum magnitude of the RF applied field applied to the magneto-optical defect center material 5120.

FIGS. 52A and 52B are circuit diagrams illustrating RF exciter systems including the RF exciter circuit 5125 according to some embodiments having a non-reciprocal isolation arrangement and a balanced amplifier arrangement, respectively.

Except for small ohmic and radiative losses in the exciter, all of the power incident to the microstrip line will be reflected back from the short to an RF amplifier of the system. To avoid this back reflection, the systems 5200A and 5200B in FIGS. 52A and 52B, respectively, include an RF termination component. The RF termination component may be, for example, a non-reciprocal isolator device as in FIG. 52A, or a balanced amplifier configuration as in FIG. 52B. If the non-reciprocal isolator device has magnetic materials, a balanced amplifier is preferred to avoid interference due to the magnetic fields.

FIG. 52A includes, in addition to RF exciter circuit 5225, controller 5208 and RF excitation source 5230 of the FIG. 51 system (e.g., the RF exciter circuit 5125, controller 5108 and RF excitation source 5130 of the FIG. 51 system), an amplifier 5210 and a RF isolator 5220. The RF signal from the RF excitation source 5230 is amplified by the amplifier 5210, and the amplified signal is input to the RF isolator 5220, which provides an RF termination function, and is then output to the RF exciter circuit 5225.

The balanced amplifier arrangement of FIG. 52B includes, in addition to RF exciter circuit 5225, controller 5208 and RF excitation source 5230 of the FIG. 52A system (e.g., the RF exciter circuit 5125, controller 5108 and RF excitation source 5130 of the FIG. 51 system), a first quadrature component 5235 arranged before two amplifiers 5240 and 5245, followed by a second quadrature component 5250 arranged after the two amplifiers 5240 and 5245. The RF signal from the RF excitation source 5230 is input to the first quadrature component 5235, and then quadrature result is input to the two amplifiers 5240 and 5245. The amplified signal from the two amplifiers 5240 and 5245 is then output to the second quadrature component 5250, and the quadrature result is input to the RF exciter circuit 5225.

FIGS. 53A and 53B illustrate the estimated applied field for, respectively, a prior RF exciter, and an RF exciter with a short circuited microstrip line with a standing wave applied field at the diamond. The prior RF exciter for FIG. 53A employed a 16 W RF power amplifier running at saturation. The RF exciter with a short circuited microstrip line with a standing wave applied field employed a 300 mW low noise amplifier (LNA) running in the linear regime (40 mW in) to produce an equivalent applied field. FIGS. 53A and 53B illustrate the applied field both with and without a balanced amplifier in the circuit. As can be seen, for the RF exciter with a short circuited microstrip line with a standing wave applied field in FIG. 53B the applied field (Relative |H|) as a function of frequency over the frequency range of 2.6 to 3.1 GHz shows a flat frequency response in particular with an addition of a balanced amplifier. The frequency response shown in FIG. 53B is an improvement over that in FIG. 53A.

The RF exciter with a short circuited microstrip line with a standing wave applied field at the diamond described above, provides a number of advantages. The field intensity applied to the diamond for a given incident RF power is maximized. The RF exciter provides both a small field gradient and a flat frequency response. Further setting the microstrip line of the RF exciter to have a length of about a quarter wavelength produces maximum current, and thus maximum applied field.

Precision Adjustability of Optical Components

FIG. 54 illustrates an optical light source 5410 (i.e., an optical excitation assembly) with adjustable spacing features in accordance with some illustrative embodiments. The optical light source 5410 may be, for example, one of the light sources in the optical excitation source 4210 of FIG. 42A. The optical light source 5410 may be, for example, the readout optical light source 4611 and reset optical light source 4612. The optical light source 5410 includes, in brief, an optical excitation module 5420 (e.g., a laser diode), an optical excitation module mount 5425, a lens mount 5430, one or more X axis translation slots 5440, one or more y axis translation slots 5450, Z axis translation material 5460 (e.g., shims), an X axis lens translation mechanism 5470, and a Y axis lens translation mechanism 5480. In addition, FIG. 54 comprises an illustration of a representation of a light beam 5495.

Still referring to FIG. 54 and in further detail, the optical light source 5410 comprises an optical excitation module 5420. In some implementations, the optical excitation module 5420 is a directed light source. In some implementations, the optical excitation module 5420 is a light emitting diode. In some implementations, the optical excitation module 5420 is a laser diode. In some implementations, the optical light source 5410 comprises an optical excitation module mount 5425 that is configured to fasten the optical excitation module 5420 in position relative to the rest of the optical light source 5410.

In some implementations, the optical light source 5410 further comprises a lens mount 5430. In some implementations, the lens mount 5430 is configured to fasten a plurality of lenses in position relative to each respective lens as well as configured to fasten a plurality of lenses in position relative to the rest of the optical light source 5410.

In some implementations, the optical light source 5410 further comprises one or more X axis translation slots 5440. The one or more X axis translation slots 5440 can be configured to allow for a positive or negative adjustment of the optical light source 5410 in a linear direction. In some implementations, the linear direction is orthogonal to a path of a light beam 5495 generated by the optical light source 5410. In some implementations, the X axis translation slots 5440 are configured to, upon adjustment, be used to fasten the optical light source 5410 to an underlying mount. In some implementations, the X axis translation slots 5440 are configured to accept a screw or other fastener that can be tightened to an underlying mount to fasten the optical light source 5410 to an underlying mount in a fixed location. In some implementations, the X axis translation slots 5440 are used to align the path of a light beam 5495 to a desired target destination.

In some implementations, the optical light source 5410 further comprises one or more Y axis translation slots 5450. The one or more Y axis translation slots 5450 can be configured to allow for a positive or negative adjustment of the optical light source 5410 in a linear direction. In some implementations, the linear direction is parallel to a path of a light beam 5495 generated by the optical light source 5410. In some implementations the linear direction is orthogonal to the linear direction of the one or more X axis translation slots 5440. In some implementations, the Y axis translation slots 5450 are configured to, upon adjustment, be used to fasten the optical light source 5410 to an underlying mount. In some implementations, the Y axis translation slots 5450 are configured to accept a screw or other fastener that can be tightened to an underlying mount to fasten the optical light source 5410 to an underlying mount in a fixed location. In some implementations, the Y axis translation slots 5450 are used to adjust the distance of the path of a light beam 5495 from a desired target destination.

In some implementations, the optical light source 5410 further comprises Z axis translation material 5460. In some implementations, the Z axis translation material 5460 comprises one or more shims. In some implementations the Z axis translation material 5460 can be added to or removed from the optical light source 5410 for a positive or negative adjustment of the optical light source 5410 in a linear direction relative to an underlying mount to which the optical light source 5410 is fastened. In some implementations, the linear direction is orthogonal to two or more of the linear direction of the one or more X axis translation slots 5440, the linear direction of the one or more Y axis translation slots 5450, and/or the path of a light beam 5495 generated by the optical light source 5410. In some implementations the linear direction is orthogonal to the linear direction of the one or more X axis translation slots 5440. In some implementations, the Z axis translation material 5460 is configured to, upon adjustment, be used to alter a distance of the fastening of the optical light source 5410 to an underlying mount. In some implementations, the Z axis translation material 5460 is configured to accommodate the one or more X axis translation slots 5440 and/or the one or more Y axis translation slots 5450 with similar or matching slots in the Z axis translation material 5460 in order to accept a plurality of screws or other fasteners that can be tightened to an underlying mount to fasten the optical light source 5410 to the underlying mount in a fixed location. In some implementations, the Z axis translation material 5460 are used to adjust the path of a light beam 5495 to a desired target destination.

In some implementations, the optical light source 5410 further comprises an X axis lens translation mechanism 5470. The X axis lens translation mechanism 5470 can be configured to allow for a positive or negative adjustment of the one or more lenses in a lens mount 5430 in a linear direction. In some implementations, the linear direction is parallel to a path of a light beam 5495 generated by the optical light source 5410. In some implementations, the X axis lens translation mechanism 5470 is used to align a lens to a path of a light beam 5495. In some implementations, the X axis lens translation mechanism 5470 is a drive screw mechanism configured to move the one or more lenses in a lens mount 5430 in the linear direction.

In some implementations, the optical light source 5410 further comprises a Y axis lens translation mechanism 5480. The Y axis lens translation mechanism 5480 can be configured to allow for a positive or negative adjustment of the one or more lenses in a lens mount 5430 in a linear direction. In some implementations, the linear direction is orthogonal to a path of a light beam 5495 generated by the optical light source 5410. In some implementations, the Y axis lens translation mechanism 5480 is used to align a lens to a path of a light beam 5495. In some implementations, the Y axis lens translation mechanism 5480 is a drive screw mechanism configured to move the one or more lenses in a lens mount 5430 in the linear direction.

In some implementations, the optical light source 5410 further comprises a Z axis lens translation mechanism 5485. The Z axis lens translation mechanism 5485 can be configured to allow for a positive or negative adjustment of the one or more lenses in a lens mount 5430 in a linear direction. In some implementations, the linear direction is orthogonal to a path of a light beam 5495 generated by the optical light source 5410. In some implementations, the linear direction is orthogonal to a path of a light beam 5495 generated by the optical light source 5410 and to one or more of the linear adjustment of the X axis lens translation mechanism 5470 or the Y axis lens translation mechanism 5480. In some implementations, the Z axis lens translation mechanism 5485 is used to align a lens to a path of a light beam 5495. In some implementations, the Z axis lens translation mechanism 5485 is a drive screw mechanism configured to move the one or more lenses in a lens mount 5430 in the linear direction.

FIG. 55 illustrates a cross section as viewed from above of a portion of the optical light source 5410 in accordance with some illustrative embodiments. The optical assembly cross section includes, in brief, an optical excitation module 5420 (e.g., a laser diode), an optical excitation module mount 5425, a lens mount 5430, one or more Y axis translation slots 5450, one or more lenses 5510, a lens spacer 5520, and a lens retaining ring 5530.

Still referring to FIG. 55 and in further detail, the optical assembly cross section comprises an optical excitation module 5420. In some implementations, the optical excitation module 5420 is a directed light source. In some implementations, the optical excitation module 5420 is a light emitting diode. In some implementations, the optical excitation module 5420 is a laser diode. In some implementations, the optical assembly cross section comprises an optical excitation module mount 5425 that is configured to fasten the optical excitation module 5420 in position relative to the rest of the optical assembly cross section.

In some implementations, the optical assembly cross section further comprises a lens mount 5430. In some implementations, the lens mount 5430 is configured to fasten a plurality of lenses 5510 in position relative to each respective lens 5510 as well as configured to fasten a plurality of lenses 5510 in position relative to the rest of the optical assembly cross section. In some implementations, a lens spacer 5520 is configured to maintain a fixed distance between one or more lenses 5510. In some implementations, a lens retaining ring 5530 is configured to hold one or more lenses 5510 in a proper position relative to the lens mount 5430.

In some implementations, the optical assembly cross section further comprises one or more Y axis translation slots 5450. The one or more Y axis translation slots 5450 can be configured to allow for a positive or negative adjustment of the optical assembly cross section in a linear direction. In some implementations, the linear direction is parallel to a path of a light beam generated by the optical assembly cross section. In some implementations the linear direction is orthogonal to the linear direction of the one or more X axis translation slots 5440. In some implementations, the Y axis translation slots 5450 are configured to, upon adjustment, be used to fasten the optical light source (e.g., the optical light source 5410) to an underlying mount. In some implementations, the Y axis translation slots 5450 are configured to accept a screw or other fastener that can be tightened to an underlying mount to fasten the optical assembly cross section to an underlying mount in a fixed location. In some implementations, the Y axis translation slots 5450 are used to adjust the distance of the path of a light beam from a desired target destination.

Waveplate

FIG. 56 is a schematic diagram illustrating a waveplate assembly 5600 according to some embodiments. In some implementations, the waveplate assembly 5600, in brief, may be comprised of a waveplate 5615, a mounting disk 5610, a mounting base 5625, a pin 5630, and a screw lock 5640. In some embodiments, the waveplate 5615 may correspond to the waveplate 315 of FIG. 3B. In some implementations, the waveplate assembly 5600 may be configured to adjust the polarization of the light (e.g., light from a laser) as the light is passed through the waveplate assembly 5600. In some implementations, the waveplate assembly 5600 may be configured to mount the waveplate 5615 to allow for rotation of the waveplate 5615 with the ability to stop the plate in to a position at a specific rotation. In some implementations, the waveplate assembly 5600 may be configured to allow for rotation of the waveplate 5615 with the ability to lock the plate in to a position at a specific rotation. Stopping the waveplate 5615 at a specific rotation may allow the configuration of the waveplate assembly 5600 to tune the polarization of the light passing through the waveplate 5615. In some implementations, the waveplate 5615 tunes the polarization of the light passing through by being configured to have a different refractive index for a different polarization of light. In these implementations, the waveplate 5615 operates using the principle of birefringence, where the refractive index of the material of the waveplate 5615 depends on the polarization of the light and the phase is changed between two perpendicular polarizations by $\pi$ (i.e., half a wave), effectively rotating the polarization of the light passing through it by ninety degrees. In some implementations, the waveplate assembly 5600 may be configured to adjust the polarization of the light such that the orientation of a given lattice of a magneto-optical defect center material allows the contrast of a dimming Lorentzian to be deepest and narrowest such that the slope of each side of the Lorentzian is steepest. In some implementations, when the light polarization (e.g., laser polarization is lined up geometrically with the orientation of the given lattice, the contrast and the narrowness of the dimming Lorentzian, the portion of the light that is sensitive to magnetic fields is deepest and narrowest, meaning that the slope of each side of Lorentzian is steepest, and that equates directly to sensitivity for the magnetic field. In some implementations, one polarization of the light (e.g., laser light) aligns with one axis or one crystal lattice of the magneto-optical defect center material, the two Lorentzians associated with that one lattice are steep and narrow, the others are not as steep and not as narrow. The slope of each side of the Lorentzian is steepest when the polarization of the light is lined up geometrically with the orientation of the given lattice of the magneto-optical defect center material. In some implementations where the waveplate 5615 is a half-wave plate, the waveplate assembly 5600 may be configured such that the polarization of the light is lined up with the orientation of a given lattice of a magneto-optical defect center material such that it allows extraction of maximum sensitivity of the lattice (i.e., maximum sensitivity of a vector in free space). In some implementations, the waveplate assembly 5600 may be configured such that four determined positions of the waveplate 5615 increase (e.g., maximize) the sensitivity across all the different lattices of a magneto-optical defect center material. In some implementations, the orientation of the light waves consequent to the polarization of light causes the light waves to coincides with an orientation of one or more of the defect centers, thereby imparting substantially increased energy transfer to the one or more defect centers with coincident orientation while imparting substantially decreased energy transfer to the defect centers that are not coincident. In some implementations, the waveplate assembly 5600 may be configured where the position of the waveplate 5615 is such that similar sensitivities are achieved to the four Lorentzians corresponding to lattice orientations of a magneto-optical defect center material.

In some implementations where the waveplate 5615 is a quarter-wave plate, the waveplate assembly 5600 may be configured such that the polarization of the light is lined up with the orientation of a given lattice of a magneto-optical defect center material such that it allows extraction of maximum sensitivity of the lattice (i.e., maximum sensitivity of a vector in free space). In some implementations, the waveplate assembly 5600 may be configured such that certain determined positions of the waveplate 5615 increase (e.g., maximize) the sensitivity across all the different lattices of a magneto-optical defect center material. In some embodiments, the orientation of the light waves consequent to the polarization of light causes the light waves to coincides with an orientation of one or more of the defect centers, thereby imparting substantially increased energy transfer to the one or more defect centers with coincident orientation while imparting substantially decreased energy transfer to the defect centers that are not coincident. In some embodiments, the circular polarization of the light waves consequent to the polarization of light caused by passing through the quarter-wave assembly causes the light waves to impart substantially equivalent energy transfer to a plurality of defect centers such that similar sensitivities are achieved to the four Lorentzians corresponding to lattice orientations of the plurality of defect centers in the magneto-optical defect center material.

Still referring to FIG. 56, the mounting disk 5610, in some implementations, is attached to a waveplate 5615. The mounting disk 5610 may be attached to a waveplate 5615 such that rotation of the mounting disk 5610 also correspondingly rotates the waveplate 5615. In some implementations, the mounting disk 5610 may be securely adhered (e.g., using epoxy) to a portion of the perimeter of the waveplate 5615. In some implementations, the mounting disk 5610 may be configured to rotate freely and also be locked in place relative to the rest of the waveplate assembly 5600 while the adhered waveplate 5615 may be rotated and locked in place due to the attachment to the mounting disk 5610. In some implementations, the waveplate assembly 5600 may be comprised of a waveplate 5615, a mounting disk 5610, a mounting base 5625, a pin 5630, and a screw lock 5640.

The mounting base 5625, in some implementations, may be configured to restrict a movement of rotation of a waveplate 5615. In some implementations, the movement of rotation is restricted to a single plane such that the rotation occurs around an axis of the waveplate 5615. In some implementations, the mounting base 5625 is configured to restrict a movement of rotation of the mounting disk 5610 such that the rotation of the waveplate 5615 attached to the mounting disk 5610 occurs around an axis of the waveplate 5615. In some implementations, one or more pins 5630 may be attached to the mounting disk 5610 slide through a slot in the mounting base 5625 to allow the mounting disk 5610 to rotate relative to the mounting base 5625. The one or more pins 5630 may be adhered to the mounting disk 5610 such that the one or more pins 5630 stay relative in position to the mounting disk 5610 during rotation of the mounting disk 5610 relative to the mounting base 5625. In some implementations, the one or more pins 5630 may be adhered directly to the waveplate 5615 such that the one or more pins 5630 stay relative in position to the waveplate 5615 during rotation of the waveplate 5615 relative to the mounting base 5625. In some implementations, one or more screw locks 5640 are attached to the mounting disk 5610 and are configured to restrict movement of the mounting base 5625 relative to the mounting base 5625 when tightened. In some implementations, one or more screw locks 5640 are attached to the mounting disk 5610 and lock the mounting disk 5610 in place when tightened. In some implementations, one or more screw locks 5640 may be attached directly to the waveplate 5615 and are configured to restrict movement of the waveplate 5615 when the one or more screw locks 5640 are tightened. In some implementations, the mounting disk 5610 and/or waveplate 5615 can be locked in place or have rotational motion restricted through other means such as through frictional force, electromagnetic force (e.g., an electromagnet is activated to restrict further rotation), other mechanical forces, and the like.

In some implementations, the waveplate assembly 5600 is configured such that a position of the waveplate 5615 is determined as an initial calibration for a light directed through a waveplate 5615. In some implementations, the performance of the system may be affected by the polarization of the light (e.g., light from a laser) as it is lined up with a crystal structure of the magneto-optical defect center material (e.g., NV diamond material). In some implementations, a waveplate 5615 is mounted to allow for rotation of the waveplate 5615 with the ability to stop and/or lock the half-wave after an initial calibration determines the eight Lorentzians associated with a given lattice with each pair of Lorentzians associated with a given lattice plane symmetric around the carrier frequency. In some implementations, the initial calibration may be set to allow for high contrast with steep Lorentzians for a particular lattice plane. In some implementations, the initial calibration may be set to create similar contrast and steepness of the Lorentzians for each of the four lattice planes.

FIG. 57 is a half-wave plate schematic diagram illustrating a change in polarization of light when the waveplate 5615 is a half-wave plate. In some implementations, plane polarized light entering the half-wave plate is rotated to an angle that is twice the angle (i.e., 20) of the entering plane polarized light with respect to a fast axis of the half-wave plate. In some implementations, the half-wave plate is used to turn left circularly polarized light into right circularly polarized light or vice versa.

FIG. 58 is a quarter-wave plate schematic diagram illustrating a change in polarization of light when the waveplate 5615 is a quarter-wave plate. In some implementations, plane polarized light entering the quarter-wave plate is turned into circularly polarized light. The exiting polarized light may be circularly polarized when the entering plane-polarized light is at an angle of 45 degrees to the fast or slow axis as shown in FIG. 58.

In order to tune the magnetic field measurement for certain axes of the magneto-optical defect center materials the polarization of light entering the magneto-optical defect center material may be controlled. During manufacture of a sensor system, there may be small variations in how a magneto-optical defect center material is mounted to the sensor such that axes have deviation in orientation as well as inherent differences between different magneto-optical defect center materials. In such manufacturing, a calibration can be conducted by adjusting the polarization of the light to benefit the final intended purpose of the sensor.

In some implementations a sensor is described comprising an optical excitation source emitting green light, a magneto-optical defect center material with defect centers in a plurality of orientations, and a half-wave plate. At least some of the green light may pass through the half-wave plate, rotating a polarization of such green light to thereby provide an orientation to the light waves emitted from the half-wave plate. The half-wave plate may be capable of being orientated relative to the defect centers in a plurality of orientations, wherein the orientation of the light waves coincides with an orientation of the defect centers, thereby imparting substantially increased energy transfer to the defect center with coincident orientation while imparting substantially decreased energy transfer to the defect centers that are not coincident.

In some implementations, a sensor is described comprising a waveplate assembly, an optical excitation source and a magneto-optical defect center material with defect centers. The waveplate assembly can include a waveplate, mounting base, and a mounting disk. The mounting disk can be adhered to the waveplate. The mounting base can be configured such that the mounting disk can rotate relative to the mounting base around an axis of the waveplate.

In some implementations, the sensor can be configured to direct light from the optical excitation source through the waveplate before the light is directed to the magneto-optical defect center material. In some implementations, the sensor can further comprise a pin adhered to the mounting disk. The mounting base can comprise a slot configured to receive the pin, the pin can slide along the slot and the mounting disk can rotate relative to the mounting base around the axis of the waveplate with the axis perpendicular to a length of the slot. In some implementations, the magneto-optical defect center material with defect centers can be comprised of a nitrogen vacancy (NV) diamond material comprising a plurality of NV centers. In some implementations, the optical excitation source can be one of a laser (e.g., a laser diode) or a light emitting diode. In some implementations, the sensor can further comprise a screw lock attached to the mounting disk. The screw lock can be configured to prevent rotation of the mounting disk relative to the mounting base when tightened. In some implementations, the sensor can further comprise a controller electrically coupled to the waveplate assembly. The controller can be configured to control an angle of the rotation of the waveplate relative to the mounting base.

In some implementations, an assembly can comprise a half-wave plate, a mounting base, an optical excitation source, and a magneto-optical defect center material with defect centers. The mounting base can be configured such that the half-wave plate can rotate relative to the mounting base around an axis of the half-wave plate. In some implementations, the assembly can further comprise a pin adhered to the mounting disk. The mounting base can comprise a slot configured to receive the pin, the pin can slide along the slot and the mounting disk can rotate relative to the mounting base around the axis of the half-wave plate with the axis perpendicular to a length of the slot. In some implementations, the magneto-optical defect center material with defect centers can be comprised of a nitrogen vacancy (NV) diamond material comprising a plurality of NV centers. In some implementations, the optical excitation source can be one of a laser (e.g., a laser diode) or a light emitting diode. In some implementations, the assembly can further comprise a screw lock attached to the mounting disk. The screw lock can be configured to prevent rotation of the mounting disk relative to the mounting base when tightened. In some implementations, the assembly can further comprise a controller electrically coupled to the half-wave plate assembly. The controller can be configured to control an angle of the rotation of the half-wave plate relative to the mounting base.

In some implementations, a sensor assembly is described comprising a mounting base and a half-wave plate assembly. The half-wave plate assembly can further comprise a half-wave plate, an optical excitation means for providing optical excitation through the half-wave plate, a magneto-optical defect center material comprising a plurality of magneto-optical defect centers, and a detector means, for detecting optical radiation.

In some implementations, an assembly is described and can comprise a half-wave plate, a mounting base, an optical excitation source, and a magneto-optical defect center material with defect centers. The mounting base can be configured such that the half-wave plate can rotate relative to the mounting base around an axis of the half-wave plate.

Holder for Magneto-Optical Defect Center Material

FIGS. 59A-59C are three-dimensional views of a holder 5900 for the magneto-optical defect center material 5920 (e.g., a nitrogen vacancy (NV) diamond material) in accordance with some illustrative embodiments. In some embodiments, the holder 5900 corresponds to the holder 4290 of FIG. 42A. An illustrative holder 5900 includes the magneto-optical defect center material 5920, a base 5906, a radio frequency (RF) circuit board 5912, an RF signal connector 5915, first mounting holes 5924, and second mounting holes 5925. In the embodiment illustrated in FIGS. 59A-59C, the holder 5900 includes locating slots 5930. In alternative embodiments, additional, fewer, and/or different elements may be used.

As shown in FIG. 59A, the magneto-optical defect center material 5920 is attached to the base 5906. The magneto-optical defect center material 5920 can be mounted to the base 5906 using any suitable securing mechanism, such as a glue or an epoxy. In alternative embodiments, screws, bolts, clips, fasteners, or etc. may be used. In some embodiments, the magneto-optical defect center material 5920 can be fixed to the RF circuit board 5912. For example, a ribbon bond can be used between the magneto-optical defect center material 5920 and the RF circuit board 5912. In alternative embodiments, any other suitable methods can be used to attach the magneto-optical defect center material 5920 to the RF circuit board 5912.

In the embodiment shown in FIG. 59A, one side of the magneto-optical defect center material 5920 is adjacent to the base 5906, and one side of the magneto-optical defect center material 5920 is adjacent to the RF circuit board 5912. In such an embodiment, other sides of the magneto-optical defect center material 5920 are not adjacent to opaque objects and, therefore, can have light injected therethrough. In the embodiment shown in FIG. 59A, the magneto-optical defect center material 5920 has eight sides, six of which are not adjacent to an opaque object. In alternative embodiments, the magneto-optical defect center material 5920 can have greater than or fewer than eight sides.

For example, the magneto-optical defect center material 5920 includes two sides 5921 and 5922 through which light can be injected into the magneto-optical defect center material 5920. In such an example, light can be injected through the edge side 5921 or the face side 5922. When light is injected through the edge side 5921, the defect centers in the magneto-optical defect center material 5920 are excited less uniformly than when light is injected through the face side 5922. Also, when light is injected through the edge side 5921, more of the defect centers in the magneto-optical defect center material 5920 are excited than when light is injected through the face side 5922.

In some illustrative embodiments, the more of the defect centers in the magneto-optical defect center material 5920 are excited by light, the more red light is emitted from the magneto-optical defect center material 5920. In some illustrative embodiments, the more uniformly that the defect centers in the magneto-optical defect center material 5920 are excited by the light the more sensitive the magnetometer may be. Thus, in some instances, it may be preferential to inject light into the edge side 5921 while in other instances it may be preferential to inject light into the face side 5922.

In the embodiment shown in FIG. 59A, the side of the magneto-optical defect center material 5920 opposite the edge side 5921 is not obstructed by an opaque object (e.g., base 5906 or the RF circuit board 5912). That is, light injected into the edge side 5921 that is not absorbed by defect centers (e.g., used to excite defect centers) of the NV diamond material 620 may pass through the magneto-optical defect center material 5920. In an illustrative embodiment the light that passes through the magneto-optical defect center material 5920 may be sensed by an optical sensor. The light that passes through the magneto-optical defect center material 5920 may be used to eliminate or reduce correlated noise in the light captured by the optical detector.

In the embodiment shown in FIG. 59A, the side of the magneto-optical defect center material 5920 that is opposite the face side 5922 is adjacent to the base 5906. Thus, light that is injected through the face side 5922 that is not absorbed by defect centers is absorbed by the base 5906. That is, the light not absorbed by the defect centers is not detected by a light detector to be used to eliminate or reduce correlated noise. In some alternative embodiments, the base 5906 includes a through hole that unabsorbed light can pass through.

As shown in FIG. 59B, the base 5906 can include first mounting holes 5924. As shown in FIG. 59C, the base 5906 can include second mounting holes 5925. The first mounting holes 5924 and the second mounting holes 5925 can be configured to accept mounting means, such as a screw, a bolt, a clip, a fastener, etc. In some illustrative embodiments, the mounting holes 5924 are threaded. For example, a helical insert can be used to provide threaded means for accepting a screw or bolt. In some illustrative embodiments, the helical insert can be made of brass, steel, stainless steel, aluminum, nylon, plastic, etc. For example, the threaded inserts can have #2-56 threads. In alternative embodiments, the threaded inserts can have any other suitable threads. The first mounting holes 5924 can be used to secure the side of the base 5906 with the first mounting holes 5924 against a base of the housing 5905 (e.g., the housing 4205 of FIG. 42A or the housing 4305 of FIG. 43A). Thus, when the base 5906 is mounted to the housing via the first mounting holes 5924, light from the plurality of optical light sources (e.g., the optical excitation system 4210 of FIG. 42A) can be injected through the face side 5922 of the magneto-optical defect center material 5920. Similarly, when the base 5906 is mounted to the housing via the second mounting holes 5925, light from the plurality of optical light sources can be injected through the edge side 5921.

In some illustrative embodiments, the base 5906 can include slots 5930. The slots 5930 can be used to receive pegs or other inserts that are attached to the housing. In such embodiments, the slots 5930 can be used to align the base 5906 with holes or fasteners associated with the first mounting holes 5924 or the second mounting holes 5925. Thus, the holder 5900 can easily and/or conveniently be rotated to optionally mount to the housing via either the first mounting holes 5924 or the second mounting holes 5925. In alternative embodiments, the holder 5900 can include additional sets of mounting holes. Also, although the embodiments shown in FIGS. 59A-59C include two holes in each set of the first mounting holes 5924 and the second mounting holes 5925, any other suitable number of mounting holes can be used.

FIG. 60 is a circuit outline of a radio frequency element circuit board in accordance with some illustrative embodiments. An illustrative example RF circuit board 6012 can include a positive electrode 6011, an RF signal trace 6014, and ground connectors 6013. The RF circuit board 6012 may correspond to the RF circuit board 5912 of FIG. 59A. In alternative embodiments, additional, fewer, and/or different elements may be used. As shown in FIG. 59A, the RF circuit board 6012 can be attached to the base 5906. The RF circuit board 6012 can be attached to the base 5906 using any suitable method, such as via a glue, epoxy, screws, bolts, clips, fasteners, etc.

An RF field can be applied to the magneto-optical defect center material 5920 to determine the external magnetic field. In some illustrative embodiments, the RF signal connector 5915 can be configured to receive a connector or cable over which an RF signal is transmitted. For example, the RF signal connector 5915 can be configured to accept a coaxial cable. The positive electrical connection of the RF signal connector 5915 can be connected to the positive electrode 6011. The positive electrode 6011 can, in turn, be electrically connected to the RF signal trace 6014. Similarly, the ground connection from the RF signal connector 5915 can be electrically connected to the ground connectors 6013. In some illustrative embodiments, the ground connectors 6013 are electrically connected to the base 5906, which can be connected to a ground of the system. Thus, an RF signal transmitted to the RF signal connector 5915 can be transmitted through the RF signal trace 6014, which can transmit an RF field. The RF field can be applied to the magneto-optical defect center material 5920. Thus, the signal transmitted to the RF signal connector 5915 can be used to apply the RF field to the magneto-optical defect center material 5920.

FIGS. 61A and 61B are three-dimensional views of an element holder base in accordance with some illustrative embodiments. An illustrative base 6106 includes the first mounting holes 6124, the second mounting holes 6125, the slots 6130, an RF connector recess 6107, and a magneto-optical defect recess 6108. The base 6106, the first mounting holes 6124, the second mounting holes 6125, the slots 6130 may correspond to the base 5906, the first mounting holes 5924, the second mounting holes 5925, and the slots 5930, respectively, of FIG. 59A. In alternative embodiments, additional, fewer, and/or different elements may be used.

In some illustrative embodiments, the base 5906, 6106 is made of a conductive material. For example, the base 5906, 6106 may be made of brass, steel, stainless steel, aluminum, etc.

The base 5906, 6106 can include an RF connector recess 6107 that can be configured to accept at least a portion of the RF signal connector 5915. Similarly, the magneto-optical defect recess 6108 can be configured to accept the magneto-optical defect center material 5920. For example, the NV diamond material 620 can be mounted to the magneto-optical defect recess 6108.

In some illustrative embodiments, the length L (e.g., from the edge of the base 6106 with the RF connector recess 6107 to the edge with the magneto-optical defect recess 6108, as shown by the dashed line) of the base 6106 is 0.877 inches long. In alternative embodiments, the length L can be less than or greater than 0.877 inches. In some illustrative embodiments, the width W is 0.4 inches. In alternative embodiments, the width W is less than or greater than 0.4 inches. In some illustrative embodiments, the height H is 0.195 inches. In alternative embodiments, the height H is less than or greater than 0.195 inches.

Vivaldi RF Antenna Array

A magneto-optical defect center sensor can utilize a Vivaldi antenna array for increasing uniformity of an RF magnetic signal at a specified location of the magneto-optical defect center material. FIG. 62 depicts an implementation of a Vivaldi or tapered slot antenna element 6200. In the implementation shown, a conductive layer 6221 is positioned on a substrate for the Vivaldi antenna element 6200. A slot 6202 is formed in the conductive layer 6221 that widens from a minimum distance 6204 at a first end 6206 of the slot 6202 to a maximum distance 6208 at a second end 6210. The opening of the slot 6202 is symmetrical in the implementation shown about an axis 6212 along the length of the slot 6202 and each side 6222, 6224 of the conductive layer 6221 widens outwardly as the slot 6202 approaches the second end 6210.

The Vivaldi antenna element 6200 can be constructed from a pair of symmetrical conductive layers 6221 on opposing sides of a thin substrate layer. The conductive layers 6221 are preferably substantially identical with the slot 6202 formed in each conductive layer 6221 pair being parallel. The Vivaldi antenna element 6200 is fed by a transmission line (not shown) at the first end 6206 and radiates from the second end 6210. The size, shape, configuration, and/or positioning of the transmission line of the Vivaldi antenna element 6200 may be modified for different bandwidths for the Vivaldi antenna element 6200.

As shown in FIG. 63, a plurality of Vivaldi antenna elements 6300 may be arranged in an array 6390. The array 6390 may include Vivaldi antenna elements 6300 in a two-dimensional configuration with Vivaldi antenna elements 6300 arranged horizontally 6312 and vertically 6311 in a plane of the array 6390. In some implementations, the Vivaldi antenna elements 6300 may be uniform in size and configuration. In other implementations, the Vivaldi antenna elements 6300 may have different sizes and/or configurations based on a position of the corresponding Vivaldi antenna element 6300 in the array 6390 and/or based on a target far-field uniformity for a magneto-optical defect center element positioned relative to the array 6390. In some implementations, the array 6390 of Vivaldi antenna elements 6300 is configured to be oversampled to operate over a frequency band centered at 2.87 GHz. Each individual Vivaldi antenna element 6300 may be designed to operate from approximately 2 GHz to 40 GHz. The array 6390 may include 64 to 196 individual Vivaldi antenna elements 6300.

FIG. 64 depicts an RF system 6400 for use in a magneto-optical defect center sensor, such as the system 4200 of FIG. 42A. A magneto-optical defect center sensor may use an RF excitation method that has substantial uniformity over a portion of the magneto-optical defect center material 6420 (e.g., a NV diamond material) such as the magneto-optical defect center material 4220 that is illuminated by the optical excitation system 4210, such as the optical light source 4210A and 4210B of FIG. 42A. A spatially oversampled Vivaldi antenna array 6490, such as the array 6390 of FIG. 63, can be implemented to achieve a high uniformity in a compact size through the use of small Vivaldi antenna elements 6200, 6300 to permit the magneto-optical defect center material 6420 to effectively be in the far field of the array, thereby decreasing the distance needed between the magneto-optical defect center material 6420 and the array 6490.

As shown in FIG. 64, the RF system includes an RF generator 6402, a beam former system 6404, and the Vivaldi antenna element array 6490. The RF generator 6402 is configured to generate an RF signal for generating an RF magnetic field for the magneto-optical defect center sensor based on an output from the controller such as the controller 680 of FIGS. 6A-6C. Each Vivaldi antenna element 6200, 6300 of the array 6490 can be designed to work from 2 gigahertz (GHz) to 40 GHz. In some implementations, each Vivaldi antenna element 6200, 6300 of the array 6990 can be designed to work at other frequencies, such as 50 GHz. The Vivaldi antenna elements 6200, 6300 are positioned on an array lattice or other substructure correlating to 40 GHz. In some implementations, the array lattice may be a small size, such as 0.1 inches by 0.1 inches. Each Vivaldi antenna element 6200, 6300 of the array 6490 is electrically coupled to the beam former system 6404. The combination of the Vivaldi antenna elements 6200, 6300 permits the array 6490 to operate at lower frequencies than each Vivaldi antenna element 6200, 6300 making up the array 6490.

The beam former system 6404 is configured to spatially oversample the Vivaldi antenna elements 6400 of the array 6490 such that the array 6490 of Vivaldi antenna elements 6200, 6300 effectively operates like a single element at 2 GHz. The beam former system 6404 may include a circuit of several Wilkinson power splitters. In some implementations, the beam former system 6404 may be configured to spatially oversample the Vivaldi antenna elements 6200, 6300 of the array 6490 such that the array 6490 of Vivaldi antenna elements 6200, 6300 perform like a single element at other frequencies, such as 2.8-2.9 GHz. A single 2 GHz antenna would typically require an increased distance for the magneto-optical defect center material 6420 to be located in the far field. If the magneto-optical defect center material 6420 is moved into the near field, decreased uniformity occurs. However, since the array 6490 is composed of much smaller Vivaldi antenna elements 6200, 6300, the far field of each element 6200, 6300 is much closer than a single 2 GHz antenna. Thus, the magneto-optical defect center material 6420 is able to be positioned much closer to still be in the far field of the array 6490. Due to oversampling provided by the beam former system 6404 of the array 6490 of very small Vivaldi antenna elements 6200, 6300 the magneto-optical defect center material 6420 is able to be positioned in the far field of the array 6490 and achieve a high uniformity.

Because of the high uniformity for the RF magnetic field provided by the array 6490, the magneto-optical defect center material 6420 can be at multiple different orientations, thereby providing additional adaptability for designing the magneto-optical defect center sensor. That is, the magneto-optical defect center material 6420 may be mounted to a light pipe for collected red wavelength light emitted from the magneto-optical defect center material 6420 when excited by a green wavelength optical excitation source, and the array 6490 can be maneuvered to a number of different positions to accommodate any preferred configurations for the positioning of the light pipe and/or optical excitation source. By providing the array 6490 of Vivaldi antenna elements 6200, 6300, the magneto-optical defect center sensor can have a more customized and smaller configuration compared to other magneto-optical defect center sensors.

In addition, in some implementations, the array 6390, 6490 may be able to control the directionality of the generated RF magnetic field. That is, because of the several Vivaldi antenna elements 6300, 6400 making up the array 6390, 6490, the directionality of the resulting RF magnetic field can be modified based on which of the Vivaldi antenna elements 6200, 6300 are active and/or the magnitude of the transmission from each of the Vivaldi antenna elements 6200, 6300. In some implementations, one or more phase shifters may be positioned between a corresponding output of a beam former of the beam former system 6404 for a Vivaldi antenna element 6200, 6300. The one or more phase shifters may be selectively activated or deactivated to provide constructive or destructive interference so as to "steer" each RF magnetic field generated from each Vivaldi antenna element 6200, 6300 in a desired direction. Thus, in some implementations it may be possible to "steer" the generated RF magnetic field to one or more lattices of the magneto-optical defect center material 6420.

Some embodiments provide methods and systems for magneto-optical defect center sensors that utilize a Vivaldi antenna array for increasing uniformity of an RF magnetic signal at a specified location of the magneto-defect center element, such as a diamond having a nitrogen vacancy.

Some implementations relate to a magnetic field sensor assembly that may include an optical excitation source, a radio frequency (RF) generator, a beam former in electrical communication with the RF generator, an array of Vivaldi antenna elements in electrical communication with the beam former, and a magneto-optical defect center material positioned in a far field of the array of Vivaldi antenna elements. The array of Vivaldi antenna elements may generate a RF magnetic field that is uniform over the magneto-optical defect center material and the optical excitation source may transmit optical light at a first wavelength to the magneto-optical defect center material to detect a magnetic field based on a measurement of optical light at a second wavelength that is different from the first wavelength.

In some implementations, the array of Vivaldi antenna elements may be configured to operate in a range from 2 gigahertz (GHz) to 50 GHz. The array of Vivaldi antenna elements may include a plurality of Vivaldi antenna elements and an array lattice. The beam former may be configured to operate the array of Vivaldi antenna elements at 2 GHz or 2.8-2.9 GHz. The beam former may be configured to spatially oversample the array of Vivaldi antenna elements. The array of Vivaldi antenna elements may be adjacent the magneto-optical defect center material. The magneto-optical defect center material may be a diamond having nitrogen vacancies.

Some implementations relate to a magnetic field sensor assembly that may include a radio frequency (RF) generator, a beam former in electrical communication with the RF generator, an array of antenna elements in electrical communication with the beam former, and a magneto-optical defect center material positioned in a far field of the array of antenna elements. The array of antenna elements may generate a RF magnetic field that is uniform over the magneto-optical defect center material.

In some implementations, the array of antenna elements may be configured to operate in a range from 2 gigahertz (GHz) to 50 GHz. The array of antenna elements may include a plurality of Vivaldi antenna elements and an array lattice. The beam former may be configured to operate the array of antenna elements at 2 GHz or 2.8-2.9 GHz. The beam former may be configured to spatially oversample the array of antenna elements. The array of antenna elements may be adjacent the magneto-optical defect center material. The magneto-optical defect center material may be a diamond having nitrogen vacancies.

Other implementations relate to a magnetic field sensor assembly that may include a radio frequency (RF) generator, an array of antenna elements in electrical communication with the RF generator, and a magneto-optical defect center material positioned in a far field of the array of antenna elements. The array of antenna elements may generate a RF magnetic field that is uniform over the magneto-optical defect center material.

In some implementations, the array of antenna elements may be configured to operate in a range from 2 gigahertz (GHz) to 50 GHz. The magnetic field sensor assembly may include a beam former configured to operate the array of antenna elements at 2.8-2.9 GHz. The array of antenna elements may include a plurality of Vivaldi antenna elements and an array lattice.

Magnetic Field Generator

In the embodiment illustrated in FIG. 65, permanent magnets are mounted to the bias magnet ring 6525, which is secured within the magnet ring mount 6515. The bias magnet ring 6525 and the magnet ring mount 6515 may correspond to the bias magnet ring 4225 and the magnet ring mount 4215 of FIG. 42A. The magnet ring mount 6515 is mounted or fixed within the housing (e.g., the housing 4205 of FIG. 42A) such that the magnet ring mount 6515 does not move within the housing. Similarly, the plurality of optical light sources (e.g., the optical light sources 4210A and 4210B of FIG. 42A) are mounted within the housing such that the plurality of optical light sources do not move within the housing.

The magneto-optical defect center material (e.g., the magneto-optical defect center material 4220 of FIG. 42A) is mounted within the magnet ring mount 6515, but the plurality of optical light sources are mounted outside of the magnet ring mount 6515. The plurality of optical light sources transmit light to the magneto-optical defect center material which excites the defect centers, and light emitted from the defect centers is detected by the optical detector (e.g., the optical detector 4240 of FIG. 42A). In some embodiments shown, the plurality of optical light sources transmit the light such that the magnet ring mount 6515 and the bias magnet ring 6525 do not interfere with the transmission of the light from the plurality of optical light sources to the NV diamond material.

The magnetic field generator (e.g., the magnetic field generator 670 of FIGS. 6A-6C) may generate magnetic fields with orthogonal polarizations, for example. In this regard, the magnetic field generator may include two or more magnetic field generators, such as two or more Helmholtz coils. The two or more magnetic field generators may be configured to provide a magnetic field having a predetermined direction, each of which provide a relatively uniform magnetic field at the magneto-optical defect center material. The predetermined directions may be orthogonal to one another. In addition, the two or more magnetic field generators of the magnetic field generator may be disposed at the same position, or may be separated from each other. In the case that the two or more magnetic field generators are separated from each other, the two or more magnetic field generators may be arranged in an array, such as a one-dimensional or two-dimensional array, for example.

The system (e.g., the system 4200 of FIG. 42A) may be arranged to include one or more optical detection systems, where each of the optical detection systems includes the optical detector, optical excitation source, and magneto-optical defect center material. Furthermore, the magnetic field generator may have a relatively high power as compared to the optical detection systems. In this way, the optical detection systems may be deployed in an environment that requires a relatively lower power for the optical detection systems, while the magnetic field generator may be deployed in an environment that has a relatively high power available for the magnetic field generator so as to apply a relatively strong magnetic field.

FIG. 65 illustrates a magnet mount assembly 6500 in accordance with some illustrative embodiments. The illustrative magnet mount assembly 6500 includes the magnet ring mount 6515 and the bias magnet ring 6525. In alternative embodiments, additional, fewer, and/or different elements may be used.

As shown in FIG. 65, the magnet ring mount 6515 includes a first portion 6616 and a second portion 6716 held together with fasteners 6518. The bias magnet ring 6525 can be fixed within the magnet ring mount 6515. The bias magnet ring 6525 can hold magnets such that a uniform or substantially uniform magnetic field is applied to a central portion of the magnet mount assembly 6500. For example, the uniform magnetic field can be applied to the magneto-optical defect center material.

The magnet mount assembly 6500 includes through-holes 6526. The through-holes 3026 can be sufficiently large to allow light from the plurality of optical light sources to pass into a center portion of the magnet mount assembly 6500 (e.g., to apply light to the magneto-optical defect center material). As noted above, the system may include any suitable number of optical light sources. Similarly, the magnet mount assembly 6500 may include any suitable number of through-holes 6526. In some illustrative embodiments, the magnet mount assembly 6500 incudes the same number of through-holes 6526 as a number of optical light sources in the system. In alternative embodiments, the magnet mount assembly 6500 includes a different number of through-holes 6526 than a number of optical light sources in the system. For example, two or more optical light sources may pass light through the same through-hole 6526. In another example, one or more through-holes 6526 may not have light passing therethrough.

The magnet mount assembly 6500 as shown in FIG. 65 includes six fasteners 6518. The fasteners 6518 can be used to secure the first portion 6616 to the second portion 6716. In some illustrative embodiments, the fasteners 6518 can be used to secure the magnet mount assembly 6500 to the housing of the system (e.g., the housing 4205 of FIG. 42A). The fasteners 6518 can be any suitable device for securing the first portion 6616 to the second portion 6716. In the embodiment shown in FIG. 65, the fasteners 6518 are screws. Other examples of fasteners 6518 may include bolts, studs, nuts, clips, etc. In alternative embodiments, any suitable means of securing the first portion 6616 and the second portion 6716 to one another, such as glue, welds, epoxy, etc. Although FIG. 65 shows six fasteners 6518 being used, any other suitable number can be used. For example, the magnet mount assembly 6500 may have one, two, three, five, ten, etc. fasteners 6518.

As shown in FIG. 65, the inside surface of the magnet ring mount 6515 is circular or semi-spherical and the outside surface is an octagonal prism. In such an embodiment, a center of the circular shape or semi-spherical shape of the inside surface is on a central axis of the octagonal prism of the outside surface. Any other suitable shapes may be used. For example, the inside surface of the magnet ring mount 6515 may be elliptical. In another example, the outside surface of the magnet ring mount 6515 may have more or fewer sides than eight.

In some illustrative embodiments, the inner diameter (e.g., the inner spherical diameter) of the magnet ring mount 6515 is 2.75 inches. In such an embodiment, the tolerance may be +0.002 inches and −0.000 inches. In alternative embodiments, the inner diameter of the magnet ring mount 6515 is greater than or less than 2.75 inches, and any suitable tolerance may be used.

As shown in FIG. 65, the bias magnet ring 6525 can include an outside ring that is circular. In some illustrative embodiments, the outside circumference of the bias magnet ring 6525 is the same or slightly less than the inside diameter of the magnet ring mount 6515. In such an embodiment, when not secured, the bias magnet ring 6525 can move freely within the magnet ring mount 6515. As discussed in greater detail below, the bias magnet ring 6525 can be secured in place inside of the magnet ring mount 6515 using, for example, set screws.

The magnet ring mount 6515 and the bias magnet ring 6525 may be made of any suitable material. In some illustrative embodiments, the magnet ring mount 6515 and the bias magnet ring 6525 are non-ferrous and/or non-magnetic. For example, the magnet ring mount 6515 and the bias magnet ring 6525 may be made of plastic (e.g., Black Noryl® PPO™, polystyrene, polyphenylene ether, etc.), titanium (e.g., Grade 5, Ti 6Al-4V, etc.), aluminum (e.g., 6061-T6 per ASTM B209, may have a chemical conversion coating per military standard MIL-DTL-5541, etc.), etc. The fasteners 6518, the set screws, and any other component of the system may be made of the same or similar materials.

FIGS. 66 and 67 are illustrations of parts of a disassembled magnet ring mount in accordance with some illustrative embodiments. FIG. 66 is an illustration of the first portion 6616 of the magnet ring mount 6515, and FIG. 67 is an illustration of the second portion 6716 of a magnet ring mount 6615 (e.g., the magnet ring mount 6515 of FIG. 65). The first portion 6616 includes fastener holes 6606, and the second portion 6716 includes fastener holes 6706. In some illustrative embodiments, the fastener holes 6606 align with corresponding fastener holes 6706 to accept the fasteners 6518. The first portion 6616 includes a hole larger than the fastener holes 6606 above the fastener holes 6606 to accept a head of the fasteners 6518 (e.g., the head of a screw). For example, the fastener holes 6606 and the fastener holes 6706 may be 0.1 inches in diameter and may be suitable to accept fasteners 6518 that are #2-56 screws. In some illustrative embodiments, the fasteners 6518 screw into threaded holes in the housing or a surface secured to the housing (e.g., a circuit board). In alternative embodiments, any other suitable securing mechanism or arrangement may be used.

The first portion 6616 of the magnet ring mount 6515 includes a height 6741, a length 6742, and a width 6743. In some illustrative embodiments, the length 6742 can be as wide as the length 6742 is long. In some illustrative embodiments, the height 6741 is 0.475 inches, and the length 6742 and the length 6742 are 2.875 inches each. In alternative embodiments, any other suitable dimensions may be used.

The second portion 6716 of the magnet ring mount 6515 includes a height 6641, a length 6642, and a width 6643. In some illustrative embodiments, the width 6643 can be as wide as the length 6642 is long. In the embodiments shown in FIGS. 66 and 67, the height 6741 is the same as the height 6641, the length 6742 is the same as the length 6642, and the length 6742 is the same as the width 6643. In some such embodiments, the height 6641 is 0.475 inches, and the width 6643 and the length 6642 are 2.875 inches each. In such an embodiment, the inside surface 6660 and the inside surface 6760 are matching but opposite portions of a sphere. That is, the circle at which the inside surface 6660 and the inside surface 6760 meet is a circumference of a sphere, and the inside surface 6660 and the inside surface 6760 are along the sphere. In alternative embodiments, any other suitable dimensions may be used.

FIG. 68 is an illustration of a magnet ring mount showing locations of magnets in accordance with some illustrative embodiments. FIG. 68 includes a magnet ring mount 6815 (e.g., the magnet ring mount 6515 of FIG. 65) and magnets 6805. In FIG. 68, six sets of three magnets 6805 are shown. Each magnet 6805 in a set is arranged in the same direction (e.g., the poles of each magnet 6805 are pointed in the same direction). In alternative embodiments, additional, fewer, and/or different elements may be used. For example, in alternative embodiments, each set of magnets 6805 may include greater than or fewer than three magnets 6805. Similarly, the total number of magnets 6805 may be greater than or fewer than eighteen.

FIG. 68 shows the arrangement of the magnets 6805 within the magnet ring mount 6815 without the bias magnet ring. Although the bias magnet ring is not shown, the bias magnet ring may hold the magnets 6805 in the same position relative to one another. But, the bias magnet ring may move within the magnet ring mount 6815 while maintaining the magnets 6805 in the same position relative to one another. Accordingly, the magnets 6805 may be rotated around the center portion of the bias magnet ring and/or the magnet ring mount 6815 (e.g., around the magneto-optical defect center material). For reference, a detailed discussion of diamond axes crystal alignment and magnet orientation is provided in U.S. patent application Ser. No. 15/003,718 (now U.S. Pat. No. 9,541,610) and U.S. patent application Ser. No. 15/003,704, both filed on Jan. 21, 2016, and both of which are incorporated herein by reference in their entireties.

FIGS. 69 and 70 are illustrations of a bias magnet ring mount in accordance with some illustrative embodiments. The bias magnet ring mount 6915 includes magnet holders 6905 with magnet holes 6910 and securing tabs 6916 with set screw holes 6920. In alternative embodiments, additional, fewer, and/or different elements may be used.

As shown in FIGS. 69 and 70, the bias magnet ring mount 6915 has an outer ring, and the magnet holders 6905 and the securing tabs 6916 are fixed to the outer ring. In some illustrative embodiments, the outside diameter 6952 of the outer ring and the bias magnet ring mount 6915 is 2.745 inches. The height 6951 of the magnet holders 6905 can be 0.290 inches. In some illustrative embodiments, the outside surface of the outer ring is spherically shaped to fit within and slide along the inner surface 6911 and the inner surface 6911.

As noted above, the magnet holders have magnet holes. The magnet holes 6910 may hold the magnets 6805 in the orientation to one another shown in FIG. 68. The securing tabs 6916 may each include one or more set screw holes 6920. The set screw holes 6920 may be configured to receive a set screw. For example, the set screw holes 6920 may be threaded. In some illustrative embodiments, set screws may be threaded into the set screw holes 6920 and be pressed against the inner surface 6911 and/or the inner surface 6911 to secure the bias magnet ring mount 6915 within the magnet ring mount 6915. In some illustrative embodiments, the set screws 6920 may be #2-56 screws. In alternative embodiments, any other suitable set screws may be used.

In the embodiment shown in FIG. 70, two of the securing tabs 7015 each include one set screw hole 7020 and six through-holes 7005. Each of the six through-holes 7005 can be used to drill or otherwise form the magnet holes 7010. For example, each of the through-holes 7005 may be aligned along a same central axis as a corresponding magnet hole 7010. For example, the inside diameter of the magnet holes 7010 can be 0.070 inches. The inside diameter of the through-holes 7005 can be the same or larger than the inside diameter of the magnet holes 7010. Following the example, the inside diameter of the through-holes 7005 may be 0.070 inches (or larger). In alternative embodiments, any other suitable inside diameters may be used.

Thus, the magnet mount assembly 6500 can be used to adjust the magnetic bias applied to the magneto-optical defect center material by moving the magnets 6805 about the magneto-optical defect center material. Similarly, once a desired position is selected, the bias magnet ring mount 6515 may be secured within the magnet ring mount 6515.

As noted above with respect to FIGS. 4A and 4B, each of the dips (e.g., Lorentzians) in the graphs may correspond to one or more axes of the defect centers within the NV diamond material 620. The bias magnetic field applied to the magneto-optical defect center material may adjust the order and orientation of the Lorentzian dips in the graphs. Accordingly, there are forty-eight unique orientations of the Lorentzians such that each Lorentzian is distinguishable from the others (e.g., as in the graph of FIG. 4B). Thus, there are forty-eight unique positions of the magnets 6805 around the magneto-optical defect center material corresponding to each of the forty-eight orientations of the Lorentzians.

In some illustrative embodiments, the magnet ring mount 6515 is movable within the bias magnet ring 6525 and the housing such that twelve of the forty-eight positions of the magnets 6805 are accessible. That is, the magnet ring mount 6515 cannot be positioned into all of the forty-eight positions because the magnet ring mount 6515 would interfere with the housing, which may span across the top and bottom of the magnet ring mount 6515. In some instances, only a portion of the twelve positions may position the bias magnet ring 6525 within the magnet ring mount 6515 such that the bias magnet ring 6525 does not interfere with the light that passes through the through-holes 6526. In some illustrative embodiments, the bias magnet ring 6525 is positioned such that the Lorentzians are distinguishable from one another and such that the light is not interfered with as it passes through the through-hole to the magneto-optical defect center material.

Magneto-optical Defect Center with Waveguide Implementation

In some implementations, the devices 300, 600A, 600B, 600C, 700, 2500, and/or 4200 can be implemented having a magneto-optical defect center material with a waveguide.

In various embodiments described herein, the material with the defect centers may be formed in a shape that directs light from the defect centers towards the photo diode. When excited by the green light photon, a defect center emits a red light photon. But, the direction that the red light photon is emitted from the defect center is not necessarily the direction that the green light photon was received. Rather, the red light photon can be emitted in any direction. When the red photon reaches the interface between the diamond and the surrounding medium, the photon may transmit through the interface or reflect back into the diamond, depending, in part, on the angle of incidence at the interface. The phenomenon by which the photon may reflect back into the diamond is referred to as total internal reflection (TIR). Thus, the sides of the diamond can be angled and polished to reflect red light photons towards the photo sensor.

FIG. 71 illustrates a magneto-optical defect center material 7120 with a defect center 7115 and an optical detector 7140. In an illustrative embodiment, the magneto-optical defect center material 7120 is a diamond material, and the defect center 7115 is an NV center. In alternative embodiments, any suitable magneto-optical defect center material 7120 and defect center 7115 can be used. An excitation photon travels along path 7105, enters the material 7120 and excites the defect center 7115. The excited defect center 7115 emits a photon, which can be in any direction. Paths 7110, 7111, 7112, 7113, and 7114 are example paths that the emitted photon may travel. In the embodiments of FIG. 71, one defect center 7115 is shown for illustrative purposes. However, in alternative embodiments, the material may include multiple defect centers 7115. Also, the angles and specific paths in FIG. 71 are meant to be illustrative only and not meant to be limiting. In alternative embodiments, additional, fewer, and/or different elements may be used.

In the embodiments illustrated in FIG. 71, there is no object between the material 7120 and the optical detector 7140. Thus, air or a vacuum is between the material 7120 and the optical detector 7140. The air or vacuum surrounds the material 7120. In alternative embodiments, objects such as waveguides may be between the material 7120 and the optical detector 7140. Regardless of whether an object is between the material 7120 and the optical detector 7140, the refractive index of the material is different than the refractive index of whatever is between the material 7120 and the optical detector 7140.

In the embodiments shown in FIG. 71 in which the same material (e.g., air or a vacuum) surrounds the material 7120 on all sides and has a different refractive index than the material 7120, the path of the emitted light may change direction at the interface between the material 7120 and the surrounding material depending upon the angle of incidence and the differences in the refractive indexes. In some instances, depending upon the differences in the refractive indexes, the angle of incidence, and the surface of the interface (e.g., smooth or rough), the photon may reflect off of the surface of the material 7120. In general, as the angle of incidence becomes more orthogonal, as the differences in the refractive indexes gets closer to zero, and as the surface of the interface is more rough, the higher the chance that the emitted photon will pass through the interface rather than reflect off of the interface. In the examples of FIG. 71, all of paths 7110, 7111, 7112, 7113, and 7114 travel through the interface (i.e., a side surface of the material 7120). However, in other instances, the photon may reflect off of one or more surfaces of the material 7120 before passing through the interface. Because the emitted photon can be emitted in any three-dimensional direction, only a small fraction of the possible beam paths exit the surface of the material 7120 facing the optical detector 7140.

FIG. 72A is a diagram illustrating possible paths of light emitted from a material with defect centers and a rectangular waveguide in accordance with some illustrative embodiments. FIG. 72A illustrates a material 7220 with a defect center 7215 and an optical detector 7240. In an illustrative embodiment, the magneto-optical defect center material 7220 is a diamond material, and the defect center 7215 is an NV center. In alternative embodiments, any suitable magneto-optical defect center material 7220 and defect center 7215 can be used. Attached to the material 7220 is a waveguide 7322. An excitation photon travels along path 7205, enters the material 7220 and excites the defect center 7215. The excited defect center 7215 emits a photon, which can be in any direction. Paths 7210, 7211, 7212, 7213, and 7214 are example paths that the emitted photon may travel. In the embodiments of FIG. 72A, one defect center 7215 is shown for illustrative purposes. However, in alternative embodiments, the material may include multiple defect centers 7215. Also, the angles and specific paths in FIG. 72 are meant to be illustrative only and not meant to be limiting. FIG. 72B is a three-dimensional view of the material and rectangular waveguide of FIG. 72A in accordance with an illustrative embodiment. As shown in FIG. 72B, the material 7220 and the waveguide 7222 are a cuboid. In alternative embodiments, additional, fewer, and/or different elements may be used.

The embodiments shown in FIG. 72A includes a waveguide 7222 attached to the material 7220. In an illustrative embodiment, the waveguide 7222 is a diamond, and there is no difference in refractive indexes between the waveguide 7222 and the material 7220. In alternative embodiments, the waveguide 7222 may be of any material with the same or similar refractive index as the material 7220. Because there is little or no difference in refractive indexes, light passing through the interface 7224 does not bounce back into the material 7220 or change velocity (e.g., including direction). Accordingly, because light passes freely through the interface 7224, more light is emitted from the material 7220 toward the optical detector 7240 than in the embodiments of FIG. 71. That is, light emitted in a direction toward a side of the material 7220 that is not the interface 7224 may bounce back into the material 7220 depending upon the angle of incidence, etc., as described above. Such light, therefore, has a chance to be bounced into the direction of the interface 7224 and toward the optical detector 7240. In general, light (e.g., via path 7212) that contacts a sidewall of the waveguide 7222 will be reflected back into the waveguide 7222 as opposed to transitioning outside of the waveguide 7222 because of the angle of incidence. That is, such light will generally have a low angle of incidence, thereby increasing the chance that the light will bounce back into the waveguide 7222. Similarly, light that hits the end face of the waveguide 7222 (i.e., the face of the waveguide 7222 facing the optical detector 7240) will generally have a high angle of incidence, and, therefore, a higher chance of passing through the end of the waveguide 7222 and pass onto the surface of the optical detector.

In some illustrative embodiments, the material 7220 includes NV centers, but the waveguide 7222 does not include NV centers. Light emitted from an NV center can be used to excite another NV center. The excited NV center emits light in any direction. Accordingly, if the waveguide 7222 includes NV centers, light that passed through the interface 7224 may excite an NV center in the waveguide 7222, and the NV center may emit light back towards the material 7220 or in a direction that would allow the light to pass through a side surface of the waveguide 7222 (e.g., as opposed to the end face of the waveguide 7222 and toward the optical detector 7240). In some instances, light may be absorbed by defects that are not NV centers, and such defects may not emit a corresponding light. In such instances, the light is not transmitted to a light sensor.

Accordingly, efficiency of the waveguide 7222 is increased when the waveguide 7222 does not include nitrogen vacancies. In this context, efficiency of the system is determined by the amount of light that is emitted from the defect centers compared to the amount of light that is detected the optical detector 7240. That is, in a system with 100% efficiency, the same amount of light that is emitted by the defect centers passes through the end face of the waveguide 7222 and is detected by the optical detector 7240. In an illustrative embodiment, a system with the waveguide 7222 that has nitrogen vacancies has a mean efficiency of about 4.5%, whereas a system with the waveguide 7222 that does not have nitrogen vacancies has a mean efficiency of about 6.1%.

FIG. 73A is a diagram illustrating possible paths of light emitted from a material with defect centers and an angled waveguide in accordance with some illustrative embodiments. FIG. 73A illustrates a material 7320 with a defect center 7315 and an optical detector 7340. In an illustrative embodiment, the magneto-optical defect center material 7320 is a diamond material, and the defect center 7315 is an NV center. In alternative embodiments, any suitable magneto-optical defect center material 7320 and defect center 7315 can be used. The material 7320 with the waveguide 7322 has a higher efficiency than the embodiments of FIG. 72. In an illustrative embodiment with a diamond and waveguide similar to the material 7320 and the waveguide 7322 of FIG. 73, the system has a mean efficiency of about 9.8%.

In an illustrative embodiment, the shape of the material 7320 and the waveguide 7322 in FIG. 73A is two-dimensional. That is, the surfaces of the material 7320 and the waveguide 7322 that are orthogonal to the viewing direction of FIG. 73 are flat with each side in a plane that is parallel to one another, and each side spaced from one another. FIG. 73B is a three-dimensional view of the material and angular waveguide of FIG. 73A in accordance with an illustrative embodiment.

As shown in FIG. 73A, the material 7320 and the waveguide 7322 are defined, in one plane, by sides 7351, 7352, 7353, 7354, 7355, and 7356. The angles between sides 7351 and 7352, between sides 7352 and 7353, between sides 7353 and 7354, and between sides 7356 and 7351 are obtuse angles (i.e., greater than 90°). The angles between sides 7354 and 7355 and between sides 7355 and 7356 are right angles (i.e., 90°). The material 7320 with nitrogen vacancies does not extend to sides 7354, 7355, and 7356. In alternative embodiments, any suitable shape can be used. For example, the waveguide can include a compound parabolic concentrator (CPC). In another example, the waveguide can approximate a CPC.

FIG. 74A is a diagram illustrating possible paths of light emitted from a material with defect centers and a three-dimensional waveguide in accordance with some illustrative embodiments. FIG. 74A illustrates a material 7420 with a defect center 7415 and an optical detector 7440. In an illustrative embodiment, the magneto-optical defect center material 7420 is a diamond material, and the defect center 7415 is an NV center. In alternative embodiments, any suitable magneto-optical defect center material 7420 and defect center 7415 can be used. Attached to the material 7420 is a waveguide 7422. An excitation photon travels along path 7405, enters the material 7420, and excites the defect center 7415. The excited defect center 7415 emits a photon, which can be in any direction. Paths 7410, 7411, 7412, and 7413 are example paths that the emitted photon may travel. In the embodiments of FIG. 74, one defect center 7415 is shown for illustrative purposes. However, in alternative embodiments, the material may include multiple defect centers 7415. Also, the angles and specific paths in FIG. 74 are meant to be illustrative only and not meant to be limiting. In alternative embodiments, additional, fewer, and/or different elements may be used.

In an illustrative embodiment, the material 7420 includes defect centers, and the waveguide 7422 is made of diamond but does not include defect centers. In an illustrative embodiment, the angles formed by sides 7455 and 7456 and by sides 7456 and 7457 are right angles, and the other angles formed by the other sides are obtuse angles. In an illustrative embodiment, the cross-sectional shape of the material 7420 and the waveguide 7422 of FIG. 74A is the shape of the material 7420 and the waveguide 7422 in two, orthogonal planes. That is, the material 7420 and the waveguide 7422 have one side 7452, one side 7456, two sides 7451, two sides 7453, two sides 7454, two sides 7455, two sides 7457, and two sides 7458. The three-dimensional aspect can be seen in FIG. 74B.

FIGS. 74C-74F are two-dimensional cross-sectional drawings of a three-dimensional waveguide in accordance with some illustrative embodiments. The three-dimensional waveguide in FIGS. 74C-74F can be the same waveguide as in FIGS. 74A and/or 74B.

Dimensions 7461, 7462, 7463, 7464, 7465, 7466, 7467, 7468, 7469, and 7470 are provided as illustrative measurements in accordance with some embodiments. In alternative embodiments, any other suitable dimensions may be used. In an illustrative embodiment, the dimension 7461 is 2.81 mm, the dimension 7462 is 2.00 mm, the dimension 7463 is 0.60 mm, the dimension 7464 is 1.00 mm, the dimension 7465 is 3.00 mm, the dimension 7466 is 0.50 mm, the dimension 7467 is 1.17 mm, the dimension 7468 is 2.0 mm, the dimension 7469 is 0.60, and the dimension 7470 is 1.75 mm.

In an illustrative embodiment, the three-dimensional material 7420 and waveguide 7422 of the system of FIGS. 74A-74F had a mean efficiency of 55.1%. The shape of the configuration of FIGS. 74A and 74B can be created using diamond shaping and polishing techniques. In some instances, the shapes of FIGS. 74A-74F can be more difficult (e.g., more steps, more sides, etc.) than other configurations (e.g., those of FIGS. 72A, 72B, 73A, and 73B). As explained above, the material and the waveguide of the configurations of FIGS. 72A, 72B, 73A, 73B, and 74A-74F include the material with the defect centers and the material without the defect centers (i.e., the waveguide). In some embodiments, the material with the defect centers is synthesized via any suitable method (e.g., chemical vapor deposition), and the waveguide is synthesized onto the material with the defect centers. In alternative embodiments, the material with the defect centers is synthesized onto the waveguide.

In alternative embodiments, the material and the waveguide can be synthesized (or otherwise formed) independently and attached after synthesis. For example, FIG. 75 is a diagram illustrating a material attached to a waveguide in accordance with some illustrative embodiments. The material 7520 can be fused to the waveguide 7522. In an illustrative embodiment, the material 7520 and the waveguide 7522 are fused together using optical contact bonding. In alternative embodiments, any suitable method can be used to fuse the material 7520 and the waveguide 7522.

In an illustrative embodiment, the refractive index of the material 7520 and the waveguide 7522 are the same. Accordingly, as discussed above, more of the light that is emitted from the defect centers is directed towards the optical detector 7540 with the waveguide 7522 than without.

In an illustrative embodiment, because the waveguide 7522 is synthesized separately from the material 7520, the waveguide 7522 can be manufactured into any suitable shape. In the embodiments shown in FIG. 75, the waveguide 7522 is a paraboloid. For example, the waveguide 7522 can be a compound parabolic concentrator. In an illustrative embodiment, the material 7520 is a cube. In such an embodiment, the length of the diagonal of one of the sides is the same as the length of the diameter of the paraboloid at the end of the waveguide 7522 attached to the material 7520. In alternative embodiments, any other suitable shape can be used, such as any of the shapes shown in FIGS. 72A, 72B, 73A, 73B, and 74A-74F.

In the embodiments of FIGS. 71, 72A, 73A, and 74A, the light used to excite the corresponding defect centers is orthogonal to the respective side of the material that the light enters. In some instances, light entering the material through the interface at an orthogonal angle is the most efficient direction to get the light into the material. In other instances, a larger incidence angle may be more efficient than an orthogonal angle, depending upon the polarization of the light with respect to the surface orientation. In alternative embodiments, the light can enter the material at any suitable angle, even if at a less efficient angle. For example, the angle of the light entering the material can be parallel to a plane of the respective optical detector (e.g., as in FIG. 71). Such an angle can be chosen based on, for example, a configuration of a magnetometer system (e.g., a DNV system) or other system constraints.

FIG. 76 is a flow chart of a method of forming a material with a waveguide in accordance with an illustrative embodiment. In alternative embodiments, additional, fewer, and/or different operations may be performed. Also, the use of a flow chart and/or arrows is not meant to be limiting with respect to the order or flow of operations. For example, in alternative embodiments, two or more operations may be performed simultaneously.

In an operation 7605, a material with defect centers is synthesized. For example, the material can be a diamond material, and the defect centers can be NV centers. In an illustrative embodiment, chemical vapor deposition can be used to create the material with defect centers. In alternative embodiments, any suitable method for synthesizing the material with defect centers can be used.

In an operation 7610, a waveguide is synthesized. For example, the waveguide can be the same material as the material with the defect centers but without the defect centers (e.g., diamond material without NV centers or other defect centers). In an illustrative embodiment, chemical vapor deposition is used to synthesize the waveguide onto the material with defect centers. For example, chemical vapor deposition can be used to form the material in the operation 7605 in the presence of nitrogen or other element or material, and the waveguide can be synthesized by continuing to deposit carbon on the material but without the nitrogen or other element or material.

In an operation 7615, the material and waveguide can be cut and polished. For example, the material and waveguide can be cut and polished into one of the shapes shown in FIGS. 72A, 72B, 73A, 73B, 74A-74F. In an illustrative embodiment, after the material and waveguide is cut and polished, the material and waveguide can be used in a magnetometer such as a DNV sensor.

FIG. 77 is a flow chart of a method of forming a material with a waveguide in accordance with some illustrative embodiments. In alternative embodiments, additional, fewer, and/or different operations may be performed. Also, the use of a flow chart and/or arrows is not meant to be limiting with respect to the order or flow of operations. For example, in alternative embodiments, two or more operations may be performed simultaneously.

In an operation 7705, a material with defect centers is synthesized. In an illustrative embodiment, the material is diamond and the defect centers are NV centers. For example, a material can be formed using chemical vapor deposition in the presence of nitrogen or other defect material, thereby forming a material with defect centers. In alternative embodiments, any suitable method can be used to create a material with defect centers. In an operation 7710, the material with defect centers is cut and polished. The material with defect centers can be cut into any suitable shape, such as a cube, a cuboid, etc.

In an operation 7715, a waveguide is synthesized. For example, a material without defect centers can be formed using any suitable method, such as chemical vapor deposition. In an operation 7720, the waveguide can be cut and polished. For example, the waveguide can be cut into the shape of the waveguide 7222 of FIGS. 72A and 72B, the waveguide 7322 of FIGS. 73A and 73B, the waveguide 7422 of FIGS. 74A-74F, or the waveguide 7522 of FIG. 75. In alternative embodiments, the waveguide can be cut into any suitable shape.

In an operation 7725, the material with the defect centers is fused to the waveguide. For example, optical contact bonding can be used to fuse the material with the defect centers with the waveguide. In alternative embodiments, an adhesive or other suitable bonding agent can be used to attach the material with the defect centers to the waveguide. In such embodiments, the substance used to fix the material with the defect centers to the waveguide can have a refractive index that is the same as or similar to the refractive index of the material. In an illustrative embodiment, after the material and waveguide are fixed together, the material and waveguide can be used in a magnetometer such as a DNV sensor.

Drift Error Compensation Implementation

In some implementations, the devices 300, 600A, 600B, 600C, 700, 2500, and/or 4200 can be implemented with methods for drift error compensation.

Measurement errors due to vertical and horizontal fluctuations in fluorescence intensity caused by internal and external effects of the system (e.g., optical excitation, thermal and/or strain effects) may be addressed in a magnetic detection system including multi-RF excitation. Fluorescence intensity measurements may be obtained at resonant frequencies associated with the positive and negative maximum (including greatest and near greatest) slope points of a response curve of an NV center orientation and spin state ($m_s$=+1) to account for vertical drift error. In addition, fluorescence intensity measurements may be obtained at resonant frequencies associated with the positive and/or negative maximum (including greatest and near greatest) slope points of the response curves of an NV center orientation at both spin states ($m_s$=+1 and $m_s$=−1) to account for horizontal drift error. By compensating for such errors, the system may realize increased sensitivity and stability when calculating an external magnetic field acting on the system. In certain embodiments, guard intervals, in the form of multi-pulse sets of RF excitation at a given resonant frequency, and/or guard pulses, in the form of initial pulses used to stabilize the system without providing measurement data, may also be utilized during the collection process to allow for sufficient repolarization of the system when switching between resonant frequencies. Such guard intervals and/or guard pulses may ensure that residual effects due to previous measurement collections are reduced or eliminated. Among other things, this allows the system to forego the use of high-powered optical excitation for repolarization, thus improving sensor performance and cost.

As shown in FIGS. 6A-6C, the controller 680 controls the operation of the optical excitation source 610, the RF excitation source 630, and the magnetic field generator 670 to perform Optically Detected Magnetic Resonance (ODMR). Specifically, the magnetic field generator 670 may be used to apply a bias magnetic field that sufficiently separates the intensity responses for each of the four NV center orientations. The controller 680 then controls the optical excitation source 610 to provide optical excitation to the NV diamond material 620 and the RF excitation source 630 to provide RF excitation to the NV diamond material 620. The resulting fluorescence intensity responses for each of the NV axes are collected over time to determine the components of the external magnetic field $B_z$ aligned along directions of the four NV center orientations of the NV diamond material 620, which may then be used to calculate the estimated vector magnetic field acting on the system 600. The excitation scheme utilized during the measurement collection process (i.e., the applied optical excitation and the applied RF excitation) may be any appropriate excitation scheme. For example, the excitation scheme may utilize continuous wave (CW) magnetometry, pulsed magnetometry, and variations on CW and pulsed magnetometry (e.g., pulsed RF excitation with CW optical excitation). In cases where Ramsey pulse RF sequences are used, pulse parameters $\pi$ and $\tau$ may be optimized using Rabi analysis and FID-Tau sweeps prior to the collection process, as described in, for example, U.S. patent application Ser. No. 15/003,590.

During the measurement collection process, fluctuations may occur in the measured intensity response due to effects caused by components of the system 600, rather than due to true changes in the external magnetic field. For example, prolonged optical excitation of the NV diamond material by the optical excitation source 610 may cause vertical (e.g., red photoluminescence intensity) fluctuations, or vertical drift, in the intensity response, causing the response curve to shift upward or downward over time. In addition, thermal effects within the system 600 may result in horizontal (e.g., frequency) fluctuations, or horizontal drift, in the measured intensity response, causing the response curve to translate left or right over time.

In some systems, the excitation scheme is configured such that the measurement collection process occurs at a single resonant frequency associated with a given spin state (e.g., $m_s$=+1) of an NV center orientation. This resonant frequency may be either the frequency associated with the positive maximum slope point or the frequency associated with the negative maximum slope point of the response curve. Intensity response changes that occur at the particular frequency are tracked and used to determine changes in the external magnetic field Bz. However, because these measurement techniques utilize data at only a single point of the response curve (e.g., the positive maximum slope point or the negative maximum slope point), it can be difficult to account for those changes in the intensity response that are not due to the external magnetic field $B_z$ but are rather due to internal or external system effects. For example, when only a single RF frequency is tracked for measurement purposes, vertical drift due to prolonged optical excitation and horizontal drift due to thermal effects may be perceived as changes in the external magnetic field $B_z$, thus introducing error into the estimated vector magnetic field. Thus, compensation for these internal errors during the measurement collection process is desirable to maximize sensitivity and stability of the magnetic detection system 600.

FIG. 78A illustrates one example of a reduced fluorescence intensity response associated with a particular NV axis orientation and a first spin state (e.g., $m_s$=+1). The graph shown in FIG. 78A is a zoomed-in view of the signal of interest (e.g., the particular NV axis orientation at the first spin state) via an offset and gain within the optical detector 640 and related circuitry of the system 600. As shown in FIG. 78A, the intensity response curve for the given spin state includes two maximum (including greatest and near greatest) slope points, a positive maximum (including greatest and near greatest) slope point 7812A and a negative maximum (including greatest and near greatest) slope point 7812B.

To compensate for vertical drift error, data is collected on both the positive maximum slope point 7812A and the negative maximum slope point 7812B during a collection process for a given magnetometry response curve. In some embodiments, however, data may be collected on a positive slope point 7812A and a negative slope point 7812B that is the average between the positive maximum slope and the negative maximum slope for a given response curve to allow for faster switching between relative frequencies during measurement collection.

By collecting data on both the positive slope point 7812A and the negative slope point 7812B for a response curve, changes due to vertical drift may be detected and accounted for during the external magnetic field calculation process. For example, if a shift in the response curve is due to a true change in the external magnetic field, the intensity response associated with the slope point 7812A and the intensity response associated with the slope point 7812B should shift in opposite directions (e.g., the intensity response associated with the slope point 7812A increases, while the intensity response associated with the slope point 7812B decreases, or vice versa). On the other hand, if a shift in the response curve is due to internal system factors that may cause vertical fluctuations, the intensity response associated with the slope points 7812A, 7812B should shift in equal directions (e.g., the intensity responses for slope points 7812A, 7812B both increase). Thus, by determining the relative shift in intensity response of slope points 7812A, 7812B of the response curve, error due to vertical drift may be detected. The resulting intensity measurements of the positive slope point 7812A and the negative slope point 7812B are then subtracted and divided by the difference of the slopes 7812A, 7812B (i.e., positive slope 7812A−negative slope 7812B≈2*positive slope 7812A), allowing for compensation of vertical fluctuations associated with vertical drift. In some embodiments, the vertical compensation process provides similar sensitivity as compared to a single RF frequency data collection process, described above, but reduces the bandwidth of the collection process by a factor of two.

FIG. 78B illustrates the reduced fluorescence intensity response associated with the same NV axis orientation shown in FIG. 78A and a second spin state (e.g., $m_s$=−1), which is opposite to the first spin state. Like FIG. 78A, FIG. 78B shows a zoomed-in view of the signal of interest (e.g., the particular NV axis orientation at the second spin state) via an offset and gain within the optical detector 640 and related circuitry of the system 600. Similar to the vertical drift compensation process, horizontal drift may be compensated by performing data collection on two different slope points. In this case, data is collected on a first slope point associated with the first spin state shown in FIG. 78A and a second slope point associated with the second spin state shown in FIG. 78B. The first slope point and the second slope point may be selected independently of each other. For example, in some embodiments, the first slope point and the second slope point have equal signs (i.e., positive slope points 7812A, 7812A' or negative slope points 7812B, 7812B'). In other embodiments, however, the first slope point and the second slope point may have opposite signs (e.g., slope points 7812A, 7812B' or slope points 7812B, 7812A'). By collecting measurement data associated with maximum slope points of the two spin states of a given NV axis orientation, horizontal drift error may be estimated and accounted for in magnetic field calculations. For example, if a shift in the intensity response is due to changes in the external magnetic field acting on the system 600, the response curves associated with each of the spin states should shift relative to one another (i.e., either outward or inward relative to the zero splitting frequency). If, on the other hand, a shift in the intensity response is due to thermal effects within the system 600, the response curves associated with each of the spin states translate. Thus, like vertical drift compensation, horizontal shifts due to internal thermal effects may be determined and compensated during the collection process.

In certain embodiments, the measurement collection process may include both vertical drift error compensation and horizontal drift error compensation by switching between frequencies associated with the positive and negative slopes of a response curve for the first spin state and a frequency associated with a slope point of a response curve for the second spin state of an NV center orientation, allowing for magnetometry calculations that account for both vertical drift and horizontal drift due to internal components of the system 600. In addition, while processing for the compensation of vertical drift and/or horizontal drift may occur at the relative fluorescence intensity level, as described above, error due to both effects may be compensated during processing associated with the external magnetic field $B_z$ estimation.

When switching between frequencies of a given NV center orientation and/or spin state, fluorescence dimming from a previous frequency may impact the measurement data collected on a subsequent frequency. Optical excitation power is often increased to reduce the time required to allow the system to repolarize to mitigate this effect. However, such a solution increases costs in terms of sensor SWAP, RF power, thermal stability, sensor complexity, and achievable sensitivity. As such, to ensure sufficient repolarization of the system 600 when shifting measurement collection to a different frequency without significantly increasing the costs associated with the system 600, guard intervals and/or guard pulses may be utilized during the measurement collection process, as shown in FIGS. 79A-79C. By utilizing guard intervals and/or pulses between measurement collections at different frequencies, measurement information from a given NV center orientation or spin state impacting the measurement of subsequent orientations and/or spin states due to residual dimming may be avoided. Moreover, because guard intervals/pulses reduce the effective sensor level duty cycle, multi-pulse coherent integration schemes may be used to further optimize magnetometry performance.

FIG. 79A shows one example of a measurement collection scheme in which error due to vertical drift is compensated through alternating single pulse intervals of data collection 7920 on a first slope point (e.g., positive slope point 7812A) of a response curve (indicated by solid lines) and data collection 7925 on the second slope point (e.g., negative slope point 7812B) of the response curve (indicated by dashed lines). In this case, a faster net sample rate may be achieved through constant switching between the two slope points 7920, 7925. The measurement collection scheme shown in FIG. 79A may be similarly applied for RF schemes utilizing horizontal drift error compensation.

In certain embodiments, to further reduce the impact of residual noise, longer data collection intervals may be used, such as the measurement collection scheme shown in FIGS. 79B and 79C. As shown in FIG. 79B, error due to vertical drift is compensated through alternating multi-pulse data collection interval 7930*a*-7930*e* on the first slope point (e.g., positive slope point 7812A) of the response curve (indicated by solid lines) and multi-pulse data collection interval 7935*a*-7935*e* on the second slope point (e.g., negative slope point 7812B) of the response curve (indicated by dashed liens). Similarly, as shown in FIG. 79C, error due to horizontal drift is compensated through alternating multi-pulse data collection 7940*a*-7940*e* (indicated by solid lines) on a first slope point of the response curve associated with a first spin state (e.g., positive slope point 7812A) and multi-pulse data collection 7945*a*-7945*e* (indicated by dashed lines) on a second slope point of the response curve associated with a second spin state (e.g., positive slope point 7812A') of the response curve.

While five pulses are shown for each data collection interval in FIGS. 79B and 79C, the total number of pulses or windows may vary and range from one pulse per interval up to about 400 pulses per interval. Longer segments of data collection allow for the averaging of intensity measurements over 60 Hz cycles, which provides a low-pass filter that nulls harmonics due to outside noise. In addition, in some embodiments, each of the pulses in a data collection interval (e.g., pulses 7930*a*-7930*e* shown in FIG. 79B) may be averaged to achieve a better signal-to-noise ratio. In other embodiments, initial pulses in a data collection interval (e.g., pulses 7930*a*-7930*c* shown in FIG. 79B) may also serve as guard "pulses," in which only the subsequent pulses (e.g., pulses 7930*d*-7930*e*) are averaged to obtain measurement data. These guard pulses allow for the thermal stability of the system 600 to be maintained by maintaining a regular RF excitation and optical excitation pattern while allowing the system 600 to ignore intensity measurements associated with transitions between frequencies.

In some cases, the need for guard intervals and/or guard pulses to ensure sufficient repolarization of the system 600 may be eliminated through the use of two optical light sources, one with a relatively high power to provide reset of spin polarization and another to induce fluorescence for the readout. Such a system is described in U.S. Non-Provisional patent application Ser. No. 15/382,045, entitled "Two-Stage Optical DNV Excitation," filed Jan. 4, 2017, which is incorporated herein by reference in its entirety.

In addition to guard intervals and/or guard pulses, in cases of RF excitation applied as Ramsey RF pulse sequences, the pulse sequence parameters may be re-optimized (i.e., pulse parameters $\pi$ and $\tau$) when switching from a response curve associated with one NV center orientation and/or spin state to a response curve associated with another NV center orientation and/or spin state. For example, when switching from a response curve associated with a first spin state of an NV center orientation to a response curve associated with a second spin state of the same NV center orientation, such as during horizontal drift error compensation, the Ramsey pulse sequence parameters may be re-optimized for the response curve associated with the second spin state. By doing so, the fluorescence intensity values and the contrast values may better match between the two response curves, thereby ensuring maximum sensitivity during the measurement collection process.

Some concepts presented herein provide for a magnetic detection system that provides for a multi-RF excitation scheme capable of compensating for measurement errors due to vertical and horizontal fluctuations in fluorescence intensity during the collection process, allowing for increased sensitivity and stability of the detection system. In addition, by utilizing guard intervals (i.e., multi-pulse sets) while switching between frequencies and guard pulses within pulse sets ensures that residual effects due to previous measurement collections are reduced or eliminated. This allows a system to forego the use of high-powered optical excitation for the required repolarization of the system, thus improving sensor performance and cost.

The drift error compensation described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for calculation some or all of the drift error computations according to a non-limiting embodiment of the present disclosure.

Thermal Drift Error Compensation Implementation

In some implementations, the devices 300, 600A, 600B, 600C, 700, 2500, and/or 4200 can be implemented with methods for thermal drift compensation.

The present disclosure relates to systems and methods for estimating a full three-dimensional magnetic field from a magneto-optical defect center material, such as a NV center diamond material. The systems and methods only require using the spectral position of four electron spin resonances to recover a full three-dimensional estimated magnetic field, in the case of NV diamond material. By using only a subset of the full eight electron spin resonances, a faster vector sampling rate is possible.

Further the systems and methods described for determining the estimated three-dimensional magnetic field are insensitive to temperature drift. Thus, the temperature drift is inherently accounted for.

Still further, according to the systems and methods described, the thermal drift in the spectral position of the electron spin resonances used in the magnetic field estimation may be readily calculated based on a four-dimensional measured projected magnetic field (onto the diamond lattice vectors) and the three-dimensional estimated magnetic field.

Referring back to FIGS. 6A-6C, the controller 680 controls the operation of the optical excitation source 610, the RF excitation source 630, and the magnetic field generator 670 to perform Optically Detected Magnetic Resonance (ODMR). Specifically, the magnetic field generator 670 may be used to apply a bias magnetic field that sufficiently separates the intensity responses corresponding to electron spin resonances for each of the four NV center orientations. The controller 680 then controls the optical excitation source 610 to provide optical excitation to the NV diamond material 620 and the RF excitation source 630 to provide RF excitation to the NV diamond material 620. The resulting fluorescence intensity responses for each of the NV axes are collected over time to determine the components of the external magnetic field $B_z$ aligned along directions of the four NV center orientations which respectively correspond to the four diamond lattice crystallographic axes of the NV diamond material 620, which may then be used to calculate the estimated vector magnetic field acting on the system 600. The excitation scheme utilized during the measurement collection process (i.e., the applied optical excitation and the applied RF excitation) may be any appropriate excitation scheme. For example, the excitation scheme may utilize continuous wave (CW) magnetometry, pulsed magnetometry, and variations on CW and pulsed magnetometry (e.g., pulsed RF excitation with CW optical excitation). In cases where Ramsey pulse RF sequences are used, pulse parameters $\pi$ and $\tau$ may be optimized using Rabi analysis and FID-Tau sweeps prior to the collection process, as described in, for example, U.S. patent application Ser. No. 15/003,590.

During the measurement collection process, fluctuations may occur in the measured intensity response due to effects caused by components of the system 600, rather than due to true changes in the external magnetic field. For example, prolonged optical excitation of the NV diamond material by the optical excitation source 610 may cause vertical (e.g., red photoluminescence intensity) fluctuations, or vertical drift, in the intensity response, causing the response curve to shift upward or downward over time. In addition, thermal effects within the system 600 may result in horizontal (e.g., frequency) fluctuations, or horizontal drift, in the measured intensity response, causing the response curve to shift left or right over time depending on whether the temperature of the magneto-optical defect center material has increased or decreased.

In deriving the three-dimensional magnetic field vector impinging on the system 600 from the measurements obtained by the intensity response produced by the NV diamond material 620, it is desirable to establish the orientation of the NV defect center axes, or magneto-optical defect center axes more broadly, of the NV diamond material 620, or the magneto-optical defect center material more broadly, to allow for the accurate recovery of the magnetic field vector and maximize signal-to-noise information. Since the NV defect center axes are aligned along the respective crystallographic axes of the diamond lattice for the NV diamond material 620, the analysis below is with respect to the four crystallographic axes of the diamond lattice. Of course, the number of crystallographic axes will depend upon the material used in general for the magneto-optical defect center material, and may be a different number than four.

As shown in FIG. 80, a Cartesian reference frame having {x, y, z} orthogonal axes may be used, but any arbitrary reference frame and orientation may be used. FIG. 80 shows a unit cell 100 of a diamond lattice having a "standard" orientation. In practice, the diamond lattice of the NV diamond material may be rotated relative to the standard orientation, but the rotation may be accounted for, for example, as discussed in U.S. application Ser. No. 15/003,718 entitled "APPARATUS AND METHOD FOR RECOVERY OF THREE DIMENSIONAL MAGNETIC FIELD FROM A MAGNETIC DETECTION SYSTEM", filed Jan. 21, 2016, the entire contents of which are incorporated herein. For simplicity, only the standard orientation will be discussed here. The axes of the diamond lattice will fall along four possible directions. Thus, the four axes in a standard orientation may be defined as unit vectors corresponding to:

$$a_{s,1} = \frac{1}{\sqrt{3}}[-1 \quad -1 \quad 1]^T$$

$$a_{s,2} = \frac{1}{\sqrt{3}}[-1 \quad 1 \quad -1]^T$$

$$a_{s,3} = \frac{1}{\sqrt{3}}[1 \quad -1 \quad -1]^T$$

$$a_{s,4} = \frac{1}{\sqrt{3}}[1 \quad 1 \quad 1]^T$$

For simplicity, the four vectors of the above equation may be represented by a single matrix $A_S$, which represents the standard orientation of the unit cell 8000:

$$A_s = [\,a_{s,1} \quad a_{s,2} \quad a_{s,3} \quad a_{s,4}\,] = \frac{1}{\sqrt{3}}\begin{bmatrix} -1 & -1 & 1 & 1 \\ -1 & 1 & -1 & 1 \\ 1 & -1 & -1 & 1 \end{bmatrix}$$

Assuming the response is linear with the magnetic field, the true magnetic field b may be expressed as a linear model on the four coordinate axes as:

$$A^T b + w = m$$

where: $b \in \mathbb{R}^{3\times1}$ is the true magnetic field vector in the NV diamond material excluding any field produced by a permanent magnet bias; $w \in \mathbb{R}^{4\times1}$ is a sensor noise vector; $m \in \mathbb{R}^{4\times1}$ is a vector where the $i^{th}$ element represents the magnetic field measurements along the $i^{th}$ axis; and $A^T b$ gives the projection of the true magnetic field vector onto each of the four axes and $A^T$ is the transpose of $A_S$. More generally, $A^T$ represents the orientation of the diamond lattice after an arbitrary orthonormal rotation and possible reflection of the axes matrix $A_S$.

The bias magnetic field serves to separate the Lorentzians response curves of the fluorescence measurement corresponding to the electron spin resonances associated with the different crystallographic axes of the diamond material. For two spin states $m_s = \pm 1$ for each crystallographic axis, there will be 8 Lorentzians, two Lorentzians corresponding to each crystallographic axis. The bias magnetic field may be calibrated to separate the Lorentzians corresponding to the different electron spin resonances as described in U.S. application Ser. No. 15/003,718 entitled "APPARATUS AND METHOD FOR RECOVERY OF THREE DIMENSIONAL MAGNETIC FIELD FROM A MAGNETIC DETECTION SYSTEM."

Further, for a given crystallographic axis and its corresponding two spin states, the magnitude of the projection of the magnetic field along the crystallographic axis can be determined, but the sign or direction of the projection will not be initially unknown. The sign due to the bias magnetic field for each crystallographic axis can also be recovered as described in U.S. application Ser. No. 15/003,718 entitled "APPARATUS AND METHOD FOR RECOVERY OF THREE DIMENSIONAL MAGNETIC FIELD FROM A MAGNETIC DETECTION SYSTEM."

The model from the prior equation can be expanded to include temperature drift as follows, where it is presumed that the measurements of the different electron spin resonances are taken simultaneously or at least quickly enough that the temperature drift between measurements is insignificant.

$$A^T b+c+w=m$$

where $$c \in \mathbb{R}^{4\times 1} = \begin{bmatrix} c \\ c \\ c \\ c \end{bmatrix}$$

is a constant vector representing a fixed, but unknown offset c on the measurements from all four axes due to temperature. This model is valid presuming the sign used during the sign recovery process, due to the bias magnetic field, is the same for all four electron spin resonances, used. Such uniformity in the per lattice sign recovery process ensures that the modeled scalar translations of each lattice due to thermal drift share the same sign and, thus, that the drift vector represents a constant vector rather than a vector whose elements have fixed magnitude but varying sign. For a true quad bias magnet configuration (e.g., an alignment in which the bias magnet projects onto the lattice vectors in a relative 7:5:3:1 ratio), potential sets of valid resonances, where the resonances are denoted as 1-8 starting from the left, would be {1, 4, 6, 7} or {2, 3, 5, 8}, for example. This is shown below.

FIG. 81A illustrates two fluorescence curves as a function of RF frequency for two different temperatures in the case the external magnetic field is aligned with the bias magnetic field. Each of the fluorescence curves has eight electron spin resonances, each electron spin resonance corresponding to one crystallographic axis and one spin state. Each of the resonances shifts in the same direction due to a temperature shift for those resonances where the sign used during the sign recovery process, due to the bias magnetic field, is the same. In this case, resonances in the set {1, 4, 6, 7} shift in the same direction based on temperature shift.

FIG. 81B illustrates two fluorescence curves as a function of RF frequency for two different magnetic fields based on a change in the bias magnetic field. In this case, the external magnetic field is aligned with the bias magnetic field and creates an equal shift in each lattice with comparable amplitude to the thermal shift in FIG. 81A. Each of the fluorescence curves has eight resonances, each resonance corresponding to one crystallographic axis and one spin state. As can be seen, the resonance shifts need not all shift in the same direction based on a magnetic field shift for the set of resonances {1, 4, 6, 7}.

FIG. 81C is similar to FIG. 81B but shows the resonances need not all shift in the same direction and with the same amplitude based on a magnetic field shift for the set of resonances {1, 4, 6, 7} in the case of a more general external field. In FIGS. 81A-81C, the results are based on a continuous wave measurement.

1 The magnetic field may now be determined using only a subset of all of the eight resonances, namely four of the eight resonances. Given the linear model for magnetic field measurement, a least-squares solution for the total magnetic field $\hat{b}$ acting on the system based on the four measurements (using sets {1, 4, 6, 7} or {2, 3, 5, 8}) in the absence of temperature drift may be provided as:

$$\begin{aligned}\hat{b} &= (A^T)^+ m \\ &= \frac{3}{4}Am \\ &= \frac{3}{4}A(A^T b + w) \\ &= b + \frac{3}{4}Aw \\ &= b + w'\end{aligned}$$

where w'=¾ Aw represents a scaled sensor noise vector, $A^T$ is the transpose of A, and the subscript+denotes the pseudoinverse. Applying this solution to the model with a temperature drift provides the equation below:

$$\begin{aligned}\hat{b} &= (A^T)^+ m \\ &= \frac{3}{4}Am \\ &= \frac{3}{4}A(A^T b + c + w) \\ &= b + \frac{3}{4}Ac + \frac{3}{4}Aw \\ &= b + \frac{3}{4}\frac{1}{\sqrt{3}}\begin{bmatrix} -1 & -1 & 1 & 1 \\ -1 & 1 & -1 & 1 \\ 1 & -1 & -1 & 1 \end{bmatrix} x + w' \\ &= b + \frac{3}{4}\frac{1}{\sqrt{3}}\begin{bmatrix} 0 \\ 0 \\ 0 \\ 0 \end{bmatrix} + w' \\ &= b + w'\end{aligned}$$

Thus, the temperature drift term c disappears from the least-squares solution and the solution is therefore insensitive to temperature drift. Moreover, only a subset of all of the resonances need be used to determine the three-dimensional magnetic field.

The thermal drift term c may be determined based on the estimated three-dimensional magnetic field $\hat{b}$ acting on the DNV material. In particular, an estimate of the offset c vector and, hence, the scalar constant of the thermal offset, c, which is the per element magnitude, can be obtained by projecting the estimated three-dimensional magnetic field $\hat{b}$ back onto the four lattice vectors and differencing this projection with the original magnetic field measurements m as follows in the below equation:

$$m - A^T\hat{b} = (A^Tb + c + w) - A^T(b + w') =$$
$$(A^Tb + c + w) - \left(A^Tb + A^T\frac{3}{4}Aw\right) = c + w - \frac{3}{4}A^TAw = c + w - w = c$$

Thus, the thermal offset due to temperature drift may be calculated based on the four-dimensional magnetic field measurements m and the estimated three-dimensional magnetic field $\hat{b}$, which is projected onto the crystallographic axes.

The present disclosure relates to systems and methods for estimating a full three-dimensional magnetic field from a magneto-optical defect center material, such as a NV center material. The systems and methods only require using the spectral position of four electron spin resonances to recover a full three-dimensional estimated magnetic field, in the case of NV diamond material. By using only a subset of the full eight electron spin resonances, a faster thermally-compensated vector sampling rate is possible.

Further the systems and methods described for determining the estimated three-dimensional magnetic field are insensitive to temperature drift. Thus, the temperature drift is inherently accounted for.

Still further, according to the systems and methods described, the thermal drift in the spectral position of the electron spin resonances used in the magnetic field estimation may be readily calculated based on the four-dimensional measured magnetic field lattice projections and the three-dimensional estimated magnetic field.

The thermal drift error compensation described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for calculation some or all of the thermal drift error computations according to a non-limiting embodiment of the present disclosure.

Pulsed RF Methods of Continuous Wave Measurement Implementation

In some implementations, the devices 300, 600A, 600B, 600C, 700, 2500, and/or 4200 can be implemented using pulsed RF methods for continuous wave (CW) measurements.

In pure CW excitation schemes, continuous RF and laser power set-ups are used to generate fluorescence in DNV systems, which are then measured to estimate magnetic field. Prior to this measurement, it is common to adjust RF excitation frequency and allow the DNV system to settle at a new steady state level of fluorescence.

In pure pulsed excitation schemes, laser/optical excitation is applied for an extended period of time with no RF excitation to polarize (i.e. reset) the quantum state of the ensemble DNV system. After the laser is turned off (for example, with an acousto-optic modulator (AOM) shutter or laser power controller), a series of RF excitation pulses are applied to the diamond for a predetermined duration and having predetermined power and frequency to optimize DNV sensitivity. Once the RF pulse sequence is completed, the laser/optical excitation is restarted and a fluorescence measurement is captured to estimate magnetic field. In practical implementation, the laser polarization pulse and laser/optical excitation pulse (which leads to fluorescence measurement) are combined as a single, longer duration pulse between RF pulse sequences. Common DNV Pulse techniques include Ramsey and Hahn Echo excitations.

The present disclosure describes a magnetic detection system having a laser operated in CW mode throughout and a pulsed RF excitation source operating only during fluorescence measurement periods. Pulsing the RF only during fluorescence measurement periods rather than maintaining a CW RF excitation source allows for RF-free laser time for faster quantum reset and thus, higher bandwidth measurements; higher RF peak power during bandwidth measurements to meet sensitivity objectives; and, an improved sensor C-SWAP by reducing RF duty cycle and supporting efficient implementation of a two-stage optical excitation scheme. Moreover, the RF pulsing methods disclosed herein also allow for shortening of the RF pulse width to optimize and balance the overall DNV system response.

Some embodiments of a pulsed RF excitation source are described with respect to a diamond material with NV centers, or other magneto-optical defect center material. The intensity of the RF field applied to the diamond material by the RF excitation source will depend on the power of the system circuit. Specifically, the power is proportional to the square of the intensity of the RF field applied. It is desirable to reduce the power of the system circuit while maintaining the RF field. By pulsing the RF excitation, the total RF energy required by the sensor system may be reduced, thus producing a more efficient sensor (having a lower power and thermal loading) while maintaining the high RF power during excitation and readout required for overall sensitivity.

Similar to traditional CW DNV techniques, a laser is operated in CW mode throughout. To obtain magnetometry measurements, an RF pulse at the relevant resonant frequency is applied to a diamond and the resulting fluorescence is measured by one or more photo detectors. By controlling the RF pulse and photo detector collection times, a short but sufficient time is provided to allow the RF pulse to interact with the relevant [NV−] electron spin state and affect the corresponding level of diamond fluorescence dimming. Upon completion of the photo detector collection interval, both the RF excitation source and photo detector are suppressed, and the laser begins repolarization of the [NV−] quantum states to set the diamond system for the next measurement. By suppressing the RF excitation source during repolarization, the normally competing RF/laser quantum drivers are simplified to allow only the laser repolarization, with a subsequent decrease in required time for full repolarization and, therefore, greater DNV CW magnetometry sample bandwidth.

FIG. 82 illustrates a magneto-optical defect center material excitation scheme operating in CW Sit mode using a CW laser functioning throughout and a pulsed RF excitation source operating at a single frequency having a pulse repetition period (i.e. pulse sequence) of approximately 110 μs. The CW Sit mode of collection at a fixed frequency (per diamond lattice and ±1 spin state resonance) does not preclude shifts between the different lattices, each of which would have a fixed RF excitation frequency.

As understood by those skilled in the art, a baseline CW Sweep was conducted prior to the CW Sit excitation scheme operation to select resonance frequencies and establish the relationship between fluorescence intensity and magnetic field for each diamond lattice and ±1 spin state. This relationship captures how a CW Sit excitation scheme-measured fluorescence intensity change for each lattice and spin state indicates a shift in the local baseline CW Sweep which, to first order, is proportional to a change in the external magnetic field.

In some embodiments, the pulse sequence includes a period of idle time followed by a period of time for an RF pulse. The idle time allows for repolarization of [NV−] electron spin states by light from the laser before the RF pulse. According to some embodiments, the period of time for the RF pulse is greater than the period of idle time. In some embodiments, the period of time for the RF pulse may vary between approximately 56 μs and 109 μs, or 60 μs and 105 μs, or 65 μs and 100 μs, or 70 μs and 95 μs, or 75 μs and 90 μs, or 80 μs and 85 μs. In some embodiments, the period of time for the RF pulse may be about 80 μs. In some embodiments, the period of idle time may vary between approximately 1 μs and 54 μs, or 5 μs and 50 μs, or 10 μs and 45 μs, or 15 μs and 40 μs, or 20 μs and 35 μs, or 25 μs and 30 μs. In some embodiments, the period of idle time may be about 30 μs.

In some embodiments, the period of idle time includes an optional period of time for reference collection with the RF pulse off. In other words, a reference fluorescence may be measured prior to applying the RF pulse to the diamond at the relevant resonant frequency. The reference collection measures the baseline intensity of fluorescence prior to RF excitation such that the net additional dimming due to the RF may be estimated by comparison with this reference (i.e. subtraction of the baseline fluorescence). For collections across multiple diamond lattices in which the fluorescence “dimming” from the previous RF excitation may not have fully repolarized, the reference collection allows measurement of the additional dimming caused by excitation of the new set of [NV] along the next diamond lattice. In some embodiments, the period of time for reference collection may vary between 1 μs and 20 μs. In some embodiments, the period of time for reference collection may be about 5 μs. In some embodiments, the period of time for reference collection may vary proportionally with the period of idle time (i.e. longer periods of idle time having longer periods of time for reference collection).

In some embodiments, the period of time for the RF pulse includes a period of settling time followed by a period of time for fluorescence measurement (i.e. collection time). During collection time, both the CW laser and the RF pulse are “on” and the fluorescence is detected by the photo detectors. This period of time for fluorescence measurement may vary between 56 μs and 95 μs, or 60 μs and 90 μs, or 65 μs and 85 μs, or 70 μs and 80 μs. In some embodiments, the period of time for fluorescence measurement may be about 60 μs.

FIG. 83 illustrates a magneto-optical defect center material excitation scheme operating in CW Sweep mode using a CW laser functioning throughout and a pulsed RF excitation source swept at different frequencies having a pulse repetition period of approximately 1100 μs. In some embodiments, the pulse sequence includes a period of idle time followed by a period of time for an RF pulse. According to some embodiments, the period of idle time is greater than the period of time for the RF pulse. In some embodiments, the period of time for the RF pulse may vary between approximately 1 μs and 549 μs, or 25 μs and 525 μs, or 50 μs and 500 μs, or 75 μs and 475 μs, or 100 μs and 450 μs, or 125 μs and 425 μs, or 150 μs and 400 μs, or 175 μs and 375 μs, or 200 μs and 350 μs, or 225 μs and 325 μs, or 250 μs and 300 μs. In some embodiments, the period of time for the RF pulse may be about 100 μs. In some embodiments, the period of idle time may vary between approximately 551 μs and 1099 μs, or 575 μs and 1075 μs, or 600 μs and 1050 μs, or 625 μs and 1025 μs, or 650 μs and 1000 μs, or 675 μs and 975 μs, or 700 μs and 950 μs, or 725 μs and 925 μs, or 750 μs and 900 μs, or 775 μs and 875 μs, or 800 μs and 850 μs. In some embodiments, the period of idle time may be about 1000 μs.

In some embodiments, the period of idle time includes an optional period of time for reference collection with the RF pulse off. In some embodiments, this period of time for reference collection may vary between 1 μs and 20 μs. In some embodiments, the period of time for reference collection may be about 5 μs. In some embodiments, the period of time for reference collection may vary proportionally with the period of idle time (i.e. longer periods of idle time having longer periods of time for reference collection). In some embodiments, the period of time for the RF pulse includes a period of settling time followed by a period of time for fluorescence measurement (i.e. collection time). This period of time for fluorescence measurement may vary between 56 μs and 95 μs, or 60 μs and 90 μs, or 65 μs and 85 μs, or 70 μs and 80 μs. In some embodiments, the period of time for fluorescence measurement may be about 60 μs.

The pulsed RF method, together with CW laser excitation, provides improved sample bandwidth over traditional CW DNV excitation while maintaining the sensitivity of the traditional methods. The reduction in RF duty cycle requires less power and creates less thermal drive on the diamond sensor. This reduction in duty cycle offers greater flexibility for practical sensor design trades. The pulsed CW method allows for increasing bandwidth without increasing both the RF and laser power. In combination with reduced power usage, these trade spaces support an improved overall sensor C-SWAP. This improved C-SWAP increases implementation of efficient DNV magnetometry sensors. The proposed solution is also compatible with high power-low duty cycle laser repolarization techniques to support faster sampling and increased sample bandwidth for vector magnetometry and/or thermally compensated multi-lattice excitation techniques.

The pulsed RF method described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor.

High Speed Sequential Cancellation for Pulsed Mode Implementation

In some implementations, the devices 300, 600A, 600B, 600C, 700, 2500, and/or 4200 can be implemented using a high speed sequential cancellation for increasing bandwidth of the devices.

Following below are more detailed descriptions of various concepts related to, and implementations of, methods, apparatuses, and systems for high bandwidth acquisition of magnetometer data with increased sensitivity. Some embodiments increase bandwidth and sensitivity of the magnetometer by eliminating the need for a reference signal that requires full repolarization of the magneto-optical defect center material prior to acquisition. Eliminating the reference signal eliminates the time needed to repolarize the magneto-optical defect center material and the acquisition time for the reference signal. An optional ground reference, a fixed "system rail" photo measurement, and/or additional signal processing may be utilized to adjust for variations in intensity levels.

FIG. 84 depicts a graph 8400 of a magnetometer system using a reference signal 8410 acquisition prior to RF pulse excitation sequence 8420 and measured signal 8430 acquisition. A contrast measurement between the measured signal 8430 and the reference signal 8410 for a given pulsed sequence is then computed as a difference between a processed read-out fluorescence level from the measured signal acquisition 8430 and a processed reference fluorescence measurement from the reference signal 8410. The processing of the measured signal 8430 and/or the reference signal 8410 may involve computation of the mean fluorescence over each of the given intervals. The reference signal 8410 is to compensate for potential fluctuations in the optical excitation power level, which can cause a proportional fluctuation in the measurement and readout fluorescence measurements. Thus, in some implementations the magnetometer includes a full repolarization between measurements with a reference fluorescence intensity (e.g., the reference signal 8410) captured prior to RF excitation (e.g., RF pulse excitation sequence 8420) and the subsequent magnetic b field measurement data 8430. This approach may reduce sensor bandwidth and increase measurement noise by requiring two intensity estimates per magnetic b field measurement. For a DNV magnetometer, this means that it needs full repolarization of the ensemble diamond [NV] states between measurements. In some instances, the bandwidth considerations provide a high laser power density trade space in sensor design, which can impact available integration time and achievable sensitivity.

FIG. 85 depicts a graph 8500 of a magnetometer system omitting a reference signal acquisition prior to RF pulse excitation sequence 8520 and measured signal 8530 acquisition. The RF pulse excitation sequence 8520 may correspond to periods 1-3 of FIG. 5 and the measured signal acquisition 8530 may correspond to period 4 of FIG. 5. The graph 8500 depicts the amplitude of optical light emitted from a magneto-optical defect center material as measured by an optical detector 340, such as a photodiode, over time. The system processes the post RF sequence read-out measurement from the measured signal 8530 directly to obtain magnetometry measurements. The processing of the measured signal 8530 may involve computation of the mean fluorescence over each of the given intervals. In some implementations, a fixed "system rail" photo measurement is obtained and used as a nominal reference to compensate for any overall system shifts in intensity offset. In some implementations, an optional ground reference signal 8510 may be obtained during the RF pulse excitation sequence 8520, such as during period 2 of FIG. 5, to be used as an offset reference. Some embodiments provide faster acquisition times, reduced or eliminated noise from the reference signal, and increased potential detune intensity peak to peak contrast.

FIG. 86 is a graphical diagram of an intensity of a measured signal 8610 from an optical detector 340 relative to an intensity of a reference signal 8620 from the optical detector 340 over a range of detune frequencies. When using a reference signal 8620, the reference signal 8620 will contain signal information from a prior RF pulse for a finite period of time. This prior signal information in the reference signal 8620 reduces available detune peak to peak intensity range and slope for a detune point for positive slope 8630 and a detune point for negative slope 8640. That is, as shown in FIG. 86, the reference signal 8620 is curved in a similar manner to the measured signal 8610. Accordingly, when a reference signal 8620 value is subtracted from a corresponding measured signal 8610 at a corresponding detune frequency, the net magnetometry curve peak to peak intensity contrast is reduced. The reason that the reference signal 8610 curve contains information from the measured signal 8610 curve is due to insufficient (laser only) polarization time for a given sensor configuration. The prior RF pulse defines the state of the measurement and, if not enough time passes between measurements, then the reference signal 8620 will contain some of the "hold" data from the prior RF "sample." This will subtract from the current measured signal 8610, thereby resulting in less signal overall as seen in FIG. 86. Thus, to remove the prior signal information, the system would need to wait until the prior signal information is eliminated from the reference signal or operate without the reference signal, such as described herein. Prior signal information from a prior measured signal 8610 (RF pulse) is cleared out via excitation from a green laser source and waiting for a period of time. This decay is exponential and tied to the power density applied from laser. However, waiting for a period of time for the prior signal information to be eliminated can decrease available bandwidth.

FIG. 87 is a diagram depicting slope relative to laser polarization pulse width for a system implementing a reference signal and a system omitting the reference signal. A first slope line 8710 corresponds to a system utilizing a reference signal while a second slope line 8720 corresponds to a system without utilizing a reference signal. As shown, the second slope line 8720 has a higher slope at equivalent laser pulse widths (in microseconds) compared to the first slope line 8710 that uses a reference signal. Longer polarization pulse widths can allow for a more complete repolarization of the a magneto-optical defect center material quantum state to reduce the residual impact of previous RF excitations. In effect, this more complete polarization can allow "less dimmed" fluorescence levels to be measured more accurately rather than exhibiting residual dimming due to an earlier RF excitation that retains some NV spin +1/−1 excited states. The wider measurement range can increase the peak to peak intensity range and, therefore, optimal slope. While both unreferenced first slope line 8710 and the referenced second slope line 8720 indicate a drop off in slope with shorter polarization pulse widths, the referenced second slope line 8720 decreases more quickly than the unreferenced first slope line 8710 due to the incomplete polarization of the reference, such as the reference signal 8620 of FIG. 86, that is further subtracted from the measured signal, such as measured signal 8610 of FIG. 86. As shown, the second slope line 8720 has a slower roll-off (e.g., reduction) of slope at shorter laser pulse widths than the first slope line 8710. That is, the laser pulse widths can be reduced without a significant decrease in optimal slope values. The second slope line 8720 can achieve a smaller laser pulse width of approximately 60-70 microseconds with minimal loss in slope compared to the first slope line 8710 that reduces slope by a factor of two when the laser pulse width is reduced by a factor of four. Thus, by eliminating the need for the reference signal, the second slope line 8720 demonstrates that the system can achieve an increase in sample rate by a factor of four with minimal impact on the slope point.

FIG. 88 depicts a comparison of a sensitivity of a system relative to a laser polarization pulse length for a system implementing a reference signal and a system omitting the reference signal. In the diagram shown, a first sensitivity line 8810 for the system implementing the reference signal has a lower sensitivity achievable at 10 nanoTeslas per root Hertz for a polarization pulse length of 150 microseconds. Thus, the system is limited in sampling rate based on a polarization pulse length of 150 microseconds as lower polarization pulse lengths reduce the sensitivity achievable to higher values. In comparison, a second sensitivity line 8820 for the system without the reference signal continues to increase the achievable lower sensitivity for lower polarization pulse lengths below 150 microseconds. Thus, by eliminating the reference signal, the sensitivity of the system can be improved for shorter polarization pulse lengths.

FIG. 89 depicts some implementations of a process 8900 of operating a magnetometer that utilizes a magneto-optical defect center material, such as a diamond having nitrogen vacancies. The process 8900 includes activating an RF pulse sequence (block 8902). The RF pulse sequence is done without acquiring a reference measurement, thereby reducing measurement noise and increasing sample bandwidth by eliminating noise introduced by the reference measurement and decreasing the time between measurement acquisitions. In some implementations, a nominal ground reference measurement (block 8904) may be acquired as a simple offset relative to the ground state. The process 8900 further includes acquiring b field measurement data (block 8906). The acquisition of b field measurement data may be acquired at a faster sample rate as full repolarization of the magneto-optical defect center material is eliminated between measurements. In some implementations, the acquired b field measurement data may be processed to determine a vector of a measured b field. By removing the reference signal, a sensor can increase AC sensitivity and bandwidth.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor.

Photodetector Circuit Saturation Mitigation Implementation

In some implementations, the devices 300, 600A, 600B, 600C, 700, 2500, and/or 4200 can be implemented using a photodetector circuit saturation mitigation component.

Some embodiments disclosed herein relate to a system including a magneto-optical defect center material, a first optical excitation source configured to provide a first optical excitation to the magneto-optical defect center material, a second optical excitation source configured to provide a second optical excitation to the magneto-optical defect center material, and an optical detection circuit. The optical detection circuit which includes a photocomponent, (e.g., a photodetector) may be configured to activate a switch between a disengaged state and an engaged state, receive, via the second optical excitation source, a light signal including a high intensity signal provided by the second optical excitation source, and cause at least one of the photocomponent or the optical detection circuit to operate in a non-saturated state responsive to the activation of the switch. The second optical excitation source rapidly illuminates the magneto-optical defect center material with light to re-polarize the magneto-optical defect center material without loss of sensitivity.

With reference to FIG. 90, some embodiments of a circuit saturation mitigation system 9000 is illustrated. The circuit saturation mitigation system 9000 uses fluorescence intensity to distinguish the $m_s=\pm1$ states, and to measure the magnetic field based on the energy difference between the $m_s=+1$ state and the $m_s=-1$ state, as manifested by the RF frequencies corresponding to each state. In these embodiments, the circuit saturation mitigation system 9000 includes a first optical excitation source 9010, second optical excitation source 9015, a magneto-optical defect center material 9005, a RF excitation source 9020, and an optical detection circuit 9040. The first and second optical excitation sources 9010, 9015 direct or otherwise provide optical excitation to the magneto-optical defect center material 9005. The RF excitation source 9020 provides RF radiation to the magneto-optical defect center material 9005. Light from the magneto-optical defect center material (e.g., diamonds, Silicon Carbide (SiC), etc.) may be directed through an optical filter (not shown) to the optical detection circuit 9040.

In general, the circuit saturation mitigation system may instead employ different magneto-optical defect center materials, with a plurality of magneto-optical defect centers. Magneto-optical defect center materials include, but are not limited to, diamonds, Silicon Carbide (SiC) and other materials with nitrogen, boron, or other defect centers. The electronic spin state energies of the magneto-optical defect centers shift with magnetic field, and the optical response, such as fluorescence, for the different spin states may not be the same for all of the different spin states. In this way, the magnetic field may be determined based on optical excitation, and possibly RF excitation, in a corresponding way to that described above with magneto-optical defect center material.

In some embodiments, the RF excitation source 9020 may take the form of a microwave coil. The RF excitation source 9020, when emitting RF radiation with a photon energy resonant with the transition energy between ground $m_s=0$ spin state and the $m_s=+1$ spin state, excites a transition between those spin states. For such a resonance, the spin state cycles between ground $m_s=0$ spin state and the $m_s=+1$ spin state, reducing the population in the $m_s=0$ spin state and reducing the overall fluorescence at resonances. Similarly, resonance and a subsequent decrease in fluorescence intensity occurs between the $m_s=0$ spin state and the $m_s=-1$ spin state of the ground state when the photon energy of the RF radiation emitted by the RF excitation source may be the difference in energies of the $m_s=0$ spin state and the $m_s=-1$ spin state.

The first and second optical excitation sources 9010, 9015 may take the form of a laser (e.g., a high power laser, low power laser, etc.), light emitting diode, etc. for example, which emits light in the green (e.g., a light signal having a wavelength W1 such that the color is green). In turn, the first and second optical excitation sources 9010, 9015 induces fluorescence in the red (e.g., the wavelength W2), which corresponds to an electronic transition from the excited state to the ground state. Light from the magneto-optical defect center material 9005 may be directed through an optical filter to filter out light in the excitation band (e.g., in the green), and to pass light in the red fluorescence band, which in turn may be detected by the optical detection circuit 9040. The first and second optical excitation light sources 9010, 9015 in addition to exciting fluorescence in the magneto-optical defect center material 9005 also serve to reset or otherwise re-polarize the population of the $m_s=0$ spin state of the ground state $^3A2$ to a maximum polarization, or other desired polarization.

As illustrated in FIGS. 90 and 91, the circuit saturation mitigation system 9000 further includes the optical detection circuit 9040. The optical detection circuit 9040 includes a photocomponent 9120 (as shown in FIG. 91) such as, but not limited to, a photodetector, photodiode, photosensor, or other device configured to receive a light signal and convert the light signal received into voltage or current. The optical detection circuit 9040 may be configured to receive, via the photocomponent 9120, a first optical excitation provided by the first optical excitation source 9010 (e.g., a low power laser). The first optical excitation source 9010 may provide the first optical excitation to the magneto-optical defect center material 9005. The first optical excitation may include a light signal configured to provide a continuous optical illumination (e.g., a low intensity light signal 9310 as illustrated in FIG. 93A) of the magneto-optical defect center material 9005. For example, the low power laser may continuously illuminate the magneto-optical defect center material 9005 for a period of time. Accordingly, the photocomponent 9120, in turn, receives the first optical excitation (e.g., a light signal that provides the continuous optical illumination) provided by the first optical excitation source 9010 over the period of time. Alternatively or additionally, the photocomponent 9120 receives the induced fluorescence provided by the magneto-optical defect center material 9005.

The optical detection circuit 9040 may be configured to receive, via the photocomponent 9120, a light signal provided via the second optical excitation source 9015 (e.g., a high power laser). In some embodiments, the second optical excitation source 9015 may provide a light signal configured to operate according to or otherwise provide a pulsed optical illumination 9320 (as illustrated in FIG. 93B) to the magneto-optical defect center material 9005. For example, the high power laser may provide a high intensity pulsed illumination to the magneto-optical defect center material 9005 for a predetermined period of time (e.g., a predetermined period of time that may be less than the period of time during which the first optical detection circuit illuminates the magneto-optical defect center material). In turn, the photocomponent 9120 receives the second optical excitation (e.g., via a light signal that provides the high intensity pulsed illumination) provided by the second optical excitation source 9015 during the predetermined period of time. The photocomponent 9120 converts the light signal received into current (A) or voltage (V).

The optical detection circuit 9040 includes a switch 9110. The switch 9110 may be disposed in the feedback path to control the output voltage, transimpedance gain, and/or the flow of current, to reduce distortion, etc., of the optical detection circuit 9040 and/or the photocomponent 9120. In some examples, the switch 9110 may take the form of a speed switch, relay, proximity switch, or any other switch configured to detect or otherwise sense optical or magnetic motion. The switch 9110 (e.g., a high speed relay) reduces the load (e.g., the amount of electrical power utilized or consumed) corresponding to the photocomponent 9120 (e.g., a photodetector). The switch 9110 includes electronic circuits configured to move between an engaged state (e.g., a state during which the switch may be turned on or may be otherwise closed) and a disengaged state (e.g., a state during which the switch may be turned off or may be otherwise open).

The switch 9110 may activate or otherwise move between the engaged state and disengaged state responsive to a light signal (e.g., a high intensity light signal) or magnetic field sensed. In some embodiments, the switch 9110 may activate in response to a command generated via at least one of a controller (e.g., the controller 9250 shown in FIG. 92 as described herein below) or an on-board diagnostics system (OBDS). In the engaged state, the flow of current or voltage may be uninterrupted, while the flow of current or voltage may be interrupted in the disengaged state. For example, in response to the command generated via the controller, the switch 9110 moves from the disengaged state (e.g., the flow of current or voltage may be interrupted) to the engaged state (e.g., the flow of current or voltage may be uninterrupted) and, thereby, turns on or may be otherwise closed.

Alternatively or additionally, the switch 9110 may be disengaged or otherwise deactivated via at least one of the controller (e.g., the controller 9250 shown in FIG. 92 as described herein below) or the on-board diagnostics system. For example, in response to the command generated via the controller, the switch 9110 moves from the engaged state (e.g., the flow of current or voltage may be uninterrupted) to the disengaged state (e.g., the flow of current or voltage may be interrupted) and, thereby, turns off or may be otherwise opened.

Advantageously, including the switch 9110 in the feedback path prevents the optical detection circuit 9040 and/or the photocomponent 9120 from experiencing a delay when returning to the level of voltage output prior to the application of the second optical excitation source 9015 (e.g., the high power laser) since the optical detection circuit 9040 and/or the photocomponent 9120 are in a non-saturated state as described with reference to FIG. 93C. In turn, the repolarization time and/or the reset time corresponding to the magneto-optical defect center material 9005 may be reduced resulting in the operability of the photocomponent 9120 and/or the optical detection circuit 9040 at a higher bandwidth without signal attenuation. As shown in FIG. 93D, a delay occurs when the photocomponent 9120 and/or the optical detection circuit 9040 begins to return to the level of voltage output prior to the application of the second optical excitation source 9015 when the photocomponent 9120 and/or the optical detection circuit 9040 may be saturated.

The optical detection circuit 9040 further includes an amplifier 9130 configured to amplify the voltage provided by the photocomponent 9120. The amplifier may take the form of an operational amplifier, fully differential amplifier, negative feedback amplifier, instrumentation amplifier, isolation amplifier, or other amplifier. In some embodiments, the photocomponent 9120, switch 9110, resistor 9140, or a combination thereof may be coupled to the inverting input terminal (−) of the amplifier 9130 (e.g., an operational amplifier). Alternatively or additionally, the switch 9110 and the resister 9140 may be coupled to the output voltage ($V_{out}$) of the amplifier 9130 as illustrated.

In further embodiments, the optical detection circuit 9040 may be configured to cause, via the switch 9110, at least one of the photocomponent 9120 or the optical detection circuit 9040 to operate in a non-saturated state responsive to the activation of the switch 9110. Accordingly, the amplifier 9130 receives the current or voltage provided via the photocomponent 9120. In FIG. 91 the switch 9110 may be parallel to the resistor 9140 such that in the engaged state (e.g., when the switch is closed or otherwise turned on) the switch 9110 shorts out the resistor 9140 which shutters or otherwise limits the output resistance in the transimpedance gain (e.g., the degree to which the current output via the photodetector translates to $V_{out}$) such that the resistance of the switch may be at or near 0Ω. To that end, the gain of the amplifier 9130 (e.g., the operational amplifier) expresses a gain at or near 0 which causes the output voltage $V_{out}$ to be at or near 0V for the current (e.g., a variable amount of input current) or voltage received or otherwise provided by the photocomponent 9120 (e.g., the photodetector). Accordingly, the optical detection circuit 9040 operates in a non-saturated state due to the gain of the amplifier 9130 (e.g., the operational amplifier) expressing a gain at or near 0. In further embodiments, the optical detection circuit 9040 may be configured such that the output voltage $V_{out}$ may be equal to the input voltage received via the amplifier 9130. The output voltage may be within a predetermined output range such as between a minimum voltage level and a maximum voltage level. The minimum voltage level and the maximum voltage level may be based on the voltage rails of the amplifier 9130 (e.g., the operational amplifier, transimpedance/gain circuit, etc). For example, if the amplifier 9130 has voltage rails of +10V and −10V, the output of the amplifier 9130 may not exceed +10V or go below −10V. Accordingly, the switch 9110 may be configured to keep the measured levels within the predetermined output range. Although the above example is directed to the predetermined output range of +10V and −10V, the predetermined output range may be +−15V, +−5V, +−3.3V, etc. Advantageously though the resister 9140 which establishes the transimpedance gain associated with the amplifier 9130 may be included in the feedback path of the optical detection circuit 9040, the optical detection circuit 9040 (e.g., the amplifier 9130) operates in the non-saturated state.

Alternatively or additionally, the switch 9110 may be further configured to reduce a load (e.g., the load impedance) corresponding to the photocomponent 9120. For example, in the engaged state the switch 9110 causes the load impedance of the photocomponent 9120 to decrease (e.g., to equal a value at or near 0 ohms (Ω)) such that the photocomponent 9120 can operate in a non-saturated state. The load (e.g., the load impedance) corresponding to the photocomponent 9120 may express a direct relationship with the state of saturation (e.g., saturated state or non-saturated state) of the optical detection circuit 9040 and/or the photocomponent 9120 in that the higher the load impedance, the greater the amount of saturation of the optical detection circuit 9040 and/or the photocomponent 9120. Advantageously, while in the non-saturated state which results from the reduction of the load impedance, the photocomponent 9120 can receive an increased amount of light at higher intensities. In further embodiments, a direct relationship may be expressed between the amount of saturation and the repolarization time (e.g., the reset time) of the magneto-optical defect center material 9005. For example, when the saturation of the photocomponent 9120 and/or the optical detection circuit 9040 may be reduced, the repolarization time may be reduced such that the magneto-optical defect center material 9005 may be reset quickly at higher light intensities.

FIG. 92 is a schematic diagram of a system 9200 for a circuit saturation mitigation system according to some embodiments. The system 9200 includes first and second optical light sources 9010, which direct optical light to a magneto-optical defect center material 9005. An RF excitation source 9020 provides RF radiation to the magneto-optical defect center material 9005. The system 9200 may include a magnetic field generator 9270 that generates a magnetic field, which may be detected at the magneto-optical defect center material 9005, or the magnetic field generator 9270 may be external to the system 9200. The magnetic field generator 9270 may provide a biasing magnetic field.

The system 9200 further includes a controller 9250 arranged to receive a light detection signal from the optical detection circuit 9040 and to control the optical light sources 9010, 9015, the RF excitation source 9020, the switch 9110, and the magnetic field generator 9270. The controller may be a single controller, or multiple controllers. For a controller including multiple controllers, each of the controllers may perform different functions, such as controlling different components of the system 9200. The magnetic field generator 9270 may be controlled by the controller 9250 via an amplifier.

The RF excitation source 9020 may include a microwave coil or coils, for example. The RF excitation source 9020 may be controlled to emit RF radiation with a photon energy resonant with the transition energy between the ground $m_s=0$ spin state and the $m_s=\pm1$ spin states as discussed above with respect to FIG. 90, or to emit RF radiation at other nonresonant photon energies.

The controller 9250 may be arranged to receive a light detection signal via the optical detection circuit 9040, activate the switch 9110 based on the light detection signal received, and to control the optical light sources 9010, 9015, the RF excitation source 9020, the switch 9110, and the magnetic field generator 9270. The controller 9250 may include a processor 9252 and memory 9254, in order to control the operation of the optical light sources 9010, 9015, the RF excitation source 9020, the switch 9110, and the magnetic field generator 9270. The memory 9254, which may include a non-transitory computer readable medium, may store instructions to allow the operation of the optical light sources 9010, 9015, the RF excitation source 9020, the switch 9110, and the magnetic field generator 9270 to be controlled. That is, the controller 9250 may be programmed or otherwise operable via programmable instructions to provide control.

FIGS. 93C and 93D illustrate the output of voltage V of the photocomponent (e.g., the photodetector). Initially the controller generates a command to activate the switch to operate in the engaged state (e.g., turns the switch on). The controller then generates a command to activate or otherwise apply the second optical light source to the magneto-optical defect center material. Responsive to the receipt of the light signal (e.g., the high power light signal) by the photocomponent, the output of voltage by the photocomponent may be rapidly (e.g., without delay) decreased to 0V at time $t_0$ due to the reduction of the load impedance and the non-saturated state of the photocomponent as described herein with reference to FIGS. 90 and 91. In some embodiments, the increase in the bandwidth achieved as result of the decrease in the delay to return to the previous output voltage may be at least twice (2×) the bandwidth achieved without the decrease in the delay to return to the previous output voltage. A high intensity signal at a short or otherwise minimal duration may cause the photocomponent to become saturated. The saturation time is independent of the sample rate such that the bandwidth increase may be significant. In example embodiments wherein the pulse rate is 100 μs (microsecond), the cycle of time pulsed may demonstrate or otherwise express a 10% improvement. If the pulse rate is 10 μs, the cycle of time pulsed may demonstrate or otherwise express an improvement that is at least twice (2×) the cycle of time pulsed without the decrease in the delay.

When the second optical light source is no longer applied or the high intensity pulse is otherwise off, the voltage output V of the photocomponent rapidly (e.g., without delay) returns at time $t_0$ to the level of voltage output V prior to the application of the second optical excitation source as a result of the photocomponent in the non-saturated state (e.g., there may be no saturation to recover from which results in no delay). In turn, the repolarization time corresponding to the magneto-optical defect center material may be reduced such that the magneto-optical defect center material resets to a maximum polarization between the excited triplet state and the ground state rapidly. Additionally, the photocomponent operates at a higher bandwidth without signal attenuation.

With reference to FIG. 93D, initially the controller does not generate a command to activate the switch to operate in the engaged state (e.g., the switch remains turned off or is not included in the optical detection circuit). When the controller generates a command to activate or otherwise apply the second optical light source to the magneto-optical defect center material, the photocomponent receives the light signal (e.g., the high power light signal). The output of voltage V provided by the photocomponent increases at time $t_0$ due to the increase of the load impedance such that the photocomponent moves to a saturated state. Alternatively or additionally, the output voltage ($V_{out}$ as shown in FIG. 91) of the amplifier approaches or otherwise reaches (e.g., hits) the rail of the amplifier (e.g., saturates the amplifier) which distorts the output voltage $V_{out}$. When the second optical light source is no longer applied or the high intensity pulse is otherwise turned off, a delay occurs at time $t_1$ when the photocomponent begins to return to the level of voltage output V prior to the application of the second optical excitation source due to the saturated state of the photocomponent and/or the amplifier. In turn, the repolarization time corresponding to the magneto-optical defect center material may be increased as shown at $t_1+t_s$ such that the magneto-optical defect center material may be inhibited from resetting between the excited triplet state and the ground state rapidly.

FIGS. 94-95 illustrate the voltage output of the optical detection circuit as a function of time based on a continuous optical illumination of the magneto-optical defect center material during a time interval which includes application of the second optical excitation source (here depicted as waveform Si along the trace 9410). In FIG. 94, the x-axis indicates time where each block equals 200 ns and the y-axis indicates voltage taken at $V_{out}$ where each block equals 200 mV. Initially, the magneto-optical defect center material has been reset to the ground state. The cycle of time (e.g., a value of delay) at which the switch may be turned on and turned off is illustrated in FIG. 94. As shown, when the second optical excitation source (e.g., the high power laser) is applied at a value of delay set to, for example, 0 s (e.g., 0 cycle switch on delay and 0 cycle switch off delay) and 20 ns (e.g., 1 cycle switch on delay and 0 cycle switch off delay), the increased voltage output 9420 results. The voltage output 9420 which may be indicative of high power laser data (e.g., information relating to the high power laser) in the measured signal may be beyond a predetermined output range (e.g., between a minimum voltage level and a maximum voltage level). For example, the voltage output 9420 spikes, rapidly increases, or otherwise increases beyond the predetermined output range. The voltage output may be beyond the predetermined output range as a result of the propagation delay in the switch and the use of the second optical light source (e.g., the high power signal) which increases the transimpedance gain as described above with reference to FIGS. 90 and 91. The increase in the transimpedance gain results in saturation of the optical detection circuit (e.g., the amplifier) before the switch can affect (e.g., reduce) the transimpedance gain. The optical detector circuit is thereby saturated and not sensitive during the period of time illustrated at 9420. This is further illustrated in FIG. 93D which shows the conventional behavior of the output voltage without the use of the example embodiments described herein. For example, when the second optical light source (e.g., the high power light signal) is applied, the output of voltage V provided by the photocomponent increases between time $t_0$ and $t_1$ due to the increase of the load impedance such that the photocomponent moves to a saturated state and the voltage output 9420 spikes or rapidly increases. In turn, when the second optical light source is no longer applied between time $t_1$ and $t_1+t_s$, a delay in the repolarization (e.g., a delay in the reset time) of the magneto-optical defect center material occurs as the photocomponent returns to the level of voltage output V prior to the application of the second optical excitation source. The delay in the repolarization of the magneto-optical defect center material occurs responsive to the saturated state of the photocomponent and/or the amplifier.

In FIG. 95, the delay in the cycle of time at which the second optical excitation source is turned on may be set to 10 cycles. In this example, a continuous optical illumination of the magneto-optical defect center material is applied during the time interval which includes application of the second optical excitation source. When the switch is turned on, the switch shorts the resistor which results in a rapid decrease in the voltage output 9510. The resulting voltage output 9510 of waveform Si may be at or near 0 V during application of the second optical excitation source (e.g., when the switch is engaged or may be otherwise closed) due to the delay in the cycle of time which may be set to, for example, 10 cycles in FIG. 95. As shown, the optical detector circuit is not saturated during the period of time illustrated at 9510 and the time between $t_0$ and $t_1$ illustrated in FIG. 93C such that the resulting voltage output 9510 no longer expresses a spike or increase beyond the predetermined output range in contrast to the voltage output 9420 of FIG. 94. Advantageously, the repolarization time of the magneto-optical defect center material may be reduced and the photocomponent and/or the optical detection circuit may operate at a higher bandwidth without signal attenuation.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor.

Shifted Magnetometry Adapted Cancellation for Pulse Sequence Implementation

In some implementations, the devices 300, 600A, 600B, 600C, 700, 2500, and/or 4200 can be implemented using a shifted magnetometry adapted cancellation for a pulse sequence.

In some embodiments, the system utilizes a special Ramsey pulse sequence pair or a 'shifted magnetometry adapted cancellation' (SMAC) pair to detect and measure the magnetic field acting on the system. These parameters include the resonant Rabi frequency, the free precession time (tau), the RF pulse width, and the detuning frequency, all of which help improve the sensitivity of the measurement. For a SMAC pair measurement, two different values of tau are used as well as two different values of the pulse width for each measurement of the pair. This is in contrast to Ramsey excitation measurement where a single pulse sequence is repeated in which there may be repolarization of the system, double RF pulses separated by a gap for the free precession time, a start of the optical excitation and a readout during the optical excitation. In a SMAC excitation, there is a second set of RF pulses having a pulse width and tau values which may be different from the pulse width and tau of the first set.

The first set of RF pulses is done with the first set of values, there is repolarization of the system, and then the second set of values is used to create an inverted curve. The SMAC pair estimate is a combination of the magnetometry curves of the two pulse sequences with different values. In some embodiments, the combination is the difference between the two curves. This creates a magnetometry curve with an improved slope and therefore improved performance.

In some embodiments, using the SMAC technique or SMAC pair measurements to perform a differential measurement technique, low-frequency noise such as vibrations, laser drift, low-frequency noise in the receiver circuits, and residual signals from previous measurements (e.g., from previous measurements on other lattice vectors) get canceled out through the differential measurement technique. In some embodiments, this noise reduction may provide a sensitivity increase at lower frequencies where colored noise may be the strongest. In some embodiments, the low-frequency noise cancellation may be due to slowly varying noise in the time domain appearing almost identically in the two sequential sets of Ramsey measurements in the SMAC pair measurement. In some embodiments, inverting the second Ramsey set and subtracting the measurement from the first Ramsey set may largely cancel out any noise that is added post-inversion. Inverting the second Ramsey set and then subtracting its measurement off from the first may therefore largely cancel out any noise that is added post-inversion. In some embodiments, the low frequency noise cancellation may be understood by viewing the SMAC technique as a digital modulation technique, whereby, in the frequency domain, the magnetic signals of interest are modulated up to a carrier frequency of half the sampling rate (inverting every second set of Ramsey measurements is equivalent to multiplying the signal by $e^{i\pi n}$ where n is the sample (i.e., Ramsey pulse number). In some embodiments, this may shift the magnetic signals of interest to a higher frequency band that is separated from the low-frequency colored noise region. Then, a high-pass filter may be applied to the signal to remove the noise, and finally, the signal may be shifted back to baseband. In some embodiments, performing a differential measurement may be equivalent to a two-tap high-pass filter, followed by a 2× down-sampling. In some embodiments, higher-order filters may be used to provide more out-of-band noise rejection to leave more bandwidth for the signal of interest.

In some embodiments, when interrogating a single lattice vector via RF and laser excitation, the sidelobe responses from nearby lattice vectors will be present. The signals from these sidelobes may cause inter-lattice vector interference, resulting in corruption of the desired measurement. The SMAC technique may see lower sidelobe levels (and thus less inter-lattice vector interference) than those from regular Ramsey measurements. For regular Ramsey measurements, different lattice vectors have potentially different optimal pulse width & tau values, based on the RF polarization, laser polarization, and gradient of the bias magnetic field. Because of this discrepancy, applying the optimal pulse width and tau settings for one lattice vector may cause the nearby lattice vectors' responses to be lower than if they were interrogated at their respective optimal values. In some embodiments, for the SMAC technique, this reduction of the nearby lattice vector's responses can become even more pronounced. Not only are there different optimal pulsewidth and tau settings for the first Ramsey set, but there may be also potentially different optimal pulse width and tau settings for the second, inverted Ramsey set. This second Ramsey set discrepancy provides potential for even more reduction in neighboring lattice vectors' responses when using the optimal settings for the lattice vector of interest.

Ramsey pulse sequence is a pulsed RF laser scheme that is believed to measure the free precession of the magnetic moment in the magneto-optical defect material 320 of FIGS. 3A-3B with defect centers, and is a technique that quantum mechanically prepares and samples the electron spin state. FIG. 96 is an example of a schematic diagram illustrating the Ramsey pulse sequence using a SMAC pair for the two pulse sequences. Several pulse sequences are shown. As shown in FIG. 96, a Ramsey pulse sequence includes optical excitation pulses (e.g., from a laser) and RF excitation pulses over a five-step period. In a first step, a first optical excitation pulse is applied to the system to optically pump electrons into the ground state (i.e., $m_s$=0 spin state). This is followed by a first RF excitation pulse (in the form of, for example, a pulse width/2 ($pw_1$/2) microwave (MW)). The first RF excitation pulse may set the system into superposition of the $m_s$=0 and $m_s$=+1 spin states (or, alternatively, the $m_s$=0 and $m_s$=−1 spin states, depending on the choice of resonance location). During a period 2, the spins are allowed to freely precess (and dephase) over a time period referred to as tau ($\tau_1$). During this free precession time period, the system measures the local magnetic field and serves as a coherent integration. Next, a second RF excitation pulse (in the form of, for example, a MW $pw_1$/2 pulse) is applied to project the system back to the $m_s$=0 and $m_s$=+1 basis. Finally, a second optical pulse is applied to optically sample the system and a measurement basis is obtained by detecting the fluorescence intensity.

Continuing with FIG. 96, to create a SMAC pair, a second Ramsey pulse sequence includes a third optical excitation pulse applied to the system to optically pump electrons into the ground state (i.e., $m_s$=0 spin state). This is followed by a third RF excitation pulse (in the form of, for example, a second MW pulse width/2 ($pw_2$/2)). The third RF excitation pulse may again set the system into superposition of the $m_s$=0 and $m_s$=+1 spin states (or, alternatively, the $m_s$=0 and $m_s$=−1 spin states, depending on the choice of resonance location). The spins are allowed to freely precess (and dephase) over a time period referred to as $tau_2$ ($\tau_2$). During this free precession time period, the system measures the local magnetic field and serves as a coherent integration. Next, a fourth RF excitation pulse (in the form of, for example, a MW $pw_2$/2 pulse) is applied to project the system back to the $m_s$=0 and $m_s$=+1 basis. Finally, a fourth optical pulse is applied to optically sample the system and a measurement basis is obtained by detecting the fluorescence intensity of the system. FIG. 96 depicts the pulse sequences continuing with another sequence with $pw_1$.

In some embodiments, a reference signal may be determined by using a reference signal acquisition prior to the RF pulse excitation sequence and measured signal acquisition. A contrast measurement between the measured signal and the reference signal for a given pulsed sequence is then computed as a difference between a processed read-out fluorescence level from the measured signal acquisition and a processed reference fluorescence measurement from the reference signal. The processing of the measured signal and/or the reference signal may involve computation of the mean fluorescence over each of the given intervals. The reference signal acts to compensate for potential fluctuations in the optical excitation power level (and other aspects), which can cause a proportional fluctuation in the measurement and readout fluorescence measurements. Thus, in some implementations the magnetometer includes a full repolarization between measurements with a reference fluorescence intensity (e.g., the reference signal) captured prior to RF excitation (e.g., RF pulse excitation sequence) and the subsequent magnetic b field measurement data. This approach may reduce sensor bandwidth and increase measurement noise by requiring two intensity estimates per magnetic b field measurement. For a magneto-optical defect material with defect centers magnetometer, this can means that it needs full repolarization of the ensemble defect center states between measurements. In some instances, the bandwidth considerations provide a high laser power density trade space in sensor design, which can impact available integration time and achievable sensitivity.

In some embodiments, the magnetometer system may omit a reference signal acquisition prior to RF pulse excitation sequence and measured signal acquisition. The system processes the post RF sequence read-out measurement from the measured signal directly to obtain magnetometry measurements. The processing of the measured signal may involve computation of the mean fluorescence over each of the given intervals. In some implementations, a fixed "system rail" photo measurement is obtained and used as a nominal reference to compensate for any overall system shifts in intensity offset. In some implementations, an optional ground reference signal may be obtained during the RF pulse excitation sequence to be used as an offset reference. Some embodiments provide faster acquisition times, reduced or eliminated noise from the reference signal, and increased potential detune $V_{pp}$ contrast.

In some embodiments, an approximation of the readout from a Ramsey pulse sequence when the pulse width is much less than the free precession interval may be defined as the equation below:

$$1-e^{\frac{\tau}{T_2^*}}*\left(\frac{\omega_{res}}{\omega_{eff}}\right)^2*\sum_{m=-1}^{1}\cos((2\pi(\Delta+m*a_n))*(\tau+\theta))$$

where $\tau$ represents the free precession time, $T_2^*$ represents spin dephasing due to inhomogeneities present in the system 600, $\omega_{res}$ represents the resonant Rabi frequency, $\omega_{eff}$, represents the effective Rabi frequency, $a_n$ represents the hyperfine splitting of the NV diamond material 320 (~2.14 MHz), $\Delta$ represents the MW detuning, and $\theta$ represents the phase offset.

When taking a measurement based on a Ramsey pulse sequence, the parameters that may be controlled are the duration of the MW $\pi/2$ pulses, the frequency of the MW pulse (which is referenced as the frequency amount detuned from the resonance location, $\Delta$), and the free precession time $\tau$. FIGS. 97A and 97B show the effects on the variance of certain parameters of the Ramsey pulse sequence. For example, as shown in FIG. 97A, if all parameters are kept constant except for the free precession time $\tau$, an interference pattern, known as the free induction decay (FID), is obtained. The FID curve is due to the constructive/destructive interference of the three sinusoids that correspond to the hyperfine splitting. The decay of the signal is due to inhomogeneous dephasing and the rate of this decay is characterized by $T_2^*$ (characteristic decay time). In addition, as shown in FIG. 97B, if all parameters are kept constant except for the microwave detuning $\Delta$, a magnetometry curve is obtained. In this case, the x-axis may be converted to units of magnetic field through the conversion 1 nT=28 Hz in order to calibrate for magnetometry.

FIG. 98 is a graphical diagram of an intensity of a measured signal 9810 from an optical detector 340 relative to an intensity of a reference signal 9820 from the optical detector 340 over a range of detune frequencies. When using a reference signal 9820, the reference signal 9820 will contain signal information from a prior RF pulse for a finite period of time. This prior signal information in the reference signal 9820 reduces available detune $V_{pp}$ and slope for a detune point for positive slope 9830 and a detune point for negative slope 9840. Thus, to remove the prior signal information, the system would need to wait until the prior signal information is eliminated from the reference signal or operate without the reference signal.

In some embodiments, there may be implementation of a reference signal and in some embodiments, omitting of the reference signal may be possible through the use of the SMAC pair due to the increased performance. Eliminating the need for a reference signal reduces the number of pulse measurements that need to be taken and increases the bandwidth of gathering magnetic field data (i.e., an increase in sample rate).

FIG. 99 depicts a plot of a magnetometry curve using a Ramsey sequence in accordance with some embodiments. The plot depicts intensity decreasing as you go up the y-axis, so curves seen in the plot going up represent a dimming in intensity. In some embodiments, the intensity is the measured fluorescence intensity obtained from a magneto-optical defect material with defect centers. In some embodiments, the x-axis represents an RF excitation frequency of a microwave source used in the Ramsey sequence. The magnetometry curve is due to the constructive/destructive interference of the three sinusoids that correspond to the hyperfine splitting in addition to side lobes caused by the Ramsey pulse. In some embodiments, this curve is a representative depiction of the first pulse sequence as depicted in FIG. 96. In some embodiments, the curve shows an upward curve at the center frequency, representing dimming.

FIG. 100 depicts a plot of an inverted magnetometry curve using a Ramsey sequence in accordance with some embodiments. The plot depicts intensity decreasing as you go up the y-axis so curves seen in the plot going up represent a dimming in intensity. In some embodiments, the intensity is the measured fluorescence intensity obtained from a magneto-optical defect material with defect centers. In some embodiments, the x-axis represents an RF excitation frequency of a microwave source used in the Ramsey sequence. The magnetometry curve is due to the constructive/destructive interference of the three sinusoids that correspond to the hyperfine splitting in addition to side lobes caused by the Ramsey pulse. In some embodiments, this curve is a representative depiction of the second pulse sequence as depicted in FIG. 96. The values of pulse width and $\tau_2$ of the second pulse sequence are chosen such that a null is seen at the center frequency, representing a lack of dimming.

Still referring to FIG. 100 and expanding on a null seen at the center frequency representing a lack of dimming in the fluorescence. In some embodiments using a spin state of the defect center electrons, the null can be thought of in terms of a representation on a Bloch sphere where the zero reference of the spin state and the minus one spin state of the defect center electrons on a sphere are the North Pole and South Pole. In the first sequence, represented in FIG. 99, the first RF pulse may move the state from the baseline zero spin state to the equator of the Bloch sphere. The precession time after the first RF pulse may move the state around the equator of the Bloch sphere representation with time. If the chosen precession time (i.e., $\tau_1$) allows for the state to go around the circumference all or most of the way before application of the second RF pulse, the second RF pulse may create maximum dimming in the fluorescence. However, if in the sequence, represented in FIG. 100, the first RF pulse was longer and for an amount of time that moved the state from the baseline zero spin state all the way to the South Pole of the Block sphere, then the precession time (i.e., $\tau_2$) allows for the state to simply go around the South Pole which is not doing anything, and the second RF pulse to create minimum dimming or take advantage of a null point in the dimming of the fluorescence.

Therefore, in some embodiments, the curve shows a downward curve at the center frequency, representing a lack of dimming. In some embodiments, the inverted curve is created because the pulse width and $\tau_2$ value are chosen such that the time given to the precession is enough to take advantage of a null point at the chosen frequency.

FIG. 101 depicts a plot showing a combined magnetometry curve of a traditional and inverted curve in accordance with some embodiments, where the curves from FIG. 99 and FIG. 100 are combined. The curves are combined by combining the intensities at each frequency value, such as for example, by taking the difference between intensities at each frequency value. In some embodiments, the intensity is the measured fluorescence intensity obtained from a magneto-optical defect material with defect centers. In some embodiments, the x-axis represents an RF excitation frequency of a microwave source used in the Ramsey sequence. In some embodiments, the plot combines the curves as depicted in FIG. 100 and FIG. 101. In some embodiments, the combined plot is obtained by taking the difference between the traditional curve and the inverted curve. The plot depicts intensity decreasing as you go up the y-axis so curves seen in the plot going up represent a dimming in intensity. The magnetometry curve is due to the constructive/destructive interference of the three sinusoids that correspond to the hyperfine splitting in addition to side lobes caused by the Ramsey pulse.

In some implementations such as depicted in FIGS. 99-101, when performing a magnetic field measurement using a magnetometer system, once the magnetometry curves have been obtained, a SMAC measurement is performed at a chosen frequency (e.g. at a frequency with a maximum slope for the curve) and the intensity of the SMAC measurement is monitored to provide an estimate of the magnetic field. In some embodiments, the maximum slope, positive and negative, is determined from the curve obtained by the SMAC pairing and the corresponding frequencies. In some implementations, the curve is first smoothed and fit to a cubic line. In some implementations, only the corresponding frequencies are stored for use in magnetic field measurements. In some implementations, the entire curve is stored. Various implementations may use different numbers of measurement points to plot out the curve. For example, to obtain a width of curve comprising 12.5 MHZ, 500 different frequencies separated by 25 KHz may be measured. Other widths of the curve with differing granularity of the separation of measurement points are possible. In some implementations, a plurality of measurements are done at each measurement point.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor.

Generation of Magnetic Field Proxy Through RF Dithering Implementation

In some implementations, the devices 300, 600A, 600B, 600C, 700, 2500, and/or 4200 can be implemented in a magnetic field proxy generation system.

Following below are more detailed descriptions of various concepts related to, and implementations of, methods, apparatuses, and systems for creating a proxy magnetic field by frequency modulating a desired magnetic field proxy modulation onto an RF wave. In the implementations described herein, no actual external magnetic field are created. Magneto-optical defect center sensors may be susceptible to both internal and external or environmental changes such as temperature, DC and near DC magnetic fields, and power variability of the laser and RF. Providing a magnetic signal of known strength and orientation that can be used as a reference can provide a capability to compensate or correct for some of these environmental changes. In addition, a magnetic field proxy modulation can be used to help determine sensor operational status such as current functionality of the sensor and/or current noise or other error levels of the sensor. The use of an external magnetic source to generate a reference magnetic signal of precise field strength and orientation at a particular portion of a magneto-optical defect center material can be difficult. For instance, some current methods to generate a reference magnetic signal may use one or more external magnetic sources (e.g., a Helmholtz coil with RF source and amplification) to generate the magnetic field. In practice, it may be very difficult to precisely create a magnetic field of known strength and orientation at the magneto-optical defect center element using such methods. Additionally, it can be difficult to generate broadband magnetic signals from a single magnetic source due to the bandwidth limitations of most antennas. Instead, as described herein, a frequency modulated magnetic field proxy modulation can be formulated in lieu of an external magnetic source to generate a biasing proxy magnetic field. Such a proxy magnetic field can reliably create a reference magnetic signal of known strength and orientation, which can be used to compensate for environmental conditions. In addition, the proxy magnetic reference signal can be used for initial functional testing of the sensor and/or determination of current noise and/or error levels with the sensor.

The implementations described herein provides methods, systems, and apparatuses to generate proxy magnetic field modulations representative of a magnetic field of known frequency, magnitude, and field orientation. Such proxy magnetic field modulations can be used for off-line, periodic, or real-time calibration; real-time drift compensation; and/or built-in-testing. To produce the desired proxy magnetic field modulation, R(t), a base RF wave used to interrogate the magneto-optical defect center material can be modified by the biasing RF modulation, F(t). A final RF signal, G(t), to be used to generate the RF field at the magneto-optical defect center material can be determined based on the equation $G(t)=A\cos(2\pi F(t)t+\varphi)$, where A is the amplitude of the carrier, $\varphi$ is a phase of the carrier, and F(t) is the base RF wave used to interrogate the magneto-optical defect center material modified by a biasing RF modulation based on the magnetic field proxy modulation of $F(t)=F_c+\gamma R(t)$, where $F_c$ is the frequency of the base RF wave, $\gamma$ is the electron gyromagnetic ratio for the magneto-optical defect center material, R(t) is the magnetic field proxy modulation and $\gamma R(t)$ is the biasing RF modulation. For a simple magnetic field proxy modulation, $R(t)=b_1 \sin(2\pi f_1 t)$ where $b_1$ is the strength of the proxy signal and $f_1$ is the frequency of the proxy signal. In other implementations, complex magnetic field proxy modulation scan be implemented where the strength, b(t), or frequency, f(t), varies based on time or other variables. In implementations where the material is a diamond having nitrogen vacancies, the gyromagnetic ratio is approximately 28 GHz/Tesla. The RF field is applied to the magneto-optical defect center material and an optical excitation source, such as a green laser light, is applied to the magneto-optical defect center material. As described below, the when excited by the optical excitation source, the magneto-optical defect centers generate a different wavelength of optical light, such as red fluorescence for a diamond having nitrogen vacancies. The system uses an optical detector to detect the generated different wavelength of optical light. In some instances, a filter may be used to filter out wavelengths of optical light than the wavelength of interest. The system processes the optical light, such as red light, emitting from the magneto-optical defect center material as if the base RF wave, F(t), was not modulated by the desired magnetic field proxy modulation, R(t). Accordingly, the desired magnetic field proxy modulation, R(t), will be present in the output and will appear as an additional reference magnetic field in addition to any other external magnetic fields to which the magneto-optical defect center material is exposed (e.g., the local Earth magnetic field and any other external magnetic fields). The detected optical signal representative of the applied desired magnetic field proxy modulation, R(t), will be superimposed on top of any background environmental magnetic field signals present.

The use of the desired magnetic field proxy modulation, R(t), for the generation of precise proxy reference magnetic fields can be useful in a number of aspects. For instance, the technique does not incur alignment issues between a magnetic transmitter and the magneto-optical defect center material, does not incur drift of the magnetic transmitter, and does not require a magnetic transmitting coil to be integrated into a sensor head for real-time calibration purposes. In addition, the broadband response of the technique can allow for offline or real-time determination of a system transfer function over a magnetic frequency span of several orders of magnitude. The detected signal by the optical detector for the applied desired magnetic field proxy modulation, R(t), can then be used for base line compensation for the magneto-optical defect center sensor. In addition, the desired magnetic field proxy modulation, R(t), can be periodically used in real-time for the generated RF signal, G(t), for periodic compensation for drift, such as due to temperature fluctuations during operation. Moreover, the detected signal by the optical detector for the applied desired magnetic field proxy modulation, R(t), can be used as an initial pass/fail test for the magneto-optical defect center sensor based on if the detected signal by the optical detector for the applied desired magnetic field proxy modulation, R(t), is within a predetermined tolerance range.

FIG. 102 illustrates a magnetometry curve for an example resonance RF frequency. The magnetometry curve of FIG. 102 corresponds to a spin state transition envelope having a respective resonance frequency for the case where the diamond material has NV centers aligned along a direction of an orientation class. This is similar to one of the 8 spin state transitions shown in FIG. 5 for continuous wave optical excitation where the RF frequency is scanned. The magnetic field component, $B_z$, along the orientation class can be determined based on the resonance frequency relative to the zero external magnetic field frequency, such as 2.87 GHz, in a similar manner to that in FIG. 4B. In monitoring the magnetic field, the dimmed luminescence intensity, i.e., the amount the fluorescence intensity diminishes from the case where the spin states have been set to the ground state, of the region having the maximum slope may be monitored. If the dimmed luminescence intensity does not change with time, the magnetic field component does not change. A change in time of the dimmed luminescence intensity indicates that the magnetic field is changing in time, and the magnetic field may be determined as a function of time.

Since a change in resonance RF frequency corresponds to the applied external magnetic field, based on $2g\mu_B B_z$, changes in RF frequency can act as a proxy for an external magnetic field. That is, a change in the applied RF frequency based on a desired magnetic field proxy modulation, R(t), to a base RF wave used to interrogate the magneto-optical defect center material, F(t), can be used to mimic the presence of an applied external magnetic field. A final RF signal, G(t), that is then used to generate the RF field at the magneto-optical defect center material can be determined based on the equation $G(t)=A \cos(2\pi F(t)t+\varphi)$, where A is the amplitude of the carrier, $\varphi$ is a phase of the carrier, and F(t) is the modulated RF frequency used to interrogate the magneto-optical defect center material modified by the magnetic field proxy modulation of $F(t)=F_c+\gamma R(t)$, where $F_c$ is the base RF frequency, $\gamma$ is the electron gyromagnetic ratio for the magneto-optical defect center material, R(t) is the magnetic field proxy modulation and $\gamma R(t)$ is the biasing RF modulation. When the detected optical signal is measured by an optical detector and processed, the applied desired magnetic field proxy modulation, R(t), will be superimposed on top of any background environmental magnetic field signals present. As noted above, introducing an external magnetic field with a component along the NV axis lifts the degeneracy of the $m_s=\pm1$ energy levels, splitting the energy levels $m_s=\pm1$ by an amount $2g\mu_B B_z$, where g is the Lande g-factor, $\mu_B$ is the Bohr magneton, and $B_z$ is the component of the external magnetic field along the NV axis. In lieu of the external magnetic field lifting the degeneracy of the $m_s=\pm1$ energy levels, a change in the applied RF energy applied to the magneto-optical defect center material can be used as a proxy for an applied external magnetic field.

In implementations described herein, a sinusoidal dithering to a particular RF interrogation frequency, $f_{r0}$, can simulate a sensor response that is equivalent to a sensor response to an external magnetic field with a projected magnitude of $b_1$ Tesla at a frequency $f_1$ Hz. The sinusoidal dithering frequency can be determined by $f_r(t)=f_{r0}+\gamma b_1 \sin(2\pi f_1 t)$, where $\gamma$ is the electron gyromagnetic ratio for the material of the magneto-optical defect center element, such as 28 GHz/Tesla for a diamond having nitrogen vacancies. The magnetic field proxy modulation described herein can be applied for both continuous wave or pulsed operation modes for a magnetometer.

FIG. 103 illustrates a process 10300 for generating a proxy magnetic reference signal. The process 10300 includes determining a base RF wave (block 10310). The base RF wave can be determined by sequentially sweeping through a set of RF frequencies, such as to generate the fluorescence as a function of RF frequency graph of FIG. 4B, and selecting a base RF wave, $F_c(t)$, based on the resulting data for fluorescence as a function of RF frequency. In some implementations, a selected base RF wave may correspond to an RF frequency where peak slope for each of the spin state transition envelopes.

The process 10300 further can include determining the desired magnetic field proxy modulation (block 10320). The determination of the desired magnetic field proxy modulation, R(t), may be based on a selected projected magnitude, $b_1$, Tesla and a selected frequency, $f_1$, Hz. Using the projected magnitude and selected frequency, the desired magnetic field proxy modulation may be determined as a sinusoid that is dithered about the base RF wave, $F_c(t)$. The sinusoid may be $\gamma b_1 \sin(2\pi f_1 t)$, where $\gamma$ is the electron gyromagnetic ratio for the material of the magneto-optical defect center element, such as 28 GHz/Tesla for a diamond having nitrogen vacancies.

The process 10300 further can include generating the final RF signal based on the determined base RF wave and the desired magnetic field proxy modulation (block 10330). The final RF signal, G(t), can be determined as $G(t)=A\cos(2\pi F(t)t+\varphi)$, where A is the amplitude of the carrier, $\varphi$ is a phase of the carrier. F(t) is the base RF wave used to interrogate the magneto-optical defect center material modified by the magnetic field proxy modulation of $F(t)=F_c+\gamma R(t)$, where $F_c$ is the base RF frequency, $\gamma$ is the electron gyromagnetic ratio for the magneto-optical defect center material, R(t) is the magnetic field proxy modulation and $\gamma R(t)$ is the biasing RF modulation. For a selected sinusoidal dithering having a projected magnitude, $b_1$, Tesla and a selected frequency, $f_1$, Hz about a peak slope frequency, $f_{r0}$, the final RF signal $f_r(t)$ may be calculated as $f_r(t)=f_{r0}+\gamma b_1 \sin(2\pi f_1 t)$.

In some implementations, the process 10300 can further include generating an RF field using the final RF signal and a RF excitation source, such as RF excitation source 330, 630, and applying the generated RF field to a NV diamond material 320, 620 or other magneto-optical defect center material.

FIG. 104 illustrates a process 10400 for determining a processed proxy magnetic reference signal based on a desired magnetic field proxy modulation used to generate a final RF signal. The process 10400 includes measuring an uncalibrated magnetic field (block 10410). The uncalibrated magnetic field can be measured by applying a Ramsey pulse sequence for each of a plurality of RF frequencies and storing a corresponding intensity output for each respective frequency of the plurality of RF frequencies. The corresponding baseline uncalibrated magnetic field data can be stored as a baseline curve.

The process 10400 can include applying a final RF signal based on a determined base RF wave and desired magnetic field proxy modulation to a magneto-optical defect center material (block 10420). The final RF signal can be determined based on the process 10300 of FIG. 103. An RF field can be generated using the final RF signal and a RF excitation source, such as RF excitation source 310, and applying the generated RF field to a magneto-optical defect center material, such as a NV diamond material 320 or other magneto-optical defect center material. By modifying the generated RF field based on the desired magnetic field proxy modulation, the resulting detected optical signal will include the applied desired magnetic field proxy modulation, R(t), superimposed on top of any background environmental magnetic field signals present.

The process 10400 can include measuring a magnetic field with the desired magnetic field proxy modulation superimposed on the uncalibrated magnetic field (block 10430). The measured magnetic field can be calculated using magneto-optical defect center signal processing without reference to the superimposed desired magnetic field proxy modulation. That is, fluorescence intensities can be measured using an optical detector for each of a plurality of RF frequencies about the base RF wave. A magnetometry curve, such as the one shown in FIG. 102, can be generated based on the measured fluorescence intensities at each of the plurality of RF frequencies about the base RF wave. The magnetic field component, $B_z$, along the corresponding orientation class for the magnetometry curve can then be determined based on the resonance frequency relative to the zero external magnetic field frequency, such as 2.87 GHz, in a similar manner to that in FIG. 4B. Because the resulting detected optical signal will include the desired magnetic field proxy modulation, R(t), superimposed on top of the uncalibrated magnetic field environmental magnetic field signals, the resulting magnetic field component, $B_z$, will also include the resulting proxy magnetic field corresponding to the desired magnetic field proxy modulation.

The process 10400 can include determining a processed proxy magnetic reference signal (block 10440). As noted above, the resulting detected optical signal includes the desired magnetic field proxy modulation, R(t), superimposed on top of the uncalibrated magnetic field environmental magnetic field signals, such that the resulting magnetic field component, $B_z$, will also include the resulting proxy magnetic field corresponding to the desired magnetic field proxy modulation. The processed proxy magnetic reference signal, $b_1$ estimate, can be determined by subtracting the uncalibrated magnetic field for the corresponding frequency from the resulting measured magnetic field from block 10430. In some implementations, the processed proxy magnetic reference signal can be determined for each of a plurality of RF frequencies by sequentially stepping through each frequency of a plurality of RF frequencies ($f_1, f_2, \ldots, f_n$). In some implementations, the processed proxy magnetic reference signal can be compared to a predetermined processed proxy magnetic reference signal and, if a difference between the processed proxy magnetic reference signal and the predetermined processed proxy magnetic reference signal is below a predetermined error value, such as 1% error, 5% error, 10% error, etc., then an initial pass/fail test flag can be set to a value corresponding to pass. If the difference between the processed proxy magnetic reference signal and the predetermined processed proxy magnetic reference signal is above the predetermined error value, then the initial pass/fail test flag can be set to a value corresponding to fail. Thus, the processed proxy magnetic reference signal can be used as an initialization test or check for a magnetometer.

FIG. 105 illustrates a process 10500 for generating a sensor attenuation curve of external magnetic fields as a function of frequency using proxy magnetic field modulations. The process 10500 includes measuring an uncalibrated magnetic field (block 10510). The uncalibrated magnetic field can be measured by applying a Ramsey pulse sequence for each of a plurality of RF frequencies and storing a corresponding intensity output for each respective frequency of the plurality of RF frequencies. The corresponding baseline uncalibrated magnetic field data can be stored as a baseline curve.

The process 10500 can include applying a final RF signal based on a determined base RF wave and desired magnetic field proxy modulation to a magneto-optical defect center material (block 10520). The final RF signal can be determined based on the process 10300 of FIG. 103. An RF field can be generated using the final RF signal and a RF excitation source, such as RF excitation source 330, 630, and applying the generated RF field to a magneto-optical defect center material, such as a NV diamond material 320, 620 or other magneto-optical defect center material.

The process 10500 can include measuring a magnetic field with the desired magnetic field proxy modulation superimposed on the uncalibrated magnetic field (block 10530). The measured magnetic field can be calculated using magneto-optical defect center signal processing without reference to the superimposed desired magnetic field proxy modulation. A magnetometry curve, such as the one shown in FIG. 102, can be generated based on the measured fluorescence intensities at each of the plurality of RF frequencies about the base RF wave. The magnetic field component, $B_z$, along the corresponding orientation class for the magnetometry curve can then be determined based on the resonance frequency relative to the zero external magnetic field frequency, such as 2.87 GHz, in a similar manner to that in FIG. 4B. Because the resulting detected optical signal will include the desired magnetic field proxy modulation, R(t), superimposed on top of the uncalibrated magnetic field environmental magnetic field signals, the resulting magnetic field component, $B_z$, will also include the resulting proxy magnetic field corresponding to the desired magnetic field proxy modulation.

The process 10500 can include determining a processed proxy magnetic reference signal (block 10540). As noted above, the resulting detected optical signal includes the desired magnetic field proxy modulation, R(t), superimposed on top of the uncalibrated magnetic field environmental magnetic field signals, such that the resulting magnetic field component, $B_z$, will also include the resulting proxy magnetic field corresponding to the desired magnetic field proxy modulation. The processed proxy magnetic reference signal, $b_1$ estimate, can be determined by subtracting the uncalibrated magnetic field for the corresponding frequency from the resulting measured magnetic field from block 10530.

The process 10500 may include incrementing a frequency for a desired magnetic field proxy modulation (block 10550). Each of a plurality of RF frequencies ($f_1$, $f_2$, . . . , $f_n$) are sequentially stepped through. The processed proxy magnetic reference signal, $b_1$ estimate, for each of the plurality of RF frequencies at the corresponding projected magnitude can be stored in a data storage device. The process 10500 also may include incrementing a magnitude for a desired magnetic field proxy modulation (block 10560). Each of a plurality of projected magnitudes ($b_1$, $b_2$, . . . , $b_n$) are sequentially stepped through. The sets of processed proxy magnetic reference signals, $b_1$ estimate, for each of the projected magnitudes at the plurality of RF frequencies can be stored in a data storage device.

The process 10500 further can include calculating attenuation values for each desired magnetic field proxy modulation (block 10570). The attenuation values can be calculated as $a_i=b_i/b_i$ estimate, where $b_i$ is the set of projected magnitudes used to generate the corresponding desired magnetic field proxy modulation and $b_i$ estimate is the set of processed proxy magnetic reference signals. In some implementations, the attenuation values can be stored in a data storage device as a look-up table. The attenuation values can be used to modify a measured magnetic field component to correct for attenuation at a corresponding frequency based on the stored attenuation values in the look-up table. In some implementations, the look-up table of attenuation values can be calculated and stored responsive to the sensor and corresponding data processing system being powered up. In other implementations, the look-up table of attenuation values can be calculated and stored at predetermined periods, such as after a period of 10 minutes, 30 minutes, 60 minutes, 2 hours, 3 hours, 6 hours, 12 hours, 24 hours, etc.

In some implementations, the process 10500 can include generating an attenuation curve based on the attenuation values (block 10580). The attenuation curve may be a plot of the look-up table attenuation values.

FIG. 106 illustrates a process 10600 for generating a calibrated noise floor as a function of frequency using magnetic field proxy modulation s. The process 10600 includes measuring an uncalibrated noise floor (block 10610). The uncalibrated noise floor can be measured by applying a Ramsey pulse sequence for each of a plurality of RF frequencies and storing a corresponding intensity output for each respective frequency of the plurality of RF frequencies and estimating a noise floor value, $w_i$, for each of the plurality of RF frequencies, $f_i$. The corresponding baseline uncalibrated noise floor estimates can be stored as a baseline curve.

The process 10600 can include applying a final RF signal based on a determined base RF wave and desired magnetic field proxy modulation to a magneto-optical defect center material (block 10620). The final RF signal can be determined based on the process 10300 of FIG. 103. An RF field can be generated using the final RF signal and a RF excitation source, such as RF excitation source 310, and applying the generated RF field to a magneto-optical defect center material, such as a NV diamond material 320 or other magneto-optical defect center material.

The process 10600 can include measuring a magnetic field with the desired magnetic field proxy modulation superimposed on the uncalibrated magnetic field (block 10630). The measured magnetic field can be calculated using magneto-optical defect center signal processing without reference to the superimposed desired magnetic field proxy modulation. A magnetometry curve, such as the one shown in FIG. 102, can be generated based on the measured fluorescence intensities at each of the plurality of RF frequencies about the base RF wave. The magnetic field component, $B_z$, along the corresponding orientation class for the magnetometry curve can then be determined based on the resonance frequency relative to the zero external magnetic field frequency, such as 2.87 GHz, in a similar manner to that in FIG. 4B. Because the resulting detected optical signal will include the desired magnetic field proxy modulation, R(t), superimposed on top of the uncalibrated magnetic field environmental magnetic field signals, the resulting magnetic field component, $B_z$, will also include the resulting proxy magnetic field corresponding to the desired magnetic field proxy modulation.

The process 10600 can include determining a processed proxy magnetic reference signal (block 10640). As noted above, the resulting detected optical signal includes the desired magnetic field proxy modulation, R(t), superimposed on top of the uncalibrated magnetic field environmental magnetic field signals, such that the resulting magnetic field component, $B_z$, will also include the resulting proxy magnetic field corresponding to the desired magnetic field proxy modulation. The processed proxy magnetic reference signal, $b_1$ estimate, can be determined by subtracting the uncalibrated magnetic field for the corresponding frequency from the resulting measured magnetic field from block 10530.

The process 10600 may include incrementing a frequency for a desired magnetic field proxy modulation (block 10650). Each of a plurality of RF frequencies ($f_1$, $f_2$, . . . , $f_n$) are sequentially stepped through. The processed proxy magnetic reference signal, $b_1$ estimate, for each of the plurality of RF frequencies at the corresponding projected magnitude can be stored in a data storage device. The process 10600 also may include incrementing a magnitude for a desired magnetic field proxy modulation (block 10660). Each of a plurality of projected magnitudes ($b_1$, $b_2$, . . . , $b_n$) are sequentially stepped through. The sets of processed proxy magnetic reference signals, $b_1$ estimate, for each of the projected magnitudes at the plurality of RF frequencies can be stored in a data storage device.

The process 10600 further can include calculating attenuation values for each desired proxy magnetic reference signal (block 10670). The attenuation values can be calculated as $a_i=b_i/b_i$ estimate, where $b_i$ is the set of projected magnitudes used to generate the corresponding desired biasing magnetic field proxy modulation and $b_i$ estimate is the set of processed proxy magnetic reference signals. In some implementations, the attenuation values can be stored in a data storage device as a look-up table. The attenuation values can be used to modify a measured magnetic field component to correct for attenuation at a corresponding frequency based on the stored attenuation values in the look-up table. In some implementations, the look-up table of attenuation values can be calculated and stored responsive to the sensor and corresponding data processing system being powered up. In other implementations, the look-up table of attenuation values can be calculated and stored at predetermined periods, such as after a period of 10 minutes, 30 minutes, 60 minutes, 2 hours, 3 hours, 6 hours, 12 hours, 24 hours, etc.

In some implementations, the process 10600 can include generating an estimated calibrated noise floor curve based on the attenuation values (block 10680). Each estimated calibrated noise floor curve value may be calculated by $v_i=w_i a_i$, where $w_i$ is the uncalibrated noise floor value at a corresponding frequency and $a_i$ is the corresponding attenuation value for the corresponding frequency. In some implementations, the estimated calibrated noise floor values may be stored in a look-up table calibrated noise floor values.

In some implementations, the projected magnitude, $b_1$, of the proxy magnetic field can be in a range of 100 picoTeslas to 1 microTesla, or, in some instances, 10 nanoTeslas to 100 nanoTeslas, in increments of 1 nanoTesla. In some implementations, the selected frequency, $f_1$, of the proxy magnetic field can vary based upon the application. For instance for magnetic location and/or navigation, a small frequency increment, such as 0 Hz, to a large frequency increment, such as 100 kHz, can be selected to increment. For magnetic communication, a medium frequency increment, such as 5 kHz to 10 kHz, can be selected to increment.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Spin Relaxometry Implementation

In some implementations, the devices 300, 600A, 600B, 600C, 700, 2500, and/or 4200 can be implemented in a spin relaxometry system.

According to some embodiments, a system and method for identifying target moieties is provided based on complementary moieties specific to the target moieties, and is further based on using detection of a magnetic effect change caused by an associated paramagnetic ion. Because the technique can be specific, it is less error prone. The system of some embodiments allows for identifying components of DNA, for example, and thus sequencing of DNA, without requiring DNA amplification chemistry, is possible. According to some embodiments, the system and method can thus avoid the complexity and cost of amplification chemistries. Sensing of extremely small quantities of analyte are possible, and sequencing speed may be improved. The system and method are applicable to a number of different applications such as forensics, diagnosis, therapeutics, predictive medicine, and synthetic biology.

Further the system and method according to embodiments allows for further advantages. A highly sensitive optical readout is possible. The system can be configured for ultra-fast readout, such as by using an electronic readout. The system can be combined with other detection schemes such as an ion-current detection method. In some embodiments, a carbon chain with high molecular weight is connected to the sensing material such as an magneto-optical defect center material. The connection may be covalent, ionic, or any other type of bond. The carbon chain includes a moiety with an ionic charge that is complementary to the charge on a potentially sensed material. The sensor chain with the moiety is placed near a fluid stream that may contain unknown molecules to be sensed and identified. Before any substance is present to be sensed, the chain with the moiety is permitted to be present in the stream where its location and magnetic field may be sensed. As a unknown molecule passes by the chain with the moiety the unknown molecule may temporarily bind with moiety causing the moiety to move.

FIGS. 107-109 illustrate a system 10700 for detecting a target molecule 10790 according to some embodiments. FIG. 107 is a schematic diagram illustrating the system 10700. FIG. 107 illustrates a substrate 10710 of the system shown in side cross-sectional view. FIG. 10708 illustrates the substrate 10710 shown in top view. FIG. 109 is a magnified cross-sectional view of a portion of an inner side wall 10722 region of a pore 10720 in the substrate 10710. The system 10700 further includes a magnetic effect detector 10740 and a processor 10746.

The substrate 10710 may have one or more electron spin centers 10732. The electron spin centers 10732 may be diamond nitrogen vacancies (DNV), for example. In this case, the substrate 10710 may be formed of diamond material. Alternatively, the electron spin centers 10732 may be defect centers in silicon carbide, for example, where the substrate 10710 may be formed of silicon carbide, or the electron spin centers 10732 may be atomic substitutions in silicon, such as phosphorous in silicon, for example. In general, the electron spin centers 10732 may be in magneto-optical defect center material.

The electron spin centers 10732 may be arranged in a band 10730 about the pore 10720. The band 10730 of electron spin centers 10732 may be disposed at a short distance from the inner wall 10722 of the pore 10720. For example, the electron spin centers 10732 may be disposed at a distance of 1 to 20 nm from the inner wall 10722. The distance from the band 10730 to the inner wall 10722 should be short enough such that an electron spin center 10732 may react to the magnetic field due to one of the paramagnetic ions 10782. While FIG. 108 illustrates the band to be circular in shape, other shapes such as square are possible, and may depend on the shape of the pore 10720. The band 10730, may be formed by ion implantation, for example.

The size of the pore 10720 will depend upon the particular application and target molecule or moiety. The pore 10720 size may be in a range of 1 to 10 nm, for example.

The system 10700 further may include one or more complementary moieties 10786, each attached to a respective paramagnetic ion 10782. The paramagnetic ion 10782 in turn may be attached to the inner wall 10712 of the pore 10720 via a ligand attachment 10780 of the paramagnetic ion 10782. The ligand attachment is preferably flexible so as to allow the paramagnetic ion 10782 to move closer and further from the band 10730 of electron spin centers 10732 due to the movement of the complementary moiety 10786 attached to the paramagnetic ion 10782. As one example of attaching the paramagnetic ion 10782 of $Gd^{3+}$ to a diamond substrate via the ligand attachment 10780, 1-ethyl-3-(3-dimethylaminopropyl) carbodiimide (EDC) and N-hydroxysulfosuccinimide (NHS) may be used to activate carboxyl groups on the diamond surface so that they react with $Gd^{3+}$ molecules functionalized with amine groups. Complementary molecules, or moieties, could be attached by a number of different chemical linkages. For example, for DNA complementary bases, each base (e.g. adenine, thymine, guanine, or cytosine) could be attached via structures similar to the phosphate-deoxyribose structures that make up the backbone of DNA strands.

Referring to FIG. 109, a target molecule 10790 in a fluid 10770 is allowed to pass by one of the complementary moieties 10782. The complementary moiety 10786 is such that it interacts with the target molecule 10790, so that complementary moiety 10786 changes its position and is drawn closer to the transiting target molecule 10790 by interaction forces. For example, the complementary moiety 10786 may temporarily bind to a portion of the target molecule 10790 thereby causing the complementary moiety 10786 to move as the target molecule 10790 passes through the pore 10720. When the complementary moiety 10786 moves, the paramagnetic ion 10782 in turn moves because the complementary moiety 10786 is attached to the paramagnetic ion 10782.

The paramagnetic ion 10782 provides a magnetic field which interacts with a spin center 10732, and has an effect on the electron spin center 10732. The magnetic effect of the spin center 10732 changes with the distance from the electron spin center 10732 to the paramagnetic ion 10782, and is detected by the magnetic effect detector 10740. For each paramagnetic ion 10782, there should correspond at least one electron spin center 10732, which is relatively close to the paramagnetic ion 10782 so as to allow for interaction between the paramagnetic ion 10782 and the electron spin center 10732.

In one embodiment, the magnetic effect is the relaxation time $T_1$ of the electron spin center 10732. For example, the electron spin center 10732 may comprise DNV centers, and the paramagnetic ion 10782 may be a $Gd^{3+}$ ion. Alternatively, the paramagnetic ion 10782 may be another strongly paramagnetic ion such as another Lanthanide series ion, or Manganese. In the case of a $Gd^{3+}$ ion, the magnetic noise from the $Gd^{3+}$ ion spins (S=7/2) induces enhanced relaxation of the NV spins reducing the relaxation time $T_1$ This magnetic effect of the spin center relaxation time changes with the distance of the $Gd^{3+}$ ion to the electron spin center 10732. In particular the spin center relaxation time $T_1$ decreases as the distance of the $Gd^{3+}$ ion to the electron spin center 10732 decreases.

The magnetic effect detector 10740 is arranged to detect the magnetic effect change of one of the electron spin centers 10732. For example, the magnetic effect detector 10740 may detect a change in the relaxation time $T_1$ of an electron spin center 10732 by measuring the photoluminescence emitted by the electron spin center 10732 as a function of time, and determining the relaxation time $T_1$ based on the photoluminescence decay with time.

In the case that the magnetic effect detector 10740 detects the photoluminescence of an electron spin center 10732 as a function of time, the magnetic effect detector 10740 may include a light source 10742 arranged to direct excitation light onto the electron spin center 10732, and a light detector 10744 arranged to receive photoluminescence light from the electron spin center 10732 based on the excitation light. The light source 10742 will direct excitation light onto a desired electron spin center 10732 to measure the photoluminescence from the desired electron spin center 10732. In the case the electron spin center 10732 is a DNV center, for example, the light source 10742 may be a laser or a LED, for example, providing light in the green.

In operation, the distances between spin centers 10732 with nearby attached complementary molecules or moieties need not match distances between complementary target molecules or moieties. The spin centers 10732 can be spaced to enable convenient individual addressing with laser light through, for example, a confocal microscopy arrangement. Timing of signal readouts will be dictated by time it takes different target molecules or moieties to move past respective complementary molecules or moieties.

FIGS. 110A and 110B illustrate the photoluminescence (PL) of a spin center as a function of time. FIG. 110A illustrates the case where the paramagnetic ion 10782 is relatively far from the electron spin center 10732, while FIG. 110B illustrates the case where the paramagnetic ion 10782 is relatively close to the electron spin center 10732. As can be seen from FIGS. 110A and 110B, the relaxation time is larger in the case that the paramagnetic ion 10782 is relatively far from the electron spin center 10732.

Referring to FIG. 109, the target molecule 10790 may comprise a number of individual target moieties 10792 and the one or more complementary moieties 10786 may comprise a number of different complementary moieties 10786*a*, 10786*b*, etc. Each of the complementary moieties 10786*a*, 10786*b* is specific to a different individual target moiety 10792*a*, 10792*b*. That is, the complementary moiety 10786*a* interacts most strongly with the individual target moiety 10792*a*, while the complementary moiety 10786*b* interacts most strongly with the individual target moiety 10792*b*. While FIG. 109 only illustrates two individual target moieties 10792*a*, 10792*b* and two complementary moieties 10786*a*, 10786*b*, in general the number of individual moieties and complementary moieties may be more than two. Further, while FIGS. 107-109 illustrate a single pore 10720, the system may include multiple pores, where different target moieties pass through different pores, and where the different target moieties are detected in the different pores by switching interrogation between the pores.

The individual moieties 10792 may be attached to a single strand 10794 of the target molecule 10790. The target molecule in this case may be DNA, and the complementary moieties 10786 may be complementary nucleic acid bases.

FIG. 111 illustrates an example of a target molecule 10790 with individual target moieties 10792*a*, 10792*b*, 10792*c*, and 10792*d* passing through a pore 10720 of a substrate 10710. The pore 10720 has complementary moieties 10786*a*, 10786*b*, 10786*c* and 10786*d* attached to an inner wall 10722 of the pore 10720. Each of the complementary moieties 10786*a*, 10786*b*, 10786*c* and 10786*d* is specific to a respective different individual target moiety 10792*a*, 10792*b*, 10792*c*, and 10792*d*. Further, each of the complementary moieties 10786*a*, 10786*b*, 10786*c* and 10786*d* corresponds to a different of the electron spin centers 10732*a*, 10732*b*, 10732*c* and 10732*d*, where the corresponding paramagnetic ion 10782 is attached to a portion of the inner wall 10722 of the pore 10720 so that the paramagnetic ion 10782 is relatively close to the electron spin center 10732.

As the molecule 10790 passes through the pore 10720, the first the complementary moiety 10786*a* will interact with the individual target moiety 10792*a* and the magnetic effect detector 10740 will detect a magnetic effect change of the corresponding electron spin center 10732*a*. Then, the magnetic effect detector 10740 will detect a magnetic effect change of the corresponding electron spin center 10732*b* for the interaction between the complementary moiety 10786*b* and the individual target moiety 10792*b*. In turn, the magnetic effect detector 10740 will detect a magnetic effect change of the corresponding electron spin center 10732*c* for the interaction between the complementary moiety 10786*c* and the individual target moiety 10792*c*. Finally, the magnetic effect detector 10740 will detect a magnetic effect change of the corresponding electron spin center 10732*d* for the interaction between the complementary moiety 10786*d* and the individual target moiety 10792*d*.

While FIG. 111 illustrates the complementary moieties 10786*a*-10786*d* to be arranged in the same order as the respective individual target moieties 10792*a*-10792*d*, the ordering may be different. The different electron spin centers 10732 allow for different channels of detection of the magnetic effect change, one for each electron spin center 10732. Each electron spin center 10732 and its associated paramagnetic ion 10782 correspond to a different channel, and each channel corresponds to a different target moiety. Thus, the different channels may be interrogated for their respective magnetic effects allowing for specificity of each channel to a respective particular target moiety.

While FIGS. 109 and 111 illustrate the complementary moieties attached to a pore surface via a paramagnetic ion and a ligand attachment, alternatively the paramagnetic ion may be attached to the target molecule or target moiety. The complementary moiety is such that it interacts with the target molecule or target moiety, so that target molecule or target moiety changes its position and is drawn closer to the complementary moiety by interaction forces. When the target molecule or target moiety moves, the paramagnetic ion in turn moves because the target molecule or target moiety is attached to the paramagnetic ion. Thus, it is possible to label either the target molecule or target moiety with the paramagnetic ion, or to label the complementary moiety with the paramagnetic ion as described in earlier embodiments.

FIG. 112 illustrates the magnetic effect signal as a function of time for each of the electron spin centers 10732*a*-10732*d* for the arrangement shown in FIG. 111. The magnetic effect signal will change in time order of the order of the electron spin centers 10732*a*-10732*d* for the FIG. 111 arrangement. Of course, the magnetic effect signal will be different in time for a different arrangement of the electron spin centers 10732 and their corresponding complementary moieties.

Referring back to FIG. 107, the system 10700 may include a processor 10746. The processor 10746 controls the magnetic effect detector 10740 to detect the magnetic effect of individual of the electron spin centers 10732, and receives the results of magnetic effects from the magnetic effect detector 10740.

The processor 10740 further may include information regarding the identity of the complementary moieties, and of a target molecule, including target moieties, if any, which will interact with the complementary moieties. The processor 10740 further may include information on the correspondence between the complementary moieties and their respective associated spin centers and the arrangement of complementary moieties and their respective associated spin centers. Based on the results of the magnetic effects, and the information regarding the identity of the complementary moieties, or complementary moieties, and possible target molecules or target moieties, the processor may identify the target molecules or target moieties.

In this way, the system 10700 allows for the complementary moieties to be labeled because they are specific to particular target molecules or moieties. The labeling provides improved identification of the target molecules or moieties.

The system and method described above using paramagnetic ions for identifying target molecules or moieties, may be combined with other identification techniques to enhance detection. For example, FIG. 113 illustrates a system 11300 with the magnetic effect detector 10740 as shown in FIG. 107, but additionally including a second effect detector 10750 to monitor a second effect which changes upon a target moiety being in the pore 10720.

For example, the second effect detector 10750 may be an ion current detector, as shown in FIG. 113, with a voltage source 10754, ammeter 10752 and electrodes 10756. The ion current detector detects the ion current in the fluid 10770 from one side of the substrate 10710 with the pore 10720, to the other side of the substrate 10710. When a target molecule is in the pore 10720, the ionic current is reduced.

The processor 10746 controls and receives the ionic current results from the second effect detector 10750, and further controls and receives the magnetic effects results from the magnetic effect detector 10740. As discussed above with respect to FIG. 107, the processor 10746 may identify target molecules or moieties based on the magnetic effect results.

The processor 10746 may enhance the identification of target molecules or moieties further using the ionic current results. In this regard, the processor 10746 may include information relating the ionic current strength corresponding to the applicable target molecules or target moieties. The processor may identify the target molecule based both on the magnetic effect results, and the second effect results, as well as the information regarding the applicable target molecules or moieties.

FIG. 114 illustrates an embodiment of the substrate 10710, where the substrate 10710 includes a graphene layer 11410 with a pore 10720 within the graphene layer 11410. This embodiment allows for fast readout of the magnetic spin change of the spin center. The substrate 10710 may include a support structure 11440, upon which the graphene layer 11410 is supported. The graphene layer 11410 may include a number of sublayers. The support structure 11440 may be formed of silicon nitride, for example.

In FIG. 114, the electron spin centers 10732 may formed in separate nano-structures 11420. The nano-structures 11420 may be about 5 to 100 nm in size. For example, if the electron spin centers 10732 are DNV centers, the nano-structures 11420 may be formed of diamond. Each nano-structure 11420 has an associated paramagnetic molecule 10782, which is attached to the nano-structure 11420 via a ligand 10780, and a complementary moiety 10786 attached to the paramagnetic ion 10782.

The substrate 10710 further includes a source electrode 11430 and a drain electrode 11432 formed thereon which allow for electronic readout of the optical excitation of the electron spin centers 10732, in contrast to the optical readout provided by the light detector 10744 of FIG. 107. The electronic readout may be based on, for example, non-radiative energy transfer (NRET) of the electron spin center 10732, which generates an electron-hole pair. Electrical signals due to the NRET of the electron spin centers 10732 may be detected using a source electrode 11430 and a drain electrode 11432, for example.

As described above, according to embodiments, a system and method for identifying target moieties is provided based on complementary moieties specific to the target moieties, and is further based on using detection of a magnetic effect change caused by an associated paramagnetic ion. Because the technique can be specific, it is less error prone. The system allows for identifying components of DNA, for example, and thus sequencing of DNA, without requiring DNA amplification chemistry, is possible. According to embodiments, the system and method can thus avoid the complexity and cost of amplification chemistries. Sensing of extremely small quantities of analyte are possible, and sequencing speed may be improved. The system and method are applicable to a number of different applications such as forensics, diagnosis, therapeutics, predictive medicine, and synthetic biology.

The spin relaxometry process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Micro Air Vehicle and Buoy Arrays of Magnetometer Sensors Implementations

In some implementations, the devices 300, 600A, 600B, 600C, 700, 2500, and/or 4200 can be implemented in a micro air vehicle (UAV)/unmanned aerial system (UAS) and/or a buoy array of sensors.

In various embodiments described herein, an array of magnetometers may be used to locate a magnetic object, such as a ferromagnetic or paramagnetic object. Multiple magnetometers are distributed across an area, which can be a two-dimensional area (e.g., the surface of a body of water) or a three-dimensional area (e.g., along a water column or attached to unmanned aerial vehicles). The magnetometers are sensitive enough to detect relatively small changes in the sensed earth's magnetic field. Differences in the sensed earth's magnetic field from each of the magnetometers can be used to detect and determine the location of an object that interferes with the earth's magnetic field.

For example, multiple unmanned aerial systems (UASs) such as flying drones are each fitted with a magnetometer. The UASs fly around an area that may be monitored. Each of the magnetometers sense a vector measurement of the earth's magnetic field at the same time. The earth's magnetic field is the same (or substantially the same) for all of the UASs. Objects can alter the earth's magnetic field as sensed by the UASs. For example, vehicles such as cars, trucks, tanks, etc. that are made primarily of steel or other paramagnetic material deflect or alter the earth's magnetic field.

The UASs fly around the monitored area and take simultaneous measurements of the earth's magnetic field. Each of the measurements may be a vector measurement that includes a strength and direction of the earth's magnetic field. If the vehicle does not move over time, the earth's magnetic field detected by each of the UASs does not change over time at specific locations. If the vehicle moves, the vehicle's effect on the earth's magnetic field that is sensed by the UASs changes. The sensed change in the earth's magnetic field can be used to determine the location of the vehicle over time.

For example, each of the UASs sense the earth's magnetic field simultaneously. The simultaneous measurements can be compared to one another to determine anomalies or changes in the earth's magnetic field caused by a magnetic object. For example, if there is no magnetic object in the area that is being monitored, each of the UASs' sensed magnetic fields may be the same. That is, there is no object within the monitored area that may be altering or moving the earth's magnetic field. But, if there is a magnetic object that is within the monitored area, the earth's magnetic field sensed by each of the UASs will be slightly different depending upon the relative location of the magnetic object. For example, the vector measurement of a UAS that is close to the magnetic object will be different than the vector measurement of UASs that are relatively far away from the magnetic object. The difference in the vector measurements can be used to determine, for example, that the magnetic object exists and may be proximate to the UAS with the vector measurement that may be different than the other vector measurements.

In some such examples, once it is determined that the magnetic object exists and may be relatively close to a particular UAS, the fleet of UASs can be directed to the area of the magnetic object. Subsequent measurements can be taken to determine the location, size, shape, etc. of the magnetic object based on the sensed magnetic vectors and the location of the UASs. The UASs may be autonomous or may be controlled remotely.

In some embodiments described herein, the "magnetic object" may be a paramagnetic or a ferromagnetic object. In an alternative embodiment, the "magnetic object" may be (or include) an electromagnet. In other alternative embodiments, the "magnetic object" may be any object that alters the earth's magnetic field. For example, the "magnetic object" may be an object made of (or that includes) a material that alters the flux lines of the earth's magnetic field, but is not necessarily paramagnetic, ferromagnetic, or electromagnetic. In such an example, the material may not be magnetic, but may still alter the flux lines of the earth's magnetic field.

A diamond with a nitrogen vacancy (DNV) can be used to measure a magnetic field. DNV sensors generally have a quick response to magnetic fields, consume little power, and are accurate. Diamonds can be manufactured with nitrogen vacancy (NV) centers in the lattice structure of the diamond. When the NV centers are excited by light, for example green light, and microwave radiation, the NV centers emit light of a different frequency than the excitation light. For example, green light can be used to excite the NV centers, and red light can be emitted from the NV centers. When a magnetic field is applied to the NV centers, the frequency of the light emitted from the NV centers changes. Additionally, when the magnetic field is applied to the NV centers, the frequency of the microwaves at which the NV centers are excited changes. Thus, by shining a green light (or any other suitable color) through a DNV and monitoring the light emitted from the DNV and the frequencies of microwave radiation that excite the NV centers, a magnetic field can be monitored.

NV centers in a diamond are oriented in one of four spin states. Each spin state can be in a positive direction or a negative direction. The NV centers of one spin state do not respond the same to a magnetic field as the NV centers of another spin state. A magnetic field vector has a magnitude and a direction. Depending upon the direction of the magnetic field at the diamond (and the NV centers), some of the NV centers will be excited by the magnetic field more than others based on the spin state of the NV centers.

FIGS. 115A and 115B are graphs illustrating the frequency response of a DNV sensor in accordance with some illustrative embodiments. FIGS. 115A and 115B are meant to be illustrative only and not meant to be limiting. FIGS. 115A and 115B plot the frequency of the microwaves applied to a DNV sensor on the x-axis versus the amount of light of a particular frequency (e.g., red) emitted from the diamond. FIG. 115A is the frequency response of the DNV sensor with no magnetic field applied to the diamond, and FIG. 115B is the frequency response of the DNV sensor with a seventy gauss (G) magnetic field applied to the diamond.

As shown in FIG. 115A, when no magnetic field is applied to the DNV sensor, there are two notches in the frequency response. With no magnetic field applied to the DNV sensor, the spin states are not resolvable. That is, with no magnetic field, the NV centers with various spin states are equally excited and emit light of the same frequency. The two notches shown in FIG. 115A are the result of the positive and negative spin directions. The frequency of the two notches is the axial zero field splitting parameter.

When a magnetic field is applied to the DNV sensor, the spin states become resolvable in the frequency response. Depending upon the excitation by the magnetic field of NV centers of a particular spin state, the notches corresponding to the positive and negative directions separate on the frequency response graph. As shown in FIG. 115B, when a magnetic field is applied to the DNV sensor, eight notches appear on the graph. The eight notches are four pairs of corresponding notches. For each pair of notches, one notch corresponds to a positive spin state and one notch corresponds to a negative spin state. Each pair of notches corresponds to one of the four spin states of the NV centers. The amount by which the pairs of notches deviate from the axial zero field splitting parameter may be dependent upon how strongly the magnetic field excites the NV centers of the corresponding spin states.

As mentioned above, the magnetic field at a point can be characterized by a vector with a magnitude and a direction. By varying the magnitude of the magnetic field, all of the NV centers will be similarly affected. Using the graph of FIG. 115A as an example, the ratio of the distance from 2.87 GHz of one pair to another will remain the same when the magnitude of the magnetic field may be altered. As the magnitude is increased, each of the notch pairs will move away from 2.87 GHz at a constant rate, although each pair will move at a different rate than the other pairs.

When the direction of the magnetic field is altered, however, the pairs of notches do not move in a similar manner to one another. FIG. 116A is a diagram of NV center spin states in accordance with an illustrative embodiment. FIG. 116A conceptually illustrates the four spin states of the NV centers. The spin states are labeled NV A, NV B, NV C, and NV D. Vector 11601 is a representation of a first magnetic field vector with respect to the spin states, and Vector 11602 is a representation of a second magnetic field vector with respect to the spin states. Vector 11601 and vector 11602 have the same magnitude, but differ in direction. Accordingly, based on the change in direction, the various spin states will be affected differently depending upon the direction of the spin states.

FIG. 116B is a graph illustrating the frequency response of a DNV sensor in response to a changed magnetic field in accordance with some illustrative embodiments. The frequency response graph illustrates the frequency response of the DNV sensor from the magnetic field corresponding to vector 11601 and to vector 11602. As shown in FIG. 116B, the notches corresponding to the NV A and NV D spin states moved closer to the axial zero field splitting parameter from vector 11601 to vector 11602, the negative (e.g., lower frequency notch) notch of the NV C spin state moved away from the axial zero field splitting parameter, the positive (e.g., high frequency notch) of the NV C spin state stayed essentially the same, and the notches corresponding to the NV B spin state increased in frequency (e.g., moved to the right in the graph). Thus, by monitoring the changes in frequency response of the notches, the DNV sensor can determine the direction of the magnetic field.

Although specific mentions to DNV sensors are made, any other suitable magnetometer may be used. For example, any suitable DNV sensor that can determine the magnitude and angle of a magnetic field can be used. In an illustrative embodiment, a sensor that functions as described above may be used, even if the diamond material is replaced with a different magneto-optical defect center material. Furthermore, although nitrogen vacancies are described herein, any other suitable vacancy or defect may be used that functions in a similar manner. In yet other embodiments, any other suitable type of magnetometer that determines a magnitude and direction of a magnetic field can be used, even if such a magnetometer does not include a magneto-optical defect center material. That is, the various embodiments and/or techniques described herein need not be limited to a particular style or type of magnetometer and can use any suitable phenomena, physical characteristics, or mathematical principals. Although references to DNV sensors are made herein, the DNV sensors may be replaced with any other suitable type of magnetometer.

FIGS. 117A and 117B are diagrams of a buoy-based DNV sensor array in accordance with some illustrative embodiments. The system 11700 includes a buoy 11705, DNV sensors 11710, a tether 11715, and an anchor 11720 in water 11745. In FIG. 117A, there is no magnetic object 11725 and the earth's magnetic flux lines 11730 are relatively straight. In FIG. 117B, the magnetic object 11725 causes a disturbance in the earth's magnetic field and causes a change in the earth's magnetic flux lines 11730 as compared to the earth's magnetic flux lines of FIG. 117A. In alternative embodiments, additional, fewer, and/or different elements may be used. For example, the embodiments shown in FIGS. 117A and 117B each show three DNV sensors 11710, but in alternative embodiments, more or less than three DNV sensor 11710 may be used. Further, in alternative embodiments, each object labeled 11710 in FIG. 117A may include more than one DNV sensor. For example, each object labeled 11710 may include two, three, four, etc. DNV sensors.

In the system 11700 of FIG. 117A, the DNV sensors 11710 are attached to the buoy 11705 via the tether 11715. The buoy 11705 floats at the surface of the water 11745. In alternative embodiments, the buoy 11705 can have any suitable density and may be suspended in the water 11745. For example, the buoy 11705 may be suspended slightly below the surface of the water 11745. In some embodiments, the buoy 11705 may include a propulsion system that can cause the buoy 11705 to be moved through the water 11745.

In some embodiments, the system 11700 can include an inertial compensation system. For example, the inertial compensation system can be an electronic and/or software component that accounts for movement of the DNV sensors 11710 and/or the buoy 11705. For example, as the buoy 11705 moves up and down or side to side with the waves of the water 11745, the inertial compensation system can account for such movements. For example, in some embodiments, the DNV sensors 11710 may not always be equally spaced apart, but may move with respect to one another depending upon the movement of the buoy 11705. Any suitable inertial compensation system can be used. For example, an inertial compensation system may be implemented as software running on one or more processors of the buoy 11705.

The DNV sensors 11710 hang from the buoy 11705 via the tether 11715. The DNV sensors 11710 are distributed along the tether 11715 such that the DNV sensors 11710 are at different depths. The anchor 11720 may be attached at the end of the tether 11715. In an illustrative embodiment, the anchor 11720 sits on or is embedded in the floor of the body of water 11745 (e.g., the bottom of the sea or ocean). For example, the anchor 11720 can anchor the buoy 11705 such that the buoy 11705 may be relatively stationary and does not float away. In an alternative embodiment, the anchor 11720 can hang from the buoy 11705. In such an embodiment, the anchor 11720 can be used to keep the tether 11715 taut. In an alternative embodiment, the anchor 11720 may not be used. For example, the tether 11715 may be a rod.

In an illustrative embodiment, the buoy 11705 includes electronics. For example, the buoy 11705 can include a processor in communication with the DNV sensors 11710. The buoy 11705 can include a location sensor (e.g., a global positioning system (GPS) sensor). In an illustrative embodiment, the buoy 11705 communicates wirelessly with a base station or remote server. For example, satellite communications can be used by the buoy 11705 to communicate with external devices.

In an illustrative embodiment, the DNV sensors 11710 communicate with the buoy 11705 via the tether 11715. For example, the tether 11715 can include one or more communication wires with which the DNV sensors 11710 communicate with the buoy 11705. In alternative embodiments, any suitable method of communication can be used, such as wireless communication or fiber optics.

In an illustrative embodiment, the buoy 11705 and the DNV sensors 11710 are relatively stationary over time. That is, the anchor 11720 keeps the tether 11715 taut and the DNV sensors 11710 are fixed to the tether 11715 such that constant distances are maintained between the buoy 11705 and the DNV sensors 11710. In some embodiments, the buoy 11705 and the DNV sensors 11710 move up and down with respect to the earth along with the level of the water 11745, such as with tides, waves, etc. In alternative embodiments, the anchor 11720 rests on the floor of the body of water 11745, and the buoy 11705 keeps the tether 11715 taught because the buoy 11705 is buoyant. In such embodiments, the buoy 11705 may move with respect to the earth with movement of the water 11745 caused, for example, tidal movements, currents, etc. In most embodiments, however, the buoy 11705 and the DNV sensors 11710 are not subject to sudden movements. As noted above, in some embodiments, an inertial compensation system can be used to compensate for movement of the DNV sensors 11710 and/or the buoy 11705. For example, the DNV sensors 11710 may not always be aligned together. That is, some of the DNV sensors 11710 may be tilted. In such an example, the inertial compensation system can adjust the measurements (e.g., the directional component of the vector measurement) to account for the tilt of the DNV sensors 11710 such that the adjusted measurements are as if all of the DNV sensors 11710 were aligned when the measurements were taken. In such embodiments, the DNV sensors 11710 can include sensors that measure the orientation of the DNV sensors 11710 (e.g., accelerometers).

Each of the DNV sensors 11710 can be configured to take measurements of a magnetic field. For example, each of the DNV sensors 11710 determine a vector measurement of the earth's magnetic field. The DNV sensors 11710 take simultaneous measurements of the earth's magnetic field. The DNV sensors 11710 can transmit the measured magnetic field to the buoy 11705. In an illustrative embodiment, the buoy 11705 compares the measurements from each of the DNV sensors 11710. If the measurements are the same (or substantially the same), then the buoy 11705 can determine that there is not a magnetic object nearby. If there is a difference that is above a threshold amount in either the direction or the magnitude of the sensed magnetic field, the buoy 11705 can determine that there is a magnetic object nearby. In an alternative embodiment, the buoy 11705 does not make such determinations, but transmits the measurements to a remote computing device that makes the determinations.

FIGS. 117A and 117B show the system 11700 with and without a nearby magnetic object 11725. The magnetic object 11725 can be any suitable paramagnetic or ferromagnetic object such as a ship, a boat, a submarine, a drone, an airplane, a torpedo, a missile, etc. The magnetic flux lines 11730 are the dashed lines of FIGS. 117A and 117B and are meant to a magnetic field for explanatory purposes. The magnetic flux lines 11730 are meant to be illustrative and explanatory only and not meant to be limiting. In an illustrative embodiment, the magnetic flux lines 11730 are representative of the earth's magnetic field. In an alternative embodiment, any suitable source of a magnetic field can be used other than the earth, such as an electromagnet, a permanent magnet, etc.

As shown in FIG. 117A, without the magnetic object 11725, the magnetic flux lines 11730 are straight and parallel. Thus, the angle of the magnetic flux lines 11730 through each of the DNV sensors 11710 may be the same. Accordingly, when the angles of the magnetic field sensed by each of the DNV sensors 11710 are compared to one another, the angles will be the same and the buoy 11705 can determine that there may be not a magnetic object (e.g., the magnetic object 11725) nearby.

However, when a magnetic object 11725 is nearby, as in the embodiment shown in FIG. 117B, the magnetic flux lines 11730 can be disturbed and/or otherwise affected. The magnetic flux lines 11730 of FIG. 117B do not pass through the DNV sensors 11710 at the same angle. Rather, depending upon how far away from the buoy 11705 that the DNV sensors 11710 are, the angle of the magnetic flux lines 11730 changes. Put another way, the angle of the magnetic field corresponding to the magnetic flux lines 11730 may be not the same along the length of the tether 11715. Thus, the sensed magnetic field angle by each of the DNV sensors 11710 are not the same. Based on the difference in the magnetic field angle from the DNV sensors 11710, the buoy 11705 can determine that the magnetic object 11725 may be nearby.

Similarly, the strength of the earth's magnetic field can be used to determine whether a magnetic object may be nearby. In the embodiment of FIG. 117A in which there is no magnetic object 11725, the density of the magnetic field lines 11730 may be consistent along the length of the tether 11715. Thus, the magnitude of the magnetic field sensed by each of the DNV sensors 11710 may be the same. However, when the magnetic object 11725 disrupts the magnetic field, the density of the magnetic flux lines 11730 along the tether 11715 (e.g., at the multiple DNV sensors 11710) may be not the same. Thus, the magnitude of the magnetic field sensed by each of the DNV sensors 11710 may be not the same. Based on the differences in magnitude, the buoy 11705 can determine that the magnetic object 11725 may be nearby.

In an illustrative embodiment, the differences between the sensed magnetic field at each of the DNV sensors 11710 can be used to determine the location and/or size of the magnetic object 11725. For example, a larger magnetic object 11725 will create larger differences in the magnetic field along the tether 11715 (e.g., angle and magnitude) than a smaller magnetic object 11725. Similarly, a magnetic object 11725 that is closer to the tether 11715 and the DNV sensors 11710 will create larger differences than the same magnetic object 11725 that may be further away.

In an illustrative embodiment, the DNV sensors 11710 make multiple measurements over time. For example, each DNV sensor 11710 can take a sample once per minute, once per second, once per millisecond, etc. The DNV sensors 11710 can take their measurements simultaneously. In some instances, the magnitude and/or the direction of the earth's magnetic field can change over time. However, if each of the DNV sensors 11710 sense the earth's magnetic field at the same time, the changes in the earth's magnetic field are negated. Changes in the earth's magnetic field (e.g., a background magnetic field) can be caused, for example, by solar flares. Thus, all of the DNV sensors 11725 are affected the same by changes in the earth's magnetic field/the background magnetic field.

For example, the DNV sensors 11710 each simultaneously take a first measurement of the earth's magnetic field. The buoy 11705 can compare the first measurements of each of the DNV sensors 11710 to determine if there may be a magnetic object 11725 nearby. The earth's magnetic field can change and, subsequently, the DNV sensors 11710 each simultaneously take a second measurement of the earth's magnetic field. The buoy 11705 can compare the second measurements of each of the DNV sensors 11710 to determine if there may be a magnetic object 11725 nearby. In both the first and second measurement sets, the buoy 11705 compares the respective measurements to each other. Thus, if there is a change in the earth's magnetic field, the system 11700 is unaffected because each of the DNV sensors 11710 sense the same changes. That is, if there is no magnetic object 11725 nearby, then subtracting the measurement of one DNV sensor 11710 from another is zero. This is true regardless of the strength or direction of the earth's magnetic field. Thus, the system 11700 is unaffected if the earth's magnetic field changes from one measurement set to another.

In an illustrative embodiment, the buoy 11705 includes one or more computer processors that use electrical power. The buoy 11705 can include a battery to power various components such as the processors. In an illustrative embodiment, the battery of the buoy 11705 powers the DNV sensors 11710. In some embodiments, the buoy 11705 can include one or more power generation systems for providing power to one or more of the various components of the system 11700 such as the processors, the battery, the DNV sensors 11710, etc. For example, the buoy 11705 can include a solar panel, a tidal generator, or any other suitable power generation system.

In an illustrative embodiment, the buoy 11705 includes a GPS sensor to determine the location of the buoy 11705. The buoy 11705 can transmit information such as the location of the buoy 11705, an indication of whether a magnetic object may be nearby and/or where the magnetic object is, the measurements from the DNV sensors 11710, etc. to a remote station via radio transmissions. The radio transmissions can be transmitted to a satellite, a base station, etc. via one or more antennas.

Although FIGS. 117A and 117B illustrate the buoy 11705 and the DNV sensors 11710 in water 11745, alternative embodiments may include the buoy 11705 and the DNV sensors 11710 in any suitable substance. For example the, buoy 11705 may be a balloon such as a weather balloon and the DNV sensors 11710 may be suspended in the air. In another embodiment, the buoy 11705 may be placed terrestrially and the DNV sensors 11710 can be located underground. In some embodiments, the system 11700 may be free-floating in space to detect, for example, satellites.

FIG. 118 is a flow chart of a method for monitoring for magnetic objects in accordance with some illustrative embodiments. In alternative embodiments, additional, fewer, and/or different elements may be used. Also, the used of a flow chart and/or arrows is not meant to be limiting with respect to the order of operations or flow of information. For example, in some embodiments, two or more operations may be performed simultaneously.

In an operation 11805, measurements from magnetometers are received. For example, the buoy 11705 can receive vector magnetic measurements taken by the DNV sensors 11710. In some illustrative embodiments, the measurements are received simultaneously form multiple magnetometers. In some alternative embodiments, the magnetometers take simultaneous measurements, but the buoy 11705 receives the measurements sequentially.

In an operation 11810, the received measurements are compared. In some illustrative embodiments, the buoy subtracts a first measurement from a second measurement that were received in the operation 11805. In embodiments in which more than two measurements are received in the operation 11805, an arbitrary one of the measurements is used as a reference measurement, and the other measurements are compared to the reference measurement. In some alternative embodiments, all of the measurements are compared to all of the other measurements.

In an operation 11815, it is determined whether the differences between the measurements are greater than a threshold amount. In some illustrative embodiments, each of the differences determined in the operation 11815 are compared to a threshold amount. In embodiments in which the measurements are vector measurements, the differences in the angle are compared to an angle threshold amount, and the differences in the magnitude are compared to a magnitude threshold amount.

In some illustrative embodiments, if any of the differences are greater than the threshold amount, then the operation 11815 determination is "yes." In some alternative embodiments, the determination of the operation 11815 is "yes" if enough of the differences are above the threshold amount. For example, if more than 25% of the differences are greater than the threshold amount, then the determination of the operation 11815 is "yes." In other embodiments, any suitable amount of differences can be used, such as 50%, 75%, etc.

If the determination of the operation 11815 is not "yes," then in an operation 11820, it is determined that there may not be a magnetic object nearby. The method 11800 proceeds to the operation 11805. If the determination of the operation 11815 is "yes," then in an operation 11825, it may be determined that a magnetic object (e.g., the magnetic object 11725) is nearby.

In an operation 11830, the size and/or location of the nearby magnetic object may be determined. For example, based on the differences in the angle and/or the magnitude of the measurements are used to determine the size and location of the magnetic object 11725. In an illustrative embodiment, the determined differences are compared to a database of previously-determined magnetic objects. For example, magnetic objects of various sizes and at various distances can be measured by a system such as the system 11700. The differences in the magnetometer measurements can be stored in connection with the size and location of the magnetic object. The differences determined in the operation 11810 can be compared to the differences stored in the database to determine which size and location most closely matches with the differences stored in the database. In such an example, the size and location corresponding to the closest match may be determined to be the size and location of the magnetic object in the operation 11830. In an illustrative embodiment, the database may be stored locally or may be stored remotely.

In embodiments in which the database may be stored remotely, the differences determined in the operation 11810 can be transmitted to a remote computing device that can perform the operation 11830. In an illustrative embodiment, the determination made in the operations 11820, 11825, and/or 11830 are transmitted to a remote computing device (e.g., wirelessly). As shown in FIG. 118, the method 11800 proceeds to the operation 11805.

FIG. 119 is a diagram of a buoy-based DNV sensor array in accordance with some illustrative embodiments. The system 11900 includes a buoy 11905, DNV sensors 11910, tethers 11915, and a magnetic object 11925. In alternative embodiments, additional, fewer, and/or different elements may be used. For example, although FIG. 119 illustrates an embodiment with three DNV sensors 11910, any suitable number of DNV sensors 11910 can be used such as two, four, five, ten, twenty, a hundred, etc. DNV sensors 11910 can be used.

In some illustrative embodiments, the buoy 11905 is similar to or the same as the buoy 11705. The DNV sensors 11910 are connected to the buoy 11905 via the tethers 11915. In some illustrative embodiments, the DNV sensors 11910 communicate with the buoy 11905 via their respective tethers 11915. In alternative embodiments, the tethers 11915 may not be used, and the DNV sensors 11910 can communicate with the buoy via wireless communications.

In the embodiments shown in FIG. 119, the buoy 11905 and the DNV sensors 11910 float on the water 11945. In alternative embodiments, any suitable arrangement may be used. For example, the buoy 11905 and/or the DNV sensors 11910 may sink to the floor of the body of water 11945 (e.g., the sea floor). In alternative embodiments, the buoy 11905 and/or the DNV sensors 11910 may be suspended in the water 11945. For example, the buoy 11905 may float at the surface of the water 11945, some of the DNV sensors 11910 float on the surface of the water 11945, and some of the DNV sensors 11910 may be suspended within the column of water 11945.

In an illustrative embodiment, each of the DNV sensors 11910 can monitor their location. For example, the DNV sensors 11910 can each include a GPS sensor that determines the geographical location of the respective DNV sensor 11910. In another example, the buoy 11905 and/or the DNV sensors 11910 monitor the location of the DNV sensors 11910 with respect to the buoy 11905. For example, the direction that each DNV sensor 11910 is from the buoy 11905, the distance that each DNV sensor 11910 is from the buoy 11905, and/or the depth that each DNV sensor 11910 is under the surface of the water 11945 can be monitored.

In some illustrative embodiments, each of the DNV sensors 11910 take a vector measurement of a magnetic field such as the earth's magnetic field. Each vector measurement includes an angular component and a magnitude. In some illustrative embodiments, each of the DNV sensors 11910 takes a measurement of the magnetic field simultaneously. Each of the DNV sensors 11910 transmit the measurement of the magnetic field to the buoy 11905. The buoy 11905 can store the multiple measurements together, such as a set. In illustrative embodiments, the buoy 11905 stores the measurements locally on a storage device of the buoy 11905. In an alternative embodiment, the buoy 11905 causes the measurements to be stored remotely, such as on a remote server. For example, the buoy 11905 can transmit the measurements wirelessly to a remote server or database.

In some illustrative embodiments, each of the DNV sensors 11910 take multiple measurements over time. For example, the buoy 11905 receives a first set of measurements from the DNV sensors 11910, then a second set of measurements, etc. The first set of measurements can be compared to the second set of measurements. If there is a difference between the first set and the second set of measurements, then it can be determined that a magnetic object 11925 may be nearby.

As mentioned above, the earth's magnetic field and/or the background magnetic field can change over time. Thus, in some instances, there are relatively minor differences between the first set of measurements and the second set of measurements because of the change in the earth's magnetic field. Accordingly, in an some illustrative embodiments, it may be determined that the magnetic object 11725 is nearby if the differences between the first set of measurements and the second set of measurements is larger than a threshold amount. The threshold amount can be large enough that changes from the first set to the second set caused by the changes in the earth's magnetic field are ignored, but is small enough that changes caused by movement of the magnetic object 11925 are larger than the threshold amount.

In some illustrative embodiments, the first set of measurements may be compared to the second set of measurements by comparing the measurements from respective DNV sensors 11910. For example, the measurement form a first DNV sensor 11910 in the first set may be compared to the measurement from the first DNV sensor 11910 in the second set. In some illustrative embodiments, if the difference from the first set to the second set from any one of the DNV sensors 11910 is above a threshold amount (e.g., the direction and/or the magnitude), then it is determined that the magnetic object 11925 is nearby. In an alternative embodiment, the differences from each of the DNV sensors 11910 are combined and if the combined differences are greater than the threshold amount, then it is determined that the magnetic object 11925 is present.

For example, the DNV sensors 11910 each take a measurement of the magnetic field once per second. The buoy 11905 receives each of the measurements and stores them as sets of measurements. The most recently received set of measurements is compared to the previously received set of measurements. As the magnetic object 11925 moves closer or moves around when in detection range, the magnetic object 11925 disrupts the magnetic field. The DNV sensors 11910 may be distributed around the buoy 11905 and the magnetic field at the points detected by the DNV sensors 11910 may be affected differently based on the location of the magnetic object 11925. In an alternative embodiment, the vector measurements from each set are compared to one another, similar to the method described with respect to FIG. 118.

In an illustrative embodiment, the size and/or location of the magnetic object 11925 can be determined based on the changes from one set of measurements to another. For example, DNV sensors 11910 can each send its location and the magnetic measurement. It can be determined that the DNV sensor 11910 with the largest change in measurement is closest to the magnetic object 11925. The amount of change in the DNV sensors 11910 around the DNV sensor 11910 with the largest change in measurement can be used to determine the direction of movement and the location of the magnetic object 11925. For example, if the rate of change is increasing away from a baseline amount for a DNV sensor 11910, it can be determined that the magnetic object 11925 is approaching the DNV sensor 11910.

FIG. 120 is a diagram of an aerial DNV sensor array in accordance with an illustrative embodiment. An illustrative system 12000 includes unmanned aerial systems (UASs), a magnetic object 12025, and a central processing unit 12035. In an illustrative embodiment, one DNV sensor is mounted to each UAS 12010. In an alternative embodiment, each UAS 12010 has multiple DNV sensors mounted thereto. In alternative embodiments, additional, fewer, and/or different elements may be used. For example, although three UASs 12010 are shown in FIG. 120, alternative embodiments may use two, four, five, six, ten, twenty, one hundred, etc. UASs 12010.

In an illustrative embodiment, inertial stabilization and/or compensation can be used for the DNV sensors on the UASs 12010. For example, one or more gyroscopic inertial stabilization systems can be used to reduce the vibration and/or to compensate for the movement of the UAS 12010. For example, the UAS 12010 may lean to the right with respect to the earth, but the inertial stabilization system can cause the DNV sensor to remain parallel (or in any other suitable position) with respect to the earth.

In an illustrative embodiment, an inertial compensation system can be used on the UASs 12010. For example, a sensor can monitor the vibration and/or position of the body of the UAS 12010. The DNV sensor can be securely attached to the body of the UAS 12010. The sensed vibration and/or position of the body can be used to augment the vector reading from the DNV sensor. For example, a first DNV vector measurement may be taken when the UAS 12010 is parallel to the earth. A second DNV sensor vector measurement may be taken with the UAS 12010 is leaning to the right with respect to the earth. The inertial compensation system can adjust the vector measurement of the second DNV sensor measurement such that the measurement is as if the UAS 12010 was parallel with respect to the earth. For example, the a compensation angle can be added to the angle component of the vector measurement.

In an illustrative embodiment, the UASs 12010 can be used to detect and locate the magnetic object 12025. The magnetic object 12025 can be any suitable paramagnetic or ferromagnetic object or any suitable device that generates a magnetic field, such as a ship, a boat, a submarine, a drone, an airplane, a torpedo, a missile, a tank, a truck, a car, land mines, underwater mines, railroad tracks, pipelines, electrical lines, etc.

In some illustrative embodiments, the earth's magnetic field of an area can be mapped and stored in a database, such as at the central processing unit 12035. For example, the UASs 12010 can fly around the area and each take multiple magnetometer readings across the area to determine a baseline magnetic field of the area. In some illustrative embodiments, once a baseline map of the area has been determined, the UASs 12010 can monitor the area for changes from the baseline map. For example, after a baseline map is generated, a second map of the area can be generated. In some illustrative embodiments, the baseline map and the second map include measurement locations that are the same. The baseline map and the second map can be compared to one another. If there has been movement from a magnetic object (e.g., the magnetic object 12025), then the baseline map and the second map will have differences. If there is no movement from the magnetic object 12025, then the baseline map and the second map will be largely the same.

As noted above, a measurement of the earth's magnetic field can include interference from various sources and/or changes over time. However, in some instances, the changes over time are gradual and relatively slow. Thus, in some illustrative embodiments, the baseline map and the second map can be generated relatively close in time to one another. That is, the closer that the baseline map and the second map are generated, the differences from the baseline map and the second map will be caused more from the magnetic object 12025 rather than changes in the earth's magnetic field. To put it another way, common mode rejection or moving target indication processing can be used to determine that the magnetic object 12025 is moving.

However, in some embodiments, the interference or noise can be removed from the measurements of the UASs 12010. That is, the measurements from the UASs 12010 can be taken simultaneously (e.g., be time-aligned). Thus, the measurements from each of the UASs 12010 are affected the same from the interference sources (e.g., the sun). Any suitable common-mode rejection techniques can be used, such as using Fourier transforms (e.g., fast-Fourier transforms (FFT)) or other frequency-domain methods for identifying and removing frequencies that are not consistent over time (e.g., not the earth's magnetic field frequency). In some instances, the multiple measurements can be subtracted from one another in the time domain to identify (and remove) the noise.

In some embodiments, noise in the various measurements will cancel statistically because the noise is uncorrelated. Thus, comparing a baseline map to additional vector measurements (e.g., a second map), motion of the magnetic object 12025 can be detected. By analyzing the changes in the magnetic field, the direction of movement of the magnetic object 12025 can be determined. Similarly, based on the changes in the detected earth's magnetic field, additional details of the magnetic object 12025 can be determined. For example, the size and/or dimensions of the magnetic object 12025 can be determined. In some instances, based on the changes in the earth's magnetic field, the magnetic object 12025 can be classified as a type of a magnetic object (e.g., a vehicle, a generator, a motor, a submarine, a boat, etc.).

In some embodiments, the earth's magnetic lines will form distinct patterns around metallic and/or magnetic objects. Such patterns can be mapped (e.g., using the UASs 12010) and compared to previously-determined patterns corresponding to known objects to determine what the object is. Such a technique may be used regardless of whether the object is moving. For example, for a large object such as a submarine, a single mapping of the earth's magnetic field may be used to determine that the object is a submarine based on the pattern of the earth's magnetic field lines. In such an example, it may also be determined that the disturbances in the earth's magnetic field lines are caused by an object of interest (e.g., the submarine) because no other metallic objects are around (e.g., there are no steel buildings in the middle of the ocean).

In some embodiments, the UASs 12010 fly around the area that was previously mapped. Each of the UASs 12010 transmits their measurement and location to the central processing unit 12035. The UASs 12010 can determine their location using any suitable method, such as GPS, celestial or stellar navigation, radio or LORAN navigation, etc. The location of the UASs 12010 can include a coordinate (e.g., latitude and longitude) and an elevation. In such embodiments, the location of the UASs 12010 can be a three-dimensional location. In an illustrative embodiment, the central processing unit 12035 can determine the location of each of the UASs 12010. For example, each of the UASs 12010 can transmit a message at the same time. Based on the time that the message reaches the central processing unit 12035 (e.g., the travel time of the message) and the direction from which the message was received, the central processing unit 12035 can determine the location of each of the UASs 12010. In alternative embodiments, any suitable method of monitoring the location of the UASs 12010 can be used.

In some embodiments, the central processing unit 12035 can compare the received measurement from each of the UASs 12010 with the magnetic field of the baseline map corresponding to the location of the respective UAS 12010. For example, the central processing unit 12035 can receive a measurement and a location from a UAS 12010. The central processing unit 12035 can determine or look up an expected magnetic field measurement based on the location of the UAS 12010 and the previously-determined magnetic field map. If the difference between the expected measurement and the received measurement is above a threshold amount, it can be determined that the magnetic object 12025 is not within the monitored area.

In some instances, the magnetic object 12025 creates a magnetic field. For example, engines or motors can create magnetic fields. In some embodiments, the magnetic object 12025 is a direct-current motor that creates a magnetic field. In some embodiments, the magnetic field of the magnetic object 12025 can be detected by the UASs 12010.

In some illustrative embodiments, the magnetic object 12025 creates a magnetic field that is detected by two or more of the UASs 12010. For example, the previously-determined magnetic map of the area can be used to subtract the earth's magnetic field (or any other background magnetic field) from the measurement, thereby leaving the magnetic field generated by the magnetic object 12025. For example, the expected magnetic measurement is a vector measurement determined from a pre-determined map and the location of the UAS 12010. The measurement from the UAS 12010 is also a vector. The pre-determined vector measurement can be subtracted from the vector measurement of the UAS 12010. The resultant vector can be used to determine the location of the magnetic object 12025. For example, the vector direction from the location of the UAS 12010 can be used to determine the location of the magnetic object 12025 by determining the intersection of the earth's surface and the vector direction. In such an example, it is assumed that the magnetic object 12025 is on the surface of the earth's surface.

In some illustrative embodiments, the magnetic object 12025 creates a unique magnetic field that can be used to determine what the magnetic object 12025 is. For example, a direct current motor may have a magnetic signature that is different than an automobile engine. The magnetic field of the magnetic object 12025 can be detected and the magnetic signature of the magnetic object 12025 can be used to identify the magnetic object 12025. In some embodiments, the magnetic field of the magnetic object 12025 is distinguished from the earth's magnetic field (e.g., by subtraction of a baseline map and a second map).

In another example, the magnetic field from the magnetic object 12025 can be measured from two (or more) UASs 12010. Di-lateration (or multilateration) can be used to determine the location of the magnetic object 12025. For example, based on the determined vector of the magnetic object from the location of each of the UASs 12010, the location of the magnetic object 12025 can be determined to be the intersection of the vector directions.

In some illustrative embodiments, the system 12000 can be used to map large magnetic objects. For example, oil fields have subterranean oil spread over large areas. Like the earth's oceans, the oil in the oil fields are affected by tides. That is, the body of oil flows from one end of the oil field to the other. Thus, the depth of the oil field changes throughout a day based on the tidal flow of the oil. Accordingly, the effect on the earth's magnetic field sensed above ground over the oil field changes throughout the day based on the tidal flow of the oil. In an illustrative embodiment, the UASs 12010 can fly around an area and monitor the change in the sensed earth's magnetic field. For areas above the oil field with oil, the earth's magnetic field as sensed by the UASs 12010 will fluctuate on a cycle that is similar to the tidal cycle of the oceans. For areas that are not above the oil, the earth's magnetic field will not be affected on a tidal cycle. Accordingly, by monitoring the sensed earth's magnetic field over a period of time such as 12 hours, 24 hours, 36 hours, two days, three days, a week, etc. over an area, it can be determined where the oil field is (e.g., where the oil is) by determining which areas have tidal changes in the sensed earth's magnetic field.

Although FIG. 120 illustrates the UASs 12010 as aerial devices, any other suitable dirigible or device may be used. For example, DNV sensors may be attached to autonomous cars or other terrestrial vehicles. In another example, DNV sensors may be attached to autonomous ships or submarines. In alternative embodiments, the devices may not be autonomous but may be remotely controlled (e.g., by the central processing unit). In yet other embodiments, the devices may controlled in any suitable fashion, such as via an onboard pilot. Embodiments of the teachings described herein need not be limited to certain types of vehicles.

FIG. 121 is a flow chart of a method for monitoring for magnetic objects in accordance with an illustrative embodiment. In alternative embodiments, additional, fewer, and/or different elements may be used. Also, the used of a flow chart and/or arrows is not meant to be limiting with respect to the order of operations or flow of information. For example, in some embodiments, two or more operations may be performed simultaneously.

In an operation 12105, first magnetic readings of an area to be monitored are received. For example, the UASs 12010 can fly around the area to be monitored. Each of the UASs 12010 can take a magnetic measurement using, for example, a DNV sensor, and the UASs 12010 can transmit to the central processing unit 12035 the magnetic reading and the location of the respective UAS 12010 when the reading was taken. In an operation 12110, the first magnetic readings received in the operation 12105 is used to generate a baseline map of the area. For example, each of the measurements can be stored in connection with the three-dimensional location. In some instances the individual measurements can be averaged over the space to create the baseline map.

In an operation 12120, second magnetic readings of the area are received. For example, the UASs 12010 can fly around the area and monitor the magnetic field of the area. The measured magnetic field and the location of the respective UAS 12010 can be transmitted to the central processing unit 12035. In an operation 12125, the second magnetic readings are compared to the baseline map. For example, a measurement received from a UAS 12010 and the measurement is compared to a measurement from the baseline map corresponding to the location of the UAS 12010.

In an operation 12130, it is determined whether differences between the second magnetic readings and the baseline map are greater than a threshold amount. In an illustrative embodiment, if the received differences in either the magnitude or the direction of the second magnetic readings and the baseline map are greater than a threshold amount, then it is determined in an operation 12135 that there is a magnetic object in the area. If not, then in the operation 12145, it is determined that there is not a magnetic object in the area.

In an operation 12140, the location of the magnetic object is determined. In an illustrative embodiment, the difference in the direction from two or more UAS 12010 measurements and the direction of the stored baseline map can be used to determine the location of the magnetic object. Any suitable technique for determining the location of the magnetic object can be used, such as di-lateration, multilateration, triangulation, etc.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Di-Lateration Implementation

In some implementations, the devices 300, 600A, 600B, 600C, 700, 2500, and/or 4200 can be implemented in a system using di-lateration.

FIGS. 122A-122C are diagrams illustrating di-lateration techniques in accordance with an illustrative embodiment. FIG. 122A includes two scalar magnetometers 12205 and a magnetic source 12210 in accordance with an illustrative embodiment. In FIG. 122A, the magnetic source 12210 is in the X-Y plane. The dashed line marked 12220 is the radius from the intersection of the X, Y, and Z axes. The dashed line marked 12215 is an arc indicating the distance from the Y axis.

Using traditional di-lateration techniques, the scalar magnetometers 12205 can determine the location of the magnetic source 12210 by monitoring the time difference between changes in the sensed magnetic field. For example, a change in the magnetic field of the magnetic source 12210 will first be sensed by the scalar magnetometer 12205 that is closer to the magnetic source 12210 and then by the scalar magnetometer 12205 that is further away. The length of time between the first scalar magnetometer 12205 and the second magnetometer 12205 sensing the change in the magnetic field can be used to determine the location of the magnetic source 12210.

However, traditional di-lateration techniques cannot precisely locate the magnetic source 12210 in a three-dimensional space using only two scalar magnetometers 12205. FIG. 122B is a diagram of the system in FIG. 122A with the magnetic source 12210 moved in the Z direction. In the system of FIG. 122B, the dashed line 12230 indicates the distance that the magnetic source 12230 moved in the Z direction. The two scalar magnetometers 12205 cannot distinguish the position of the magnetic source 12210 in FIG. 122A from the position of the magnetic source 12210 in FIG. 122B. Rather, to distinguish from the two positions, at least one more scalar magnetometer is required. In practice, the more scalar magnetometers that are used, the more accurate the location of the magnetic source 12210 can be determined.

Using two vector magnetometers 12255, the location of the magnetic source 12210 can be determined in any position in the three-dimensional space. Each of the vector magnetometers 12255 can determine a strength and direction of the magnetic field produced by the magnetic source 12210. The vector direction is orthogonal to the direction that the magnetic source 12210 is in. The magnitude or strength of the magnetic field is the same as the measurement of the scalar magnetometers 12205. Thus, based on the strength of the magnetic field and the direction of the magnetic field sensed by both of the vector magnetometers 12255, the location of the magnetic source 12210 can be determined.

Two vector magnetometers 12255 can be used to determine the location of the magnetic source 12210 whether the magnetic field from the magnetic source 12210 changes (e.g., propagates) or is static. That is, di-lateration can be used to monitor the time between when the change sensed by the two vector magnetometers 12255. Using the time difference between the two vector magnetometers 12255, a locational plane of the magnetic source 12210 can be determined as with the scalar magnetometers 12205 of FIGS. 122A and 122B. The direction components of the vector measurement can be used to precisely locate the magnetic source 12210 on the plane of possible locations.

In an embodiment in which the magnetic field does not change over time, the two vector magnetometers 12255 can be used to determine the location of the magnetic source 12210. The relative strength of the magnetic field can be used to determine the plane of possible locations, which can be the same information determined by the di-lateration using the two scalar magnetometers 12205. The directional component of the vector measurement can be used to precisely locate the magnetic source 12210 on the plane of possible locations.

Although two vector magnetometers 12255 can be used to locate the magnetic source 12210, using additional vector magnetometers can be used to determine more information about the magnetic source 12210. For example, additional vector magnetometers can be used to determine the number of poles of the magnetic source 12210 (e.g., dipole, tripole, etc.). In another example, additional vector magnetometers can be used to determine the orientation of the magnetic source 12210 (e.g., which end of the magnetic source 12210 is the north pole and which is the south pole). Locating a magnetic source using di-lateration of two vector magnetometers can be used by the system 11700, the system 11900, the system 12000, or any other suitable system with two or more vector magnetometers.

The process described herein may be implemented in hardware, software or a combination of hardware and software, for example by the processing system 18400 of FIG.

184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Geolocation Implementation

In some implementations, the devices 300, 600A, 600B, 600C, 700, 2500, and/or 4200 can be implemented in a geolocation system implementation.

It is possible to resolve a magnetic field vector from a diamond nitrogen vacancy magnetic field sensor. In some implementations, two or more vector magnetometers may be used to resolve a position of a magnetic source. In some further implementations, a position and dipole of a magnetic source may be determined using three or more sensors. In some embodiments, magnetic sources may be geolocated using bilateration and/or vector search algorithms. Sources may be intentional or unintentional, may be passive (e.g., perturbations to Earth's geomagnetic field) or active, and may include DC, AC, or slowly varying magnetic fields. Potential applications include DNV calibration, Magnetic Anomaly Detection (MAD), industrial inventory management, magnetic beacon based applications, PNT (Position, Navigation and Timing).

The NV center magnetic sensor is capable of resolving a vector of a magnetic source. High sensitivity, high bandwidth, full vector magnetometry sensing may be provided by a set of DNV sensors to estimate the location of a fixed magnetic source with known dipole orientation, the location and dipole orientation of a fixed magnetic source with unknown dipole orientation, the location of an AC magnetic source with fixed dipole orientation, and/or the location of a rotating dipole magnetic source with known plane of rotation relative to sensors. Alternatively to the dipole orientation being known, the dipole moment and position may be deteremined using the sensing.

To determine the geolocation of the magnetic source, a controller receives the vector measurement inputs from two or more of the magnetometers and computes a score function and associated gradient for candidate magnetic source locations and orientations based on the magnetic fields as measured at a set of spatially distributed (DNV) vector magnetometer sensors. In some implementations, the controller can be applied to locate DC or AC magnetic sources. The system utilizes the vector difference between sensors as a means of mitigating common-mode spatially flat interfering sources and/or the full vector estimates from each sensor to provide more degrees of freedom to estimate the source location and orientation.

In some systems, an array of magnetometers measuring only scalar values utilizes Anderson functions to perform certain Magnetic Anomaly Detection (MAD) tasks. Anderson functions describe how a magnetic field amplitude and gradient of the full field amplitude vary as a function of relative geometry with respect to a magnetic source or disturbance. In such Anderson scalar systems, the array of scalar measurements may be compared to expected Anderson function values for a guessed location of magnetic source through trial and error. Such systems require a large array of sensors covering a large area and multiple iterative guesses to determine the location of the magnetic source. In other systems, a geolocation magnetic sensor may use a three-dimensional magnetic sensor and a multi-axis gradiometer with direct inversion of a 1st order expansion formula to provide a closed form solution for location of an RFID tag. Such a sensor consists of three orthogonal loop coils, three orthogonal planar gradiometers and three orthogonal axial gradiometers, thus requiring a large and complex sensor apparatus with limited sensitivity. Moreover, for the orthogonal loops of wire, the magnetic field detection is limited to AC fields for inducing current within the looped coils.

In contrast, the solution presented herein can minimize the number of magnetometers needed and reduce the spatial area needed to perform magnetic source geolocation. In particular, the instantaneous vector DNV sensors provide high bandwidth and can utilize dipole field matching to geolocate a magnetic source. Such DNV sensors provide a higher sensitivity and can provide vector estimation in a single compact sensor. In some implementations, improvements in the DNV sensitivity and 1/f noise compensation allow extension of geolocation to DC, slowly varying AC, and higher frequency AC tones. Low frequency AC sources offer particular potential benefits in salt-water environments where suppression of magnetic fields increases with frequency. In some embodiments described herein, the geolocation with full vector magnetometers offers improved capability over scalar full-field magnetometers and/or associated full field sensors and gradiometers. Potential incorporation of multiple vector DNV sensors permits full three by three Jacobian (gradient matrix) computation from 4 compact sensors.

Referring to the system of FIG. 123, four DNV sensors 12320, such as those described above in reference to FIGS. 7-106, are shown coupled to a controller 12310 and positioned relative to a magnetic source. The controller 12310, in addition to controlling the DNV sensors 12320 and receiving data from the sensors 12320, may perform data processing on the data. In this regard, the controller 12310 may include a subcontroller to control and receive data from the sensors 12320, and one or more further subcontroller to perform data processing on the data. Each of the DNV sensors 12320 takes multiple measurements over time and/or can take a single measurement during the same time window. In some implementations, the controller 12310 may have the set of DNV sensors 12320 take an initial measurement with no magnetic source 12330 present to provide a base measurement such that a variation in the measurement from the DNV sensors 12320 can be detected when a magnetic source 12330 is present. That is, the controller 12310 may store a base magnetic field measurement to compare to subsequent measurements from the DNV sensors 12320. Subsequent measurements can be compared to the base measurement to detect the presence of a magnetic source 12330. In some implementations, the earth's magnetic field and/or the background magnetic field can change over time. Thus, in some instances, if there are relatively minor differences between the base measurement and the subsequent measurement, this may be due to changes in the earth's magnetic field. Accordingly, in some implementations, it may be determined that the magnetic source 12330 is present if the differences between the base measurement and the subsequent measurement is larger than a threshold amount. The threshold amount can be large enough that changes from the base measurement to the subsequent measurement caused by the changes in the earth's magnetic field are ignored, but small enough that changes caused by the presence or movement of a magnetic source are larger than the threshold amount. Using the subsequent measurement, a plane angle and/or a geolocation for the magnetic source 12330 can be determined.

In some implementations, the DNV sensors 12320 each take a measurement of a magnetic field once per second. The controller 12310 can receive vector magnetic measurements taken by the DNV sensors 12320. In some implementations, the measurements are received simultaneously from the DNV sensors 12320. The controller 12310 receives each of the measurements and stores them as sets of measurements. The most recently received set of measurements can be compared to the previously received set of measurements. As a magnetic source 12330 moves closer or moves around when in detection range, the magnetic source disrupts the magnetic field detected by the DNV sensors 12320. The DNV sensors 12320 may be distributed in any geometric configuration and the magnetic field at the points detected by the DNV sensors 12320 may be affected differently based on the location of the magnetic source 12330.

In an illustrative embodiment, the plane angle, size, and/or location of a rotating magnetic source can be determined based on the measurements from the DNV sensors. For plane angle estimation relative to the DNV sensors:

$$M=A^T R_{r2D} B+W$$

where W~(NCO, I), $R_{r2D}$ is the transform of the positional coordinates of a room or area to the diamond, and B is the detected magnetic field. For a rotating magnetic source in the same plane as a DNV sensor and with a rotation axis along the z-axis of the area and a moment in the X-Y plane of the area with a plane angle of θ, then the magnetic field, B, can be defined as:

$$B = R_\theta \begin{bmatrix} 2\cos(\omega t+\varphi) \\ \sin(\omega t+\varphi) \\ 0 \end{bmatrix}$$

where φ is an unknown phase offset and $t=[t_1, t_2, \ldots, t_n]$ is the time vector. Thus, $$M = A^T R_{r2D} R_\theta \begin{bmatrix} 2\cos(\omega t+\varphi) \\ \sin(\omega t+\varphi) \\ 0 \end{bmatrix} + W$$

Converting the cosine and sine terms using Euler's formula, $$M = A^T R_{r2D} R_\theta \begin{bmatrix} e^{i\varphi}e^{i\omega t} + e^{-i\varphi}e^{-i\omega t} \\ \frac{1}{2}e^{i\varphi}e^{i\omega t} - \frac{1}{2}e^{-i\varphi}e^{-i\omega t} \\ 0 \end{bmatrix} + W$$

which be further reduced to $$M=A^T R_{r2D} R_\theta E+W$$

Given a known M, $R_{r2D}$, and A values, then $\hat{\theta}$ can be determined since ¾ $AA^T$=I. Accordingly, $$\tfrac{3}{4} R_\theta^T R_{r2D}^T AM=E+W'$$

To determine the $\hat{\theta}$ according to a first implementation, the controller can perform matched filtering against the $e^{i\omega t}$ term to determine the $R_\theta$ transform that maximizes the x-component. Thus, the controller can calculate:

$$R_{\hat{\theta}} = \underset{R_\theta}{\operatorname{argmax}} \left| \frac{3}{4} R_\theta^T R_{r2D}^T AM (e^{i\omega t})^H \right|$$

where $(e^{i\omega t})^H$ is the conjugate transpose and $R_\theta^T R_{r2D}^T AM (e^{i\omega t})^H$ is a three by one vector that can be obtained directly from Fast Fourier Transform.

In some implementations, the amplitude ratio between a dominant direction and a perpendicular direction of the dipole can be leveraged and the ninety degree phase offset can also be used. That is, $$R_{\hat{\theta}} = \underset{R_\theta}{\operatorname{argmax}} \left| [2-i0] \frac{3}{4} R_{r2D}^T R_\theta^T AM (e^{i\omega t})^H \right|$$

In yet a further implementation, an Orthogonal Procrustes algorithm can be used by the controller to determine the $R_\theta$ that minimizes $$\| R_\theta E - \tfrac{3}{4} R_{r2D}^T AM \|_F$$

In further implementations, the DNV sensors 12320 and the controller 12310 can be used for geolocation through dipole field matching. That is, the vector measurements of the DNV sensors 12320 of the magnetic source 12330 can be compared to a set of known orientations and/or configurations for a dipole magnetic source. In some implementations, a time series of vector measurements can be compared to a time series of known orientations and/or configurations for a dipole magnetic source. The controller 12320, via a sub-controller for example, can compare the vector measurements to the set of known orientations and/or configurations for a dipole magnetic source to determine the maximum (e.g., greatest or near greatest). The maximum orientation and/or configuration is then set as the geolocation and/or orientation of the magnetic source 12330 relative to the DNV sensors 12320. By comparing the vector measurements to known orientations and/or configurations of magnetic sources, a direct determination of the angle of the dipole magnetic source and/or location can be determined.

In an example implementation, five DNV sensors 12320 may be used with the controller 12310 to determine a geolocation of a magnetic source and associated moment vector from the resulting vector magnetic field measured by the five DNV sensors 12320. Other numbers of DNV sensors 12320 may also be used, such as two or three. The controller 12310 is electrically coupled to the five DNV sensors 12320 to receive data from the DNV sensors. In some implementations, the controller 12310, which may include one or more subcontrollers, may be in data communication with a DNV sensor controller to receive vector data from the DNV sensor controller. In other implementations, the controller 12310 may be in direct data communication with the DNV sensors 12320 to receive raw data output. The controller 12310 can include an initial position vector for the DNV sensors 12320, such as [X_coord, Y_coord, Z_coord] defining each DNV sensor location.

The example implementation may also generate a Monte Carlo set of dipole data based on an approximation of a single magnetic source. The controller 12310 can include an upper bound and lower bound vector defining an upper position and lower position boundary for the Monte Carlo set of dipole data for the approximated single magnetic source relative to the DNV sensors 12320. In some implementations, the controller 12310 may also store an initial start position for generating the Monte Carlo set of dipole data for the approximated single magnetic source. The initial start position may be randomly generated positional X, Y, and Z coordinates and/or may be static X, Y, and Z values. The approximated single magnetic source may include a static dipole moment.

To generate the Monte Carlo set, the controller 12310 is configured to define three by one vectors for each magnetic field and corresponding gradients that would be detected by each DNV sensor for the approximated single magnetic source, such as [SensorField #, SensorFieldGradientX, SensorFieldGradientY, SensorFieldGradientZ], which is determined as a function of the sensor position, a position of the approximated single magnetic source, and the dipole moment. A Monte Carlo method can be performed for a given root mean square (RMS) noise per vector component. A geolocation function generates data for the approximated single magnetic source and estimated dipole moment based on the sensor positions, the measured resultant magnetic field at each sensor with Monte Carlo generated RMS noise per vector component, the upper and lower bounds, and the initial start position. The geolocation function also generates data for a measured magnetic source based on the measured magnetic vectors of the DNV sensors 12320, the sensor positions, the dipole moment, an initial dipole position estimate, and an upper bound and a lower bound for the dipole position. That is, the geolocation function may utilize the magnetic field data from the DNV sensors to determine a position and dipole moment of the magnetic source based on dipole field matching.

In some implementations, the initial dipole position estimate and dipole moment vector estimate may be modified based on a scoring function based on an error fit between the estimated position and moment of the magnetic source and the measured dipole magnetic fields by the DNV sensors. In some implementations, a least squares algorithm may be used to perform a constrained least squares fit to optimize performance. Below is provided exemplary computer code (MATLAB):

```
% ==========================================================================
% Script to evaluate magnetic field from a dipole at five sensors.
% ==========================================================================
%% Initialization
clear;
%% Define grid points
% X = Right on monitor, Y = Up on monitor, Z = Out of monitor towards user.
%% Define Sensor Locations:
sensor1Location = [-10 0 1]';     % (3 × 1) (m)
sensor2Location = [0 0 1]';     % (3 × 1) (m)
sensor3Location = [10 0 1]';     % (3 × 1) (m)
sensor4Location = [-5 5 1.5]';     % (3 × 1) (m)
sensor5Location = [5 5 1.5]';     % (3 × 1) (m)
sensorPos = [sensor1Location, sensor2Location, sensor3Location, ...
    sensor4Location, sensor5Location];
%% Define initial estimates and bounds for search algorithm:
% Define initial dipole position and moment estimates as well as associated
% upper and lower search bounds for the position and moment estimates
MC__initPosMoment = [0, 20, 1, 10, 10, 10];
MC__posMomentLowerBound = [-80, -15, 0,   -100, -100, -100];
MC__posMomentUpperBound = [ 80, 100, 2,   100, 100, 100];
%% Define Test Dipole Moment and Position:
% %     Define Magnet Test Location for analysis
testDipolePosition = [9, 15, 1.25 ]
% %     Define Magnet Dipole magnitude and orientation for analysis
dipoleMoment = 63.8 * unit([1 1 1]) % (3 × 1) (T)
%% Specify RMS noise (per magnetic field component)
noise__nT = 0.1 % Gaussian b field error (nT) per xyz component
%% Generate truth data for all sensor locations
[   sensorField, ...
    sensorFieldGradX, sensorFieldGradY, sensorFieldGradZ ] =...
    dipoleBField__wDipolePosGradient__SingleDipole(...
    sensorPos, testDipolePosition', dipoleMoment');% [ sensor1Field, ...
measuredB = 1e9*sensorField;
measuredBfield__mag__nT = sqrt(sum(measuredB.^2,1))
%% Run Monte Carlo for given RMS noise per vector component
nMonteCarloTrials = 40;
for ii = 1:nMonteCarloTrials,
    MCmeasB = measuredB + noise__nT*randn(size(measuredB));
    % Call Geolocation solver:
    [ magnet3dPosMoment(ii,:) ] = xyzGeolocateBfield__wDipole__multiBfit( ...
        MCmeasB, ...
        sensorPos, ...
        MC__initPosMoment, MC__posMomentLowerBound, MC__posMomentUpperBound);
end
%% Compute sample Monte Carlo statistics on the accuracy of the target
% dipole position and moment estimates:
meanMCdipolePos = mean(magnet3dPosMoment(:,1:3),1)
meanMCdipoleMoment = mean(magnet3dPosMoment(:,4:6),1)
MCdipolePosErr = magnet3dPosMoment(:,1:3)-...
    repmat(testDipolePosition,nMonteCarloTrials,1);
MCdipoleMomentErr = magnet3dPosMoment(:,4:6)-...
    repmat(dipoleMoment,nMonteCarloTrials,1);
meanMCdipolePosErr = mean(MCdipolePosErr,1)
meanMCdipoleMomentErr = mean(MCdipoleMomentErr,1)
```

```
stdMCdipolePosErr = std(MCdipolePosErr,1)
stdMCdipoleMomentErr = std(MCdipoleMomentErr,1)
rmsMCdipolePosErr = rms(MCdipolePosErr,1)
rmsMCdipoleMomentErr = rms(MCdipoleMomentErr,1)
%% End of Monte Carlo Geolocation Script
% ========================================================================
% Function to estimate magnetic dipole position and moment vector from
% measurements of the resulting magnetic field at multiple sensors.
% ========================================================================
function [ magnet3dPosMoment ] = xyzGeolocateBfield__wDipole__multiBfit( ...
      measBvec, ...
      sensorPos, ...
      dipolePosXYZMomentXYZ__init, ...
      dipolePosXYZMomentXYZ__LB, dipolePosXYZMomentXYZ__UB)
% xyzGeolocateBfield__wDipole__multiBfit.m
%    Function estimates the geolocation and moment of a magnetic dipole
%    target from measured estimates of the magnetic field caused by the
%    dipole source at a set of known sensor positions (and orientations).
% Define geolocation score function to be optimized:
geoScoreFunWrapper = @(dipolePosXYZMomentXYZ)
geoDipoleErrorFun6stateFitXYZDipole( ...
      dipolePosXYZMomentXYZ(1:3), ...
      measBvec, ...
      sensorPos, dipolePosXYZMomentXYZ(4:6)' );
% If upper and lower bounds are not provided in the function, the following
% commands provide representative bounds for an envisioned scenario.
if (nargin < 5)
      dipolePosXYZMomentXYZ__UB = [ 2,3,2, 100, 100, 100];
end
if (nargin < 4)
      dipolePosXYZMomentXYZ__LB = [−2,1,0, −100, −100, −100];
end
% If an initial position and dipole moment estimate is not provided, the
% following commands provide a representative initial estimate for an
% envisioned scenario.
if (nargin < 3)
      dipolePosXYZMomentXYZ__init = [0,2,1, 1, 1, 1];
end
% Perform optimization using built-in lsqnonlin algorithm to perform
% constrained ordinary least squares
%    Set options for contrained nonlinear least square solver:
options = optimoptions('lsqnonlin', ...
      'TolX',1e−16, 'TolFun', 1e−16, ...
      'MaxFunEvals', 4000, 'MaxIter', 1000, 'Display', 'off', ...
      'Jacobian','on');
%    Call nonlinear least squares solver:
[magnet3dPosMoment, ~] = lsqnonlin( geoScoreFunWrapper, ...
      dipolePosXYZMomentXYZ__init, ...
      dipolePosXYZMomentXYZ__LB, dipolePosXYZMomentXYZ__UB, options);
end
% ========================================================================
% Function to compute the error between a set of measured magnetic field
% vectors at known sensor locations and the expected magnetic field at the
% same locations for a candidate dipole moment and position.
% ========================================================================
function [multiBerror, multiBJacobian] = ...
      geoDipoleErrorFun6stateFitXYZDipole( dipolePosXYZ, ...
      measBvec, sensorPos, dipoleMoment )
 % Function call computes the error between a set of measured magnetic
 % field vectors, "measBvec" and the expected magnetic fields for a scenario
 % described by sensors at position "sensorPos" and magnetic dipole sources
 % with moments "dipoleMoment" located at positions "dipolePosXYZ".
 % The function call further calculates the Jacobian matrix associated with
 % the given error function.
 % Compute the resulting magnetic field at a given sensor Position for a
 % dipole at given position with given dipole moment
 [ sensorField, ...
        sensorFieldGradX, sensorFieldGradY, sensorFieldGradZ, ...
        sensorFieldGrad__mX, sensorFieldGrad__mY, sensorFieldGrad__mZ ] = ...
        dipoleBField__wDipolePosVecGradient__SingleDipole(...
        sensorPos, dipolePosXYZ', dipoleMoment);
  % Compute the error function between the measured and expected magnetic
  % fields at the given sensor locations due to the specified candidate set
  % of dipole positions and moments.
  multiBerror = [measBvec − 1e9*sensorField];
  % Calculate Jacobian matrix:
  if nargout > 1
       jacobian = zeros(1,length(dipolePosXYZ));
       multiBJacobian = −1e9*[...
```

-continued

```
        sensorFieldGradX(:), sensorFieldGradY(:), sensorFieldGradZ(:), ...
        sensorFieldGrad_mX(:), sensorFieldGrad_mY(:), sensorFieldGrad_mZ(:) ];
  end
end
% =========================================================================
% Function to compute the magnetic field and corresponding gradient vectors
% at specified sensor positions based upon a magnetic dipole with specified
% moment and position.
%
% USAGE
%    [bField, bFieldGradX, bFieldGradY, bFieldGradZ] = ...
%       dipoleBField_wDipolePosGradient(sPos,dPos,m,mu)
% INPUTS
%    sPos - the sensor position (3×1 or 3×N column) vector
%    dPos - the dipole position (3×1) vector
%    m - the (3×1) vector magnetic moment (n*I*A, right-hand rule direction)
%       Note: size(dPos) = size(m)
%    mu - the scalar permeability (default to mu0)
% OUTPUTS
%    bField - the (3×N matrix) Bfield vectors
%    bFieldGradX - the (3×N matrix) gradient vectors of Bfield w.r.t. X
%    bFieldGradY - the (3×N matrix) gradient vectors of Bfield w.r.t. Y
%    bFieldGradZ - the (3×N matrix) gradient vectors of Bfield w.r.t. Z
% =========================================================================
function [bField,bFieldGradX,bFieldGradY,bFieldGradZ] = ...
    dipoleBField_wDipolePosGradient_SingleDipole(sPos,dPos,m,mu)
    if nargin < 4
        mu = util.Physics.MAGNETIC_CONSTANT;
    end
    if (size(dPos) ~= size(m))
        error('# dipole Positions must match # dipole orientations')
    end
    % Make r and m have equal size
    if size(sPos,2) < size(m,2) % Impossible for single Dipole function
        sPos = repmat(sPos, 1, size(m,2));
    elseif size(m,2) < size(sPos,2)
        m = repmat(m, 1, size(sPos, 2));
        dPos = repmat(dPos, 1, size(sPos, 2));
    end
    r = sPos − dPos;
    assert(size(r,2) == size(m,2), ...
      'Input r and m must have size in 2nd dim equal to each other or to 1');
    %% Compute b field
    rMag = sqrt(sum(r.*r));
    rMag5 = rMag.^5;
    rMag7 = rMag.^7;
    mDotR = sum(m .* r); % 1×N row-vector of magnetic moment dotted with
                         % N radial vectors
    bField = mu/(4*pi)*...
            ( 3*r.*repmat(mDotR./rMag5,3,1) − m.*repmat(rMag,3,1).^(−3) );
%% Compute b field gradient with respect to coordinates X, Y, and Z
    bFieldGradX = −3*mu/(4*pi)*( ...
        r.*(repmat(−5*r(1,:).*mDotR./rMag7 + m(1,:)./rMag5 , 3, 1)) − ...
        − m.*repmat( r(1,:)./rMag5 , 3, 1) + ...
        [mDotR./rMag5; zeros(size(mDotR)); zeros(size(mDotR))] );
    bFieldGradY = −3*mu/(4*pi)*( ...
        r.*(repmat(−5*r(2,:).*mDotR./rMag7 + m(2,:)./rMag5 , 3, 1)) − ...
        − m.*repmat( r(2,:)./rMag5 , 3, 1) + ...
        [zeros(size(mDotR)); mDotR./rMag5; zeros(size(mDotR))] );
    bFieldGradZ = −3*mu/(4*pi)*( ...
        r.*(repmat(−5*r(3,:).*mDotR./rMag7 + m(3,:)./rMag5 , 3, 1)) − ...
        − m.*repmat( r(3,:)./rMag5 , 3, 1) + ...
        [zeros(size(mDotR)); zeros(size(mDotR)); mDotR./rMag5] );
End
```

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Subsurface Liquid Locating Implementation

In some implementations, the devices 300, 600A, 600B, 600C, 700, 2500, and/or 4200 can be implemented in a system for detecting the location of a subsurface liquid using an array of magnetometers.

FIG. 124 depicts an overview of a system 12400 for localization of a subsurface liquid 12490 using a proton spin resonance excitation coil 12410 for inducing a magnetization in the subsurface liquid 12490, an array 12420 of vector magnetometers 12422 to detect the location of the subsurface liquid 12490, and a controller 12450 for generating a location, two-dimensional reconstruction, and/or three-dimensional reconstruction of the subsurface liquid 12490 based on the output of the array 12420 of vector magnetometers 12422. The subsurface liquid 12490 may be a liquid of interest for the location, such as oil, other hydrocarbons, water, or other liquids. For instance, oil may be of interest in artic, Antarctic, tundra, and/or other locations where oil and water may be mixed. In particular, locating oil during an oil spill may be important for recovery and/or clean-up procedures. In certain locations, such as the arctic, Antarctic, and/or other ice or snow areas, visual location of the oil may be difficult as the oil may be below the surface, such as mixed in and/or below snow or ice, underground, in water under ice, etc. Moreover, site surveys can be expensive, dangerous, and/or ineffective for remote and/or difficult to reach areas. Accordingly, accurate locating of the oil may be useful to expedite recovery, containment, and/or clean-up efforts for spilled oil. In other instances, subsurface oil can be located for extraction purposes. In further instances, subsurface water can be located in arid or other geographic locations for extraction and use.

The proton spin resonance excitation coil 12410 is a coil for inducing magnetic resonance in the subsurface liquid 12490, such as oil, by generating a magnetic resonance (MR) field from the coil. The proton spin resonance excitation coil 12410 may be a flat coil, such as a flat figure-8 gradiometer coil such as that described in L. Chavez, et al., "*Detecting Arctic oil spills with NMR: a feasibility study*", Near Surface Geophysics, Vol 13, No 4, August 2015, the disclosure of which is incorporated by reference in its entirety herein. The proton spin resonance excitation coil 12410 is configured to induce magnetic $^1$H magnetic resonance in the subsurface liquid 12490 and any other different liquids below the position of the proton spin resonance excitation coil 12410. By exploiting the magnetic relaxation differential between the subsurface liquid of interest and any other liquids near the subsurface liquid of interest, a general location of the subsurface liquid can be estimated. In some implementations, the proton spin resonance excitation coil 12410 may be mounted to a substructure, such as a tubular frame, piping, or other substructure to maintain the coil 12410 configuration and shape. In some instances, the substructure may be coupled to a vehicle, such as a helicopter, or other device to move the substructure and the proton spin resonance excitation coil 12410. The proton spin resonance excitation coil 12410 is a large scale coil, such as on the order of 10 meters, and may be difficult to detect a particular location of the subsurface liquid 12490. Accordingly, an array 12420 of magnetometers 12422 may be implemented with the proton spin resonance excitation coil 12410 to exploit the magnetic resonance excitation from the proton spin resonance excitation coil 12410 and detected a location of the subsurface liquid 12490 using the vector signals from sets of magnetometers 12422.

The array 12420 of the magnetometers 12422 may be mounted to the substructure to which the proton spin resonance excitation coil 12410 is mounted and/or may be independent of the proton spin resonance excitation coil 12410. The array 12420 is generally positioned in a circular arrangement relative to the proton spin resonance excitation coil 12410, but the array 12420 may have other geometric configurations, such as square, rectangular, triangular, ovular, etc. Other possible array configurations may include a two-dimensional array filling a circular area subtended by the excitation coil or a three-dimensional array positioned above or below the excitation coil with an area projected within the coil. The magnetometers 12422 of the present disclosure are DNV magnetometers, but other vector magnetometry devices may be utilized as well, such as superconducting quantum interference devices (SQUIDs). Such SQUID devices are described in greater detail in L Q Qiu, et al., "*SQUID-detected AMR in Earth's Magnetic Field*", 8th European Conference on Applied Superconductivity (EUCAS 2007), Journal of Physics: Conference Series 97 (2008) 012026, IOP Publishing; A. N. Matlashov, et al., "*SQIRDs for Magnetic Resonance Imaging at Ultra-low Magnetic Field*", PIERS online 5.5 (2009) and/or J. Clarke, et al., "*SQUID-Detected Magnetic Resonance Imaging in Microtesla Fields*", Annual Review of Biomedical Engineering, Vol. 9: 389-413 (2007), the disclosures of which are incorporated by reference herein in their entirety. In some implementations, the array of magnetometers is an array of gas-cell detectors.

The controller 12450 is electrically coupled to and/or in communication with the array 12420 of magnetometers 12422 and, in some implementations, the proton spin resonance excitation coil 12410 to control the magnetometers 12422 and, optionally, the proton spin resonance excitation coil 12410. In addition, the controller 12450 is configured to utilize the output from the magnetometers 12422 to generate a location, two-dimensional reconstruction, and/or three-dimensional reconstruction of the subsurface liquid 12490 as will be described in greater detail in reference to FIG. 127.

Referring to FIG. 125, once the proton spin resonance excitation coil 12410 induces a magnetic resonance in the subsurface liquid 12490, the array 12420 of magnetometers 12422 can be activated to detect the magnetic field vectors of the subsurface liquid 12490. As shown in FIG. 125, sets 12430, 12432, 12434, 12436 of magnetometers 12422 may be utilized to determine detected magnetic vectors, M, and magnetic intensity, |M|, for the magnetized subsurface liquid 12490. The detected magnetic vectors and magnetic intensity can be determined by detecting the Earth's magnetic field at the location without the subsurface liquid 12490 being magnetized and removing the result from the magnetic signal detected by the magnetometers 12422 once the subsurface liquid 12490 is magnetized by the proton spin resonance excitation coil 12410. In other implementations, the magnetometers can be operated in a mode that filters out magnetic fields which are effectively static, such as the Earth's field, on the time scale of the magnetometer measurements (typically milliseconds). The magnetic intensity, |M|, is proportional to the distance of the subsurface liquid 12490 relative to each magnetometer 12422 and/or set of magnetometers 12430, 12432, 12434, 12436. In some implementations, a time-varying nuclear magnetic resonance, M(t), can be modeled as a radiating source, such as a dipole radiator. The magnetic vector, M, provides a direction of the subsurface liquid 12490 relative to each magnetometer 12422 and/or set of magnetometers 12430, 12432, 12434, 12436. Using the foregoing, a back-projection or other reconstruction algorithm can be implemented to locate the subsurface liquid 12490, as shown in FIG. 126, from the magnetic vector and/or magnetic intensity measured by 1 through N magnetometers 12422 and/or sets of magnetometers 12422.

FIG. 127 depicts a process 12700 for utilizing the proton spin resonance excitation coil 12410 and array 12420 of magnetometers 12422 to detect the subsurface liquid 12490. The process 12700 may be implemented by controller 12450 of FIG. 124. The process 12700 includes deactivating or "blanking" the magnetometers (block 12702). The deactivation or "blanking" may include deactivating an optical excitation source, such as optical excitation source 310 of FIGS. 3A-3B, for a DNV magnetometer and/or deactivating a RF excitation source, such as RF excitation source 330 of FIGS. 3A-3B. Deactivating the optical and/or RF excitation source occurs during the adiabatic passage preparation with the proton spin resonance excitation coil 12410. Thus, the magnetometers 12422 are not affected by the proton spin resonance excitation coil 12410.

The process 12700 further includes activating the proton spin resonance excitation coil 12410 (block 12704). Activating the proton spin resonance excitation coil 12410 induces a magnetic resonance in the subsurface liquid 12490 that will be measured by the magnetometers 12422. The process 12700 further includes activating the magnetometers 12422 (block 12706). For magnetometers such as DNV magnetometers, the activation step can be rapid after the proton spin resonance excitation coil 12410 is deactivated. That is, the rapid "turn on" time for DNV magnetometers can be used to detect the magnetic signal from the magnetic resonant excited subsurface liquid 12490 quickly after the excitation coil 12410 is deactivated, allowing for a larger magnetic signal (and therefore a more easily discernable magnetic signal) to be detected than other magnetometers. The process 12700 further includes recording the oscillatory $^{1}$H MR precession in Earth's field by the magnetometers (block 12708). The process 12700 further includes filtering the local, approximately static, Earth field from the magnetic signal detected by the magnetometers (block 12710). In some implementations, the filtering may discriminate the magnetic signal of the subsurface liquid 12490 from the local Earth field by AC filtering pulse sequence, such as Hahn Echo. In other implementations, the filtering may use a reversal of $^{1}$H magnetization in alternating signal co-additions to enhance discrimination of the magnetic signal of the subsurface liquid 12490 relative to the local Earth field. The process 12700 includes generating a location, a two-dimensional reconstruction, and/or a three-dimensional reconstruction of the subsurface liquid 12490 based on the filtered magnetic signal from the magnetometers (block 12712). The generation of the location (e.g., scalar or numerical location), two-dimensional reconstruction, and/or three-dimensional reconstruction may be through a back-projection and/or tomographic algorithm for image reconstruction, such as those similar to magnetic resonance imaging (MM) and/or computed tomography (CT).

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Mapping and Monitoring Hydraulic Fractures Implementation

In some implementations, the devices 300, 600A, 600B, 600C, 700, 2500, and/or 4200 can be implemented in a system to map and/or monitor hydraulic fractures.

In some implementations, a system for mapping and monitoring of hydraulic fractures using vector magnetometers can be implemented. Magnetic images are capture at various phases of the hydraulic fracturing operation (also referred to as "fracking"), which include padding and injection of fracking (frac) fluid and proppant, as described in more detail herein. The subject technology allows monitoring and adjustment of the fracking operation by providing a map of the distribution of the frac fluid and proppant in various stages.

The disclosed solution can be used in conjunction with micro-seismic monitoring. Micro-seismic monitoring is very challenging due to the fact that initial times for the shear fracture events are unknown, which results in large uncertainty in the depth migration problem of seismic processing. Other limiting factors include observation of only shear fractures, and the fact that fracture events themselves don't indicate whether or not the induced fracture was effectively propped open subsequent to removal of pressurized frac fluid.

The subject solution provides indication of proppant penetration into the fracture network during and subsequent to the frac process, which is the key to better controlling the overall fracking process. Fracking is typically a multiple stage or zonal process per each well. The disclosed solution also enables adapting initial frac plan to evolving conditions.

FIGS. 128A-128B are diagrams illustrating examples of a high-level architecture of a system 12800A for mapping and monitoring of hydraulic fracture and an environment 12800B where the system operates, according to certain embodiments. The system 12800A includes a sensor array 12802 including multiple sensors 12803, an analyzer 12805, and an output device 12809. Each sensor 12803 includes at least a magnetometer communicatively coupled to the analyzer 12805. The analyzer 12805 includes one or more processors 12806, memory 12808 and an interface 12804. Each sensor may communicate data signal to the analyzer 12805. The communication between the sensors and the analyzer 12805 may be wired, optical, or wireless communication. The analyzer 12805 may communicate with the sensors 12803 individually or with the sensor array 12802 through the interface 12804 to receive sensor data. The analyzer 12805 may store the sensor data received from the sensors 12803 or the sensor array 12802 to the memory 12808. The stored data may be accessed by processor(s) 12806 for processing the data subsequent to the sensors storing their respective data. The processor(s) 12806 may be configured to receive executable instructions for processing the data according to the constrained geophysical processing described herein. The signals produced by the sensor array 12802 may include magnetic imaging data for generation of a magnetic profile of a region defined by the well which is intended to be processed using hydraulic fracturing. Each magnetometer sensor 12803 may save its vector field measurement every few minutes throughout the entire fracking process. All saved data is time tagged by some simple means such as a common clock or a trigger for later processing of the data.

The memory 12808 is in communication with processor 12806 and the interface 12804. Memory 12808 may store information, such as the sensor array 12802 signals received by the analyzer 12805. Further, memory 12808 may store magnetic images or signals that have been received from sensor array 12802 and further processed by processor(s) 12806. The interface 12804 communicates data from the analyzer 12805 to an output device 12809. The output device 12809 may be any device or apparatus that can communicate information about the processed signals received from sensor array 12802. For example, the output device 12809 may be a display configured to display a graphical depiction of a well site, including a mapping of an induced fracture network produced during hydraulic fracturing. In some aspects, the output may be a printing device providing information (e.g. reports) relating to a hydraulic fracturing operation.

In one or more implementations, the sensors 12803 are arranged in a sensor array 12802 and communicatively connected to analyzer 12805. The sensors 12803 may include a magnetometer for measuring a magnetic field in the proximity of the sensor 12803, which is communicated to the analyzer 12805. The magnetic fields measured by sensor array 12802 may be related to a well being processed using hydraulic fracturing. The magnetic field measured by the sensors 12803 may include magnetic influences relating to the Earth's magnetic field, as well as remnant magnetism in the rock formation and magnetic properties of the well apparatus itself, such as the well casing. As the well is fractured by injecting fluid and proppants into the well bore at selected stages along the bore, the magnetic field in the region of the hydraulic fluids and proppants affect the surrounding magnetic fields that are subsequently measured by the sensors 12803. As hydraulic fracturing proceeds in the well, subsequent magnetic images are captured by the sensor array 12802 and communicated to the analyzer 12805. The received magnetic images are processed by processor(s) 12806 to determine changes in the magnetic profile between successive magnetic images captured by the sensor array 12802. The changes are processed to map the distribution of frac fluid and proppant in the well, which are indicative of the induce fracture network into which the fluid and proppant has flowed during hydraulic fracturing.

FIG. 128B shows the environment 12800B, which is representation of the geology of natural gas resources. The growth of natural gas reserves and production from shale formations has sparked interest in the nation's natural gas resources. The diagram in FIG. 128B shows the geologic nature of most major sources of natural gas in the United States in schematic form. Gas rich shale 12810 is the source rock for many natural gas resources, but until recently, has not been a focus for production. Horizontal drilling and hydraulic fracturing have made shale gas an economically viable alternative to conventional gas resources. Conventional gas accumulations 12840, 12850, or plays, occur when gas migrates from gas-rich shale into an overlying sandstone formation, and then becomes trapped by an overlying impermeable formation, called the seal 12830. Associated gas 12840 accumulates in conjunction with oil 12820, while non-associated gas 12850 does not accumulate with oil. Tight sand gas accumulations 12860 occur when gas migrates from a source rock into a sandstone formation 12870, but is limited in its ability to migrate upward due to reduced permeability in the sandstone. Finally, coal bed methane 12880 does not originate from shale, but is generated during the transformation of organic material to coal.

Conventional gas accumulations 12840, 12850 may be accessed via horizontal drilling techniques in which the well bore is substantially vertical. To access non-conventional plays such as gas-rich shale formations 12810, horizontal drilling techniques in which the well bore 12895 extends substantially horizontally 12896 may be needed. Generally, the permeability of unconventional reservoirs is too low for production, thus requiring directional drilling and well stimulation. For example, the permeability of a typical shale formation may be on the order of $10^{-9}$ Darcy. Tight sand formations may have permeability of about $10^{-6}$ Darcy. In contrast, a conventional play may have permeability of $10^{-2}$ Darcy.

FIG. 129 is a high-level diagram illustrating an example of implementation of hydraulic fracturing of a well to release gas reserves, according to certain embodiments. A well head 12901 is installed at ground level and attached to a water supply from a storage container 12903 via a pump 12905. The pump provides a frac fluid at a sufficient pressure in the well bore 12995 to produce fracturing of the underlying shale layer 12910. Natural gas trapped within the natural fissures 12920 in the shale layer 12910 are released as the newly formed fractures expand existing fissures while creating newly induced fractures and pathways through the remaining shale formation 12910.

Shale is a finely grained sedimentary form of rock. Spaces between the grains are typically very small. As natural gas is formed, some of the gas becomes trapped within these small spaces. Using conventional mining and drilling techniques these trapped resources are difficult to access. Despite the resource richness of these sources, the production from wells in these types of formations has proven to be economically infeasible. Yet despite the inability to access the trapped gas due to the high impermeability of the shale, the shale contains a high volume of pore space that may contain substantial amounts of gas collected over long geological timeframes. Hydraulic fracturing provides access to this pore space, allowing the trapped gas 12930 migrate toward the well bore 12995 and be collected at the well head 12901.

Frac fluid is stored near the well head 12901 in storage container 12903. The frac fluid is provided to the well bore 12995 under pressure provided by the pump 12905. The frac fluid is primarily water, but other additives or chemicals may be added to the frac fluid. For example, water pumped into the shale layer 12910 at pressure, creates new fractures in the grains of the shale formation. When the pressure is relieved, such as by turning off the pump 12905, the newly formed cracks in the shale tend to reclose under the pressure caused by the mass of the overlying layers. To maintain the openings created by the hydraulic pressure, a substance called a proppant 12940 is added to the frac fluid. The proppant 12940 props open the newly formed cracks 12920 to allow the trapped natural gas 12930 to migrate toward the well bore 12995. The proppant 12940 typically includes sand, which has a compressibility sufficient to maintain the openings in the shale, while providing enough permeability to allow the migration of the natural gas within the shale formation. While frac sand is a commonly used proppant, other materials, for example, aluminum beads, ceramic beads, sintered bauxite and other materials may be used, provided the material is crush-resistant and provides adequate permeability.

Other materials or chemicals may be added to frac fluid to provide additional functionality. For example, thickening agents may be added to the frac fluid to form a gel, which is effective at carrying the proppant particles deep into the rock formation. Other chemicals may be added to reduce friction, maintain rock debris from the fracking process in suspension for ease of removal, prevent corrosion of equipment, kill bacteria, control pH, as well as perform other functions.

The frac fluid is introduced to the well bore 12995 under pressure (as indicated by arrow 12970) and enters the natural fissures 12920 located within the shale layer 12910. Hydrostatic pressure builds in the shale until the pressure creates force which exceeds the tensile strength of the shale grains causing the grains to fracture and split. The entire well bore 12995 does not need to be pressurized. Plugs may be placed beyond the regions of shale being targeted for fracturing to produce the desired pressure within a targeted region or stage.

The well bore 12995 may extend from the surface for thousands of feet to reach the shale layer 12910 below. Overlying layers, include the aquifer 12950 which may provide the water supply for the area surrounding the well 12900. To protect the water supply from contamination, the well bore 12995 is lined with a steel casing 12960. The space between the outside of the steel casing 12960 and the walls of the well bore 12995 are then filled with concrete to a depth greater than the aquifer 12950. As the well bore 12995 approaches the depth containing the gas-rich shale formation 12910, the well bore 12995 is angled to a horizontal or nearly horizontal direction to run longitudinally through the shale formation 12910. As the pressurized frac fluid is applied to the shale layer 12910 the existing fissures 12920 are expanded and newly formed fractures are created. As shown in detail in the inset of FIG. 129, the frac fluid and proppant 12940 enter the existing fissures 12920 and create new fissures. Proppant particles 12940 contained in the frac fluid hold the fissures open and provide permeability for gas 12930 located within the fissures to migrate through the frac fluid and proppant particles to the well bore 12995 and back to the surface.

During production of a non-conventional play, a horizontal pay zone extending about 4,000 feet through the pay zone may be established. Fracturing is performed along the horizontal pay zone in typically uniform stages extending about 400 feet. For a typical fractured well, 10-20 million square feet of additional surface area is created by the fractures. The fracking is performed beginning at the toe or end of the well, and processed stage by stage back toward the well opening. Fracking a typical well requires about 2.5 million pounds of proppant and about 4-6 million gallons of frac fluid. The fracturing process seeks to push proppant radially out from the well bore into the formation up to 1,000 feet. Ideally, fractures create sheet-like openings that extend orthogonally to the direction of the well bore. To this end, wells are typically drilled based on prior knowledge of the in situ stress state of the rock formation. Spacing for the fracturing stages are selected based, at least in part, on the anticipated induced fracture and empirically determined flow rates into the fracture network to ensure that production is commensurate with the intended 20-30 year life expectancy of a typical well installation. A production field may contain a number of wells configured as described above. The wells are spaced according to the corresponding designed pay zone of each well. The use of hydraulic fracturing is intended to maximize the stimulated rock volume (SRV) per dollar cost of production.

Experience has shown, however, that induced fractures define complicated networks of fractures rather than the ideal sheet-like openings. Accordingly, mapping the occurrence and location of actual fractures becomes valuable in determining the effectiveness of the current operations, and provides insight into future actions to maximize production efficiency of the well. Factors that create uncertainty in the hydraulic fracturing process include the loss of frac fluid and proppants to pre-existing or natural fractures which may open further during the fracking process. Injected fluid and proppant is accommodated, (e.g., space/volume become available) by the compliance of the surrounding rock which becomes compressed, and thereby alters the rock's stress state. This changes the stress field from one stage's fracture to the next. This results in added uncertainty as to the final placement of proppants to maintain openings formed by the fracking after the hydraulic pressure is removed.

Mapping induced fractures caused by hydraulic fracturing allows for greater production and maximized stimulated reservoir volume (SRV). In addition, concerns expressed over the process of fracking, including the proliferation of the fracking materials into the environment, may require accurate mapping of induced fractures and the introduction of frac fluids and proppants to those fractures to meet further regulatory requirements designed to control and regulate impact to the environment caused by hydraulic fracturing.

Presently, attempts at mapping fractures include passive micro-seismic monitoring. In micro-seismic monitoring, a passive array of seismic sensors is arranged at the surface overlying the fractured pay zone, or the sensors may be placed down hole in the fracked well or in a nearby observation well. The seismic sensors are configured to detect shear pops that occur when an induced tensile crack intersects with a natural fracture which emits a popping type of impulse. The impulses are converted to signals which are processed to determine the source of the impulse. Micro-seismic monitoring is passive. That is, no active seismic signal is generated and used to create returned signals. The sensors merely monitor the surroundings for seismic activity if and when such activity occurs. Since it not known when a fracture may be induced by the hydraulic pressure, or where such fractures may occur, there is considerable uncertainty in seismic monitoring. This uncertainty is compounded by the very low energy seismic signals which must be detected. Further, seismic monitoring does not provide insight as to the effective placement of proppants, as the impulses used to generate signals occur at the initiation of an induced fracture and do not indicate if the fractures were successfully propped open, or reclosed after the initial fracture. Therefore, it is difficult to verify that the mapping information generated is reliable. The subject solution may be used alone or in cooperation with existing techniques including micro-seismic monitoring.

According to one or more implementations, an array of sensors is placed on or near the surface of a well or active pay zone. The array of sensors includes at least a magnetometer sensor for measuring a magnetic field around the sensor. In an alternative embodiment, one or more of the magnetometer sensors may be placed down hole in the well, although this is not a requirement and a system may be embodied using solely surface arrays. The environment around the well has a magnetic signature that may be measured by the sensor array. For example, the Earth's magnetic field will influence the overall magnetic signature in the area of the well. Additionally, remnant sources of magnetic fields, such as the host rock or intrusions of magnetite further influence the magnetic field sensed by the array of magnetometer sensors. Further, as the well casing is driven down in the well bore, the well casing tends to become magnetized, thereby affecting the magnetic field measured at the magnetometer sensor array.

According to an embodiment, a process includes placing an array of sensors proximate to a well pay zone. Prior to introducing any frac fluid for hydraulic fracturing, a baseline magnetic profile is established by measuring the magnetic signature prior to any hydraulic fracturing being performed. The baseline magnetic signature includes the Earth's magnetic field, remnant sources of magnetism in the earth and the magnetic field which is associated with the well casing. The magnetometer sensor may be based on a diamond nitrogen vacancy (DNV) sensor. A DNV sensor includes a synthetic diamond substrate which is created having intentional impurities introduced into the carbon lattice structure of the diamond. Nitrogen atoms replace the carbon atoms at varying locations in the lattice, thereby creating vacancies which contain electrons. The electrons have various spin states which may be measured. The spin states are sensitive to the surrounding magnetic environment. As the magnetic environment changes, the spin states of the electrons change and the difference in spin may be correlated to the corresponding change in the magnetic environment. Magnetometers based on DNV technologies are very sensitive and can detect small changes in magnetic fields in a sensor which is considerably smaller than other technologies. For example, a typical conventional magnetometer capable of detecting small changes in the magnetic profile of a well's pay zone may require a sensor which is the size of a small van. In contrast, a DNV based magnetometer may be embodied in a sensor the size of a cellular telephone or smaller. Thus, a number of small, very sensitive magnetometers can be carried on site and arranged in an array about the surface in the area defining the well pay zone.

FIG. 130A is a diagram illustrating an example background magnetic signature 13000A of a well, according to certain embodiments. A well may include a bore 13020 that is drilled vertically from the surface to a desired depth, at which point the bore 13020 is extended horizontally along the pay zone. A well casing 13025 is inserted into the bore to insulate the well bore 13020 from the surrounding rock formation and to prevent introduction of mining materials into the surrounding rock near the surface. As the well casing 13025 is driven into the rock formation, the casing tends to become magnetized and form the magnetic field 13026. The surrounding rock formation contains naturally occurring remnant magnetism 13016 which may be in the host rock or intrusions of other materials such as magnetite 13015. In addition, the Earth has its own global magnetic field 13001 that extends through the area defined by the well and its pay zone.

FIG. 130B is a diagram illustrating an example implementation of a mapping system 13000B for hydraulic fracturing of the well shown in FIG. 130A, according to certain embodiments. The mapping system 13000B includes the sensor array 13011 including magnetometer sensors 13010 arranged on the surface in an area defining the pay zone of the well. According to some aspects, a one-to-one placement of magnetometers with geophones (e.g., for concurrent micro-seismic mapping) at the surface may be used. This configuration provides a wide aperture and allows for triangulating locations. The addition of magnetometer data requires minimal modification to procedures already established for micro-seismic techniques. Where the well is cased, monitoring the opened holes may involve introducing sensors at a subsurface level. Downhole placements of sensors may also be used to provide much stronger signals.

The sum of the magnetic fields created by the Earth's magnetic field 13001, the remnant magnetism in the host rock 13015, and additional magnetic influence of the mining materials, such as the well casing 13026, define a baseline magnetic field of the well region which is measured by the array of magnetometers at the surface before any introduction of fracking material into the well bore 13020. Frac fluid is introduced at high pressure to the well bore opening and the well bore 13020 is filled with the fluid through the bore 13020 to the toe of the well which initiates fractures in the rock. The fluid introduced prior to introducing proppant and other additives to the fluid is called padding. A typical well may receive millions of gallons of frac fluid in addition to millions of pounds of proppant 13030. This large additional mass is received by the surrounding formation and may affect the surrounding magnetic signature. For this reason, the sensor array 13011 may be configured to measure the baseline magnetic signature of the well adjusted for the additional mass provided by the padding fluid and proppant 13030.

After the baseline magnetic signature has been measured, introduction of additional frac fluid and proppant 13030 to the well may begin. The fluid is provided to the well in stages. A typical 4,000 foot horizontal pay zone may be hydraulically fractured in stages of about 400 feet at a time. In some aspects, the first stage is the length of the well bore 13020 closest to the toe. Subsequent stages are processed sequentially, working from the toe back to the well opening. As the frac fluid is introduced to a new stage, the sensor array 13011 measures the magnetic signature of the well pay zone region. The addition of the fluid causes hydraulic fracturing of the rock 13005 surrounding the horizontal well bore in the area of the stage presently being processed. Changes from the baseline measured magnetic signature indicate the presence of the additional fluid and proppant 13030 as it extends into the new induced fractures caused by the pressurized fluid. The changes may be monitored as subsequent stages are processed, with incremental changes in the measured magnetic signature being analyzed to provide insight into the progress and location of the newly formed fracture network.

To augment the information received at the sensor array as each stage is processed, the frac fluid and/or the proppant 13030 may be treated or infused with a magnetically susceptible material. For example, small ferrite particles may be added to the proppant particles 13030. The ferrite particles have a greater effect on the overall magnetic signature of the area to which they are introduced due to their magnetic susceptibility. According to some implementations, the proppant 13030 is mixed with a magnetically susceptible material. In other implementations, the frac fluid may be mixed with the magnetically susceptible material, or both the fluid and the proppant 13030 may be treated with the magnetically susceptible material. The differential magnetic signature is determined based on measuring the magnetic signature with the magnetometer sensor array after the magnetically susceptible proppant or fluid is added to a processing stage, and compared with the previous measured magnetic signatures measured prior to the addition of the proppant or fluid.

When adding a magnetic susceptible material to the frac fluid or the proppant 13030, the material is selected such that the addition of the material does not substantially increase the weight of the proppant of fluid. Along the horizontal pay zone, fractures in the rock extend in varying directions in a web-like manner radially from the horizontal well bore. Therefore, as the well is hydraulically fractured, the frac fluid and proppant 13030 must flow from the well bore in all radial directions, including upward against the force of gravity. If the added magnetically susceptible material adds too much weight to the fluid or the proppant 13030, the heavier material will tend to settle due to gravity and not flow into the upward regions of the surrounding rock formation.

A sequence of changes in the passive magnetic images captured by the magnetometer sensors during the fracking process are used to determine the proppant placement. The frac fluid and/or the synthetic proppant may be doped with a magnetically susceptible material. Monitoring of the hydraulic fracturing process continues as multiple magnetic images are captured throughout the proppant injection phase. The background or baseline magnetic profile is removed from the images formed throughout the propping phase. Constrained geophysical processing of the resulting group of magnetic images provides information about the distributions of fluid and proppant.

FIG. 131 is a diagram illustrating an example of a method 13100 for mapping and monitoring of hydraulic fracture, according to certain embodiments. According to the method 13100, using an array of sensors (e.g., 12802 of FIG. 128A or 13011 of FIG. 130A), a first magnetic image of a well pay zone (e.g., 12900 of FIG. 129) is captured (block 13110). Using the array of sensors, a second magnetic image is captured after a well bore (e.g., 12995 of FIG. 129) is padded with a fluid (block 13120). A background is established based on the first and the second magnetic images (block 13130). Using the array of sensors, a third magnetic image is captured after a doped proppant (e.g., 12940 of FIG. 129) is injected into a stage (e.g., 12920 of FIG. 129) (block 13140). The third image is processed to subtract the background and to obtain information regarding distribution of the fluid and the proppant in the stage (block 13150).

FIG. 132 is a diagram illustrating examples of primary and secondary magnetic fields in the presence of a doped proppant, according to certain embodiments. According to an aspect of the disclosure, FIG. 132 depicts a scenario wherein proppant doped with magnetically susceptible matter 13203 (e.g. the dopant) becomes magnetized and aligns with an external magnetic field, $\vec{H}_0$ 13201. Such external magnetic field may consist of the Earth's natural (geomagnetic) field, as well as possibly that of the surrounding rocks having remnant magnetization, and a magnetized well casing. The external field 13201 is commonly/synonymously referred to as the primary, background, or inducing field, which may be represented as a vector quantity having strength or magnitude, and direction.

Magnetization is also represented as a vector quantity, and the magnetization of the volume of doped proppant 13203 depicted below is labeled $\vec{M}$. Upon becoming magnetized, the susceptible proppant 13203 gives rise to an induced or secondary field 13205, $\underline{H}_S$. The induced field 13205 is distinct from, but caused, by the primary field 13201. The total magnetic field is then determined as the superposition of the primary field 13201 and secondary field 13205. In the simplest case (e.g. isotropic), magnetization relates to the total field by a scalar-valued susceptibility $\chi$, according to:

$$\underline{M}=\chi\underline{H}=\chi(\underline{H}_0+\underline{H}_S)$$

In a non-limiting embodiment, a standard approximation may be made which assumes the primary field 13201 is significantly greater than the secondary field 13205. Thus, the system's calculation may be made according to $\underline{M}\approx\chi\underline{H}_0$ and wherein the magnetization is parallel to the primary field 13201 and is linearly proportional to it through the susceptibility at any given location.

Generally, the vector field at an observation or measurement point P due to a distribution of magnetized matter (e.g. doped proppant) within a source region $\Omega$ is given by:

$$\begin{aligned}\vec{H}(P) &= \vec{H}_0(P) + \vec{H}_S(P)\\ &= \vec{H}_0(P) + \frac{1}{4\pi}\int\int_{\Omega}\int \vec{M}(\xi)\cdot\nabla\nabla\frac{1}{\rho(P,\xi)}d\Omega\end{aligned}$$

Given the quantities as previously defined, and $\xi$ taking on all locations within the relevant source magnetic region. However, using the standard approximation this reduces to a model for the secondary field 13205 depending on the susceptibility distributed throughout the relevant (i.e., non-negligible magnetic source) domain:

$$\vec{H}_S(P) = \frac{1}{4\pi}\int\int_{\Omega}\int \chi(\xi)\vec{H}_0(\xi)\cdot\nabla\nabla\frac{1}{\rho(P,\xi)}d\Omega$$

The magnetic source domain for an embodiment of the disclosure comprises the subsurface region surrounding the well that is being fracked, and extending outward from the well to a distance greater than the proppant would reasonably be expected to reach.

If the primary field 13201 existing prior to injecting any doped proppant or frac fluid is complicated by unknown but significant remnants, then the second equation may be used and the magnetization vector may be solved. Alternatively, the third equation may be used to solve for the scalar susceptibility distribution assuming the primary field vector is known throughout the domain of interest, which is taken to be Earth's geomagnetic background, and is well characterized. This approach may represent a simpler implementation.

Consistent with the assumptions stated above, the difference between DNV-based vector magnetic field measurements taken before and during the injection of doped proppant comprises a measure of the secondary field 13205 modeled by the third equation above, induced throughout the fracking process.

According to an aspect of the subject solution, the subsurface domain $\Omega$ surrounding the well is subdivided into many model "cells" that are right rectangular prisms of uniform size (other geometric shapes can be used but it is much less common). The unknown susceptibility of the material region associated with each model cell is taken to be constant. Cell sizes are chosen so that this approximation is reasonable, while also being large enough to keep the overall problem tractable (e.g. not too many cells), yet small enough to offer useful resolution (e.g. smooth variation) of the susceptibility being solved for.

After this discretization of the domain into many smaller discrete, uniform subdomain "cells," the susceptibilities for each cell being held constant can be removed from the volume integral and the integrals evaluated and arranged in a coefficient matrix (G) which multiplies the unknown susceptibilities (m) of each cell to compute secondary field values (d) that are expected to match the measured values. This forward model comprises a simple matrix-vector multiplication stated as:

$$d=Gm$$

The influence coefficient (G) maps the susceptibility values of all cells in the modeled domain to magnetic field values at each measurement point. As there are many more cells in the model than there are measurement locations, this problem is severely underdetermined and has no unique solution (e.g. it has an infinite number of solutions). This is typical of geophysical inversion problems.

Regularized inversion provides a solution to this dilemma and is a mainstay of geophysics, wherein additional constraints are introduced to yield uniqueness and enable solving for the many unknowns. Types of constraints vary widely, ranging from totally artificial and mathematically contrived, to constraints that are very much physics-based and well applied to certain problems.

A general formulation that encapsulates most of these approaches comprises the simultaneous minimization of data misfit and constraint violation. Data misfit is the difference between measured data and modeled data reconstructed by the forward model of the equation above for a specified set of cell susceptibilities. This can be written as a scalar, two-term performance index or cost function:

$$\phi(m)=\phi_d(m)+\gamma\phi_m(m)$$

where $\varphi_d$ represents the data misfit term that takes on large values when a specified set of susceptibilities poorly reconstructs (via the forward model of the prior equation) the measured magnetic field values, and small values when the data is well matched. A quadratic form is common:

$$\phi_d(m)=(\tilde{d}-d)^T R^{-1}(\tilde{d}-d)$$

where the tilde (~) annotation indicates actual measured data and square matrix (R) is the measurement error covariance matrix associated with the data. Accordingly, individual data entries known to be very accurate may require being very closely matched by the reconstruction. Otherwise their mismatch produces large penalties.

The term $\phi_m$ is a model adjustment term that embodies problem constraints that give uniqueness to the problem while also providing physical insight to the problem being solved. A simple example for this term is one that takes on large values for specified susceptibilities that differ greatly from a-priori values (note the a-priori values are often zero, which for a hydraulic fracturing application implies no proppant is pushed into the geologic subdomain corresponding to a cell of the forward model). A simple quadratic form for this term is:

$$\phi_m(n)=(m_0-m)^T W(m_0-m)$$

where $m_0$ comprises the a-priori susceptibilities of the cells one intends to keep the solution near, and the square matrix (W) reflects the possibly differential importance or preference of keeping certain cell values closer to their a-priori values than others. The non-diagonal entries of W may be represented as zero entries, wherein W is diagonal and hence symmetric. Diagonal entries of W are all positive-valued.

Returning to the overall performance index of the two-term performance index or cost function above, the second (model adjustment) term is weighted by a scalar (γ) to achieve a balance between the two terms. For example, (γ) is typically heuristically adjusted so the overall performance index is evenly apportioned between the data misfit and model adjustment terms.

Susceptibilities are then solved for the quadratic case as:

$$m=(G^T R^{-1} G+\gamma W)^{-1}(G^T R^{-1}\tilde{d}+\gamma W m_0)$$

The above described solutions provide the benefit of being easy to solve. The model adjustment term may encapsulate the following constraints, which may be particularly useful for embodiments according to this specification: (1) The well geometry is known a-priori, so model cells outside the fracked stage and potentially its neighboring stages are unlikely to have significant changes in their susceptibility; (2) the total amount of susceptible matter pumped down the well is known and must be matched by the recovered model; (3) alternatively to the quadratic adjustment term of the quadratic form equation allowing small adjustment of all susceptibilities, a so-called focused inversion may be implemented wherein only susceptibilities of a subset (e.g. minimum) number of model cells are allowed to change during the solution.

The geophysical inversion calculations may be implemented in hardware, software or a combination of hardware and software, for example by the processing system 18400 of FIG. 184. A general purpose computer processor (e.g., processing system 18402 of FIG. 184) for receiving magnetic and/or micro-seismic signals may be configured to receive and execute computer readable instructions. The instructions may be stored on a computer readable medium in communication with the processor. One or more processors may be used for calculation some or all of the magnetic and/or micro-seismic signals according to a non-limiting embodiment of the present disclosure.

High Bit-Rate Magnetic Communication Implementation

In some implementations, the devices 300, 600A, 600B, 600C, 700, 2500, and/or 4200 can be implemented in a high bit-rate magnetic communication system.

In some implementations, a high bit-rate magnetic communications transmitter can be used that is capable of transmitting magnetic field waves with an optimized waveform. The optimized waveform includes an amplitude modulated triangular waveform. The disclosure is also directed to a high bit-rate magnetic communications receiver including a magnetic sensor, such as diamond nitrogen-vacancy (DNV) sensor, and a signal processor that can demodulate the amplitude modulated triangular waveform. In some implementations, the receiver of the subject technology is enabled to perform motion compensation, for example, compensation for rotations in Earth's magnetic field. The subject technology achieves a significantly higher bit-rate than other magnetic communications approaches by leveraging the high sensitivity and small form factor of the DNV sensors and utilizing modern signal processing that has made amplitude-dependent coherent modulation a practical reality for high bit rates. Other advantageous features of the disclosed solution include optimized waveform for the magnetic scenario, magnetic-specific error removal, and an optional adaptation scheme and polarity scheme.

FIGS. 133A-133B are diagrams illustrating examples of a high-level architecture of a magnetic communication transmitter 13300A and a schematic of a circuit 13300B of a controller, according to certain embodiments. It is understood that the nearly-universal method of creating a variable magnetic field is by passing current through a coil of wire. The magnetic communication transmitter (hereinafter "transmitter") 13300A includes a magnetic field generator 13310 and a controller 13320. The magnetic field generator 13300 includes a magnetic coil and generates a magnetic field, which is proportional to an electrical current (hereinafter "current") passing through the coil. The controller 13320 controls the current provided to the magnetic field generator and can cause the magnetic field generator to generate an optimized waveform.

Electrically, the coil is an inductor with some loss that can be modeled as a series resistance. The series resistance may place the following constraints on the design. First, the rate of change of the magnetic field has an upper bound corresponding to the maximum voltage available in drive circuit of the coil, because the derivative of the current is proportional to the voltage across the inductor. This also implies that the magnetic field and current are continuous functions. The optimized waveform is considered to be a waveform that when received and processed by the receiver can result in a desirable signal-to-noise ratio.

It is understood that the desirable signal-to-noise ratio can be achieved when the modulation signal has the largest L2 norm (e.g., the differences between the signals for different symbol values have the largest L2 norm), and with a rate limited signal. The rate limited signal has a waveform that, in the maximum amplitude case, has a ramp-up derivative equal to a maximum positive derivative, and a ramp-down derivative equal to the maximum negative derivative. Therefore, the subject technology uses, as a basis function, a triangle wave with an optional sustain. The triangular waveform ramps up, can sustain at its peak value, then ramps down. With no sustain, triangular waveform is a ramp-up and ramp-down, and for a given fixed symbol interval and given the rate limit, that would be a desirable waveform. If, however, there is also some reason to impose an inductor current limit that would be exceeded by a maximum ramp-up of the current for half the duration of the symbol interval, then the ramp up would be stopped at the current level and the magnitude would be sustained, and then ramped down proceeds at the maximum rate to zero. To be able to start each successive symbol transmission at the same starting point regardless of the value of the successive symbols, each symbol must start with the same magnetic field strength and must end with that same field strength (e.g., for the required continuity).

The controller 13320 is responsible for providing the current to the magnetic coil of the magnetic field generator 13310 such that the generated magnetic field has the optimized triangular waveform. In some embodiments, the controller includes the circuit 13300B, the schematic of which is shown in FIG. 133B. The circuit 13300B includes switches (e.g., transistors such as bipolar or other transistor type or other switches) T1 and T2, diodes D1 and D2, an inductor L, capacitors C1 and C2. The inductor L is the magnetic coil of the magnetic field generator 13310. A current i of the inductor L of the magnetic coil is controlled by the transistors T1 and T2. The capacitor C1 is precharged to +Vp voltage, as shown in FIG. 133B. The circuit 13300B can be operated in four phases.

In a first phase, when the transistor T1 is on and transistor T2 is off, the capacitor C1 is discharged through the transistor T1 (e.g., an NPN transistor) and the inductor L, which provides an increasing positive current i through the inductor L. In a second phase, the transistors T1 and T2 are off, the capacitor C2 is charged through the diode D2 and the inductor L, which provides a decreasing positive current i through the inductor L. In a third phase, the transistor T1 is off and the transistor T2 is on, the capacitor C2 is discharged through the transistor T2 and the inductor L, which provides a decreasing negative current i through the inductor L. Finally, in a fourth phase, both transistors T1 and T2 are off and the capacitor C1 is charged through the diode D1 and the inductor L, which provides an increasing negative current i through the inductor L.

More detailed discussion of circuit 13300B and other implementations of the controller 13320 can be found in a separate patent application entitled "Energy Efficient Magnetic Field Generator Circuits," by the applicants of the present patent application, filed on the same date with the present patent application.

FIGS. 134A-134B are diagrams illustrating examples of a high-level architecture of a magnetic communication receiver 13400A and a set of amplitude modulated waveforms 13400B, according to certain embodiments. The magnetic communication receiver (hereinafter "receiver") 13400A includes a magnetic field sensor 13410 and a signal processor 13420. The magnetic field sensor 13410 is configured to sense a magnetic field and generate a signal (e.g., an optical signal or an electrical signal such as a current or voltage signal) proportional to the sensed magnetic field. In one or more implementations, the magnetic field sensor 13410 may include a DNV sensor.

Atomic-sized nitrogen-vacancy (NV) centers in diamond lattices have been shown to have excellent sensitivity for magnetic field measurement and enable fabrication of small (e.g., micro-level) magnetic sensors that can readily replace existing-technology (e.g., Hall-effect) systems and devices. The DNV sensors are maintained in room temperature and atmospheric pressure and can be even used in liquid environments. A green optical source (e.g., a micro-LED) can optically excite NV centers of the DNV sensor and cause emission of fluorescence radiation (e.g., red light) under off-resonant optical excitation. A magnetic field generated, for example, by a microwave coil can probe degenerate triplet spin states (e.g., with $m_s$=−1, 0, +1) of the NV centers to split proportional to an external magnetic field projected along the NV axis, resulting in two spin resonance frequencies. The distance between the two spin resonance frequencies is a measure of the strength of the external magnetic field. A photo detector can measure the fluorescence (red light) emitted by the optically excited NV centers and generate an electrical signal.

The signal processor 13420 may include a general processor or a dedicated processor (e.g., a microcontroller). The signal processor 13420 includes logic circuits or other circuitry and codes configured to implement coherent demodulation of a high-bit rate amplitude modulated signals, such as a high-bit rate amplitude modulated triangular waveform. An example of an amplitude modulated triangular waveform is shown in FIG. 134B. The amplitude modulated triangular waveform 13400B of FIG. 134B includes a high-amplitude (e.g., full-amplitude) positive triangular waveform 13432, a low-amplitude positive triangular waveform 13434, a low-amplitude negative triangular waveform 13436, and high-amplitude negative triangular waveform 13438. These waveforms are desirable for representing various symbols of a 2-bit representation of data. For example, the waveforms 13432, 13434, 13436, and 13438 can be used to represent 11, 10, 01, and 00 symbols of the 2-bit representation of data. The waveforms 13432, 13434, 13436, and 13438 can provide an optimized signal-to-noise ratio (SNR), and due to their continuity, can be readily generated by using a practical voltage supply, as shown for example, by the circuit 13300B of FIG. 133B. The amplitude of the waveforms 13432, 13434, 13436, and 13438 are selected to make the spacing between the subsequent symbols as large as possible by the L2 metric. For example, a partial amplitude waveform (e.g., 13434 or 13436) may be chosen to have an amplitude that is ⅓ of the amplitude of a high-amplitude waveform (e.g., 13432 or 13438).

FIG. 135 is a diagram illustrating an example of a method 13500 for providing a magnetic communication transmitter, according to certain embodiments. The method 13500 includes providing a magnetic field generator (e.g. 13310 of FIG. 133A) configured to generate a magnetic field (block 13510). A controller (e.g. 13320 of FIG. 133A) is provided that is configured to control the magnetic field generator by controlling an electrical current (e.g. i of FIG. 133B) supplied to the magnetic field generator and causing the magnetic field generator to generate an optimized variable amplitude triangular waveform (e.g. 13400B of FIG. 134B) (block 13520).

FIG. 136 is a diagram illustrating an example of a data frame 13600 of a magnetic communication transmitter, according to certain embodiments. The data frame 13600 includes data portions 13602 and 13604 and one or more auxiliary portions. The data portions 13602 and 13604 include data symbols, for example, 11, 00, 10, and 01 symbols. The auxiliary portions include MAX and OFF symbols 13610 and 13620. In one or more implementations, the MAX symbol 13610 can be a 11 symbol, and the OFF symbol 13620 may represent a no symbol interval, which provides an opportunity for synchronization and background field measurement and removal, as explained in more details herein. The calibration and background field removal are critical aspects of the subject technology. The MAX symbol 13610 is used to enable the receiver to perform synchronization and calibration of the received signal. The calibration, for example, can correct for the rotation of the sensor relative to the Earth's magnetic dipole, which results in some change in the background signal.

FIG. 137 is a diagram illustrating an example of motion compensation scheme 13700, according to certain embodiments. Motion compensation is an important aspect of the subject disclosure, as the Earth's magnetic field is a significant part of the background noise in any magnetic field sensing. If the sensor is moving (e.g., rotating) relative to the Earth's magnetic field vector, the measured signal (e.g., 13710 corresponding to a rotation rate of 0.1 rad/s) can significantly deviate from the measured magnetic signal without rotation (e.g., 13720). The subject technology allows for measurement and subtraction of this time varying background while the magnetic signal is analyzed. The OFF symbol intervals 13620, 13622, and 13624 can be used for measurement of the background noise. As seen from FIG. 137, the value of the measured signal 13710 at OFF symbol intervals 13620, 13622, and 13624 are substantially different from the respective values of the measured signal 13720 (e.g., without rotation). These differences at different OFF symbol intervals can be fitted to linear or spline curves and be used to calibrate the signal for motion compensation, for example, by subtraction of the measured background noise from the actual measured signal.

FIGS. 138A-138B are diagrams illustrating examples of throughput results with turning, rolling and low-frequency compensation, according to certain embodiments. In the diagram 13800A of FIG. 138A, plot 13810 corresponds to no rotation compensation that results is undesirably low throughput values (in kbits/sec), which rapidly turn to zero as the transmitter-to-receiver distance is increased to nearly 200 meters. Plots 13820 and 13830 correspond to turning of the sensor at 0.1 rad/sec, where measure data are compensated for the motion (e.g., as described above) using linear and spline compensations, respectively. The spline compensation is seen to completely remove rotation effects on bit rate. Not shown here for simplicity, are the removal of all effects of low frequency (e.g., <0.1 Hz) environmental noise and low frequency self-noise (e.g., <5 Hz). In some implementations, the 60 cycle hum and its 120 Hz harmonic can be removed by using notch filters.

In the diagram 13800B of FIG. 138B, plots 13812, 13822, and 13832 are for similar circumstances as plots 13810, 13820, and 13830 of FIG. 138A, except that the sensor motion is rolling at a higher rate (e.g., 0.3 rad/sec). The spline compensation is seen to be more effective in removing the effects of rolling on bit rate than the linear compensation.

FIG. 139 is a diagram illustrating an example adaptive modulation scheme 13900, according to certain embodiments. The adaptive modulation scheme 13900 uses an adaptive modulation technique, which is different form the commonly used techniques in other communication media such as RF communication. The subject technology uses period extension to perform adaptive modulation. It is understood that as the performance is degraded due to noise (e.g., SNR is decreased), discriminating various levels 13920 denoted by symbols 00, 01, 10, and 11 can be difficult. In other words, the correlation of the measured points 13915 with the basis function 13910 (e.g., a triangular waveform) may not match one of the expected values (e.g., denoted by symbols 00, 01, 10, and 11). When mismatches are too large relative to amplitude spacings, the receiver can signal for either fewer amplitude levels (e.g., lower performance such as two-level resolution) or longer symbol intervals (e.g., lower bit rate). Conversely, when the mismatches are small, the amplitude levels can be increased (e.g., better resolution performance) or the symbol intervals can be decreased (e.g., higher bit rate). The adaptive modulation may, for example, be implemented by extending the symbol period as shown by the symbol (e.g., basis function) 13930, which has an extended period as compared to the basis function 13910.

FIGS. 140A through 140C are diagrams illustrating components for implementing an example technique for multiple channel resolution, according to certain embodiments. The use of DNV sensors for the receivers of the subject technology allows simultaneous receiving of multiple channel (e.g., up to three) channels transmitted by three different transmitters that are synchronous and cooperative in time, but transmit with different magnetic field (B) orientations. This enables up to three times higher performance of a single channel alone. The magnetic fields of the three transmitters in the coordinate system 14000A of FIG. 140A, where magnetic vectors 14010, 14020, and 14030 correspond to the fields transmitted by the three transmitters, which form the resultant combined vector 14050.

The subject technology uses frame formatting to support the multiple channels scheme. For example, MAX symbols (e.g., 14012, 14014, and 14016) of a data frame 14000B of FIG. 140B are used to indicate which of the three transmitters is transmitting. For instance, the MAX symbol 14012 indicates that first transmitter is transmitting and the all other transmitters are off. Similarly, MAX symbols 14014 and 14016 indicate that one of the second or the third transmitters is transmitting, respectively. This information assists the receiver to estimate the corresponding magnetic field (e.g., $B_1$) vector of the transmitting transmitter (e.g. the $i_{th}$ transmitter). To resolve a magnetic field B into individual channels, as shown in a matrix equation 140C of FIG. 140C, the basis matrix C+ transforms the measurements from the {X,Y,Z} basis into the {B1,B2,B3} basis. The full performance can be achieved when the matrix C+ has full rank, which happens when all transmitter B fields are mutually orthogonal. In case the B fields are highly co-linear, C+ matrix may become singular and magnify any noise present, thereby degrading the performance. The elements of the C+ matrix are projections of the measured magnetic field of each transmitter $B_i$ fields over the X, Y, and Y axes. For example, $B_{i,y}$ is the projection of the measured $B_i$ fields over the Y axis, and $B_{i,x}$, $B_{i,y}$, and $B_{i,z}$ define the angle of arrival of the $i_{th}$ transmitter. The angle of arrival of each transmitter is a vector that is in the direction of the polarization of the B-field vector for that transmitter. The elements of the channels vector give the channel data that each transmitter has actually transmitted.

FIGS. 141A-141B are diagrams illustrating single channel throughput variations 14100A and 14100B versus transmitter-receiver distance, according to certain embodiments. The plots 14100A and 14100B shown in FIGS. 141A and 141B are single channel (e.g., with no orthogonal frequency division multiplexing (OFDM) and no 3D-vector multiplexing) simulation results in open air for bit-error rates less than approximately one percent, using existing DNV detectors. The period of the triangular waveform is allowed to vary from 60 to 500 microseconds. The plot 14100B shown in FIG. 141B is a zoom-in of the plot 14100A in FIG. 141A for closer look.

FIGS. 142A-142B are diagrams illustrating simulated performance results 14201A and 14200B, according to certain embodiments. The simulated performance results 14200A and 14200B are 2-dimensional plots showing single channel throughput results (in Kbps) as the DNV sensor quantization level and transmitter magnetic field B (in Tesla at 1 meter) are varied. The results 14200A and 14200B are, respectively, for 100 m and 500 meter distance between the receiver and the transmitter. The quantization levels define the resolution of the DNV sensors.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Magnio Communication Implementation

In some implementations, the devices 300, 600A, 600B, 600C, 700, 2500, and/or 4200 can be implemented in a magnio communication implementation.

Radio waves can be used as a carrier for information. Thus, a transmitter can modulate radio waves at one location, and a receiver at another location can detect the modulated radio waves and demodulate the signals to receive the information. Many different methods can be used to transmit information via radio waves. However, all such methods use radio waves as a carrier for the information being transmitted.

However, radio waves are not well suited for all communication methods. For example, radio waves can be greatly attenuated by some materials. For example, radio waves do not generally travel well through water. Thus, communication through water can be difficult using radio waves. Similarly, radio waves can be greatly attenuated by the earth. Thus, wireless communication through the earth, for example for coal or other mines, can be difficult. It is often difficult to communicate wirelessly via radio waves from a metal enclosure. The strength of a radio wave signal can also be reduced as the radio wave passes through materials such as walls, trees, or other obstacles. Additionally, communication via radio waves is widely used and understood. Thus, secret communication using radio waves requires complex methods and devices to maintain the secrecy of the information.

According to some embodiments described herein, wireless communication is achieved without using radio waves as a carrier for information. Rather, modulated magnetic fields can be used to transmit information. For example, a transmitter can include a coil or inductor. When current passes through the coil, a magnetic field is generated around the coil. The current that passes through the coil can be modulated, thereby modulating the magnetic field. Accordingly, information converted into a modulated electrical signal (e.g., the modulated current through the coil) can be used to transfer the information into a magnetic field. A magnetometer can be used to monitor the magnetic field. The modulated magnetic field can, therefore, be converted into traditional electrical systems (e.g., using current to transfer information). Thus, a communications signal can be converted into a magnetic field and a remote receiver (e.g., a magnetometer) can be used to retrieve the communication from the modulated magnetic field.

Magnetic fields of different directions can be modulated simultaneously and each of the modulations can be differentiated or identified by a DNV sensor. For example, a magnetic field in the direction of NV A can be modulated with a first pattern, a magnetic field in the direction of NV B can be modulated with a second pattern, a magnetic field in the direction of NV C can be modulated with a third pattern, and a magnetic field in the direction of NV D can be modulated with a fourth pattern. The movement of the notches in the frequency response corresponding to the various spin states can be monitored to determine each of the four patterns.

However, in some embodiments, the direction of the magnetic field corresponding to the various spin states of a DNV sensor of a receiver may not be known by the transmitter. In such embodiments, by monitoring at least three of the spin states, messages transmitted on two magnetic fields that are orthogonal to one another can be deciphered. Similarly, by monitoring the frequency response of the four spin states, messages transmitted on three magnetic fields that are orthogonal to one another can be deciphered. Thus, in some embodiments, two or three independent signals can be transmitted simultaneously to a receiver that receives and deciphers the two or three signals. Such embodiments can be a multiple-input multiple-output (MIMO) system. Diversity in the polarization of the magnetic field channels provides a full rank channel matrix even through traditionally keyhole channels. In an illustrative embodiment, a full rank channel matrix allows MIMO techniques to leverage all degrees of freedom (e.g., three degrees of polarization). Using a magnetic field to transmit information circumvents the keyhole effect that propagating a radio frequency field can have.

FIG. 143 is a block diagram of a magnetic communication system in accordance with an illustrative embodiment. An illustrative magnio system 14300 includes input data 14305, a 14310, a transmitter 14345, a modulated magnetic field 14350, a magnetometer 14355, a magnio receiver 14360, and output data 14395. In alternative embodiments, additional, fewer, and/or different elements may be used.

In an illustrative embodiment, input data 14305 is input into the magnio system 14300, transmitted wirelessly, and the output data 14395 is generated at a location remote from the generation of the input data 14305. In an illustrative embodiment, the input data 14305 and the output data 14395 contain the same information.

In an illustrative embodiment, input data 14305 is sent to the magnio transmitter 14310. The magnio transmitter 14310 can prepare the information received in the input data 14305 for transmission. For example, the magnio transmitter 14310 can encode or encrypt the information in the input data 14305. The magnio transmitter 14310 can send the information to the transmitter 14345.

The transmitter 14345 is configured to transmit the information received from the magnio transmitter 14310 via one or more magnetic fields. The transmitter 14345 can be configured to transmit the information on one, two, three, or four magnetic fields. That is, the transmitter 14345 can transmit information via a magnetic field oriented in a first direction, transmit information via a magnetic field oriented in a second direction, transmit information via a magnetic field oriented in a third direction, and/or transmit information via a magnetic field oriented in a fourth direction. In some embodiments in which the transmitter 14345 transmits information via two or three magnetic fields, the magnetic fields can be orthogonal to one another. In alternative embodiments, the magnetic fields are not orthogonal to one another.

The transmitter 14345 can be any suitable device configured to create a modulated magnetic field. For example, the transmitter 14345 can include one or more coils. Each coil can be a conductor wound around a central axis. For example, in embodiments in which the information is transmitted via three magnetic fields, the transmitter 14345 can include three coils. The central axis of each coil can be orthogonal to the central axis of the other coils.

The transmitter 14345 generates the modulated magnetic field 14350. The magnetometer 14355 can detect the modulated magnetic field 14350. The magnetometer 14355 can be located remotely from the transmitter 14345. For example, with a current of about ten Amperes through a coil (e.g., the transmitter) and with a magnetometer magnetometer 14355 with a sensitivity of about one hundred nano-Tesla, a message can be sent, received, and recovered in full with several meters between the transmitter and receiver and with the magnetometer magnetometer 14355 inside of a Faraday cage. The magnetometer 14355 can be configured to measure the modulated magnetic field 14350 along three or four directions. As discussed above, a magnetometer 14355 using a DNV sensor can measure the magnetic field along four directions associated with four spin states. The magnetometer 14355 can transmit information, such as frequency response information, to the magnio receiver 14360.

The magnio receiver 14360 can analyze the information received from the magnetometer 14355 and decipher the information in the signals. The magnio receiver 14360 can reconstitute the information contained in the input data 14305 to produce the output data 14395.

In an illustrative embodiment, the magnio transmitter 14310 includes a data packet generator 14315, an outer encoder 14320, an interleaver 14325, an inner encoder 14330, an interleaver 14335, and an output packet generator 14340. In alternative embodiments, additional, fewer, and/or different elements may be used. The various components of the magnio transmitter 14310 are illustrated in FIG. 143 as individual components and are meant to be illustrative only. However, in alternative embodiments, the various components may be combined. Additionally, the use of arrows is not meant to be limiting with respect to the order or flow of operations or information. Any of the components of the magnio transmitter 14310 can be implemented using hardware and/or software.

The input data 14305 can be sent to the data packet generator 14315. In an illustrative embodiment, the input data 14305 is a series or stream of bits. The data packet generator 14315 can break up the stream of bits into packets of information. The packets can be any suitable size. In an illustrative embodiment, the data packet generator 14315 includes appending a header to the packets that includes transmission management information. In an illustrative embodiment the header can include information used for error detection, such as a checksum. Any suitable header may be used. In some embodiments, the input data 14305 is not broken into packets.

The stream of data generated by the data packet generator 14315 can be sent to the outer encoder 14320. The outer encoder 14320 can encrypt or encode the stream using any suitable cypher or code. Any suitable type of encryption can be used such as symmetric key encryption. In an illustrative embodiment, the encryption key is stored on memory associated with the magnio transmitter 14310. In an illustrative embodiment, the magnio transmitter 14310 may not include the outer encoder 14320. For example, the messages may not be encrypted. In an illustrative embodiment, the outer encoder 14320 separates the stream into multiple channels. In an illustrative embodiment, the outer encoder outer encoder 14320 performs forward error correction (FEC). In some embodiments, the forward error correction dramatically increases the reliability of transmissions for a given power level.

In an illustrative embodiment, the encoded stream from the outer encoder 14320 is sent to the interleaver 14325. In an illustrative embodiment, the interleaver 14325 interleaves bits within each packet of the stream of data. In such an embodiment, each packet has the same bits, but the bits are shuffled according to a predetermined pattern. Any suitable interleaving method can be used. In an alternative embodiment, the packets are interleaved. In such an embodiment, the packets are shuffled according to a predetermined pattern. In some embodiments, the magnio transmitter 14310 may not include the interleaver 14325.

In some embodiments, interleaving data can be used to prevent loss of a sequence of data. For example, if a stream of bits are in sequential order and there is a communication loss during a portion of the stream, there is a relatively large gap in the information corresponding to the lost bits. However, if the bits were interleaved (e.g., shuffled), once the stream is de-interleaved (e.g., unshuffled) at the receiver, the lost bits are not grouped together but are spread across the sequential bits. In some instances, if the lost bits are spread across the message, error correction can be more successful in determining what the lost bits were supposed to be.

In an illustrative embodiment, the interleaved stream from the interleaver 14325 is sent to the inner encoder 14330. The inner encoder 14330 can encrypt or encode the stream using any suitable cypher or code. Any suitable type of encryption can be used such as symmetric key encryption. In an illustrative embodiment, the encryption key is stored on memory associated with the magnio transmitter 14310. In an illustrative embodiment, the magnio transmitter 14310 may not include the inner encoder 14330. In an illustrative embodiment, the inner encoder 14330 and the outer encoder 14320 perform different functions. For example, the inner encoder 14330 can use a deep convolutional code and can perform most of the forward error correction, and the outer encoder can be used to correct residual errors and can use a different coding technique from the inner encoder 14330 (e.g., a block-parity based encoding technique).

In an illustrative embodiment, the encoded stream from the inner encoder 14330 is sent to the interleaver 14335. In an illustrative embodiment, the interleaver 14335 interleaves bits within each packet of the stream of data. In such an embodiment, each packet has the same bits, but the bits are shuffled according to a predetermined pattern. Any suitable interleaving method can be used. In an alternative embodiment, the packets are interleaved. In such an embodiments, the packets are shuffled according to a predetermined pattern. In an illustrative embodiment, interleaving the data spreads out burst-like errors across the signal, thereby facilitating the decoding of the message. In some embodiment, the magnio transmitter 14310 may not include the interleaver 14335.

In an illustrative embodiment, the interleaved stream from the interleaver 14335 is sent to the output packet generator 14340. The output packet generator 14340 can generate the packets that will be transmitted. For example, the output packet generator 14340 may append a header to the packets that includes transmission management information. In an illustrative embodiment the header can include information used for error detection, such as a checksum. Any suitable header may be used.

In an illustrative embodiment, the output packet generator 14340 appends a synchronization sequence to each of the packets. For example, a synchronization sequence can be added to the beginning of each packet. The packets can be transmitted on multiple channels. In such an embodiment, each channel is associated with a unique synchronization sequence. The synchronization sequence can be used to decipher the channels from one another, as is discussed in greater detail below with regard to the magnio receiver 14360.

In an illustrative embodiment, the output packet generator 14340 modulates the waveform to be transmitted. Any suitable modulation can be used. In an illustrative embodiment, the waveform is modulated digitally. In some embodiments, minimum shift keying can be used to modulate the waveform. For example, non-differential minimum shift key can be used. In an illustrative embodiment, the waveform has a continuous phase. That is, the waveform does not have phase discontinuities. In an illustrative embodiment, the waveform is sinusoidal in nature.

In an illustrative embodiment, the modulated waveform is sent to the transmitter 14345. In an illustrative embodiment, multiple modulated waveforms are sent to the transmitter 14345. As mentioned above, two, three, or four signals can be transmitted simultaneously via magnetic fields with different directions. In an illustrative embodiment, three modulated waveforms are sent to the transmitter 14345. Each of the waveforms can be used to modulate a magnetic field, and each of the magnetic fields can be orthogonal to one another.

The transmitter 14345 can use the received waveforms to produce the modulated magnetic field 14350. The modulated magnetic field 14350 can be a combination of multiple magnetic fields of different directions. The frequency used to modulate the modulated magnetic field 14350 can be any suitable frequency. In an illustrative embodiment, the carrier frequency of the modulated magnetic field 14350 can be 10 kHz. In alternative embodiments, the carrier frequency of the modulated magnetic field 14350 can be less than or greater than 10 kHz. In some embodiments, the carrier frequency can be modulated to plus or minus the carrier frequency. That is, using the example in which the carrier frequency is 10 kHz, the carrier frequency can be modulated down to 0 Hz and up to 20 kHz. In alternative embodiments, any suitable frequency band can be used.

FIGS. 144A and 144B show the strength of a magnetic field versus frequency in accordance with an illustrative embodiment. FIGS. 144A and 144B are meant to be illustrative only and not meant to be limiting. In some instances, the magnetic spectrum is relatively noisy. As shown in FIG. 144A, the noise over a large band (e.g., 0-200 kHz) is relatively high. Thus, communicating over such a large band may be difficult. FIG. 144B illustrates the noise over a smaller band (e.g., 1-3 kHz). As shown in FIG. 144B, the noise over a smaller band is relatively low. Thus, modulating the magnetic field across a smaller band of frequencies can be less noisy and more effective. In an illustrative embodiment, the magnio transmitter 14310 can monitor the magnetic field and determine a suitable frequency to modulate the magnetic fields to reduce noise. That is, the magnio transmitter 14310 can find a frequency that has a high signal to noise ratio. In an illustrative embodiment, the magnio transmitter 14310 determines a frequency band that has noise that is below a predetermined threshold.

In an illustrative embodiment, the magnio receiver 14360 includes the demodulator 14365, the de-interleaver 14370, the soft inner decoder 14375, the de-interleaver 14380, the outer decoder 14385, and the output data generator 14390. In alternative embodiments, additional, fewer, and/or different elements may be used. For example, the magnio receiver 14360 can include the magnetometer 14355 in some embodiments. The various components of the magnio receiver 14360 are illustrated in FIG. 143 as individual components and are meant to be illustrative only. However, in alternative embodiments, the various components may be combined. Additionally, the use of arrows is not meant to be limiting with respect to the order or flow of operations or information. Any of the components of the magnio receiver 14360 can be implemented using hardware and/or software.

The magnetometer 14355 is configured to measure the modulated magnetic field 14350. In an illustrative embodiment, the magnetometer 14355 includes a DNV sensor. The magnetometer 14355 can monitor the modulated magnetic field 14350 in up to four directions. As illustrated in FIG. 4B, the magnetometer 14355 can be configured to measure the magnetometer 14355 in one or more of four directions that are tetrahedronally arranged. As mentioned above, the magnetometer 14355 can monitor n+1 directions where n is the number of channels that the transmitter 14345 transmits on. For example, the transmitter 14345 can transmit on three channels, and the magnetometer 14355 can monitor four directions. In an alternative embodiment, the transmitter 14345 can transmit via the same number of channels (e.g., four) as directions that the magnetometer 14355 monitors.

The magnetometer 14355 can send information regarding the modulated magnetic field 14350 to the demodulator 14365. The demodulator 14365 can analyze the received information and determine the direction of the magnetic fields that were used to create the modulated magnetic field 14350. That is, the demodulator 14365 can determine the directions of the channels that the transmitter 14345 transmitted on. As mentioned above, the transmitter 14345 can transmit multiple streams of data, and each stream of data is transmitted on one channel. Each of the streams of data can be preceded by a unique synchronization sequence. In an illustrative embodiment, the synchronization sequence includes 1023 bits. In alternative embodiments, the synchronization sequence includes more than or fewer than 1023 bits. Each of the streams can be transmitted simultaneously such that each of the channels are time-aligned with one another. The demodulator 14365 can monitor the magnetic field in multiple directions simultaneously. Based on the synchronization sequence, which is known to the magnio receiver 14360, the demodulator 14365 can determine the directions corresponding to the channels of the transmitter 14345. When the streams of synchronization sequences are time-aligned, the demodulator 14365 can monitor the modulated magnetic field 14350 to determine how the multiple channels mixed. Once the demodulator 14365 determines how the various channels are mixed, the channels can be demodulated.

For example, the transmitter 14345 transmits on three channels, with each channel corresponding to an orthogonal direction. Each channel is used to transmit a stream of information. For purposes of the example, the channels are named "channel A," "channel B," and "channel C." The magnetometer 14355 monitors the modulated magnetic field 14350 in four directions. The demodulator 14365 can monitor for three signals in orthogonal directions. For purposes of the example, the signals can be named "signal 1," "signal 2," and "signal 3." Each of the signals can contain a unique, predetermined synchronization sequence. The demodulator 14365 can monitor the modulated magnetic field 14350 for the signals to be transmitted on the channels. There is a finite number of possible combinations that the signals can be received at the magnetometer 14355. For example, signal 1 can be transmitted in a direction corresponding to channel A, signal 2 can be transmitted in a direction corresponding to channel B, and signal 3 can be transmitted in a direction corresponding to channel C. In another example, signal 2 can be transmitted in a direction corresponding to channel A, signal 3 can be transmitted in a direction corresponding to channel B, and signal 1 can be transmitted in a direction corresponding to channel C, etc. The modulated magnetic field 14350 of the synchronization sequence for each of the possible combinations that the signals can be received at the magnetometer 14355 can be known by the demodulator 14365. The demodulator 14365 can monitor the output of the magnetometer 14355 for each of the possible combinations. Thus, when one of the possible combinations is recognized by the demodulator 14365, the demodulator 14365 can monitor for additional data in directions associated with the recognized combination. In another example, the transmitter 14345 transmits on two channels, and the magnetometer 14355 monitors the modulated magnetic field 14350 in three directions.

The demodulated signals (e.g., the received streams of data from each of the channels) is sent to the de-interleaver 14370. The de-interleaver 14370 can undo the interleaving of the interleaver 14335. The de-interleaved streams of data can be sent to the soft inner decoder 14375, which can undo the encoding of the inner encoder 14330. Any suitable decoding method can be used. For example, in an illustrative embodiment the inner encoder 14330 uses a three-way, soft-decision turbo decoding function. In an alternative embodiment, a two-way, soft-decision turbo decoding function may be used. For example, the expected cluster positions for signal levels are learned by the magnio receiver 14360 during the synchronization portion of the transmission. When the payload/data portion of the transmission is processed by the magnio receiver 14360, distances from all possible signal clusters to the observed signal value are computed for every bit position. The bits in each bit position are determined by combining the distances with state transition probabilities to find the best path through a "trellis." The path through the trellis can be used to determine the most likely bits that were communicated.

The decoded stream can be transmitted to the de-interleaver 14380. The de-interleaver 14380 can undo the interleaving of the interleaver 14325. The de-interleaved stream can be sent to the outer decoder 14385. In an illustrative embodiment, the outer decoder 14385 undoes the encoding of the outer encoder 14320. The unencoded stream of information can be sent to the output data generator 14390. In an illustrative embodiment, the output data generator 14390 undoes the packet generation of data packet generator 14315 to produce the output data 14395.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Navigation Using Power Grid and Communication Network Implementation

In some implementations, the devices 300, 600A, 600B, 600C, 700, 2500, and/or 4200 can be implemented in a navigation system that utilizes a power grid and/or communication network.

In some embodiments, methods and configurations are disclosed for diamond nitrogen-vacancy (DNV) magnetic navigation via power transmission and distribution lines. The characteristic magnetic signature of human infrastructure provides context for navigation. For example, power lines, which have characteristic magnetic signatures, can serve as roads and highways for mobile platforms (e.g., UASs). Travel in relatively close proximity to power lines may allow stealthy transit, may provide the potential for powering the mobile platform itself, and may permit point-to-point navigation both over long distances and local routes.

Some implementations can include one or more magnetic sensors, a magnetic navigation database, and a feedback loop that controls the UAS position and orientation. DNV magnetic sensors and related systems and methods may provide high sensitivity magnetic field measurements. The DNV magnetic systems and methods can also be low cost, space, weight, and power (C-SWAP) and benefit from a fast settling time. The DNV magnetic field measurements may allow UAS systems to align themselves with the power lines, and to rapidly move along the power-line infrastructure routes. The subject solution can enable navigation in poor visibility conditions and/or in GPS-denied environments. Such magnetic navigation allows for UAS operation in close proximity to power lines facilitating stealthy transit. DNV-based magnetic systems and methods can be approximately 100 times smaller than conventional systems and can have a reaction time that that is approximately 100,000 times faster than other systems.

FIG. 145 illustrates an example of UAS 14502 navigation along power lines 14504, 14506, and 14508, the UAS 14502 can exploit the distinct magnetic signatures of power lines for navigation such that the power lines can serve as roads and highways for the UAS 14502 without the need for detailed a priori knowledge of the route magnetic characteristics. As shown in FIG. 146A, a ratio of signal strength of two magnetic sensors, A and B, attached to wings of the UAS 14502, varies as a function of distance, x, from a center line of an example three-line power transmission line structure 14504, 14506, and 14508. When the ratio is near 1, point 14622, the UAS 14502 is centered over the power transmission line structure, x=0 at point 14620.

A composite magnetic field (B-field) 14606 from all (3) wires is shown in FIG. 146B. This field is an illustration of the strength of the magnetic field measured by one or more magnetic sensors in the UAS. In this example, the peak of the field 14608 corresponds to the UAS 14502 being above the location of the middle line 14506. When the UAS 14502 has two magnetic sensors, the sensors would read strengths corresponding to points 14602 and 14604. A computing system on the UAS or remote from the UAS, can calculate combined readings. Not all of the depicted components may be required, however, and one or more implementations may include additional components not shown in the figure. Variations in the arrangement and type of the components may be made, and additional components, different components, or fewer components may be provided.

As an example of some implementations, a vehicle, such as a UAS, can include one or more navigation sensors, such as DNV sensors. The vehicle's mission could be to travel to an initial destination and possibly return to a final destination. Known navigation systems can be used to navigate the vehicle to an intermediate location. For example, a UAS can fly using GPS and/or human controlled navigation to the intermediate location. The UAS can then begin looking for the magnetic signature of a power source, such as power lines. To find a power line, the UAS can continually take measurements using the DNV sensors. The UAS can fly in a circle, straight line, curved pattern, etc. and monitor the recorded magnetic field. The magnetic field can be compared to known characteristics of power lines to identify if a power line is in the vicinity of the UAS. For example, the measured magnetic field can be compared with known magnetic field characteristics of power lines to identify the power line that is generating the measured magnetic field. In addition, information regarding the electrical infrastructure can be used in combination with the measured magnetic field to identify the current source. For example, a database regarding magnetic measurements from the area that were previously taken and recorded can be used to compare the current readings to help determine the UAS's location.

In some implementations, once the UAS identifies a power line the UAS positions itself at a known elevation and position relative to the power line. For example, as the UAS flies over a power line, the magnetic field will reach a maximum value and then begin to decrease as the UAS moves away from the power line. After one sweep of a known distance, the UAS can return to where the magnetic field was the strongest. Based upon known characteristics of power lines and the magnetic readings, the UAS can determine the type of power line.

Once the current source has been identified, the UAS can change its elevation until the magnetic field is a known value that corresponds with an elevation above the identified power line. For example, as shown in FIG. 150, a magnetic field strength can be used to determine an elevation above the current source. The UAS can also use the measured magnetic field to position itself offset from directly above the power line. For example, once the UAS is positioned above the current source, the UAS can move laterally to an offset position from the current source. For example, the UAS can move to be 10 kilometers to the left or right of the current source.

The UAS can be programmed, via a computer 14706 of FIG. 147, with a flight path. In some implementations, once the UAS establishes its position, the UAS can use a flight path to reach its destination. In some implementations, the magnetic field generated by the transmission line is perpendicular to the transmission line. In some implementations, the vehicle will fly perpendicular to the detected magnetic field. In one example, the UAS can follow the detected power line to its destination. In this example, the UAS will attempt to keep the detected magnetic field to be close to the original magnetic field value. To do this, the UAS can change elevation or move laterally to stay in its position relative to the power line. For example, a power line that is rising in elevation would cause the detected magnetic field to increase in strength as the distance between the UAS and power line decreased. The navigation system of the UAS can detect this increased magnetic strength and increase the elevation of the UAS. In addition, on board instruments can provide an indication of the elevation of the UAS. The navigation system can also move the UAS laterally to the keep the UAS in the proper position relative to the power lines.

The magnetic field can become weaker or stronger, as the UAS drifts from its position of the transmission line. As the change in the magnetic field is detected, the navigation system can make the appropriate correction. For a UAS that only has a single DNV sensor, when the magnetic field had decreased by more than a predetermined amount the navigation system can make corrections. For example, the UAS can have an error budget such that the UAS will attempt to correct its course if the measured error is greater than the error budget. If the magnetic field has decreased, the navigation system can instruct the UAS to move to the left. The navigation system can continually monitor the magnetic field to see if moving to the left corrected the error. If the magnetic field further decreased, the navigation system can instruct the UAS to fly to the right to its original position relative to the current source and then move further to the right. If the magnetic field decreased in strength, the navigation system can deduce that the UAS needs to decrease its altitude to increase the magnetic field. In this example, the UAS would originally be flying directly over the current source, but the distance between the current source and the UAS has increased due to the current source being at a lower elevation. Using this feedback loop of the magnetic field, the navigation system can keep the UAS centered or at an offset of the current source. The same analysis can be done when the magnetic field increases in strength. The navigation can maneuver until the measured magnetic field is within the proper range such that the UAS in within the flight path.

The UAS can also use the vector measurements from one or more DNV sensors to determine course corrections. The readings from the DNV sensor are vectors that indicate the direction of the sensed magnetic field. Once the UAS knows the location of the power line, as the magnitude of the sensed magnetic field decreases, the vector can provide an indication of the direction the UAS should move to correct its course. For example, the strength of the magnetic field can be reduced by a threshold amount from its ideal location. The magnetic vector of this field can be used to indicate the direction the UAS should correct to increase the strength of the magnetic field. In other words, the magnetic field indicates the direction of the field and the UAS can use this direction to determine the correct direction needed to increase the strength of the magnetic field, which could correct the UAS flight path to be back over the transmission wire.

Using multiple sensors on a single vehicle can reduce the amount of maneuvering that is needed or eliminate the maneuvering all together. Using the measured magnetic field from each of the multiple sensors, the navigation system can determine if the UAS needs to correct its course by moving left, right, up, or down. For example, if both DNV sensors are reading a stronger field, the navigation system can direct the UAS to increase its altitude. As another example if the left sensor is stronger than expected but the right sensor is weaker than expected, the navigation system can move the UAS to the left.

In addition to the current readings from the one or more sensors, a recent history of readings can also be used by the navigation system to identify how to correct the UAS course. For example, if the right sensor had a brief increase in strength and then a decrease, while the left sensor had a decrease, the navigation system can determine that the UAS has moved to far to the left of the flight path and could correct the position of the UAS accordingly.

As shown in FIG. 147, a high-level block diagram of an example UAS navigation system 14700 includes a number of DNV sensors 14702*a*, 14702*b*, and 14702*c*, a navigation database 14704, and a feedback loop that controls the UAS position and orientation. In other implementations, a vehicle can contain a navigation control that is used to navigate the vehicle. For example, the navigation control can change the vehicle's direction, elevation, speed, etc. The DNV magnetic sensors 14702*a*-14702*c* have high sensitivity to magnetic fields, low C-SWAP and a fast settling time. The DNV magnetic field measurements allow the UAS to align itself with the power lines, via its characteristic magnetic field signature, and to rapidly move along power-line routes. Not all of the depicted components may be required, however, and one or more implementations may include additional components not shown in the figure. Variations in the arrangement and type of the components may be made, and additional components, different components, or fewer components may be provided.

FIG. 148 illustrates an example of a power line infrastructure. It is known that widespread power line infrastructures, such as shown in FIG. 148, connect cities, critical power system elements, homes and businesses. The infrastructure may include overhead and buried power distribution lines, transmission lines, railway catenary and 3$^{rd}$ rail power lines and underwater cables. Each element has a unique electro-magnetic and spatial signature. It is understood that, unlike electric fields, the magnetic signature is minimally impacted by man-made structures and electrical shielding. It is understood that specific elements of the infrastructure will have distinct magnetic and spatial signatures and that discontinuities, cable droop, power consumption and other factors will create variations in magnetic signatures that can also be leveraged for navigation.

FIGS. 149A and 149B depict examples of magnetic field distributions for overhead power lines and underground power cables. Both above-ground and buried power cables emit magnetic fields, which unlike electrical fields are not easily blocked or shielded. Natural Earth and other man-made magnetic field sources can provide rough values of absolute location. However, the sensitive magnetic sensors described here can locate strong man-made magnetic sources, such as power lines, at substantial distances. As the UAS moves, the measurements can be used to reveal the spatial structure of the magnetic source (point source, line source, etc.) and thus identify the power line as such. In addition, once detected the UAS can guide itself to the power line via its magnetic strength. Once the power line is located its structure is determined, and the power line route is followed and its characteristics are compared to magnetic way points to determine absolute location. Fixed power lines can provide precision location reference as the location and relative position of poles and towers are known. A compact on-board database can provide reference signatures and location data for waypoints. Not all of the depicted components may be required, however, and one or more implementations may include additional components not shown in the figure. Variations in the arrangement and type of the components may be made, and additional components, different components, or fewer components may be provided.

FIG. 150 provides examples of magnetic field strength of power lines as a function of distance from the centerline showing that even low current distribution lines can be detected to distances in excess of 10 km. Here it is understood that DNV sensors provide 0.01 uT sensitivity (1e-10 T), and modeling results indicates that high current transmission line (e.g. with 1000 A-4000 A) can be detected over many tens of km. These strong magnetic sources allow the UAS to guide itself to the power lines where it can then align itself using localized relative field strength and the characteristic patterns of the power-line configuration as described below.

FIG. 151 illustrates an example of a UAS 15102 equipped with DNV sensors 15104 and 15106. FIG. 152 is a plot of a measured differential magnetic field sensed by the DNV sensors when in close proximity of the power lines. While power line detection can be performed with only a single DNV sensor precision alignment for complex wire configurations can be achieved using multiple arrayed sensors. For example, the differential signal can eliminate the influence of diurnal and seasonal variations in field strength. Not all of the depicted components may be required, however, and one or more implementations may include additional components not shown in the figure. Variations in the arrangement and type of the components may be made, and additional components, different components, or fewer components may be provided.

In various other implementations, a vehicle can also be used to inspect power transmission lines, power lines, and power utility equipment. For example, a vehicle can include one or more magnetic sensors, a magnetic waypoint database, and an interface to UAS flight control. The subject technology may leverage high sensitivity to magnetic fields of DNV magnetic sensors for magnetic field measurements. The DNV magnetic sensor can also be low cost, space, weight, and power (C-SWAP) and benefit from a fast settling time. The DNV magnetic field measurements allow UASs to align themselves with the power lines, and to rapidly move along power-line routes and navigate in poor visibility conditions and/or in GPS-denied environments. It is understood that DNV-based magnetic sensors are approximately 100 times smaller than conventional magnetic sensors and have a reaction time that that is approximately 100,000 times faster than sensors with similar sensitivity such as the EMDEX LLC Snap handheld magnetic field survey meter.

The fast settling time and low C-SWAP of the DNV sensor enables rapid measurement of detailed power line characteristics from low-C-SWAP UAS systems. In one or more implementations, power lines can be efficiently surveyed via small unmanned aerial vehicles (UAVs) on a routine basis over long distance, which can identify emerging problems and issues through automated field anomaly identification. In other implementations, a land based vehicle or submersible can be used to inspect power lines. Human inspectors are not required to perform the initial inspections. The inspections of the subject technology are quantitative, and thus are not subject to human interpretation as remote video solutions may be.

FIG. 153 illustrates an example of a measured magnetic field distribution for power lines 15304 and power lines with anomalies 15302 according to some implementations. The peak value of the measured magnetic field distribution, for the normal power lines, is in the vicinity of the centerline (e.g., d=0). The inspection method of the subject technology is a high-speed anomaly mapping technique that can be employed for single and multi-wire transmission systems. The subject solution can take advantage of existing software modeling tools for analyzing the inspection data. In one or more implementations, the data form a normal set of power lines may be used as a comparison reference for data resulting from inspection of other power lines (e.g., with anomalies or defects). Damage to wires and support structure alters the nominal magnetic field characteristics and is detected by comparison with nominal magnetic field characteristics of the normal set of power lines. It is understood that the magnetic field measurement is minimally impacted by other structures such as buildings, trees, and the like. Accordingly, the measured magnetic field can be compared to the data from the normal set of power lines and the measured magnetic field's magnitude and if different by a predetermined threshold the existence of the anomaly can be indicated. In addition, the vector reading between the difference data can also be compared and used to determine the existence of anomaly.

In some implementations, a vehicle may need to avoid objects that are in their navigation path. For example, a ground vehicle may need to maneuver around people or objects, or a flying vehicle may need to avoid a building or power line equipment. In these implementations, the vehicle can be equipment with sensors that are used to locate the obstacles that are to be avoided. Systems such as a camera system, focal point array, radar, acoustic sensors, etc., can be used to identify obstacles in the vehicles path. The navigation system can then identify a course correction to avoid the identified obstacles.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Defect Detection in Power Transmission Lines Implementation

In some implementations, the devices 300, 600A, 600B, 600C, 700, 2500, and/or 4200 can be implemented in a power line inspection implementation. Such an implementation may utilize the UAS and system described above in reference to FIGS. 145-153.

In some aspects of the present technology, methods and configurations are disclosed for diamond nitrogen-vacancy (DNV) application to detection of defects in power transmission or distribution lines. A characteristic magnetic signature of power infrastructure may be used for inspection of the infrastructure. For example, power lines without defects have characteristic magnetic signatures. The magnetic signature of a power line can be measured and compared to the expected magnetic signature. Measured differences can indicate that there is a defect in the transmission line.

In some implementations, a magnetic sensor may be used to measure the magnetic signature of a transmission line. For example, the magnetic sensor can be equipped on a manned vehicle. The manned vehicle can move along the transmission line to measure the magnetic signature of the transmission line. In other implementations, the magnetic sensor can be included in an unmanned vehicle. The transmission line can then also be used to navigate the unmanned vehicle, allowing for unmanned inspection of the transmission line. An unmanned vehicle can maneuver using power lines and can also inspect the same power lines for defects.

Because the magnetic fields are being measured, the measurements of these magnetic fields are not hindered by vegetation or poor visibility conditions that impact other inspection methods such as a visual, optical, and laser inspection methods. Accordingly, the detection of defects such as a downed power line can proceed in poor visibility weather or when vegetation has overgrown the power lines.

In some implementations, the subject technology can include one or more magnetic sensors, a magnetic navigation database, and a feedback loop that can control an unmanned vehicle's position and orientation. High sensitivity to magnetic fields of DNV magnetic sensors for magnetic field measurements can be utilized. The DNV magnetic sensor can also be low cost, space, weight, and power (C-SWAP) and benefit from a fast settling time. The DNV magnetic field measurements allow UAS systems to align themselves with the power lines, and to rapidly move along the power-line infrastructure routes. Navigation is enabled in poor visibility conditions and/or in GPS-denied environments. Further, the UAS operation may occur in close proximity to power lines facilitating stealthy transit. DNV-based magnetic sensors can be approximately 100 times smaller than conventional magnetic sensors and can have a reaction time that that is approximately 100,000 times faster than sensors with similar sensitivity.

FIGS. 154A and 154B are block diagrams of a system for detecting deformities in a transmission line in accordance with an illustrative embodiment. An illustrative system 15400 includes a transmission line 15405 and a magnetometer 15430. The magnetometer can be included within a vehicle.

Current flows through the transmission line 15405 as indicated by the arrow labeled 15420. FIGS. 154A and 154B illustrate the direction of a current through the transmission line 15405. As the current 15420 passes through the transmission line 15405 a magnetic field is generated 15425. The magnetometer 15430 can be passed along the length of the transmission line 15405. FIGS. 154A and 154B include an arrow parallel to the length of the transmission line 15405 indicating the relative path of the magnetometer 15430. In alternative embodiments, any suitable path may be used. For example, in some embodiments in which the transmission line 15405 is curved, the magnetometer 15430 can follow the curvature of the transmission line 15405. In addition, the magnetometer 15430 does not have to remain at a constant distance from the transmission line 15405.

The magnetometer 15430 can measure the magnitude and/or direction of the magnetic field along the length of the transmission line 15405. For example, the magnetometer 15430 measures the magnitude and the direction of the magnetic field at multiple sample points along the length of the transmission line 15405 at the same orientation to the transmission line 15405 at the sample points. For instance, the magnetometer 15430 can pass along the length of the transmission line 15405 while above the transmission line 15405.

Any suitable magnetometer can be used as the magnetometer 15430. In some embodiments, the magnetometer uses one or more diamonds with NV centers. The magnetometer 15430 can have a sensitivity suitable for detecting changes in the magnetic field around the transmission line 15405 caused by deformities. In some instances, a relatively insensitive magnetometer 15430 may be used. In such instances, the magnetic field surrounding the transmission line 15405 should be relatively strong. For example, the magnetometer 15430 can have a sensitivity of about $10^{-9}$ Tesla (one nano-Tesla). Transmission lines can carry a large current, which allows detection of the magnetic field generated from the transmission line over a large distances. For example, for high current transmission lines, the magnetometer 15430 can be 10 kilometers away from the transmission source. The magnetometer 15430 can have any suitable measurement rate. For example, the magnetometer 15430 can measure the magnitude and/or the direction of a magnetic field at a particular point in space ten thousand times per second. In another example, the magnetometer 15430 can take a measurement fifty thousand times per second.

In some embodiments in which the magnetometer 15430 measures the direction of the magnetic field, the orientation of the magnetometer 15430 to the transmission line 15405 can be maintained along the length of the transmission line 15405. As the magnetometer 15430 passes along the length of the transmission line 15405, the direction of the magnetic field can be monitored. If the direction of the magnetic field changes or is different than an expected value, it can be determined that a deformity exits in the transmission line 15405.

In some embodiments, the magnetometer 15430 can be maintained at the same orientation to the transmission line 15405 because even if the magnetic field around the transmission line 15405 is uniform along the length of the transmission line 15405, the direction of the magnetic field is different at different points around the transmission line 15405. For example, referring to the magnetic field direction 15425 of FIG. 154A, the direction of the magnetic field above the transmission line 15405 is pointing to the right of the transmission line 15405 (e.g., according to the "right-hand rule"). A vehicle carrying the magnetometer would know the magnetometer's relative position to the transmission line 15405. For example, an aerial vehicle would know it's relative position would be above or a known distance offset from the transmission line 15405, while a ground based vehicle would now it's relative position to be below or a known offset from the transmission line 15405. Based upon the relative position of the magnetometer to the transmission line 15405, the direction magnetic vector can be monitored for indicating defects in the transmission line 15405.

In some embodiments in which the magnetometer 15430 measures magnitude of the magnetic field and not the direction of the magnetic field, the magnetometer 15430 can be located at any suitable location around the transmission line 15405 along the length of the transmission line 15405 and the magnetometer 15430 may not be held at the same orientation along the length of the transmission line 15405. In such embodiments, the magnetometer 15430 may be maintained at the same distance from the transmission line 15405 along the length of the transmission line 15405 (e.g., assuming the same material such as air is between the magnetometer 15430 and the transmission line 15405 along the length of the transmission line 15405).

FIG. 154A illustrates the system in which the transmission line 15405 does not contain a deformity. FIG. 154B illustrates in which the transmission line 15405 includes a defect 15435. The defect 15435 can be a crack in the transmission line, a break in the transmission line, a deteriorating portion of the transmission line, etc. A defect 15435 is a condition of the transmission line that affects the current flow through a defect free transmission line. As shown in FIG. 154B, a portion of the current 15420 is reflected back from the defect 15435 as shown by the reflected current 15440. As in FIG. 154B, the magnetic field direction 15425 corresponds to the current 15420. The reflected current magnetic field direction 15445 corresponds to the reflected current 15440. The magnetic field direction 15425 is opposite the reflected current magnetic field direction 15445 because the current 15420 travels in the opposite direction from the reflected current 15440. Accordingly, the magnetic field measured in the transmission line would be based upon both the current 15420 and the reflected current 15440. This magnetic field is different in magnitude and possibly direction from the magnetic field 15425. The difference between the magnetic fields 15420 and 15440 can be calculated and used to indicate the presence of the defect 15435. In some instances, as the magnetometer 15430 travels closer to the defect 15435, the magnitude of the detected magnetic field reduces. In some embodiments, it can be determined that the defect 15435 exists when the measured magnetic field is below a threshold value. In some embodiments, the threshold value may be a percentage of the expected value, such as ±5%, ±10%, ±15%, ±50%, or any other suitable portion of the expected value. In alternative embodiments, any suitable threshold value may be used.

In some embodiments in which the defect 15435 is a full break that breaks conductivity between the portions of the transmission line 15405, the magnitude of the current 15420 may be equal to or substantially similar to reflected current 15440. Thus, the combined magnetic field around the transmission line 15405 will be zero or substantially zero. That is, the magnetic field generated by the current 15420 is canceled out by the equal but opposite magnetic field generated by the reflected current 15440. In such embodiments, the defect 15435 may be detected using the magnetometer 15430 by comparing the measured magnetic field, which is substantially zero, to an expected magnetic field, which is a non-zero amount.

In some embodiments in which the defect 15435 allows some of the current 15420 to pass through or around the defect 15435, the magnitude of the reflected current 15440 is less than the magnitude of the current 15420. Accordingly, the magnitude of the magnetic field generated by the reflected current 15440 is less than the magnitude of the magnetic field generated by the current 15420. Although the magnitudes of the current 15420 and the reflected current 15440 may not be equal, the current magnetic field direction 15425 and the reflected current magnetic field direction 15445 are still opposite. Thus, the net magnetic field will be a magnetic field in the current magnetic field direction 15425. The magnitude of the net magnetic field is the magnitude of the magnetic field generated by the current 15420 reduced based upon the magnitude of the magnetic field generated by the reflected current 15440. As mentioned above, the magnetic field measured by the magnetometer 15430 can be compared against a threshold. Depending upon the severity, size, and/or shape of the defect 15435, the net magnetic field sensed by the magnetometer 15430 may or may not be less than (or greater than) the threshold value. Thus, the threshold value can be adjusted to adjust the sensitivity of the system. That is, the more that the threshold value deviates from the expected value, the larger the deformity in the transmission line 15405 is to cause the magnitude of the sensed magnetic field to be less than the threshold value. Thus, the closer that the threshold value is to the expected value, the finer, smaller, less severe, etc. deformities are detected by the system.

As mentioned above, the direction of the magnetic field around the transmission line 15405 can be used to sense a deformity in the transmission line 15405. FIG. 155 illustrates current paths through a transmission line with a deformity 15535 in accordance with an illustrative embodiment. FIG. 155 is meant to be illustrative and explanatory only and not meant to be limiting with respect to the functioning of the system.

A current can be passed through the transmission line 15505, as discussed above. The current paths 15520 illustrate the direction of the current. As shown in FIG. 155, the transmission line 15505 includes a deformity 15535. The deformity 15535 can be any suitable deformity, such as a crack, a dent, an impurity, etc. The current passing through the transmission line 15505 spreads uniformly around the transmission line 15505 in portions that do not include the deformity 15535. In some instances, the current may be more concentrated at the surface of the transmission line 15505 than at the center of the transmission line 15505.

In some embodiments, the deformity 15535 is a portion of the transmission line 15505 that does not allow or resists the flow of electrical current. Thus, the current passing through the transmission line 15505 flows around the deformity 15535. As shown in FIG. 154A, the current magnetic field direction 15425 is perpendicular to the direction of the current 15420. Thus, as in FIG. 154A, when the transmission line 15405 does not include a deformity, the direction of the magnetic field around the transmission line 15405 is perpendicular to the length of the transmission line 15405 all along the length of the transmission line 15405.

As shown in FIG. 155, when the transmission line 15505 includes a deformity 15535 around which the current flows, the direction of the current changes, as shown by the current paths 15520. Thus, even though the transmission line 15505 is straight, the current flowing around the deformity 15535 is not parallel to the length of the transmission line 15505. Accordingly, the magnetic field generated by the current paths corresponding to the curved current paths 15520 is not perpendicular to the length of the transmission line 15505. Thus, as a magnetometer such as the magnetometer 15430 passes along the length of the transmission line 15505, a change in direction of the magnetic field around the transmission line 15505 can indicate that the deformity 15535 exits. As the magnetometer 15430 approaches the deformity 15535, the direction of the magnetic field around the transmission line 15505 changes from being perpendicular to the length of the transmission line 15505. As the magnetometer 15430 passes along the deformity 15535, the change in direction of the magnetic field increases and then decreases as the magnetometer 15430 moves away from the deformity 15535. The change in the direction of the magnetic field can indicate the location of the deformity 15535. In some instances, the transmission line 15505 may have a deformity that reflects a portion of the current, as illustrated in FIG. 154B, and that deflects the flow of the current, as illustrated in FIG. 155.

The size, shape, type, etc. of the deformity 15535 determines the spatial direction of the magnetic field surrounding the deformity 15535. In some embodiments, multiple samples of the magnetic field around the deformity 15535 can be taken to create a map of the magnetic field. In an illustrative embodiment, each of the samples includes a magnitude and direction of the magnetic field. Based on the spatial shape of the magnetic field surrounding the deformity 15535, one or more characteristics of the deformity 15535 can be determined, such as the size, shape, type, etc. of the deformity 15535. For instance, depending upon the map of the magnetic field, it can be determined whether the deformity 15535 is a dent, a crack, an impurity in the transmission line, etc. In some embodiments, the map of the magnetic field surrounding the deformity 15535 can be compared to a database of known deformities. In an illustrative embodiment, it can be determined that the deformity 15535 is similar to or the same as the closest matching deformity from the database. In an alternative embodiment, it can be determined that the deformity 15535 is similar to or the same as a deformity from the database that has a similarity score that is above a threshold score. The similarity score can be any suitable score that measures the similarity between the measured magnetic field and one or more known magnetic fields of the database.

In various implementations, a vehicle that includes one or magnetometers can navigate via the power lines that are being inspected. For example, the vehicle can navigate to an known position, e.g., a starting position, identify the presence of a power line based upon the sensed magnetic vector. Then the vehicle can determine the type of power line and further determine that the type of power line is the type that is to be inspected. The vehicle can then autonomously or semi-autonomously navigate via the power lines as described in detail above, while inspecting the power lines at the same time.

In various implementations, a vehicle may need to avoid objects that are in their navigation path. For example, a ground vehicle may need to maneuver around people or objects, or a flying vehicle may need to avoid a building or power line equipment. In these implementations, the vehicle can be equipment with sensors that are used to locate the obstacles that are to be avoided. Systems such as a camera system, focal point array, radar, acoustic sensors, etc., can be used to identify obstacles in the vehicles path. The navigation system can then identify a course correction to avoid the identified obstacles.

Power transmission lines can be stretched between two transmission towers. In these instances, the power transmission lines can sag between the two transmission towers. The power transmission line sag depends on the weight of the wire, tower spacing and wire tension, which varies with ambient temperature and electrical load. Excessive sagging can cause shorting when the transmission line comes into contact with brush or other surface structures. This can caused power transmission lines to fail.

FIG. 156 illustrates power transmission line sag between transmission towers in accordance with an illustrative embodiment. A transmission line 15610 is shown with "normal" sag 15622. Here sag is determined based upon how far below the transmission line is from the tower height. The transmission line 15610 is stretched between a first tower 15602 and a second tower 15604. A second transmission line 15620 is shown with excessive sag. When this occurs the transmission line 15620 can come into contact with vegetation 15630 or other surface structures that can cause on or failure to the line.

A vector measurement made with a magnetometer mounted on a UAV can measure the wire sag as the UAV flies along the power lines. FIG. 157 depicts the instantaneous measurement of the magnetic field at point X' as the UAV flies at a fixed height above the towers. A larger horizontal (x) component of the magnetic field indicates more sag. FIG. 158 depicts the variation in magnetic field components for the wire with nominal sag, and for the wire with excessive sag as the UAV transits between towers 1 and 2. The X and Z components for a transmission line under normal/nominal sag are shown (15808 and 15802 respectively). In addition, the X component 15806 and the Z component 15804 of a line experiencing excessive sag is also shown.

The cable sag may be measured by flying the UAV along the cable from tower to tower. FIG. 158 shows the modulation in vector components of the magnetic field for different sag values. A look-up table can be constructed to retrieve the sag from these measurements for wires between each pair of towers along the UAV flight route. Alternatively a database of prior vector measurements can be compared with measurements. In general the flatter the curves the less sag. The exact value of the sag depends on the distance between towers and, which is measured by the UAV, and the angle of the vector at the tower. Combined with weather information and potentially historical data or transmission line sag models, the vector measurements can be used to determine if the power line is experiencing greater or lesser sag as expected. When this occurs, an indication that the power line is experiencing a sag anomaly can be indicated and/or reported.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

In-Situ Power Charging Implementation

In some implementations, the devices 300, 600A, 600B, 600C, 700, 2500, and/or 4200 can be implemented in an in-situ power charging implementation.

FIG. 159 is a block diagram of a vehicular system in accordance with an illustrative embodiment. An illustrative vehicular system 15900 includes a propulsion device 15905, a power source 15910, a charging device 15915, a computing device 15920, a magnetometer 15925, and a navigation system 15930. In alternative embodiments, additional, fewer, and/or different elements may be used.

In an illustrative embodiment, the vehicular system 15900 is an unmanned aircraft system. For example, the vehicular system 15900 can be an aerial drone such as a fixed wing vehicle or a rotary vehicle. In some embodiments, the vehicular system 15900 is a surface vehicle such as an unmanned boat or land vehicle. In some embodiments, the vehicular system 15900 can be a robot. The vehicular system 15900 can be autonomous or remotely controlled. In yet other embodiments, the vehicular system 15900 can be a manned vehicle. In alternative embodiments, the vehicular system 15900 can be any suitable vehicle.

The vehicular system 15900 includes the propulsion device 15905. The propulsion device 15905 can be any suitable device or system configured to propel or otherwise move the vehicular system 15900. For example, the propulsion device 15905 can include one or more propellers, an internal combustion engine, a jet engine, wings, wheels, motors, pumps, etc.

The vehicular system 15900 includes the power source 15910. The power source 15910 can be configured to provide power to one or more of the components of the vehicular system 15900. For example, the power source power source 15910 can include one or more batteries that provide power to the propulsion device 15905, the computing device 15920, the magnetometer 15925, etc.

The vehicular system 15900 includes the charging device 15915. The charging device 15915 can be any suitable device configured to provide power to the power source 15910. For example, the charging device 15915 is configured to charge batteries of the power source 15910. In an illustrative embodiment, the charging device 15915 includes one or more coils of conductive material (e.g., coils of wire). When an electromagnetic field is applied to the coils, a current can be induced in the coils. The induced current can be provided to the power source 15910 to, for example, charge batteries. In alternative embodiments, any suitable charging device 15915 may be used. In alternative embodiments, the induced current can be used for any suitable purpose, such as providing power to one or more of the components of the vehicular system 15900.

The vehicular system 15900 includes the computing device 15920. The computing device 15920 can be any suitable computing device. For example, the computing device 15920 can include a processor, memory, communication links, etc. The computing device 15920 can be in communication with one or more of the other components of the vehicular system 15900. For example, the computing device 15920 can communicate with the propulsion device 15905 to control the direction and speed of the vehicular system 15900. In another example, the computing device 15920 can communicate with the magnetometer 15925 and receive measurements taken by the magnetometer 15925. In yet another example, the computing device 15920 can communicate with the navigation system 15930 to determine the location of the vehicular system 15900.

The vehicular system 15900 includes a magnetometer 15925. The magnetometer 15925 can be any suitable device that measures a magnetic field. In an illustrative embodiment, the magnetometer 15925 has a sensitivity of one to ten pico Tesla. In alternative embodiments, the sensitivity can be less than one pico Tesla or greater than ten pico Tesla. In an illustrative embodiment, with one hundred amps traveling through the line, the magnetometer 15925 has an angular sensitivity of between nine pico Tesla per degree to thirty pico Tesla per degree at five meters from the line, between ten pico Tesla per degree and fifteen pico Tesla per degree at ten meters from the power line, and between three pico Tesla per degree and twelve pico Tesla per degree at fifteen meters from the power line. In another embodiment, with one thousand amps traveling through the line, the magneto meter 15925 has an angular sensitivity of between ninety pico Tesla per degree to three hundred pico Tesla per degree at five meters from the line, between fifty pico Tesla per degree and one hundred and fifty pico Tesla per degree at ten meters from the power line, and between forty pico Tesla per degree and one hundred and ten pico Tesla per degree at fifteen meters from the power line. In alternative embodiments, the magnetometer 15925 can have any suitable angular sensitivity.

In some embodiments, the magnetometer 15925 can be relatively small and/or lightweight. In some embodiments, the magnetometer 15925 consumes relatively little power. Such characteristics are suitable for various vehicular system 15900. For example, by consuming relatively little power, the magnetometer 15925 allows the power source 15910 to be used for other components, such as the propulsion device 15905. Additionally, by being lightweight, less energy is required from the power source 15910 to move the magnetometer 15925. In an illustrative embodiment, the magnetometer 15925 can weigh about 0.1 kilograms. In alternative embodiments, the magnetometer 15925 weighs less than 0.1 kilograms or greater than 0.1 kilograms. In some embodiments, the magnetometer 15925 consumes less than two Watts of power. In alternative embodiments, the magnetometer 15925 consumes greater than two Watts of power.

As discussed in greater detail below, in an illustrative embodiment, the magnetometer 15925 is configured to measure the direction of a magnetic field. The magnetic field at any given point can be characterized by using a vector. The vector includes a magnitude and a direction. In an illustrative embodiment, the magnetometer 15925 is configured to measure the magnitude and the direction of a magnetic field at the location of the magnetometer 15925. In alternative embodiments, the magnetometer 15925 is configured to measure the magnitude or the direction of the magnetic field.

In an illustrative embodiment, the magnetometer 15925 uses a diamond with NV centers to measure the magnetic field. A diamond-based magnetometer 15925 may be suited for use in the vehicular system 15900. For example, a diamond-based magnetometer 15925 can have a sensitivity of one pico Tesla or greater, can weigh about 0.1 kilograms, and can consume about two Watts of power. Additionally, a diamond-based magnetometer 15925 can measure the magnitude and direction of a magnetic field. Any suitable diamond-based magnetometer 15925 may be used. In alternative embodiments, the magnetometer 15925 may not be diamond based. In such embodiments, any suitable magnetometer 15925 may be used.

The vehicular system 15900 includes a navigation system 15930. The navigation system 15930 can be any suitable system or device that can provide navigation features to the vehicular system 15900. For example, the navigation system 15930 can include maps, global positioning system (GPS) sensors, or communication systems.

In an illustrative embodiment, the navigation system 15930 includes a magnetic waypoint database. The magnetic waypoint database can include a map of an area or space that includes known magnetic flux vectors. For example, the magnetic waypoint database can include previously determined magnetic flux vectors in a one cubic mile volume of the atmosphere. In such an example, the density of the magnetic waypoint database can be one vector per cubic meter. In alternative embodiments, the magnetic waypoint database can include previously determined flux vectors for a volume larger than one cubic mile. For example, the magnetic waypoint database can include a map of vectors for a city, town, state, province, country, etc. In an illustrative embodiment, the magnetic waypoint database can be stored on a remote memory device. Relevant information, such as nearby vectors, can be transmitted to the navigation system 15930. Any suitable vector density can be used. For example, the vector density can be less than or greater than one vector per cubic meter. The magnetic waypoint database can be used for navigation and/or identifying power sources that can be used to charge batteries of the vehicle.

Although not illustrated in FIG. 159, the vehicular system 15900 may include any other suitable components. For example, the vehicular system 15900 can include surveillance cameras, communication systems for transmitting and/or receiving information, weapons, or sensors. In an illustrative embodiment, the vehicular system 15900 includes sensors that assist the vehicular system 15900 in navigating around objects.

In an illustrative embodiment, the vehicular system 15900 is an autonomous vehicle. In alternative embodiments, the vehicular system 15900 can be controlled remotely. For example, the vehicular system 15900 can each communicate with a control unit. The vehicular system 15900 and the control unit can include transceivers configured to communicate with one another. Any suitable transceivers and communication protocols can be used. In such an embodiment, the vehicular system 15900 can transmit to the control unit any suitable information. For example, the vehicular system 15900 can transmit to the control unit measurements of the magnetic field sensed by the magnetometer 15925. In such an embodiment, the control unit can display to a user the measurement, which can be a vector. The user can use the measurement to navigate the vehicular system 15900 to a position in which the charging device 15915 can charge the power source 15910.

FIG. 160 is a flow chart of a method for charging a power source in accordance with an illustrative embodiment. In alternative embodiments, additional, fewer, and/or different operations may be performed. Also, the use of a flow chart and/or arrows is not meant to be limiting with respect to the order or flow of operations. For example, in some embodiments, two or more of the operations may be performed simultaneously.

In an operation 16005, power lines are located. Power lines can be located using any suitable method. In an illustrative embodiment, a magnetometer can be used to detect a magnetic field of the power lines. The measured magnetic field can be used to identify the direction of the power lines. In alternative embodiments, a map of known power lines can be used to locate the power lines. For example, a magnetic waypoint database can be used to locate power lines. In yet other embodiments, sensors other than a magnetometer can be used (e.g., in conjunction with the magnetometer) to locate the power lines. For example, cameras, ultrasonic sensors, lasers, etc. can be used to locate the power lines.

The power lines can be any suitable conductor of electricity. In an illustrative embodiment, the power lines can include utility power lines that are designed for transporting electricity. The utility power lines can include power transmission lines. FIG. 148 is an illustration of a power line transmission infrastructure in accordance with an illustrative embodiment. Widespread power line infrastructures, such as shown in FIG. 148, connect cities, critical power system elements, homes, and businesses. The infrastructure may include overhead and buried power distribution lines, transmission lines, third rail power lines, and underwater cables. In various embodiments described herein, one or more of the various power lines can be used to charge the power systems of the vehicular system 15900. In alternative embodiments, any suitable source of electromagnetic fields can be used to power the systems of the vehicular system 15900. For example, transmission towers such as cellular phone transmission towers can be used to power the systems of the vehicular system 15900.

In some embodiments, a conductor with a direct current (DC) may be used. By moving a magnetic field with respect to a coil, a current can be induced in the coil. If the magnetic field does not move with respect to the coil, a current is not induced. Thus, if a conductor has an AC current passing through the conductor, the magnetic field around the conductor is time-varying. In such an example, the coil can be stationary with respect to the coil and have a current induced in the conductor. However, if a DC current is passed through the conductor, a static magnetic field is generated about the conductor. Thus, if a coil does not move with respect to the conductor, a current is not induced in the coil. In such instances, if the coil moves with respect to the conductor, a current will be induced in the coil. Thus, in embodiments in which the power lines have DC power, the vehicle and/or the coil can move with respect to the power line. For example, the vehicle can travel along the length of the power line. In another example, the vehicle can oscillate positions, thereby moving the coil within the magnetic field.

In embodiments in which the vehicular system 15900 is an aerial vehicle, the power lines can be overhead lines. In such embodiments, the vehicular system 15900 can fly close enough to the overhead lines to induce sufficient current in the charging device to charge the power systems. In some embodiments, the power lines can be underground power lines. In such embodiments, the aerial vehicular system 15900 can fly close to the ground. In such embodiments, the electromagnetic field can be sufficiently strong to pass through the earth and provide sufficient power to the vehicular system 15900. In an alternative embodiment, the vehicular system 15900 can land above or next to the buried power lines to charge the power source. In embodiments in which the vehicular system 15900 is a land-based vehicle, the operation 16005 can include locating a buried power line.

In an operation 16010, the vehicular system 15900 can travel to the power line. For example, after identifying and/or locating the power line, the vehicular system 15900 can use suitable navigation systems and propulsion devices to cause the vehicular system 15900 to move sufficiently close to the power line.

In an operation 16015, the charging system is oriented with the power line. In an illustrative embodiment, the charging system includes one or more coils. FIG. 151 is an illustration of a vehicle in accordance with an illustrative embodiment. An illustrative unmanned aircraft system (UAS) includes a fuselage 15105 and wings 15110. In alternative embodiments, additional, fewer, and/or different elements may be used. In an illustrative embodiment, the fuselage 15105 includes a battery system. The fuselage 15105 may house other components such as a computing system, electronics, sensors, cargo, etc.

In an illustrative embodiment, one or more coils of the charging system can be located in the wings 15110. For example, each of the wings 15110 can include a coil. The coil can be located in the wings 15110 in any suitable manner. For example, the coil is located within a void within the wings 15110. In another example, the coil is bonded, fused, laminated, or otherwise attached to the wings 15110. In such an example, the coil can be formed within the material that makes up the wings 15110 or the coil can be attached to an outside or inside surface of the wings 15110. In alternative embodiments, the one or more coils can be located at any suitable location. The UAS is meant to be illustrative only. In alternative embodiments, any suitable vehicle can be used and may not be a fixed wing aircraft.

Any suitable coil of a conductor can be used to induce a current that can be used to charge batteries. In an illustrative embodiment, the coil is an inductive device. For example, the coil can include a conductor coiled about a central axis. In alternative embodiments, any suitable coil can be used. For example, the coil can be wound in a spherical shape. In alternative embodiments, the charging device can include dipoles, patch antennas, etc. In an illustrative embodiment, the operation 16015 includes orienting the coil to maximize the current induced in the coil. For example, the operation 16015 can include orienting the coil such that the direction of the magnetic field at the coil is parallel to the central axis of the coil. In such an example, a magnetometer can be used to determine the direction of the magnetic field at the coil. For example, each of the wings 15110 of the UAS include a coil and a magnetometer. In an embodiment in which the vehicle is a rotary-type vehicle (e.g., a helicopter style or quad-copter style vehicle), the vehicle can orient itself in a stationary position around the power lines to orient the direction of the magnetic field with the central axis of the coil.

In an illustrative embodiment, the operation 16015 includes navigating the vehicle to get the coil as close to the power line as possible. FIG. 161 is a graph of the strength of a magnetic field versus distance from the conductor in accordance with an illustrative embodiment. Line 16105 shows the strength of the magnetic field of a 1000 Ampere conductor, and line 16110 shows the strength of the magnetic field of a 100 Ampere conductor. As shown in FIG. 161, the magnitude of the magnetic field decreases at a rate proportional to the inverse of the distance from the source of the magnetic field. Thus, $$B \propto \frac{1}{r}$$

where B is the magnitude of the magnetic field, and r is the distance from magnetic field source. For example, r is the distance from the power line. Thus, the closer the coil is to the power line, the more power can be induced in the coil to charge the batteries.

However, in some embodiments, practical limitations may dictate that a minimum distance be maintained between the vehicle and the power line. For example, damage can occur to the vehicle if the vehicle strikes or grazes the power line. In such an example, the vehicle may lose control or crash. In another example, the power line has high voltage and/or high current. For example, the voltage between power lines can be between five thousand to seven thousand volts and the power lines can carry about one hundred Amperes (Amps). In alternative embodiments, the power lines can have voltages above seven thousand volts or less than five thousand volts. Similarly, the power lines can have less than one hundred Amps or greater than one hundred Amps. In such an example, if the vehicle is close enough to the power lines, a static discharge may occur. Such a discharge may be a plasma discharge that can damage the vehicle.

In an illustrative embodiment, the vehicle is about one meter away from the power line. For example, one or more of the coils can be located one meter away from the power line. In alternative embodiments, the vehicle can be between one and ten meters away from the power line. In yet other embodiments, the vehicle can be between ten and twenty meters away from the power lines. In alternative embodiments, the vehicle is closer than one meter or further away than twenty meters from the power lines.

In an operation 16020, the power source can be charged. For example, the power source may include one or more batteries. Current induced in the coil can be used to charge the batteries. In an illustrative embodiment, the power in the power lines can be alternating current (AC) power. In such an embodiment, the magnetic field produced by the AC power alternates, and the current induced in the coil alternates. The vehicle can include a rectifier that converts the induced current to a direct current to charge one or more of the batteries.

In an operation 16025, the orientation of the charging system with the power line can be maintained. For example, the vehicle can maximize the amount of current induced in the coil while maintaining a suitable (e.g., safe) distance from the power line.

In embodiments in which the vehicle can charge while in a stationary position (e.g., a land vehicle or a rotary vehicle), the vehicle can maintain a consistent position near the power line. In embodiments in which the vehicle moves along the power line (e.g., when the vehicle is charging while traveling or if the vehicle is a fixed wing vehicle), the vehicle can follow the path of the power lines. For example, overhead power lines may sag between support poles. In such an example, the vehicle can follow the sagging (e.g., the catenary shape) of the power lines as the vehicle travels along the length of the power lines. For example, the vehicle can maintain a constant distance from the power line.

The vehicle can maintain a distance from the power lines in any suitable manner. For example, the UAS can include a magnetometer in each of the wings 15110. The UAS can triangulate the position of the power lines using the magnetometers. For example, the direction of the magnetic field around the power lines is perpendicular to the length of the power lines (e.g., perpendicular to the direction of current travel). Thus, based on the measured direction of the magnetic field, the direction of the power line can be determined. To determine the distance from the power line, the magnitude of the magnetic field measured at each of the magnetometers can be used to triangulate the distance to the power line. In alternative embodiments, any other suitable device may be used to determine the distance from the vehicle to the power lines. For example, the vehicle can use lasers, cameras, ultrasonic sensors, focal plane arrays, or infrared sensors to detect the location of the power lines.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Position Encoder/Sensor Implementation

In some implementations, the devices 300, 600A, 600B, 600C, 700, 2500, and/or 4200 can be implemented in a position encoder or sensor.

A position sensor system may include a position sensor that includes a magnetic field sensor. The magnetic field sensor may be a DNV magnetic field sensor capable of resolving a magnetic field vector of the type described above. The high sensitivity of the DNV magnetic field sensor combined with an appropriate position encoder component is capable of resolving both a discrete position and a proportionally determined position between discrete positions. The position sensor system has a small size, light weight, and low power requirement.

As shown in FIG. 162, the position sensor 16220 may be part of a system that also includes an actuator 16210 and a sensor component 16230. The actuator 16210 may be connected to the position sensor 16220 by any appropriate attachment means 16214, such as a rod or shaft. The actuator may be any actuator that produces the desired motion, such as an electro-mechanical actuator. The position sensor 16220 may be connected to the sensor component 16230 by any appropriate attachment means 16224, such as a rod or shaft. A controller 16240 may be included in the system and connected to the position sensor 16220 and optionally the actuator 16210 by electronic interconnects 16222 and 16212, respectively. The controller may be configured to receive a measured position from the position sensor 16220 and activate or deactivate the actuator to position the sensor 16230 in a desired position. According to some embodiments, the controller may be on the same substrate as the magnetic field sensor of the position sensor. The controller may include a processor and a memory.

The position sensor may be a rotary position sensor. FIG. 163 depicts a rotary position sensor system that includes a rotary actuator 16380 that is configured to produce a rotation of a sensor 16390. A rotary position encoder 16310 is connected to the rotary actuator 16380 by a connection means 16382, such as a rod or shaft. A connection means 16392 is also provided between the rotary position encoder 16310 and the sensor 16390. A position sensor head 16320 is located to measure the magnetic field of magnetic elements located on the rotary position encoder 16310. The position sensor head 16320 is aligned with magnetic elements located on the rotary position encoder 16310 at a distance, r, from the center of the rotary position encoder. A surface of the rotary position encoder 16310 that includes magnetic elements is shown in FIG. 164. The center 16340 of the rotary position encoder 16310 may be configured to attach to a connection means 16392, 16394 that connects the rotary position encoder 16310 to the actuator 16308 or the sensor 16390. Magnetic elements, such as uniform coarse magnetic elements 16334 and tapered fine magnetic elements 16332, may be disposed on the surface of the rotary position encoder 16310 along an arc 16336 at a distance, r, from the center of the rotary position encoder. The magnetic elements on the rotary position encoder 16310 may be located on only a portion of the arc, as shown in FIG. 164, or around an entirety of the arc forming a circle of magnetic elements.

The spacing between the magnetic elements on the rotary position encoder 16310 correlates to a discrete angular rotation, θ. The distance between magnetic elements associated with the discrete angular rotation, θ, increases as r increases. The sensitivity of the magnetic field sensors employed in the position sensor allows r to be reduced while maintaining a high degree of precision for the angular position of the rotary position encoder. The rotary position encoder may have an r on the order of mm, such as an r of 1 mm to about 30 mm, or about 5 mm to about 20 mm. The rotary position encoder allows for the measurement of a rotary position with a precision of 0.5 micro-radians.

The position sensor may be a linear position sensor. As shown in FIG. 165, the linear position sensor system includes a linear actuator 16580 that is configured to produce linear motion of the linear position encoder 16510 and sensor 16590. The linear position encoder 16510 may be connected to the linear actuator by a connecting means 16582, such as a rod or shaft. The linear position encoder 16510 may be connected to the sensor 16590 by a connecting means 16592, such as a rod or shaft. A position sensor head 16520 is located to measure the magnetic field produced by magnetic elements disposed on the linear position encoder. In some cases, a mechanical linkage, such as a lever arm, may be utilized to multiply the change in position of the linear position encoder for an associated movement of the sensor. The linear position sensor may have a sensitivity that allows a change in position on the order of hundreds of nanometers to be resolved, such as a position change of 500 nm.

The magnetic elements may be arranged on the linear or rotary position encoder in any appropriate configuration. As shown in FIG. 166, the magnetic elements may include both uniform coarse magnetic elements 16634 and tapered fine magnetic elements 16632. The uniform coarse magnetic elements 16634 may have an influence on the local magnetic field that is at least two orders of magnitude greater than the maximum influence of the tapered fine magnetic elements 16634. The coarse magnetic elements 16634 may be formed on the position encoder by any suitable process. According to some embodiments, a polymer loaded with magnetic material may be utilized to form the uniform coarse magnetic elements. The amount of magnetic material that may be included in the coarse magnetic elements is limited by potential interference with other elements in the system.

The tapered fine magnetic elements may be formed by any suitable process on the position encoder. According to some embodiments, a polymer loaded with magnetic material may be utilized to form the tapered fine magnetic elements. The loading of the magnetic material in the polymer may be increased to produce a magnetic field gradient from a first end of the tapered fine magnetic element to a second end of the tapered fine magnetic element. Alternatively, the geometric size of the tapered fine magnetic element may be increased to create the desired magnetic field gradient. A magnetic field gradient of the tapered fine magnetic element may be about 10 nT/mm. The tapered fine magnetic elements 16632 as shown in FIG. 166 allow positions between the coarse magnetic elements 16634 to be accurately resolved. The position encoder on which the magnetic elements are disposed may be formed from any appropriate material, such as a ceramic, glass, polymer, or non-magnetic metal material.

The size of the magnetic elements is limited by manufacturing capabilities. The magnetic elements on the position encoder may have geometric features on the order of nanometers, such as about 5 nm.

FIG. 167 depicts an alternate magnetic element arrangement that may be employed when the additional precision provided by the tapered fine magnetic elements is not required. The magnetic element arrangement of FIG. 167 includes only coarse magnetic elements 16634. FIG. 168 depicts a magnetic element arrangement that does not include coarse magnetic elements. A similar effect to the coarse magnetic elements 16634 may be achieved by utilizing the transitions between the maximum of the tapered fine magnetic elements 16632 and the minimum of the adjacent tapered fine magnetic elements as indicators in much the same way that the coarse magnetic elements shown in FIGS. 166 and 167 indicate a discrete change in position. While FIGS. 166-168 depict the magnetic element arrangements in linear form, similar magnetic element arrangements may be applied to a rotary position encoder.

According to other embodiments, a single tapered magnetic element may be employed. Such an arrangement may be especially suitable for an application where only a small position range is required, as for a larger position range the increase in magnetic field with the increasing gradient of the magnetic element may interfere with other components of the position sensor system. The use of a single tapered magnetic element may allow a position to be determined without first initializing the position sensor by setting the position encoder to a known position. The ability of the magnetic field sensor to resolve a magnetic field vector may allow a single magnetic field sensor to be employed in the position sensor head when a single tapered fine magnetic element is utilized on the position encoder.

The position sensor head 16620 may include a plurality of magnetic field sensors, as shown in FIG. 169. For magnetic element arrangements including more than one element, at least two magnetic field sensors 16624 and 16622 may be utilized in the position head sensor. The magnetic field sensors may be separated by a distance, a. The distance, a, between the magnetic sensors 16622 and 16624 may be less than the distance, d, between the coarse magnetic elements 16634. According to some embodiments, the relationship between the spacing of the magnetic field sensors and the spacing of the coarse magnetic elements may be $0.1d<a<d$. As shown in FIG. 169, the position sensor head 16620 may include a third and fourth magnetic field sensor. The magnetic field sensors in the position sensor head may be DNV magnetic field sensors of the type described above.

The magnetic field sensor arrangement in the position sensor head 16620 depicted in FIG. 169 allows the direction of movement of the position encoder to be determined. As shown in FIG. 170, the spacing between the magnetic field sensors 16624 and 16622 produces a delayed response to the magnetic field elements as the position encoder moves. The difference in measured magnetic field for each magnetic field sensor allows a direction of the movement of the position encoder to be determined, as for any given position of the position encoder a different output magnetic field will be measured by each magnetic field sensor. The increasing portion of the plots in FIG. 170 is produced by the tapered fine magnetic element and the square peak is produced by the coarse magnetic element. These measured magnetic fields may be utilized to determine the change in position of the position encoder, and thereby the sensor connected to the position encoder.

The controller of the position sensor system may be programmed to determine the position of position encoder, and thereby the sensor connected thereto, utilizing the output from the magnetic field sensors. As shown in FIG. 171, the controller may include a line transection logic 17102 function that determines when the coarse magnetic elements have passed the magnetic sensor. The output from two magnetic field sensors B1 and B2 may be utilized to determine the direction of the position change based on the order in which a coarse magnetic element is encountered by the magnetic field sensors, and to count the number of coarse magnetic elements measured by the magnetic field sensors. Each coarse magnetic element adds a known amount of position change due to the known spacing between the coarse magnetic elements on the position encoder. An element gradient logic processing function 17100 is programmed in the controller to determine the position between coarse magnetic elements based on the magnetic field signal produced by the tapered fine magnetic elements located between the coarse magnetic elements. As shown in FIG. 171, the element gradient logic processing 17100 is utilized only when the line transection logic 17102 determines that the position is between coarse magnetic elements 17104, or lines. In the case that the position is determined to be between coarse magnetic elements, a position correction, $\delta\theta$, is calculated based on the magnetic field associated with the tapered fine magnetic elements. The position correction is then added to the sum of the position change calculated from the number of coarse magnetic elements that were counted. A final position may be calculated by adding the calculated position change to a starting position of the position encoder. The logic processing in the controller may be conducted by analog or digital circuits.

The position sensor may be employed in a method for controlling the position of the position encoder. The method includes determining a movement direction required to reach a desired position, and activating the actuator to produce the desired movement. The position sensor is employed to monitor the change in position of the position encoder, and determine when to deactivate the actuator and stop the change in position. The change in position may be stopped once the desired position is reached. The method may additionally include initializing the position sensor system by moving the position encoder to a known starting point. The end position of the position encoder may be determined after the deactivation of the actuator, and the end position may be stored in a memory of the position sensor controller as a starting position for future movement.

The ability of the position sensor system to resolve positions between the coarse magnetic elements of the position encoder provides many practical benefits. For example, the position of the position encoder, and associated sensor, may be known with more precision while reducing the size, weight and power requirements of the position sensor system. Additionally, position control systems that offer resolution of discrete position movements can result in dithering when a desired position is between two discrete position values. Dithering can result in unwanted vibration and overheating of the actuator as the control system repeatedly tries to reach the desired position.

The characteristics of the position sensor system described above make it especially suitable for applications where precision, size, weight, and power requirements are important considerations. The position sensor system is well suited for astronautic applications, such as on space vehicles. The position sensor system is also applicable to robot arms, 3-d mills, machine tools, and X-Y tables.

The position sensor system may be employed to control the position of a variety of sensors and other devices. Non-limiting examples of sensors that could be controlled with the position sensor system are optical sensors.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Magnetic Wake Detector Implementation

In some implementations, the devices 300, 600A, 600B, 600C, 700, 2500, and/or 4200 can be implemented in a magnetic wake detector.

In some aspects of the present technology, methods and configurations are disclosed for detecting small magnetic fields generated by moving charged particles. For example, fast moving charged particles moving through the Earth's atmosphere create a small magnetic field that can be detected by the disclosed embodiments. Sources of charged particles include fast moving vehicles such as missiles, aircraft, supersonic gliders, etc. To detect the small magnetic fields, highly sensitive magnetometers (e.g., DNV sensors) may be used. DNV sensors can provide 0.01 μT sensitivity. These magnetometers can be as or more sensitive than the superconducting quantum interference device (SQUID) magnetometer (e.g., with femto-Tesla level measurement sensitivity).

As another example of a source of charged particles, a jet engine can create ions as a byproduct of the combustion process. Another example includes a super-sonic glider that generates a plasma field as the glider moves through the atmosphere. This plasma field can generate charged particles. The disclosed detectors can also detect magnetic fields underwater. Accordingly, torpedoes that are rocket propelled may create an ion flux. The charged particles, e.g., ions, are moving quite fast for a period of time until slowed down by the surrounding air. These fast moving ions (charged particles) can generate a low-level magnetic field in the atmosphere. This field can be detected by one or more detectors as described here within.

The subject technology can be used as an array of sensitive magnetic sensors (e.g., DNV sensors) to detect the magnetic fields created by charged particle sources, such as jet engine exhaust. A single detector can be used to detect the magnetic field that are generated over the detector. In one implementation, the range of a detector is 10 kilometers or less. In another implementation, the range of the detector is one kilometer. In this implementation, a single detector can detect a magnetic field within its 10 kilometer slant range. In another implementation, the magnetic sensors may be spread out along a coast or at a distance from some other areas of interest (e.g., critical infrastructure such as power plants, military bases, etc.). In addition, multiple lines of sensors can be used to allow the system to establish the missile trajectory. In one or more implementations, data from the magnetic sensors may be used in conjunction with data from passive acoustic sensors (e.g., to hear the signature whine of a jet engine) to improve the overall detection capabilities of the subject system. In some aspects, the sensors can be small enough to be covertly placed near an enemy air field to provide monitoring of jets as they take off or land (e.g., are at low altitudes). In various implementations, the detectors can be low power and persistent (e.g., always watching—without a manned crew). These detectors, therefore, can be used for covert (e.g., passive) surveillance based on the subject solution which cannot be detected, even by current stealth technology.

FIG. 172 illustrates a flying object 17202 at low altitude 17208 in accordance with some illustrative implementations. The flying object 17202 can be a cruise missile, an aircraft, or a super-sonic glider. The flying object 17202 can readily avoid radar tracking due to high clutter caused by terrain 17206 and being stealth. Even airborne radars may not be able to detect and track these objects because of intense clutter issues involved with scanning down toward the Earth and trying to track a small, stealthy target. For example, high flying surveillance radar (e.g., AWACS or Hawkeye) can sometimes detect cruise missiles, but it is costly and has to be up in the air and have sufficient signal-to-noise ratio(SNR) to be able to operate in a high-clutter situation. Short-range radars may also provide detection capability, but require substantial power and, due to the low flight height of the missile, may be able to see the missile for an extremely brief period. The limited window of view-ability allows the missile to be easily missed by a ground based system (especially if rotating) in part because it would not persist in the field of view long enough to establish a track. The subject technology utilizes high sensitivity magnetic sensors, such as DNV sensors to detect weak magnetic fields generated by the fast movement of ions in the jet exhaust of cruise missiles. For example, a DNV sensor measures the magnetic field that acts upon the DNV sensor. When used on Earth, the DNV sensor measures the Earth's magnetic field, assuming there are no other magnetic fields affecting the Earth's magnetic field. The DNV measures a magnetic vector that provides both a magnitude and direction of the magnetic field. When another magnetic field is within range of the DNV sensor, the measured field changes. Such changes indicate the presence of another magnetic field.

When using a DNV sensor, each sample is a vector that represents the magnetic field affecting the DNV sensor. Accordingly, using measurements over time the positions in time and therefore, the path of an object can be determined. Multiple DNV sensors that are spaced out can also be used. For example, sensed magnetic vectors from multiple DNV sensors that are measured at the same time can be combined. As one example, the combined vectors can make up a quiver plot. Analysis, such as a Fourier transform, can be used to determine the common noise of the multiple measures. The common noise can then be subtracted out from various measurements.

One way measurements from a single or multiple DNV sensors can be used is to use the vectors in various magnetic models. For example, multiple models can be used that estimate the dimensions, mass, number of objects, position of one or more objects etc. The measurements can be used to determine an error of each of the models. The model with the lowest error can be identified as most accurately describing the objects that are creating the magnetic fields being measured by the DNV sensors. Alterations to one or more of the best models can then be applied to reduce the error in the model. For example, genetic algorithms can be used to alter a model in an attempt to reduce model error to determine a more accurate model. Once an error rate of a model is below a predetermined threshold, the model can help identify how many objects are generating the sensed magnetic fields as well as the dimensions and mass of the objects.

If the flying object 17202 uses a combustion engine, exhaust 17204 will be generated. The exhaust 17204 can include charged particles that are moving at high speeds when exiting the flying object 17202. These charged particles create a magnetic field that can be detected by the described implementations. As the Earth has a relatively static magnetic field, the detectors can detect disturbances or changes from the Earth's static magnetic field. These changes can be attributed to the flying object 17202.

FIG. 173 illustrates a magnetic field detector in accordance with various illustrative implementations. A sensor 17306 can detected a magnetic field 17304 of a flying object 17202 passing overhead the sensor 17306. The sensor 17306 can be passive in that the sensor 17306 does not emit any signal to detect the flying object 17202. Accordingly, the sensor 17306 is passive and its use is not detectable by other sensors. For example a magnetic sensor such as a DNV-based magnetic sensor can detect magnetic field with high sensitivity without being detectable. A sensor network formed by a number of nodes equipped with magnetic sensors (e.g. DNV sensors) can be deployed, for example, along national borders, in buoys off the coast or in remote locations. For instance, a distant early warning line can be established near the Arctic Circle.

FIGS. 174A and 174B illustrate a portion of a detector array in accordance with various illustrative implementations. Detectors 17402 and 17404 can both detect the magnetic field generated by the flying object 17406. Given an array of detectors located in a region, data from multiple detectors can be combined for further analysis. For example, data from the detectors 17402 and 17404 can be combined an analyzed to determine aspects such as speed and location of the flying object 17406. As one example, at a first time shown in FIG. 174A, detector 17402 can detect the magnetic field generated from the flying object 17406. Detector 17404 may not be able to detect this magnetic field or can detect the field but given the further distance the detected field will be weaker compared to the magnetic field detected by detector 17402. This data from a single point of time can be used to calculate a position of the object 17406. Data from a third detector can also be used to triangulate the position of the flying object 17406. Data from a single detector can also be useful as this data can be used to detect a slant position of the flying object 17406. The combined data can also be used to determine a speed of the flying object 17406.

In addition, data from one or more detectors over time can be used. In FIG. 174B, the flying object 17406 has continued its path. The magnetic field detected by detector 17404 has increased in strength as the flying object approaches detector 17404, while the magnetic field detected by detector 17402 will be weaker compared to the magnetic field detected in FIG. 174A. The differences in strength are based upon the flying object being closer to detector 17404 and further away from detector 17402. This information can be used to determine a trajectory of the flying object 17406.

As describe above, data from a single detector can be used to calculate a slant range of a flying object. The slant range can be calculated based upon a known intensity of the magnetic field of the flying object compared with the intensity of the detected field. Comparing these two values provides an estimate for the distance that the object is from the detector. The precise location, however, is not known, rather a list of possible positions is known, the slant range. The speed of the flying object can be estimated by comparing the detected magnetic field measurements over time. For example, a single detector can detect the magnetic field of the flying object over a period of time. How quickly the magnetic field increases or decreases in intensity as the flying object move toward or away, respectively, from the detector can be used to calculate an estimate speed of the flying object. Better location estimates can also be used by monitoring the magnetic field over a period of time. For example, monitoring the magnetic field from the first detection to the last detection from a single detector can be used to better estimate possible positions and/or the speed of the flying object. If the magnetic field was detected for a relatively long period of time, the flying object is either a fast moving object that flew closely overhead to the detector or is a slower moving object that few further away from the detector. The rate of change of the intensity of the magnetic field can be used to determine if the object is a fast moving object or a slow moving object. The possible positions of the flying object, therefore, can be reduced significantly.

The time history of the magnetic field can also be used to detect the type of flying object. Rocket propelled objects can have a thrust that is initially uniform. Accordingly, the charged particles will be moving in a uniform manner for a time after being propelled from the flying object. The detected magnetic field, therefore, will also have a detectable amount of uniformity over time when the range influence is taken into account. In contrast, hypersonic objects will lack this uniformity. For example, ions that leave a plasma field that surrounds the hypersonic object will not be ejected in a uniform manner. That is, the ions will travel in various different directions. The detected magnetic field based upon these ions will have a lot of variation that is not dependent on the range of the flying object. Accordingly, analysis of the intensity of the magnetic field, taking into account range influence, can determine if the magnetic field is uniform or has a large variation over time. Additional data can be used to refine this analysis. For example, calculating and determining a speed of an object can be used to eliminate possible flying objects that cannot fly at the determined speed. In addition, data from different types of detectors can be used. Radar data, acoustic data, etc., can be used in combination with detector data to eliminate possible types of flying objects.

Data combined from multiple sensors can also be used to more accurately calculate data associated with the flying object. For example, the time difference between when two separate detectors can be used to calculate a range of speeds and possible locations of the flying object. A first detector can first detect a flying object at a first time. A second detector can first detect the flying object at a second time. Using the known distance between the two detectors and the range of the two detectors, estimates of the speed and location of the flying object can be significantly enhanced compared to using data from a single detector. For example, the flying object is determined to be between two detectors rather than being on the opposite of the first detector. Further, the direction of the flying object can be deduced. The addition of a third detector allows for the location of the flying object to be triangulated.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Defect Detector Implementation

In some implementations, the devices 300, 600A, 600B, 600C, 700, 2500, and/or 4200 can be implemented in a defect detector.

In various embodiments described in greater detail below, a magnetometer using one or more diamonds with NV centers can be used to detect defects in conductive materials. According to Ampere's law, an electrical current through a conductor generates a magnetic field along the length of the conductor. Similarly, a magnetic field can induce a current through a conductor. In general, a conductor with continuous uniformity in size, shape, and material through which an electrical current passes will generate a continuous magnetic field along the length of the conductor. On the other hand, the same conductor but with a deformity or defect such as a crack, a break, a misshapen portion, holes, pits, gouges, impurities, anomalies, etc. will not generate a continuous magnetic field along the length of the conductor. For example, the area surrounding the deformity may have a different magnetic field than areas surrounding portions of the conductor without the deformity. In some deformities, such as a break in the conductor, the magnetic field on one side of the break may be different than the magnetic field on the other side of the break.

For example, a rail of railroad tracks may be checked for deformities using a magnetometer. A current can be induced in the rail, and the current generates a magnetic field around the rail. The magnetometer can be used by passing the magnetometer along the length of the rail, or along a portion of the rail. The magnetometer can be at the same location with respect to the central axis of the rail as the magnetometer passes along the length of the rail. The magnetometer detects the magnetic field along the length of the rail.

In some embodiments, the detected magnetic field can be compared to an expected magnetic field. If the detected magnetic field is different than the expected magnetic field, it can be determined that a defect exits in the rail. In some embodiments, the detected magnetic field along the length of the rail can be checked for areas that have a magnetic field that is different than the majority of the rail. It can be determined that the area that has a magnetic field that is different than the majority of the rail is associated with a defect in the rail.

The principles explained above can be applied to many scenarios other than checking the rails of railroad tracks. A magnetometer can be used to detect deformities in any suitable conductive material. For example, a magnetometer can be used to detect deformities in machinery parts such as turbine blades, wheels, engine components.

FIGS. 175A and 175B are block diagrams of a system for detecting deformities in a material in accordance with an illustrative embodiment. An illustrative system 17500 includes a conductor 17505, an alternating current (AC) source 17510, a coil 17515, and a magnetometer 17530. In alternative embodiments, additional, fewer, and/or different elements may be used.

The conductor 17505 is a length of conductive material. In some embodiments, the conductor 17505 is paramagnetic. In some embodiments, the conductor 17505 is ferromagnetic. The conductor 17505 can be any suitable length and have any suitable cross-sectional shape.

A current indicated by the arrow labeled 17520 in FIGS. 175A and 175B illustrates the direction of an induced current through the conductor 17505. In the embodiments illustrated in FIGS. 175A and 175B, the AC source 17510 and the coil 17515 induce the induced current 17520. For example, current from the AC source 17510 can pass through the coil 17515, thereby creating a magnetic field around the coil 17515. The magnetic field of the coil 17515 can be placed sufficiently close to the conductor 17505 to create the induced current 17520. The induced current 17520 travels in a direction along the conductor 17505 that is away from the coil 17515. In alternative embodiments, any suitable system can be used to create the induced current 17520.

In the embodiments illustrated in FIGS. 175A and 175B, an AC source 17510 is used to provide power to the coil 17515. The AC source 17510 can be any suitable alternating current source. For example, power lines or traditional methods of obtaining alternating current power can be used. In another example, a third rail of a railway that is used to provide power to railcars can be used as the AC source 17510. In yet another example, a crossing gate trigger of a railway can be used as the AC source 17510.

In an illustrative embodiment, the induced current 17520 is an alternating current. In some embodiments, the frequency of the induced current 17520 can be altered. The magnetic field generated by the induced current 17520 can change based on the frequency of the induced current 17520. Thus, by using different frequencies, different features of the conductor 17520 can be determined by measuring the magnetic field generated by the different frequencies, as explained in greater detail below. For example, a rapid sequence of different frequencies can be used. In another example, multiple frequencies can be applied at once and the resulting magnetic field can be demodulated. For example, the spatial shape and pattern of the vector magnetic field generated by eddy currents around the defect or imperfection changes with the frequency of the applied excitation field. A three-dimensional Cartesian magnetic field pattern around the defect or imperfection can be measured and imaged at one frequency at a time. The detected magnetic field pattern can be stored (e.g., in a digital medium or a continuous analog medium). The detected magnetic field pattern can be compared to previously measured images to generate a likely taxonomy or identification of the nature of the defect or imperfection and/or the location of the defect or imperfection.

The induced current 17520 that passes through the conductor 17505 generates a magnetic field. The magnetic field has a direction around the conductor 17505 indicated by the arrow labeled with numeral 17525. The magnetometer 17530 can be passed along the length of the conductor 17505. FIGS. 175A and 175B include an arrow parallel to the length of the conductor 17505 indicating the path of the magnetometer 17530. In alternative embodiments, any suitable path may be used. For example, in embodiments in which the conductor 17505 is curved (e.g., as a railroad rail around a corner), the magnetometer 17530 can follow the curvature of the conductor 17505.

The magnetometer 17530 can measure the magnitude and/or direction of magnetic field vectors along the length of the conductor 17505. For example, the magnetometer 17530 measures the magnitude and the direction of the magnetic field at multiple sample points along the length of the conductor 17505 at the same orientation to the conductor 17505 at the sample points. For instance, the magnetometer 17530 can pass along the length of the conductor 17505 while above the conductor 17505.

Any suitable magnetometer can be used as the magnetometer 17530. In some embodiments, the magnetometer uses one or more diamonds with NV centers. The magnetometer 17530 can have a sensitivity suitable for detecting changes in the magnetic field around the conductor 17505 caused by deformities. In some instances, a relatively insensitive magnetometer 17530 may be used. In such instances, the magnetic field surrounding the conductor 17505 should be relatively strong. In some such instances, the current required to pass through the conductor 17505 to create a relatively strong magnetic field may be impractical or dangerous. Thus, for example, the magnetometer 17530 can have a sensitivity of about $10^{-9}$ Tesla (one nano-Tesla) and can detect defects at a distance of about one to ten meters away from the conductor 17505. In such an example, the conductor 17505 can be a steel pipe with a diameter of 0.2 meters. In one example, the current through the conductor 17505 may be about one Ampere (Amp), and the magnetometer 17530 may be about one meter away from the conductor 17505. In another example, the current through the conductor 17505 may be about one hundred Amps, and the magnetometer 17530 may be about ten meters away. The magnetometer 17530 can have any suitable measurement rate. In an illustrative embodiment, the magnetometer 17530 can measure the magnitude and/or the direction of a magnetic field at a particular point in space up to one million times per second. For example, the magnetometer 17530 can take one hundred, one thousand, ten thousand, or fifty thousand times per second.

In embodiments in which the magnetometer 17530 measures the direction of the magnetic field, the orientation of the magnetometer 17530 to the conductor 17505 can be maintained along the length of the conductor 17505. As the magnetometer 17530 passes along the length of the conductor 17505, the direction of the magnetic field can be monitored. If the direction of the magnetic field changes or is different than an expected value, it can be determined that a deformity exits in the conductor 17505.

In such embodiments, the magnetometer 17530 can be maintained at the same orientation to the conductor 17505 because even if the magnetic field around the conductor 17505 is uniform along the length of the conductor 17505, the direction of the magnetic field is different at different points around the conductor 17505. For example, referring to the induced current magnetic field direction 17525 of FIG. 175A, the direction of the magnetic field above the conductor 17505 is pointing to the right-hand side of the figure (e.g., according to the "right-hand rule"). The direction of the magnetic field below the conductor 17505 is pointing to the left-hand side of the figure. Similarly, the direction of the magnetic field is down at a point that is to the right of the conductor 17505. Following the same principle, the direction of the magnetic field is up at a point that is to the left of the conductor 17505. Therefore, if the induced current 17520 is maintained at the same orientation to the conductor 17505 along the length of the conductor 17505 (e.g., above the conductor 17505, below the conductor 17505, twelve degrees to the right of being above the conductor 17505, etc.), the direction of the magnetic field can be expected to be the same or substantially similar along the length of the conductor 17505. In some embodiments, the characteristics of the induced current 17520 can be known (e.g., Amps, frequency, etc.) and the magnitude and direction of the magnetic field around the conductor 17505 can be calculated.

In embodiments in which the magnetometer 17530 measures magnitude of the magnetic field and not the direction of the magnetic field, the magnetometer 17530 can be located at any suitable location around the conductor 17505 along the length of the conductor 17505, and the magnetometer 17530 may not be held at the same orientation along the length of the conductor 17505. In such embodiments, the magnetometer 17530 may be maintained at the same distance from the conductor 17505 along the length of the conductor 17505 (e.g., assuming the same material such as air is between the magnetometer 17530 and the conductor 17505 along the length of the conductor 17505).

FIG. 175A illustrates the system 17500 in which the conductor 17505 does not contain a deformity. FIG. 175B illustrate the system 17500 in which the conductor 17505 includes a break 17535. As shown in FIG. 175B, a portion of the induced current 17520 is reflected back from the break 17535 as shown by the reflected current 17540. As in FIG. 175B, the induced current magnetic field direction 17525 corresponds to the induced current 17520. The reflected current magnetic field direction 17545 corresponds to the reflected current 17540. The induced current magnetic field direction 17525 is opposite the reflected current magnetic field direction 17545 because the induced current 17520 travels in the opposite direction from the reflected current 17540.

In some embodiments in which the break 17535 is a full break that breaks conductivity between the portions of the conductor 17505, the magnitude of the induced current 17520 may be equal to or substantially similar to the reflected current 17540. Thus, the combined magnetic field around the conductor 17505 will be zero or substantially zero. That is, the magnetic field generated by the induced current 17520 is canceled out by the equal but opposite magnetic field generated by the reflected current 17540. In such embodiments, the break 17535 may be detected using the magnetometer 17530 by comparing the measured magnetic field, which is substantially zero, to an expected magnetic field, which is a non-zero amount. As the magnetometer 17530 travels closer to the break 17535, the magnitude of the detected magnetic field reduces. In some embodiments, it can be determined that the break 17535 exists when the measured magnetic field is below a threshold value. In some embodiments, the threshold value may be a percentage of the expected value, such as ±0.1%, ±1%, ±5%, ±10%, ±15%, ±50%, or any other suitable portion of the expected value. In alternative embodiments, any suitable threshold value may be used.

In embodiments in which the break 17535 allows some of the induced current 17520 to pass through or around the break 17535, the magnitude of the reflected current 17540 is less than the magnitude of the induced current 17520. Accordingly, the magnitude of the magnetic field generated by the reflected current 17540 is less than the magnitude of the magnetic field generated by the induced current 17520. Although the magnitudes of the induced current 17520 and the reflected current 17540 may not be equal, the induced current magnetic field direction 17525 and the reflected current magnetic field direction 17545 are still opposite. Thus, the net magnetic field is a magnetic field in the induced current magnetic field direction 17525. The magnitude of the net magnetic field is the magnitude of the magnetic field generated by the induced current 17520 minus the magnitude of the magnetic field generated by the reflected current 17540. As mentioned above, the magnetic field measured by the magnetometer 17530 can be compared against a threshold value. Depending upon the severity, size, and/or shape of the break 17535, the net magnetic field sensed by the magnetometer 17530 may or may not be less than or greater than the threshold value. Thus, the threshold value can be adjusted to adjust the sensitivity of the system. That is, the more that the threshold value deviates from the expected value, the more severe the deformity in the conductor 17505 is to cause the magnitude of the sensed magnetic field to be less than the threshold value. Thus, the smaller the threshold value is, the finer, smaller, less severe, etc. deformities are that are detected by the system 17500.

As mentioned above, the direction of the magnetic field around the conductor 17505 can be used to sense a deformity in the conductor 17505. FIG. 176 illustrates current paths through a conductor with a deformity in accordance with an illustrative embodiment. FIG. 176 is meant to be illustrative and explanatory only and not meant to be limiting with respect to the functioning of the system.

A current can be passed through the conductor 17605, as discussed above with regard to the conductor 17505. The current paths 17620 illustrate the direction of the current. As shown in FIG. 176, the conductor 17605 includes a deformity 17635. The deformity 17635 can be any suitable deformity, such as a crack, a dent, an impurity, etc. The current passing through the conductor 17605 spreads uniformly around the conductor 17605 in portions that do not include the deformity 17635. In some instances, the current may be more concentrated at the surface of the conductor 17605 than at the center of the conductor 17605.

In some embodiments, the deformity 17635 is a portion of the conductor 17605 that does not allow or resists the flow of electrical current. Thus, the current passing through the conductor 17605 flows around the deformity 17635. As shown in FIG. 175A, the induced current magnetic field direction 17525 is perpendicular to the direction of the induced current 17520. Thus, as in FIG. 175A, when the conductor 17505 does not include a deformity, the direction of the magnetic field around the conductor 17505 is perpendicular to the length of the conductor 17505 all along the length of the conductor 17505.

As shown in FIG. 176, when the conductor 17605 includes a deformity 17635 around which the current flows, the direction of the current changes, as shown by the current paths 17620. Thus, even though the conductor 17605 is straight, the current flowing around the deformity 17635 is not parallel to the length of the conductor 17605. Accordingly, the magnetic field generated by the current paths corresponding to the curved current paths 17620 is not perpendicular to the length of the conductor 17605. Thus, as a magnetometer such as the magnetometer 130 passes along the length of the conductor 17605, a change in direction of the magnetic field around the conductor 17605 can indicate that the deformity 17635 exits. As the magnetometer 130 approaches the deformity 17635, the direction of the magnetic field around the conductor 17605 changes from being perpendicular to the length of the conductor 17605. As the magnetometer 17530 passes along the deformity 17635, the change in direction of the magnetic field peaks and then decreases as the magnetometer 17530 moves away from the deformity 17635. The change in the direction of the magnetic field can indicate the location of the deformity 17635. In some instances, the conductor may have a deformity that reflects a portion of the current, as illustrated in FIG. 175B, and that deflects the flow of the current, as illustrated in FIG. 176.

The size, shape, type, etc. of the deformity 17635 determines the spatial direction of the magnetic field surrounding the deformity 17635. In some embodiments, multiple samples of the magnetic field around the deformity 17635 can be taken to create a map of the magnetic field. In an illustrative embodiment, each of the samples includes a magnitude and direction of the magnetic field. Based on the spatial shape of the magnetic field surrounding the deformity 17635, one or more characteristics of the deformity 17635 can be determined, such as the size, shape, type, etc. of the deformity 17635. For instance, depending upon the map of the magnetic field, it can be determined whether the deformity 17635 is a dent, a crack, an impurity in the conductor, etc. In some embodiments, the map of the magnetic field surrounding the deformity 17635 can be compared to a database of known deformities. In an illustrative embodiment, it can be determined that the deformity 17635 is similar to or the same as the closest matching deformity from the database. In an alternative embodiment, it can be determined that the deformity 17635 is similar to or the same as a deformity from the database that has a similarity score that is above a threshold score. The similarity score can be any suitable score that measures the similarity between the measured magnetic field and one or more known magnetic fields of the database.

A magnetometer can be used to detect defects in conductive materials in many different situations. In one example, a magnetometer can be used to detect defects in railroad rails. In such an example, a railroad car can be located along the rails and travel along the tracks. A magnetometer can be located on the car a suitable distance from the rails, and monitor the magnetic field around one or more of the rails as the car travels along the tracks. In such an example, the current can be induced in one or more of the rails at a known stationary location. In an alternative embodiment, the coil that induces the current in the rails can be located on the moving car and can move with the magnetometer.

In such an example, the magnetometer can be located on a typical rail car or a specialized rail car device. The magnetometer can be mounted and/or the rail car can be designed in a manner that maintains the orientation of the magnetometer with respect to one or more of the rails. In some instances, it may not be feasible to maintain perfect orientation of the magnetometer with the rails because of, for example, bumps or dips in the terrain, movement of people or cargo in the car, imperfections in the rails, etc. In such instances, one or more gyroscopes can be used to track the relative position of the magnetometer to the one or more rails. In alternative embodiments, any suitable system can be used to track the relative position of the magnetometer, such as sonar, lasers, or accelerometers. The system may use the change in relative position to adjust the magnitude and/or direction of the expected magnetic field accordingly.

In another example, the magnetometer can be used to detect deformities in pipes. In some instances, the pipes can be buried or may be beneath water. In scenarios in which the conductor being checked for deformities is surrounded by a relatively conductive material, such as water, the magnetometer can be placed relatively close to the coil inducing the current in the conductor. Because the conductor is surrounded by the relatively conductive material, the strength of the current traveling through the conductor will diminish much quicker the further away from the coil the magnetometer is compared to the conductor being surrounded by a relatively non-conductive material, such as air. In such conditions, the coil can travel along the conductor with the magnetometer. The magnetometer and the coil can be separated enough that the magnetic field from the coil does not cause excessive interference with the magnetometer.

In some instances, a magnetometer can be used to detect leaks in pipes. For example, some fluids that are transported via a pipeline have magnetic properties. In such instances, the fluid and/or the pipe can be magnetized. The magnetometer (e.g., an array of magnetometers) can travel along the pipe to detect discrepancies in the detected magnetic field around the pipe as explained above. Differences or changes in the magnetic field can be caused by the fluid leaking from the pipe. Thus, detecting a difference or change in the magnetic field using the magnetometer can indicate a leak in the pipe. For example, a stream or jet of fluid or gas flowing from a pipe can be detected by a magnetic field around the stream or jet. In some embodiments, the volumetric leak rate can be determined based on the magnetic field (e.g., the size of the magnetic field). The leak rate can be used, for example, to prioritize remediation of leaks.

In some embodiments, a current may not be induced in the conductor. In such embodiments, any suitable magnetic field may be detected by the magnetometer. For example, the earth generates a magnetic field. The material being inspected may deflect or otherwise affect the earth's magnetic field. If the inspected material is continuous, the deflection of the earth's magnetic field is the same or similar along the length of the material. However, if there is a deformity or defect, the deflection of the earth's magnetic field will be different around the deformity or defect.

In some embodiments, any other suitable magnetic source may be used. For example, a source magnet may be applied to a material that is paramagnetic. The magnetic field around the paramagnetic material can be used to detect deformities in the material using principles explained herein. In such an embodiment, the magnetometer can be located relatively close to the source magnet.

As mentioned above, in some embodiments the measured magnetic field is compared to an expected magnetic field. The expected magnetic field can be determined in any suitable manner. The following description is one example of how the expected magnetic field can be determined.

In embodiments in which a coil is used to induce a current in the conductor (e.g., the embodiments illustrated in FIGS. 175A and 175B), the magnitude of the magnetic field of the coil at the conductor, $B^{coil}$, can be determined using the following equation:

$$B^{coil} = \frac{\mu I}{4\pi}\int \frac{dl_{coil}\cdot r_{cr}}{r_{cr}^2}$$

where μ is the magnetic permeability (Newtons/Amp$^2$) of the medium between the coil and the conductor (e.g., conductor 17505), I is the current through the coil (Amps), $dl_{coil}$ is the elemental length of the coil wire (meters), and $r_{cr}$ is the scalar distance from the coil to the rail (meters). It will be understood that the magnitude of the magnetic field of the coil can be converted into a vector quantity with a circular profile symmetric about the coil center of alignment and, therefore, circumferentially constant with a radial relationship consistent with the above equation.

The forward current in the rail, $I^{rail}$, can be calculated using the equation:

$$I^{rail} = \alpha B^{coil}$$

where α is the magnetic susceptibility of the conductor (Henry).

The magnitude of the magnetic field of the rail magnetic B-field is:

$$B^{rail} = \frac{\mu I^{rail}}{4\pi}\int \frac{dl_{rail}\cdot r_{rm}}{r_{rm}^2}$$

where $r_{rm}$ is the distance from the rail to the magnetometer, and $dl_{rail}$ is the length of the rail from the location the magnetic field from the coil interacts with the rail and the location of the magnetometer (meters).

In some embodiments, the magnetometer can measure the magnitude of a magnetic field in one or more directions. For example, the magnetometer can measure the magnitude of the magnetic field in three orthogonal directions: x, y, and z. The following equation shows the relationship between the measured magnitudes of the detected magnetic field in the x, y, and z directions ($B_x$, $B_y$, and $B_z$, respectively) and the vector of the magnetic field measured by the magnetometer ($B^{meas}$) (e.g., using a dipole model):

$$B^{meas} = \begin{bmatrix} B_x \\ B_y \\ B_z \end{bmatrix}$$

If the rail is uniform and homogeneous, then $B^{meas}$ is essentially equal to $B^{rail}$. When a defect, anomaly, deformity, etc. is present within the rail, the measured magnetic vector, $B^{meas}$, is different from the expected magnetic field of the rail, $B^{rail}$, by a function of translation ($F_t$) because of the anomaly, as shown in the equation:

$$B^{meas} = F_t B^{rail}$$

A linear expansion of the translation function allows an algebraic formula isolating position, δ, changes caused by the rail anomaly to be detected from a difference between the reference and measured field as follows:

$$\delta B^{meas} = +\frac{\partial F_t}{\partial P}\delta B^{rail}$$

$$B^{meas} = (I_{rail} + \delta)B^{rail}$$

$$B^{meas} - B^{rail} = \delta B^{rail}$$

therefore, $$[(B^{meas} - B^{rail})_k (B^{meas} - B^{rail})_{k+1} \ldots\ ] = [\delta]\cdot[(B^{rail})_k (B^{rail})_{k+1} \ldots\ ]$$

In the above equations, δ is the distance of the deformity along the conductor from the magnetometer, $I_{rail}$ is the current through the conductor, and k denotes a particular measurement sample. In an illustrative embodiment, one hundred samples are taken. In alternative embodiments, more or fewer than one hundred samples are taken. When processed through a Fast Fourier Transform algorithm (or any other suitable algorithm), noise may be suppressed and echoes or uneven departures from the reference field ($B^{rail}$) are correlated to the rail break at a known position and orientation relative to the magnetometer at distance δ according to the following equations:

$$[\delta] = \frac{[(B^{meas} - B^{rail})_k (B^{meas} - B^{rail})_{k+1} \dots ]}{[(B^{rail})_k (B^{rail})_{k+1} \dots ]}$$

$$\Im[\delta] = \Im(j\omega, X)$$

Using the equations above, the distance from the magnetometer to the deformation can be determined based on the current induced in the conductor (I) and the measured magnetic field at a particular distance from the conductor.

In the embodiments illustrated in FIGS. 175A and 175B, one magnetometer 17530 is used to pass along the length of the conductor 17505 to monitor for deformities. In alternative embodiments, two or more magnetometers 17530 may be used. The multiple magnetometers 17530 can be oriented around the conductor 17505 in any suitable manner. Using multiple magnetometers 17530 provides benefits in some instances. For example, using multiple magnetometers 17530 provides multiple sample points simultaneously around the conductor 17505. In some instances, the multiple sample points can be redundant and can be used to check the accuracy of the samples. In some instances, having multiple sample points spread around a conductor 17505 increases the chances that there is a magnetometer 17530 at a point around the conductor 17505 that has the greatest angle of departure. That is, sampling multiple points around the conductor 17505 increases the chances that a magnetometer 17530 will detect an anomaly in the conductor 17505 based on the greatest change in the magnetic field around the conductor 17505.

FIG. 177 is a flow diagram of a method for detecting deformities in accordance with an illustrative embodiment. In alternative embodiments, additional, fewer, or different operations may be performed. Also, the use of a flow chart and/or arrows is not meant to be limiting with respect to the order or flow of operations. For example, in some embodiments, two or more of the operations may be performed simultaneously.

In an operation 17705, an expected magnetic field is determined. In an illustrative embodiment, the expected magnetic field can include a magnitude and a direction (e.g., be a vector). In alternative embodiments, the expected magnetic field includes a magnitude or a direction. In an illustrative embodiment, the expected magnetic field is determined based on a current induced in a conductor. For example, a power source and a coil can be used to induce a current in a conductor. Based on the current through the coil and the distance between the coil and the conductor (and any other suitable variable), the induced current through the conductor can be calculated. The location of the coil with respect to the magnetometer can be known, and, therefore, the direction of the induced current can be known. If the current through the conductor is known or calculated, the magnetic field at a point around the conductor can be calculated. Thus, the magnetic field at the point around the conductor that the magnetometer is can be calculated based on the induced current, assuming that no deformity exits.

In an alternative embodiment, the expected magnetic field can be determined using a magnetometer. As discussed above, a deformity can be detected by detecting a change in a magnetic field around a conductor. In such embodiments, one or more initial measurements can be taken using the magnetometer. The one or more initial measurements can be used as the expected magnetic field. That is, if the conductor is not deformed along the length of the conductor, the magnetic field along the conductor will be the same as or substantially similar to the initial measurements. In alternative embodiments, any suitable method for determining an expected magnetic field can be used.

In an operation 17710, a magnetic field is sensed. In an illustrative embodiment, a magnetometer is used to measure a magnetic field around a conductor along the length of the conductor. In an operation 17715, the magnetometer moves along the length of the conductive material. The magnetometer can maintain an orientation to the conductor as the magnetometer travels along the length of the conductor. As the magnetometer moves along the length of the conductive material, the magnetometer can be used to gather multiple samples along the length of the conductive material.

In an operation 17720, the difference between the sensed field and the expected field is compared to a threshold. In an illustrative embodiment, the absolute value of the difference between the sensed field and the expected field is compared to the threshold. In such an embodiment, the magnitude of the difference is used and not the sign of the value (e.g., negative values are treated as positive values). The threshold can be any suitable threshold value. For example, the difference between the magnitude of the sensed vector and the magnitude of the expected vector can be compared against a threshold magnitude value. In another example, the difference between the direction of the sensed vector and the direction of the expected vector can be compared against a threshold value. The threshold value can be chosen based on a desired level of sensitivity. The higher the threshold value is, the lower the sensitivity of the system is. For example, the threshold value for a difference in vector angles can be 5-10 micro radians. In alternative embodiments, the threshold value can be less than 5 micro radians or greater than 10 micro radians.

If the difference between the sensed field and the expected field is greater than the threshold, then it can be determined in an operation 17735 that there is a defect. In alternative embodiments, a sufficiently large difference in the sensed field and the expected field can indicate an anomaly in the conductor, a deformity in the conductor, etc. If the difference between the sensed field and the expected field is not greater than the threshold, then it can be determined in an operation 17740 that there is no defect. That is, if the sensed field is sufficiently close to the expected field, it can be determined that there is not a sufficiently large anomaly, break, deformity, etc. in the conductor.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Hydrophone Implementation

In some implementations, the devices 300, 600A, 600B, 600C, 700, 2500, and/or 4200 can be implemented in a hydrophone.

FIG. 178 is a schematic illustrating a hydrophone 17800 in accordance with some illustrative implementations. In various implementations the components of the hydrophone 17800 can be contained within a housing 17802. The hydrophone 17800 includes a ferro-fluid 17804 that is exposed. In this implementation, the hydrophone can be exposed to air, water, a fluid, etc. A magnet 17808 activates the ferro-fluid 17804. In some implementations, the magnet 17808 is strong enough to keep the ferro-fluid 17804 in place in the hydrophone. In other implementations, a membrane can be used to contain the ferro-fluid 17804. When activated the ferro-fluid 17804 forms a shape based upon the magnetic field from the magnet 17808. The magnet 17808 can be a permanent magnet of an electro-magnet. As sound waves hit the ferro-fluid 17804, the shape of the ferro-fluid changes. As the ferro-fluid changes, the magnetic field from the ferro-fluid 17804 changes. One or more DNV sensors 17806 can be used to detect these changes in the magnetic field. The magnetic field changes measured by the DNV sensors 17806 can be converted into acoustic signals. For example, one or more electric processors can be used to translate movement of the ferro-fluid 17804 into acoustic data. The hydrophone 17800 can be used in medical devices as well as within vehicles.

A reservoir (not shown) can be used to hold additional ferro-fluid. As needed, the ferro-fluid 17804 that is being used to be detect sound waves can be replenished by the additional ferro-fluid from the reservoir. For example, a sensor can detect how much ferro-fluid is currently being used and control the reservoir to inject an amount of the additional ferro-fluid.

FIG. 179 is a schematic illustrating a portion of a vehicle 17902 with a hydrophone in accordance with some illustrative implementations. The components of the hydrophone are similar to those described in FIG. 178. A ferro-fluid 17904 is activated by a magnet 17908. In this implementation, the ferro-fluid 17904 is contained with a cavity 17910. The magnet 17908 is strong enough such that the ferro-fluid 17904 is contained within the cavity 17910 even when the vehicle is moving. As the cavity 17910 is not enclosed, the ferro-fluid 17904 is exposed to the fluid in which the vehicle is traveling. For example, if the vehicle is a submarine, the ferro-fluid 17904 is exposed to the water. In other implementations, the vehicle travels in the air and the ferro-fluid 17904 is exposed to air.

Prior to use, the ferro-fluid 17904 can be stored in a container 17912. The ferro-fluid 17904 can then be injected into the cavity 17910. In addition, during operation the amount of ferro-fluid 17904 contained within the cavity 17910 can be replenished with ferro-fluid from the container 17912.

As sound waves contact the ferro-fluid 17904, the ferro-fluid 17904 changes shape. The change in shape can be detected by one or more DNV sensors 17906. In one implementation, a single DNV sensor can be used. In other implementations an array of DNV sensors can be used. For example, multiple DNV sensors can be place in a ring around the cavity 17910. Readings from the DNV sensors 17906 can be translated into acoustic signals.

FIG. 180 is a schematic illustrating a portion of a vehicle with a hydrophone with a containing membrane in accordance with some illustrative implementations. This implementation contains similar components as to implementation illustrated in FIG. 179. What is different is that a membrane 18014 covers a portion of or the entire opening of the cavity 17910. The membrane 18014 can help enclose and contain the ferro-fluid 17904 within the cavity 17910.

FIG. 181 is a schematic illustrating a portion of a vehicle with a hydrophone in accordance with some illustrative implementations. In this implementation, a ferro-fluid 1814 is not contained within any cavity. Rather, the ferro-fluid 18104 is located outside of the vehicle. The magnet 17908 is used to contain the ferro-fluid 18104 in place. In one implementation, the magnet 17908 is located within the vehicle. In other implementations, the magnet 17908 is located outside of the vehicle. In yet another implementation, a portion of the magnet 17908 is located within the vehicle and a portion of the magnet 17908 is located outside of the vehicle.

FIG. 182 is a schematic illustrating a portion of a vehicle with a hydrophone with a containing membrane in accordance with some illustrative implementations. Similar to FIG. 181, the ferro-fluid 18104 is located outside of the vehicle. The ferro-fluid 18104 is enclosed within a membrane 18214 that contains the ferro-fluid 18104 near the vehicle. In this implementation, the magnet 17908 can be used to contain the ferro-fluid 18104, but the combination of the magnet 17908 and the membrane 18214 can be used to ensure that the ferro-fluid 18104 remains close enough to the vehicle to allow the DNV sensors to read the changes to the ferro-fluid 18104.

As mentioned above, a magnetometer using a diamond with NV centers can be used as a hydrophone. FIGS. 183A and 183B are diagrams illustrating hydrophone systems in accordance with illustrative embodiments. An illustrative system 18300 includes a hull 18305 and a magnetometer 18310. In alternative embodiments, additional, fewer, or different elements can be used. For example, an acoustic transmitter can be used to generate one or more acoustic signals. In the embodiments in which a transmitter is not used, the system 18300 can be used as a passive sonar system. For example, the system 18300 can be used to detect sounds created by something other than a transmitter (e.g., a ship, a boat, an engine, a mammal, ice movement, etc.).

In an illustrative embodiment, the hull 18305 is the hull of a vessel such as a ship or a boat. The hull 18305 can be any suitable material, such as steel or painted steel. In alternative embodiments, the magnetometer 18310 is installed in alternative structures such as a bulk head or a buoy.

As illustrated in FIG. 183A, the magnetometer 18310 can be located within the 18305. In the embodiment, the magnetometer 18310 is located at the outer surface of the hull 18305. In alternative embodiments, the magnetometer 18310 can be located at any suitable location. For example, magnetometer 18310 can be located near the middle of the hull 18305, at an inner surface of the hull 18305, or on an inner or outer surface of the hull 18305.

In an illustrative embodiment, the magnetometer 18310 is a magnetometer with a diamond with NV centers. In an illustrative embodiment, the magnetometer 18310 has a sensitivity of about 0.1 micro Tesla. In alternative embodiments, the magnetometer 18310 has a sensitivity of greater than or less than 0.1 micro Tesla.

In the embodiment illustrated in FIG. 183A, sound waves 18315 propagate through a fluid with dissolved ions, such as sea water. As the sound waves 18315 move the ions in the fluid, the ions create a magnetic field. For example, as the ions move within the magnetic field of the Earth, the ions create a magnetic field that is detectable by the magnetometer 18310. In another embodiment, a magnetic field source such as a permanent magnet or an electromagnet can be used. The movement of the ions with respect to the source of the magnetic field (e.g., the Earth) creates the magnetic field detectable by the magnetometer 18310.

In an illustrative embodiment, the sound waves 18315 travel through sea water. The density of dissolved ions in the fluid near the magnetometer 18310 depends on the location in the sea that the magnetometer 18310 is. For example, some locations have a lower density of dissolved ions than others. The higher the density of the dissolved ions, the greater the combined magnetic field created by the movement of the ions. In an illustrative embodiment, the strength of the combined magnetic field can be used to determine the density of the dissolved ions (e.g., the salinity of the sea water).

In an illustrative embodiment, the hull 18305 is the hull of a ship that travels through the sea water. As noted above, the movement of the ions relative to the source magnetic field can be measured by the magnetometer 18310. Thus, the magnetometer 18310 can be used to detect and measure the sound waves 18315 as the magnetometer 18310 moves through the sea water and as the magnetometer 18310 is stationary in the sea water.

In an illustrative embodiment, the magnetometer 18310 can measure the magnetic field caused by the moving ions in any suitable direction. For example, the magnetometer 18310 can measure the magnetic field caused by the movement of the ions when the sound waves 18315 is perpendicular to the hull 18305 or any other suitable angle. In some embodiments, the magnetometer 18310 measures the magnetic field caused by the movement of ions caused by sound waves 18315 that are parallel to the surface of the hull 18305.

An illustrative system 18350 includes the hull 18305 and an array of magnetometers 18355. In alternative embodiments, additional, fewer, and/or different elements can be used. For example, although FIG. 183B illustrates four magnetometers 18355 are used. In alternative embodiments, the system 18350 can include fewer than four magnetometers 18355 or more than magnetometers 18355. The array of the magnetometers 18355 can be used to increase the sensitivity of the hydrophone. For example, by using multiple magnetometers 18355, the hydrophone has multiple measurement points.

The array of magnetometers 18355 can be arranged in any suitable manner. For example, the magnetometers 18355 can be arranged in a line. In another example, the magnetometers 18355 can be arranged in a circle, in concentric circles, in a grid, etc. The array of magnetometers 18355 can be uniformly arranged (e.g., the same distance from one another) or non-uniformly arranged. The array of magnetometers 18355 can be used to determine the direction from which the sound waves 18315 travel. For example, the sound waves 18315 can cause ions near one the bottom magnetometer of the magnetometers 18355 of the embodiment illustrated in the system 18350 to create a magnetic field before the sound waves 18315 cause ions near the top magnetometer of the magnetometers 18355. Thus, it can be determined that the sound waves 18315 travels from the bottom to the top of FIG. 183B.

In an illustrative embodiment, the magnetometer 18310 or the magnetometers 18355 can determine the angle that the sound waves 18315 travel relative to the magnetometer 18310 based on the direction of the magnetic field caused by the movement of the ions. For example, individual magnetometers of the magnetometers 18355 can each be configured to measure the magnetic field of the ions in a different direction. Principles of beamforming can be used to determine the direction of the magnetic field. In alternative embodiments, any suitable magnetometer 18310 or magnetometers 18355 can be used to determine the direction of the magnetic field and/or the direction of the acoustic signal.

The process described herein may be implemented in hardware, software or a combination of hardware and software, for example by the processing system 18400 of FIG. 184. A general purpose computer processor (e.g., processing system 18402 of FIG. 184) for receiving signals may be configured to receive and execute computer readable instructions. The instructions may be stored on a computer readable medium in communication with the processor. One or more processors may be used for some or all of the calculations for the process described herein.

Processing or Controller System

FIG. 184 is a diagram illustrating an example of a system 18400 for implementing some aspects such as the controller. The system 18400 includes a processing system 18402, which may include one or more processors or one or more processing systems. A processor may be one or more processors. The processing system 18402 may include a general-purpose processor or a specific-purpose processor for executing instructions and may further include a machine-readable medium 18419, such as a volatile or non-volatile memory, for storing data and/or instructions for software programs. The instructions, which may be stored in a machine-readable medium 18410 and/or 18419, may be executed by the processing system 18402 to control and manage access to the various networks, as well as provide other communication and processing functions. The instructions may also include instructions executed by the processing system 18402 for various user interface devices, such as a display 18412 and a keypad 18414. The processing system 18402 may include an input port 18422 and an output port 18424. Each of the input port 18422 and the output port 18424 may include one or more ports. The input port 18422 and the output port 18424 may be the same port (e.g., a bi-directional port) or may be different ports.

The processing system 18402 may be implemented using software, hardware, or a combination of both. By way of example, the processing system 18402 may be implemented with one or more processors. A processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable device that can perform calculations or other manipulations of information.

A machine-readable medium may be one or more machine-readable media, including no-transitory or tangible machine-readable media. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media (e.g., 18419) may include storage integrated into a processing system such as might be the case with an ASIC. Machine-readable media (e.g., 18410) may also include storage external to a processing system, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. Those skilled in the art will recognize how best to implement the described functionality for the processing system 18402. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions may be executable, for example, by the processing system 18402 or one or more processors.

Instructions can be, for example, a computer program including code for performing methods of some of the embodiments.

A network interface 18416 may be any type of interface to a network (e.g., an Internet network interface), and may reside between any of the components shown in FIG. 184 and coupled to the processor via the bus 18404.

A device interface 18418 may be any type of interface to a device and may reside between any of the components shown in FIG. 184. A device interface 18418 may, for example, be an interface to an external device (e.g., USB device) that plugs into a port (e.g., USB port) of the system 18400.

One or more of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology. In some aspects, the subject technology may be used in various markets, including for example and without limitation, advanced sensors and mobile space platforms.

There may be many other ways to implement the subject technology. Various functions and elements described herein may be partitioned differently from those shown without departing from the scope of the subject technology. Various modifications to these embodiments may be readily apparent to those skilled in the art, and generic principles defined herein may be applied to other embodiments. Thus, many changes and modifications may be made to the subject technology, by one having ordinary skill in the art, without departing from the scope of the subject technology.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases. Every combination of components described or exemplified can be used to practice the embodiments, unless otherwise stated. Some embodiments can be modified to incorporate any number of variations, alterations, substitutions or equivalent arrangements not heretofore described, but which are commensurate with the spirit and scope of the embodiments. Additionally, while various embodiments of the disclosure have been described, it is to be understood that aspects of the disclosure may include only some of the described embodiments. Accordingly, the disclosure is not to be seen as limited by the foregoing description.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various embodiments described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. A system comprising:

a magneto-optical defect center magnetometer comprising:

a magneto-optical defect center element;

a collection device;

an optical light source comprising:

a readout optical light source configured to provide continuous optical excitation to the magneto-optical defect center element to transition spin states of relevant magneto-optical defect center electrons in the magneto-optical defect center element to an excited state; and a reset optical light source configured to provide, at a defined interval concurrent to the provision of the continuous optical excitation, optical light to the magneto-optical defect center element to reset the spin states in the magneto-optical defect center element from the excited state to a ground state, wherein the reset optical light source provides a higher power light than the readout optical light source; and a radio frequency (RF) excitation source configured to provide RF excitation to the magneto-optical defect center element, the RF excitation source comprising a plurality of coils adjacent the magneto-optical defect center element, the coils each having a spiral shape.

2. The system of claim 1, wherein the magneto-optical defect center magnetometer further comprises:

a half-wave plate; and a mounting base configured such that the half-wave plate can rotate relative to the mounting base around an axis of the half-wave plate.

3. The system of claim 2, wherein the magneto-optical defect center magnetometer further comprises:

a base structure; and an adjustment mechanism configured to adjust a position of a plurality of lenses relative to at least one of the readout optical light source or the reset optical light source.

4. The system of claim 3, wherein the magneto-optical defect center magnetometer further comprises:

an optical detection circuit including the collection device, and configured to:

activate a switch between a disengaged state and an engaged state;

receive, via one of the readout optical light source or the reset optical light source, a light signal comprising a high intensity signal; and cause or the optical detection circuit to operate in a non-saturated state responsive to the activation of the switch.

5. The system of claim 4 further comprising:

a substrate comprising an electron spin center;

a complementary moiety attached to a paramagnetic ion, which is attached to the substrate; and a processor configured to identify a target molecule based on an identity of the complementary moiety and a detected magnetic effect change, wherein the magneto-optical defect center magnetometer is arranged to detect the magnetic effect change of the electron spin center caused by a change in position of the paramagnetic ion due to the target molecule passing by the complementary moiety.

6. The system of claim 4 further comprising:

a plurality of unmanned aerial systems (UASs), wherein the magneto-optical defect center magnetometer is one of a plurality of magneto-optical defect center magnetometers, wherein each of the plurality of magneto-optical defect center magnetometers is attached to a respective one of the UASs, wherein each of the plurality of magneto-optical defect center magnetometers is configured to generate a vector measurement of a magnetic field; and a central processing unit in communication with each of the plurality of magneto-optical defect center magnetometers, wherein the central processing unit is configured to:

receive, from the plurality of magneto-optical defect center magnetometers, a first set of vector measurements and corresponding locations, wherein the corresponding locations indicate where a respective magnetometer of the plurality of magneto-optical defect center magnetometers was when the respective vector measurement of the first set of vector measurements was taken;

generate a magnetic baseline map using the first set of vector measurements;

receive, from the magneto-optical defect center magnetometer of the plurality of magneto-optical defect center magnetometers, a first vector measurement and a first corresponding location;

compare the first vector measurement with the magnetic baseline map using the first corresponding location to determine a first difference vector; and determine that a magnetic object is in an area corresponding to the area of the magnetic baseline map based on the first difference vector.

7. The system of claim 4 further comprising:

a plurality of buoys, wherein the magneto-optical defect center magnetometer is one of a plurality of magneto-optical defect center magnetometers, wherein each of the plurality of magneto-optical defect center magnetometers is attached to a respective one of the buoys, wherein each of the plurality of magneto-optical defect center magnetometers is configured to generate a vector measurement of a magnetic field; and a central processing unit in communication with each of the plurality of magneto-optical defect center magnetometers, wherein the central processing unit is configured to:

receive, from the plurality of magneto-optical defect center magnetometers, a first set of vector measurements and corresponding locations, wherein the corresponding locations indicate where a respective magnetometer of the plurality of magneto-optical defect center magnetometers was when the respective vector measurement of the first set of vector measurements was taken;

generate a magnetic baseline map using the first set of vector measurements;

receive, from the magneto-optical defect center magnetometer of the plurality of magneto-optical defect center magnetometers, a first vector measurement and a first corresponding location;

compare the first vector measurement with the magnetic baseline map using the first corresponding location to determine a first difference vector; and determine that a magnetic object is in an area corresponding to the area of the magnetic baseline map based on the first difference vector.

8. The system of claim 4, wherein the magneto-optical defect center magnetometer is one of a plurality of magneto-optical defect center magnetometers of an array of magnetometers configured to capture magnetic images, wherein the magnetic images comprises a first magnetic image of a well pay zone, and a second magnetic image comprises a magnetic image captured after a well bore is padded with a fluid, the first magnetic image comprising a baseline magnetic profile including Earth's magnetic field, and remnant sources of magnetism in the well pay zone, the first magnetic image comprising a first set of one of more vector measurements using the array of magnetometers, the second magnetic image comprising a second set of one of more vector measurements using the array of magnetometers; and a processor configured to provide a background image based on the first and the second magnetic images, wherein:

a third magnetic image is captured by the array of magnetometers after a doped proppant is injected into a stage, the third magnetic image comprising a third set of one of more vector measurements using the array of magnetometers, and the processor is configured to process the third magnetic image to subtract the background and to obtain information regarding distribution of the fluid and the proppant in the stage.

9. The system of claim 4, wherein the magneto-optical defect center magnetometer is configured to sense a modulated magnetic field comprising multiple channels, the system further comprising:

a signal processor configured to demodulate each channel of the multiple channels of the sensed modulated magnetic field, wherein:

each channel of the modulated magnetic field comprises an optimized variable amplitude triangular waveform, the magnetic field sensor detecting a direction of a polarization of a B-field vector corresponding to a channel for a transmitter using a transmitted MAX and OFF symbol of the modulated magnetic signal, the signal processor configured to demodulate the channel of the sensed modulated magnetic field using the detected direction.

10. The system of claim 4 further comprising:

one or more electronic processors configured to:

receive a magnetic vector of a magnetic field detected by the magneto-optical defect center magnetometer; and determine a presence of a current source based upon the magnetic vector; and a navigation control configured to navigate a vehicle based upon the presence of the current source and the magnetic vector.

11. The system of claim 4, wherein the magneto-optical defect center magnetometer is a first magnetic sensor, the system further comprising:

a position encoder component comprising a plurality of uniform magnetic regions, wherein the uniform magnetic regions have a uniform spacing therebetween, a second magnetic sensor, wherein the magnetic sensor and the second magnetic sensor are separated by a distance that is less than the uniform spacing between the uniform magnetic regions, and a controller configured to:

determine a direction and magnitude of a change in position of the position encoder component based on the output of the first magnetic sensor and the second magnetic sensor.

12. The system of claim 4, wherein the magneto-optical defect center magnetometer is configured to simultaneously measure the magnitude of a modulated magnetic field in a plurality of directions, the system further comprising:

a processor operatively coupled to the magneto-optical defect center magnetometer, wherein the processor is configured to:

receive, from the magneto-optical defect center magnetometer, a time-varying signal corresponding to the modulated magnetic field, determine a plurality of transmission channels based on the time-varying signal, and monitor the plurality of transmission channels to determine data transmitted on each of the plurality of transmission channels.

13. The system of claim 4 further comprising:

a processor operatively coupled to the magneto-optical defect center magnetometer and configured to:

monitor a magnetic field magnitude sensed by the magneto-optical defect center magnetometer;

determine a change in the magnetic field sensed by the magneto-optical defect center magnetometer; and determine that a length of a material comprises a defect based at least on the change in the magnetic field.

14. The system of claim 4 further comprising:

a ferro-fluid configured to deform when contacted by sound waves;

a magnet configured to activate the ferro-fluid; and one or more processors, wherein the magneto-optical defect center magnetometer is configured to detect a magnetic field of the ferro-fluid and to detect movement of the ferro-fluid, and wherein the one or more processors is configured to translate movement of the ferro-fluid into acoustic data associated with the sound waves.

15. The system of claim 1, wherein the RF excitation source is further configured to provide at least two pulses of the RF excitation between two pulses of the optical light by the reset optical light source provided at the defined interval and during the continuous provision of the readout optical light source by the readout optical light source.

16. The system of claim 1, wherein the RF excitation source is further configured to provide the RF excitation at a second defined interval relative to the defined interval at which the optical light is provided by the reset optical light source.

17. The system of claim 16, wherein the magneto-optical defect center magnetometer further comprises an optical detection circuit including the collection device, configured to receive, via one of the readout optical light source or the reset optical light source, a light signal subsequent to application of the RF excitation to use to measure a magnetic field of the magneto-optical defect center element.

18. A magneto-optical defect center magnetometer comprising:

a magneto-optical defect center element;

a collection device;

an optical light source comprising:

a readout optical light source configured to provide continuous optical excitation to the magneto-optical defect center element to transition spin states of relevant magneto-optical defect center electrons in the magneto-optical defect center element to an excited state; and a reset optical light source configured to provide, at a defined interval and concurrent to the provision of the continuous optical excitation, optical light to the magneto-optical defect center element to reset the spin states in the magneto-optical defect center element from the excited state to a ground state, wherein the reset optical light source provides a higher power light than the readout optical light source; and an RF exciter system comprising:

a RF source;

a controller configured to control the RF source, the RF input;

a RF ground;

a microstrip line electrically connected to the RF input and short circuited to the RF ground adjacent the magneto-optical defect center material, wherein controller is configured to control the RF source such that a standing wave RF field is created in the magneto-optical defect center material.

19. The magneto-optical defect center magnetometer of claim 18, wherein the controller is further configured to control the RF source to provide an RF excitation at a second defined interval relative to the defined interval at which the optical light is provided by the reset optical light source.

20. The magneto-optical defect center magnetometer of claim 19, wherein the controller is further configured to measure a magnetic field of the magneto-optical defect center element based on a light signal received subsequent to application of the RF excitation at the second defined interval.

* * * * *